US012245497B2

(12) United States Patent
Liu et al.

(10) Patent No.: US 12,245,497 B2
(45) Date of Patent: *Mar. 4, 2025

(54) ORGANIC LIGHT EMITTING MATERIAL

(71) Applicant: BEIJING SUMMER SPROUT TECHNOLOGY CO., LTD., Beijing (CN)

(72) Inventors: Renmao Liu, Beijing (CN); Xinfang Hao, Beijing (CN); Weizhou Huang, Beijing (CN); Zhihong Dai, Beijing (CN); Qi Zhang, Beijing (CN); Cuifang Zhang, Beijing (CN); Nannan Lu, Beijing (CN); Xueyu Lu, Beijing (CN); Dongdong Zhang, Beijing (CN); Yongjun Wu, Beijing (CN); Chi Yuen Raymond Kwong, Beijing (CN); Chuanjun Xia, Beijing (CN)

(73) Assignee: BEIJING SUMMER SPROUT TECHNOLOGY CO., LTD., Beijing (CN)

( * ) Notice: Subject to any disclaimer, the term of this patent is extended or adjusted under 35 U.S.C. 154(b) by 1034 days.

This patent is subject to a terminal disclaimer.

(21) Appl. No.: 17/145,696

(22) Filed: Jan. 11, 2021

(65) Prior Publication Data

US 2021/0242411 A1 Aug. 5, 2021

(30) Foreign Application Priority Data

Jan. 10, 2020 (CN) ......................... 202010026581.1
Dec. 11, 2020 (CN) ......................... 202011438481.6

(51) Int. Cl.
*H01L 51/00* (2006.01)
*C07F 15/00* (2006.01)
(Continued)

(52) U.S. Cl.
CPC ....... *H10K 85/342* (2023.02); *C07F 15/0033* (2013.01); *C09K 11/02* (2013.01);
(Continued)

(58) Field of Classification Search
CPC .................................................. H10K 85/342
See application file for complete search history.

(56) References Cited

U.S. PATENT DOCUMENTS 5,703,436 A 12/1997 Forrest et al.
5,707,745 A 1/1998 Forrest et al.
(Continued)

FOREIGN PATENT DOCUMENTS

CN 2005508437 3/2005
CN 2010516622 5/2010
(Continued)

OTHER PUBLICATIONS

FIT translation of KR_20110106397_A_I (Year: 2011).*
(Continued)

*Primary Examiner* — Michael M Dollinger
(74) *Attorney, Agent, or Firm* — Workman Nydegger

(57) ABSTRACT

Provided is an organic light-emitting material. The light-emitting material is a series of metal complexes containing a ligand(s) based on isoquinoline which is substituted with deuterium at 3- and 4-position and a ligand(s) based on acetylacetone. The compounds can be used as the light-emitting material in an emissive layer of an organic electroluminescent device. These novel compounds can provide better device performance. Further provided are an electroluminescent device and a compound combination including the light-emitting material.

23 Claims, 2 Drawing Sheets

(51) Int. Cl.
*C09K 11/02* (2006.01)
*C09K 11/06* (2006.01)
*H10K 85/30* (2023.01)
*H10K 50/11* (2023.01)

(52) U.S. Cl.
CPC .......... *C09K 11/06* (2013.01); *C07B 2200/05* (2013.01); *C09K 2211/1007* (2013.01); *C09K 2211/1029* (2013.01); *C09K 2211/185* (2013.01); *H10K 50/11* (2023.02)

(56) References Cited

U.S. PATENT DOCUMENTS 5,844,363 A 12/1998 Gu et al.
6,097,147 A 8/2000 Baldo et al.
6,303,238 B1 10/2001 Thompson et al.
7,279,704 B2 10/2007 Walters et al.
7,968,146 B2 6/2011 Wagner et al.
11,653,559 B2* 5/2023 Lu .......................... C09K 11/06 257/40
2003/0072964 A1 4/2003 Kwong et al.
2003/0096138 A1 5/2003 Lecloux et al.
2003/0230980 A1 12/2003 Forrest et al.
2004/0108507 A1* 6/2004 Grushin ............... C07D 213/68 257/79
2004/0174116 A1 9/2004 Lu et al.
2004/0241495 A1 12/2004 Kwong et al.
2006/0008671 A1 1/2006 Kwong et al.
2006/0008673 A1 1/2006 Kwong et al.
2007/0259205 A1 11/2007 Ionkin et al.
2007/0278936 A1 12/2007 Herron et al.
2008/0001515 A1 1/2008 Iwanaga et al.
2008/0023671 A1* 1/2008 Chichak ................ H05B 33/14 428/917
2008/0074033 A1 3/2008 Ionkin et al.
2008/0194853 A1 8/2008 Kim et al.
2008/0261076 A1 10/2008 Kwong et al.
2009/0104472 A1 4/2009 Je et al.
2010/0051869 A1 3/2010 Chichak et al.
2010/0090591 A1 4/2010 Alleyne et al.
2010/0270916 A1 10/2010 Xia et al.
2012/0119190 A1 5/2012 Alleyne et al.
2012/0181511 A1 7/2012 Ma et al.
2012/0217868 A1 8/2012 Ma et al.
2013/0146848 A1 6/2013 Ma et al.
2013/0299795 A1 11/2013 Xia et al.
2013/0328019 A1 12/2013 Xia et al.
2014/0203265 A1 7/2014 Sakuma et al.
2015/0001472 A1 1/2015 Boudreault et al.
2015/0171348 A1 6/2015 Stoessel et al.
2015/0188061 A1 7/2015 Xia et al.
2015/0214494 A1 7/2015 Xia et al.
2015/0236277 A1 8/2015 Boudreault et al.
2015/0287933 A1 10/2015 Kottas et al.
2015/0295187 A1 10/2015 Boudreault et al.
2015/0315222 A1 11/2015 Boudreault et al.
2015/0349273 A1 12/2015 Hung et al.
2015/0357587 A1 12/2015 Kishino et al.
2015/0364701 A1 12/2015 Horiuchi et al.
2016/0028023 A1 1/2016 Boudreault et al.
2016/0093808 A1 3/2016 Adamovich et al.
2016/0104848 A1 4/2016 Boudreault et al.
2016/0111661 A1 4/2016 Boudreault et al.
2016/0190486 A1 6/2016 Lin et al.
2016/0359122 A1 12/2016 Boudreault et al.
2017/0018718 A1 1/2017 Jang et al.
2017/0084849 A1 3/2017 Tsai et al.
2017/0092880 A1 3/2017 Boudreault et al.
2017/0098788 A1 4/2017 Lee et al.
2017/0098789 A1 4/2017 Boudreault et al.
2017/0229663 A1 8/2017 Tsai et al.
2017/0288157 A1 10/2017 Joseph et al.
2017/0365799 A1 12/2017 Ji et al.
2017/0365800 A1 12/2017 Tsai et al.
2017/0365801 A1 12/2017 Margulies et al.
2018/0013077 A1 1/2018 Boudreault et al.
2018/0051007 A1 2/2018 Jung et al.
2018/0066180 A1 3/2018 Huh et al.
2018/0086775 A1 3/2018 Hong et al.
2018/0134954 A1 5/2018 Tsai et al.
2018/0190914 A1 7/2018 Tsai et al.
2018/0190915 A1 7/2018 Ji et al.
2018/0240988 A1 8/2018 Boudreault et al.
2018/0277774 A1 9/2018 Boudreault et al.
2018/0323382 A1 11/2018 Boudreault et al.
2018/0337348 A1 11/2018 Jung et al.
2019/0067598 A1 2/2019 Li et al.
2019/0077818 A1 3/2019 Xia
2019/0127406 A1 5/2019 Xia
2019/0165283 A1 5/2019 Boudreault et al.
2019/0194234 A1* 6/2019 Xia ...................... H10K 85/342
2019/0237683 A1 8/2019 Boudreault et al.
2019/0248818 A1 8/2019 Boudreault
2019/0252619 A1 8/2019 Tsai et al.
2019/0252627 A1 8/2019 Joseph et al.
2019/0326525 A1 10/2019 Kim et al.
2020/0006675 A1 1/2020 Ma et al.
2020/0099000 A1 1/2020 Kaiser et al.
2020/0044166 A1 2/2020 Cho et al.
2020/0075870 A1 3/2020 Boudreault et al.
2020/0251666 A1 8/2020 Cai et al.
2020/0308201 A1 10/2020 Lee et al.
2020/0354391 A1 11/2020 Zhang et al.
2020/0358010 A1 11/2020 Lu et al.
2020/0358011 A1 11/2020 Lu et al.
2021/0115069 A1 4/2021 Dai et al.
2022/0131093 A1 4/2022 Zhang et al.
2023/0107413 A1 4/2023 Tsai et al.

FOREIGN PATENT DOCUMENTS

CN 103159798 A 6/2013
CN 103204880 A 7/2013
CN 104022232 A 9/2014
CN 2015530982 10/2015
CN 108191916 6/2018
CN 109438521 3/2019
CN 109467575 3/2019
CN 109575083 4/2019
CN 109651444 A 4/2019
CN 109721628 A 5/2019
CN 109956977 A 7/2019
CN 110283216 A 9/2019
CN 111333684 A * 6/2020 .......... C07F 15/0033
CN 111909214 11/2020
CN 112679548 A 4/2021
EP 2907820 A1 8/2015
EP 2940098 A1 11/2015
EP 3007244 A1 4/2016
JP 10-158639 A 6/1998
JP 2008532998 8/2008
JP 2009-539768 A 11/2009
JP 2012525405 10/2012
JP 2013-121957 A 6/2013
JP 2015-010093 A 1/2015
JP 2020-186234 A 11/2020
JP 2020-186235 A 11/2020
JP 2020-186236 11/2020
KR 10-2006-0097320 A 9/2006
KR 10-2009-0039464 A 4/2009
KR 10-2011-0077350 A 7/2011
KR 20110106397 A * 9/2011
KR 10-2013-0110934 A 10/2013
KR 10-2016-0041771 A 4/2016
KR 10-2017-0142949 A 12/2017
KR 10-2018-0065353 A 6/2018
KR 10-2019-0064478 A 6/2019
KR 10-2020-0068559 A 6/2020
KR 10-2020-0115010 A 10/2020
KR 10-2020-0130660 A 11/2020
KR 10-2020-0130661 A 11/2020
KR 10-2020-0130667 A 11/2020
WO 02/44189 A1 6/2002
WO 2006/095951 A1 9/2006

(56) References Cited

FOREIGN PATENT DOCUMENTS

| | | | | | |
|---|---|---|---|---|---|
| WO | 2007/143201 | A1 | | 12/2007 | |
| WO | WO-2008014037 | A2 | * | 1/2008 | ........... A61K 31/695 |
| WO | 2018/084189 | A1 | | 5/2018 | |
| WO | WO2018/105986 | | | 6/2018 | |
| WO | WO2018124697 | | | 7/2018 | |

OTHER PUBLICATIONS

Uoyama, Hiroki, et al., "Highly efficient organic light-emitting diodes from delayed fluorescence", Nature, vol. 492, Dec. 13, 2012.
Tang, C.W., et al., "Organic Electroluminescent diodes", Applied Physics Letters, Sep. 21, 1987.
The Japanese first office action cited in Application No. 2021-002771 dated Dec. 8, 2021.
Yuji Kawanishi, Tetsu Miyazawa, Taichi Abe, Deuterium Compound for Electronic Devices, Organic Square 36 (2011), pp. 2-3.
Yoko Sugiyama, Development of Deuterated Phosphorescent Probe, Taiyo Nippon Sanso Technical Report, No. 36 (2017), pp. 1-4.
Chinese First Office Action for Chinese Application No. 202011438481.6, dated May 31, 2022, 7 pages with translation.
Japanese Notice of Reasons for Refusal for Japanese Application No. 2021-002771, dated Jul. 5, 2022, 4 pages with English translation.
German Office Action for German Application No. 10 2021 100 230.3, dated May 30, 2022, 4 pages with English translation.

* cited by examiner

ORGANIC LIGHT EMITTING MATERIAL

CROSS-REFERENCE TO RELATED APPLICATION(S)

This application claims priority to Chinese Patent Application No. CN 202010026581.1, filed Jan. 10, 2020, and Chinese Patent Application No. CN 202011438481.6, filed Dec. 11, 2020, the disclosures of which are incorporated herein by reference in their entirety.

TECHNICAL FIELD

The present disclosure relates to compounds for organic electronic devices, for example, organic light-emitting devices. Particularly, the present disclosure relates to an organic light-emitting material containing deuterium-substituted ligands, and an electroluminescent device and a compound combination containing the organic light-emitting material.

BACKGROUND

Organic electronic devices include, but are not limited to, the following types: organic light-emitting diodes (OLEDs), organic field-effect transistors (O-FETs), organic light-emitting transistors (OLETs), organic photovoltaic devices (OPVs), dye-sensitized solar cells (DSSCs), organic optical detectors, organic photoreceptors, organic field-quench devices (OFQDs), light-emitting electrochemical cells (LECs), organic laser diodes and organic plasmon emitting devices.

In 1987, Tang and Van Slyke of Eastman Kodak reported a bilayer organic electroluminescent device, which comprises an arylamine hole transporting layer and a tris-8-hydroxyquinolato-aluminum layer as the electron and emitting layer (Applied Physics Letters, 1987, 51 (12): 913-915). Once a bias is applied to the device, green light was emitted from the device. This device laid the foundation for the development of modern organic light-emitting diodes (OLEDs). State-of-the-art OLEDs may comprise multiple layers such as charge injection and transporting layers, charge and exciton blocking layers, and one or multiple emissive layers between the cathode and anode. Since the OLED is a self-emitting solid state device, it offers tremendous potential for display and lighting applications. In addition, the inherent properties of organic materials, such as their flexibility, may make them well suited for particular applications such as fabrication on flexible substrates.

The OLED can be categorized as three different types according to its emitting mechanism. The OLED invented by Tang and van Slyke is a fluorescent OLED. It only utilizes singlet emission. The triplets generated in the device are wasted through nonradiative decay channels. Therefore, the internal quantum efficiency (IQE) of the fluorescent OLED is only 25%. This limitation hindered the commercialization of OLED. In 1997, Forrest and Thompson reported phosphorescent OLED, which uses triplet emission from heavy metal containing complexes as the emitter. As a result, both singlet and triplets can be harvested, achieving 100% IQE. The discovery and development of phosphorescent OLED contributed directly to the commercialization of active-matrix OLED (AMOLED) due to its high efficiency. Recently, Adachi achieved high efficiency through thermally activated delayed fluorescence (TADF) of organic compounds. These emitters have small singlet-triplet gap that makes the transition from triplet back to singlet possible. In the TADF device, the triplet excitons can go through reverse intersystem crossing to generate singlet excitons, resulting in high IQE.

OLEDs can also be classified as small molecule and polymer OLEDs according to the forms of the materials used. A small molecule refers to any organic or organometallic material that is not a polymer. The molecular weight of the small molecule can be large as long as it has well defined structure. Dendrimers with well-defined structures are considered as small molecules. Polymer OLEDs include conjugated polymers and non-conjugated polymers with pendant emitting groups. Small molecule OLED can become the polymer OLED if post polymerization occurred during the fabrication process.

There are various methods for OLED fabrication. Small molecule OLEDs are generally fabricated by vacuum thermal evaporation. Polymer OLEDs are fabricated by solution process such as spin-coating, inkjet printing, and slit printing. If the material can be dissolved or dispersed in a solvent, the small molecule OLED can also be produced by solution process.

The emitting color of the OLED can be achieved by emitter structural design. An OLED may comprise one emitting layer or a plurality of emitting layers to achieve desired spectrum. In the case of green, yellow, and red OLEDs, phosphorescent emitters have successfully reached commercialization. Blue phosphorescent device still suffers from non-saturated blue color, short device lifetime, and high operating voltage. Commercial full-color OLED displays normally adopt a hybrid strategy, using fluorescent blue and phosphorescent yellow, or red and green. At present, efficiency roll-off of phosphorescent OLEDs at high brightness remains a problem. In addition, it is desirable to have more saturated emitting color, higher efficiency, and longer device lifetime.

US 2015/0171348 A1 discloses a compound having the following partial structure:

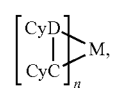

which contains a condensed ring structure having the following structure:

Formula 3

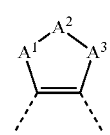

or

Formula 4

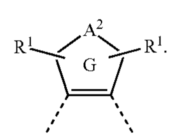

Specific examples of this compound include

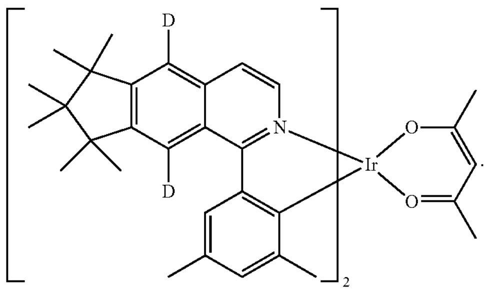

This disclosure focuses on performance changes brought about by the introduction of the condensed ring structure in a ligand. Although the above application mentions related complexes of isoquinoline with two deuterium atoms introduced at 5- and 8-position, no study is made on the effect of deuteration, let alone the change in the metal complex properties brought about by the introduction of deuteration in specific 3- and 4-position on the isoquinoline ring.

US 2008/0194853 A1 discloses an iridium complex having the following structure:

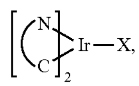

where

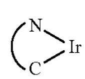

may be selected from a phenylisoquinoline structure, and the ligand X may be selected from an acetylacetone-based ligand. Specific examples of this compound include

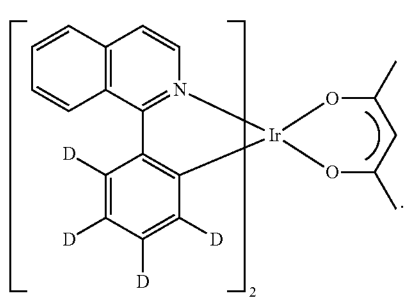

The inventors of the above application notice the improvement in device efficiency brought about by the introduction of multiple deuterium atoms into the iridium complex ligand, but they do not notice the particular advantage of increasing device lifetime brought about by the introduction of deuterium atom substitution at specific 3- and 4-position on the isoquinoline ring.

US 2003/0096138 A1 discloses an active layer containing a compound having the following formula:

$IrL_3$
$IrL_2Z$, where the ligand L may be selected from the structure of the following formula:

(IX)

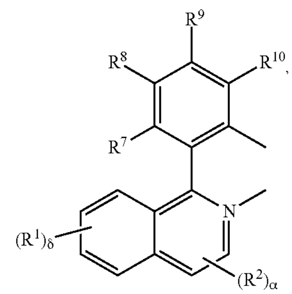

where $R^2$ and $R^7$ to $R^{10}$ are each independently selected from H, D, alkyl, hydroxyl, alkoxy, sulfhydryl, alkylthio, amino and other substituents, α is 0, 1 or 2, and δ is 0 or an integer from 1 to 4. Examples in the above application are described with the cases where α and δ are equal to 0, and no examples that the isoquinoline ring has $R^2$ substituents is disclosed, nor are there any discussions on the effects achieved by the iridium complex due to the introduction of deuterium atoms.

WO 2018/124697 A1 discloses an organic electroluminescent compound with the following structure:

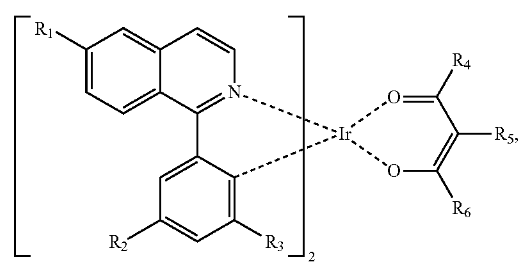

where $R_1$ to $R_3$ are selected from alkyl/deuterated alkyl. The inventors of the above application notice the improvement in efficiency of the iridium complex brought about by an alkyl/deuterated alkyl substituted phenylisoquinoline ligand, but they do not notice the improvement in metal complex properties, particularly the improvement in terms of lifetime and efficiency, brought about by the direct deuteration on the isoquinoline ring.

US 2010/0051869 A1 discloses a composition containing at least one organic iridium complex having the structure of the following formula:

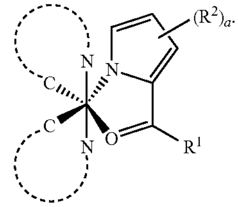

The inventors of the above application focus on the ligand of a 2-carbonylpyrrole structure. Although the perdeuterated phenylisoquinoline ligand is mentioned, they do not notice the application of the cooperation with the acetylacetone-based ligand in the complex, which is obviously different from the overall structure of the metal complex of the present disclosure.

CN 109438521 A discloses a complex having the following structure:

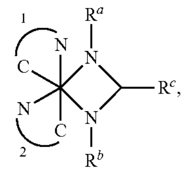

I where one or more hydrogens in this complex may be substituted by deuterium, and the C^N ligand disclosed may have the structure of phenylisoquinoline or phenylquinazoline. Specific example of this complex include:

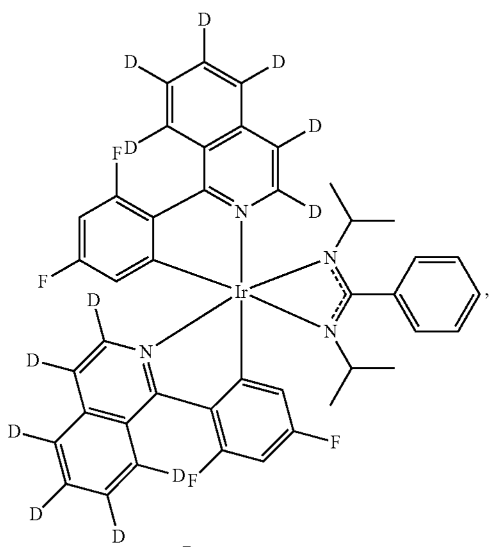

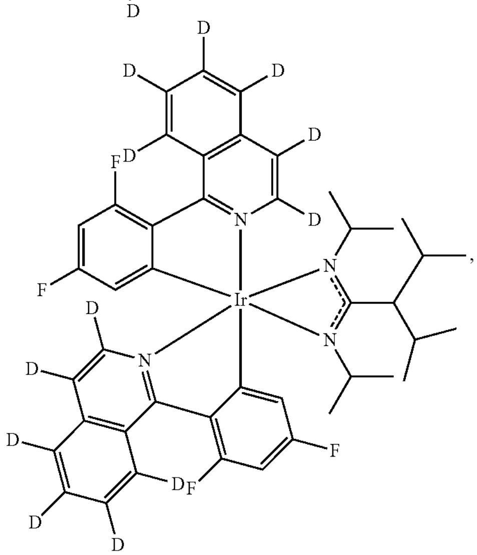

and

-continued

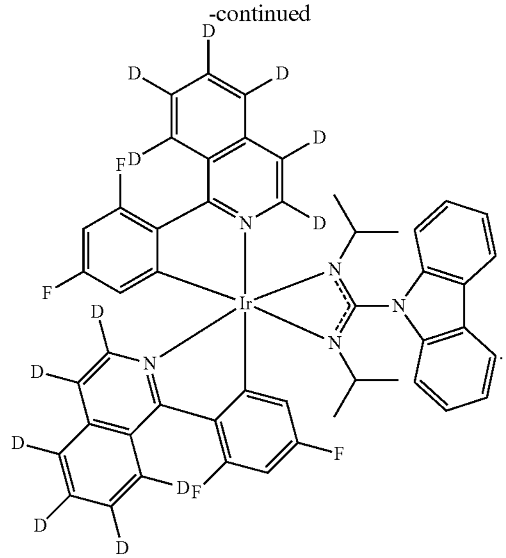

The inventors of the above application mainly focus on dinitrogen coordination amidinate- and guanidine-based ligands. Although the perdeuterated isoquinoline ligand is mentioned, they do not notice the application of the cooperation with the acetylacetone-based ligand in the complex, which is obviously different from the overall structure of the metal complex of the present disclosure.

Although iridium complexes containing a ligand having a structure of phenylisoquinoline which is fully deuterated or dideuterated at 5- and 8-position are reported in the literatures, these examples involving deuteration are only a few of the many disclosed examples of the iridium complex having isoquinoline ligands in the corresponding literatures, or these examples do not involve the co-use of acetylacetone-based ligands in metal complexes, or these examples do not study or discuss the deuteration effect and the influence of deuteration positions on the device performance especially lifetime. Development in related art still needs to be performed further.

SUMMARY

The present disclosure aims to provide a series of organic light-emitting materials containing a ligand(s) based on isoquinoline which is substituted with deuterium at 3- and 4-position and a ligand(s) based on acetylacetone. The compounds can be used as the emissive material in the emissive layer of the organic electroluminescent device. These novel metal complexes can effectively improve device efficiency and lifetime.

According to one embodiment of the present disclosure, a metal complex is disclosed, which has a general structure of $M(L_a)_m(L_b)_n(L_c)_q$, wherein $L_a$, $L_b$ and $L_c$ are the first ligand, the second ligand and the third ligand coordinated to the metal M, respectively; wherein the metal M is a metal whose relative atomic mass is greater than 40;

wherein $L_a$, $L_b$ and $L_c$ can be optionally joined to form a multi-dentate ligand;

wherein m is 1 or 2, n is 1 or 2, q is 0 or 1, and m+n+q equals to the oxidation state of the metal M;

when m is greater than 1, $L_a$ may be the same or different; and when n is greater than 1, $L_b$ may be the same or different;

wherein the first ligand $L_a$ has a structure represented by Formula 1:

Formula 1

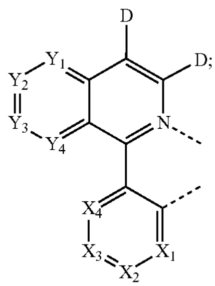

wherein $X_1$ to $X_4$ are, at each occurrence identically or differently, selected from $CR_1$ or N;

wherein $Y_1$ to $Y_4$ are, at each occurrence identically or differently, selected from $CR_2$ or N;

wherein $R_1$ and $R_2$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

in Formula 1, adjacent substituents can be optionally joined to form a ring;

wherein the second ligand $L_b$ has a structure represented by Formula 2:

Formula 2

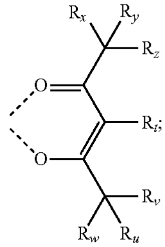

where $R_t$ to $R_z$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

in Formula 2, adjacent substituents can be optionally joined to form a ring;

where the third ligand $L_c$ is a monoanionic bidentate ligand.

According to another embodiment of the present disclosure, an electroluminescent device is further disclosed, which includes:

an anode, a cathode, and an organic layer disposed between the anode and the cathode, the organic layer includes a metal complex having a general structure of $M(L_a)_m(L_b)_n(L_c)_q$, wherein $L_a$, $L_b$ and $L_c$ are the first ligand, the second ligand and the third ligand coordinated to the metal M, respectively; wherein the metal M is a metal whose atomic mass is greater than 40;

wherein, $L_a$, $L_b$ and $L_c$ can be optionally joined to form a multi-dentate ligand;

wherein m is 1 or 2, n is 1 or 2, q is 0 or 1, and m+n+q equals to the oxidation state of the metal M;

when m is greater than 1, $L_a$ may be the same or different; and when n is greater than 1, $L_b$ may be the same or different;

wherein the first ligand $L_a$ has a structure represented by Formula 1:

Formula 1

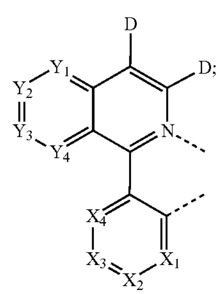

wherein $X_1$ to $X_4$ are, at each occurrence identically or differently, selected from $CR_1$ or N;

wherein $Y_1$ to $Y_4$ are, at each occurrence identically or differently, selected from $CR_2$ or N;

wherein $R_1$ and $R_2$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

in Formula 1, adjacent substituents can be optionally joined to form a ring;

wherein the second ligand $L_b$ has a structure represented by Formula 2:

Formula 2

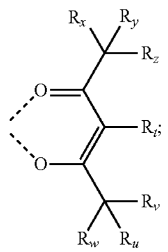

wherein $R_t$ to $R_z$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

in Formula 2, adjacent substituents can be optionally joined to form a ring;

wherein the third ligand $L_c$ is a monoanionic bidentate ligand.

According to another embodiment of the present disclosure, a compound formulation is further disclosed, which contains the metal complex described above.

The metal complex disclosed by the present disclosure can be used as the light-emitting material in the emissive layer of the organic electroluminescent device. Through the deuterium substitution at 3- and 4-position of the isoquinoline ligand and the combination with acetylacetonate ligand to form metal complexes, these metal complexes unexpectedly exhibit many characteristics, for example, the metal complexes can improve the device lifetime and external quantum efficiency. The metal complexes are easy to use in the fabrication of OLEDs, and can provide efficient and long-lifetime electroluminescent devices. After intensive research, the inventors of the present disclosure have surprisingly found that through the introduction of deuterium atoms into the specific positions of the isoquinoline ligand of the metal complex, such a metal complex, when used as a light-emitting material in the organic light-emitting device, can greatly improve the device efficiency and lifetime.

DETAILED DESCRIPTION

Figure 1:
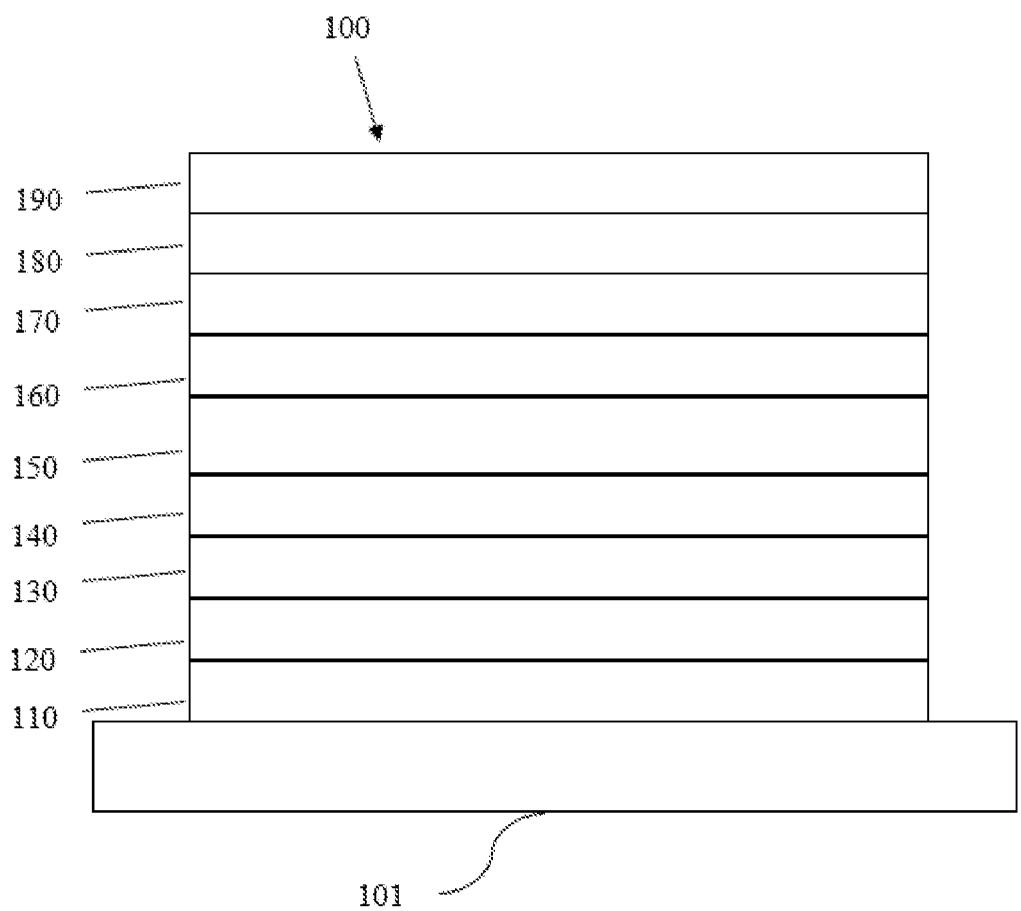
FIG. 1 is a schematic diagram of an organic light-emitting apparatus that may include a metal complex and a compound formulation disclosed by the present disclosure.

OLEDs can be fabricated on various types of substrates such as glass, plastic, and metal foil. FIG. 1 schematically shows an organic light emitting device 100 without limitation. The figures are not necessarily drawn to scale. Some of the layers in the figures can also be omitted as needed. Device 100 may include a substrate 101, an anode 110, a hole injection layer 120, a hole transport layer 130, an electron blocking layer 140, an emissive layer 150, a hole blocking layer 160, an electron transport layer 170, an electron injection layer 180 and a cathode 190. Device 100 may be fabricated by depositing the layers described in order. The properties and functions of these various layers, as well as example materials, are described in more detail in U.S. Pat. No. 7,279,704 at cols. 6-10, the contents of which are incorporated by reference herein in its entirety.

More examples for each of these layers are available. For example, a flexible and transparent substrate-anode combination is disclosed in U.S. Pat. No. 5,844,363, which is incorporated by reference herein in its entirety. An example of a p-doped hole transport layer is m-MTDATA doped with F4-TCNQ at a molar ratio of 50:1, as disclosed in U.S. Patent Application Publication No. 2003/0230980, which is incorporated by reference herein in its entirety. Examples of host materials are disclosed in U.S. Pat. No. 6,303,238 to Thompson et al., which is incorporated by reference herein in its entirety. An example of an n-doped electron transport layer is BPhen doped with Li at a molar ratio of 1:1, as disclosed in U.S. Patent Application Publication No. 2003/0230980, which is incorporated by reference herein in its entirety. U.S. Pat. Nos. 5,703,436 and 5,707,745, which are incorporated by reference herein in their entireties, disclose examples of cathodes including composite cathodes having a thin layer of metal such as Mg:Ag with an overlying transparent, electrically-conductive, sputter-deposited ITO layer. The theory and use of blocking layers are described in more detail in U.S. Pat. No. 6,097,147 and U.S. Patent Application Publication No. 2003/0230980, which are incorporated by reference herein in their entireties. Examples of injection layers are provided in U.S. Patent Application Publication No. 2004/0174116, which is incorporated by reference herein in its entirety. A description of protective layers may be found in U.S. Patent Application Publication No. 2004/0174116, which is incorporated by reference herein in its entirety.

The layered structure described above is provided by way of non-limiting examples. Functional OLEDs may be achieved by combining the various layers described in different ways, or layers may be omitted entirely. It may also include other layers not specifically described. Within each layer, a single material or a mixture of multiple materials can be used to achieve optimum performance. Any functional layer may include several sublayers. For example, the emissive layer may have two layers of different emitting materials to achieve desired emission spectrum.

In one embodiment, an OLED may be described as having an "organic layer" disposed between a cathode and an anode. This organic layer may comprise a single layer or multiple layers.

Figure 2:
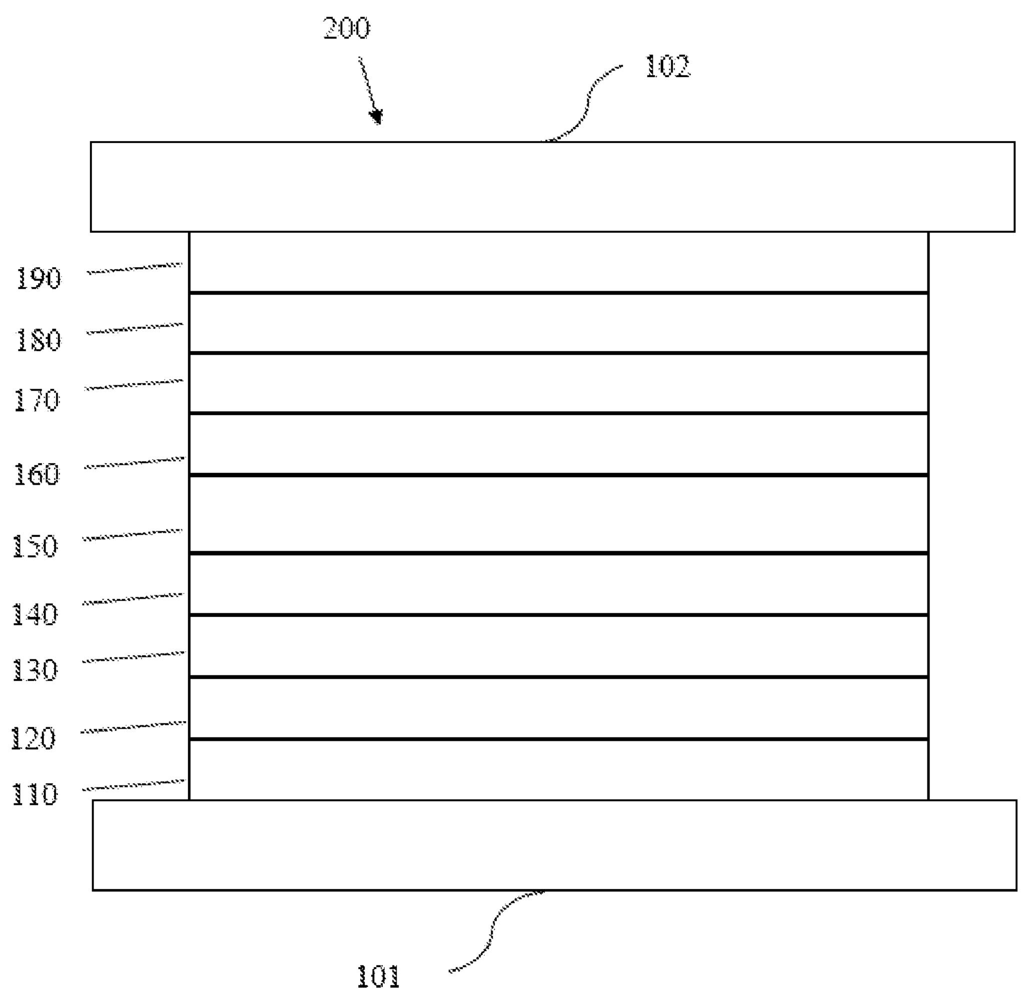
FIG. 2 is a schematic diagram of another organic light-emitting apparatus that may include a metal complex and a compound formulation disclosed by the present disclosure.

An OLED can be encapsulated by a barrier layer. FIG. 2 schematically shows an organic light emitting device 200 without limitation. FIG. 2 differs from FIG. 1 in that the organic light emitting device include a barrier layer 102, which is above the cathode 190, to protect it from harmful species from the environment such as moisture and oxygen. Any material that can provide the barrier function can be used as the barrier layer such as glass or organic-inorganic hybrid layers. The barrier layer should be placed directly or indirectly outside of the OLED device. Multilayer thin film encapsulation was described in U.S. Pat. No. 7,968,146, which is incorporated by reference herein in its entirety.

Devices fabricated in accordance with embodiments of the present disclosure can be incorporated into a wide variety of consumer products that have one or more of the electronic component modules (or units) incorporated therein. Some examples of such consumer products include flat panel displays, monitors, medical monitors, televisions, billboards, lights for interior or exterior illumination and/or signaling, heads-up displays, fully or partially transparent displays, flexible displays, smart phones, tablets, phablets, wearable devices, smart watches, laptop computers, digital cameras, camcorders, viewfinders, micro-displays, 3-D displays, vehicles displays, and vehicle tail lights.

The materials and structures described herein may be used in other organic electronic devices listed above.

As used herein, "top" means furthest away from the substrate, while "bottom" means closest to the substrate. Where a first layer is described as "disposed over" a second layer, the first layer is disposed further away from the substrate. There may be other layers between the first and second layers, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the transition between the triplet states and the singlet excited states. Compounds that are capable of generating E-type delayed fluorescence are required to have very small singlet-triplet gaps to convert between energy states. Thermal energy can activate the transition from the triplet state back to the singlet state. This type of delayed fluorescence is also known as thermally activated delayed fluorescence (TADF). A distinctive feature of TADF is that the delayed component increases as temperature rises. If the reverse intersystem crossing rate is fast enough to minimize the non-radiative decay from the triplet state, the fraction of back populated singlet excited states can potentially reach 75%. The total singlet fraction can be 100%, far exceeding 25% of the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap ($\Delta E_{S-T}$). Organic, non-metal containing, donor-acceptor luminescent materials may be able to achieve this. The emission in these materials is generally characterized as a donor-acceptor charge-transfer (CT) type emission. The spatial separation of the HOMO and LUMO in these donor-acceptor type compounds generally results in small $\Delta E_{S-T}$. These states may involve CT states. Generally, donor-acceptor luminescent materials are constructed by connecting an electron donor moiety such as amino- or carbazole-derivatives and an electron acceptor moiety such as N-containing six-membered aromatic rings.

Definition of Terms of Substituents

Halogen or halide—as used herein includes fluorine, chlorine, bromine, and iodine.

Alkyl—contemplates both straight and branched chain alkyl groups. Examples of the alkyl group include methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neopentyl group, 1-methylpentyl group, 2-methylpentyl group, 1-pentylhexyl group, 1-butylpentyl group, 1-heptyloctyl group, and 3-methylpentyl group. Additionally, the alkyl group may be optionally substituted. The carbons in the alkyl chain can be replaced by other hetero atoms. Of the above, preferred are methyl group, ethyl group, propyl group, isopropyl group, n-butyl group, s-butyl group, isobutyl group, t-butyl group, n-pentyl group, and neopentyl group.

Cycloalkyl—as used herein contemplates cyclic alkyl groups. Preferred cycloalkyl groups are those containing 4 to 10 ring carbon atoms and includes cyclobutyl, cyclopentyl, cyclohexyl, 4-methylcyclohexyl, 4,4-dimethylcyclohexyl, 1-adamantyl, 2-adamantyl, 1-norbornyl, 2-norbornyl and the like. Additionally, the cycloalkyl group may be optionally substituted. The carbons in the ring can be replaced by other hetero atoms.

Alkenyl—as used herein contemplates both straight and branched chain alkene groups. Preferred alkenyl groups are those containing 2 to 15 carbon atoms. Examples of the alkenyl group include vinyl group, allyl group, 1-butenyl group, 2-butenyl group, 3-butenyl group, 1,3-butandienyl group, 1-methylvinyl group, styryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl1-butenyl group, and 3-phenyl-1-butenyl group. Additionally, the alkenyl group may be optionally substituted.

Alkynyl—as used herein contemplates both straight and branched chain alkyne groups. Preferred alkynyl groups are those containing 2 to 15 carbon atoms. Additionally, the alkynyl group may be optionally substituted.

Aryl or aromatic group—as used herein includes noncondensed and condensed systems. Preferred aryl groups are those containing six to sixty carbon atoms, preferably six to twenty carbon atoms, more preferably six to twelve carbon atoms. Examples of the aryl group include phenyl, biphenyl, terphenyl, triphenylene, tetraphenylene, naphthalene, anthracene, phenalene, phenanthrene, fluorene, pyrene, chrysene, perylene, and azulene, preferably phenyl, biphenyl, terphenyl, triphenylene, fluorene, and naphthalene. Additionally, the aryl group may be optionally substituted. Examples of the non-condensed aryl group include phenyl group, biphenyl-2-yl group, biphenyl-3-yl group, biphenyl-4-yl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 4'-methylbiphenylyl group, 4"-t-butyl p-terphenyl-4-yl group, o-cumenyl group, m-cumenyl group, p-cumenyl group, 2,3-xylyl group, 3,4-xylyl group, 2,5-xylyl group, mesityl group, and m-quarterphenyl group.

Heterocyclic group or heterocycle—as used herein includes aromatic and non-aromatic cyclic groups. Heteroaromatic also means heteroaryl. Preferred non-aromatic heterocyclic groups are those containing 3 to 7 ring atoms which include at least one hetero atom such as nitrogen, oxygen, and sulfur. The heterocyclic group can also be an aromatic heterocyclic group having at least one heteroatom selected from nitrogen atom, oxygen atom, sulfur atom, and selenium atom.

Heteroaryl—as used herein includes non-condensed and condensed hetero-aromatic groups that may include from one to five heteroatoms. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Alkoxy—it is represented by —O-Alkyl. Examples and preferred examples thereof are the same as those described above. Examples of the alkoxy group having 1 to 20 carbon atoms, preferably 1 to 6 carbon atoms include methoxy group, ethoxy group, propoxy group, butoxy group, pentyloxy group, and hexyloxy group. The alkoxy group having 3 or more carbon atoms may be linear, cyclic or branched.

Aryloxy—it is represented by —O-Aryl or —O-heteroaryl. Examples and preferred examples thereof are the same as those described above. Examples of the aryloxy group having 6 to 40 carbon atoms include phenoxy group and biphenyloxy group.

Arylalkyl—as used herein contemplates an alkyl group that has an aryl substituent. Additionally, the arylalkyl group may be optionally substituted. Examples of the arylalkyl group include benzyl group, 1-phenylethyl group, 2-phenylethyl group, 1-phenylisopropyl group, 2-phenylisopropyl group, phenyl-t-butyl group, alpha.-naphthylmethyl group, 1-alpha.-naphthylethyl group, 2-alpha-naphthylethyl group, 1-alpha-naphthylisopropyl group, 2-alpha-naphthylisopropyl group, beta-naphthylmethyl group, 1-beta-naphthylethyl group, 2-beta-naphthylethyl group, 1-beta-naphthylisopropyl group, 2-beta-naphthylisopropyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group, and 1-chloro-2-phenylisopropyl group. Of the above, preferred are benzyl group, p-cyanobenzyl group, m-cyanobenzyl group, o-cyanobenzyl group, 1-phenylethyl group, 2-phenylethyl group, 1-phenylisopropyl group, and 2-phenylisopropyl group.

The term “aza” in azadibenzofuran, aza-dibenzothiophene, etc. means that one or more of the C—H groups in the respective aromatic fragment are replaced by a nitrogen atom. For example, azatriphenylene encompasses dibenzo[f,h]quinoxaline, dibenzo[f,h]quinoline and other analogues with two or more nitrogens in the ring system. One of ordinary skill in the art can readily envision other nitrogen analogs of the aza-derivatives described above, and all such analogs are intended to be encompassed by the terms as set forth herein.

In the present disclosure, unless otherwise defined, when any term of the group consisting of substituted alkyl, substituted cycloalkyl, substituted heteroalkyl, substituted arylalkyl, substituted alkoxy, substituted aryloxy, substituted alkenyl, substituted aryl, substituted heteroaryl, substituted alkylsilyl, substituted arylsilyl, substituted amine, substituted acyl, substituted carbonyl, substituted carboxylic acid group, substituted ester group, substituted sulfinyl, substituted sulfonyl and substituted phosphino is used, it means that any group of alkyl, cycloalkyl, heteroalkyl, arylalkyl, alkoxy, aryloxy, alkenyl, aryl, heteroaryl, alkylsilyl, arylsilyl, amine, acyl, carbonyl, carboxylic acid group, ester group, sulfinyl, sulfonyl and phosphino may be substituted with one or more groups selected from the group consisting of deuterium, a halogen, an unsubstituted alkyl group having 1 to 20 carbon atoms, an unsubstituted cycloalkyl group having 3 to 20 ring carbon atoms, an unsubstituted heteroalkyl group having 1 to 20 carbon atoms, an unsubstituted arylalkyl group having 7 to 30 carbon atoms, an unsubstituted alkoxy group having 1 to 20 carbon atoms, an unsubstituted aryloxy group having 6 to 30 carbon atoms, an unsubstituted alkenyl group having 2 to 20 carbon atoms, an unsubstituted aryl group having 6 to 30 carbon atoms, an unsubstituted heteroaryl group having 3 to 30 carbon atoms, an unsubstituted alkylsilyl group having 3 to 20 carbon atoms, an unsubstituted arylsilyl group having 6 to 20 carbon atoms, an unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group and a phosphino group, and combinations thereof.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In the compounds mentioned in the present disclosure, multiple substitutions refer to a range that includes a double substitution, up to the maximum available substitutions. When a substitution in the compounds mentioned in the present disclosure represents multiple substitutions (including di, tri, tetra substitutions etc.), that means the substituent may exist at a plurality of available substitution positions on its linking structure, the substituents present at a plurality of available substitution positions may be the same structure or different structures.

In the compounds mentioned in the present disclosure, adjacent substituents in the compounds cannot connect to form a ring unless otherwise explicitly defined, for example, adjacent substituents can be optionally joined to form a ring. In the compounds mentioned in the present disclosure, adjacent substituents can be optionally joined to form a ring, including both the case where adjacent substituents can be joined to form a ring, and the case where adjacent substituents are not joined to form a ring. When adjacent substituents can be optionally joined to form a ring, the ring formed may be monocyclic or polycyclic, as well as alicyclic, heteroalicyclic, aromatic or heteroaromatic. In such expression, adjacent substituents may refer to substituents bonded to the same atom, substituents bonded to carbon atoms which are directly bonded to each other, or substituents bonded to carbon atoms which are more distant from each other. Preferably, adjacent substituents refer to substituents bonded to the same carbon atom and substituents bonded to carbon atoms which are directly bonded to each other.

The expression that adjacent substituents can be optionally joined to form a ring is also intended to mean that two substituents bonded to the same carbon atom are joined to each other via a chemical bond to form a ring, which can be exemplified by the following formula:

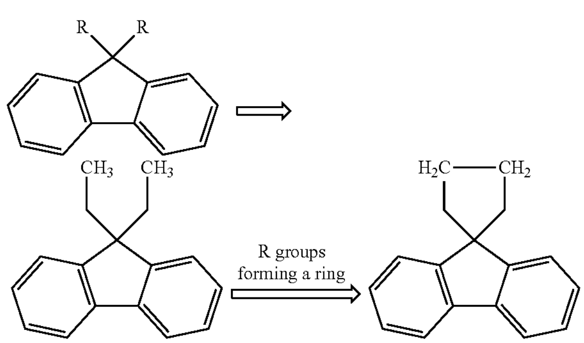

The expression that adjacent substituents can be optionally joined to form a ring is also intended to mean that two substituents bonded to carbon atoms which are directly bonded to each other are joined to each other via a chemical bond to form a ring, which can be exemplified by the following formula:

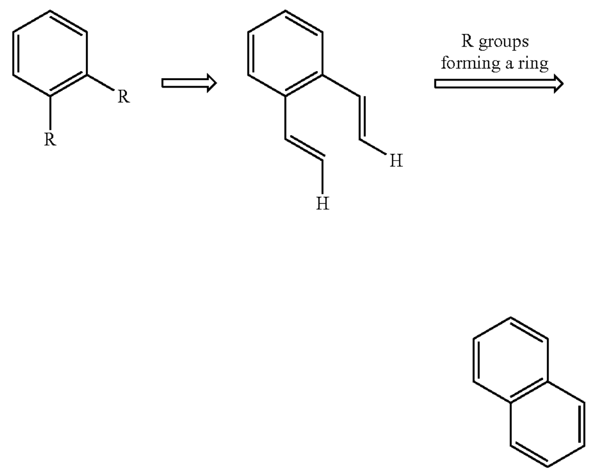

Furthermore, the expression that adjacent substituents can be optionally joined to form a ring is also intended to mean that, in the case where one of the two substituents bonded to carbon atoms which are directly bonded to each other represents hydrogen, the second substituent is bonded at a position at which the hydrogen atom is bonded, thereby forming a ring. This is exemplified by the following formula:

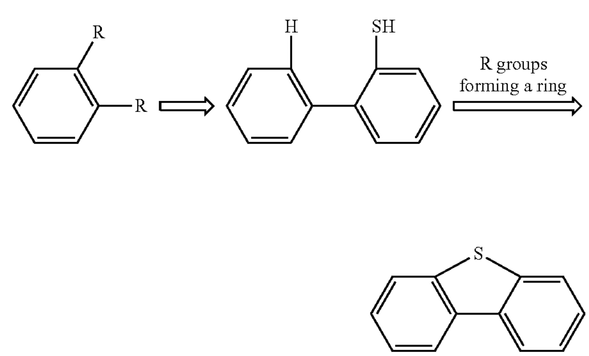

According to one embodiment of the present disclosure, a metal complex is disclosed, which has a general structure of $M(L_a)_m(L_b)_n(L_c)_q$, wherein $L_a$, $L_b$ and $L_c$ are the first ligand, the second ligand and the third ligand coordinated to the metal M, respectively; wherein the metal M is a metal whose relative atomic mass is greater than 40;

wherein, $L_a$, $L_b$ and $L_c$ can be optionally joined to form a multi-dentate ligand;

wherein m is 1 or 2, n is 1 or 2, q is 0 or 1, and m+n+q equals to the oxidation state of the metal M;

when m is greater than 1, $L_a$ may be the same or different; and when n is greater than 1, $L_b$ may be the same or different;

wherein the first ligand $L_a$ has a structure represented by Formula 1:

Formula 1

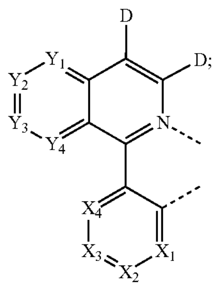

wherein $X_1$ to $X_4$ are, at each occurrence identically or differently, selected from $CR_1$ or N;

wherein $Y_1$ to $Y_4$ are, at each occurrence identically or differently, selected from $CR_2$ or N;

wherein $R_1$ and $R_2$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

in Formula 1, adjacent substituents can be optionally joined to form a ring;

wherein, the second ligand $L_b$ has a structure represented by Formula 2:

Formula 2

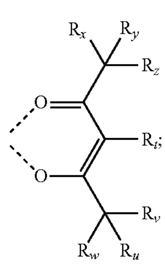

wherein $R_t$ to $R_z$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

in Formula 2, adjacent substituents can be optionally joined to form a ring;

wherein, the third ligand $L_c$ is a monoanionic bidentate ligand.

In this embodiment, the expression that "in Formula 1, adjacent substituents can be optionally joined to form a ring" may include the following cases: in one case, there is/are case(s) that between adjacent substituents $R_1$, between adjacent substituents $R_2$ and/or between adjacent substituents $R_1$ and $R_2$ are joined to form a ring; and in the other case, between adjacent substituents $R_1$, between adjacent substituents $R_2$ and/or between adjacent substituents $R_1$ and $R_2$ may not be joined to form a ring.

In this embodiment, the expression that "in Formula 2, adjacent substituents can be optionally joined to form a ring" may include the following cases: in one case, there is/are case(s) that between adjacent substituents $R_x$, $R_y$, $R_z$, $R_t$, $R_u$, $R_v$, and $R_w$ are joined to form a ring, for example, any one or any several of between adjacent substituents $R_x$ and $R_y$, between adjacent substituents $R_y$ and $R_z$, between adjacent substituents $R_u$ and $R_v$, between adjacent substituents $R_t$ and $R_z$, between adjacent substituents $R_t$ and $R_u$, and between adjacent substituents $R_w$ and $R_v$ are joined to form a ring; and in the other case, there are cases that between adjacent substituents $R_x$, $R_y$, $R_z$, $R_t$, $R_u$, $R_v$, and $R_w$ may not be joined to form a ring, for example, any one or any several of between adjacent substituents $R_x$ and $R_y$, between adjacent substituents $R_y$ and $R_z$, between adjacent substituents $R_u$ and $R_v$, between adjacent substituents $R_t$ and $R_z$, between adjacent substituents $R_t$ and $R_u$, and between adjacent substituents $R_w$ and $R_v$ may not be joined to form a ring.

In the present disclosure, when a substituent is selected from hydrogen, the hydrogen refers to its isotope, protium (H), rather than other isotopes deuterium or tritium.

According to an embodiment of the present disclosure, wherein the metal M is selected from the group consisting of Cu, Ag, Au, Ru, Rh, Pd, Os, Ir and Pt.

According to an embodiment of the present disclosure, wherein the metal M is selected from Pt or Ir.

According to an embodiment of the present disclosure, wherein at least one of $X_1$ to $X_4$ is selected from $CR_1$.

According to an embodiment of the present disclosure, wherein at least one of $X_1$ to $X_4$ is selected from N.

According to an embodiment of the present disclosure, wherein at least one of $Y_1$ to $Y_4$ is selected from N.

According to an embodiment of the present disclosure, wherein $X_1$ to $X_4$ are, at each occurrence identically or differently, selected from $CR_1$.

According to an embodiment of the present disclosure, wherein $X_1$ and/or $X_3$ are, at each occurrence identically or differently, selected from $CR_1$, and $R_1$ is, at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted aralkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

wherein adjacent substituents $R_1$ can be optionally joined to form a ring.

According to an embodiment of the present disclosure, wherein $X_1$ and $X_3$ are, at each occurrence identically or differently, selected from $CR_1$, and $R_1$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, and substituted or unsubstituted alkylsilyl having 3 to 20 carbon atoms.

According to an embodiment of the present disclosure, wherein $X_1$ and $X_3$ are, at each occurrence identically or differently, selected from $CR_1$, and $R_1$ is, at each occurrence identically or differently, selected from substituted or unsubstituted alkyl having 1 to 20 carbon atoms, and $X_2$ and $X_4$ are CH.

According to an embodiment of the present disclosure, wherein $X_1$ and $X_4$ are CH, and $X_2$ and $X_3$ are, at each occurrence identically or differently, selected from $CR_1$.

According to an embodiment of the present disclosure, wherein $R_1$ is, at each occurrence identically or differently, selected from the group consisting of: hydrogen, deuterium, fluorine, methyl, ethyl, 2-butyl, isopropyl, tert-butyl, isobutyl, cyclopentyl, cyclohexyl, deuteromethyl, deuteropropyl, isopropylamino, phenyl, 2,6-dimethylphenyl, pyridyl, vinyl, and combinations thereof;

where adjacent substituents $R_1$ can be optionally joined to form a ring.

According to an embodiment of the present disclosure, wherein $Y_1$ to $Y_4$ are, at each occurrence identically or differently, selected from $CR_2$, and $R_2$ is, at each occurrence identically or differently, selected from the group consisting of: hydrogen, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted aralkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

wherein adjacent substituents $R_2$ can be optionally joined to form a ring.

According to an embodiment of the present disclosure, wherein $Y_2$ is $CR_2$, and $R_2$ is, at each occurrence identically or differently, selected from the group consisting of: halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted aralkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof; wherein adjacent substituents $R_2$ can be optionally joined to form a ring.

According to an embodiment of the present disclosure, $Y_2$ is $CR_2$, and $R_2$ is, at each occurrence identically or differently, selected from the group consisting of: halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, and substituted or unsubstituted alkylsilyl having 3 to 20 carbon atoms; wherein adjacent substituents $R_2$ can be optionally joined to form a ring.

According to an embodiment of the present disclosure, $R_2$ is alkyl having 1 to 20 carbon atoms.

According to an embodiment of the present disclosure, $Y_2$ is $CR_2$, and $R_2$ is, at each occurrence identically or differently, selected from substituted or unsubstituted alkyl or cycloalkyl having 1 to 20 carbon atoms or substituted or unsubstituted alkylsilyl having 3 to 20 carbon atoms, and $Y_1$, $Y_3$, and $Y_4$ each are CH;

wherein adjacent substituents $R_2$ can be optionally joined to form a ring.

According to an embodiment of the present disclosure, wherein $R_2$ is, at each occurrence identically or differently, selected from the group consisting of: hydrogen, fluorine, methyl, ethyl, isopropyl, 2-butyl, isobutyl, tert-butyl, pent-3-yl, cyclopentyl, cyclohexyl, 4,4-dimethylcyclohexyl, neopentyl, 2,4-dimethylpent-3-yl, 1,1-dimethylsilacyclohex-4-yl, cyclopentylmethyl, cyano, trifluoromethyl, trimethylsilyl, phenyldimethylsilyl, bicyclo[2,2,1]pentyl, adamantyl, deuteroisopropyl, phenyl, pyridyl, and combinations thereof.

According to an embodiment of the present disclosure, wherein the first ligand $L_a$ is, at each occurrence identically or differently, selected from any one or any two structures of the group consisting of $L_{a1}$ to $L_{a1101}$, wherein the specific structures of $L_{a1}$ to $L_{a1101}$ are shown in claim 10.

According to one embodiment of the present disclosure, wherein the first ligand $L_a$ is, at each occurrence identically or differently, selected from any one or any two structures of the group consisting of $L_{a1}$ to $L_{a1189}$, wherein the specific structures of $L_{a1}$ to $L_{a1189}$ are shown in claim 10.

According to an embodiment of the present disclosure, wherein in Formula 2, $R_t$ to $R_z$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, and combinations thereof.

According to an embodiment of the present disclosure, wherein in Formula 2, $R_t$ is selected from hydrogen, deuterium or methyl, and $R_u$ to $R_z$ are, at each occurrence identically or differently, selected from hydrogen, deuterium, fluorine, methyl, ethyl, propyl, cyclobutyl, cyclopentyl, cyclohexyl, 3-methylbutyl, 3-ethylpentyl, trifluoromethyl, and combinations thereof.

According to an embodiment of the present disclosure, wherein the second ligand $L_b$ is, at each occurrence identically or differently, selected from any one or any two structures of the group consisting of $L_{b1}$ to $L_{b383}$, wherein the specific structures of $L_{b1}$ to $L_{b383}$ are shown in claim 12.

According to an embodiment of the present disclosure, wherein the hydrogens in the first ligand $L_a$ and/or the second ligand $L_b$ can be partially or fully substituted by deuterium.

According to an embodiment of the present disclosure, wherein the third ligand $L_c$ is selected from any one of the following structures:

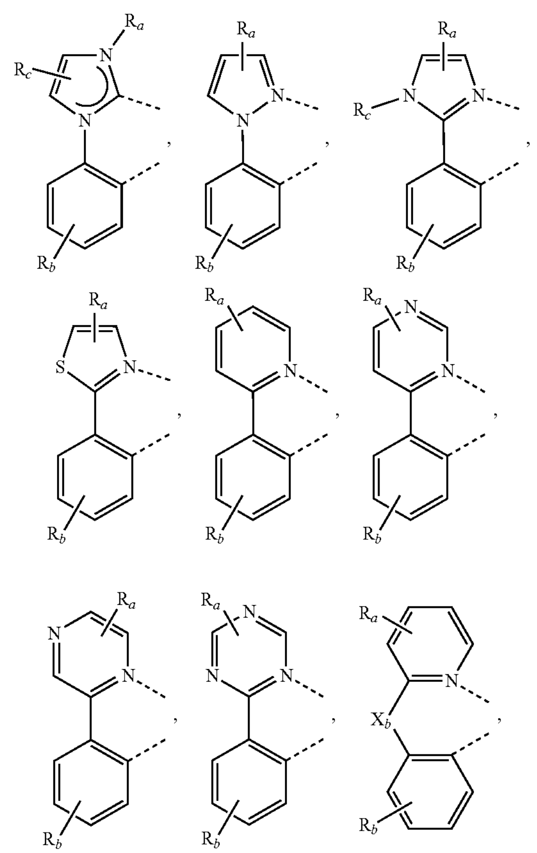

-continued

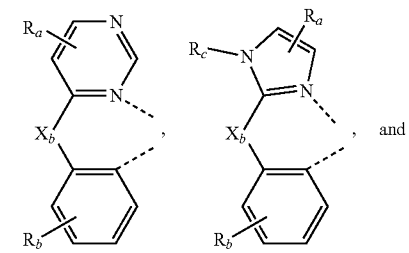

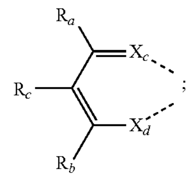

wherein $R_a$, $R_b$ and $R_c$ can represent mono-substitution, multi-substitutions or no substitution;

$X_b$ is, at each occurrence identically or differently, selected from the group consisting of: O, S, Se, $NR_{N1}$, and $CR_{C1}R_{C2}$;

$X_c$ and $X_d$ are, at each occurrence identically or differently, selected from the group consisting of: O, S, Se, and $NR_{N2}$;

$R_a$, $R_b$, $R_c$, $R_{N1}$, $R_{N2}$, $R_{C1}$ and $R_{C2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

in the structure of $L_c$, adjacent substituents can be optionally joined to form a ring.

In this embodiment, the expression that "adjacent substituents can be optionally joined to form a ring" is intended to mean that any one or more of the group of adjacent substituents, such as between two substituents $R_a$, between two substituents $R_b$, between two substituents $R_c$, between substituents $R_a$ and $R_b$, between substituents $R_a$ and $R_c$, between substituents $R_b$ and $R_c$, between substituents $R_a$ and $R_{N1}$, between substituents $R_b$ and $R_{N1}$, between substituents $R_a$ and $R_{C1}$, between substituents $R_a$ and $R_{C2}$, between substituents $R_b$ and $R_{C1}$, between substituents $R_b$ and $R_{C2}$, between substituents $R_a$ and $R_{N2}$, between substituents $R_b$ and $R_{N2}$, and between substituents $R_{C1}$ and $R_{C2}$, may be joined to form a ring. Obviously, these substituents may not be joined to form a ring.

According to an embodiment of the present disclosure, wherein the third ligand $L_c$ is, at each occurrence identically or differently, selected from the group consisting of $L_{c1}$ to $L_{c227}$, wherein the specific structures of $L_{c1}$ to $L_{c227}$ are shown in claim 15.

According to an embodiment of the present disclosure, wherein the metal complex is $Ir(L_a)_2(L_b)$ or $Ir(L_a)(L_b)(L_c)$; when the metal complex is $Ir(L_a)_2(L_b)$, the first ligand $L_a$ is, at each occurrence identically or differently, selected from any one or any two of the group consisting of $L_{a1}$ to $L_{a1189}$, and the second ligand $L_b$ is, at each occurrence identically or differently, selected from any one of the group consisting of $L_{b1}$ to $L_{b388}$; when the metal complex is $Ir(L_a)(L_b)(L_c)$, the first ligand $L_a$ is, at each occurrence identically or differently, selected from any one of the group consisting of $L_{a1}$ to $L_{a1189}$, the second ligand $L_b$ is, at each occurrence identically or differently, selected from any one of the group consisting of $L_{b1}$ to $L_{b388}$, and the third ligand $L_c$ is, at each occurrence identically or differently, selected from any one of the group consisting of $L_{c1}$ to $L_{c227}$.

According to an embodiment of the present disclosure, the metal complex is selected from complexes whose specific structures are shown in claim 16.

According to another embodiment of the present disclosure, an electroluminescent device is further disclosed, which includes:

an anode, a cathode, and an organic layer disposed between the anode and the cathode, where the organic layer includes the metal complex described in any one of the embodiments above.

According to an embodiment of the present disclosure, wherein the electroluminescent device emits red light or white light.

According to an embodiment of the present disclosure, wherein the organic layer is an emissive layer, and the metal complex is a light-emitting material.

According to an embodiment of the present disclosure, wherein the organic layer further includes a host material.

According to an embodiment of the present disclosure, wherein the host material includes at least one chemical group selected from the group consisting of: benzene, pyridine, pyrimidine, triazine, carbazole, azacarbazole, indolocarbazole, dibenzothiophene, azadibenzothiophene, dibenzofuran, azadibenzofuran, dibenzoselenophene, triphenylene, azatriphenylene, fluorene, silafluorene, naphthalene, quinoline, isoquinoline, quinazoline, quinoxaline, phenanthrene, azaphenanthrene, and combinations thereof.

According to yet another embodiment of the present disclosure, a compound combination is further disclosed, which includes the metal complex described in any one of the embodiments above.

Combination with Other Materials

The materials described in the present disclosure for a particular layer in an organic light emitting device can be used in combination with various other materials present in the device. The combinations of these materials are described in more detail in U.S. Pat. App. No. 20160359122 at paragraphs 0132-0161, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

The materials described herein as useful for a particular layer in an organic light emitting device may be used in combination with a variety of other materials present in the device. For example, dopants disclosed herein may be used in combination with a wide variety of hosts, transport layers, blocking layers, injection layers, electrodes and other layers that may be present. The combination of these materials is described in detail in paragraphs 0080-0101 of U.S. Pat. App. No. 20150349273, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

In the embodiments of material synthesis, all reactions were performed under nitrogen protection unless otherwise stated. All reaction solvents were anhydrous and used as received from commercial sources. Synthetic products were structurally confirmed and tested for properties using one or more conventional equipment in the art (including, but not limited to, nuclear magnetic resonance instrument produced by BRUKER, liquid chromatograph produced by SHIMADZU, liquid chromatograph-mass spectrometry produced by SHIMADZU, gas chromatograph-mass spectrometry produced by SHIMADZU, differential Scanning calorimeters produced by SHIMADZU, fluorescence spectrophotometer produced by SHANGHAI LENGGUANG TECH., electrochemical workstation produced by WUHAN CORRTEST, and sublimation apparatus produced by ANHUI BEQ, etc.) by methods well known to the persons skilled in the art. In the embodiments of the device, the characteristics of the device were also tested using conventional equipment in the art (including, but not limited to, evaporator produced by ANGSTROM ENGINEERING, optical testing system produced by SUZHOU FATAR, life testing system produced by SUZHOU FATAR, and ellipsometer produced by BEIJING ELLITOP, etc.) by methods well known to the persons skilled in the art. As the persons skilled in the art are aware of the above-mentioned equipment use, test methods and other related contents, the inherent data of the sample can be obtained with certainty and without influence, so the above related contents are not further described in this present disclosure.

MATERIAL SYNTHESIS EXAMPLE

The method for preparing the metal complex of the present disclosure is not limited herein. The following is typically described below using the example of the following compounds without limitation, and synthesis routes and preparation methods of the compounds are as follows.

Synthesis Example 1: Synthesis of Compound $Ir(L_{a126})_2(L_{b361})$

Step 1: Synthesis of an Iridium Dimer

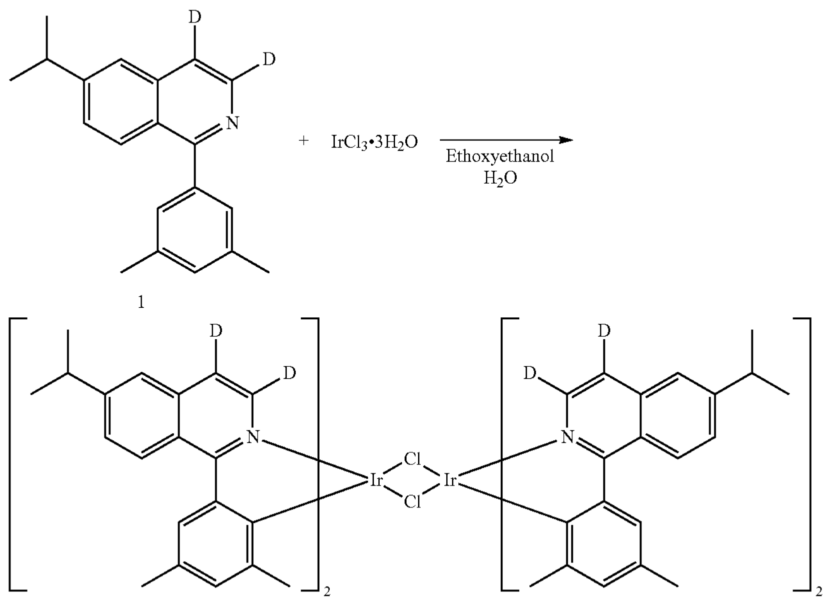

Intermediate 1 (4.06 g, 14.64 mmol), iridium trichloride trihydrate (1.29 g, 3.66 mmol), ethoxyethanol (39 mL) and water (13 mL) were added into a 100 mL round bottom flask. The resulting reaction mixture was bubbled with nitrogen gas for 3 min. The reaction was heated to reflux under nitrogen for 24 h, and the reaction solution changed from yellow green to dark red. After the reaction was completed, the mixture was cooled to room temperature and filtered. The filtered solid was washed several times with methanol and then dried to obtain the dimer.

Step 2: Synthesis of Compound $Ir(L_{a126})_2(L_{b361})$

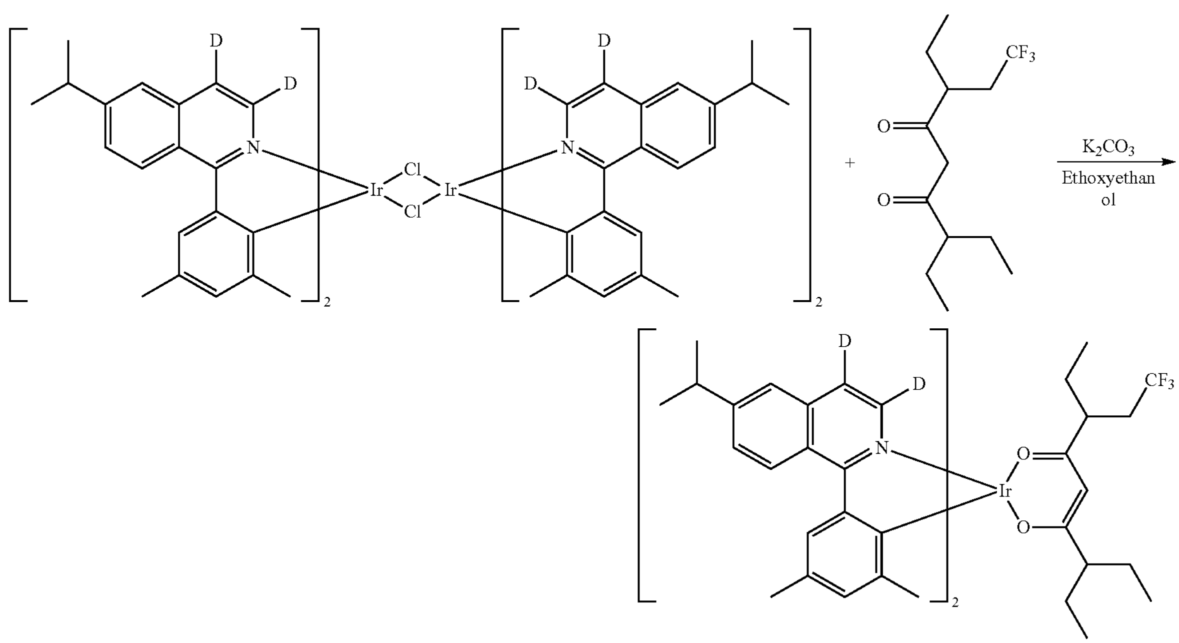

$Ir(L_{a126})_2(L_{b361})$

The mixture of the iridium dimer (1.33 g, 0.85 mmol) obtained in Step 1, 3,7-diethyl-1,1,1-trifluorononane-4,6-dione (679 mg, 2.55 mmol), potassium carbonate (1.17 g, 8.5 mmol) and 2-ethoxyethanol (28 mL) was stirred at room temperature under nitrogen for 24 h. After the TLC showed that the reaction was completed, Celite was added into a funnel, and the reaction mixture was poured into the funnel. The above mixture was filtered, and the filter cake was washed several times with ethanol. The product in the filter cake was washed with dichloromethane into the solution. A certain amount of ethanol was then added into the solution, and dichloromethane in the solution was carefully removed on a rotary evaporator. A red solid was precipitated from the solution and filtered. The resulting solid was washed several times with ethanol. The solvent was removed by suction filtration to obtain Compound $Ir(L_{a126})_2(L_{b361})$ as a red solid (1.29 g, yield: 75%). The obtained product was confirmed as the target product with a molecular weight of 1010.

Synthesis Example 2: Synthesis of Compound $Ir(L_{a577})_2(L_{b378})$

Step 1: Synthesis of an Iridium Dimer

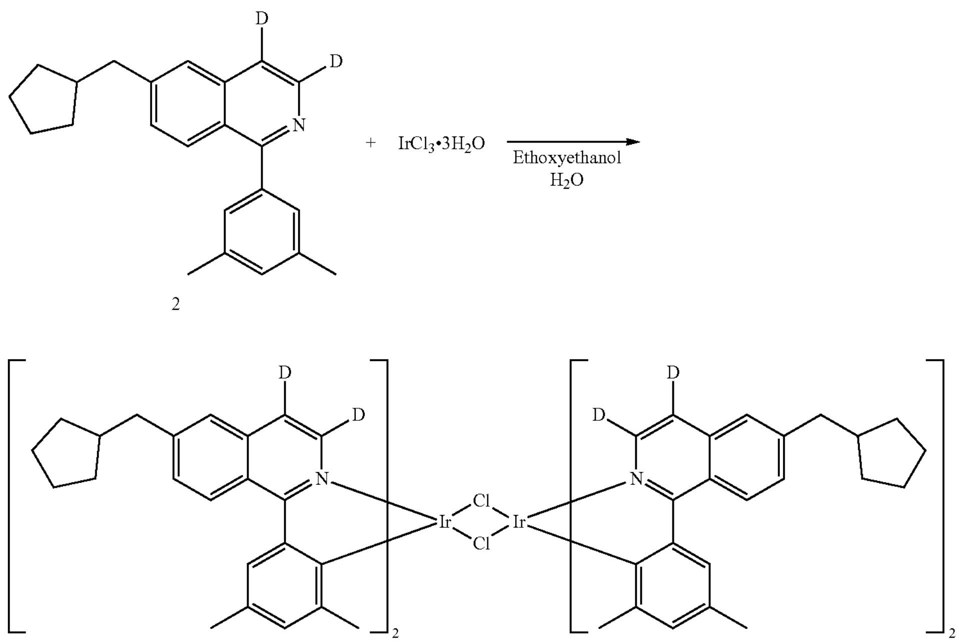

Intermediate 2 (3.34 g, 10.53 mmol), iridium trichloride trihydrate (1.24 g, 3.51 mmol), ethoxyethanol (39 mL) and water (13 mL) were added into a 100 mL round bottom flask. The resulting reaction mixture was bubbled with nitrogen gas for 3 min. The reaction was heated to reflux under nitrogen for 24 h, and the reaction solution changed from yellow green to dark red. After that the reaction was cooled to room temperature and filtered. The filtered solid was washed several times with methanol and then dried to obtain an iridium dimer (2.65 g, yield: 87.8%).

Step 2: Synthesis of Compound $Ir(L_{a577})_2(L_{b378})$

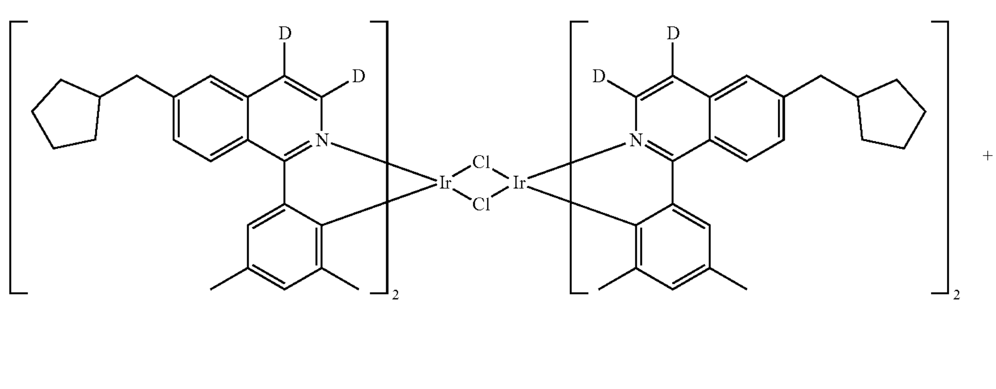

-continued

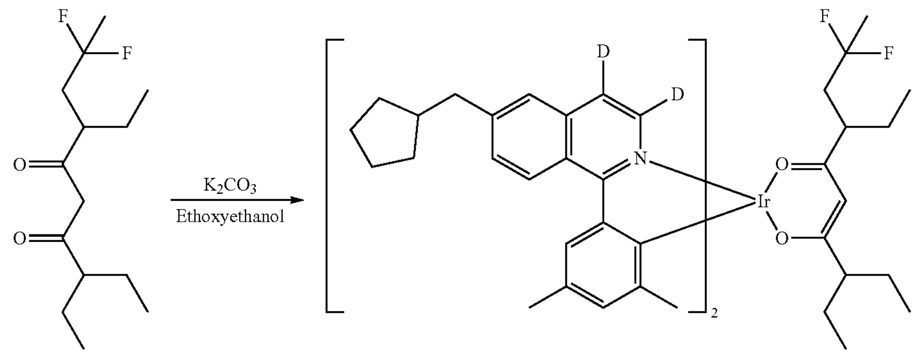

$Ir(L_{a577})_2(L_{b378})$

The mixture of the iridium dimer (1.33 g, 0.77 mmol) obtained in Step 1, 3,7-diethyl-9,9-difluoro-decane-4,6-dione (808 mg, 3.1 mmol), potassium carbonate (1.06 g, 7.71 mmol) and 2-ethoxyethanol (22 mL) was stirred at room temperature under nitrogen for 24 h. After the TLC showed that the reaction was completed, Celite was added into a funnel, and the reaction mixture was poured into the funnel. The above mixture was filtered, and the filter cake was washed several times with ethanol. The product in the filter cake was washed with dichloromethane into the solution. A certain amount of ethanol was then added into the solution, and dichloromethane in the solution was carefully removed on a rotary evaporator. A red solid was precipitated from the solution and filtered. The resulting solid was washed several times with ethanol. The solvent was removed by suction filtration to obtain Compound $Ir(L_{a577})_2(L_{b378})$ as a red solid (1.4 g, yield: 83.5%). The obtained product was confirmed as the target product with a molecular weight of 1087.

Synthesis Example 3: Synthesis of Compound $Ir(L_{a577})_2(L_{b361})$

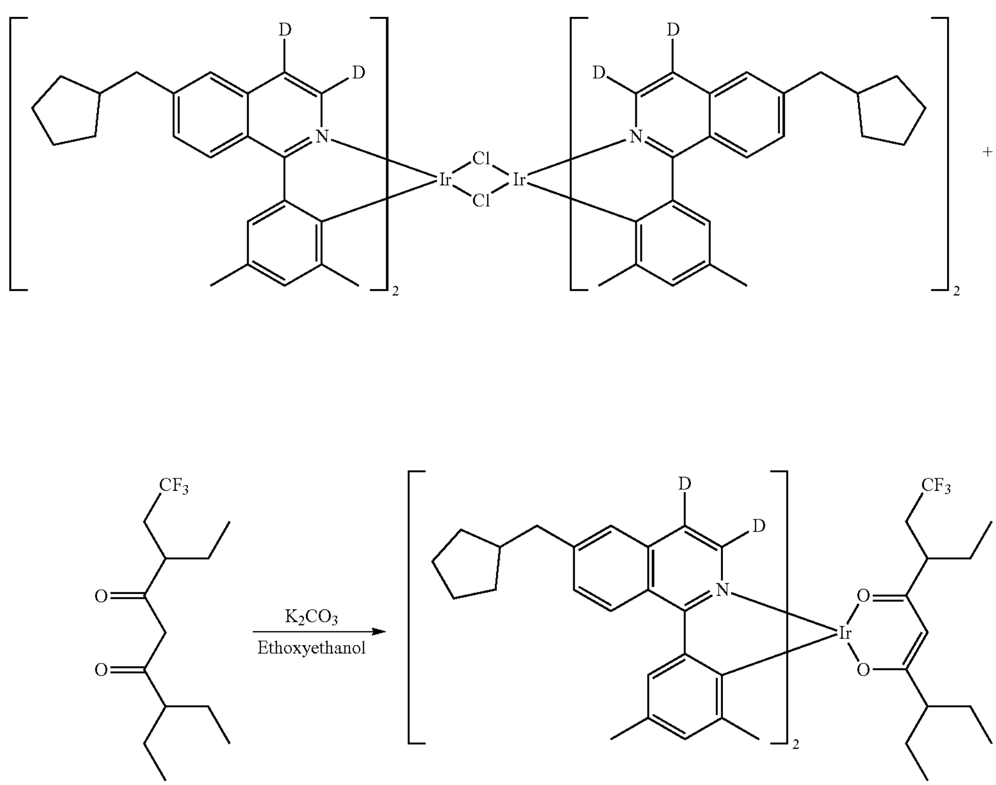

$Ir(L_{a577})_2(L_{b361})$

The mixture of the iridium dimer (1.33 g, 0.77 mmol), 3,7-diethyl-1,1,1-trifluorononane-4,6-dione (820 mg, 3.1 mmol), potassium carbonate (1.06 g, 7.71 mmol) and 2-ethoxyethanol (22 mL) was stirred at room temperature under nitrogen for 24 h. After the TLC showed that the reaction was completed, Celite was added into a funnel, and the reaction mixture was poured into the funnel. The above mixture was filtered, and the filter cake was washed several times with ethanol. The product in the filter cake was washed with dichloromethane into the solution. A certain amount of ethanol was then added into the solution, and dichloromethane in the solution was carefully removed on a rotary evaporator. A red solid was precipitated from the solution and filtered. The resulting solid was washed several times with ethanol. The solvent was removed by suction filtration to obtain Compound $Ir(L_{a577})_2(L_{b361})$ as a red solid (1.4 g, yield: 83.4%). The obtained product was confirmed as the target product with a molecular weight of 1091.

Synthesis Example 4: Synthesis of Compound $Ir(L_{a331})_2(L_{b378})$

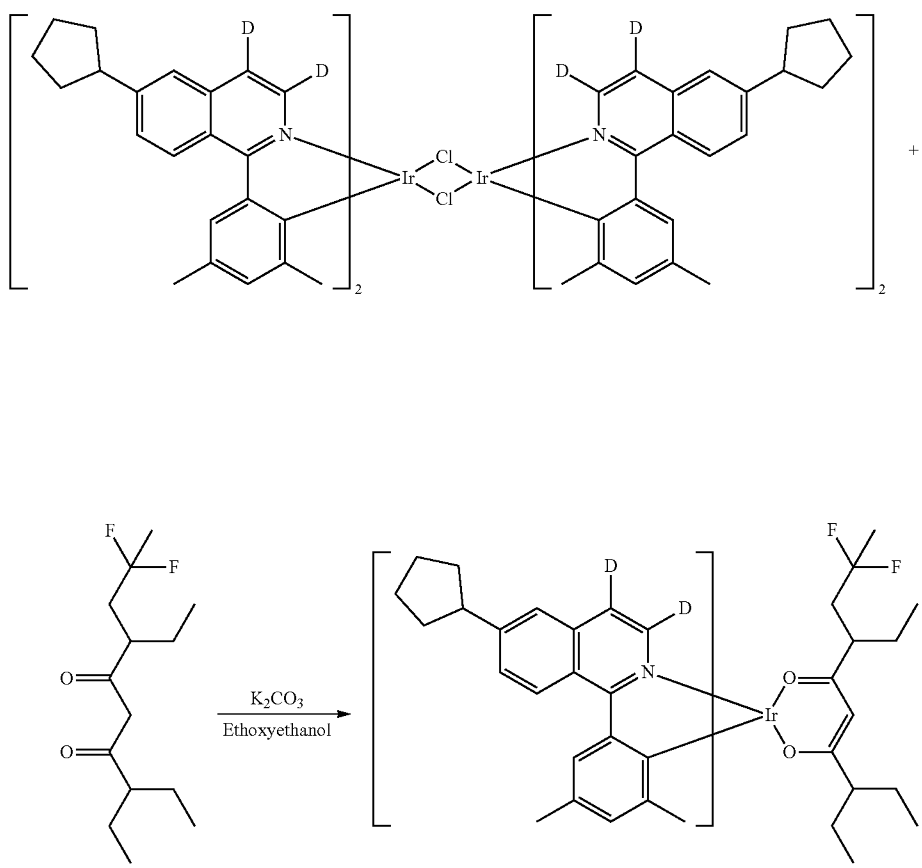

$Ir(L_{a331})_2(L_{b378})$

The mixture of the iridium dimer (1.2 g, 0.72 mmol), 3,7-diethyl-9,9-difluoro-decane-4,6-dione (755 mg, 2.88 mmol), potassium carbonate (995 mg, 7.2 mmol) and 2-ethoxyethanol (24 mL) was stirred at room temperature under nitrogen for 24 h. After the TLC showed that the reaction was completed, Celite was added into a funnel, and the reaction mixture was poured into the funnel. The above mixture was filtered, and the filter cake was washed several times with ethanol. The product in the filter cake was washed with dichloromethane into the solution. A certain amount of ethanol was then added into the solution, and dichloromethane in the solution was carefully removed on a rotary evaporator. A red solid was precipitated from the solution and filtered. The resulting solid was washed several times with ethanol. The solvent was removed by suction filtration to obtain Compound $Ir(L_{a331})_2(L_{b378})$ as a red solid (1.4 g, yield: 92%). The obtained product was confirmed as the target product with a molecular weight of 1059.

Synthesis Example 5: Synthesis of Compound $Ir(L_{a331})_2(L_{b361})$

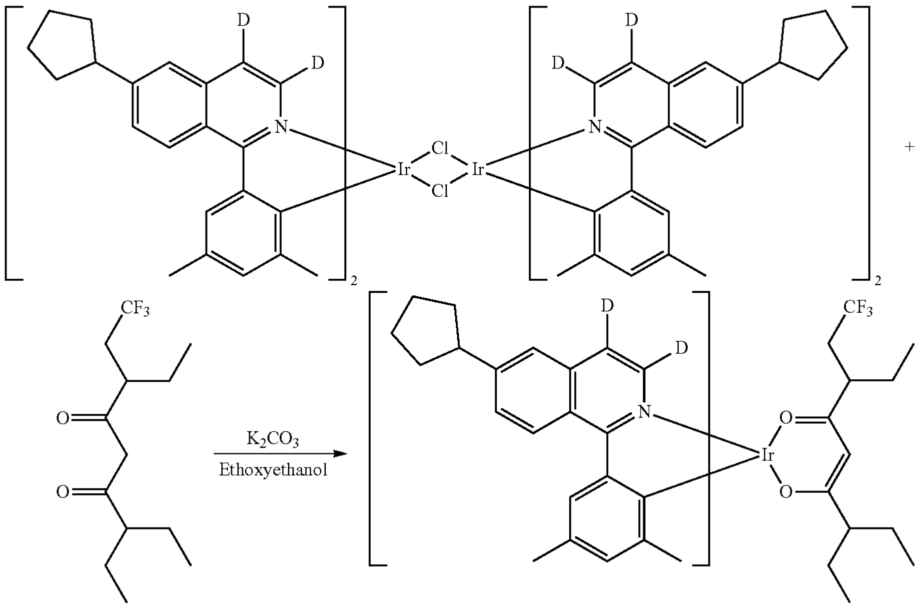

$Ir(L_{a331})_2(L_{b361})$

The mixture of the iridium dimer (1.24 g, 0.745 mmol), 3,7-diethyl-1,1,1-trifluorononane-4,6-dione (793 mg, 2.98 mmol), potassium carbonate (1.03 g, 7.45 mmol) and 2-ethoxyethanol (25 mL) was stirred at room temperature under nitrogen for 24 h. After the TLC showed that the reaction was completed, Celite was added into a funnel, and the reaction mixture was poured into the funnel. The above mixture was filtered, and the filter cake was washed several times with ethanol. The product in the filter cake was washed with dichloromethane into the solution. A certain amount of ethanol was then added into the solution, and dichloromethane in the solution was carefully removed on a rotary evaporator. A red solid was precipitated from the solution and filtered. The resulting solid was washed several times with ethanol. The solvent was removed by suction filtration to obtain Compound $Ir(L_{a331})_z(L_{b361})$ as a red solid (1.29 g, yield: 82%). The obtained product was confirmed as the target product with a molecular weight of 1062.

Synthesis Example 6: Synthesis of Compound $Ir(L_{a577})_2(L_{b31})$

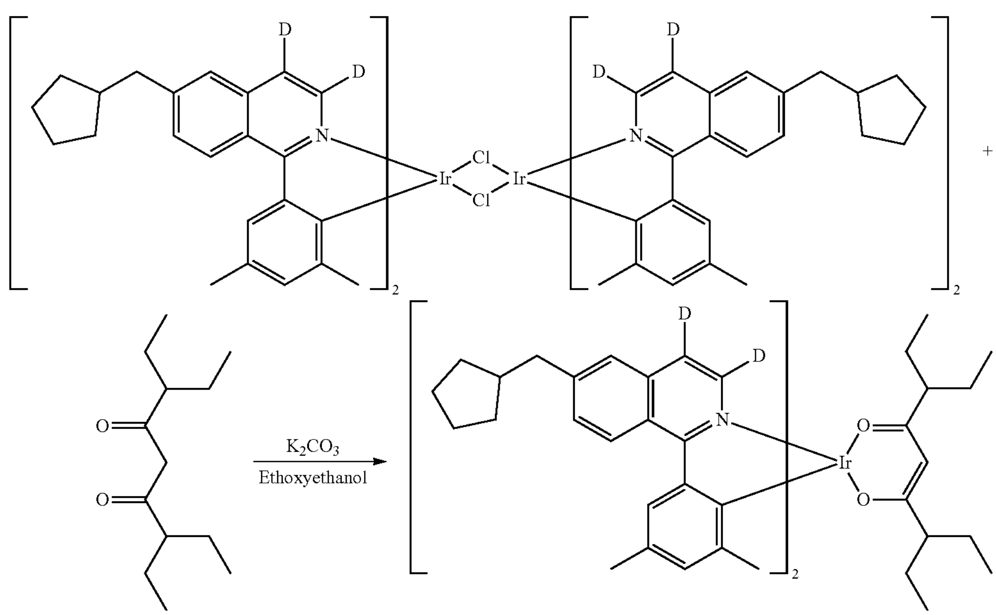

$Ir(L_{a577})_2(L_{b31})$

The mixture of the iridium dimer (1.25 g, 0.8 mmol), 3,7-diethylnonane-4,6-dione (650 mg, 3.2 mmol), potassium carbonate (1.11 g, 8 mmol) and 2-ethoxyethanol (25 mL) was stirred at room temperature under nitrogen for 24 h. After the TLC showed that the reaction was completed, Celite was added into a funnel, and the reaction mixture was poured into the funnel. The above mixture was filtered, and the filter cake was washed several times with ethanol. The product in the filter cake was washed with dichloromethane into the solution. A certain amount of ethanol was then added into the solution, and dichloromethane in the solution was carefully removed on a rotary evaporator. A red solid was precipitated from the solution and filtered. The resulting solid was washed several times with ethanol. The solvent was removed by suction filtration to obtain Compound $Ir(L_{a577})_2(L_{b31})$ as a red solid (1.09 g, yield: 66%). The obtained product was confirmed as the target product with a molecular weight of 1037.

Synthesis Example 7: Synthesis of Compound $Ir(L_{a577})_2(L_{b116})$

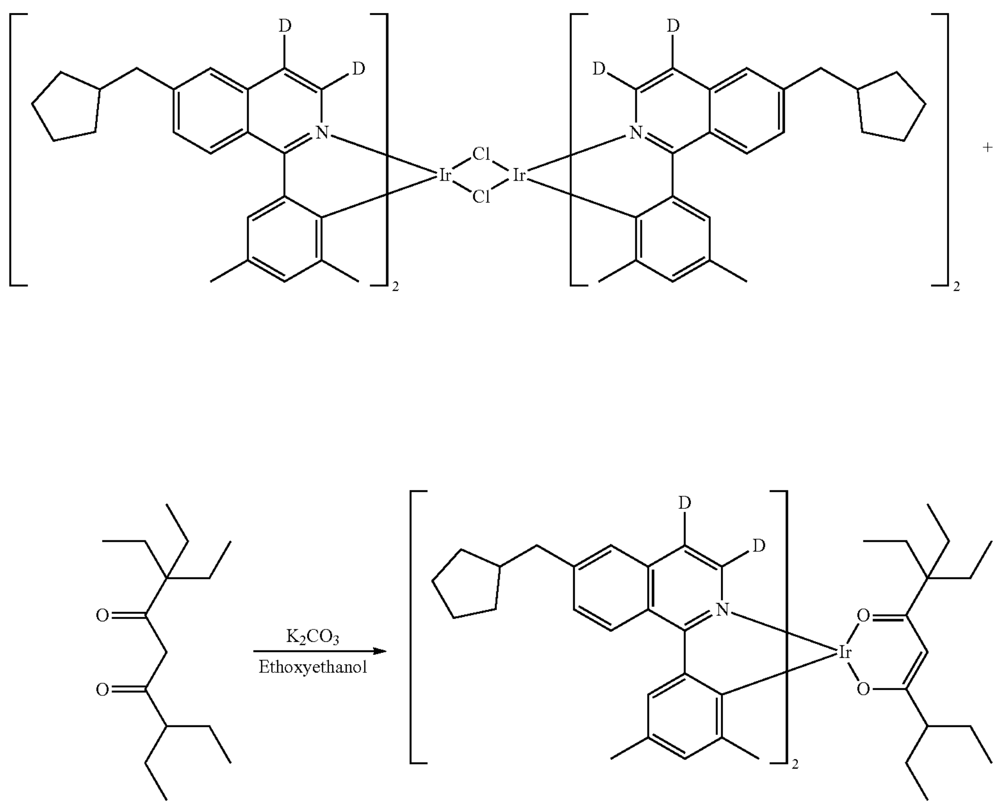

$Ir(L_{a577})_2(L_{b116})$

The mixture of the iridium dimer (1.2 g, 0.8 mmol), 3,3,7-triethylnonane-4,6-dione (500 mg, 2.4 mmol), potassium carbonate (1.11 g, 8 mmol) and 2-ethoxyethanol (25 mL) was stirred at room temperature under nitrogen for 24 h. After the TLC showed that the reaction was completed, Celite was added into a funnel, and the reaction mixture was poured into the funnel. The above mixture was filtered, and the filter cake was washed several times with ethanol. The product in the filter cake was washed with dichloromethane into the solution. A certain amount of ethanol was then added into the solution, and dichloromethane in the solution was carefully removed on a rotary evaporator. A red solid was precipitated from the solution and filtered. The resulting solid was washed several times with ethanol. The solvent was removed by suction filtration to obtain Compound $Ir(L_{a577})_2(L_{b116})$ as a red solid (1.1 g, yield: 65%). The obtained product was confirmed as the target product with a molecular weight of 1065.

Synthesis Example 8: Synthesis of Compound $Ir(L_{a331})_2(L_{b116})$

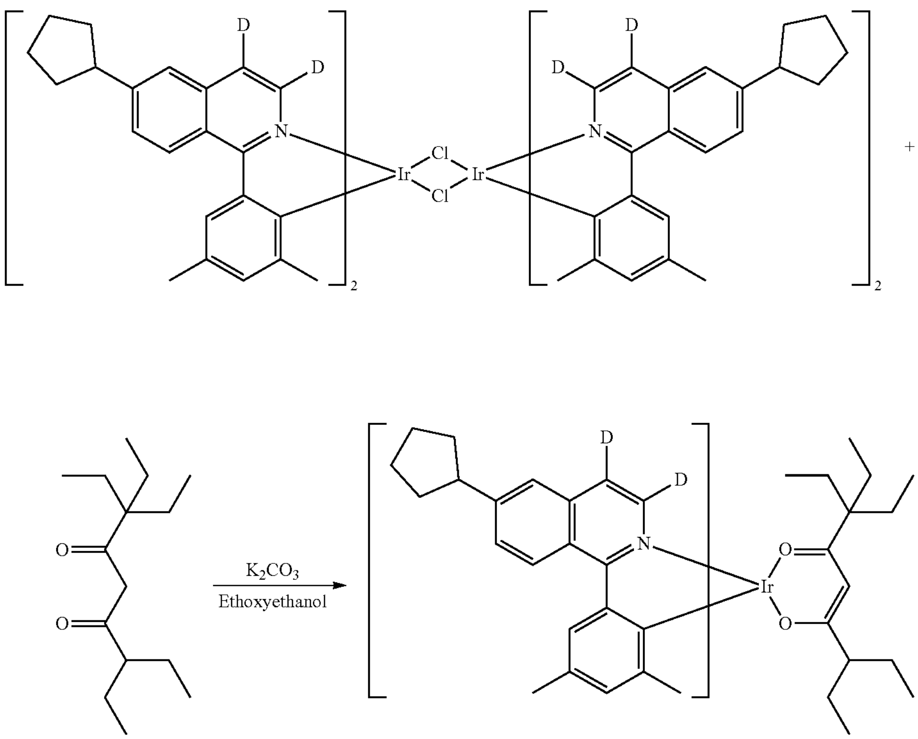

$Ir(L_{a331})_2(L_{b116})$

The mixture of the iridium dimer (1.25 g, 0.75 mmol), 3,3,7-triethylnonane-4,6-dione (540 mg, 2.25 mmol), potassium carbonate (1.04 g, 7.5 mmol) and 2-ethoxyethanol (22 mL) was stirred at room temperature under nitrogen for 24 h. After the TLC showed that the reaction was completed, Celite was added into a funnel, and the reaction mixture was poured into the funnel. The above mixture was filtered, and the filter cake was washed several times with ethanol. The product in the filter cake was washed with dichloromethane into the solution. A certain amount of ethanol was then added into the solution, and dichloromethane in the solution was carefully removed on a rotary evaporator. A red solid was precipitated from the solution and filtered. The resulting solid was washed several times with ethanol. The solvent was removed by suction filtration to obtain Compound $Ir(L_{a331})_2(L_{b116})$ as a red solid (1.25 g, yield: 83%). The obtained product was confirmed as the target product with a molecular weight of 1037.

Synthesis Example 9: Synthesis of Compound $Ir(L_{a331})(L_{b361})(L_{c161})$

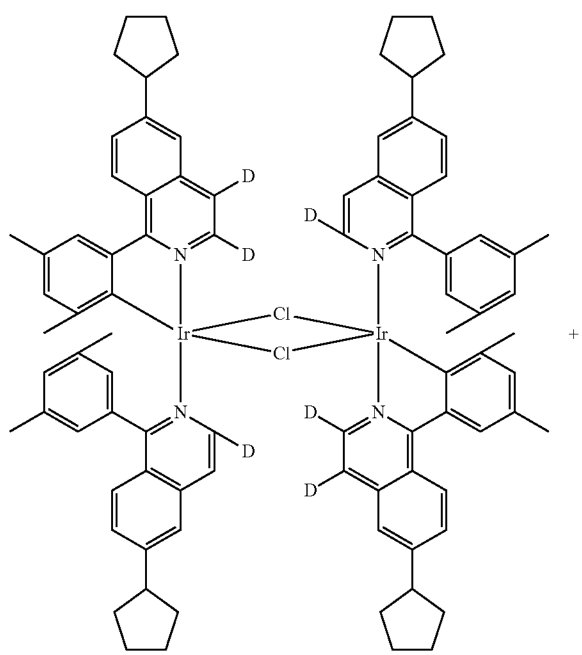

-continued

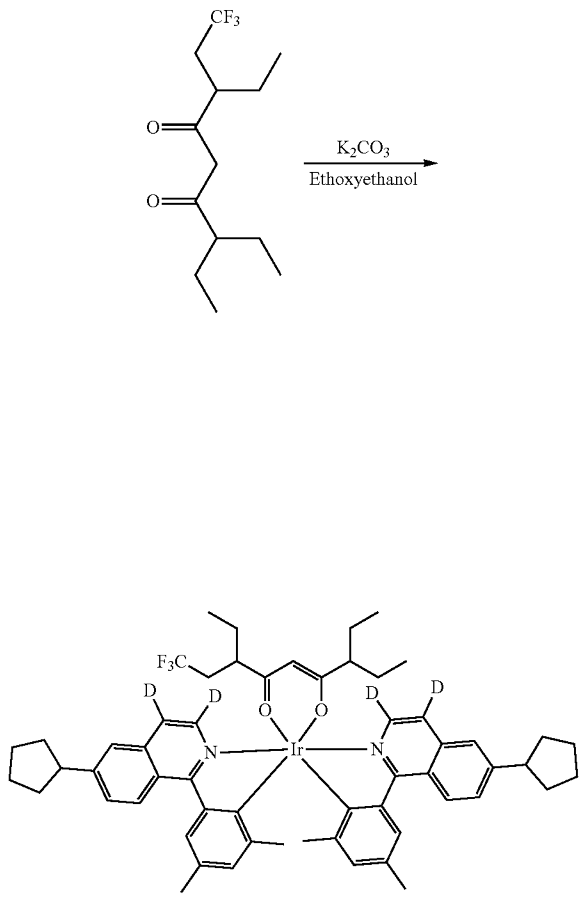

Ir(L$_{a331}$)(L$_{b361}$)(L$_{c161}$)

The mixture of the iridium dimer (0.9 g, 0.5 mmol), 3,7-diethyl-1,1,1-trifluorononane-4,6-dione (0.5 g, 2 mmol), potassium carbonate (1 g, 5.3 mmol) and 2-ethoxyethanol (12 mL) was stirred at room temperature under nitrogen for 24 h. After the TLC showed that the reaction was completed, Celite was added into a funnel, and the reaction mixture was poured into the funnel. The above mixture was filtered, and the filter cake was washed several times with ethanol. The product in the filter cake was washed with dichloromethane into the solution. A certain amount of ethanol was then added into the solution, and dichloromethane in the solution was carefully removed on a rotary evaporator. A red solid was precipitated from the solution and filtered. The resulting solid was washed several times with ethanol. The solvent was removed by suction filtration to obtain Compound Ir(L$_{a331}$)(L$_{b361}$)(L$_{c161}$) as a red solid (0.82 g, yield: 75%). The obtained product was confirmed as the target product with a molecular weight of 1061.

Synthesis Example 10: Synthesis of Compound Ir(L$_{a126}$)(L$_{b361}$)(L$_{c141}$)

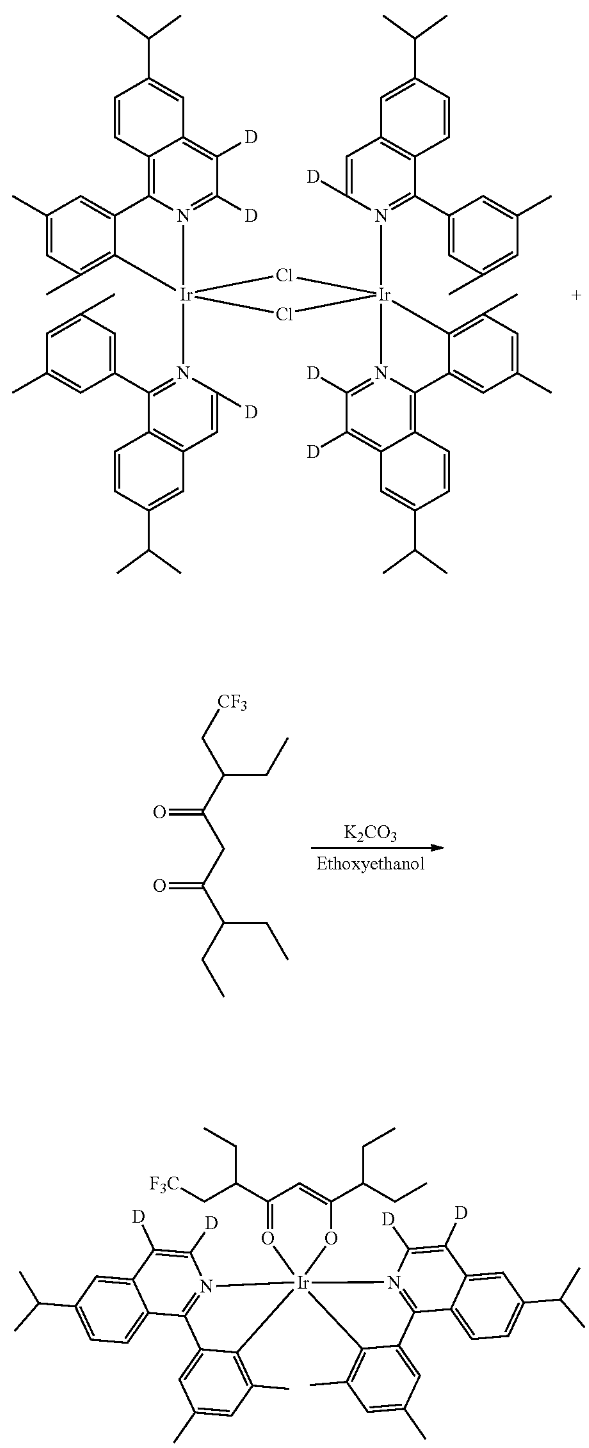

Ir(L$_{a126}$)(L$_{b361}$)(L$_{c141}$)

The mixture of the iridium dimer (1.14 g, 0.7 mmol), 3,7-diethyl-1,1,1-trifluorononane-4,6-dione (0.5 g, 2 mmol), potassium carbonate (1 g, 5.3 mmol) and 2-ethoxyethanol (12 mL) was stirred at room temperature under nitrogen for 24 h. After the TLC showed that the reaction was completed, Celite was added into a funnel, and the reaction mixture was poured into the funnel. The above mixture was filtered, and the filter cake was washed several times with ethanol. The product in the filter cake was washed with dichloromethane into the solution. A certain amount of ethanol was then added into the solution, and dichloromethane in the solution was carefully removed on a rotary evaporator. A red solid was precipitated from the solution and filtered. The resulting solid was washed several times with ethanol. The solvent was removed by suction filtration to obtain Compound $Ir(L_{a126})(L_{b361})(L_{c141})$ as a red solid (1.1 g, yield: 79%). The obtained product was confirmed as the target product with a molecular weight of 1009.

Those skilled in the art will appreciate that the above preparation methods are merely illustrative. Those skilled in the art can obtain other compound structures of the present disclosure through the modifications of the preparation methods.

Device Example 1

First, a glass substrate having an Indium Tin Oxide (ITO) anode having a thickness of 120 nm was cleaned and then treated with oxygen plasma and UV ozone. After the treatment, the substrate was dried in a glovebox to remove water. Next, the substrate was mounted on a substrate holder and placed in a vacuum chamber. Organic layers specified below were sequentially deposited through vacuum thermal evaporation on the ITO anode at a rate of 0.2 to 2 Angstroms per second at a vacuum degree of about $10^{-8}$ torr. Compound HI was used as a hole injection layer (HIL). Compound HT was used as a hole transporting layer (HTL). Compound EB was used as an electron blocking layer (EBL). Then, Compound $Ir(L_{a126})_2(L_{b361})$ of the present disclosure was doped at 3% in a host Compound RH and then used as an emissive layer (EML). Compound HB was used as a hole blocking layer (HBL). On the HBL, Compound ET and 8-hydroxyquinolinolato-lithium (Liq) were deposited and used as an electron transporting layer (ETL). Finally, Liq having a thickness of 1 nm was used as an electron injection layer, and Al having a thickness of 120 nm was deposited as a cathode. The device was transferred back to the glovebox and encapsulated with a glass lid and a moisture getter to complete the device.

Device Comparative Example 1

The implementation mode in Device Comparative Example 1 was the same as that in Device Example 1, except that in the emissive layer (EML), Compound $Ir(L_{a126})_2(L_{b361})$ of the present disclosure was replaced with Comparative Compound RD1.

Device Comparative Example 2

The implementation mode in Device Comparative Example 2 was the same as that in Device Example 1, except that in the emissive layer (EML), Compound $Ir(L_{a126})_2(L_{b361})$ of the present disclosure was replaced with Comparative Compound RD2.

Device Example 2

The implementation mode in Device Example 2 was the same as that in Device Example 1, except that in the emissive layer (EML), Compound $Ir(L_{a126})_2(L_{b361})$ of the present disclosure was replaced with Compound $Ir(L_{a331})(L_{b361})$ of the present disclosure (the weight ratio of Compound $Ir(L_{a331})_2(L_{b361})$ to Compound RH was 5:95), and that in EBL, Compound EB was replaced with Compound EB1.

Device Example 3

The implementation mode in Device Example 3 was the same as that in Device Example 2, except that in the emissive layer (EML), Compound $Ir(L_{a126})(L_{b361})$ of the present disclosure was replaced with Compound $Ir(L_{a331})_2(L_{b378})$ of the present disclosure.

Device Example 4

The implementation mode in Device Example 4 was the same as that in Device Example 2, except that in the emissive layer (EML), Compound $Ir(L_{a331})_2(L_{b361})$ of the present disclosure was replaced with Compound $Ir(L_{a577})(L_{b378})$ of the present disclosure.

Device Example 5

The implementation mode in Device Example 5 was the same as that in Device Example 2, except that in the emissive layer (EML), Compound $Ir(L_{a331})_2(L_{b361})$ of the present disclosure was replaced with Compound $Ir(L_{a577})_2(L_{b361})$ of the present disclosure.

Device Comparative Example 3

The implementation mode in Device Comparative Example 3 was the same as that in Device Example 2, except that in the emissive layer (EML), Compound $Ir(L_{a331})_2(L_{b361})$ of the present disclosure was replaced with Comparative Compound RD3.

Device Comparative Example 4

The implementation mode in Device Comparative Example 4 was the same as that in Device Example 2, except that in the emissive layer (EML), Compound $Ir(L_{a331})_2(L_{b361})$ of the present disclosure was replaced with Comparative Compound RD4.

Device Comparative Example 5

The implementation mode in Device Comparative Example 5 was the same as that in Device Example 2, except that in the emissive layer (EML), Compound $Ir(L_{a331})_2(L_{b361})$ of the present disclosure was replaced with Comparative Compound RD5.

Detailed structures and thicknesses of layers of the devices are shown in the following table. The layers using more than one material are obtained by doping different compounds at weight proportions as recorded in the following stable.

TABLE 1

| Part device structures in device examples | | | | | | |
|---|---|---|---|---|---|---|
| Device No. | HIL | HTL | EBL | EML | HBL | ETL |
| Example 1 | Compound HI (100 Å) | Compound HT (400 Å) | Compound EB (50 Å) | Compound RH:Compound $Ir(L_{a126})_2(L_{b361})$ (97:3) (400 Å) | Compound HB (50 Å) | Compound ET:Liq (40:60) (350 Å) |
| Comparative Example 1 | Compound HI (100 Å) | Compound HT (400 Å) | Compound EB (50 Å) | Compound RH:Compound RD1 (97:3) (400 Å) | Compound HB (50 Å) | Compound ET:Liq (40:60) (350 Å) |
| Comparative Example 2 | Compound HI (100 Å) | Compound HT (400 Å) | Compound EB (50 Å) | Compound RH:Compound RD2 (97:3) (400 Å) | Compound HB (50 Å) | Compound ET:Liq (40:60) (350 Å) |
| Example 2 | Compound HI (100 Å) | Compound HT (400 Å) | Compound EB1 (50 Å) | Compound RH:Compound $Ir(L_{a331})_2(L_{b361})$ (95:5) (400 Å) | Compound HB (50 Å) | Compound ET:Liq (40:60) (350 Å) |
| Example 3 | Compound HI (100 Å) | Compound HT (400 Å) | Compound EB1 (50 Å) | Compound RH:Compound $Ir(L_{a331})_2(L_{b378})$ (95:5) (400 Å) | Compound HB (50 Å) | Compound ET:Liq (40:60) (350 Å) |
| Example 4 | Compound HI (100 Å) | Compound HT (400 Å) | Compound EB1 (50 Å) | Compound RH:Compound $Ir(L_{a577})_2(L_{b378})$ (95:5) (400 Å) | Compound HB (50 Å) | Compound ET:Liq (40:60) (350 Å) |
| Example 5 | Compound HI (100 Å) | Compound HT (400 Å) | Compound EB1 (50 Å) | Compound RH:Compound $Ir(L_{a577})_2(L_{b361})$ (95:5) (400 Å) | Compound HB (50 Å) | Compound ET:Liq (40:60) (350 Å) |
| Comparative Example 3 | Compound HI (100 Å) | Compound HT (400 Å) | Compound EB1 (50 Å) | Compound RH:Compound RD3 (95:5) (400 Å) | Compound HB (50 Å) | Compound ET:Liq (40:60) (350 Å) |
| Comparative Example 4 | Compound HI (100 Å) | Compound HT (400 Å) | Compound EB1 (50 Å) | Compound RH:Compound RD4 (95:5) (400 Å) | Compound HB (50 Å) | Compound ET:Liq (40:60) (350 Å) |
| Comparative Example 5 | Compound HI (100 Å) | Compound HT (400 Å) | Compound EB1 (50 Å) | Compound RH:Compound RD5 (95:5) (400 Å) | Compound HB (50 Å) | Compound ET:Liq (40:60) (350 Å) |

Structures of the materials used in the devices are shown as follows:

Compound HI

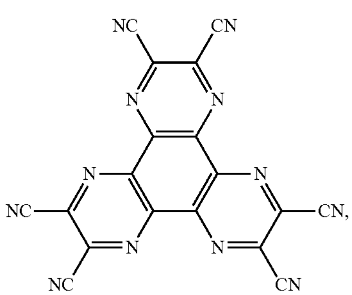

-continued

Compound HT

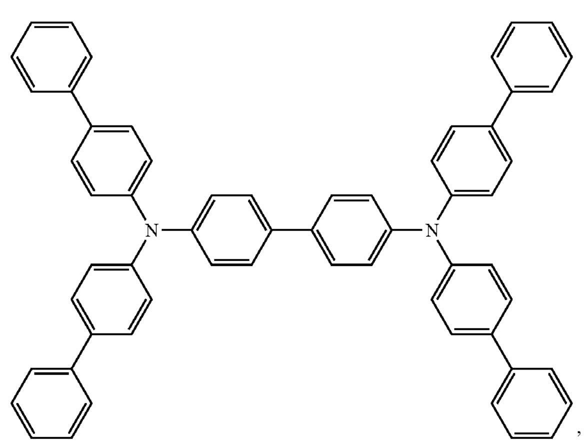

-continued
Compound EB
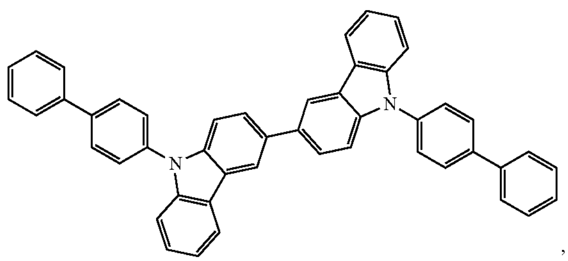
,
Compound HB
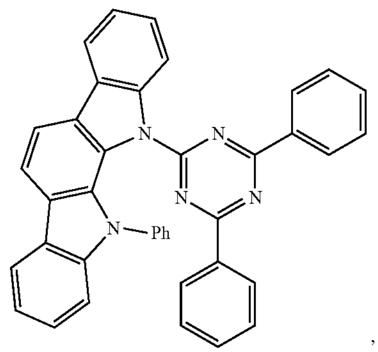
,
Compound EB1
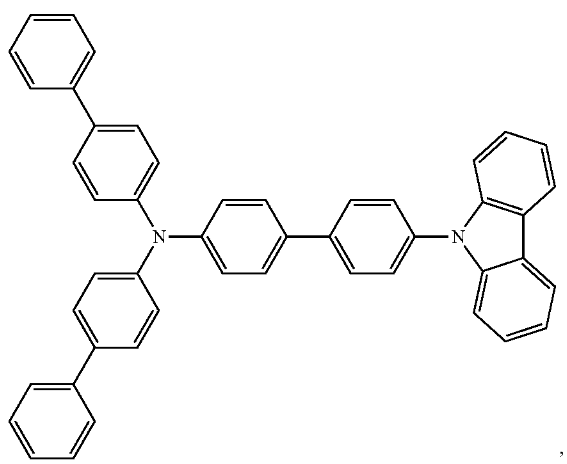
,
Compound RH
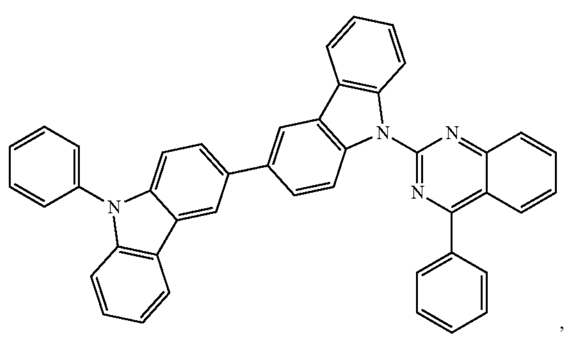
,
Compound Liq
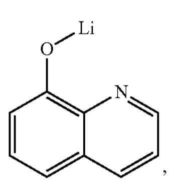
,
-continued
Compound ET
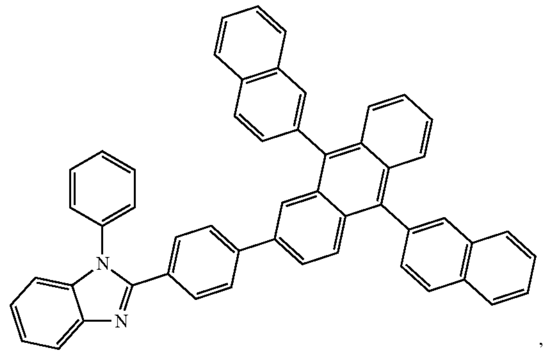
,
Compound $Ir(L_{a126})_2(L_{b361})$
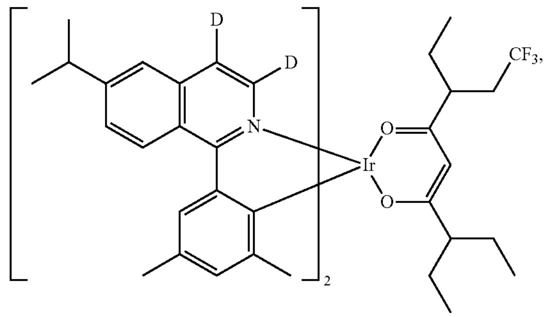
RD1
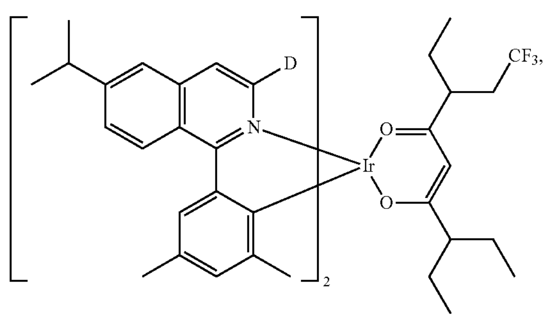
RD2
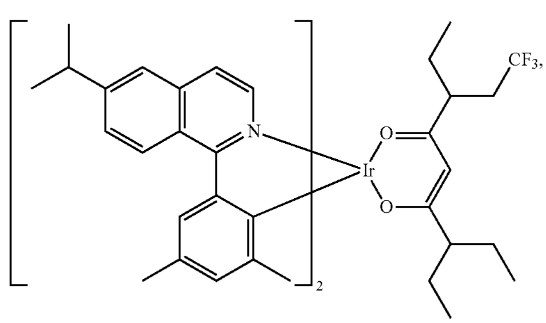

-continued

Compound $Ir(L_{a331})_2(L_{b361})$

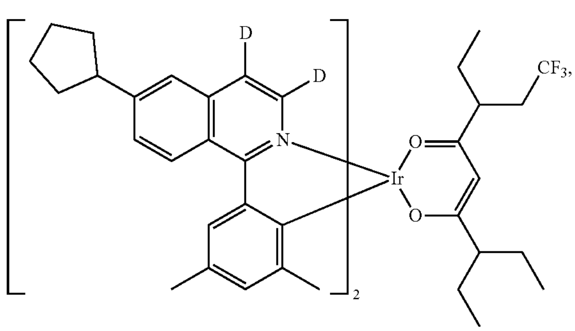

Compound $Ir(L_{a331})_2(L_{b378})$

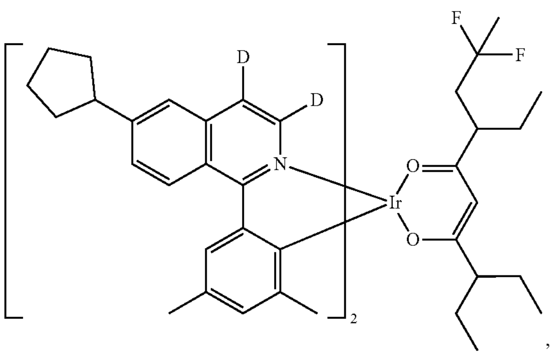

Compound $Ir(L_{a577})_2(L_{b378})$

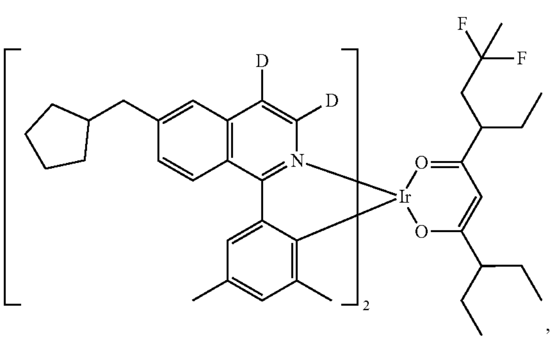

Compound $Ir(L_{a577})_2(L_{b361})$

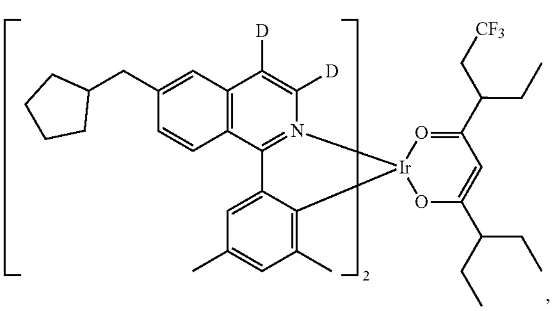

-continued

RD3

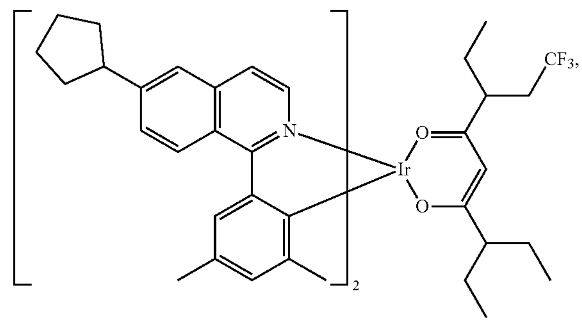

RD4

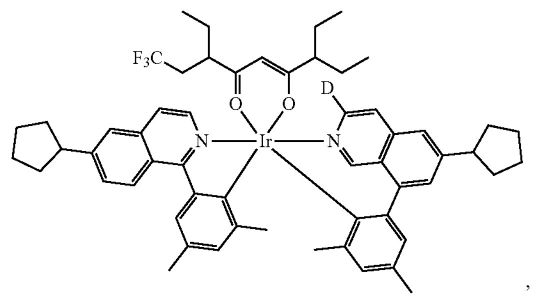

, and

RD5

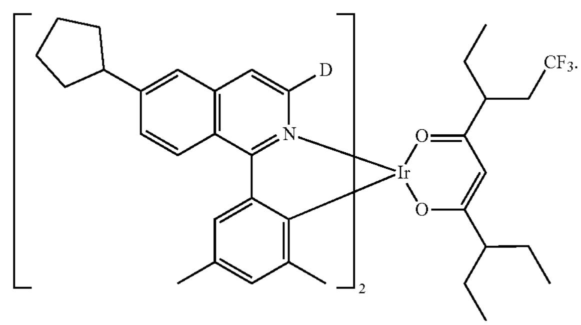

Table 2 shows data of chromaticity coordinates (CIE) and emission wavelengths ($\lambda_{max}$) measured at a brightness of 1000 Nits, and external quantum efficiency (EQE) measured at a constant current density of 15 mA/cm$^2$ for devices in Device Examples 1 and Comparative Examples 1 to 2 and Device Examples 2 to 5 and Comparative Examples 3 to 5. The device lifetime LT97 was measured at a constant current density of 80 mA/cm$^2$.

TABLE 2

| Device data | | | | |
|---|---|---|---|---|
| Device No. | CIE (x, y) | λmax (nm) | EQE (%) | LT97 (h) |
| Example 1 | 0.677, 0.322 | 620 | 24.20 | 106 |
| Comparative Example 1 | 0.677, 0.322 | 620 | 23.26 | 98 |
| Comparative Example 2 | 0.678, 0.322 | 620 | 23.11 | 86 |
| Example 2 | 0.678, 0.321 | 622 | 23.41 | 64 |
| Example 3 | 0.682, 0.317 | 625 | 23.23 | 70 |
| Example 4 | 0.683, 0.316 | 624 | 23.97 | 57 |
| Example 5 | 0.679, 0.320 | 622 | 24.73 | 57 |
| Comparative Example 3 | 0.679, 0.320 | 622 | 22.85 | 52 |

TABLE 2-continued

| Device data | | | | |
|---|---|---|---|---|
| Device No. | CIE (x, y) | λmax (nm) | EQE (%) | LT97 (h) |
| Comparative Example 4 | 0.679, 0.320 | 622 | 22.91 | 59 |
| Comparative Example 5 | 0.680, 0.320 | 622 | 23.39 | 54 |

Discussion:

From the data shown in Table 2 and the comparison of Example 1 and Comparative Examples 1 and 2, it can be found that the chromaticity coordinates and emission wavelengths are approximate. However, most importantly, compared with the device in Comparative Example 1, the lifetime of the device in Example 1 is increased by 8.2%, and the external quantum efficiency is improved by 4.0%; compared with the device in Comparative Example 2, the lifetime of the device in Example 1 is increased by 23.3%, and the external quantum efficiency is improved by 4.7%. It indicates that the di-deuterium substitution at 3- and 4-position of the isoquinoline ligand leads to both lifetime and efficiency improvement, especially the significant increase in lifetime, which confirms the uniqueness and importance of this structural feature.

It can be found from the comparison of Example 2 and Comparative Examples 3 to 5, that the color coordinates and emission wavelengths of the device in Example 2 are approximate to the color coordinates and emission wavelengths of the devices in Comparative Examples 3 to 5. However, most importantly, compared with the device in Comparative Example 3, the lifetime of the device in Example 2 is increased by 23%, and the external quantum efficiency is improved by 2.4%; compared with the device in Comparative Example 4, the lifetime of the device in Example 2 is increased by 8.5%, and the external quantum efficiency is improved by 2.2%; compared with the device in Comparative Example 5, the lifetime of the device in Example 2 is increased by 18.5%, and the external quantum efficiency is slightly improved. The data of Examples 3 to 5 also demonstrate high lifetime and high efficiency characteristics similar to those in Example 2. These device results indicate that the di-deuterium substitution at 3- and 4-position of the isoquinoline ligand leads to both lifetime and efficiency improvement, especially the significant increase in lifetime, which again confirms the uniqueness and importance of this structural feature.

It should be understood that various embodiments described herein are examples and not intended to limit the scope of the present disclosure. Therefore, it is apparent to those skilled in the art that the present disclosure as claimed may include variations of specific embodiments and preferred embodiments described herein. Many of the materials and structures described herein may be replaced with other materials and structures without departing from the spirit of the present disclosure. It should be understood that various theories as to why the present disclosure works are not intended to be limitative.

What is claimed is:

1. A metal complex, which has a general structure of $M(L_a)_m(L_b)_n(L_c)_q$, wherein $L_a$, $L_b$ and $L_c$ are the first ligand, the second ligand and the third ligand coordinated to the metal M, respectively; wherein the metal M is a metal whose atomic mass is greater than 40;

wherein $L_a$, $L_b$ and $L_c$ may be optionally joined to form a multi-dentate ligand;

wherein m is 1 or 2, n is 1 or 2, q is 0 or 1, and m+n+q equals to the oxidation state of the metal M;

when m is greater than 1, $L_a$ may be the same or different; and when n is greater than 1, $L_b$ may be the same or different;

wherein the first ligand $L_a$ has a structure represented by Formula 1:

Formula 1

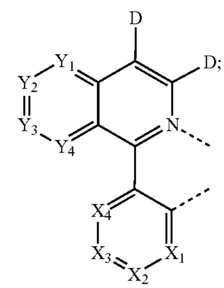

wherein $X_1$ to $X_4$ are, at each occurrence identically or differently, selected from $CR_1$ or N;

wherein $Y_1$ to $Y_4$ are, at each occurrence identically or differently, selected from $CR_2$ or N;

wherein $R_2$ is, at each occurrence identically or differently, selected from the group consisting of: hydrogen, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

wherein $R_1$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

in Formula 1, adjacent substituents can be optionally joined to form a ring;

wherein the second ligand $L_b$ has a structure represented by Formula 2:

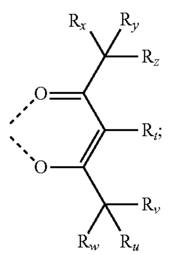

Formula 2 wherein $R_t$ to $R_z$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

in Formula 2, adjacent substituents can be optionally joined to form a ring;

wherein the third ligand $L_e$ is a monoanionic bidentate ligand.

2. The metal complex according to claim 1, wherein the metal M is selected from Pt or Ir.

3. The metal complex according to claim 1, wherein $X_1$ to $X_4$ are, at each occurrence identically or differently, selected from $CR_1$.

4. The metal complex according to claim 1, wherein $X_1$ and/or $X_3$ are, at each occurrence identically or differently, selected from $CR_1$, and $R_1$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted aralkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

wherein adjacent substituents $R_1$ can be optionally joined to form a ring.

5. The metal complex according to claim 1, wherein $X_1$ and $X_4$ are CH, and $X_2$ and $X_3$ are, at each occurrence identically or differently, selected from $CR_1$.

6. The metal complex according to claim 1, wherein $R_1$ is, at each occurrence identically or differently, selected from the group consisting of: hydrogen, deuterium, fluorine, methyl, ethyl, 2-butyl, isopropyl, tert-butyl, isobutyl, cyclopentyl, cyclohexyl, deuteromethyl, deuteropropyl, isopropylamino, phenyl, 2,6-dimethylphenyl, pyridyl, vinyl, and combinations thereof;

wherein adjacent substituents $R_1$ can be optionally joined to form a ring.

7. The metal complex according to claim 1, wherein $Y_1$ to $Y_4$ are, at each occurrence identically or differently, selected from $CR_2$, and $R_2$ is, at each occurrence identically or differently, selected from the group consisting of: hydrogen, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted aralkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

wherein adjacent substituents $R_2$ can be optionally joined to form a ring.

8. The metal complex according to claim 1, wherein $Y_2$ is $CR_2$, and $R_2$ is, at each occurrence identically or differently, selected from the group consisting of: halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted aralkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, a nitrile group, an isonitrile group, a sulfanyl group, a sulfinyl group, a sulfonyl group, a phosphino group, and combinations thereof;

wherein adjacent substituents $R_2$ can be optionally joined to form a ring.

9. The metal complex according to claim 1, wherein $R_2$ is, at each occurrence identically or differently, selected from the group consisting of: hydrogen, fluorine, methyl, ethyl, isopropyl, 2-butyl, isobutyl, tert-butyl, pent-3-yl, cyclopentyl, cyclohexyl, 4,4-dimethylcyclohexyl, neopentyl, 2,4-dimethylpent-3-yl, 1,1-dimethylsilacyclohex-4-yl, cyclopentylmethyl, cyano, trifluoromethyl, trimethylsilyl, phenyldimethylsilyl, bicyclo[2,2,1]pentyl, adamantyl, deuteroisopropyl, phenyl, pyridyl, and combinations thereof.

10. The metal complex according to claim 1, wherein the first ligand $L_a$ is, at each occurrence identically or differently, selected from any one or any two of the group consisting of $L_{a1}$ to $L_{a1085}$, $L_{a1091}$ to $L_{a1094}$, $L_{a1096}$ to $L_{a1189}$:

$L_{a1}$

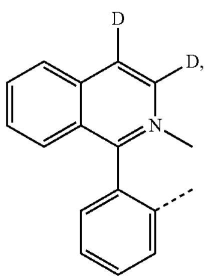

$L_{a2}$

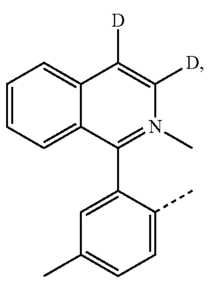

$L_{a3}$

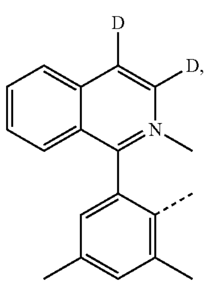

$L_{a4}$

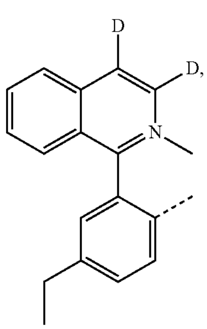

-continued $L_{a5}$

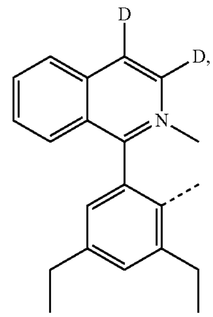

$L_{a6}$

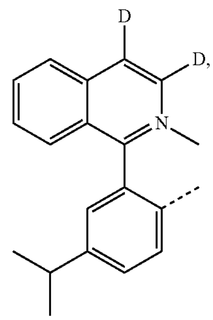

$L_{a7}$

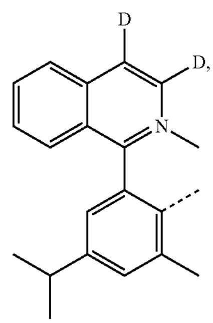

$L_{a8}$

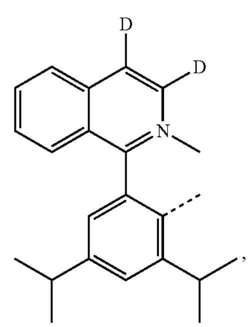

$L_{a9}$

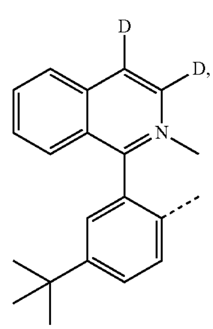

-continued
$L_{a10}$
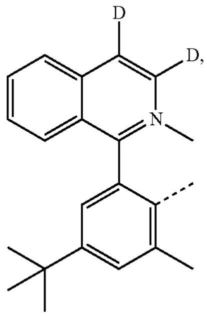
$L_{a11}$
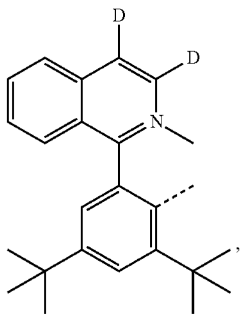
$L_{a12}$
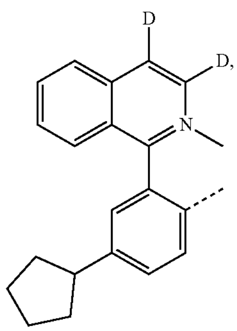
$L_{a13}$
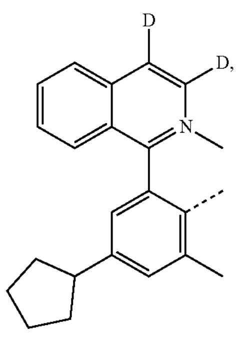
$L_{a14}$
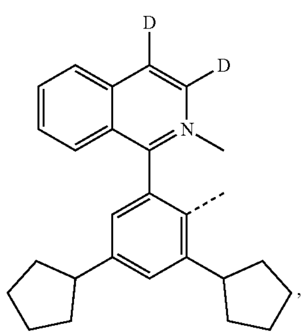
-continued
$L_{a15}$
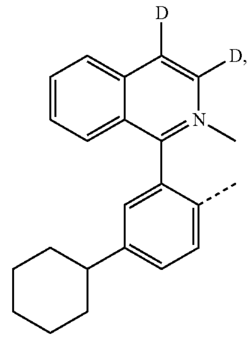
$L_{a16}$
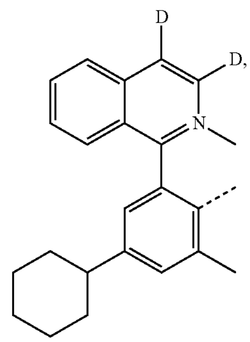
$L_{a17}$
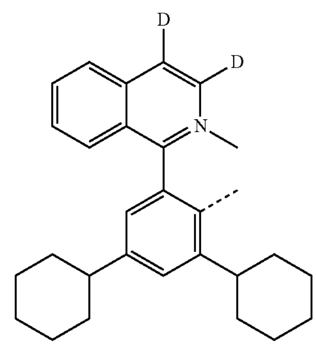
$L_{a18}$
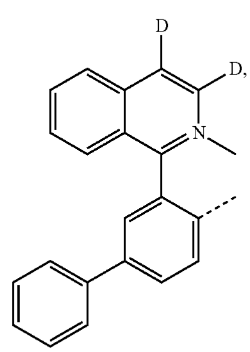

-continued
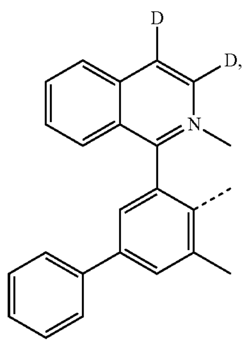
$L_{a19}$
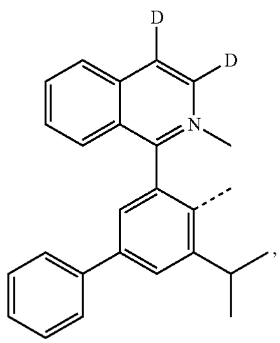
$L_{a20}$
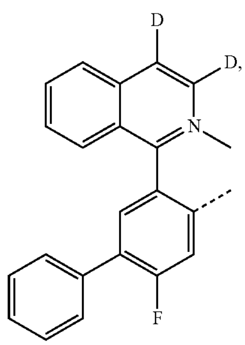
$L_{a21}$
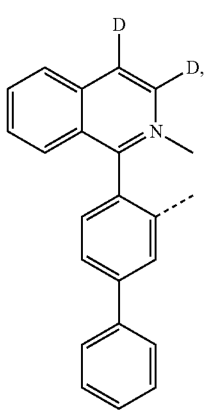
$L_{a22}$
-continued
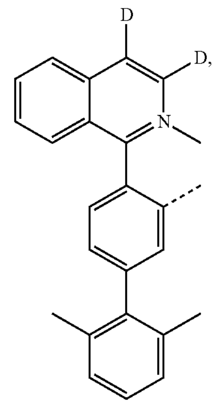
$L_{a23}$
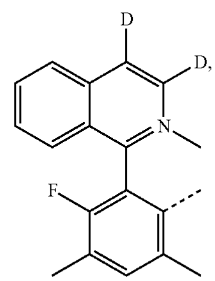
$L_{a24}$
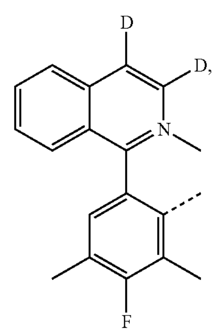
$L_{a25}$
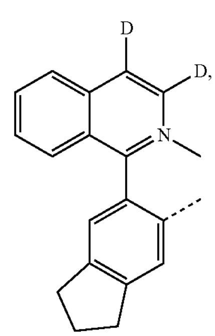
$L_{a26}$ $L_{a27}$
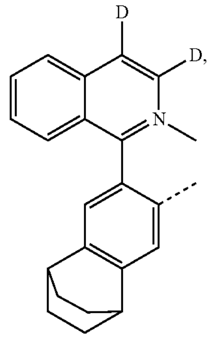
$L_{a28}$
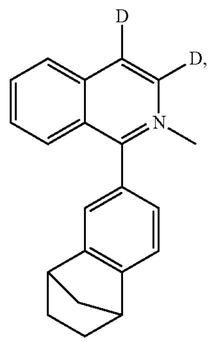
$L_{a29}$
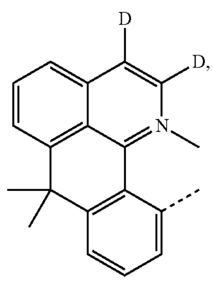
$L_{a30}$
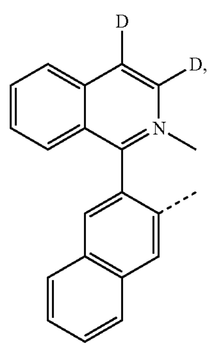
$L_{a31}$
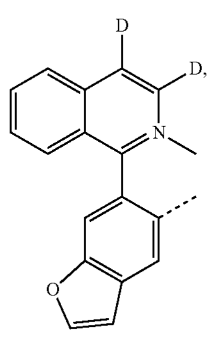
$L_{a32}$
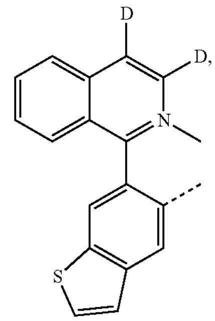
$L_{a33}$
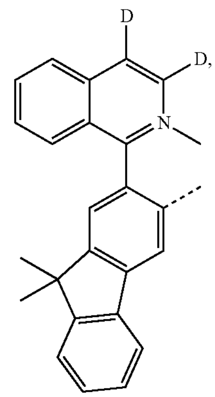
$L_{a34}$
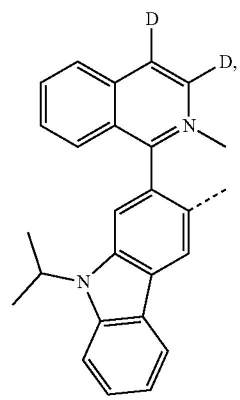
$L_{a35}$
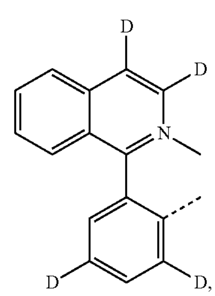

$L_{a36}$
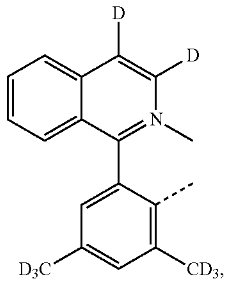
$L_{a37}$
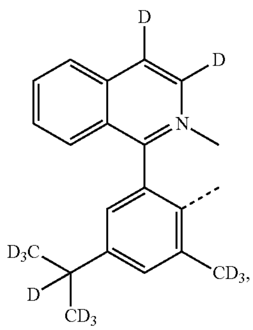
$L_{a38}$
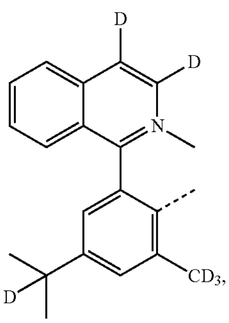
$L_{a39}$
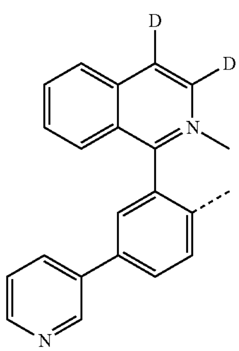
$L_{a40}$
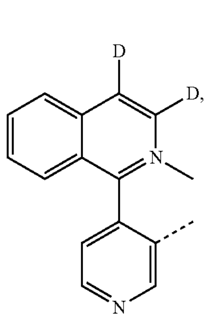
$L_{a41}$
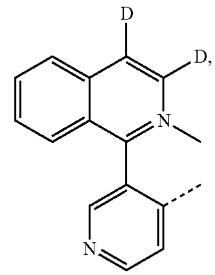
$L_{a42}$
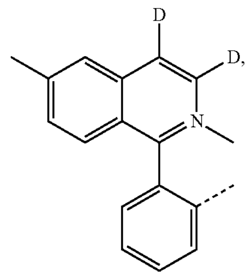
$L_{a43}$
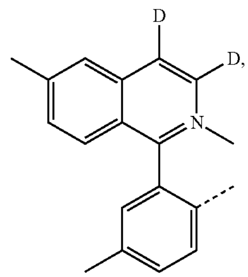
$L_{a44}$
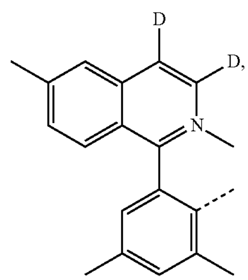
$L_{a45}$
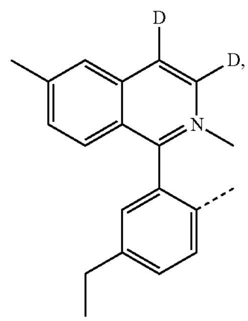

$L_{a46}$
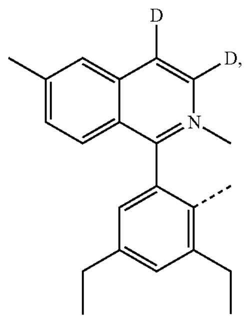
$L_{a47}$
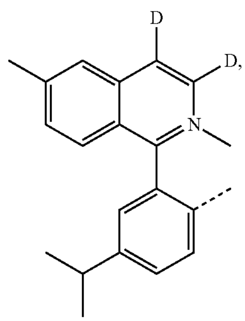
$L_{a48}$
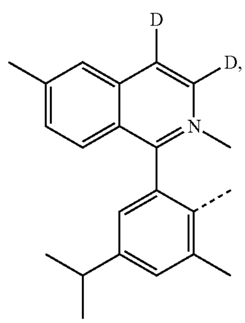
$L_{a49}$
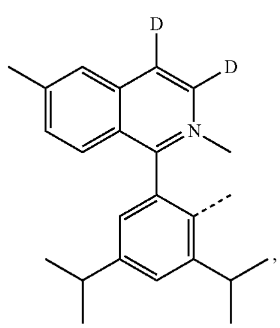
$L_{a50}$
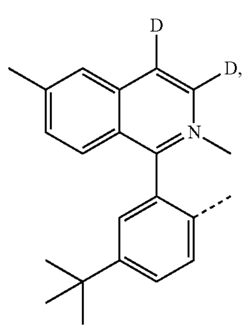
$L_{a51}$
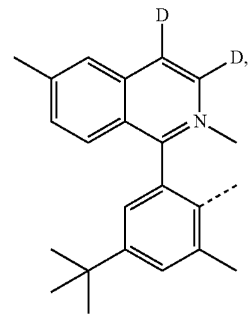
$L_{a52}$
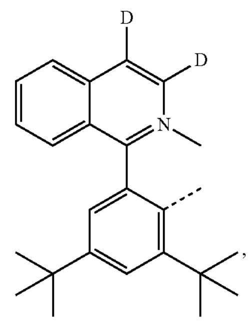
$L_{a53}$
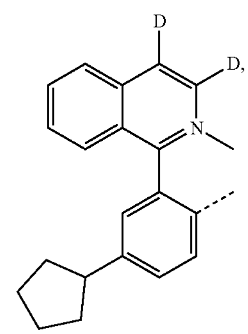
$L_{a54}$
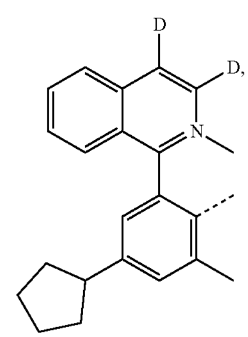
$L_{a55}$
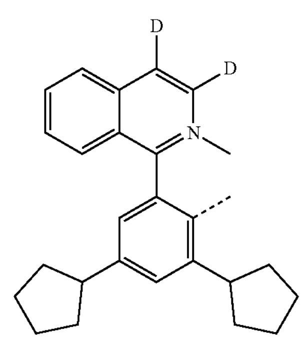

-continued
$L_{a56}$
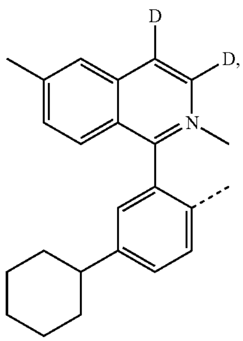
$L_{a57}$
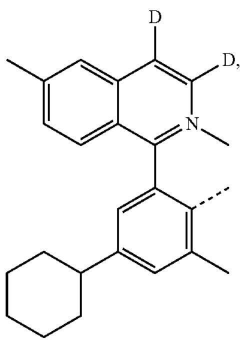
$L_{a58}$
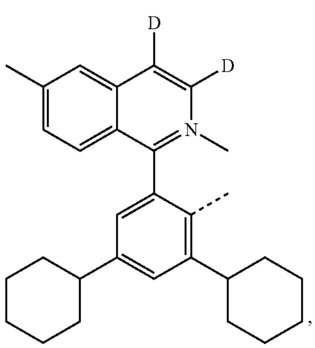
$L_{a59}$
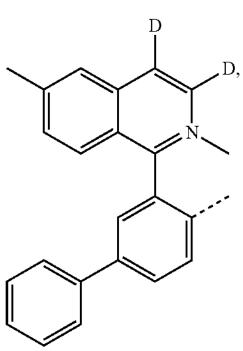
-continued
$L_{a60}$
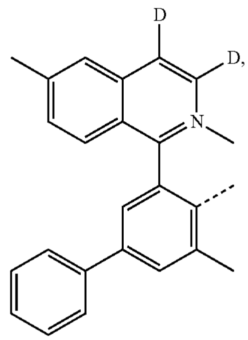
$L_{a61}$
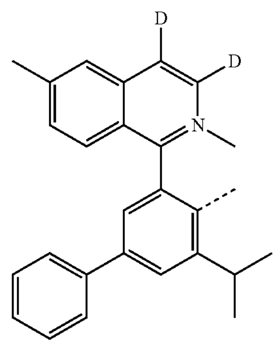
$L_{a62}$
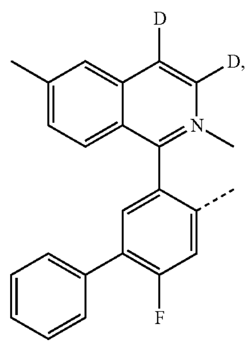
$L_{a63}$
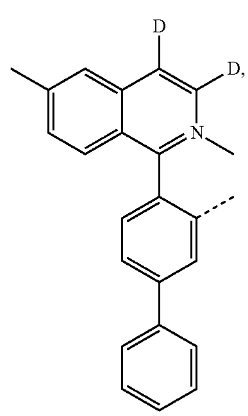

-continued
$L_{a64}$
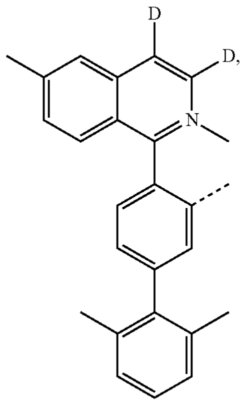
$L_{a65}$
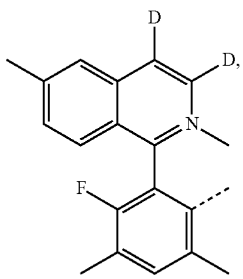
$L_{a66}$
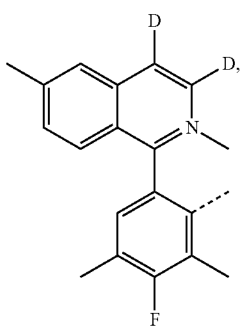
$L_{a67}$
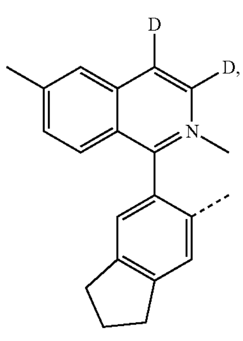
-continued
$L_{a68}$
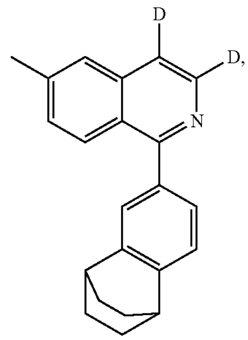
$L_{a69}$
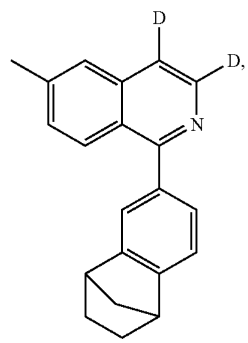
$L_{a70}$
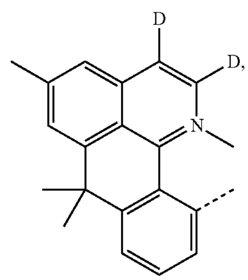
$L_{a71}$
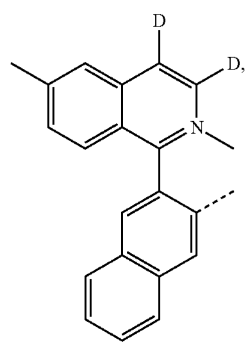
$L_{a72}$
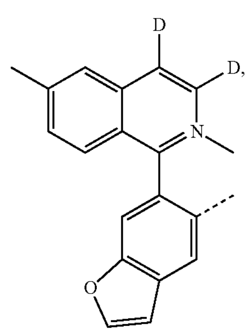

-continued
$L_{a73}$
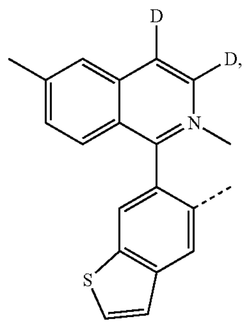
$L_{a74}$
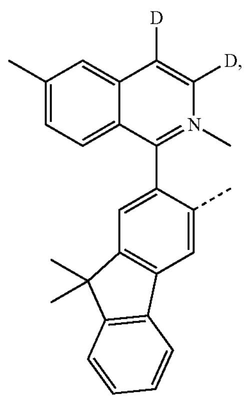
$L_{a75}$
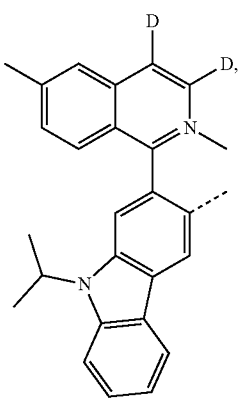
$L_{a76}$
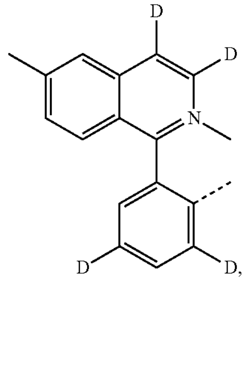
-continued
$L_{a77}$
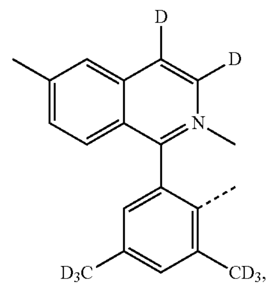
$L_{a78}$
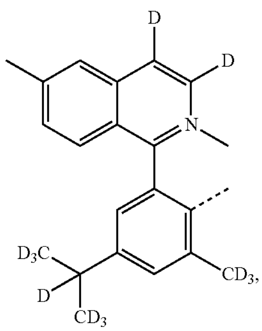
$L_{a79}$
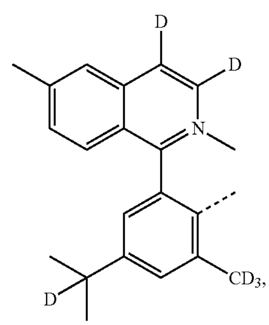
$L_{a80}$
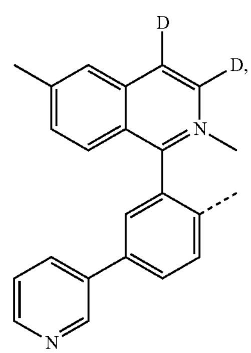
$L_{a81}$
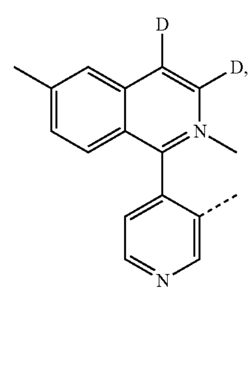

-continued
$L_{a82}$
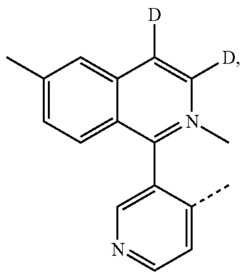
$L_{a83}$
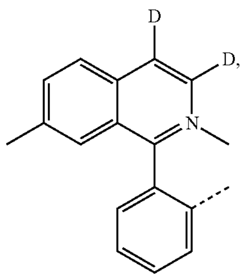
$L_{a84}$
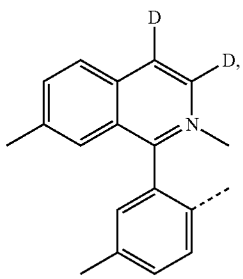
$L_{a85}$
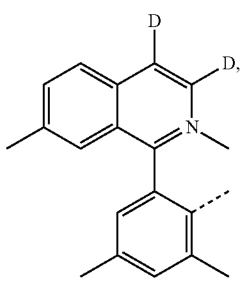
$L_{a86}$
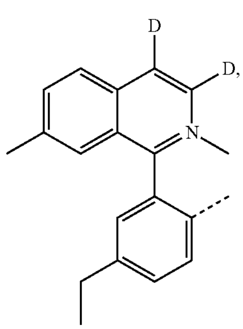
-continued
$L_{a87}$
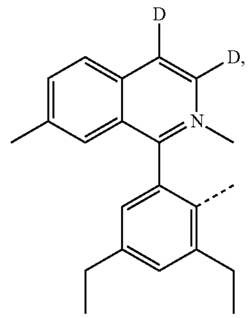
$L_{a88}$
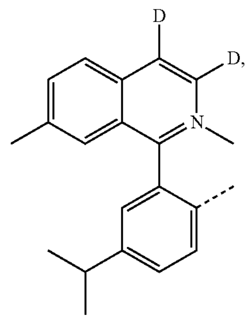
$L_{a89}$
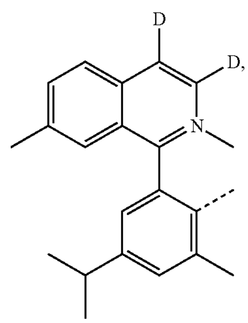
$L_{a90}$
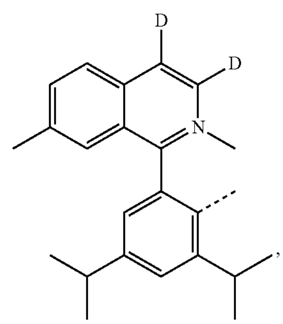
$L_{a91}$
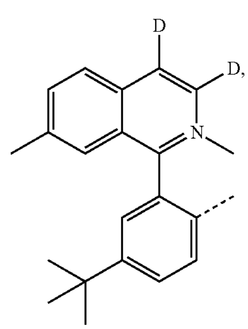

$L_{a92}$
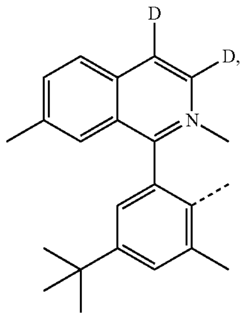
$L_{a93}$
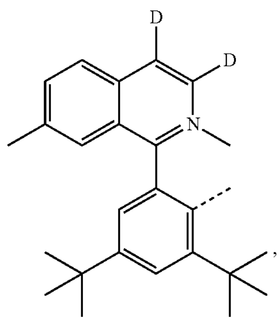
$L_{a94}$
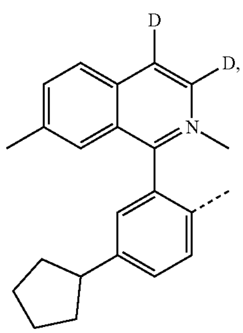
$L_{a95}$
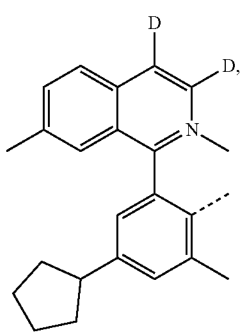
$L_{a96}$
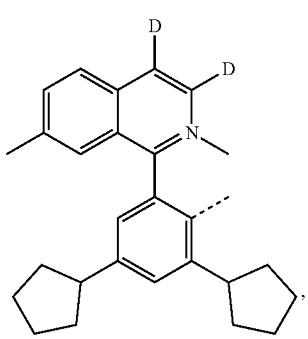
$L_{a97}$
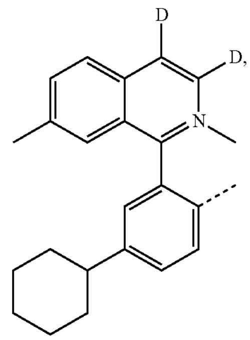
$L_{a98}$
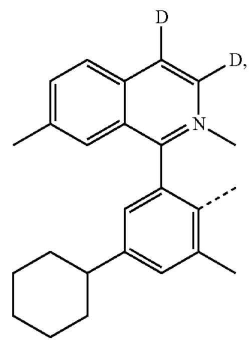
$L_{a99}$
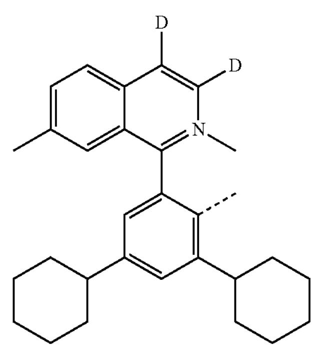
$L_{a100}$
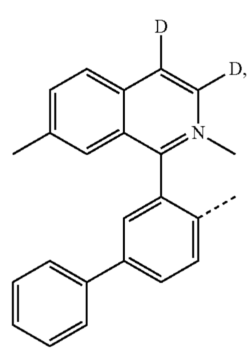

-continued
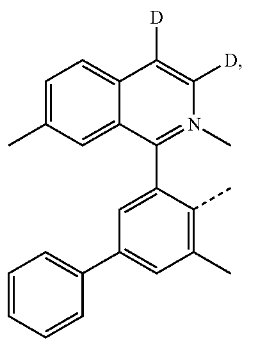
$L_{a101}$
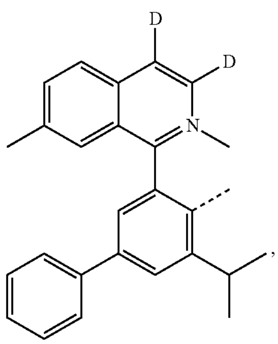
$L_{a102}$
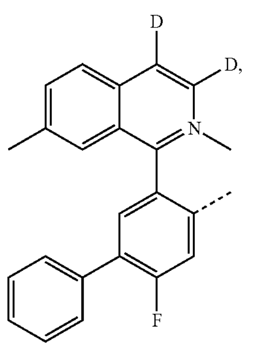
$L_{a103}$
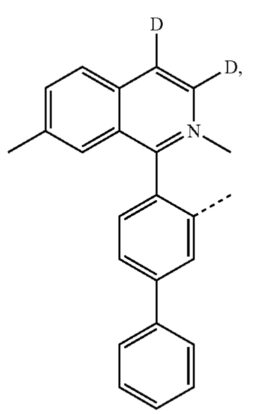
$L_{a104}$
-continued
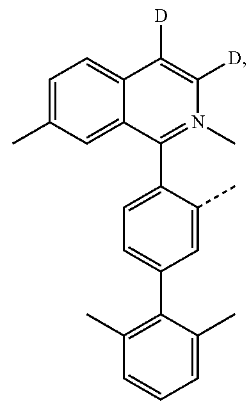
$L_{a105}$
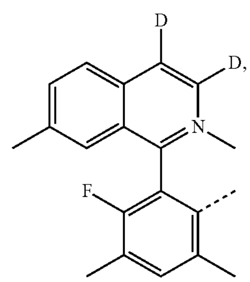
$L_{a106}$
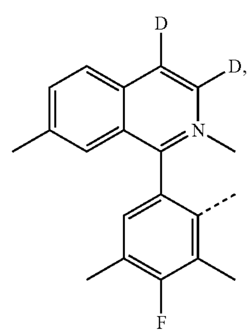
$L_{a107}$
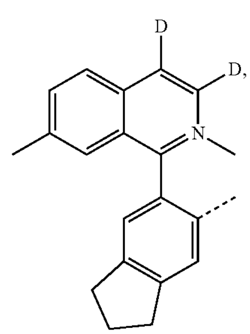
$L_{a108}$ -continued
$L_{a109}$
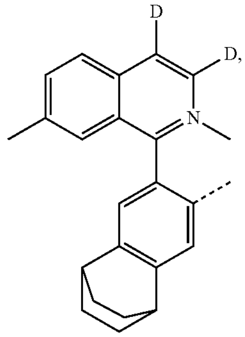
$L_{a110}$
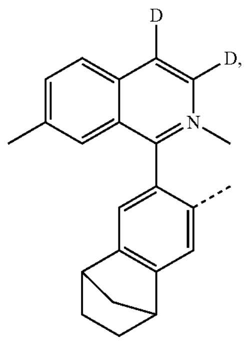
$L_{a111}$
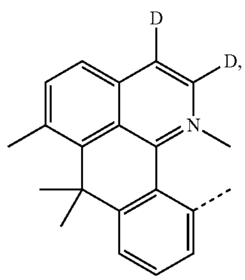
$L_{a112}$
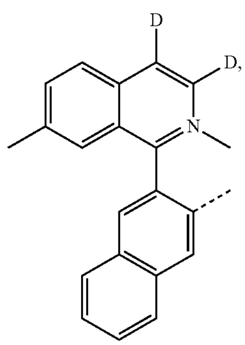
$L_{a113}$
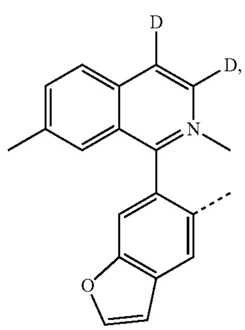
-continued
$L_{a114}$
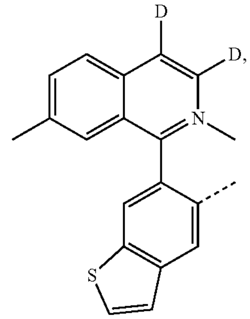
$L_{a115}$
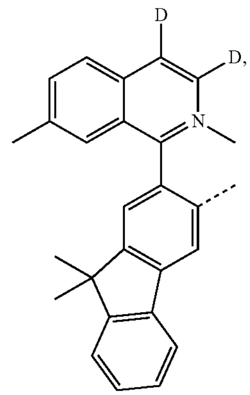
$L_{a116}$
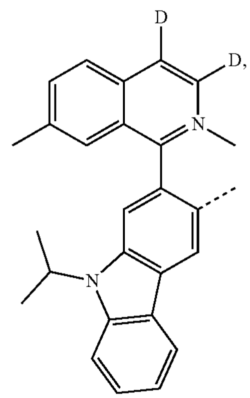
$L_{a117}$
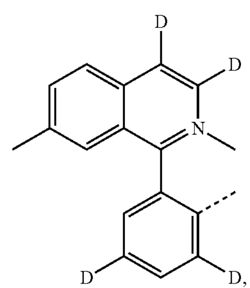

-continued
$L_{a118}$
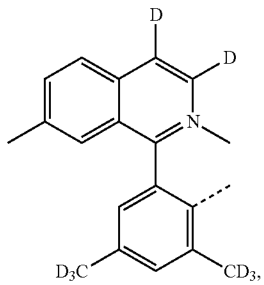
$L_{a119}$
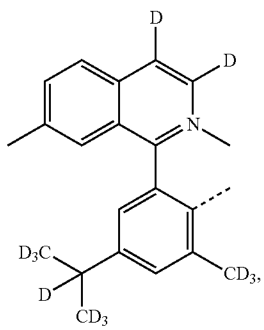
$L_{a120}$
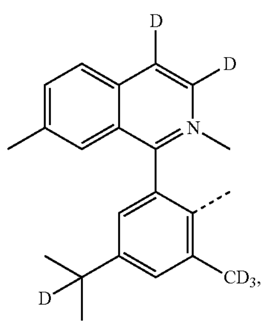
$L_{a121}$
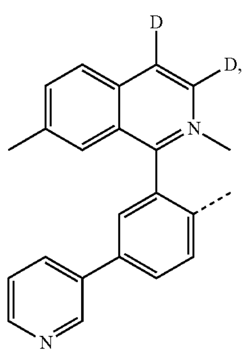
$L_{a122}$
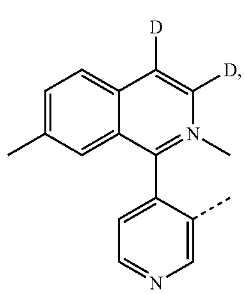
-continued
$L_{a123}$
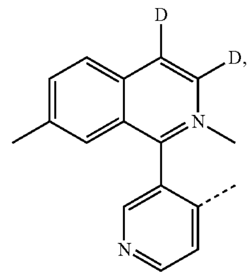
$L_{a124}$
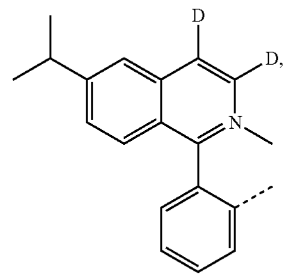
$L_{a125}$
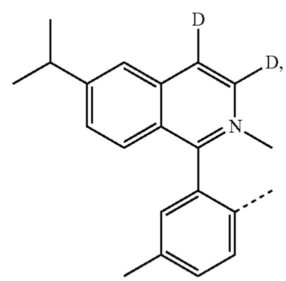
$L_{a126}$
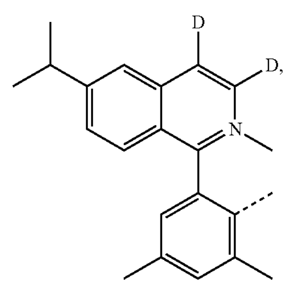
$L_{a127}$
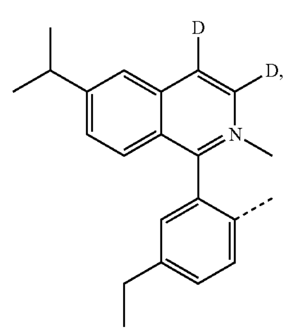

-continued
$L_{a128}$
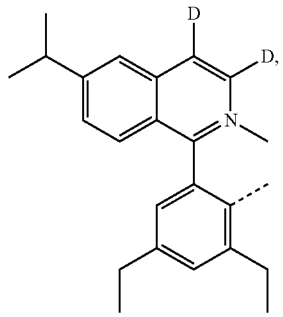
$L_{a129}$
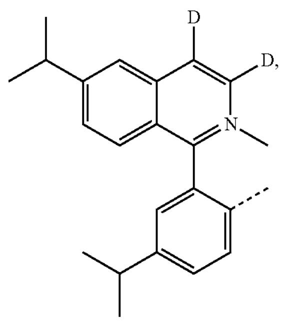
$L_{a130}$
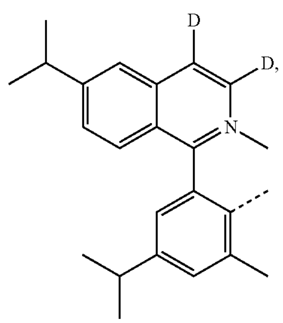
$L_{a131}$
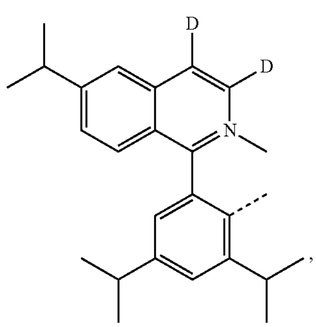
$L_{a132}$
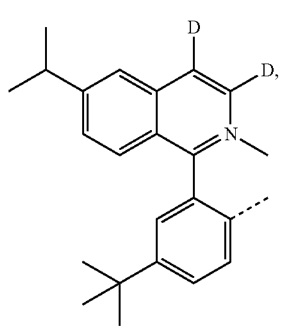
-continued
$L_{a133}$
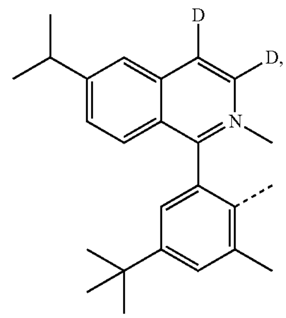
$L_{a134}$
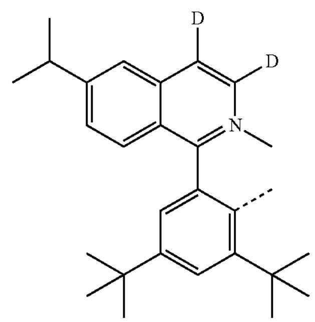
$L_{a135}$
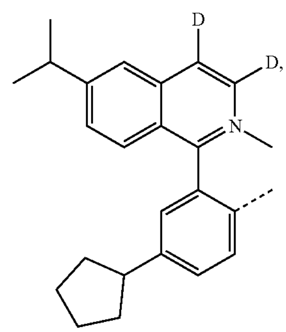
$L_{a136}$
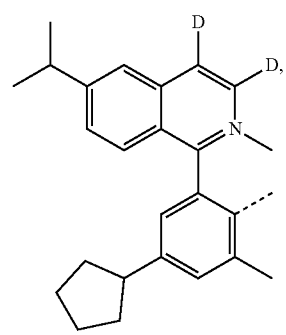
$L_{a137}$
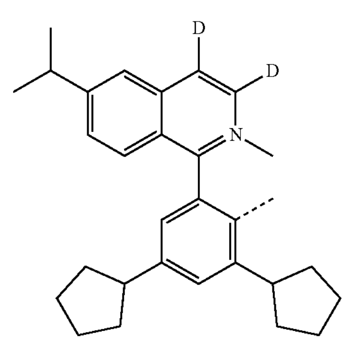

-continued
$L_{a138}$
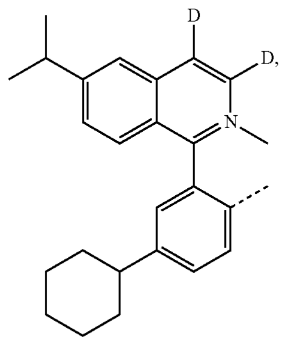
$L_{a139}$
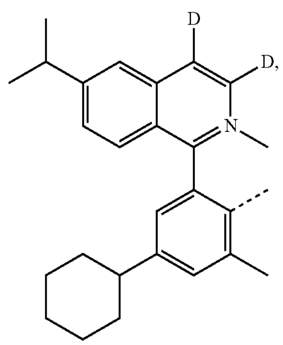
$L_{a140}$
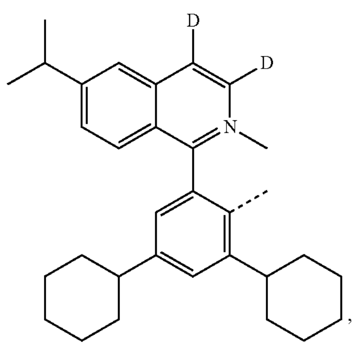
$L_{a141}$
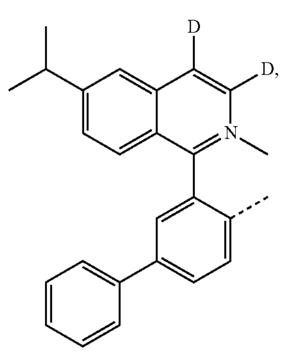
-continued
$L_{a142}$
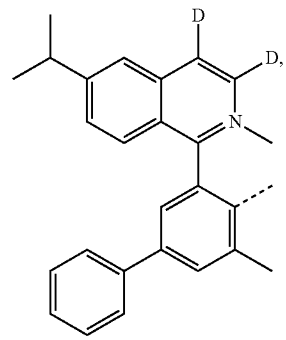
$L_{a143}$
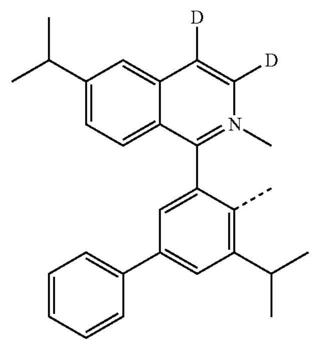
$L_{a144}$
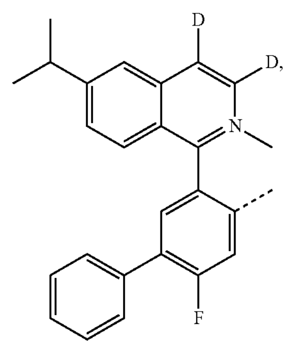
$L_{a145}$
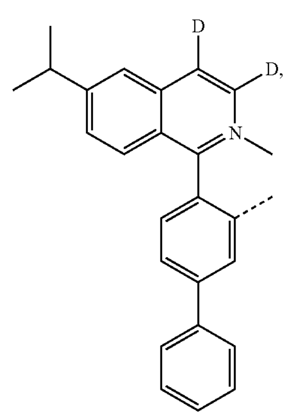

$L_{a146}$
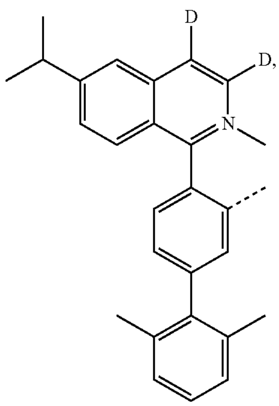
$L_{a147}$
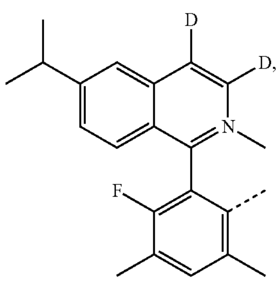
$L_{a148}$
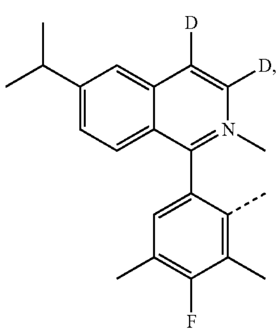
$L_{a149}$
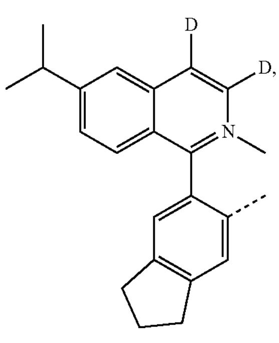
$L_{a150}$
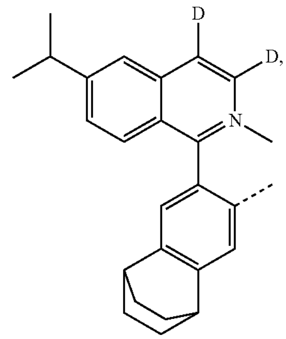
$L_{a151}$
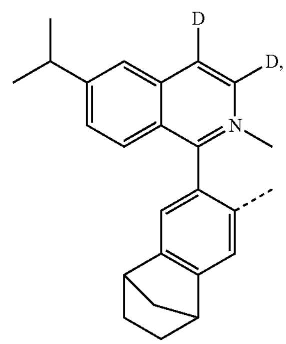
$L_{a152}$
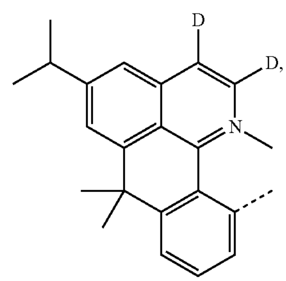
$L_{a153}$
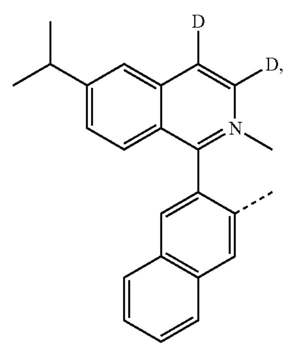
$L_{a154}$
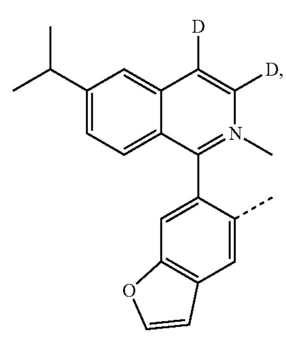

-continued
$L_{a155}$
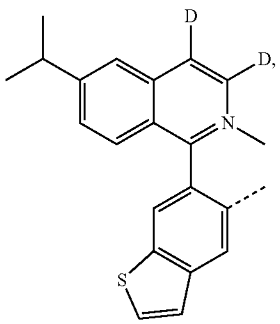
$L_{a156}$
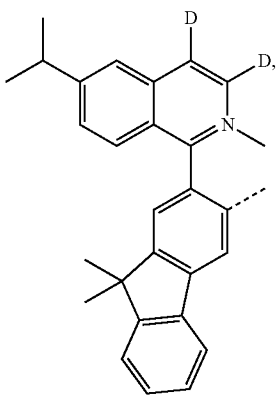
$L_{a157}$
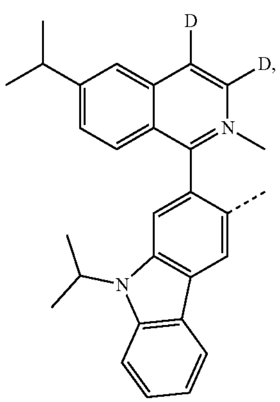
$L_{a158}$
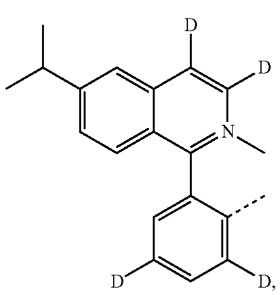
-continued
$L_{a159}$
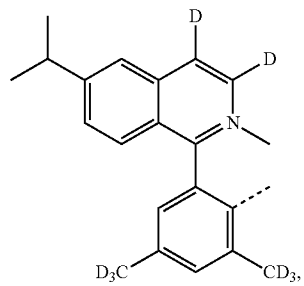
$L_{a160}$
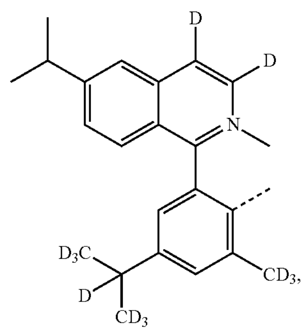
$L_{a161}$
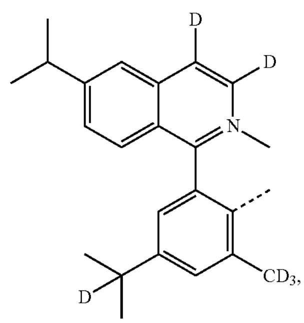
$L_{a162}$
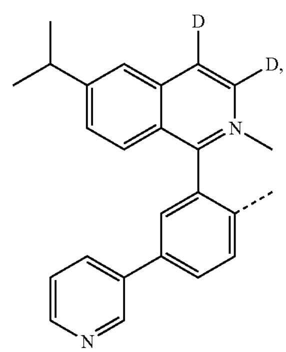
$L_{a163}$
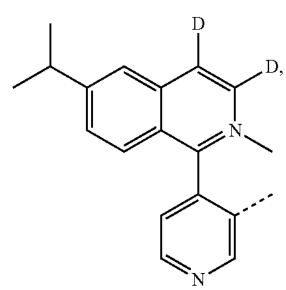

-continued
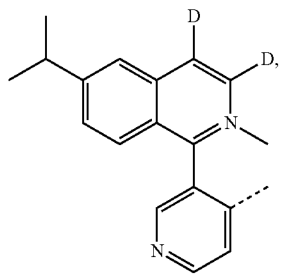
$L_{a164}$
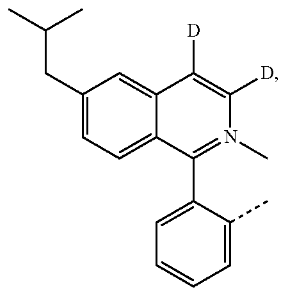
$L_{a165}$
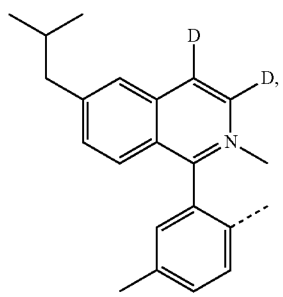
$L_{a166}$
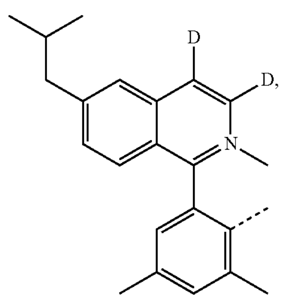
$L_{a167}$
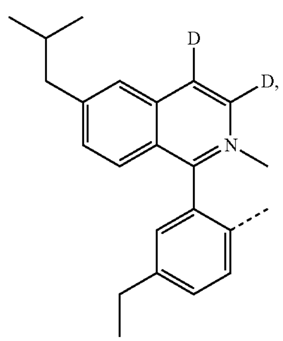
$L_{a168}$
-continued
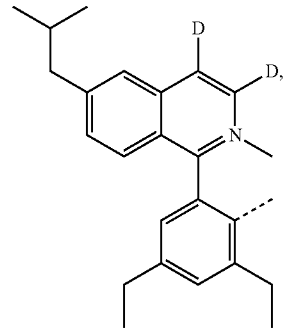
$L_{a169}$
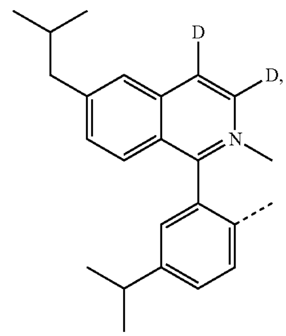
$L_{a170}$
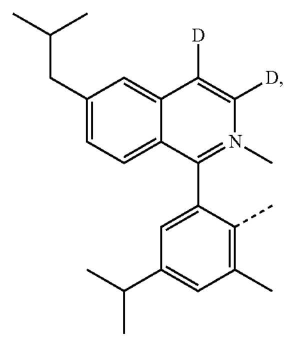
$L_{a171}$
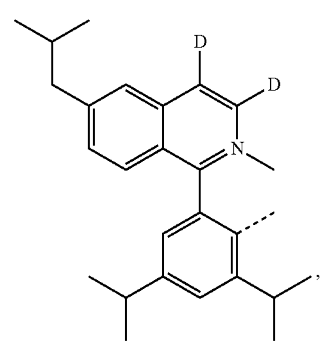
$L_{a172}$ -continued
$L_{a173}$
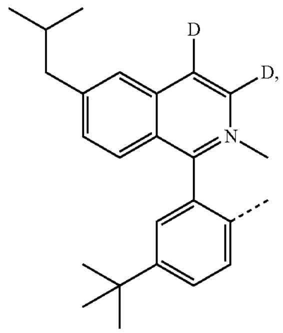
$L_{a174}$
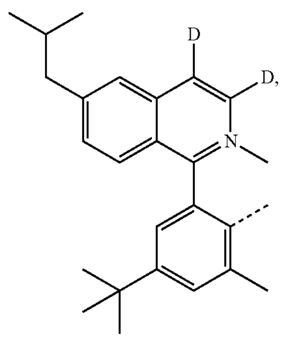
$L_{a175}$
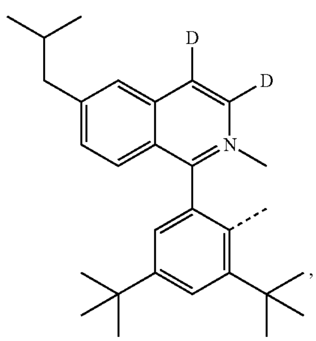
$L_{a176}$
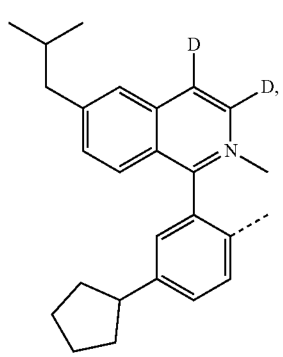
-continued
$L_{a177}$
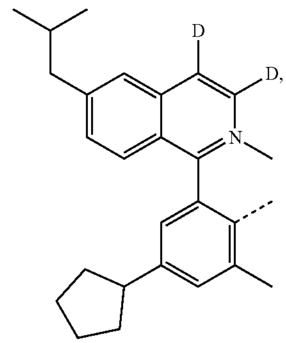
$L_{a178}$
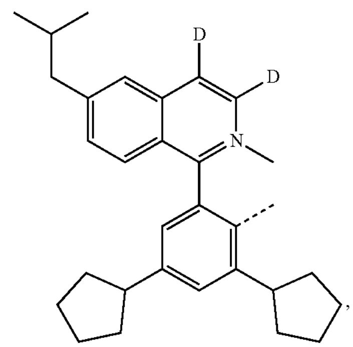
$L_{a179}$
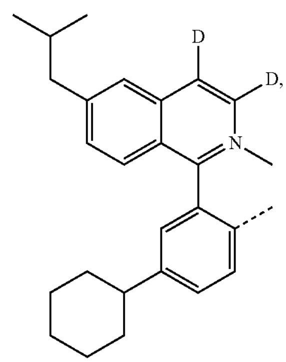
$L_{a180}$
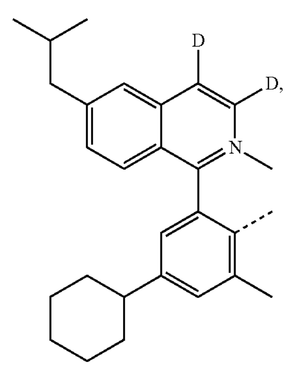

-continued
$L_{a181}$
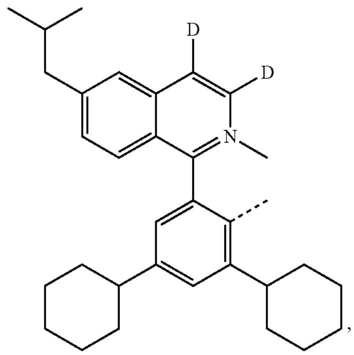
$L_{a182}$
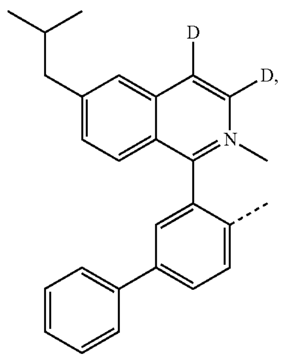
$L_{a183}$
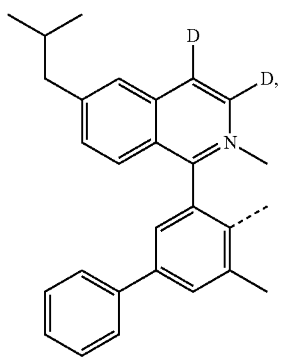
$L_{a184}$
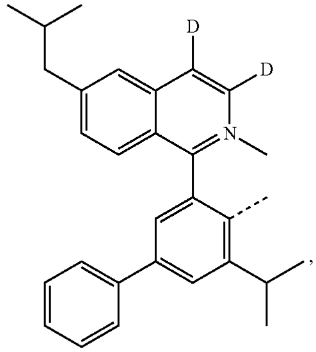
-continued
$L_{a185}$
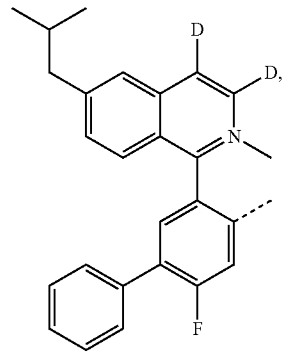
$L_{a186}$
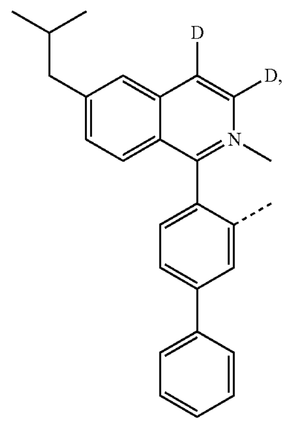
$L_{a187}$
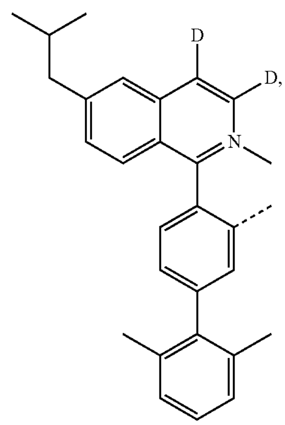
$L_{a188}$
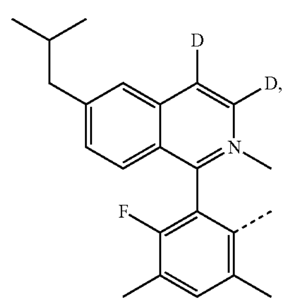

-continued
$L_{a189}$
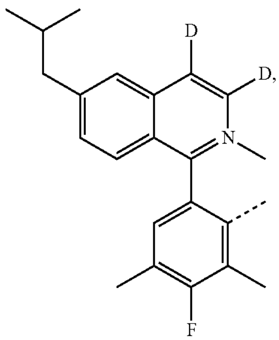
$L_{a190}$
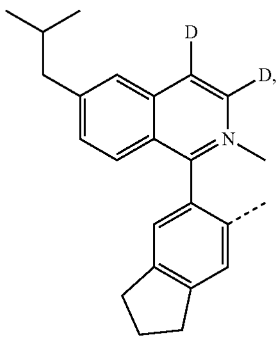
$L_{a191}$
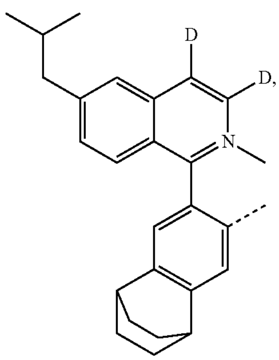
$L_{a192}$
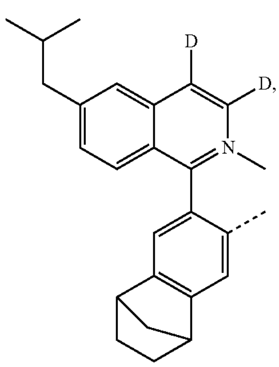
-continued
$L_{a193}$
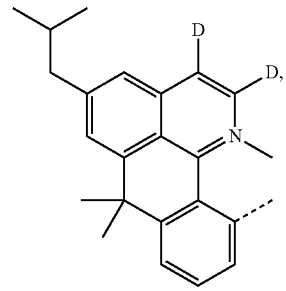
$L_{a194}$
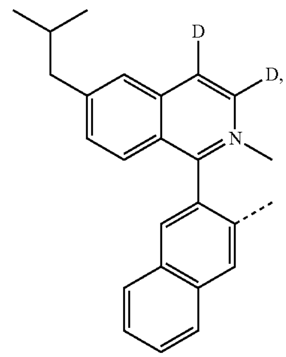
$L_{a195}$
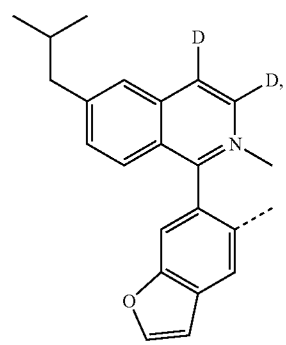
$L_{a196}$
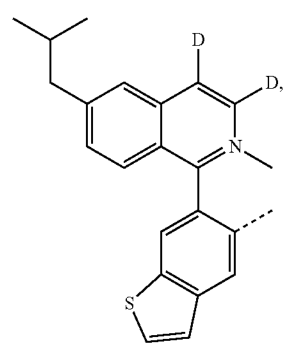

-continued
$L_{a197}$
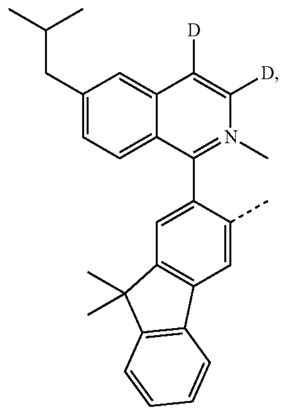
$L_{a198}$
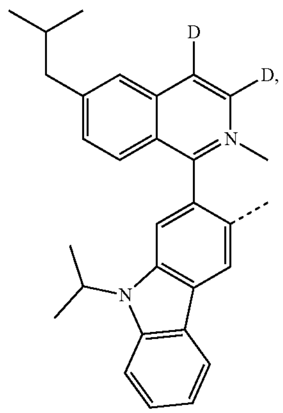
$L_{a199}$
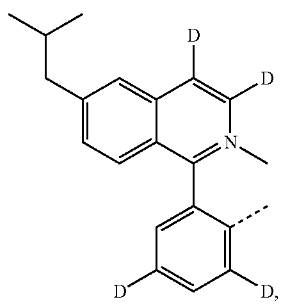
$L_{a200}$
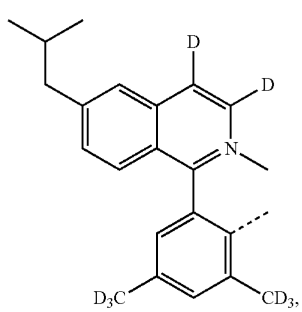
-continued
$L_{a201}$
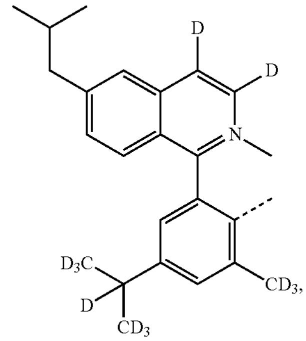
$L_{a202}$
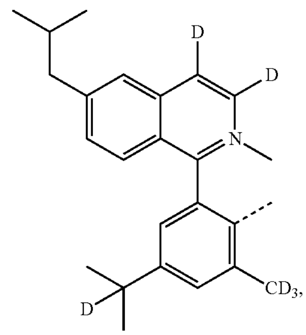
$L_{a203}$
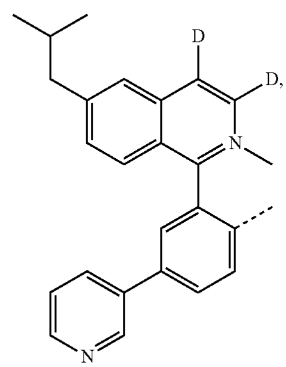
$L_{a204}$
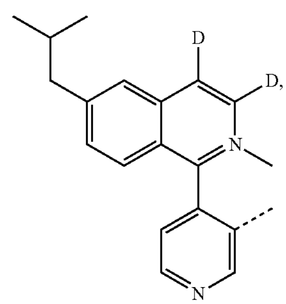
$L_{a205}$
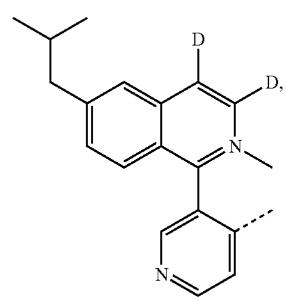

-continued
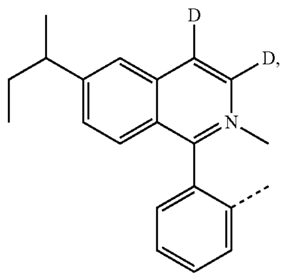
$L_{a206}$
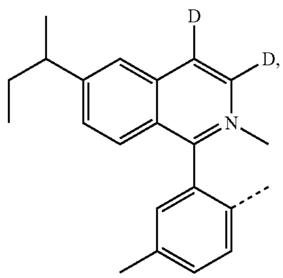
$L_{a207}$
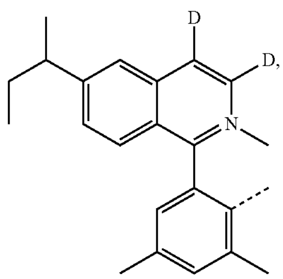
$L_{a208}$
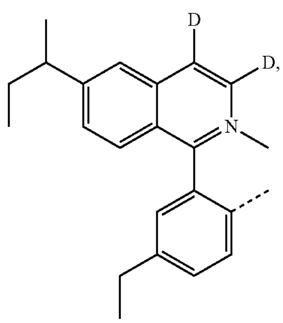
$L_{a209}$
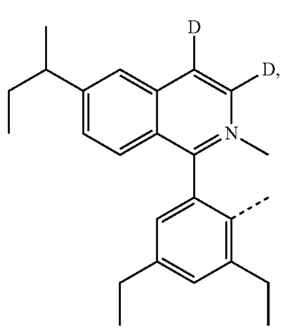
$L_{a210}$
-continued
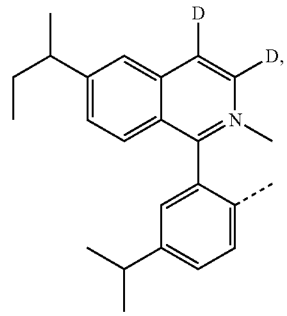
$L_{a211}$
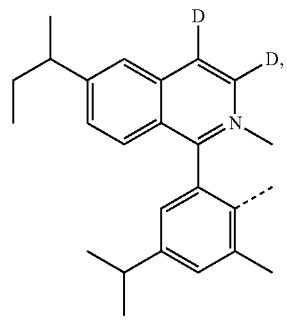
$L_{a212}$
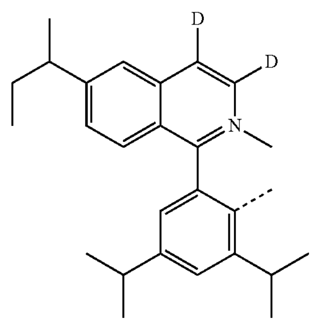
$L_{a213}$
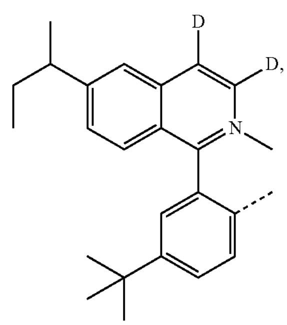
$L_{a214}$
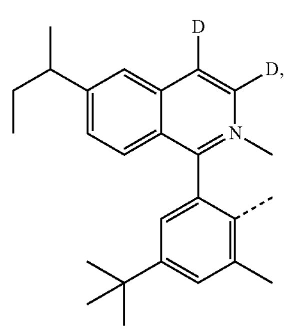
$L_{a215}$ -continued
$L_{a216}$
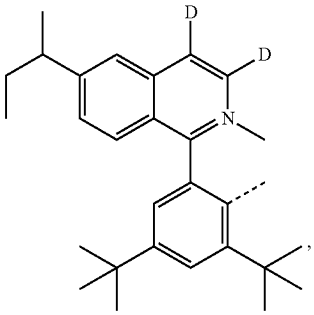
$L_{a217}$
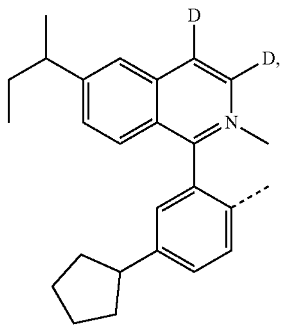
$L_{a218}$
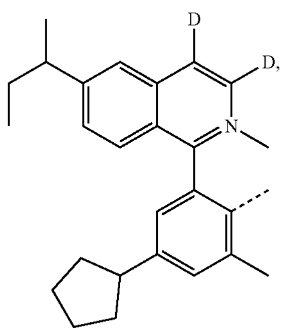
$L_{a219}$
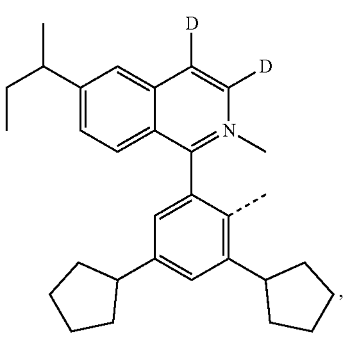
-continued
$L_{a220}$
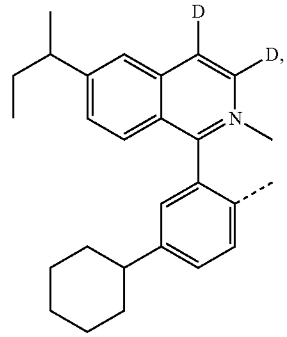
$L_{a221}$
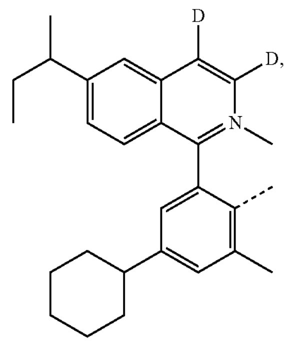
$L_{a222}$
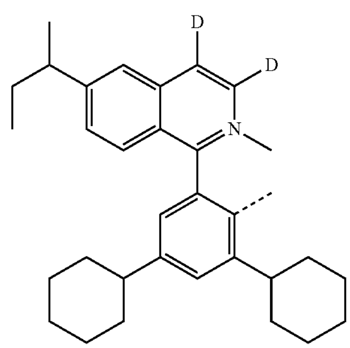
$L_{a223}$
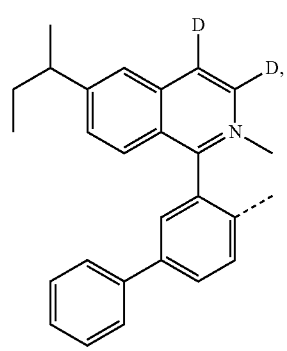

-continued
$L_{a224}$
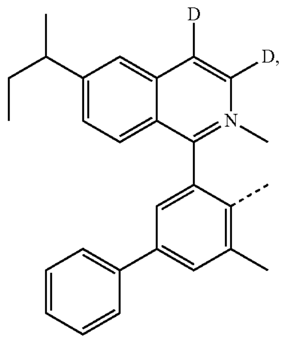
$L_{a225}$
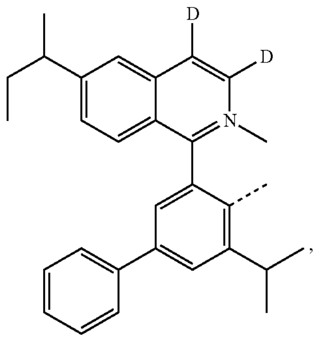
$L_{a226}$
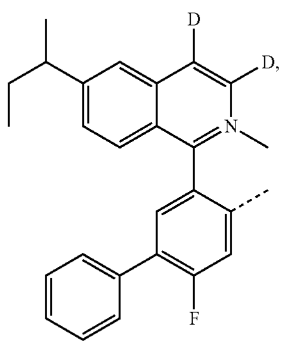
$L_{a227}$
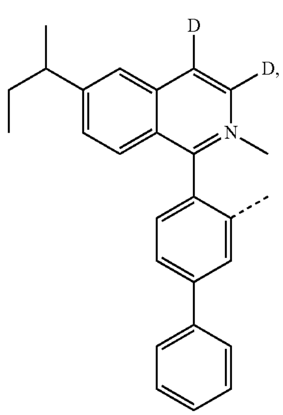
-continued
$L_{a228}$
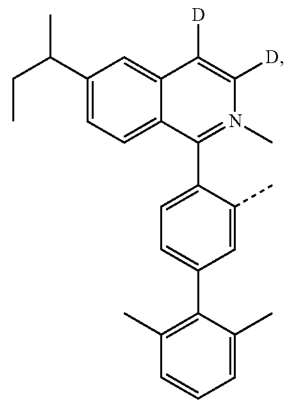
$L_{a229}$
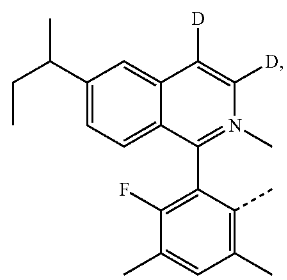
$L_{a230}$
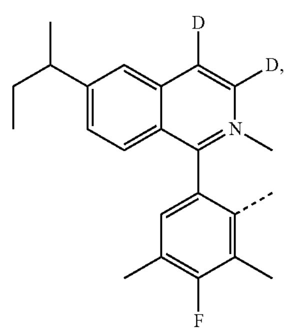
$L_{a231}$
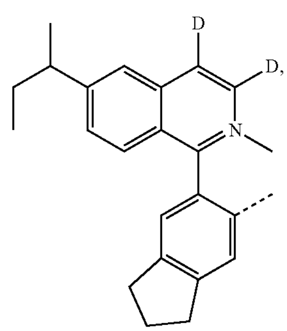

-continued
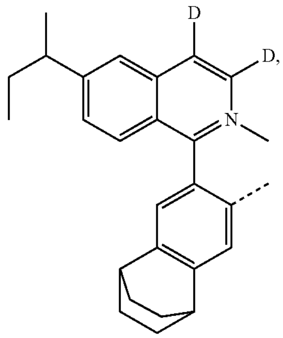
$L_{a232}$
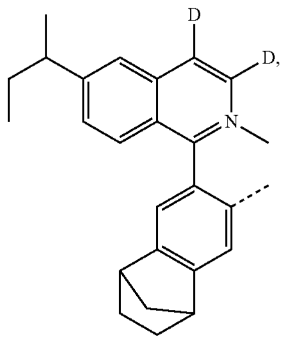
$L_{a233}$
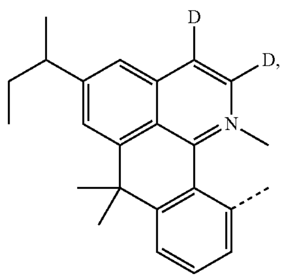
$L_{a234}$
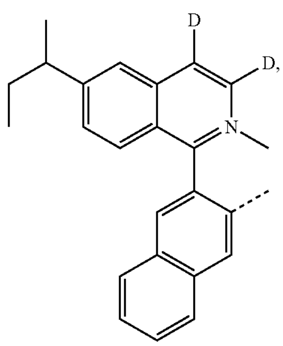
$L_{a235}$
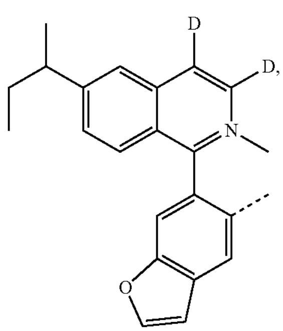
$L_{a236}$
-continued
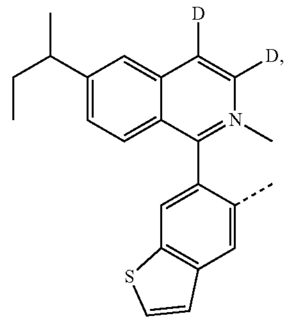
$L_{a237}$
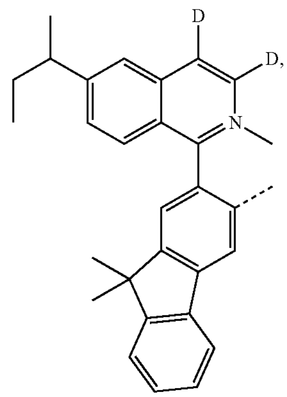
$L_{a238}$
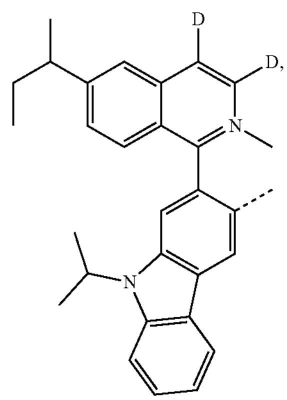
$L_{a239}$
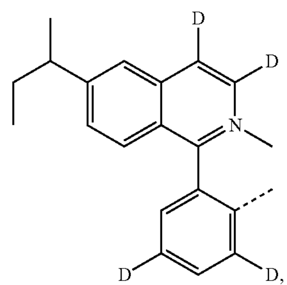
$L_{a240}$ $L_{a241}$
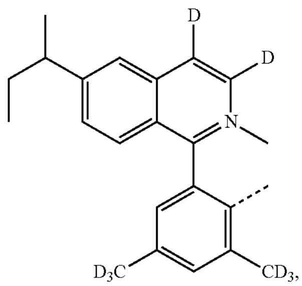
$L_{a242}$
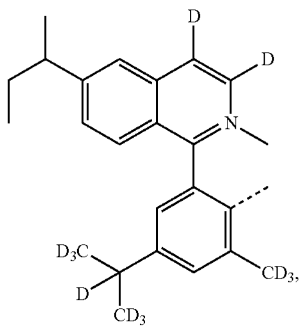
$L_{a243}$
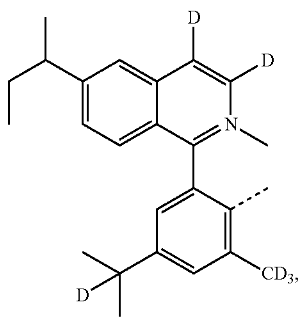
$L_{a244}$
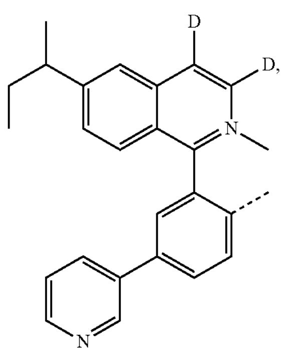
$L_{a245}$
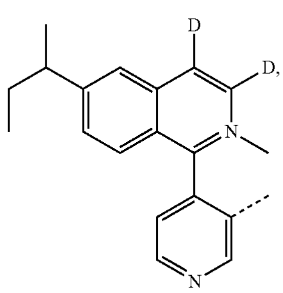
$L_{a246}$
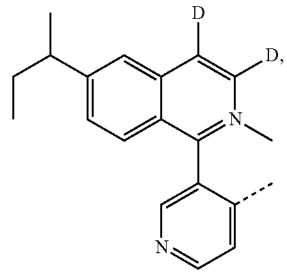
$L_{a247}$
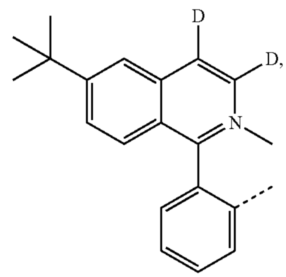
$L_{a248}$
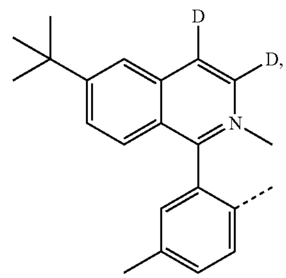
$L_{a249}$
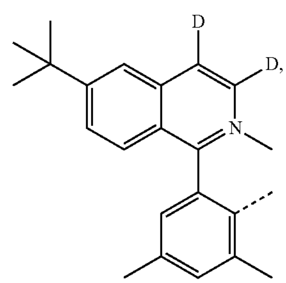
$L_{a250}$
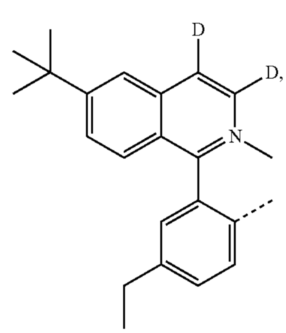

-continued
$L_{a251}$
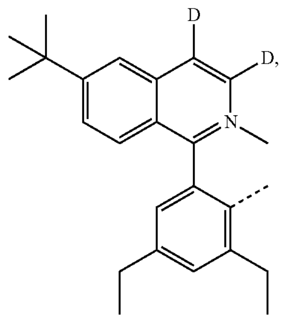
$L_{a252}$
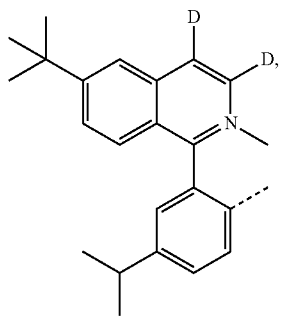
$L_{a253}$
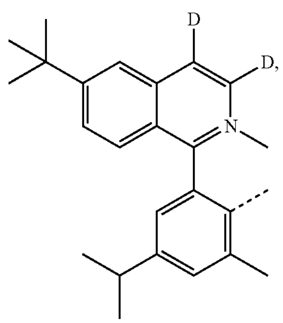
$L_{a254}$
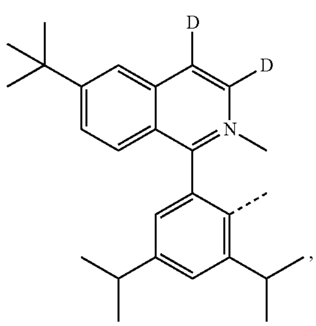
$L_{a255}$
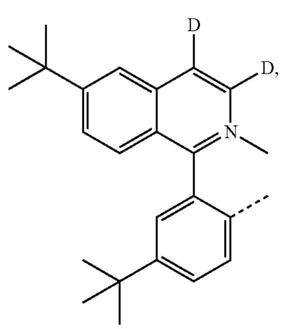
-continued
$L_{a256}$
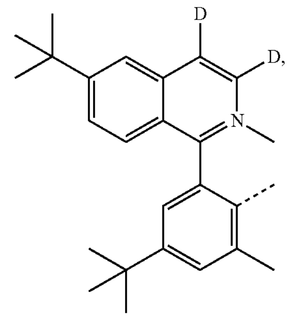
$L_{a257}$
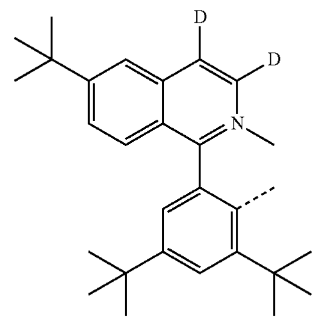
$L_{a258}$
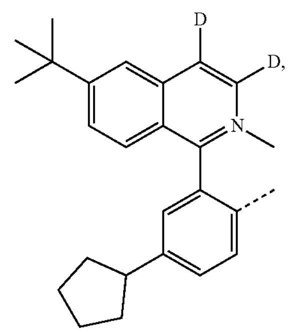
$L_{a259}$
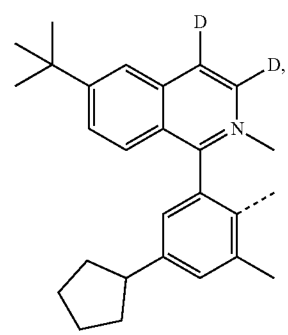
$L_{a260}$
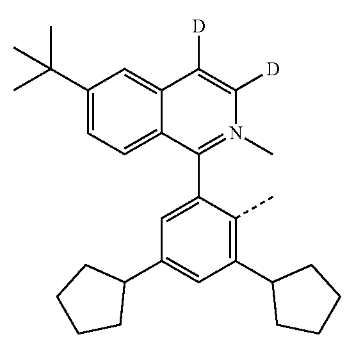

-continued
$L_{a261}$
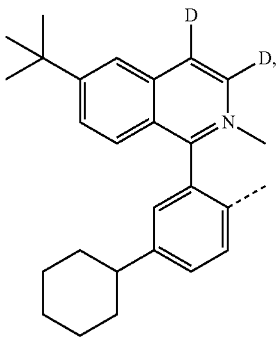
$L_{a262}$
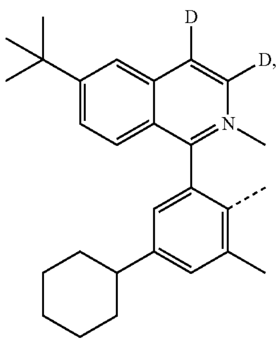
$L_{a263}$
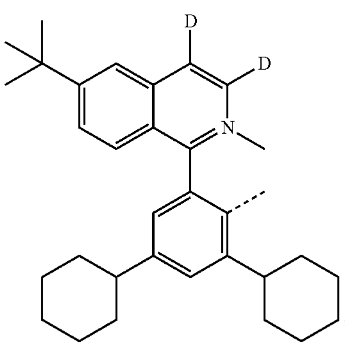
$L_{a264}$
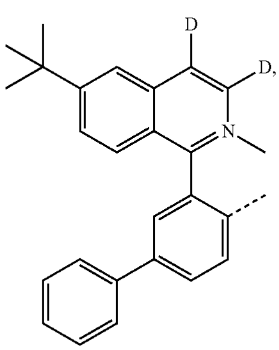
-continued
$L_{a265}$
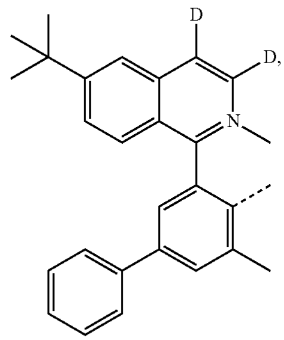
$L_{a266}$
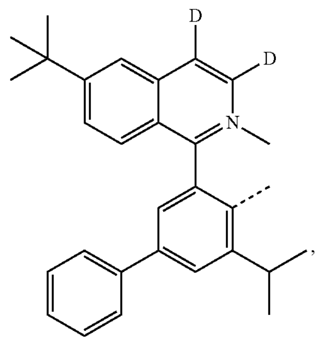
$L_{a267}$
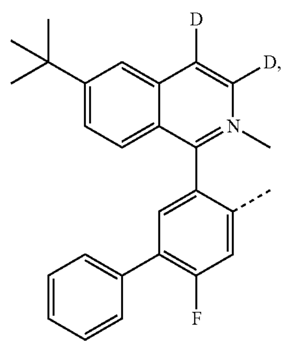
$L_{a268}$
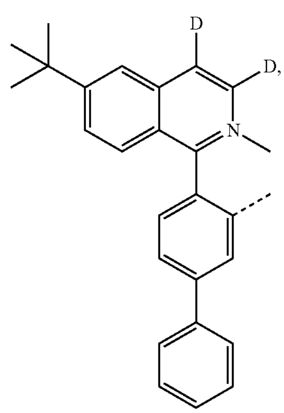

-continued
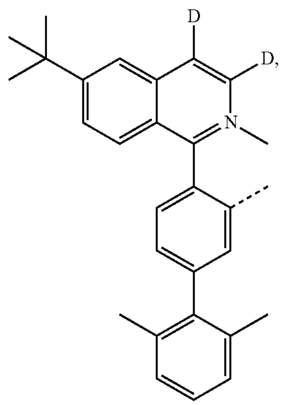
$L_{a269}$
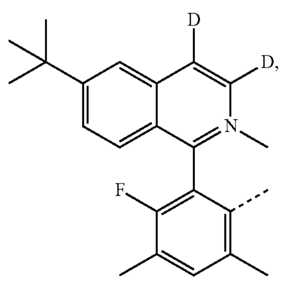
$L_{a270}$
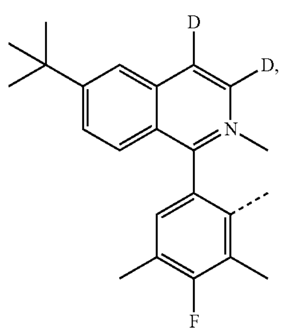
$L_{a271}$
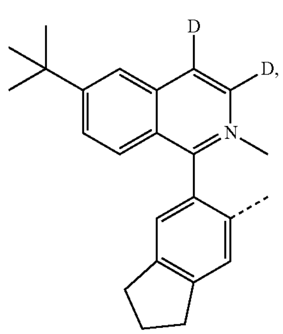
$L_{a272}$
-continued
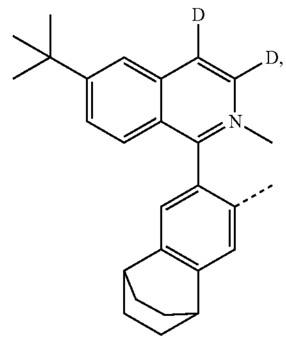
$L_{a273}$
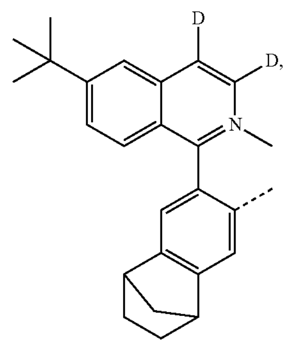
$L_{a274}$
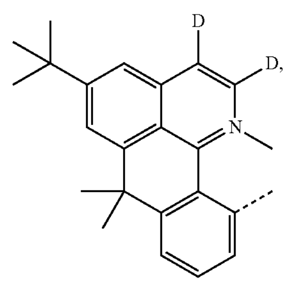
$L_{a275}$
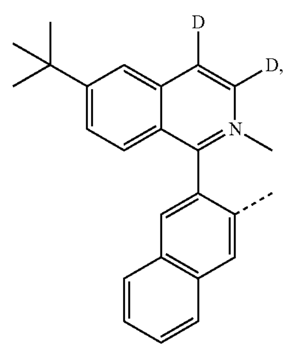
$L_{a276}$
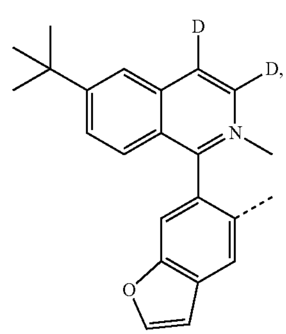
$L_{a277}$ $L_{a278}$
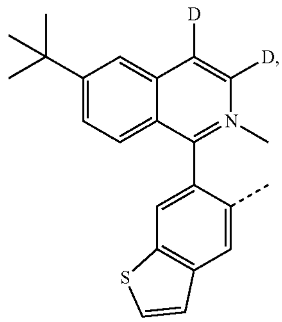
$L_{a279}$
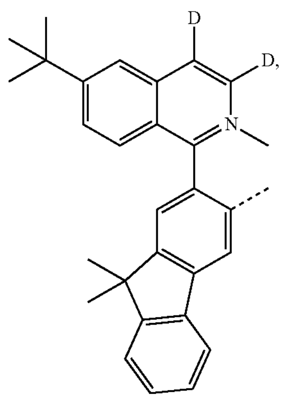
$L_{a280}$
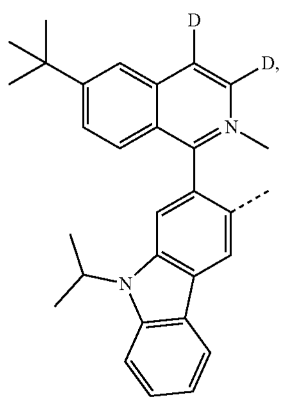
$L_{a281}$
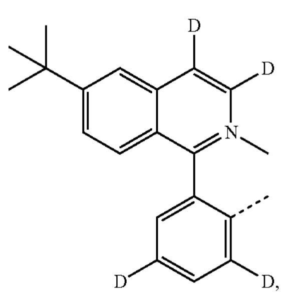
$L_{a282}$
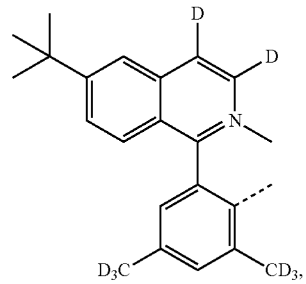
$L_{a283}$
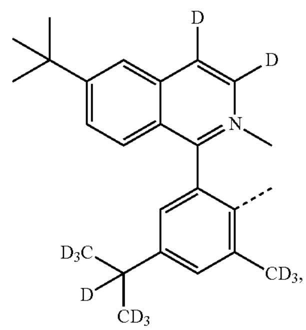
$L_{a284}$
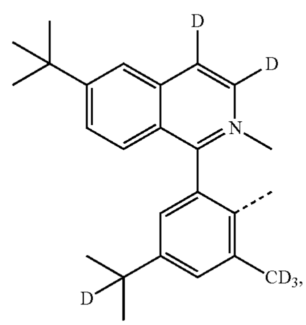
$L_{a285}$
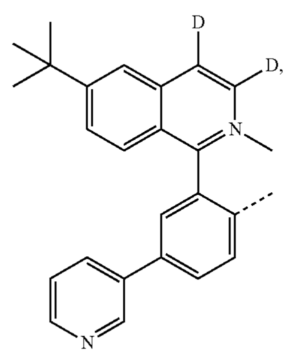
$L_{a286}$
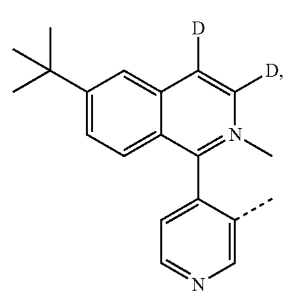

-continued
$L_{a287}$
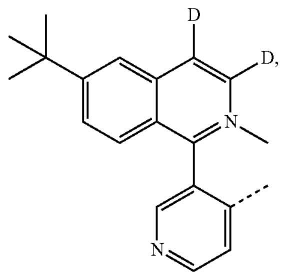
$L_{a288}$
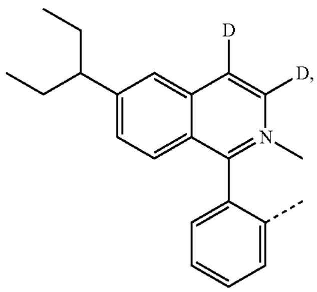
$L_{a289}$
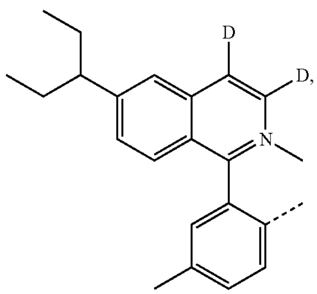
$L_{a290}$
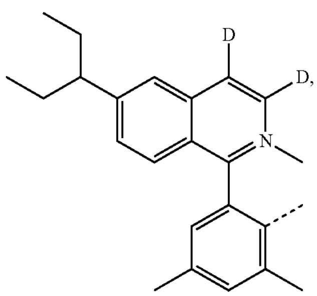
$L_{a291}$
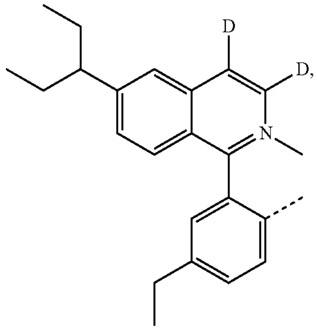
-continued
$L_{a292}$
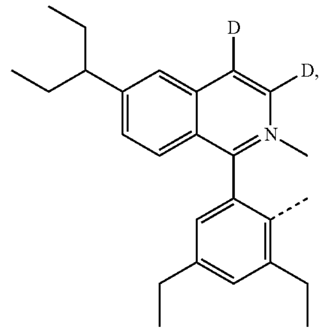
$L_{a293}$
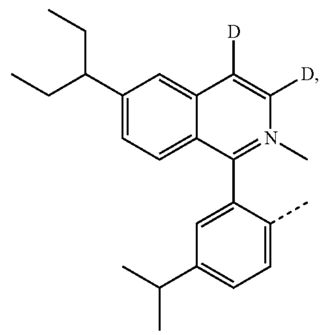
$L_{a294}$
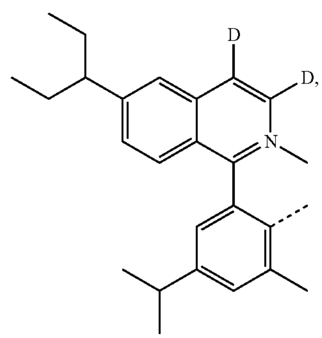
$L_{a295}$
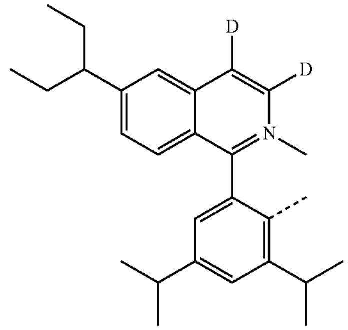

$L_{a296}$
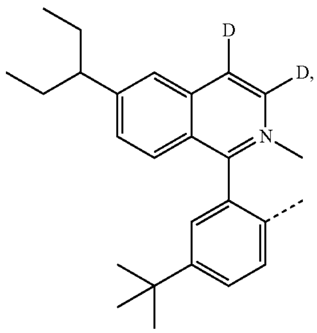
$L_{a297}$
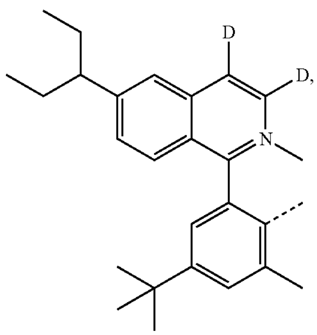
$L_{a298}$
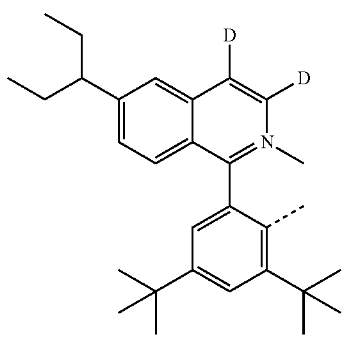
$L_{a299}$
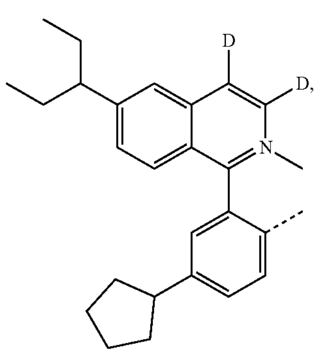
$L_{a300}$
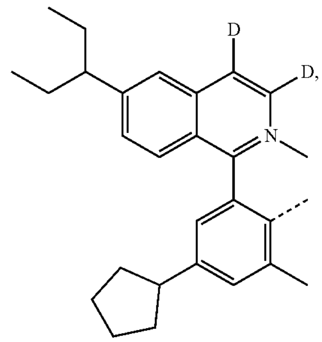
$L_{a301}$
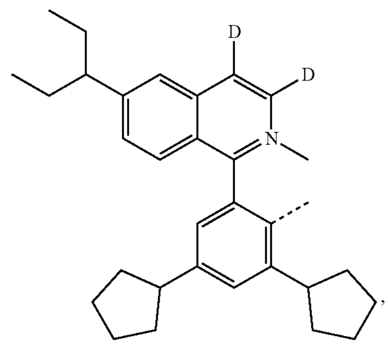
$L_{a302}$
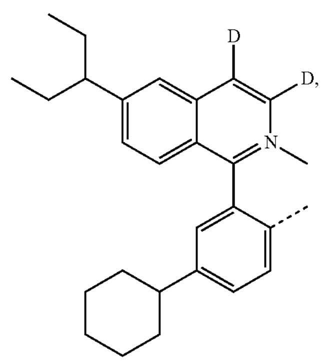
$L_{a303}$
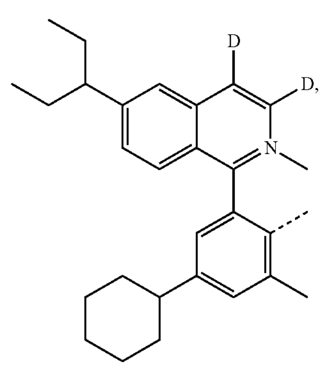

$L_{a304}$
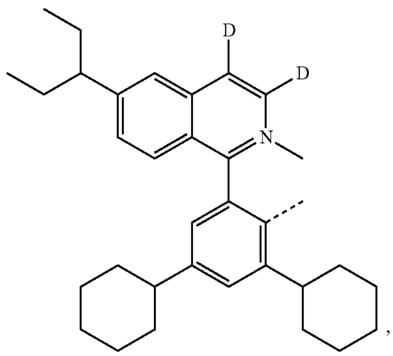
$L_{a305}$
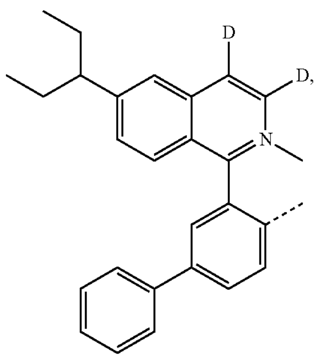
$L_{a306}$
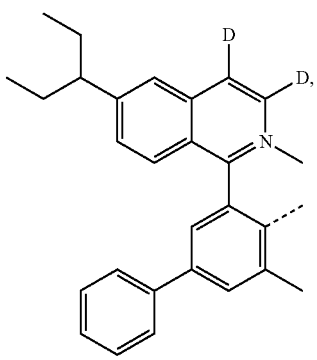
$L_{a307}$
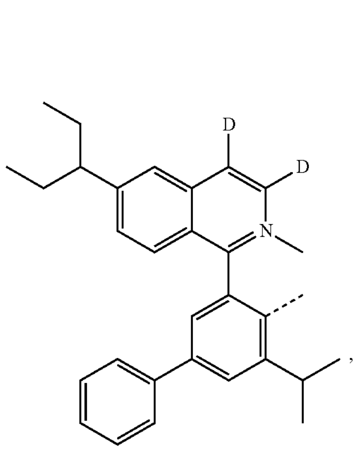
$L_{a308}$
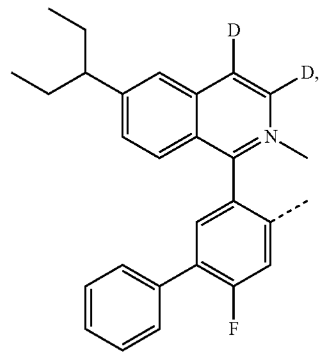
$L_{a309}$
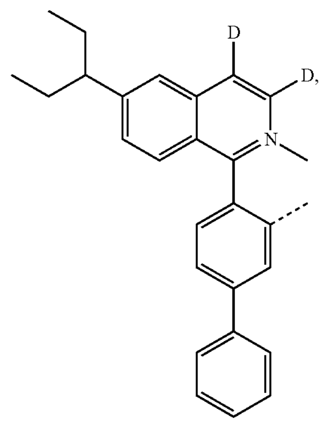
$L_{a310}$
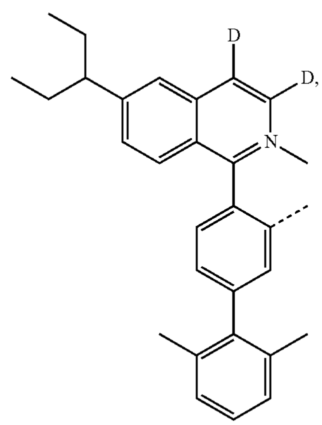
$L_{a311}$
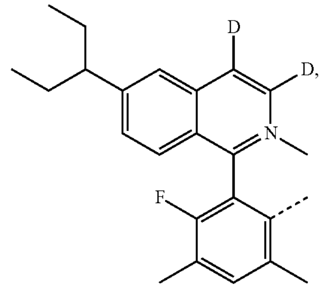

$L_{a312}$
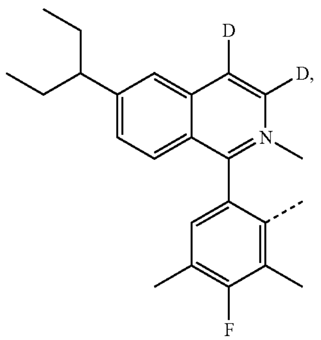
$L_{a313}$
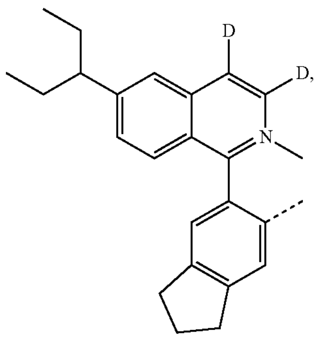
$L_{a314}$
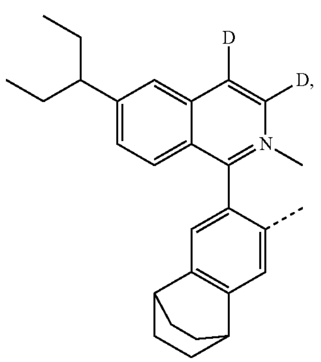
$L_{a315}$
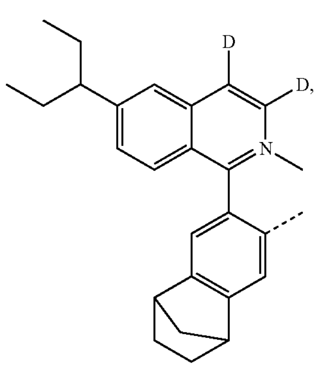
$L_{a316}$
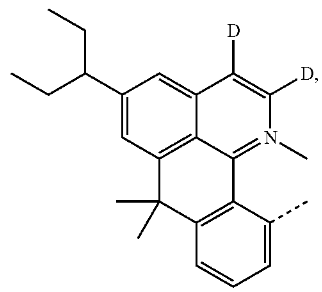
$L_{a317}$
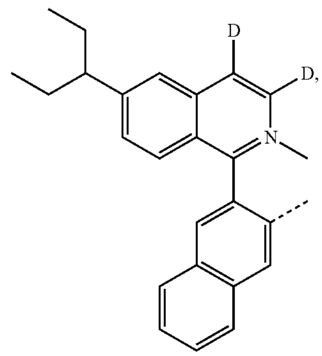
$L_{a318}$
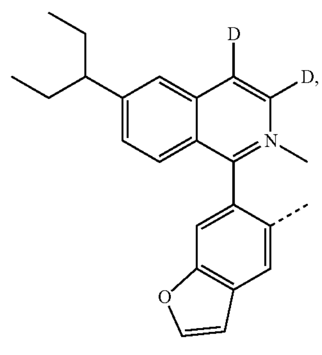
$L_{a319}$
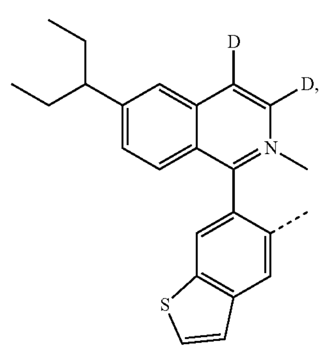

-continued
L$_{a320}$
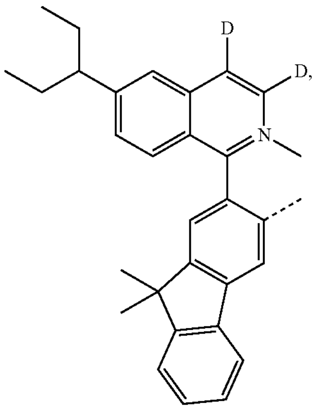
L$_{a321}$
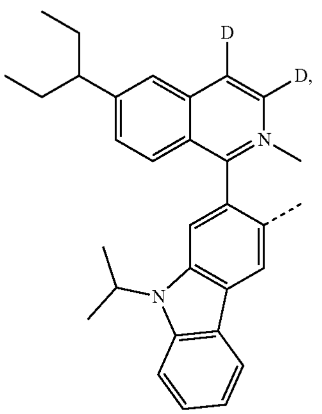
L$_{a322}$
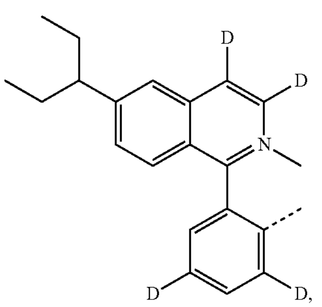
L$_{a323}$
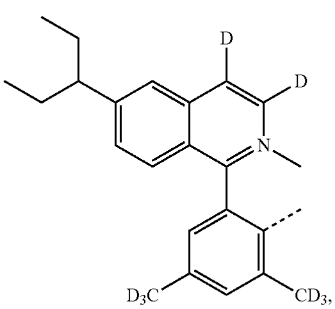
-continued
L$_{a324}$
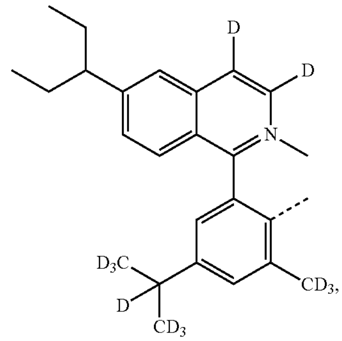
L$_{a325}$
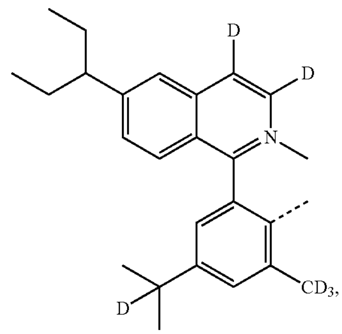
L$_{a326}$
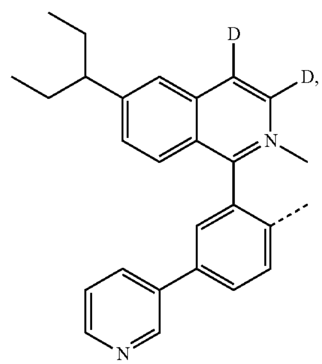
L$_{a327}$
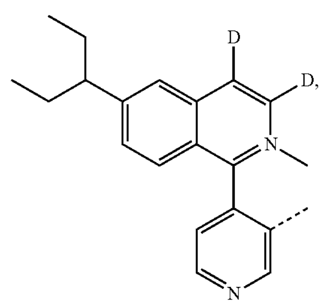
L$_{a328}$
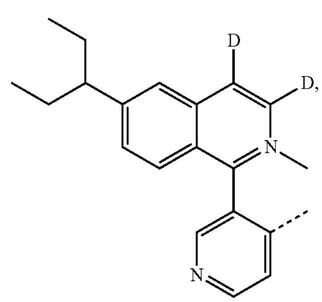

-continued
$L_{a329}$
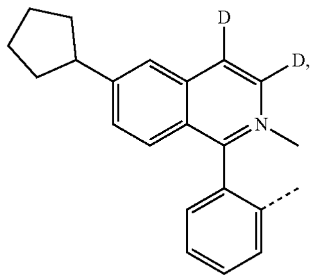
$L_{a330}$
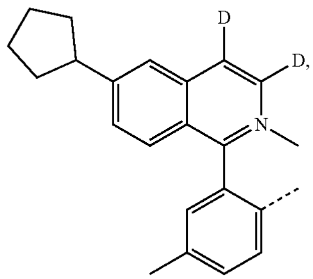
$L_{a331}$
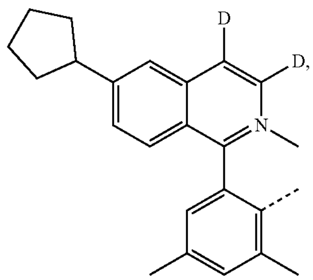
$L_{a332}$
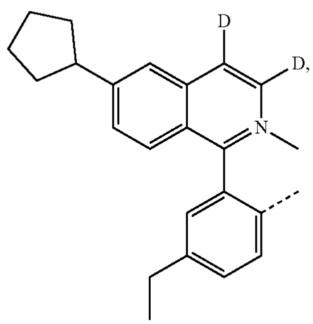
$L_{a333}$
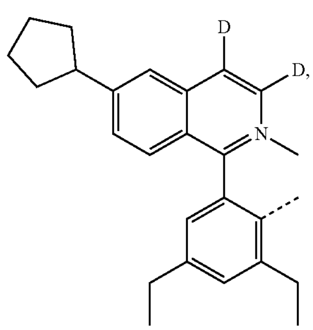
-continued
$L_{a334}$
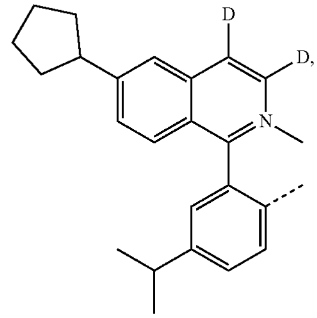
$L_{a335}$
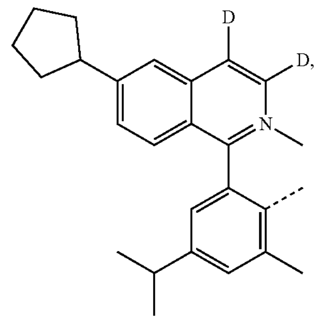
$L_{a336}$
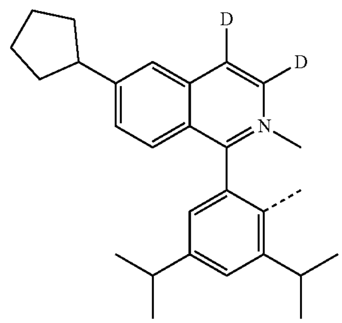
$L_{a337}$
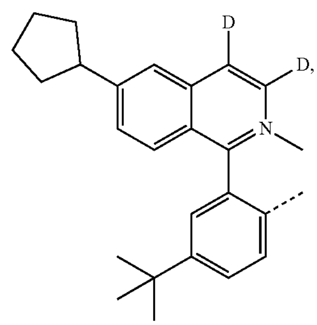
$L_{a338}$
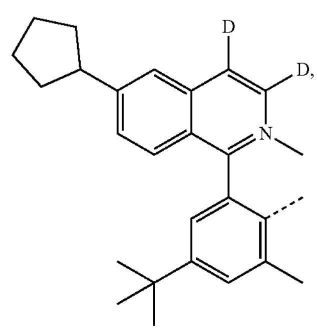

$L_{a339}$
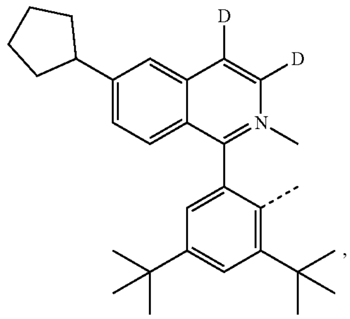
$L_{a340}$
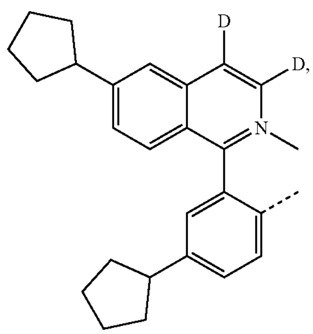
$L_{a341}$
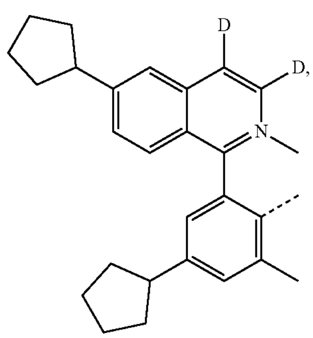
$L_{a342}$
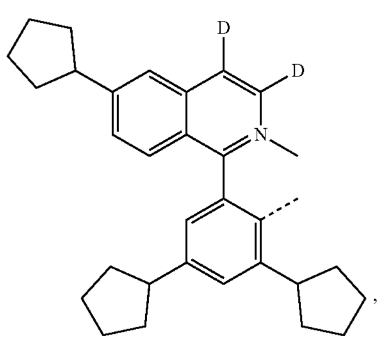
$L_{a343}$
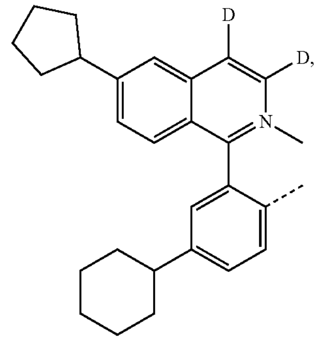
$L_{a344}$
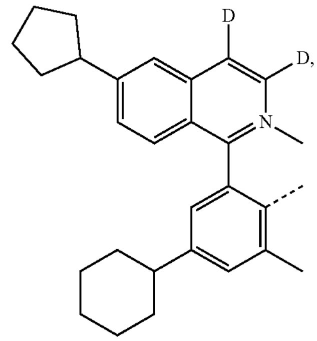
$L_{a345}$
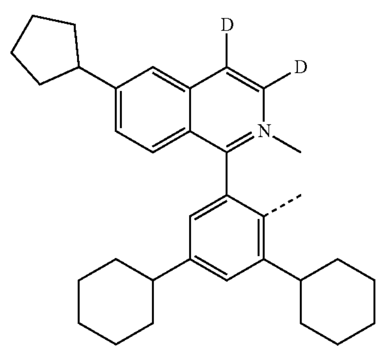
$L_{a346}$
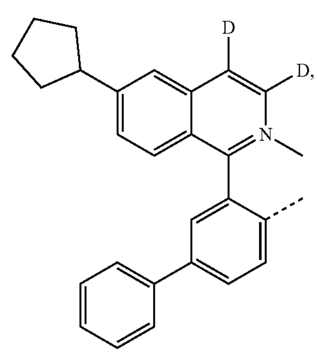

$L_{a347}$
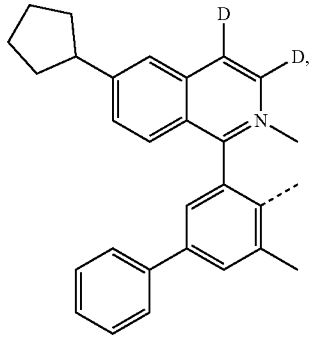
$L_{a348}$
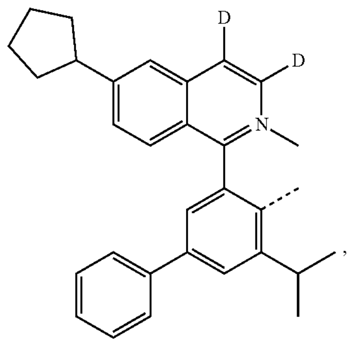
$L_{a349}$
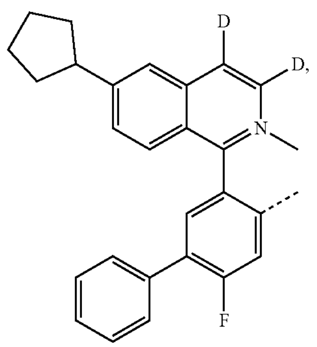
$L_{a350}$
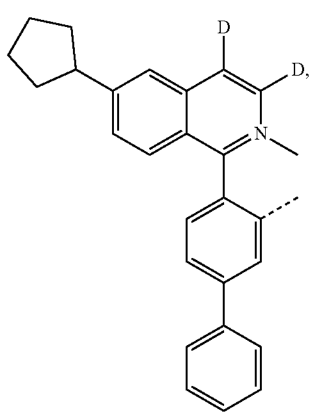
$L_{a351}$
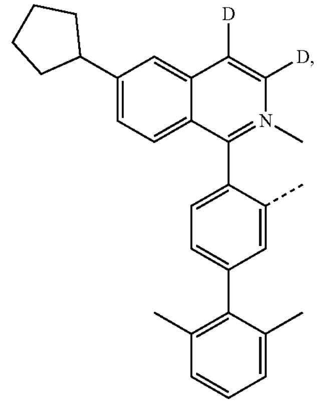
$L_{a352}$
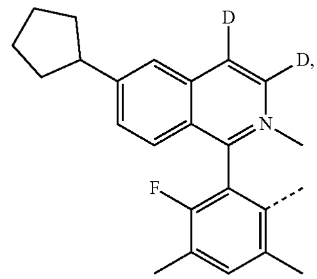
$L_{a353}$
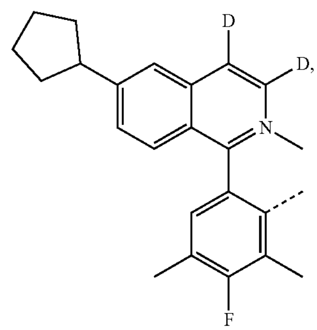
$L_{a354}$
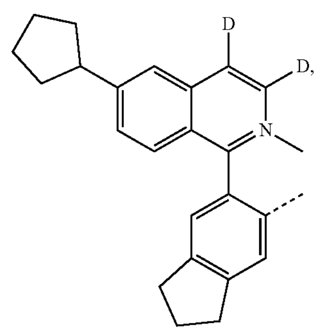

-continued
$L_{a355}$
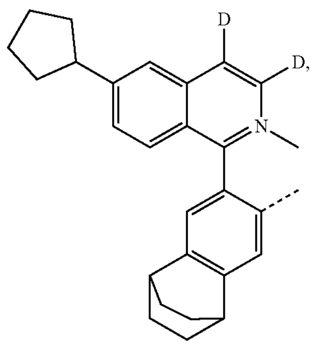
$L_{a356}$
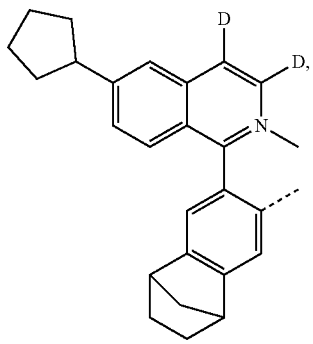
$L_{a357}$
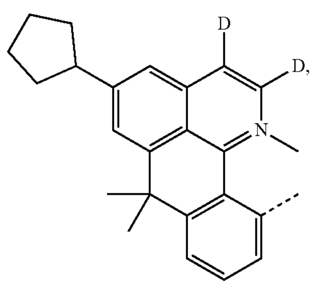
$L_{a358}$
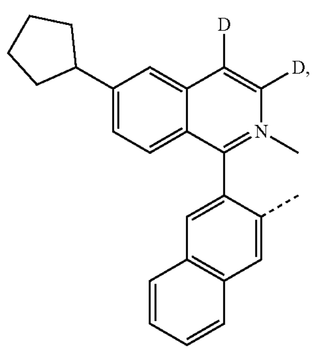
-continued
$L_{a359}$
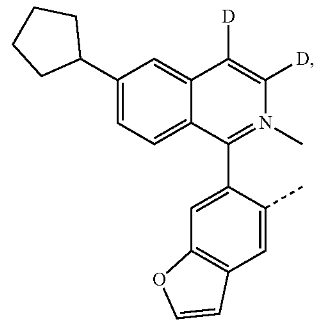
$L_{a360}$
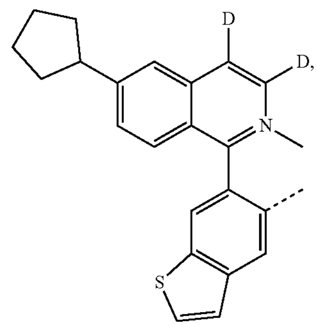
$L_{a361}$
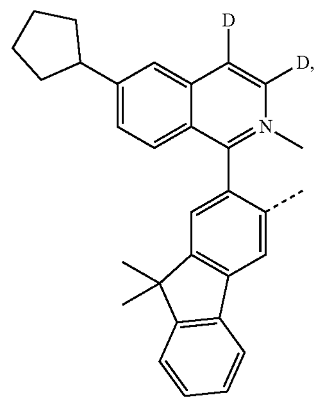
$L_{a362}$
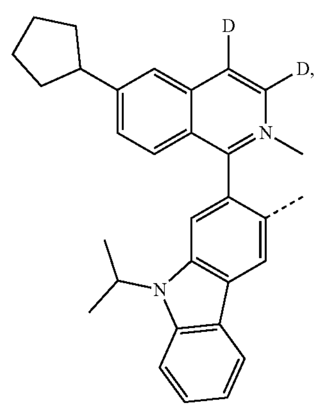

-continued
$L_{a363}$
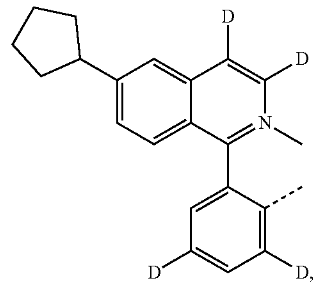
$L_{a364}$
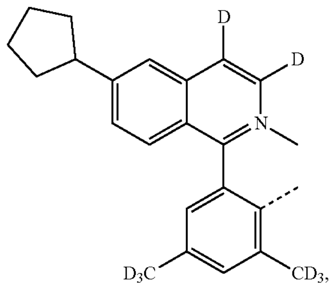
$L_{a365}$
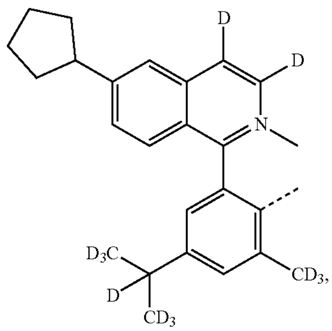
$L_{a366}$
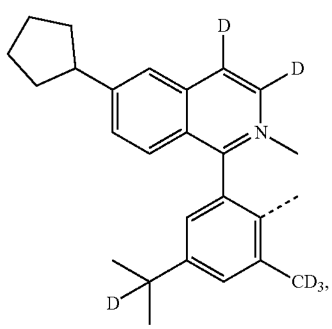
$L_{a367}$
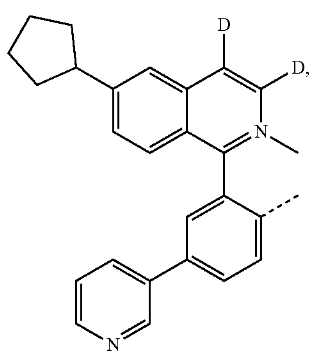
-continued
$L_{a368}$
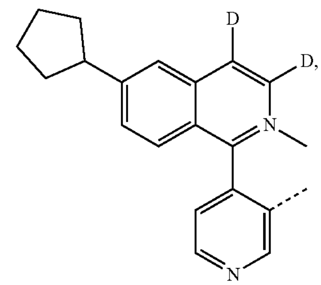
$L_{a369}$
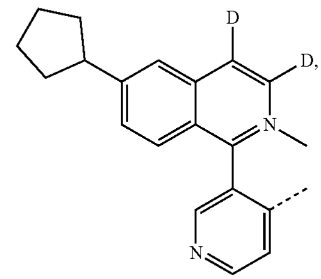
$L_{a370}$
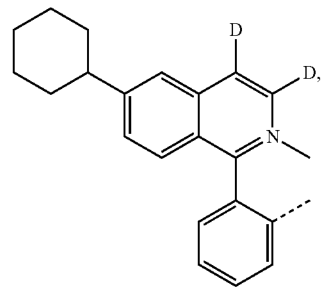
$L_{a371}$
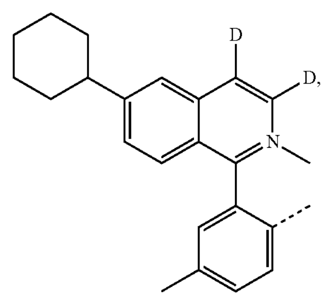
$L_{a372}$
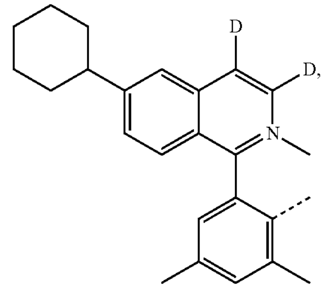

-continued
$L_{a373}$
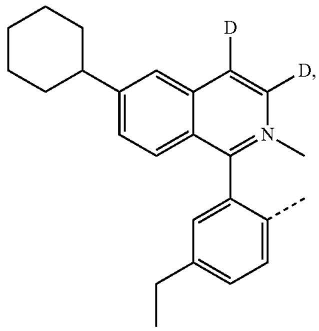
$L_{a374}$
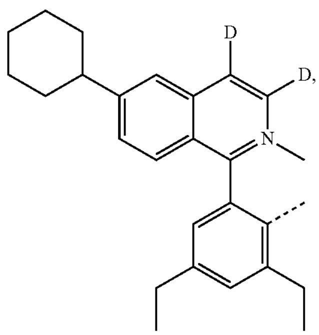
$L_{a375}$
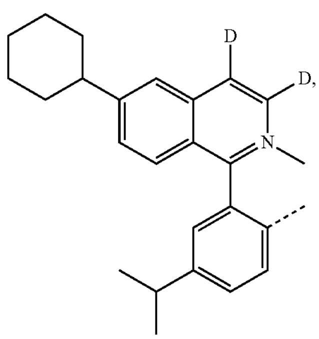
$L_{a376}$
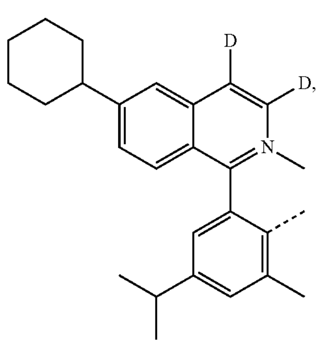
-continued
$L_{a377}$
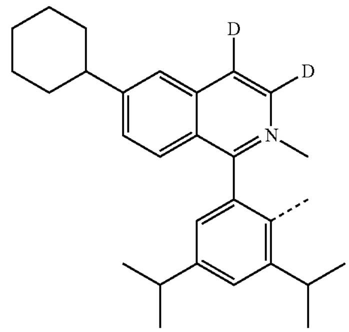
$L_{a378}$
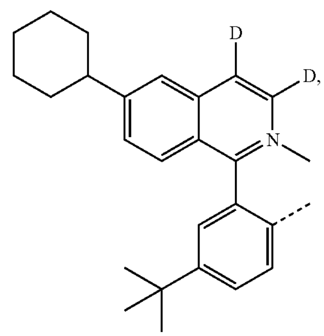
$L_{a379}$
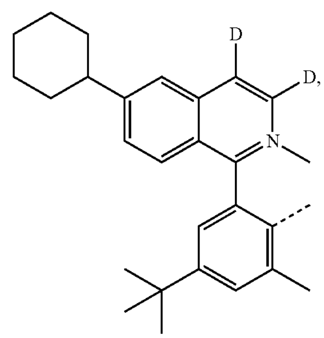
$L_{a380}$
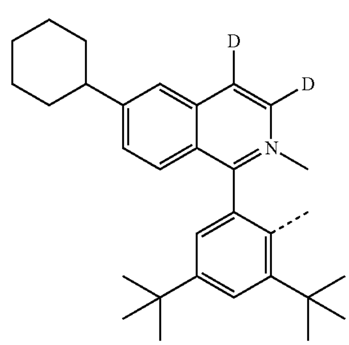

-continued
$L_{a381}$
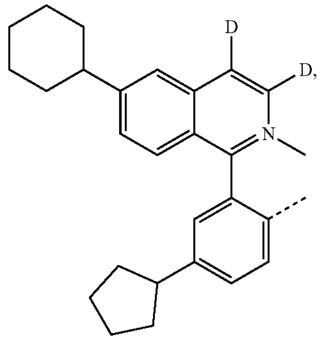
$L_{a382}$
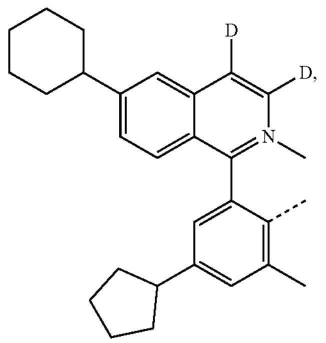
$L_{a383}$
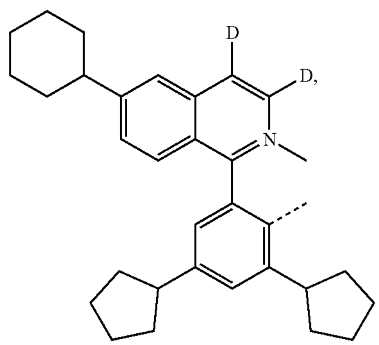
$L_{a384}$
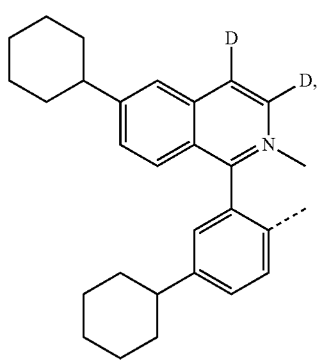
-continued
$L_{a385}$
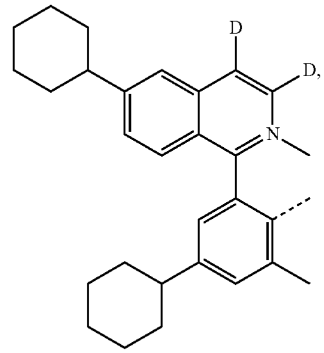
$L_{a386}$
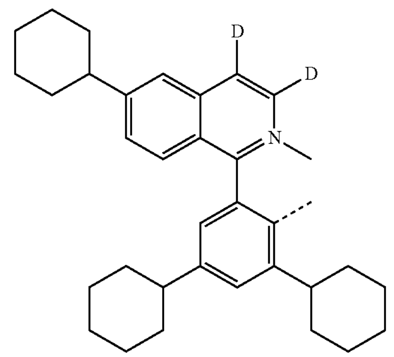
$L_{a387}$
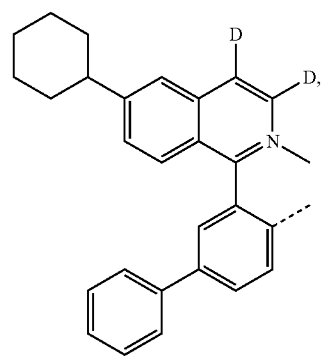
$L_{a388}$
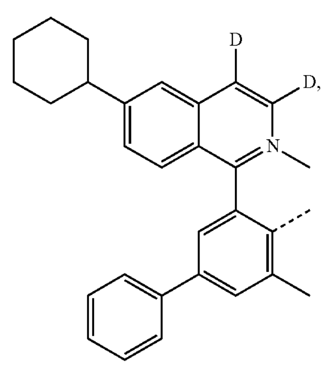

-continued
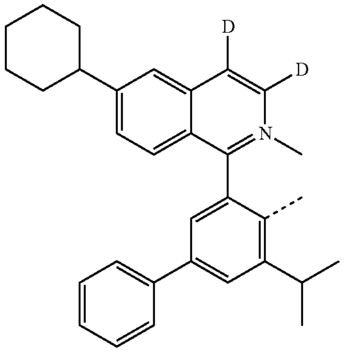
$L_{a389}$
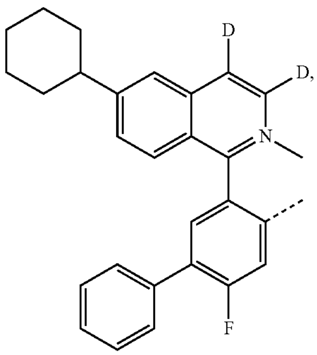
$L_{a390}$
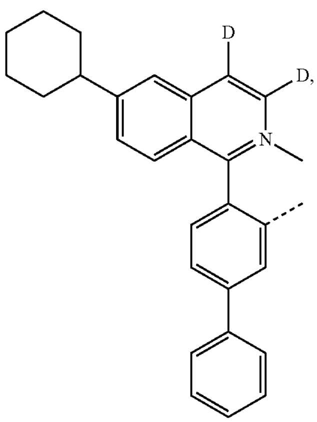
$L_{a391}$
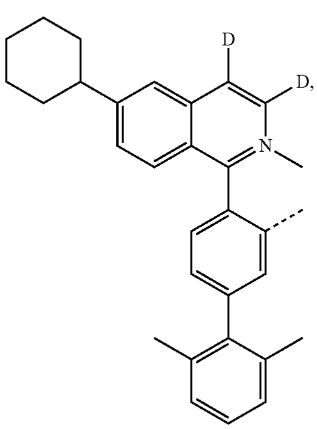
$L_{a392}$
-continued
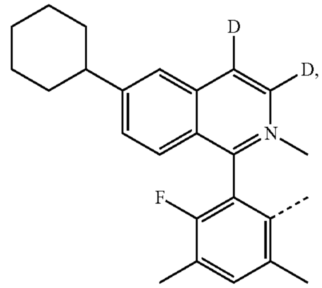
$L_{a393}$
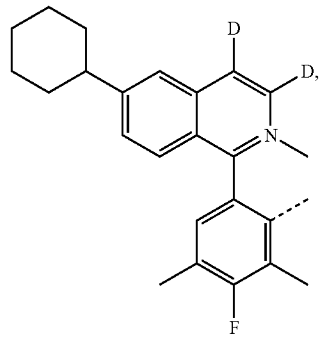
$L_{a394}$
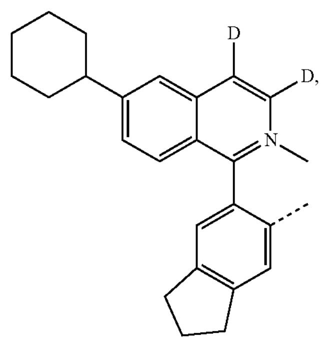
$L_{a395}$
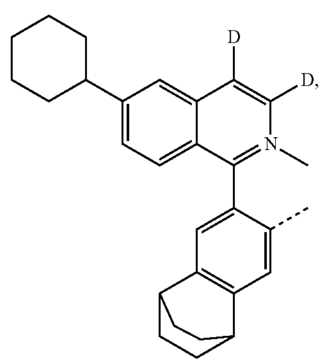
$L_{a396}$ $L_{a397}$
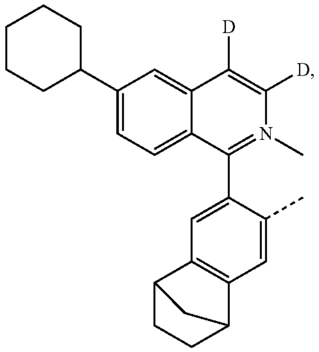
$L_{a398}$
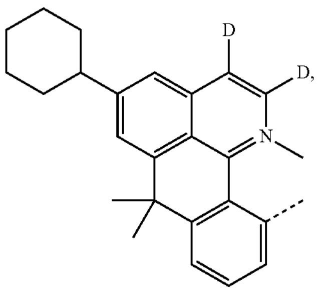
$L_{a399}$
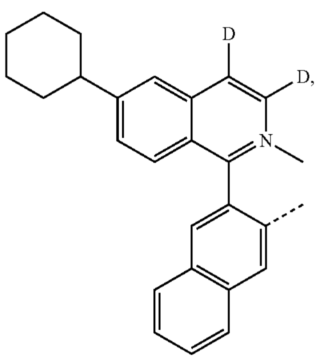
$L_{a400}$
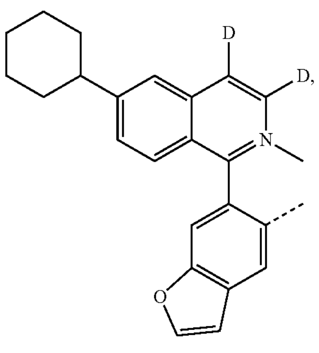
$L_{a401}$
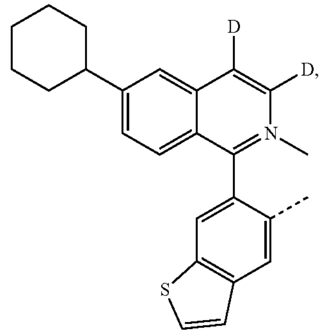
$L_{a402}$
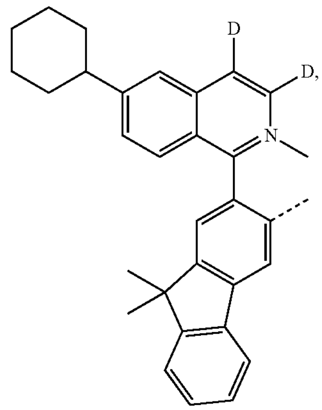
$L_{a403}$
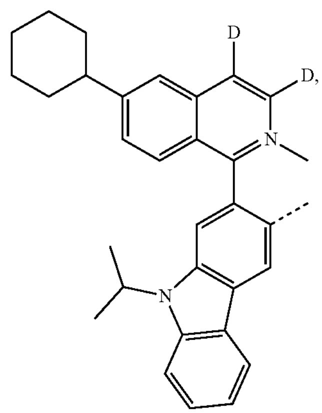
$L_{a404}$
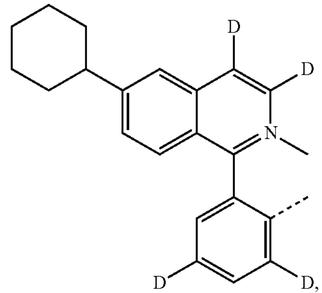

-continued
$L_{a405}$
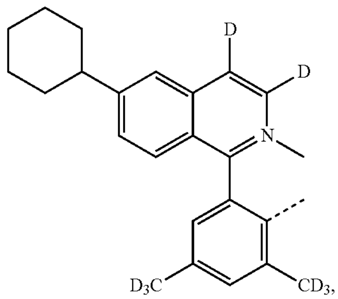
$L_{a406}$
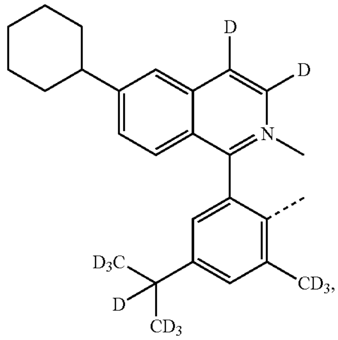
$L_{a407}$
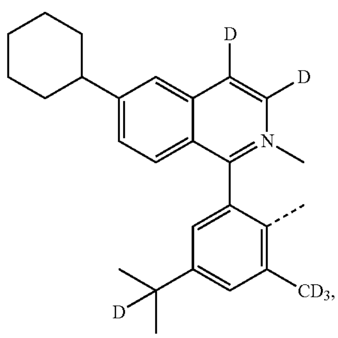
$L_{a408}$
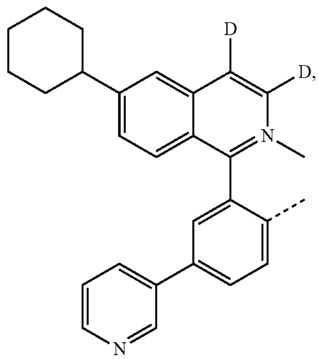
-continued
$L_{a409}$
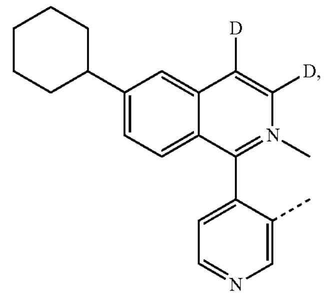
$L_{a410}$
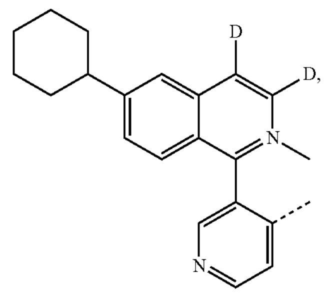
$L_{a411}$
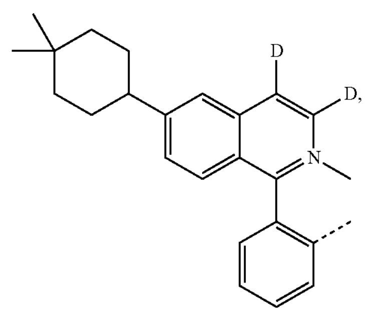
$L_{a412}$
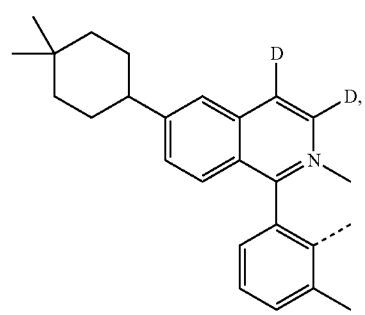
$L_{a413}$
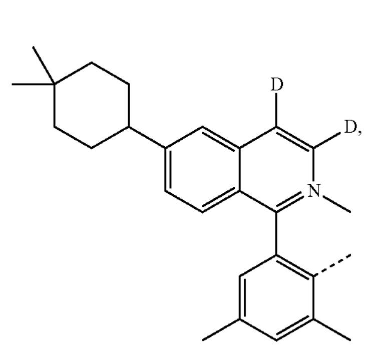

-continued
$L_{a414}$
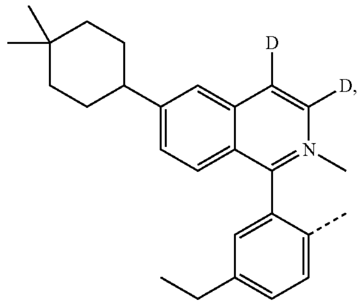
$L_{a415}$
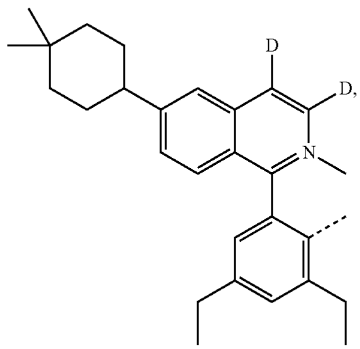
$L_{a416}$
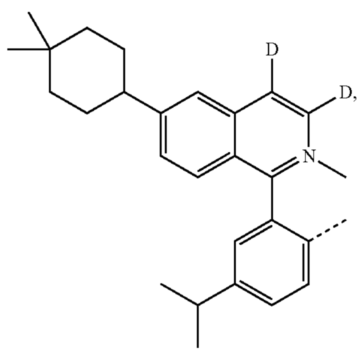
$L_{a417}$
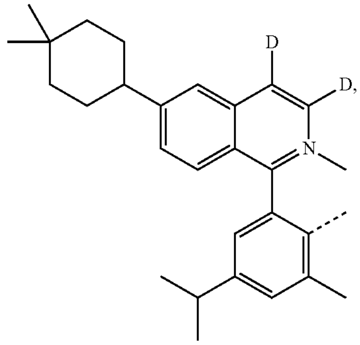
-continued
$L_{a418}$
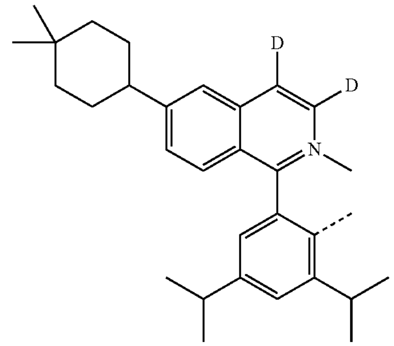
$L_{a419}$
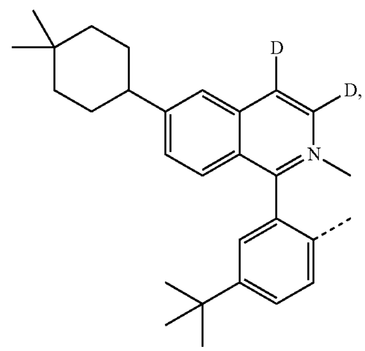
$L_{a420}$
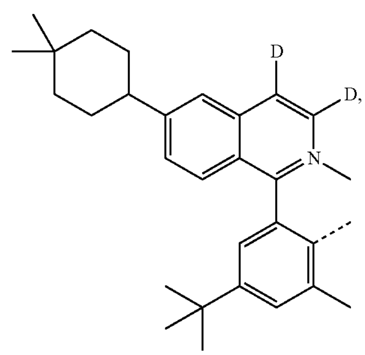
$L_{a421}$
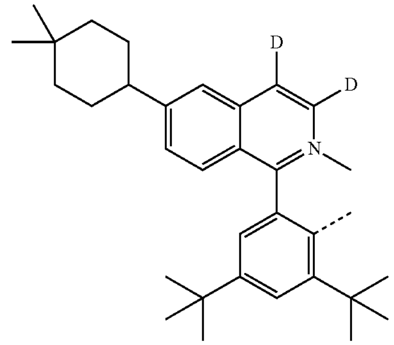

-continued
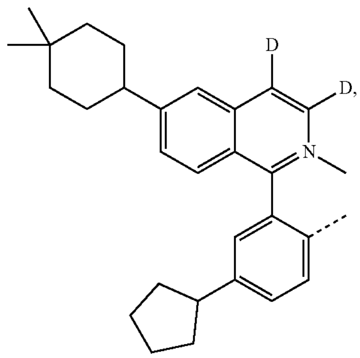
$L_{a422}$
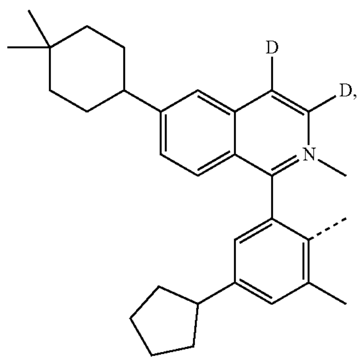
$L_{a423}$
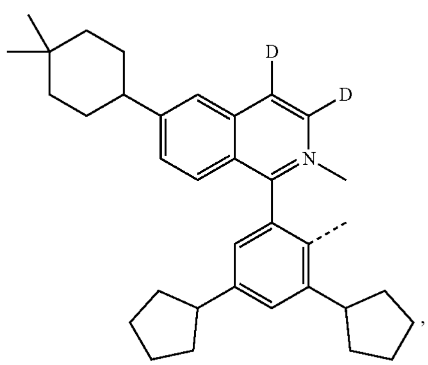
$L_{a424}$
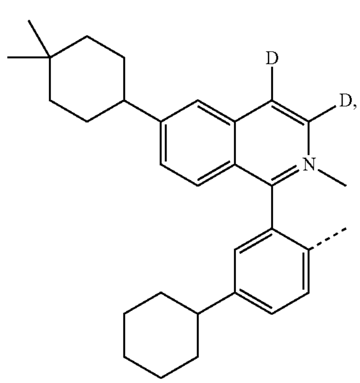
$L_{a425}$
-continued
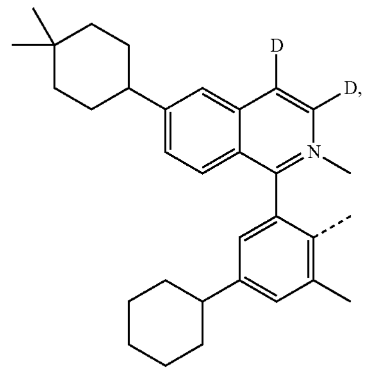
$L_{a426}$
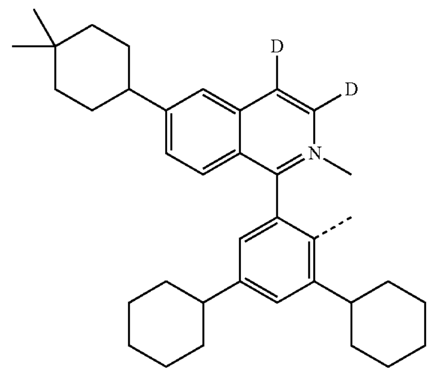
$L_{a427}$
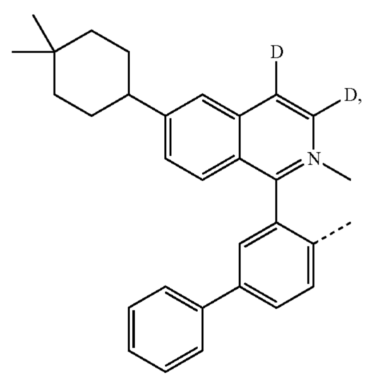
$L_{a428}$
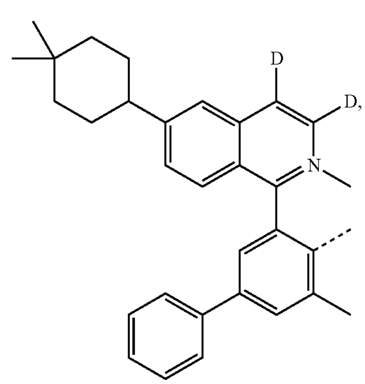
$L_{a429}$ -continued
$L_{a430}$
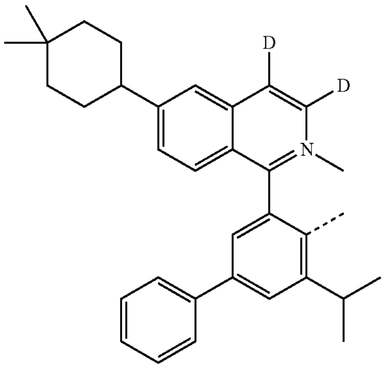
$L_{a431}$
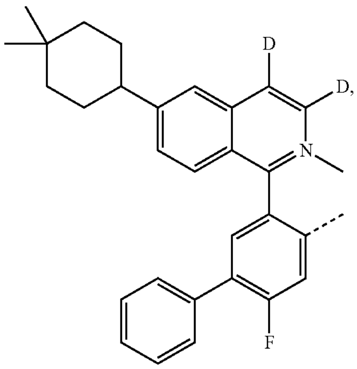
$L_{a432}$
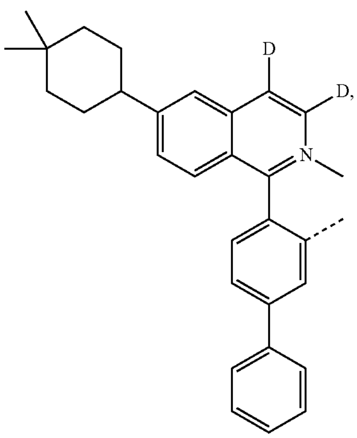
$L_{a433}$
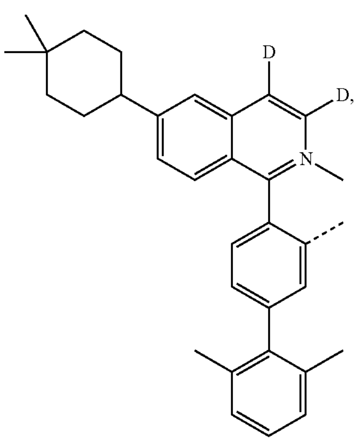
-continued
$L_{a434}$
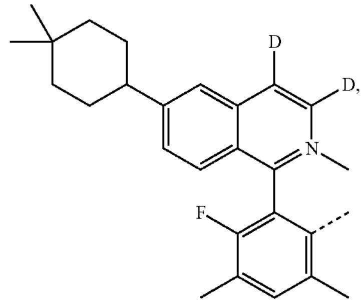
$L_{a435}$
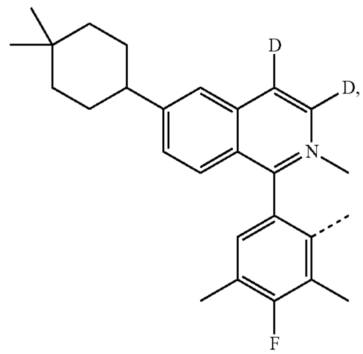
$L_{a436}$
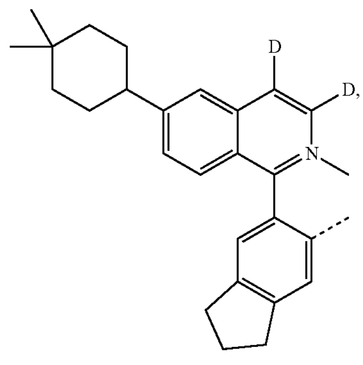
$L_{a437}$
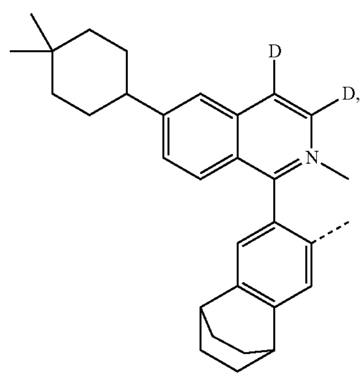

-continued
$L_{a438}$
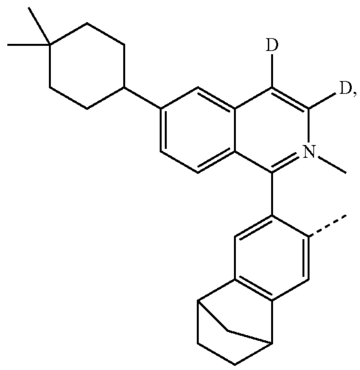
$L_{a439}$
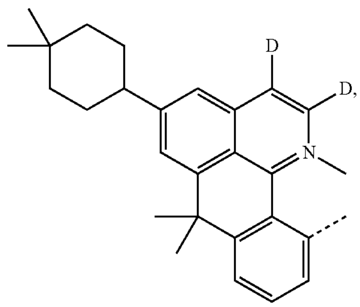
$L_{a440}$
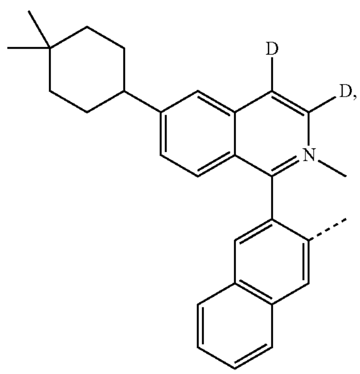
$L_{a441}$
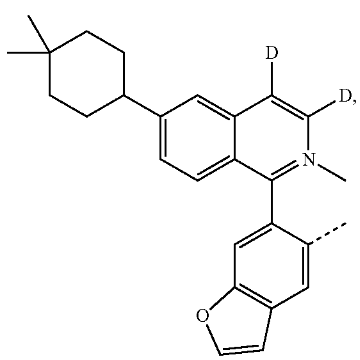
-continued
$L_{a442}$
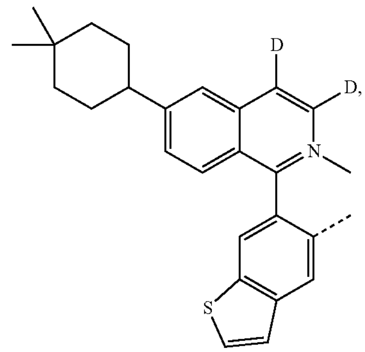
$L_{a443}$
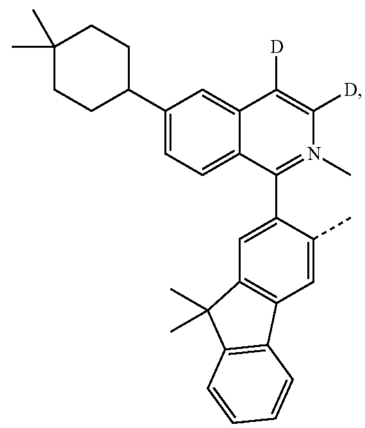
$L_{a444}$
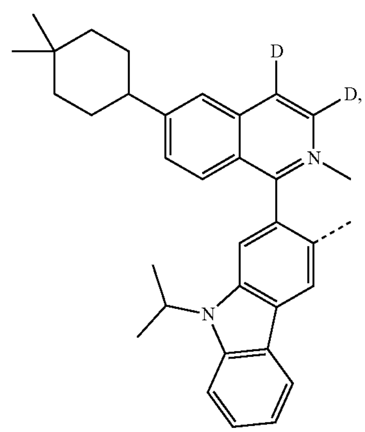
$L_{a445}$
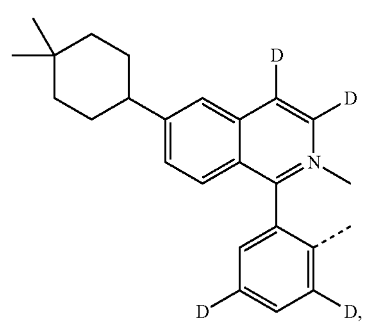

$L_{a446}$
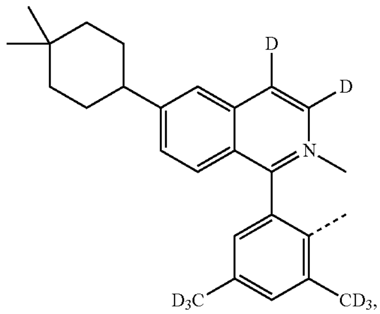
$L_{a447}$
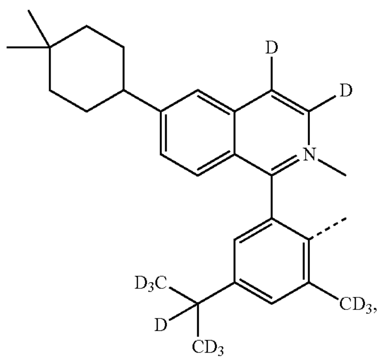
$L_{a448}$
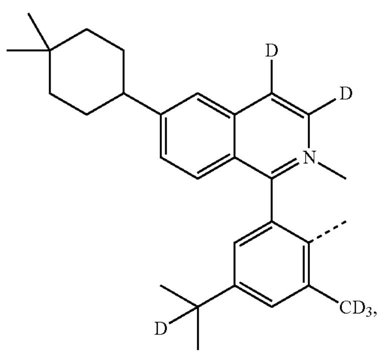
$L_{a449}$
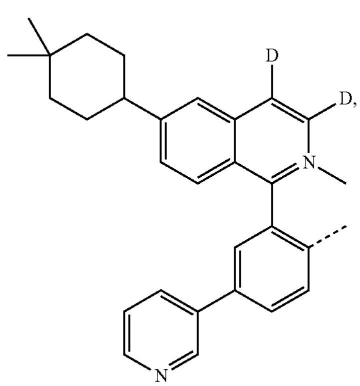
$L_{a450}$
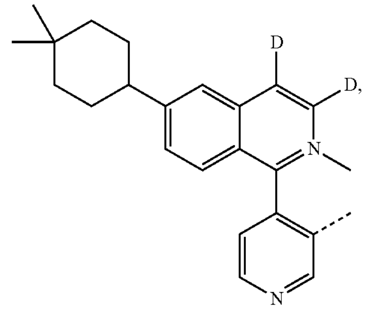
$L_{a451}$
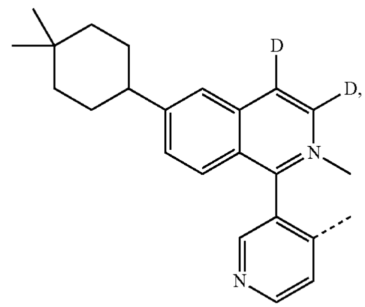
$L_{a452}$
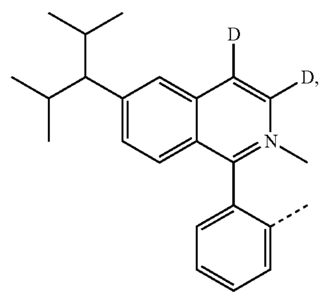
$L_{a453}$
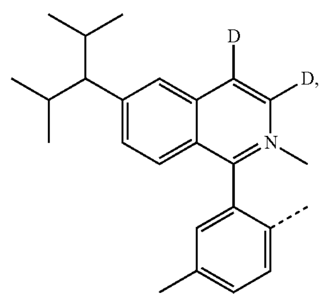
$L_{a454}$
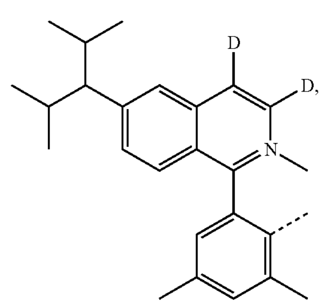

-continued
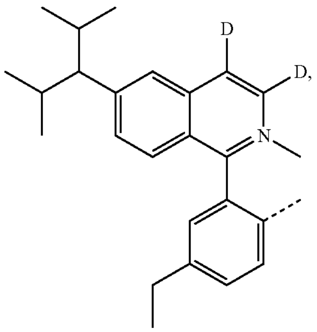
$L_{a455}$
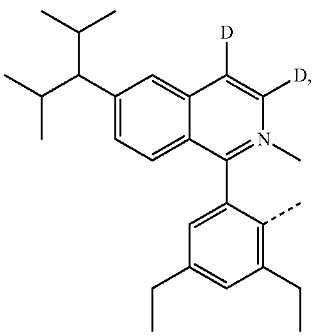
$L_{a456}$
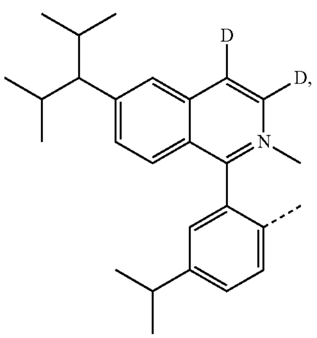
$L_{a457}$
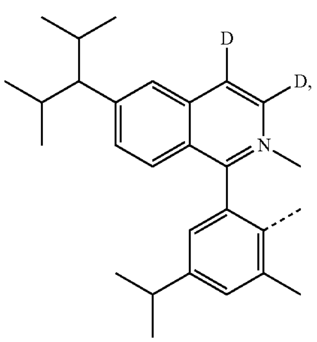
$L_{a458}$
-continued
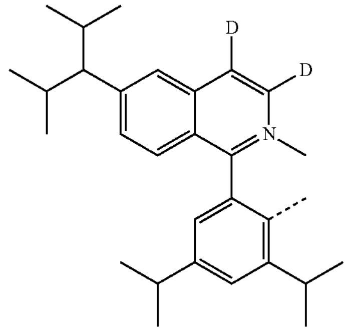
$L_{a459}$
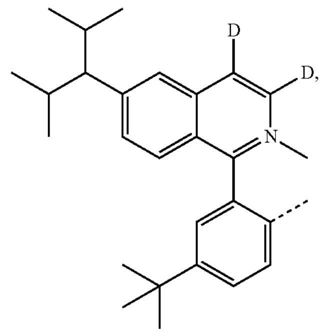
$L_{a460}$
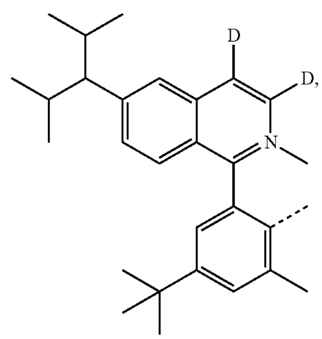
$L_{a461}$
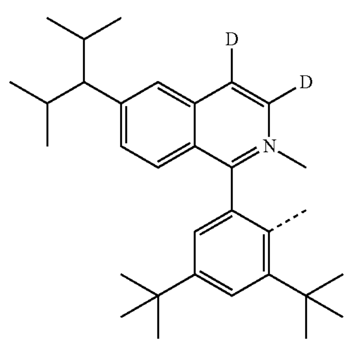
$L_{a462}$ -continued
$L_{a463}$
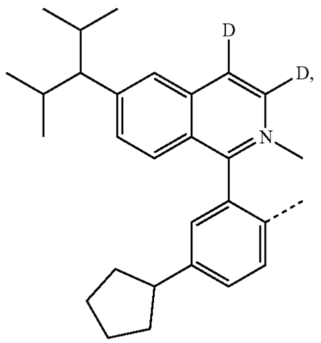
$L_{a464}$
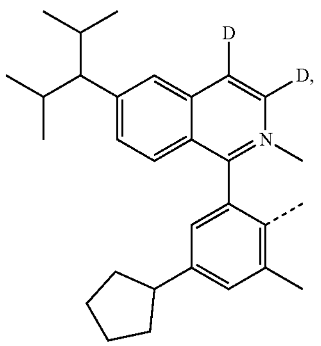
$L_{a465}$
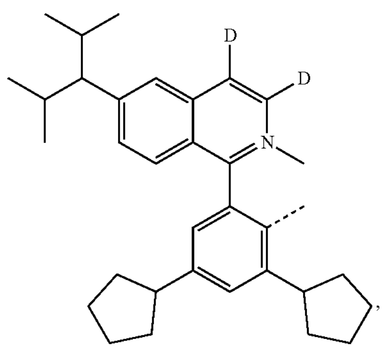
$L_{a466}$
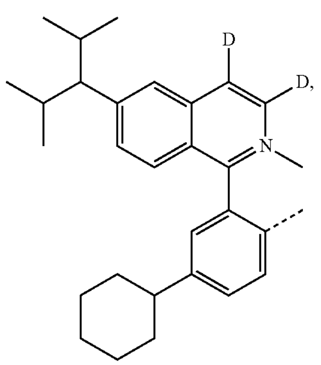
-continued
$L_{a467}$
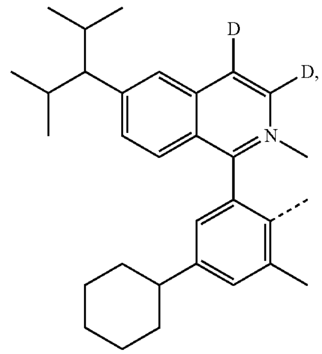
$L_{a468}$
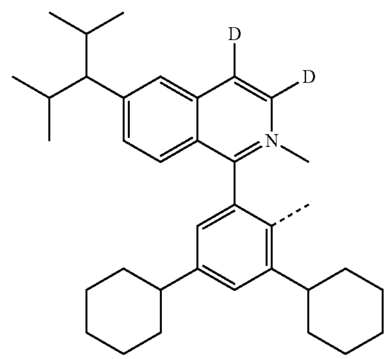
$L_{a469}$
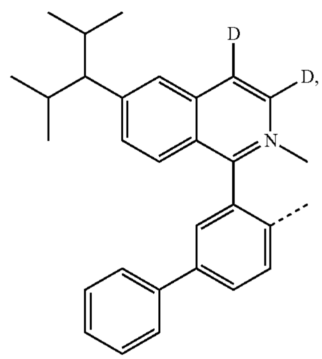
$L_{a470}$
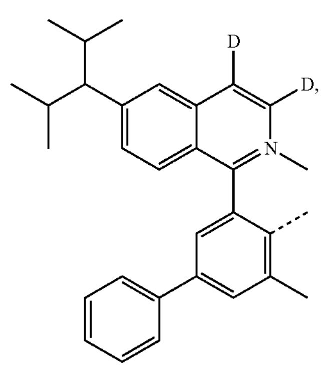

-continued
$L_{a471}$
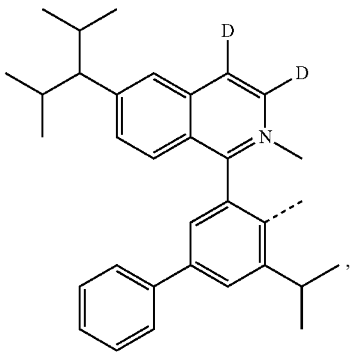
$L_{a472}$
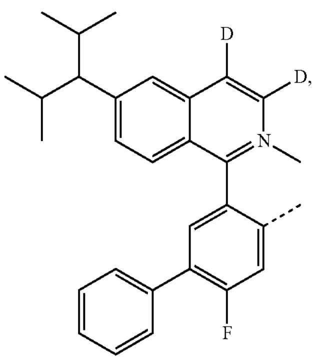
$L_{a473}$
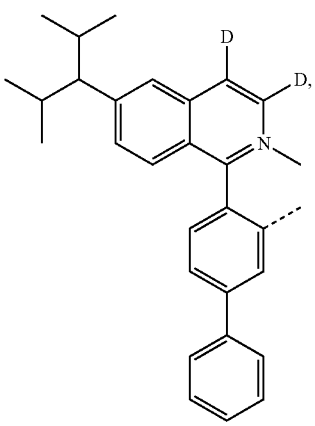
$L_{a474}$
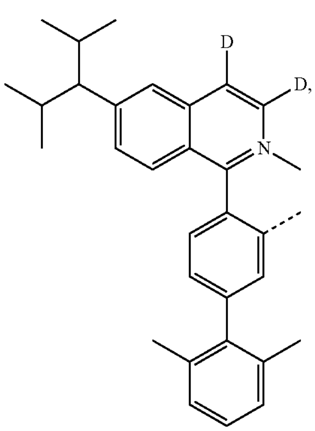
-continued
$L_{a475}$
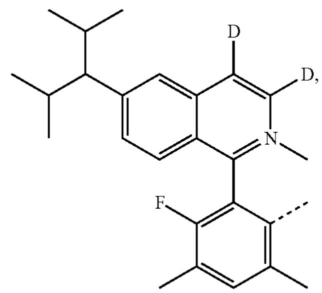
$L_{a476}$
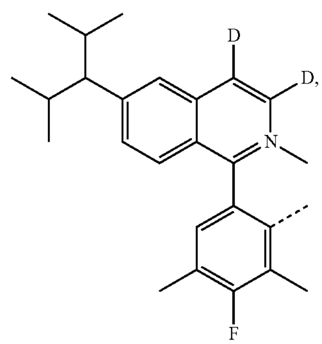
$L_{a477}$
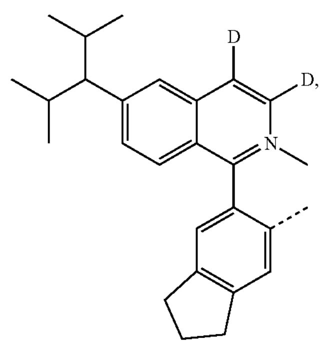
$L_{a478}$
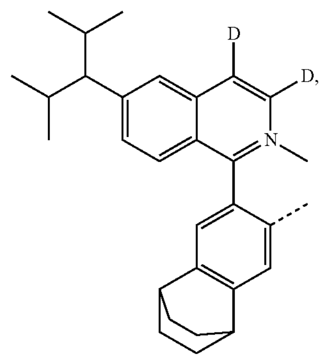

-continued
$L_{a479}$
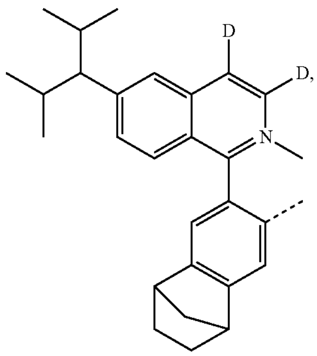
$L_{a480}$
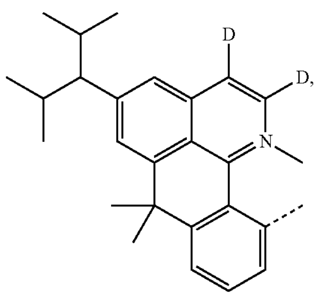
$L_{a481}$
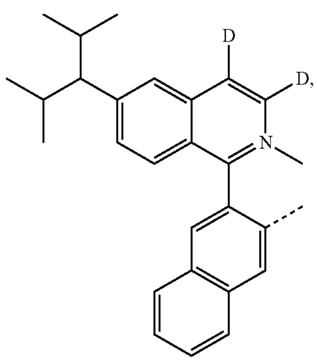
$L_{a482}$
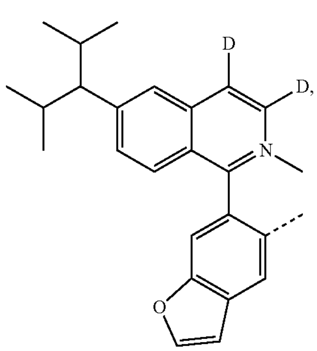
-continued
$L_{a483}$
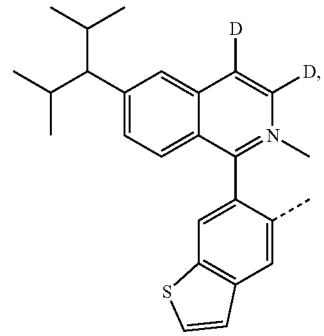
$L_{a484}$
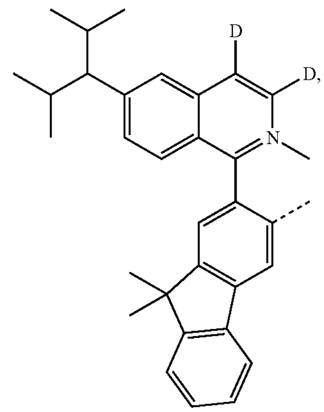
$L_{a485}$
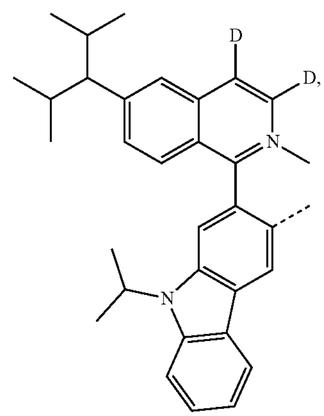
$L_{a486}$
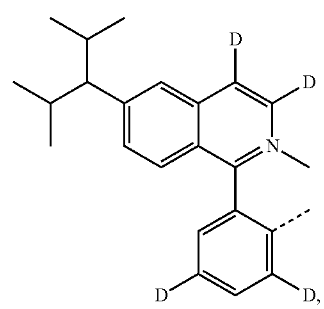

-continued
$L_{a487}$
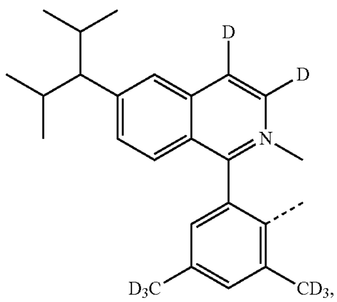
$L_{a488}$
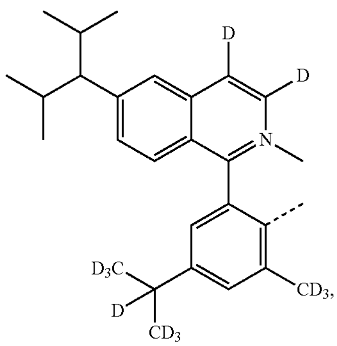
$L_{a489}$
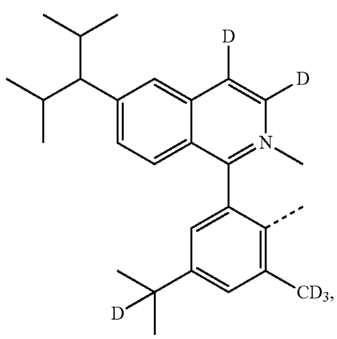
$L_{a490}$
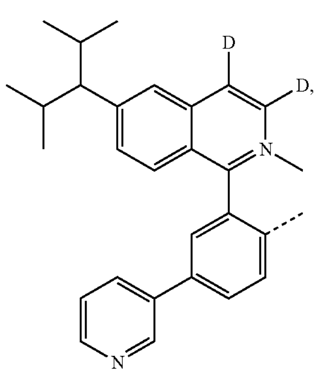
-continued
$L_{a491}$
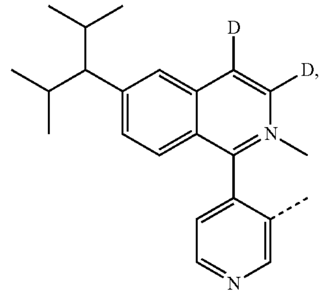
$L_{a492}$
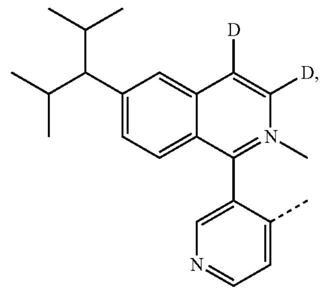
$L_{a493}$
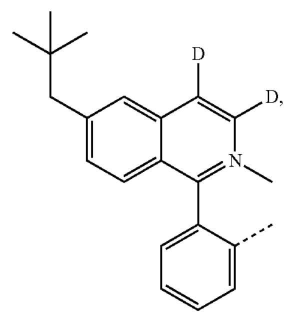
$L_{a494}$
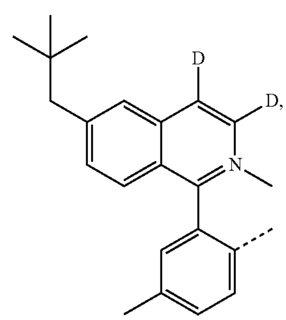
$L_{a495}$
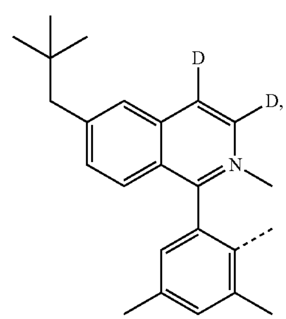

-continued
$L_{a496}$
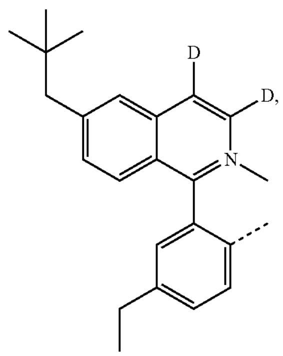
$L_{a497}$
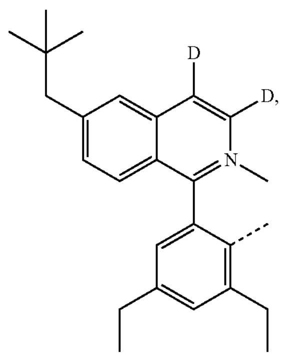
$L_{a498}$
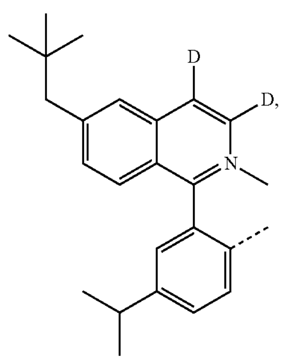
$L_{a499}$
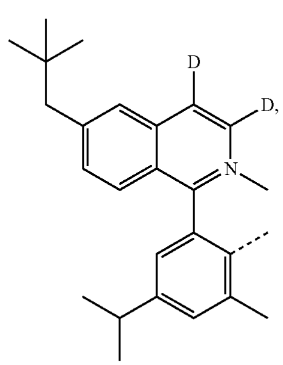
-continued
$L_{a500}$
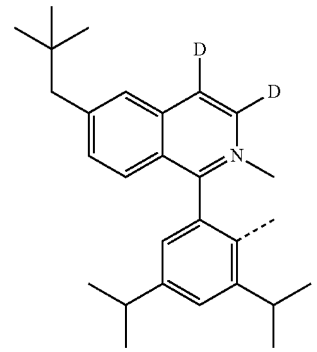
$L_{a501}$
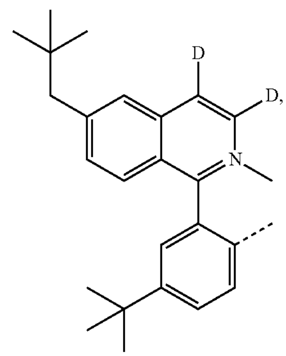
$L_{a502}$
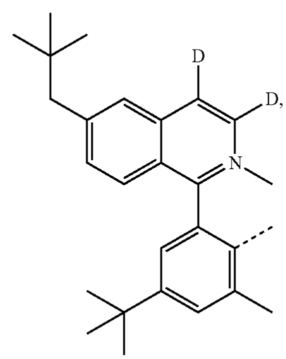
$L_{a503}$
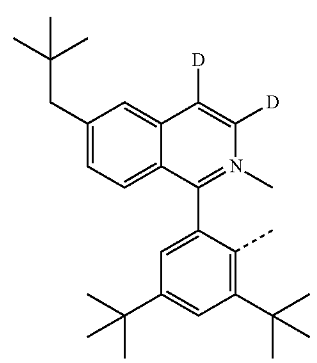

-continued
$L_{a504}$
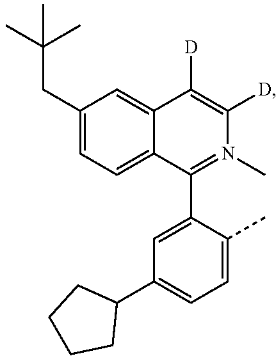
$L_{a505}$
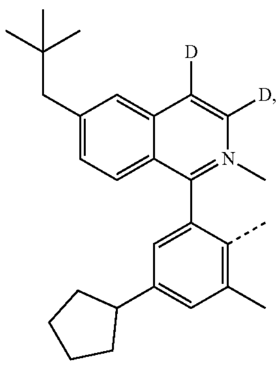
$L_{a506}$
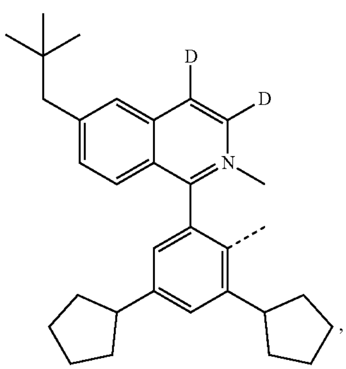
$L_{a507}$
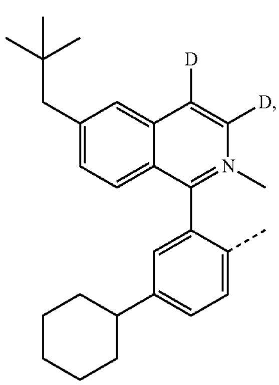
-continued
$L_{a508}$
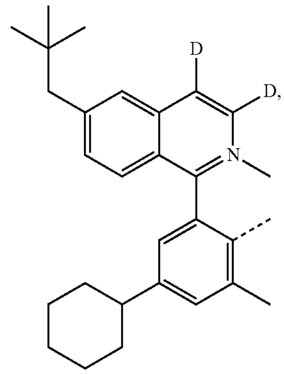
$L_{a509}$
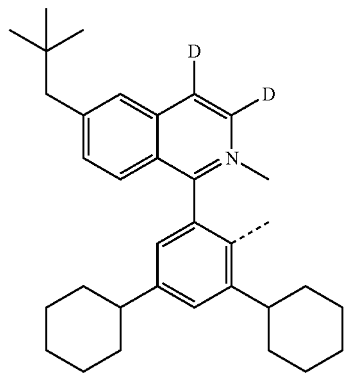
$L_{a510}$
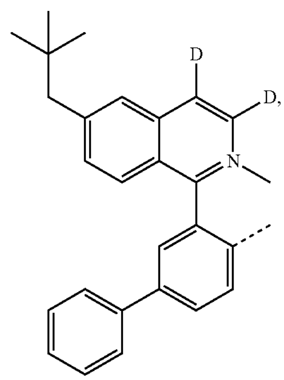
$L_{a511}$
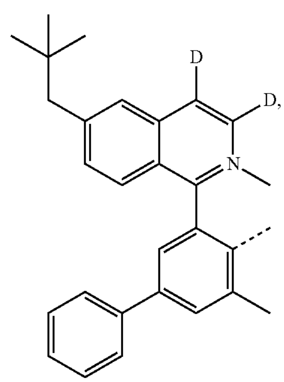

-continued
$L_{a512}$
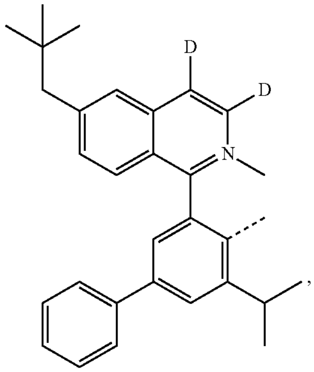
$L_{a513}$
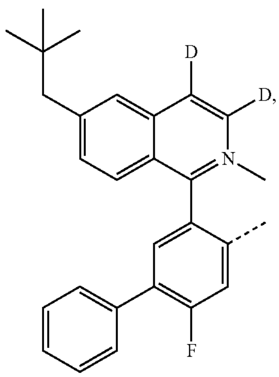
$L_{a514}$
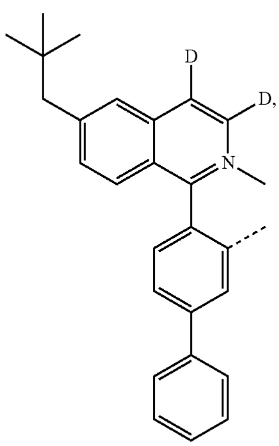
$L_{a515}$
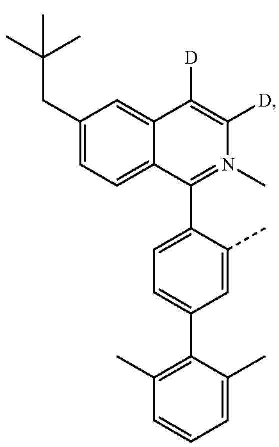
-continued
$L_{a516}$
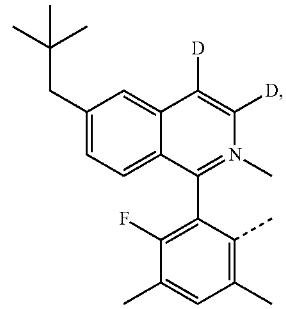
$L_{a517}$
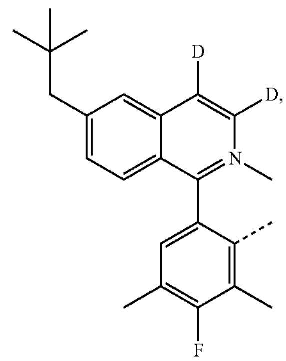
$L_{a518}$
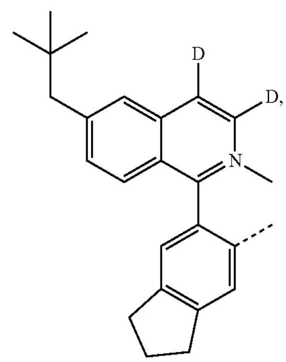
$L_{a519}$
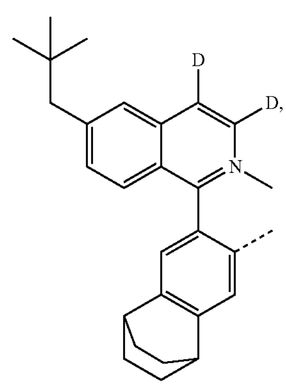

$L_{a520}$
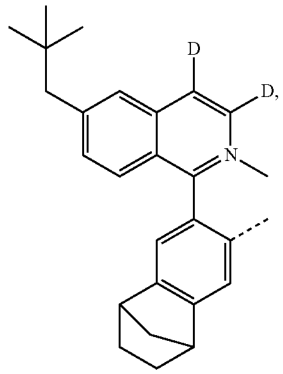
$L_{a521}$
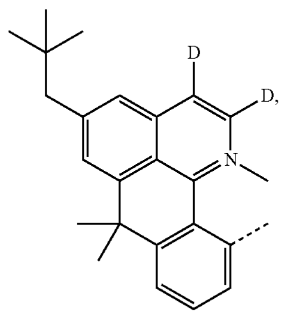
$L_{a522}$
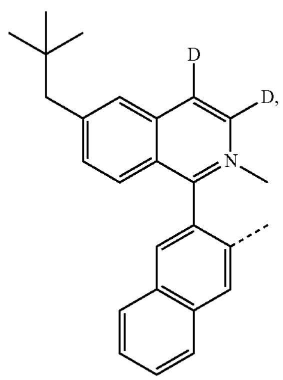
$L_{a523}$
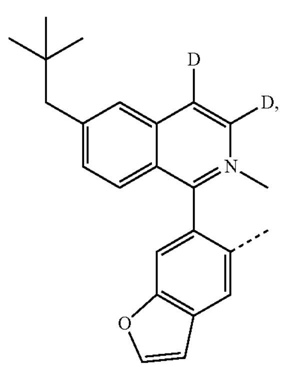
$L_{a524}$
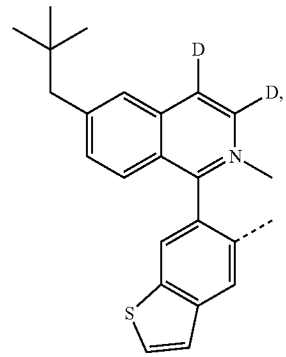
$L_{a525}$
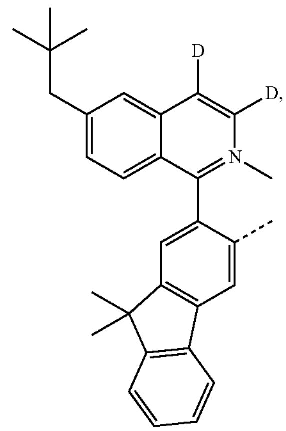
$L_{a526}$
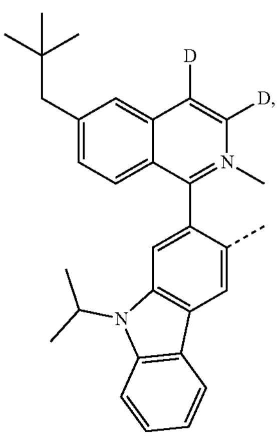
$L_{a527}$
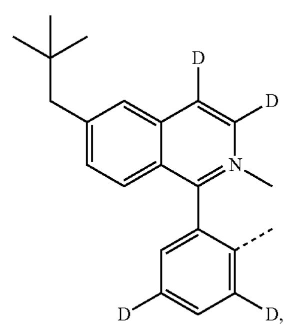

-continued
$L_{a528}$
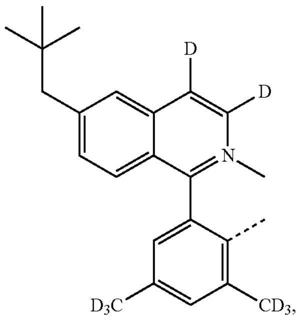
$L_{a529}$
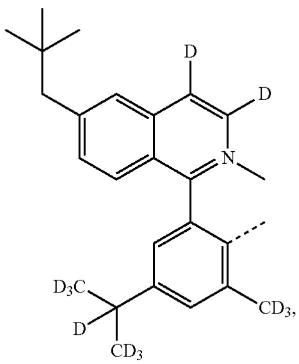
$L_{a530}$
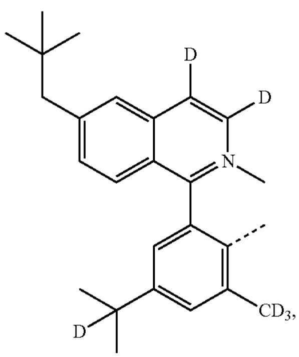
$L_{a531}$
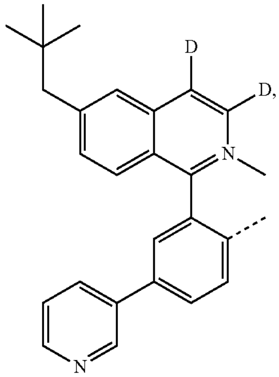
-continued
$L_{a532}$
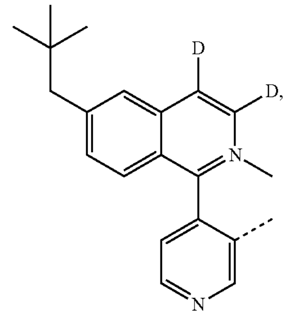
$L_{a533}$
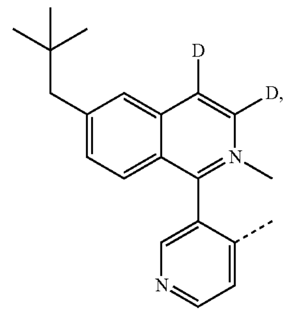
$L_{a534}$
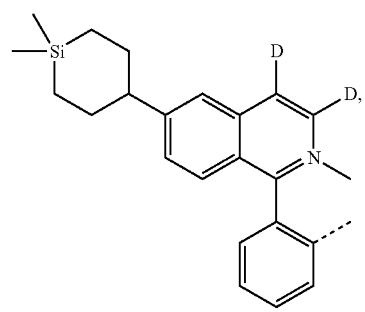
$L_{a535}$
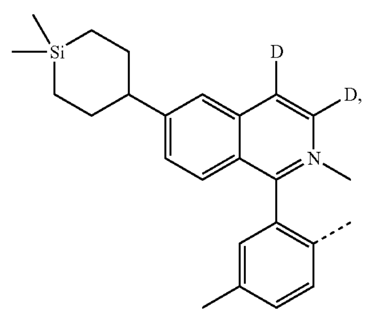
$L_{a536}$
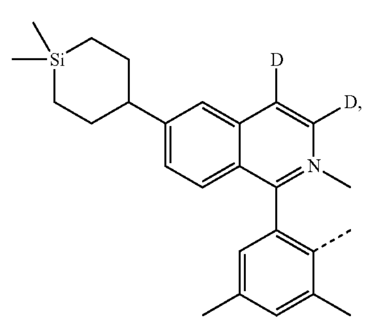

-continued
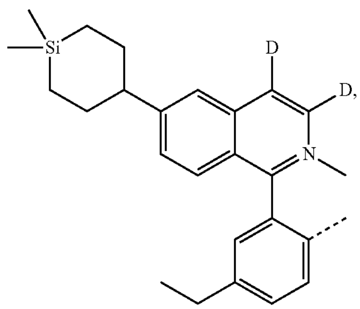
$L_{a537}$
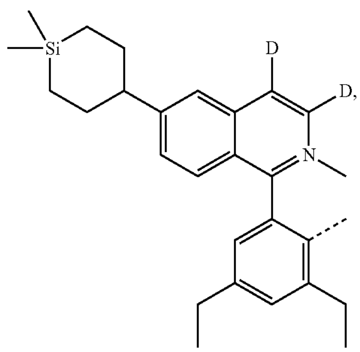
$L_{a538}$
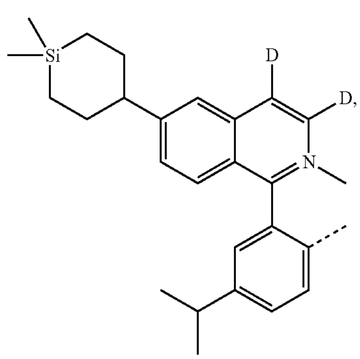
$L_{a539}$
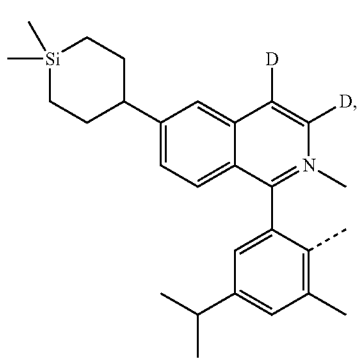
$L_{a540}$
-continued
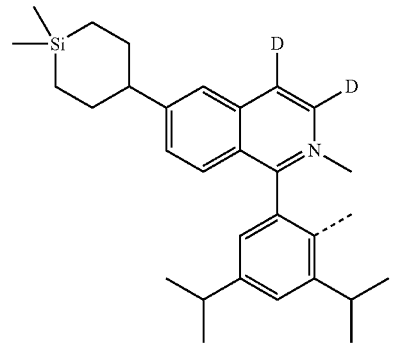
$L_{a541}$
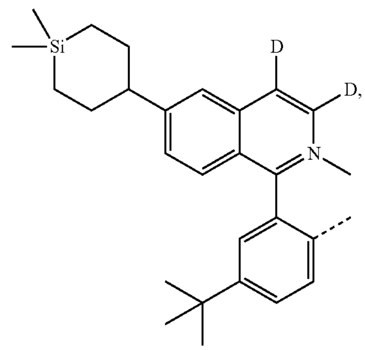
$L_{a542}$
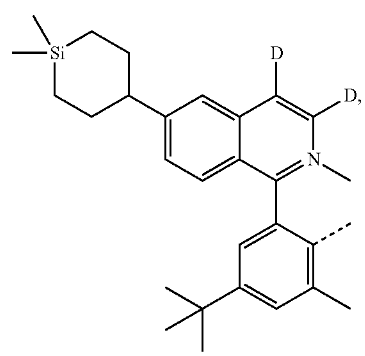
$L_{a543}$
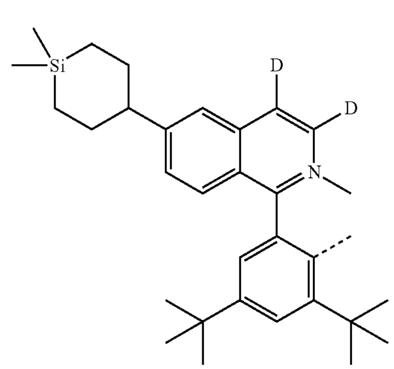
$L_{a544}$ -continued
$L_{a545}$
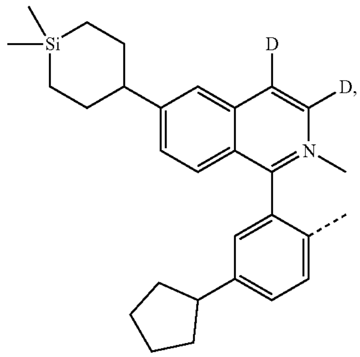
$L_{a546}$
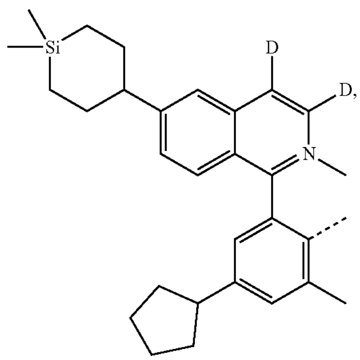
$L_{a547}$
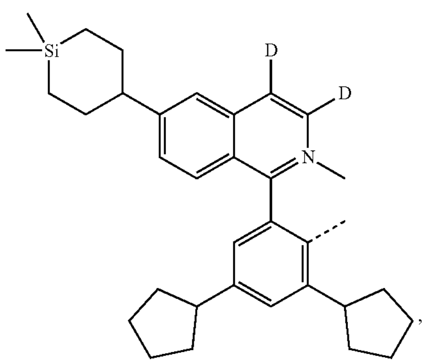
$L_{a548}$
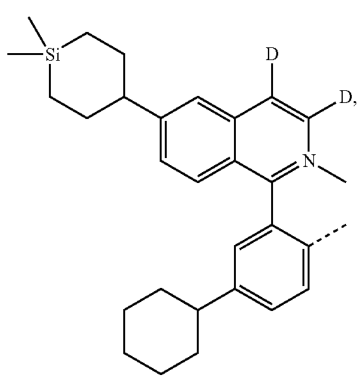
-continued
$L_{a549}$
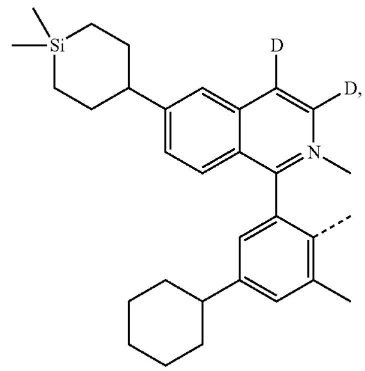
$L_{a550}$
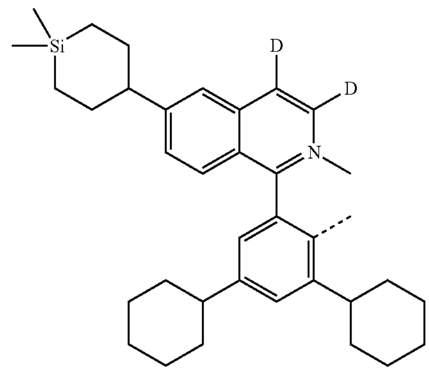
$L_{a551}$
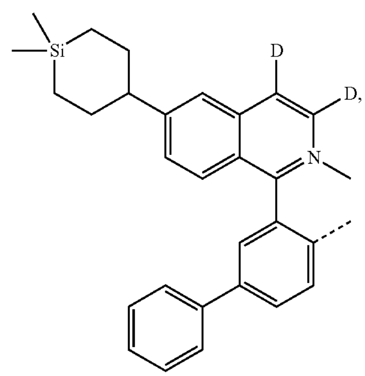
$L_{a552}$
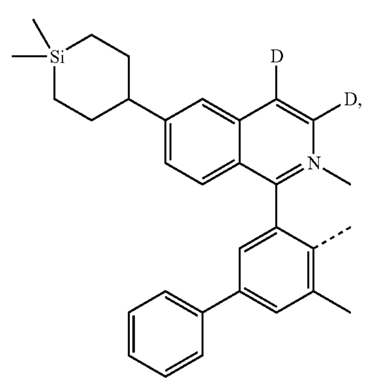

-continued
$L_{a553}$
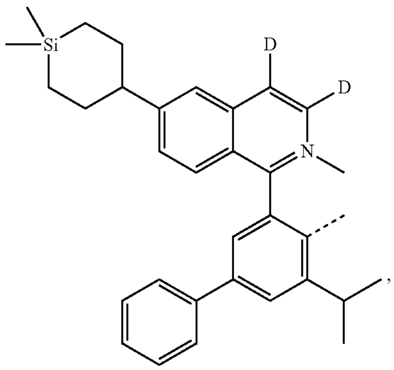
$L_{a554}$
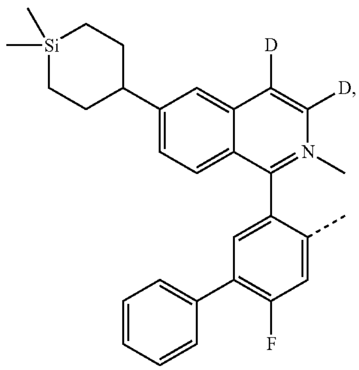
$L_{a555}$
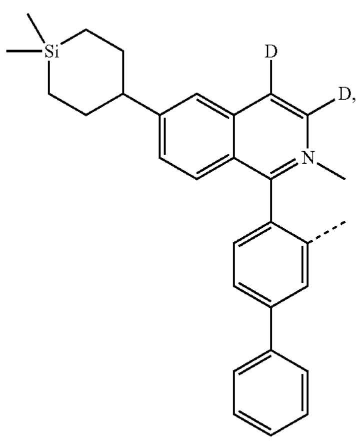
$L_{a556}$
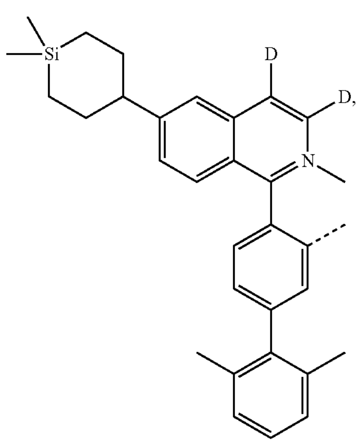
-continued
$L_{a557}$
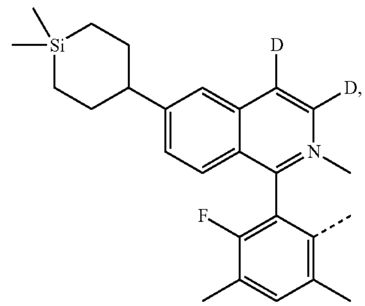
$L_{a558}$
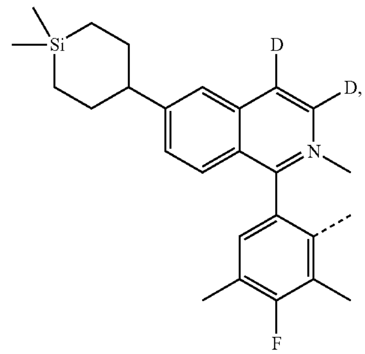
$L_{a559}$
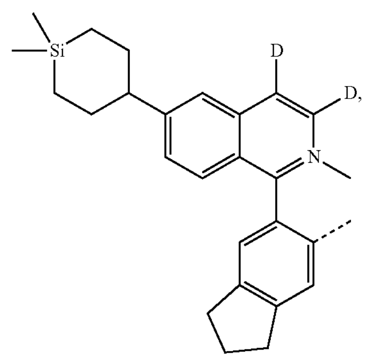
$L_{a560}$
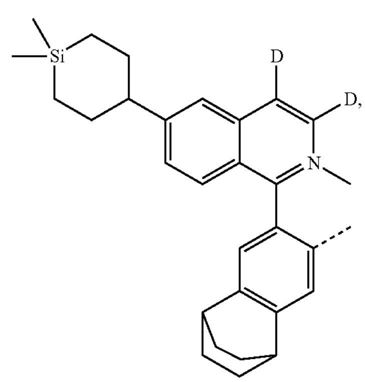

-continued
$L_{a561}$
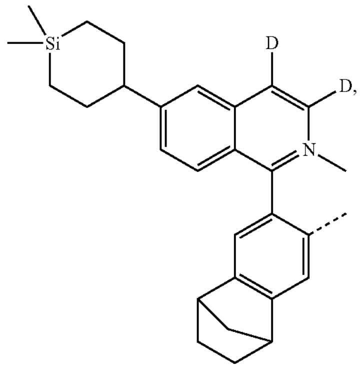
$L_{a562}$
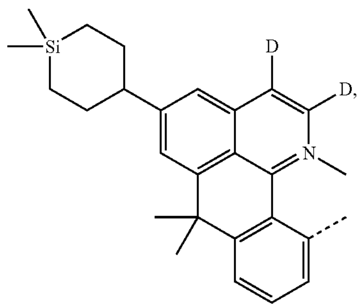
$L_{a563}$
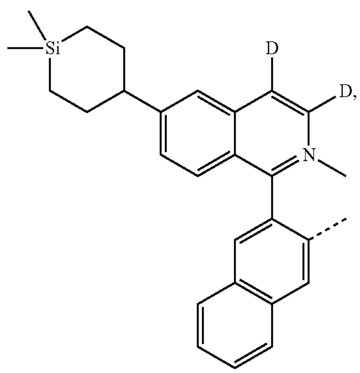
$L_{a564}$
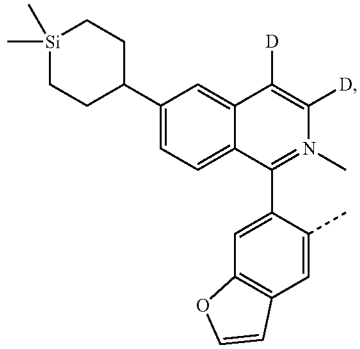
-continued
$L_{a565}$
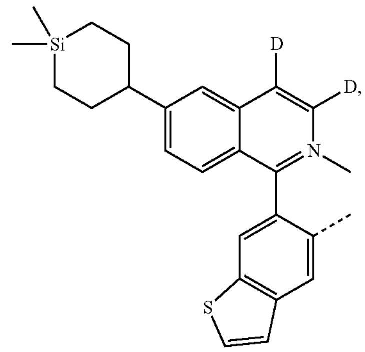
$L_{a566}$
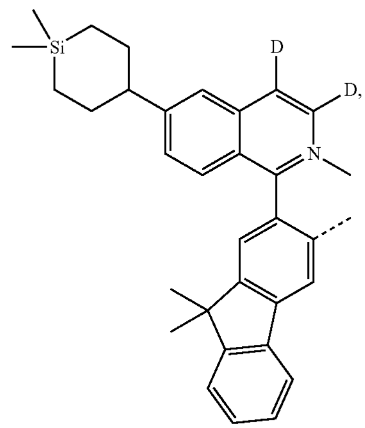
$L_{a567}$
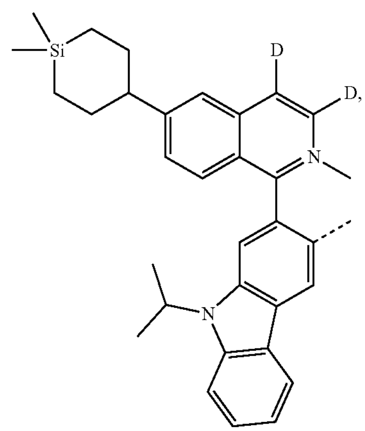
$L_{a568}$
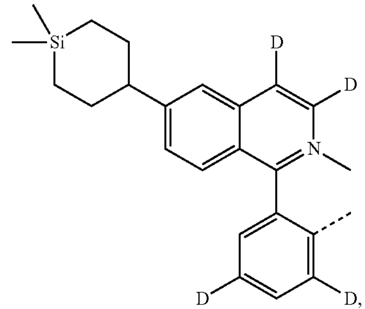

-continued
$L_{a569}$
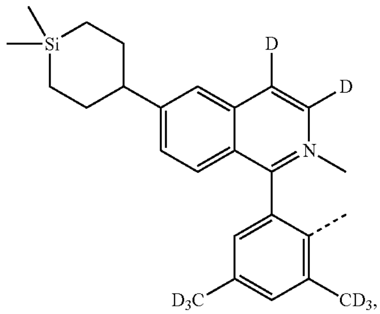
$L_{a570}$
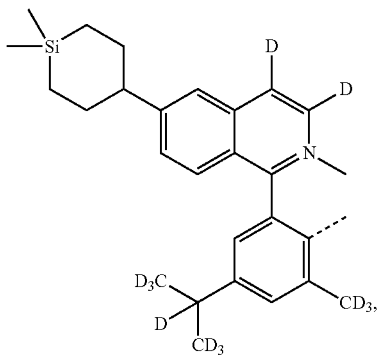
$L_{a571}$
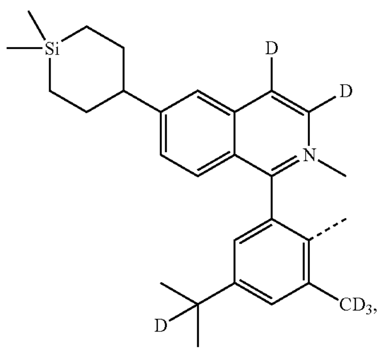
$L_{a572}$
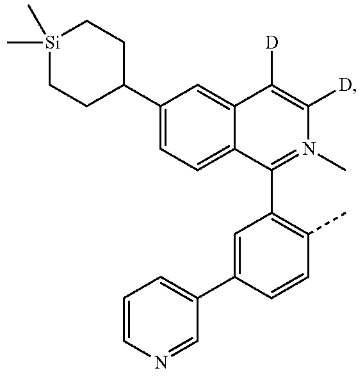
-continued
$L_{a573}$
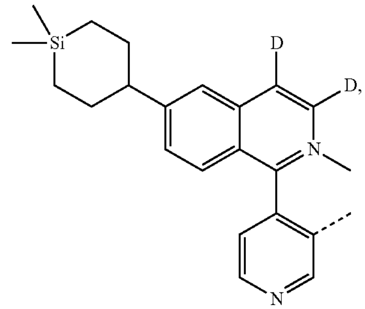
$L_{a574}$
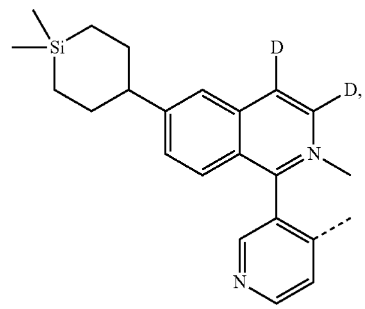
$L_{a575}$
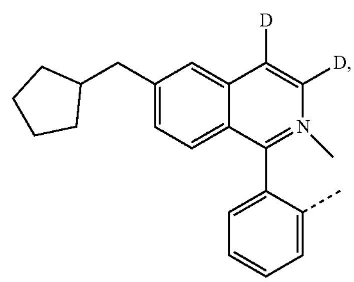
$L_{a576}$
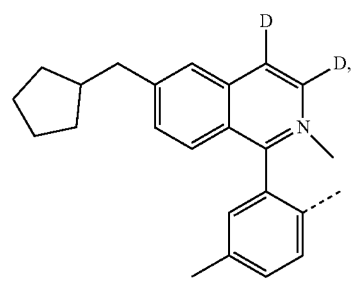
$L_{a577}$
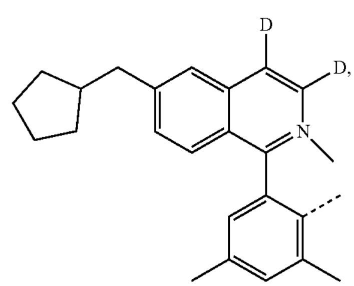

-continued
$L_{a578}$
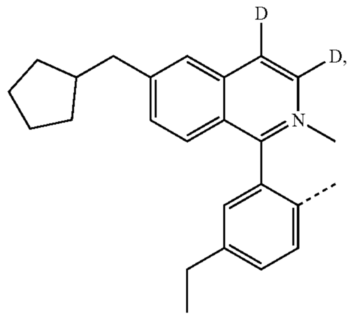
$L_{a579}$
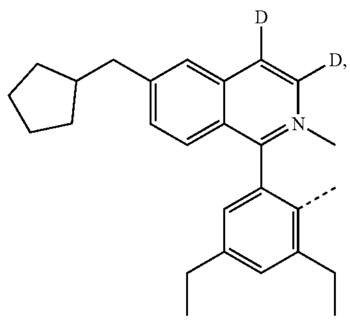
$L_{a580}$
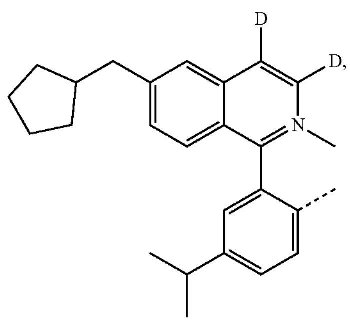
$L_{a581}$
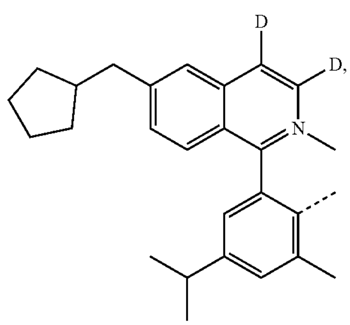
$L_{a582}$
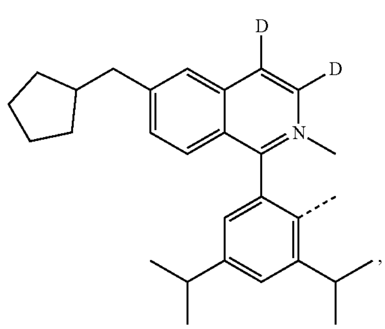
-continued
$L_{a583}$
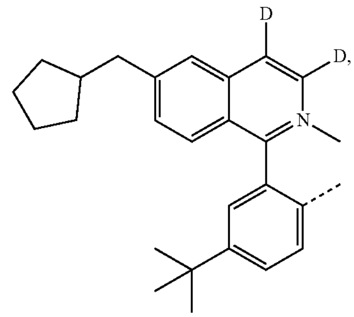
$L_{a584}$
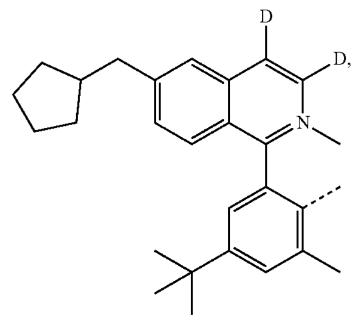
$L_{a585}$
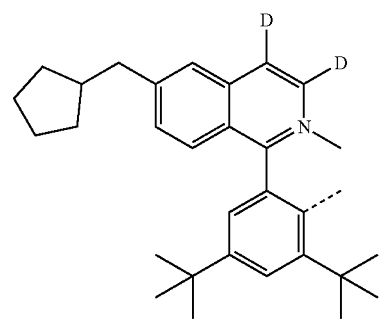
$L_{a586}$
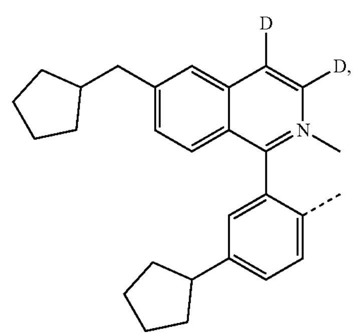
$L_{a587}$
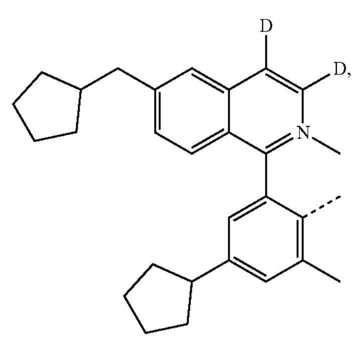

$L_{a588}$
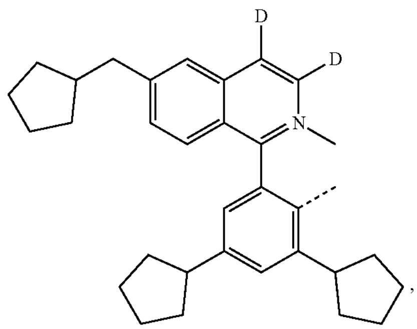
$L_{a589}$
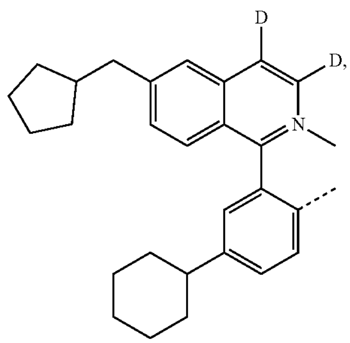
$L_{a590}$
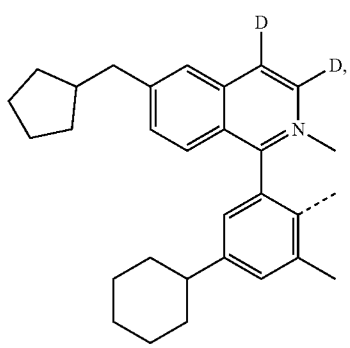
$L_{a591}$
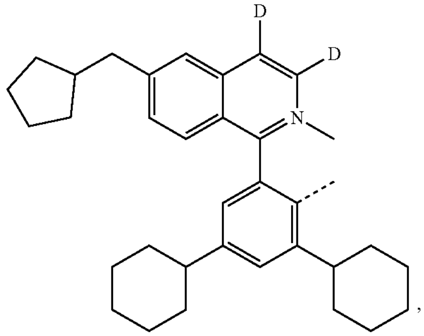
$L_{a592}$
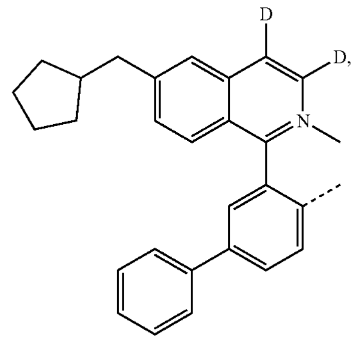
$L_{a593}$
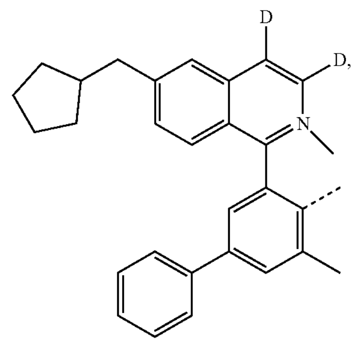
$L_{a594}$
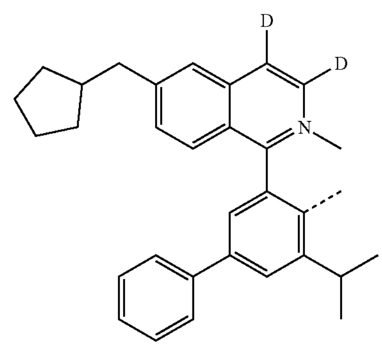
$L_{a595}$
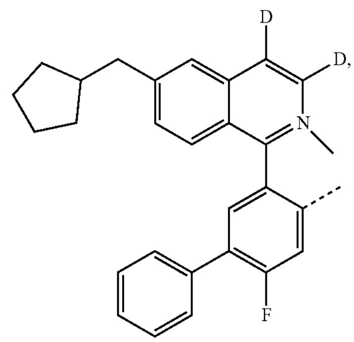

$L_{a596}$
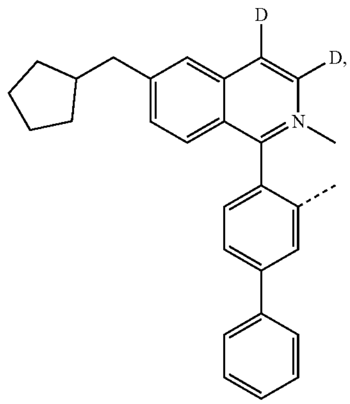
$L_{a597}$
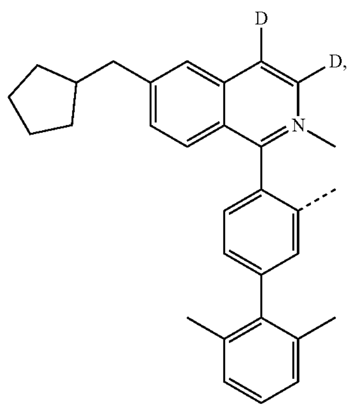
$L_{a598}$
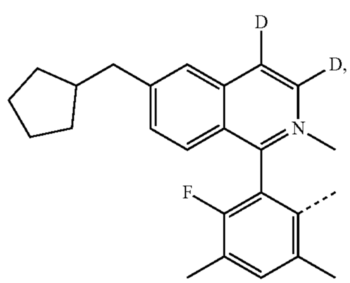
$L_{a599}$
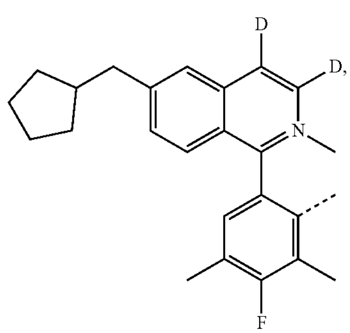
$L_{a600}$
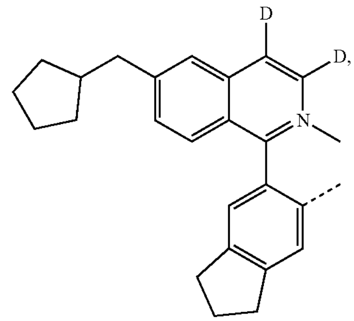
$L_{a601}$
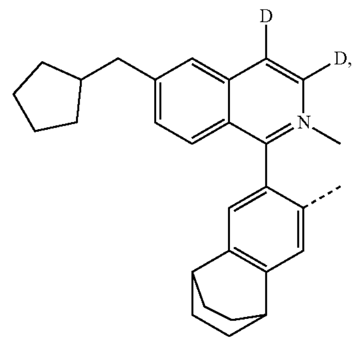
$L_{a602}$
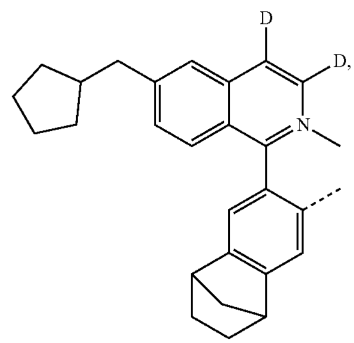
$L_{a603}$
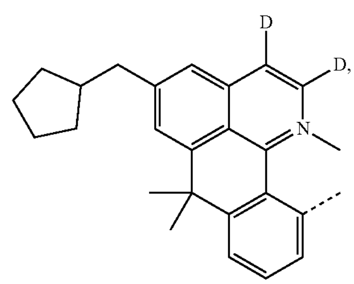
$L_{a604}$
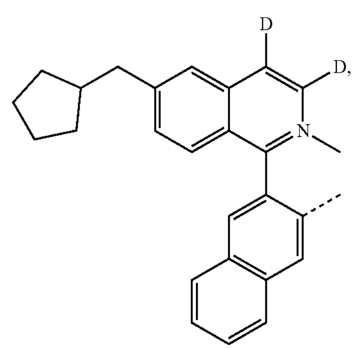

-continued
$L_{a605}$
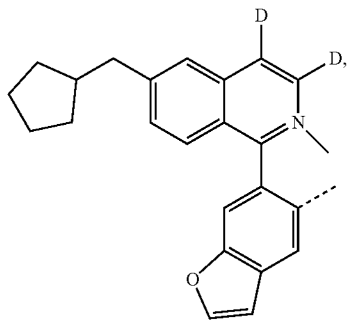
$L_{a606}$
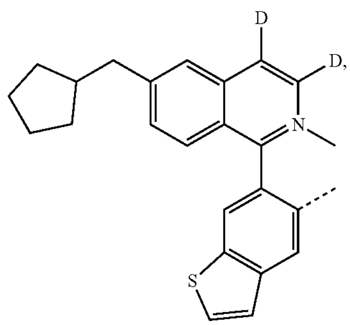
$L_{a607}$
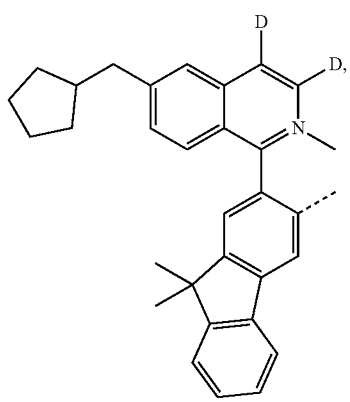
$L_{a608}$
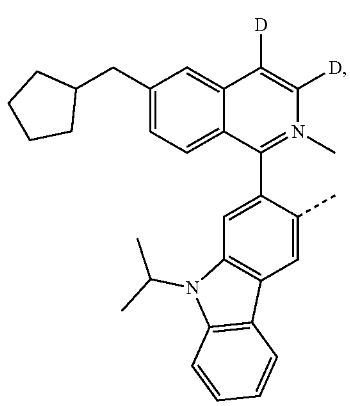
-continued
$L_{a609}$
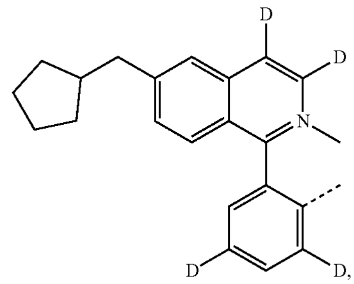
$L_{a610}$
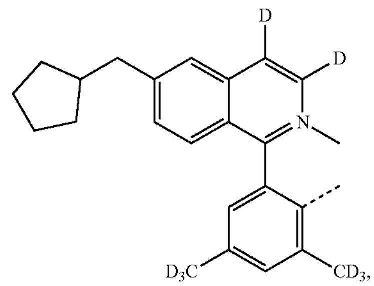
$L_{a611}$
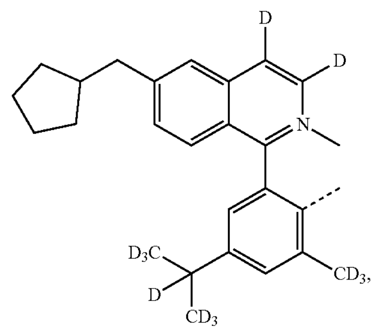
$L_{a612}$
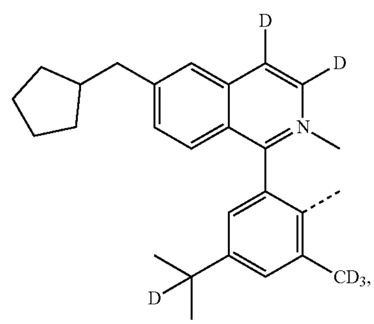
$L_{a613}$
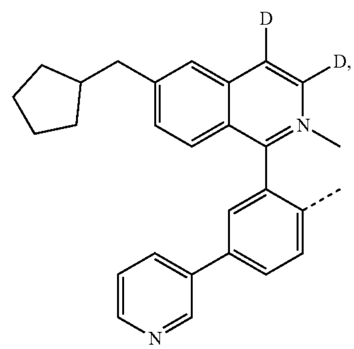

$L_{a614}$
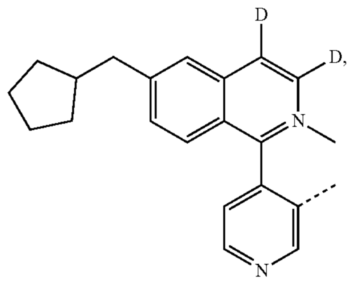
$L_{a615}$
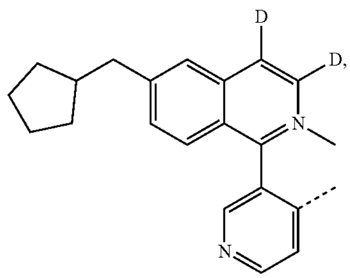
$L_{a616}$
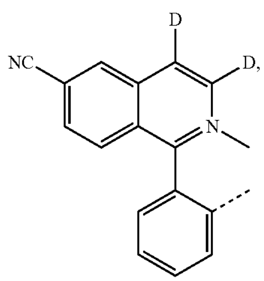
$L_{a617}$
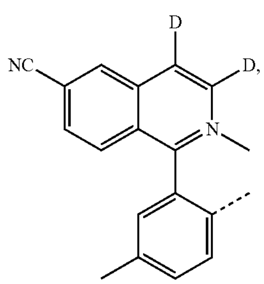
$L_{a618}$
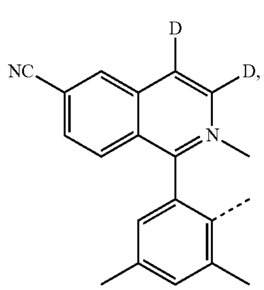
$L_{a619}$
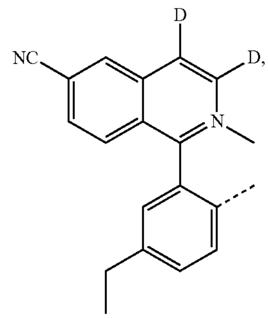
$L_{a620}$
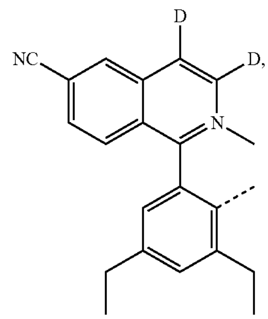
$L_{a621}$
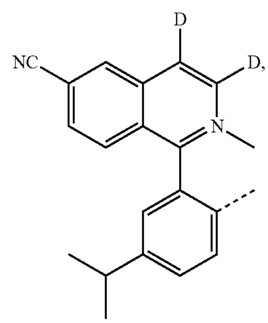
$L_{a622}$
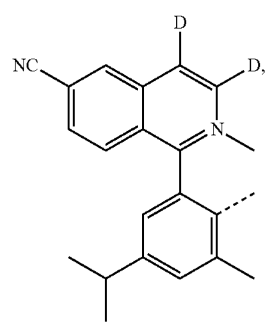
$L_{a623}$
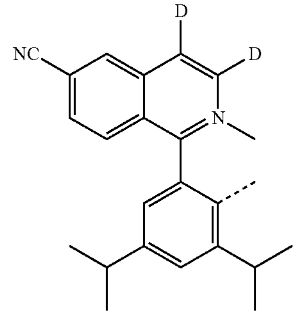

-continued
$L_{a624}$
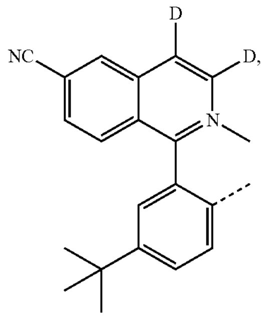
$L_{a625}$
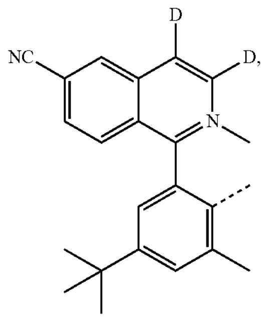
$L_{a626}$
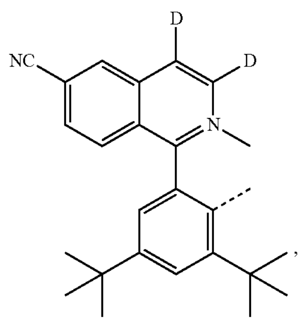
$L_{a627}$
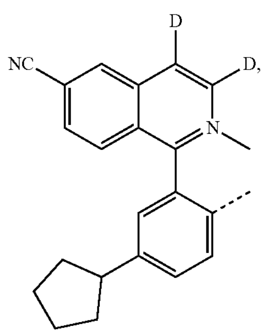
$L_{a628}$
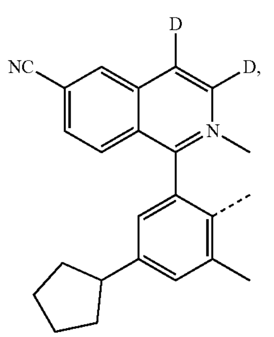
-continued
$L_{a629}$
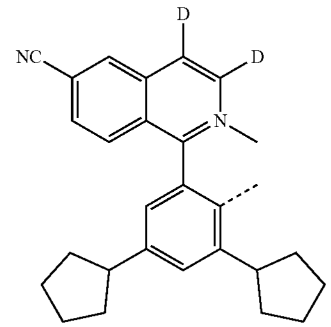
$L_{a630}$
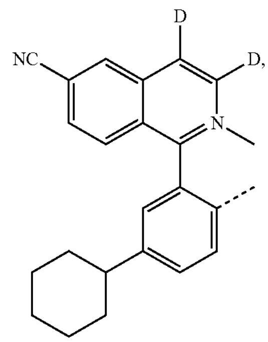
$L_{a631}$
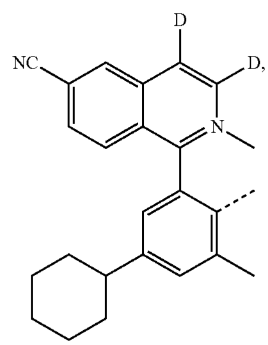
$L_{a632}$
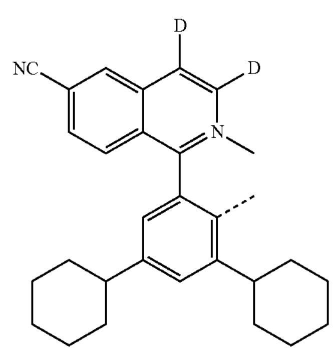

-continued
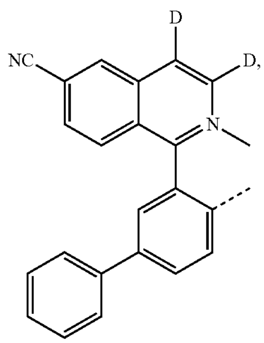
$L_{a633}$
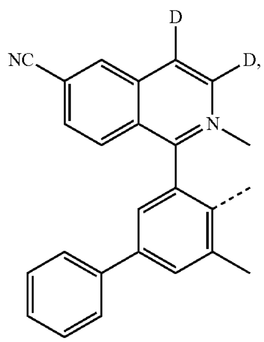
$L_{a634}$
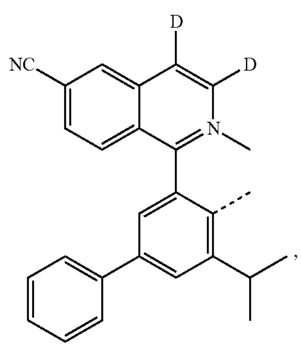
$L_{a635}$
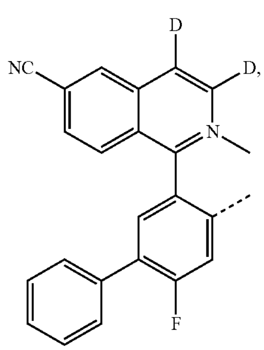
$L_{a636}$
-continued
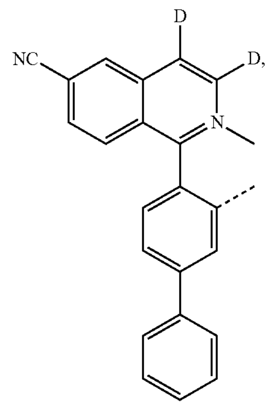
$L_{a637}$
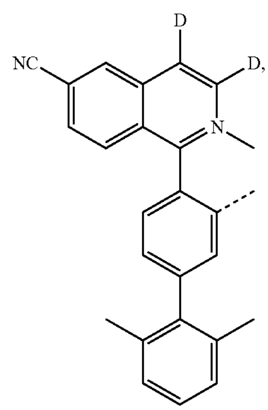
$L_{a638}$
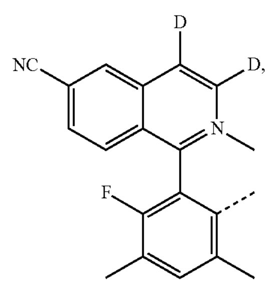
$L_{a639}$
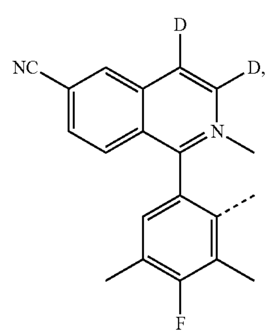
$L_{a640}$ -continued
$L_{a641}$
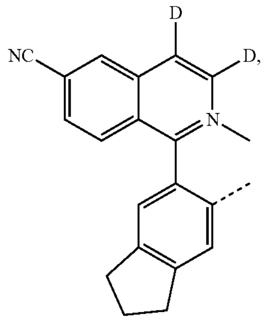
$L_{a642}$
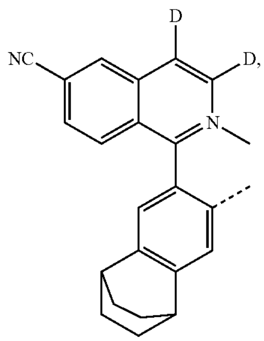
$L_{a643}$
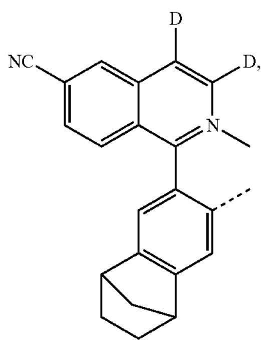
$L_{a644}$
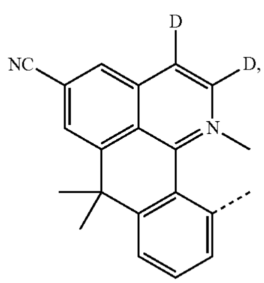
$L_{a645}$
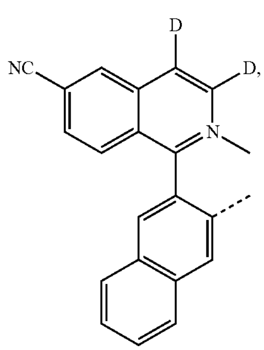
-continued
$L_{a646}$
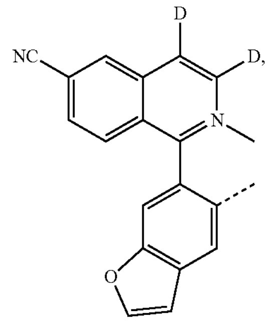
$L_{a647}$
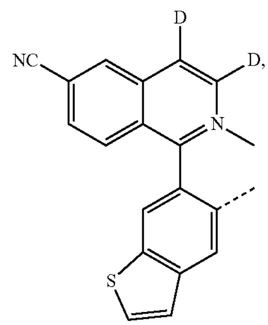
$L_{a648}$
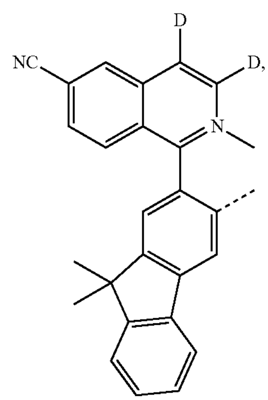
$L_{a649}$
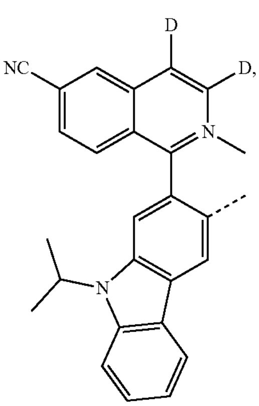

$L_{a650}$
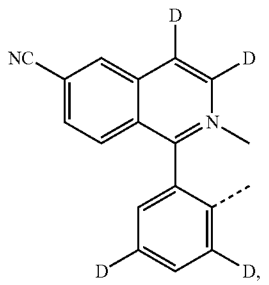
$L_{a651}$
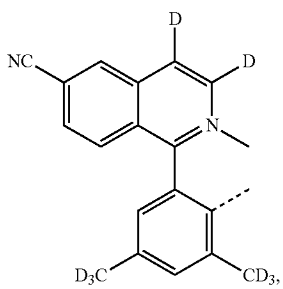
$L_{a652}$
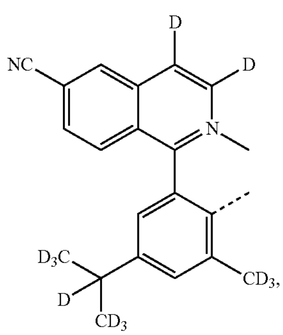
$L_{a653}$
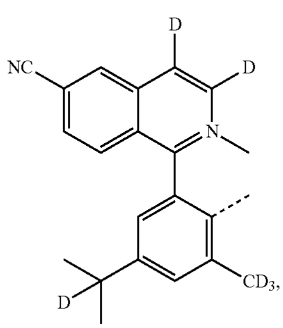
$L_{a654}$
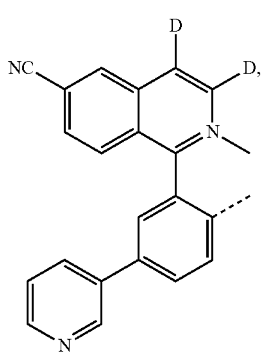
$L_{a655}$
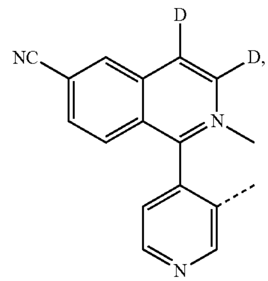
$L_{a656}$
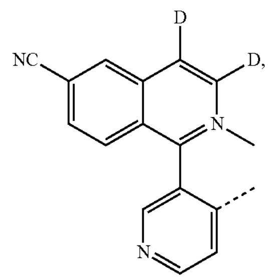
$L_{a657}$
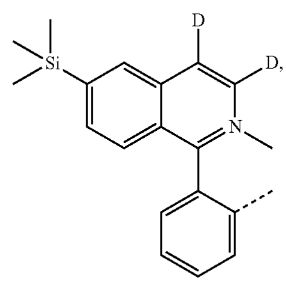
$L_{a658}$
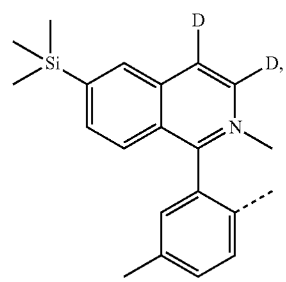
$L_{a659}$
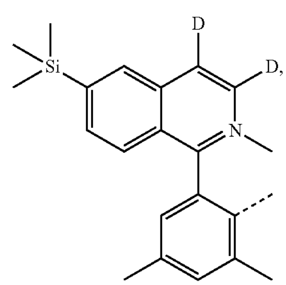

-continued
$L_{a660}$
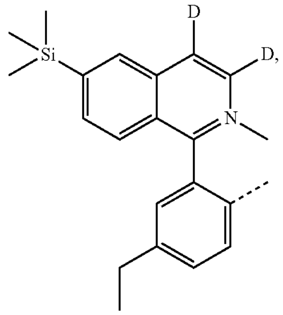
$L_{a661}$
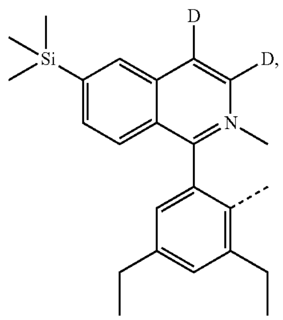
$L_{a662}$
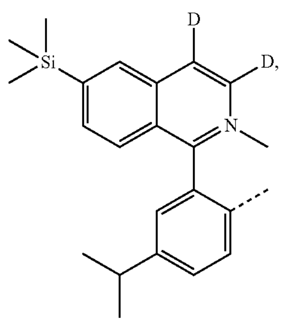
$L_{a663}$
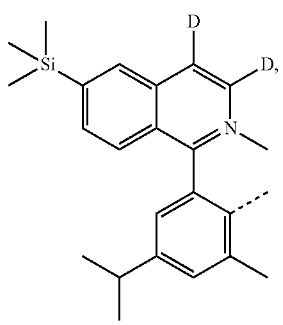
$L_{a664}$
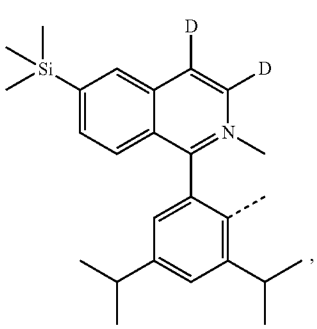
-continued
$L_{a665}$
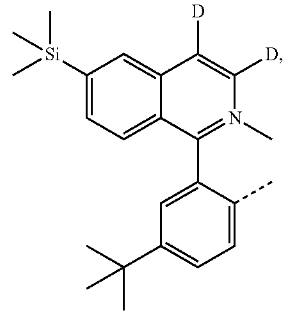
$L_{a666}$
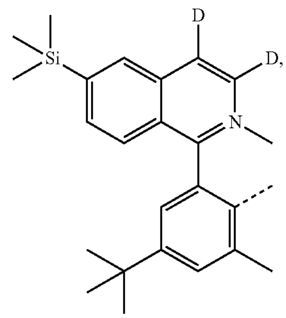
$L_{a667}$
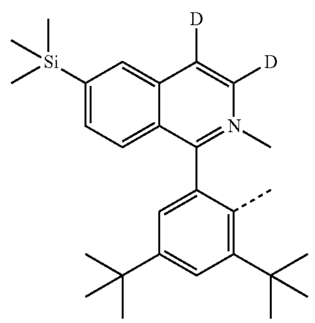
$L_{a668}$
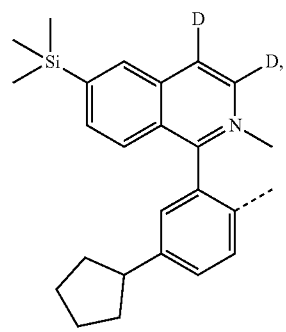
$L_{a669}$
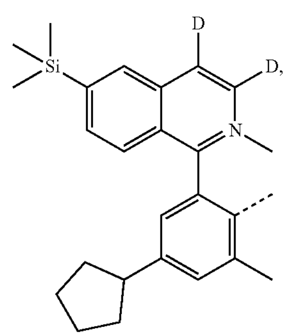

L$_{a670}$
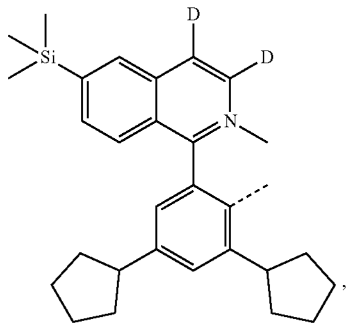
L$_{a671}$
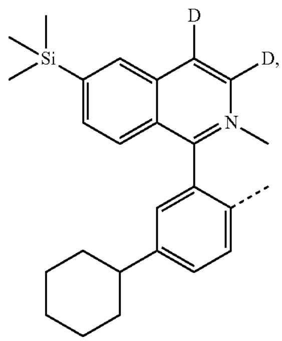
L$_{a672}$
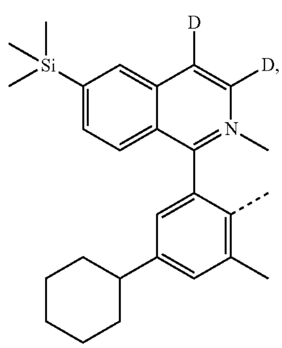
L$_{a673}$
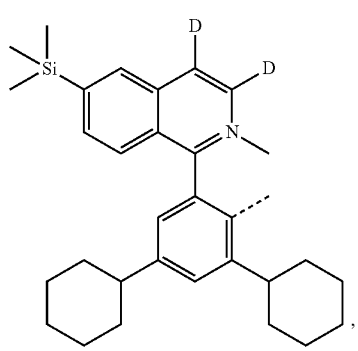
L$_{a674}$
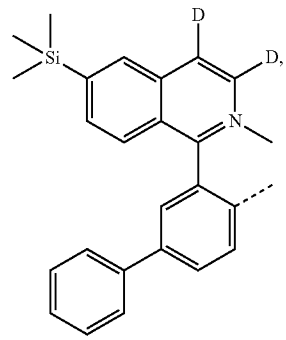
L$_{a675}$
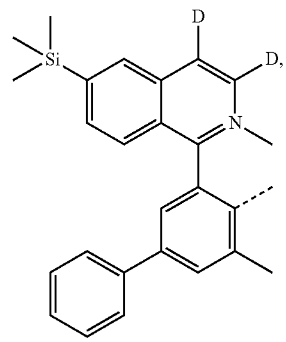
L$_{a676}$
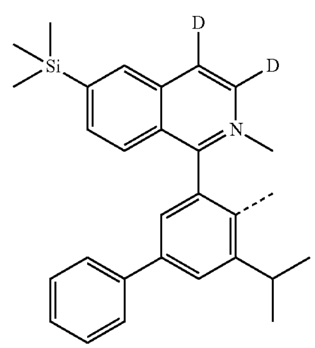
L$_{a677}$
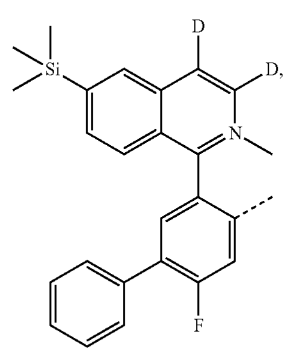

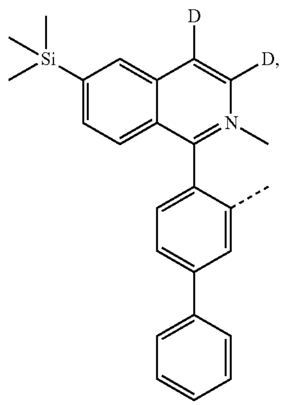
$L_{a678}$
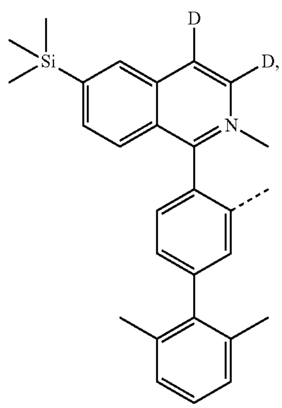
$L_{a679}$
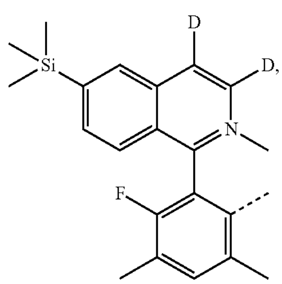
$L_{a680}$
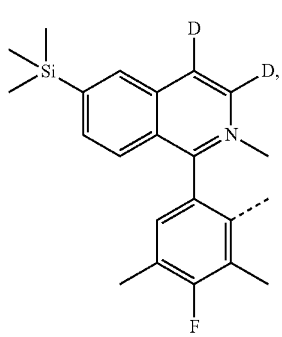
$L_{a681}$
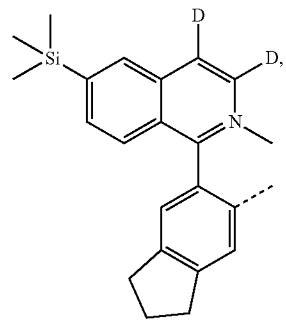
$L_{a682}$
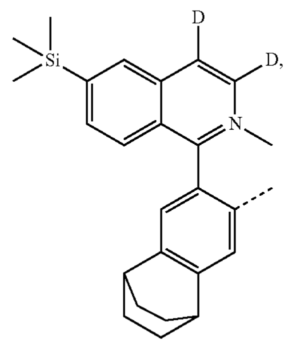
$L_{a683}$
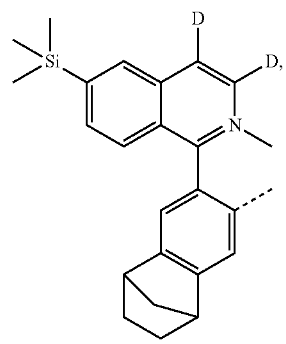
$L_{a684}$
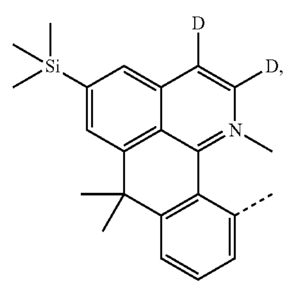
$L_{a685}$
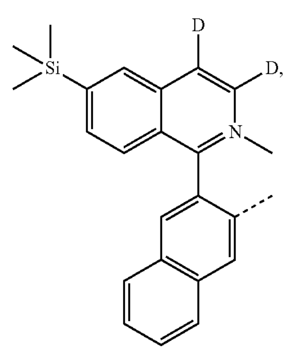
$L_{a686}$ $L_{a687}$
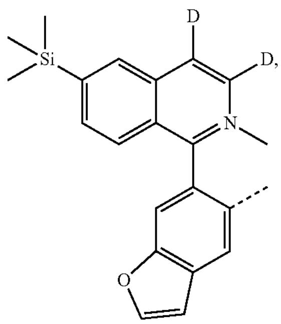
$L_{a688}$
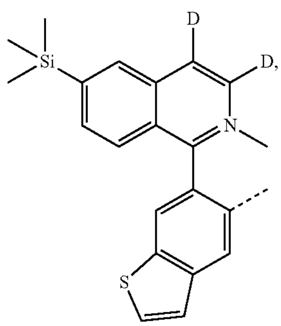
$L_{a689}$
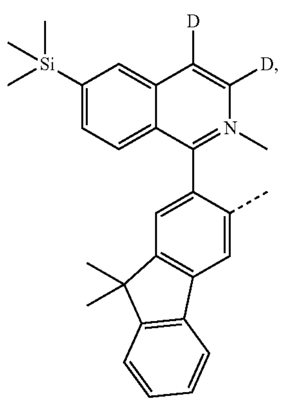
$L_{a690}$
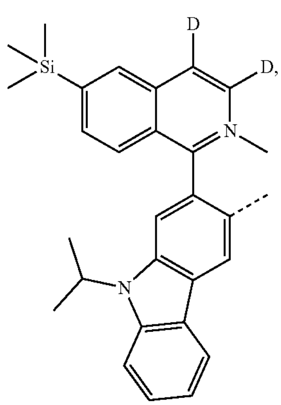
$L_{a691}$
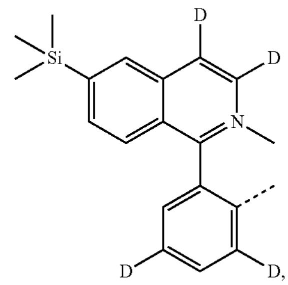
$L_{a692}$
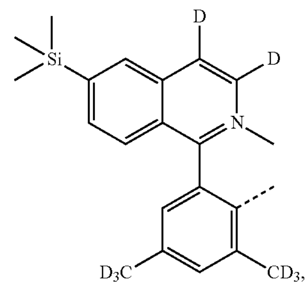
$L_{a693}$
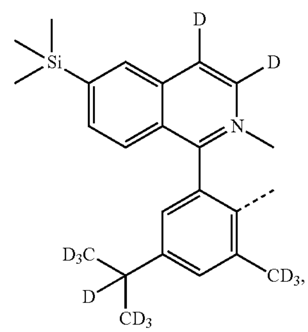
$L_{a694}$
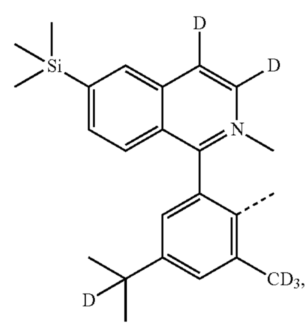
$L_{a695}$
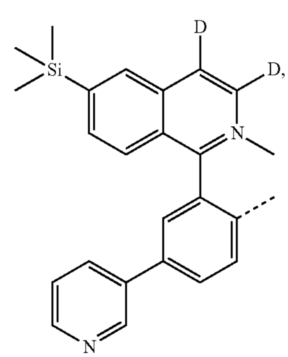

$L_{a696}$
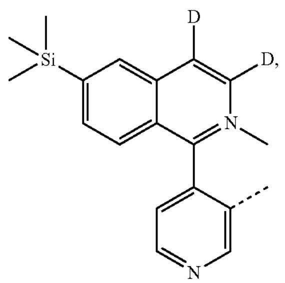
$L_{a697}$
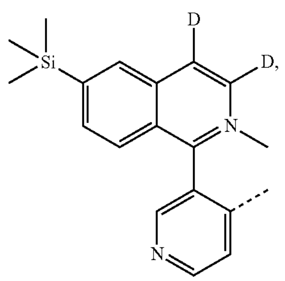
$L_{a698}$
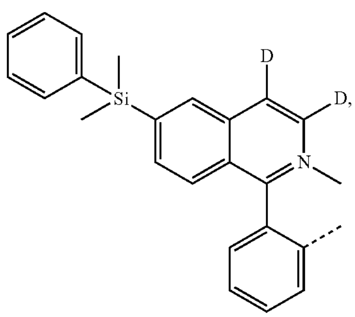
$L_{a699}$
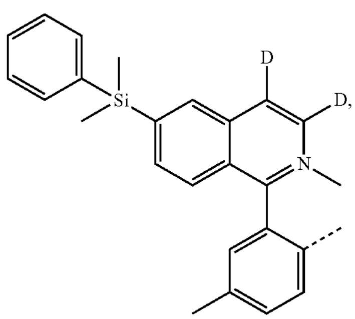
$L_{a700}$
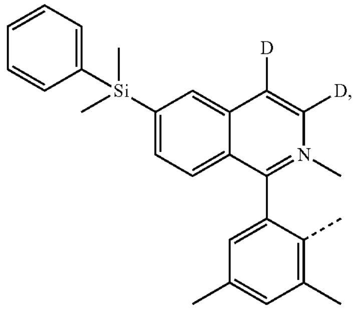
$L_{a701}$
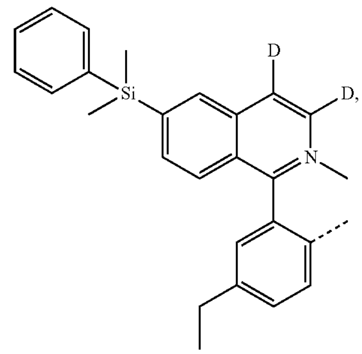
$L_{a702}$
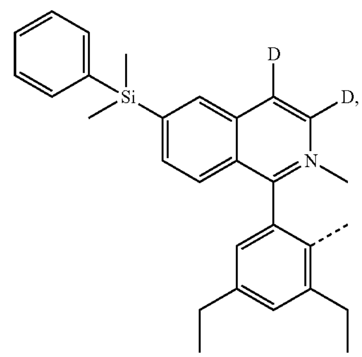
$L_{a703}$
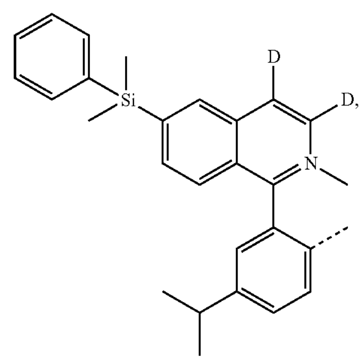
$L_{a704}$
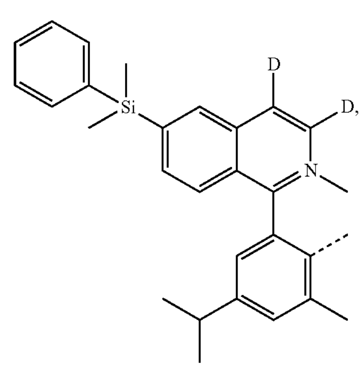

-continued
$L_{a705}$
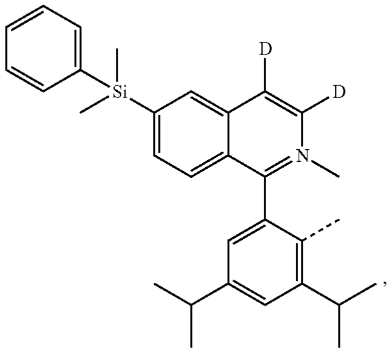
$L_{a706}$
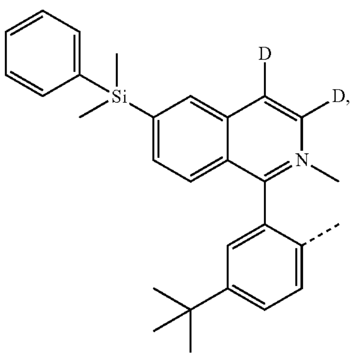
$L_{a707}$
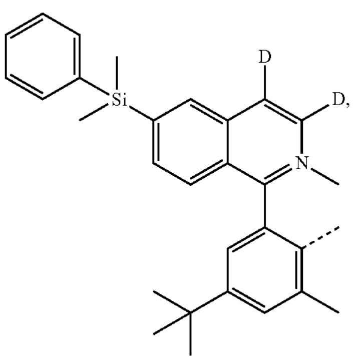
$L_{a708}$
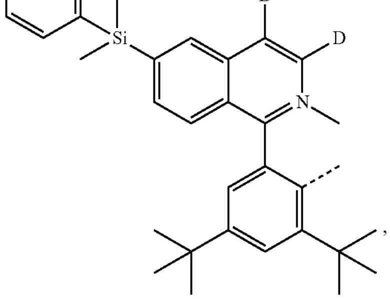
-continued
$L_{a709}$
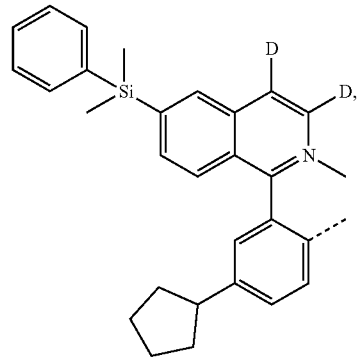
$L_{a710}$
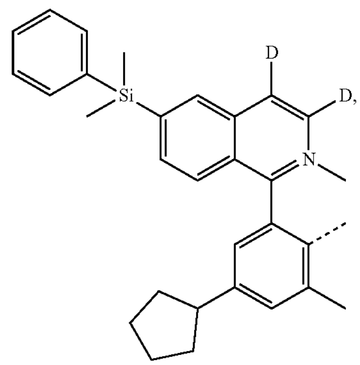
$L_{a711}$
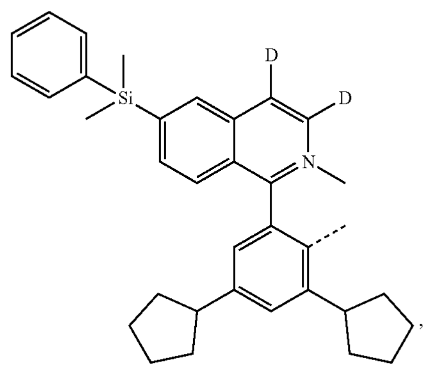
$L_{a712}$
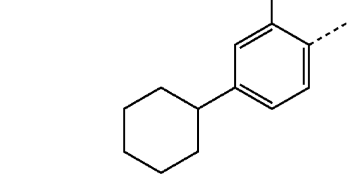

$L_{a713}$
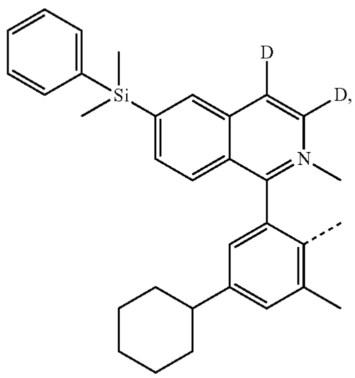
$L_{a714}$
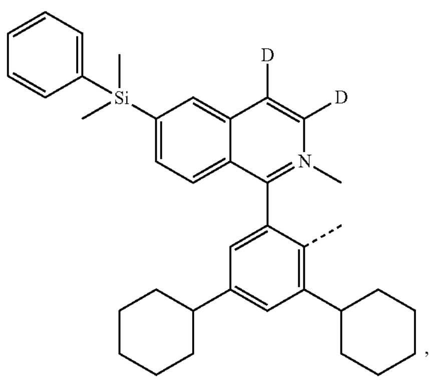
$L_{a715}$
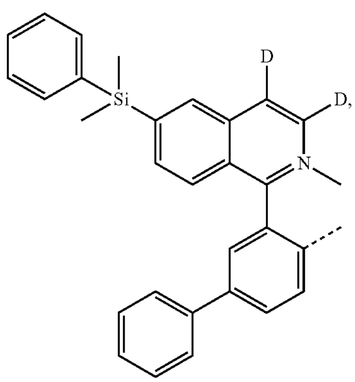
$L_{a716}$
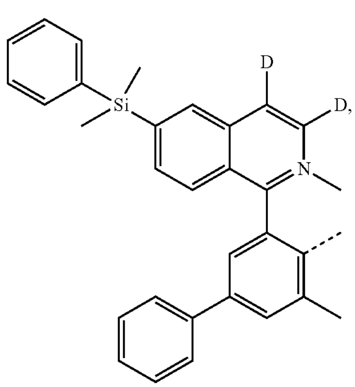
$L_{a717}$
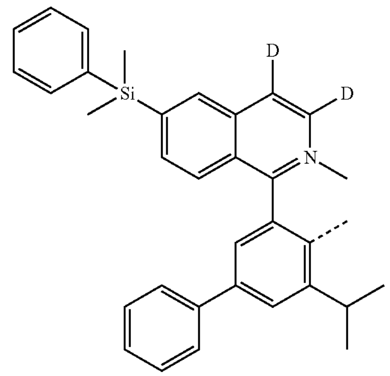
$L_{a718}$
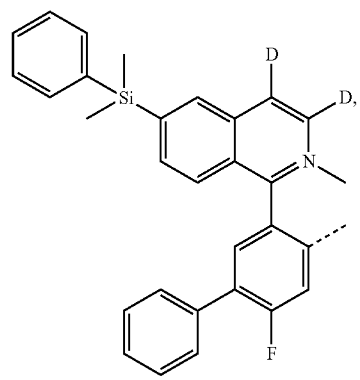
$L_{a719}$
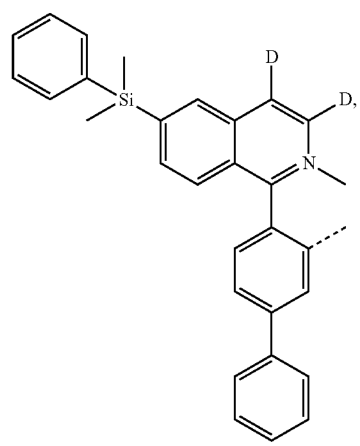
$L_{a720}$
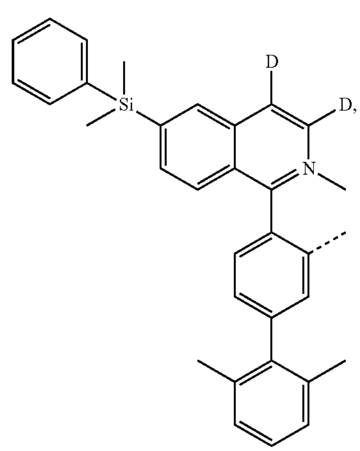

-continued
$L_{a721}$
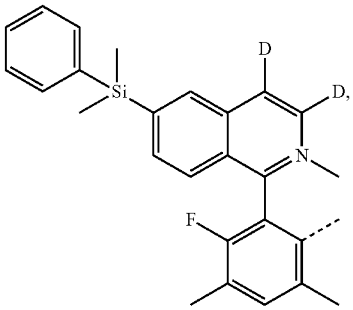
$L_{a722}$
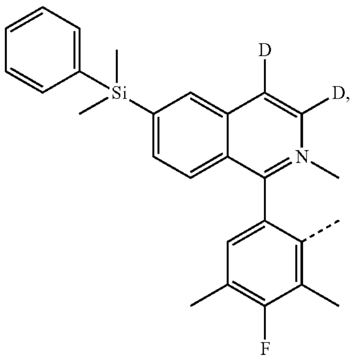
$L_{a723}$
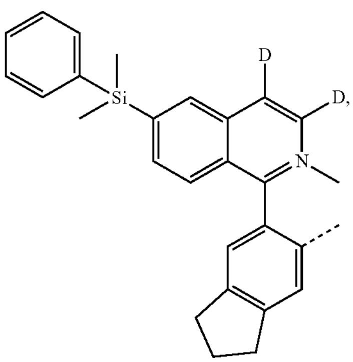
$L_{a724}$
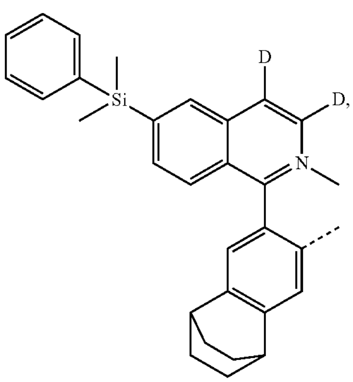
-continued
$L_{a725}$
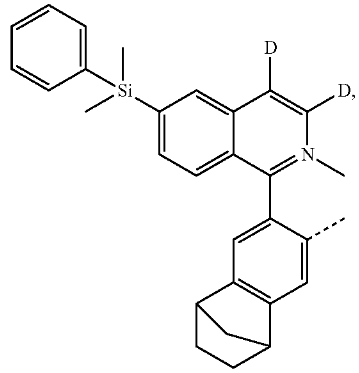
$L_{a726}$
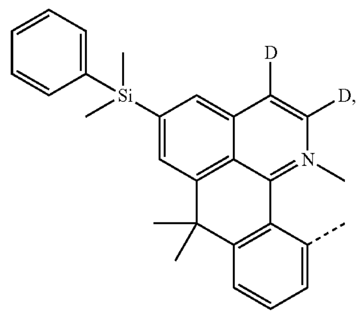
$L_{a727}$
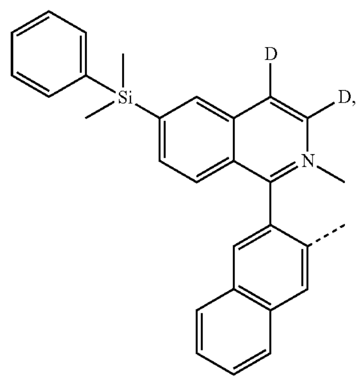
$L_{a728}$
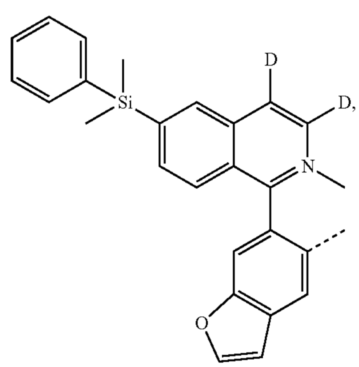

-continued
$L_{a729}$
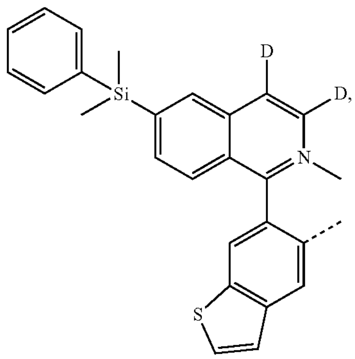
$L_{a730}$
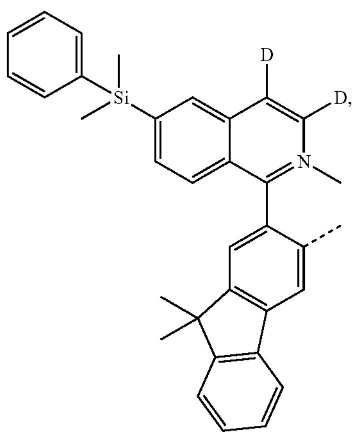
$L_{a731}$
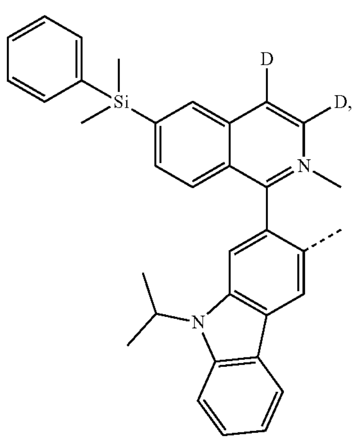
$L_{a732}$
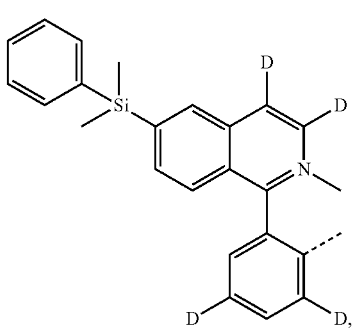
-continued
$L_{a733}$
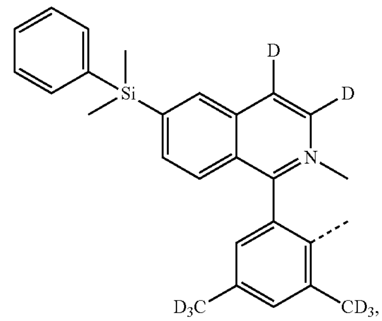
$L_{a734}$
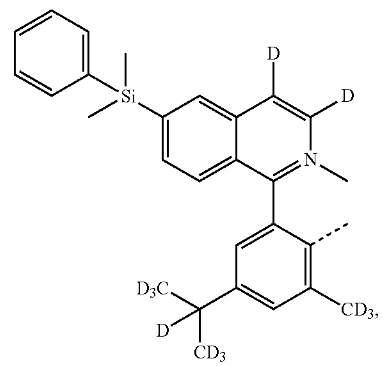
$L_{a735}$
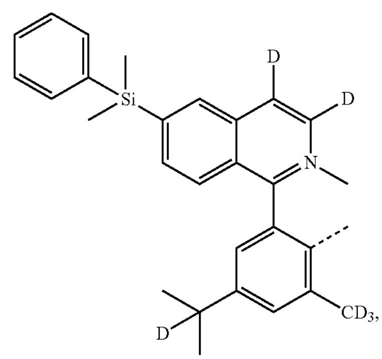
$L_{a736}$
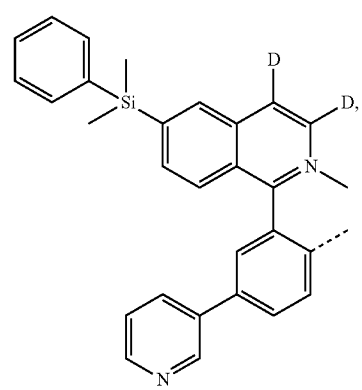

-continued
$L_{a737}$
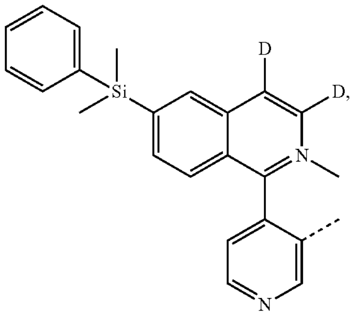
$L_{a738}$
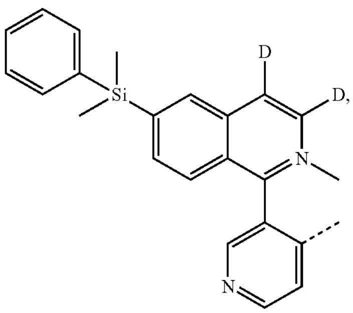
$L_{a739}$
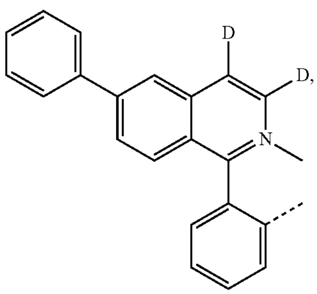
$L_{a740}$
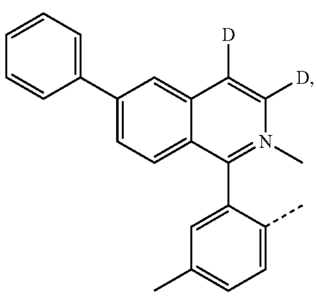
$L_{a741}$
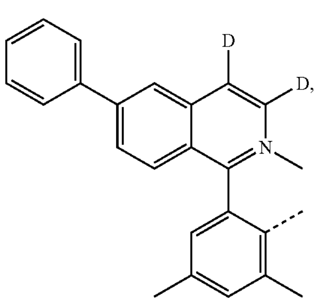
-continued
$L_{a742}$
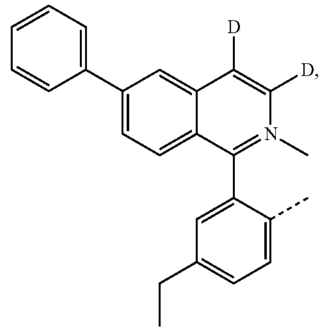
$L_{a743}$
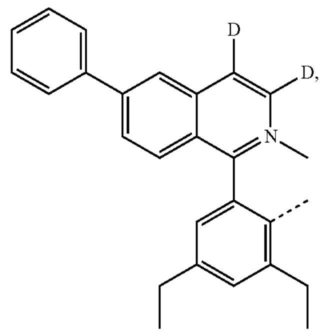
$L_{a744}$
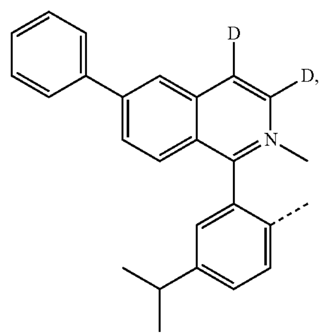
$L_{a745}$
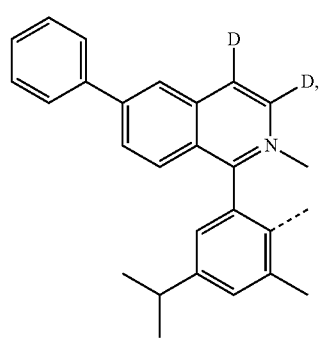

-continued
$L_{a746}$
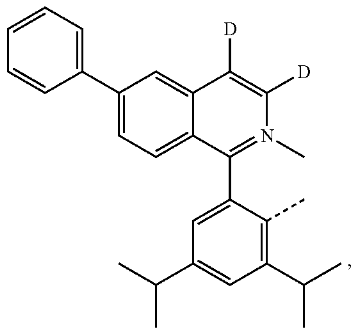
$L_{a747}$
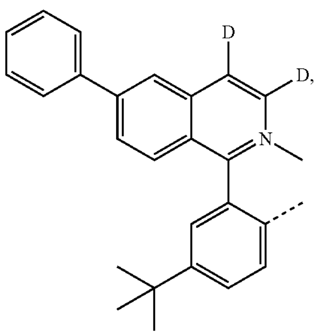
$L_{a748}$
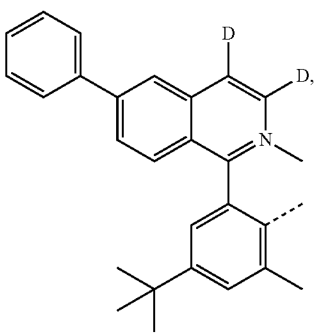
$L_{a749}$
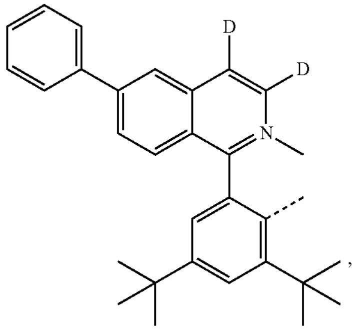
-continued
$L_{a750}$
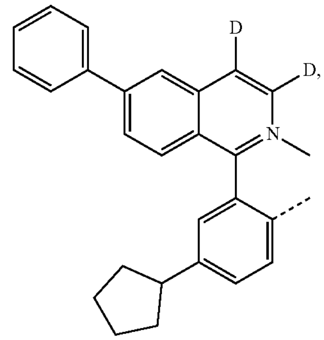
$L_{a751}$
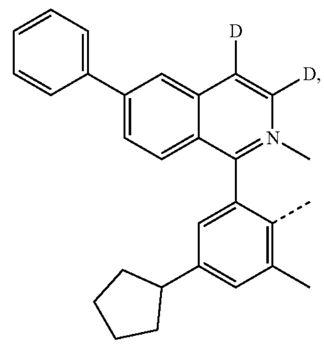
$L_{a752}$
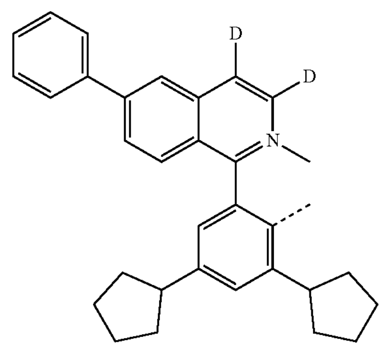
$L_{a753}$
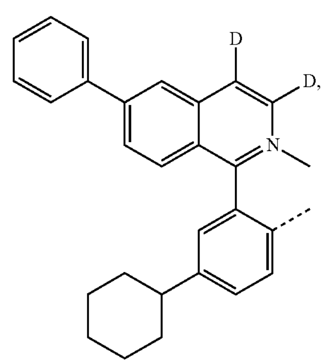

$L_{a754}$
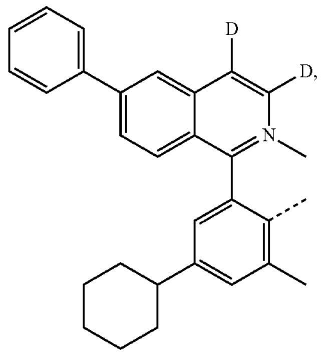
$L_{a755}$
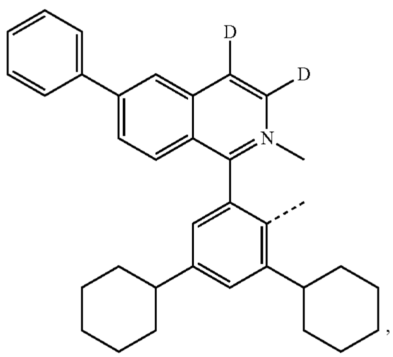
$L_{a756}$
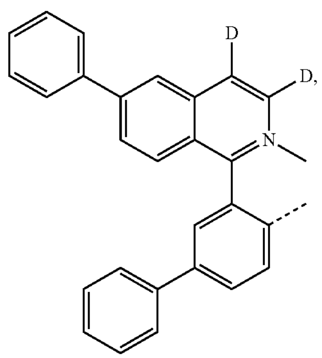
$L_{a757}$
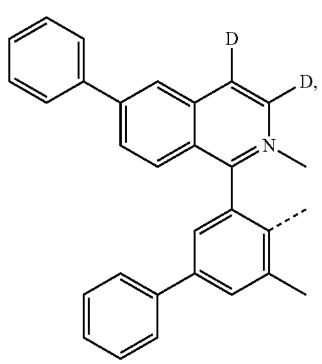
$L_{a758}$
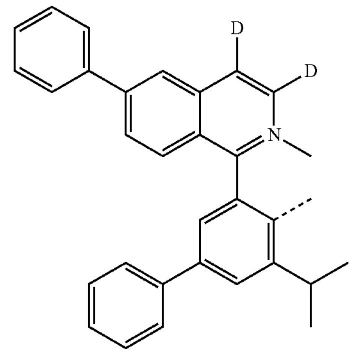
$L_{a759}$
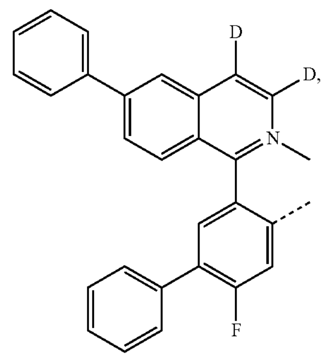
$L_{a760}$
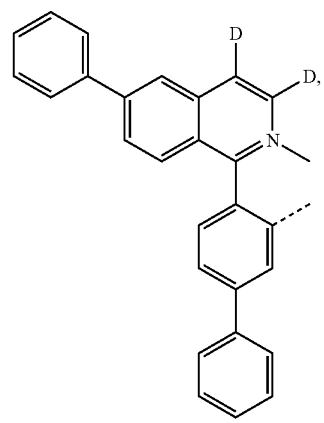
$L_{a761}$
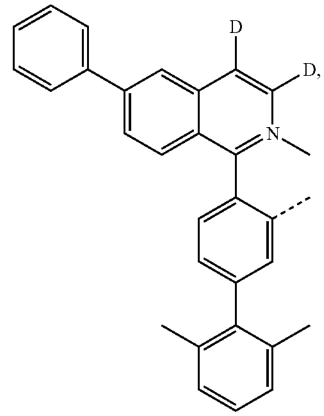

-continued
$L_{a762}$
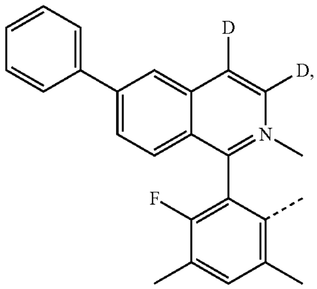
$L_{a763}$
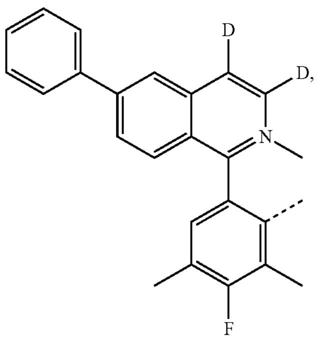
$L_{a764}$
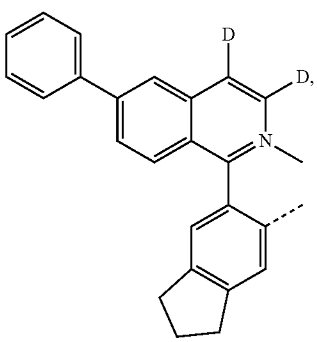
$L_{a765}$
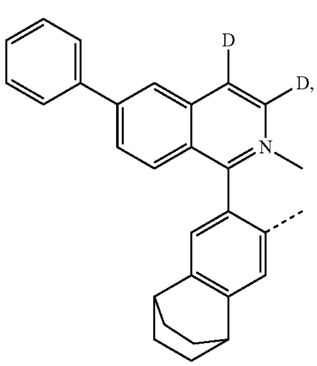
-continued
$L_{a766}$
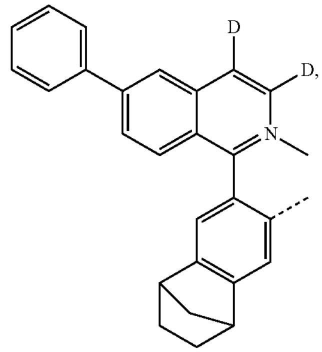
$L_{a767}$
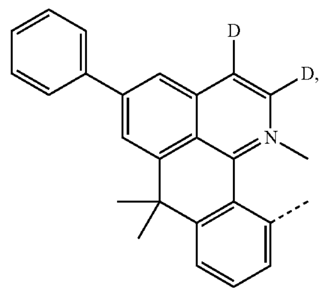
$L_{a768}$
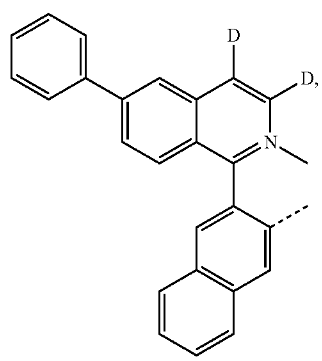
$L_{a769}$
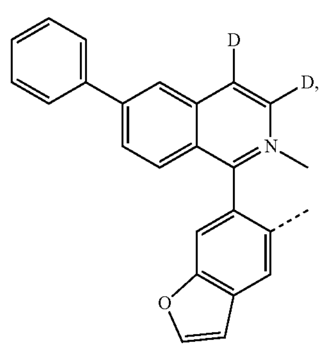

-continued
L$_{a770}$
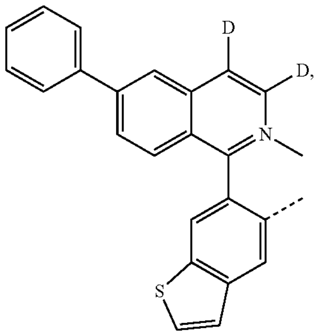
L$_{a771}$
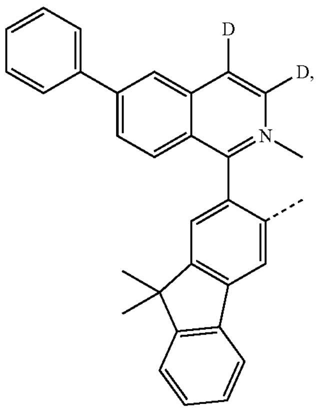
L$_{a772}$
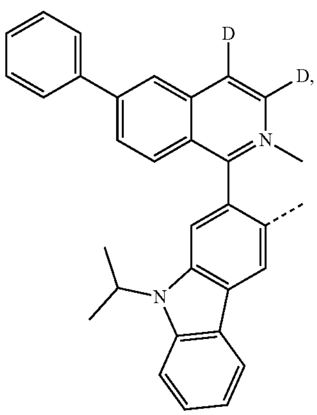
L$_{a773}$
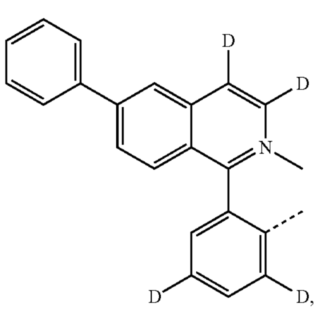
-continued
L$_{a774}$
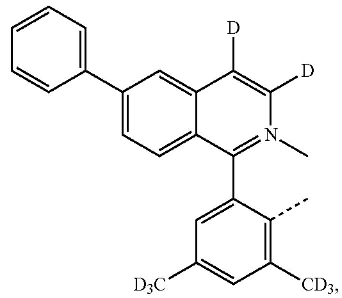
L$_{a775}$
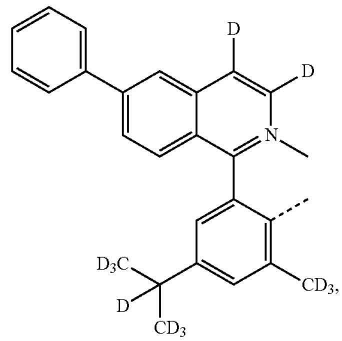
L$_{a776}$
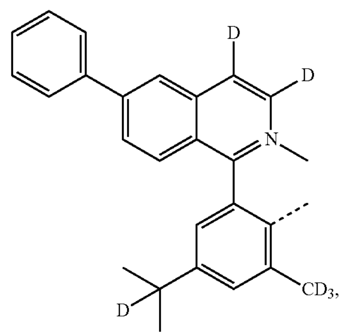
L$_{a777}$
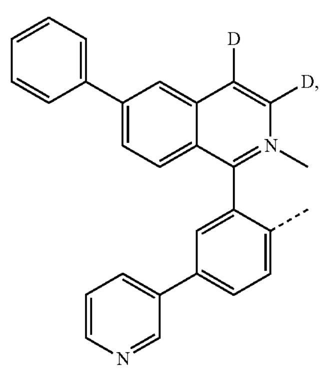

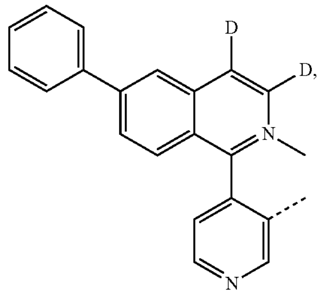
$L_{a778}$
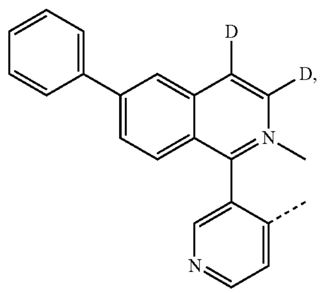
$L_{a779}$
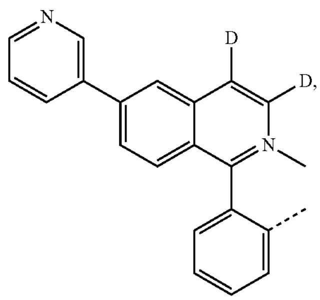
$L_{a780}$
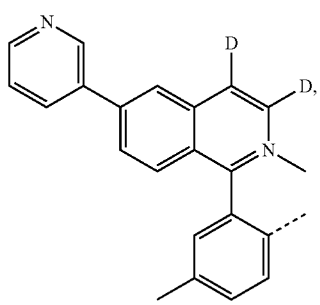
$L_{a781}$
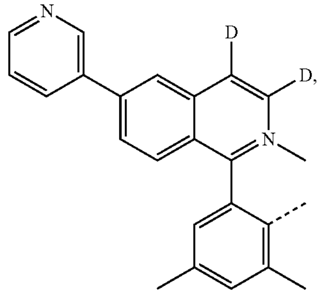
$L_{a782}$
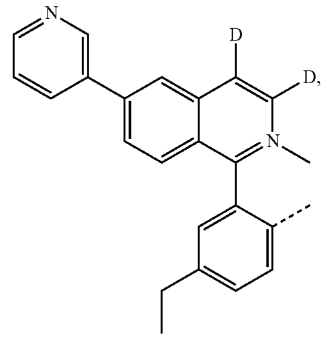
$L_{a783}$
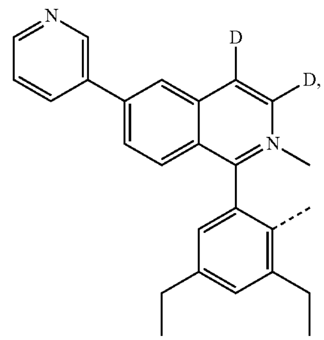
$L_{a784}$
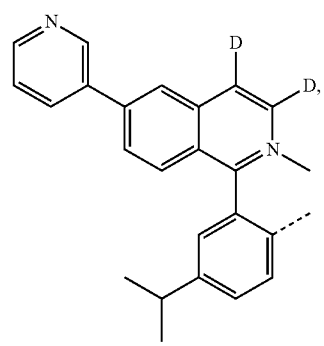
$L_{a785}$
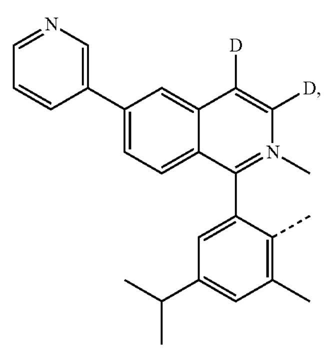
$L_{a786}$ -continued
$L_{a787}$
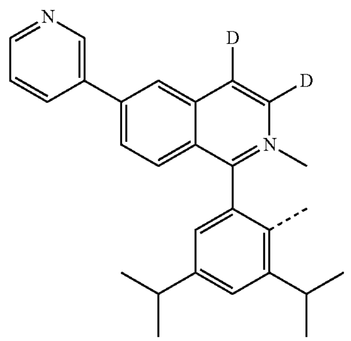
$L_{a788}$
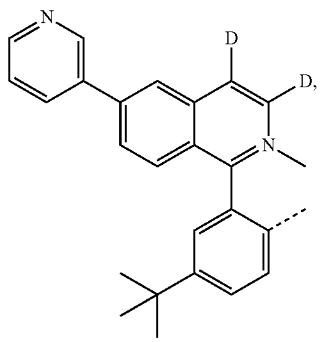
$L_{a789}$
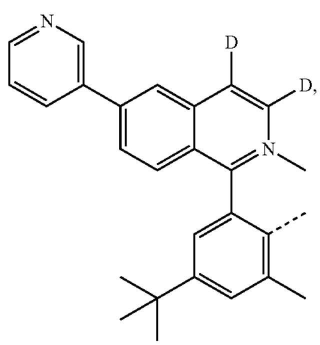
$L_{a790}$
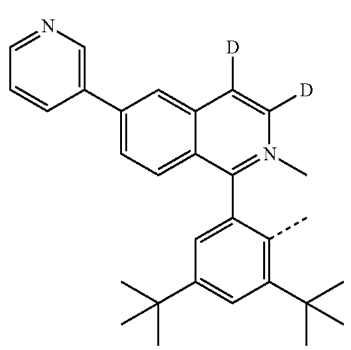
-continued
$L_{a791}$
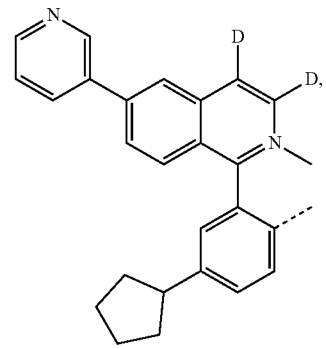
$L_{a792}$
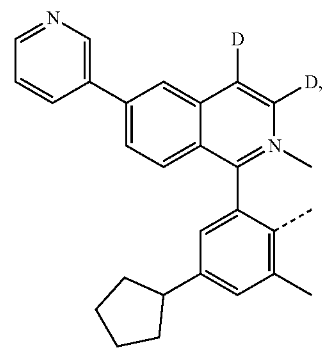
$L_{a793}$
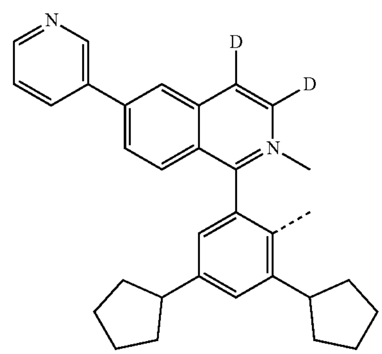
$L_{a794}$
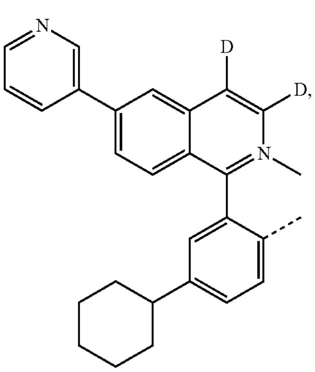

-continued
$L_{a795}$
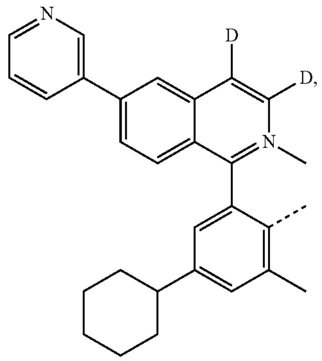
$L_{a796}$
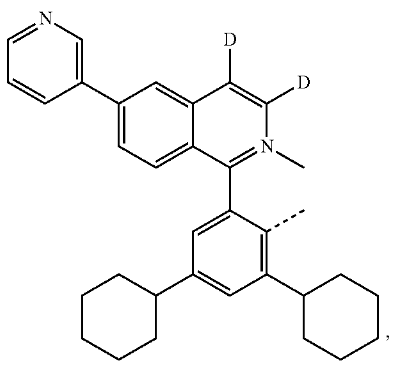
$L_{a797}$
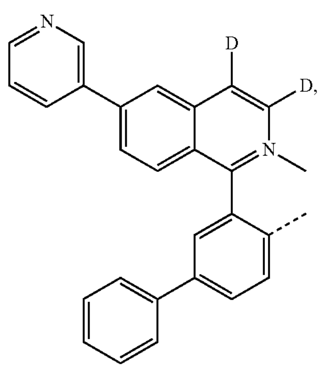
$L_{a798}$
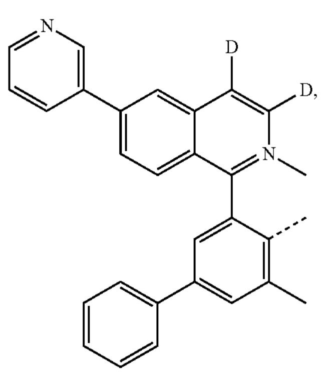
-continued
$L_{a799}$
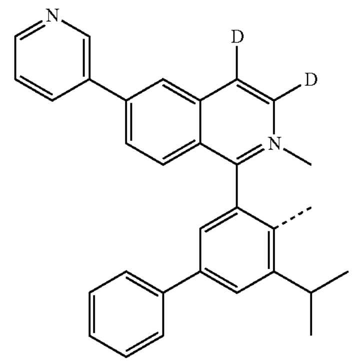
$L_{a800}$
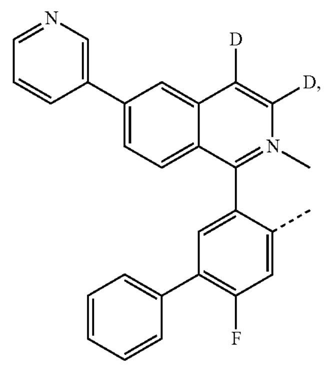
$L_{a801}$
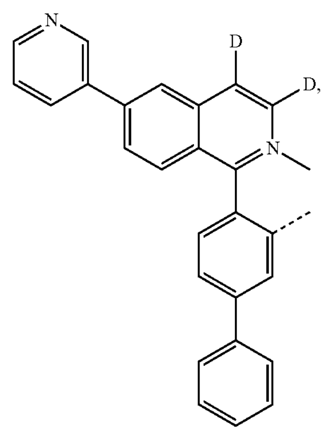
$L_{a802}$
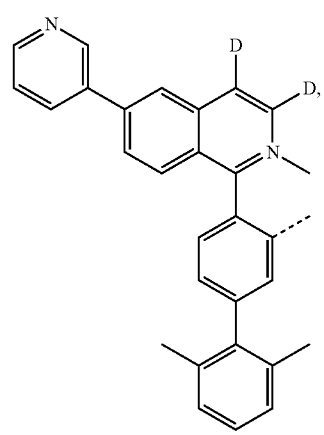

-continued
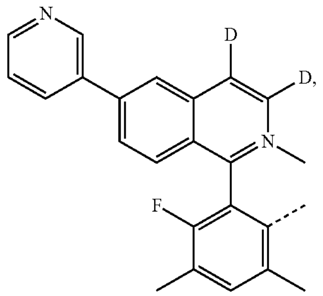
$L_{a803}$
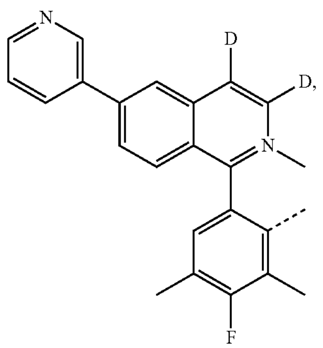
$L_{a804}$
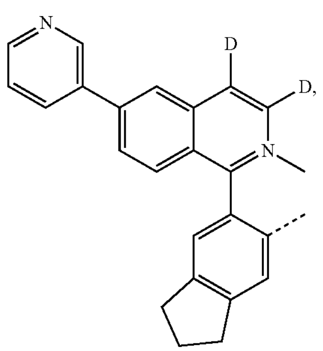
$L_{a805}$
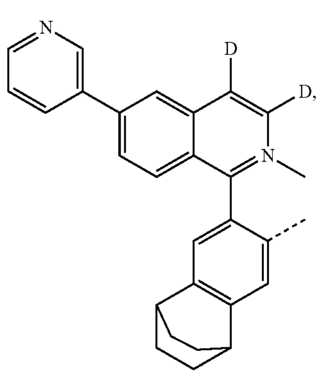
$L_{a806}$
-continued
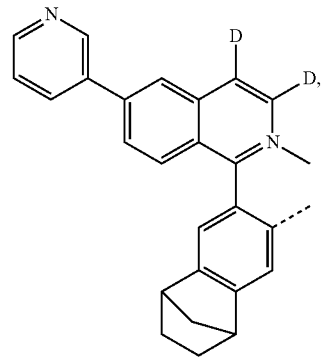
$L_{a807}$
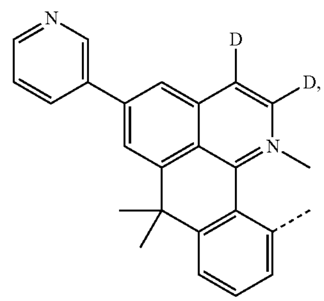
$L_{a808}$
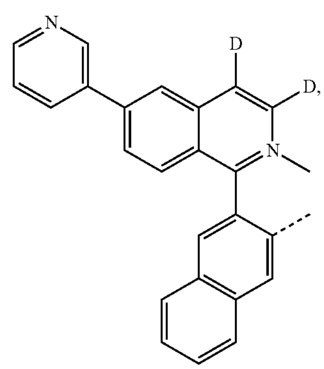
$L_{a809}$
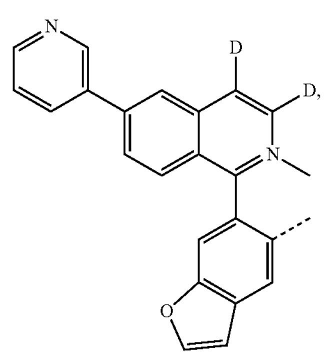
$L_{a810}$ -continued
$L_{a811}$
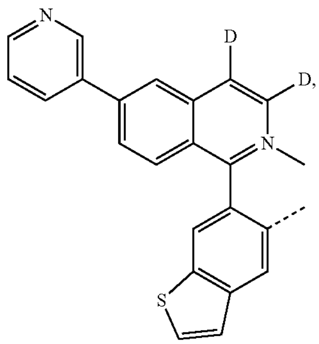
$L_{a812}$
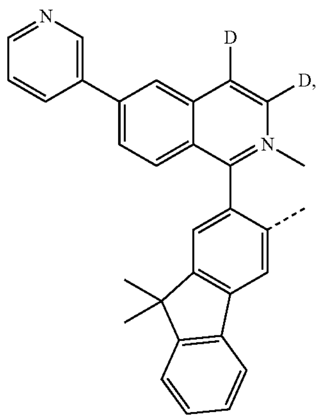
$L_{a813}$
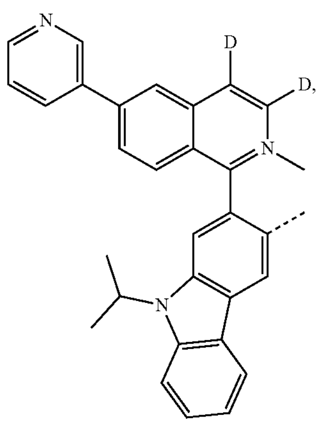
$L_{a814}$
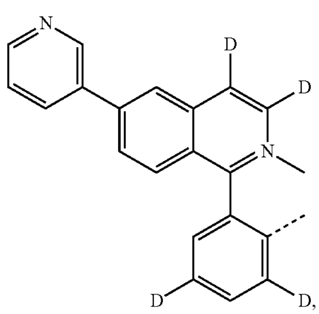
-continued
$L_{a815}$
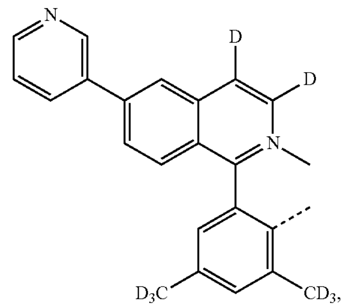
$L_{a816}$
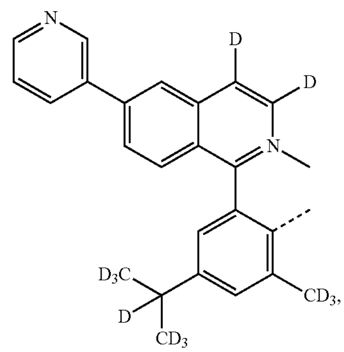
$L_{a817}$
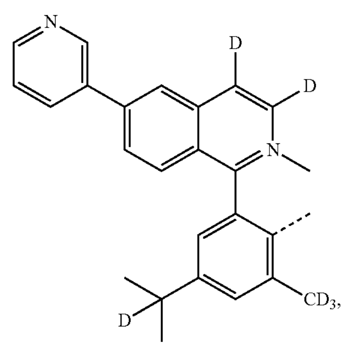
$L_{a818}$
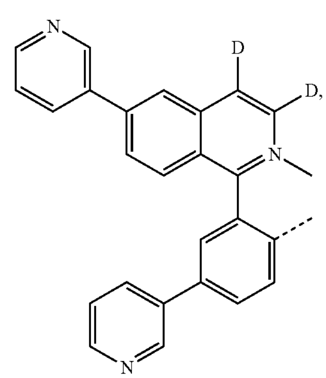

$L_{a819}$
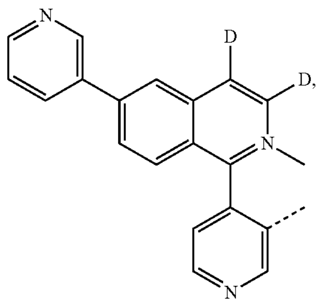
$L_{a820}$
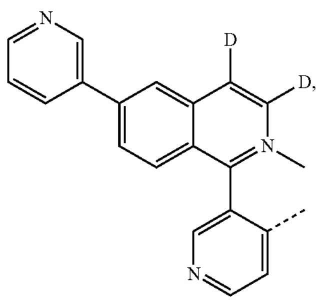
$L_{a821}$
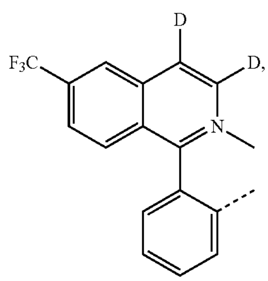
$L_{a822}$
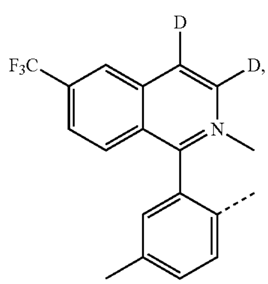
$L_{a823}$
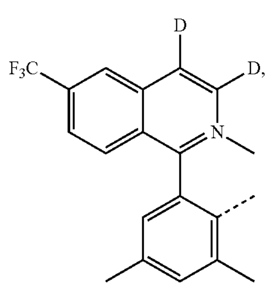
$L_{a824}$
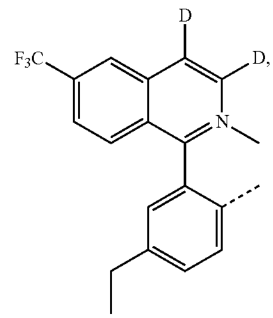
$L_{a825}$
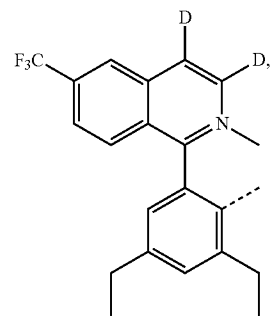
$L_{a826}$
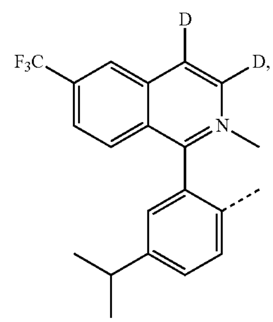
$L_{a827}$
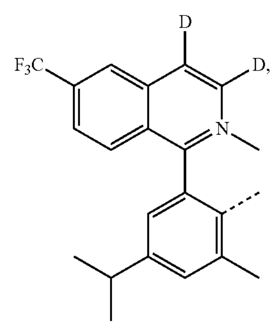
$L_{a828}$
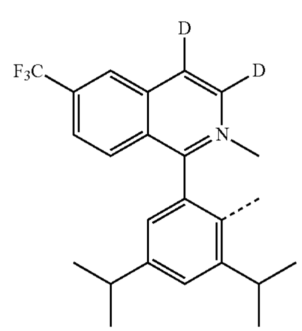

-continued
$L_{a829}$
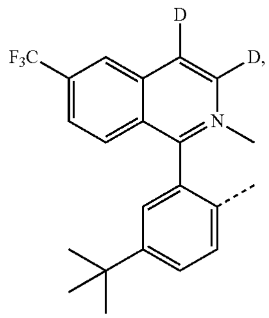
$L_{a830}$
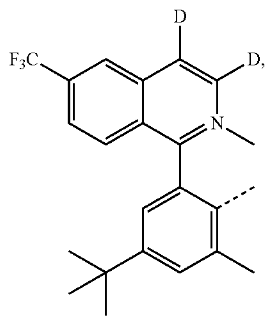
$L_{a831}$
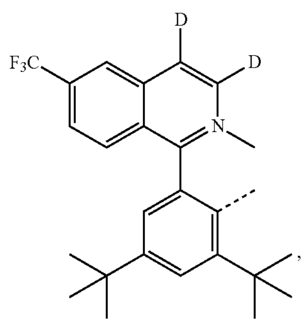
$L_{a832}$
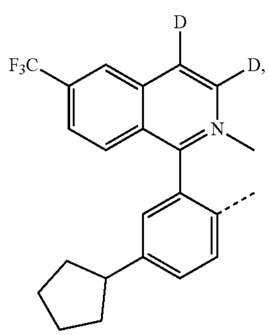
$L_{a833}$
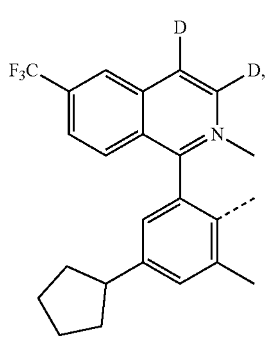
-continued
$L_{a834}$
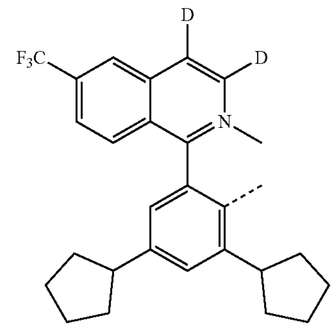
$L_{a835}$
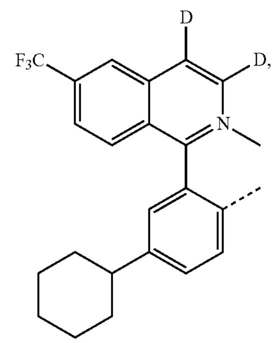
$L_{a836}$
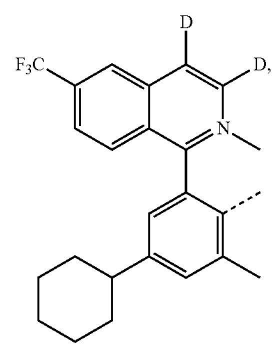
$L_{a837}$
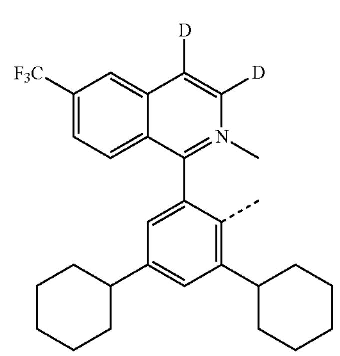

-continued
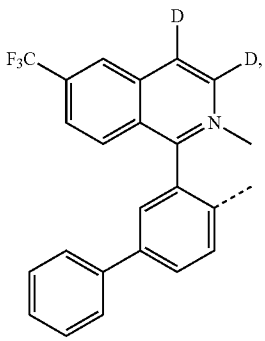
$L_{a838}$
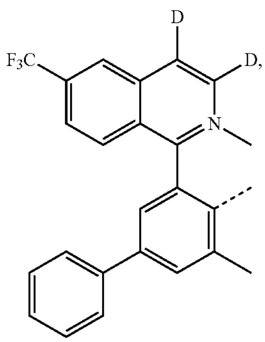
$L_{a839}$
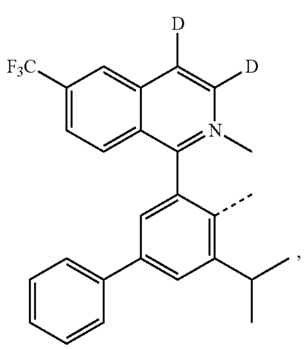
$L_{a840}$
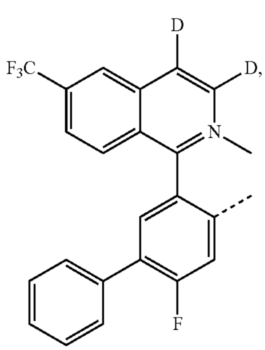
$L_{a841}$
-continued
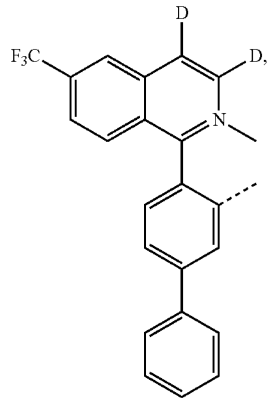
$L_{a842}$
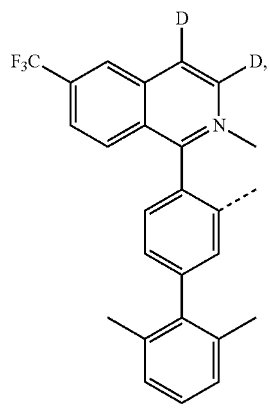
$L_{a843}$
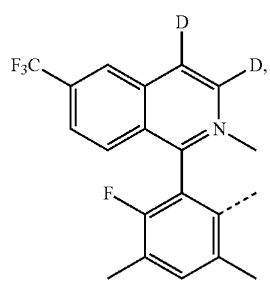
$L_{a844}$
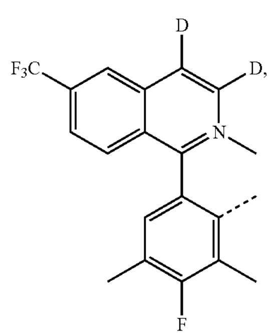
$L_{a845}$ $L_{a846}$
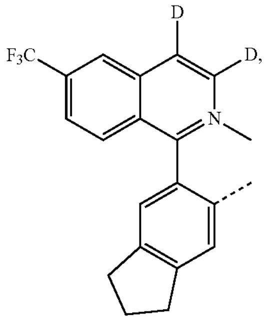
$L_{a847}$
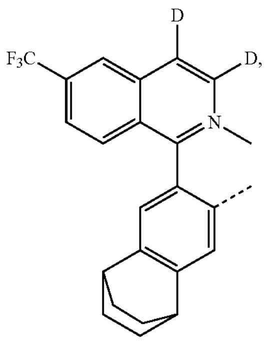
$L_{a848}$
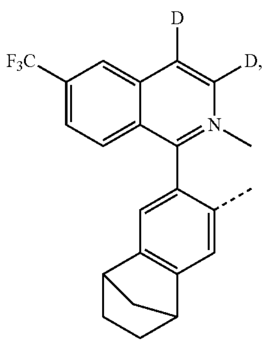
$L_{a849}$
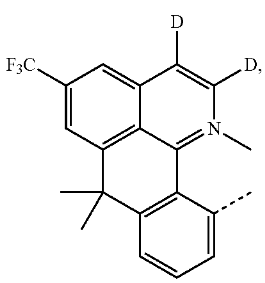
$L_{a850}$
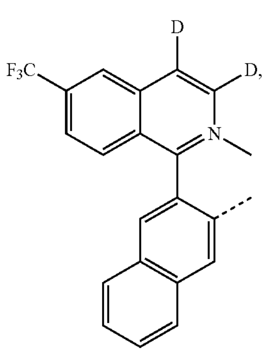
$L_{a851}$
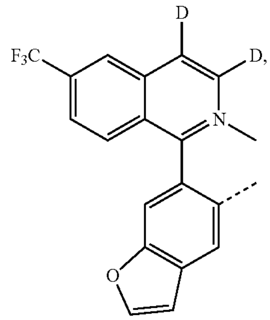
$L_{a852}$
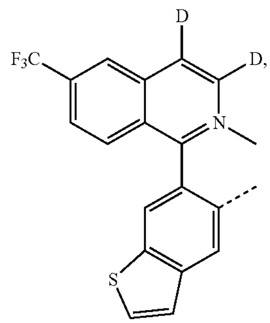
$L_{a853}$
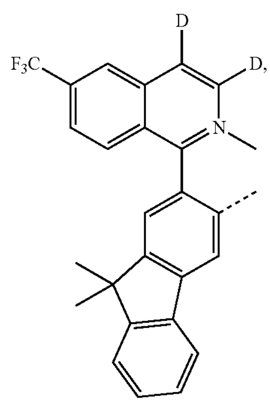
$L_{a854}$
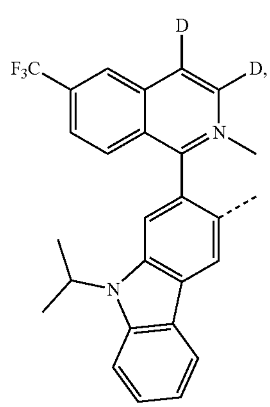

-continued
$L_{a855}$
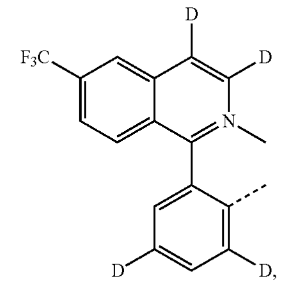
$L_{a856}$
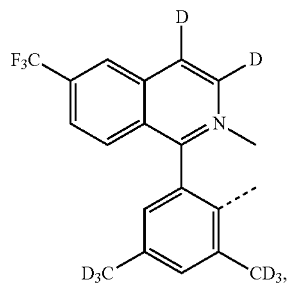
$L_{a857}$
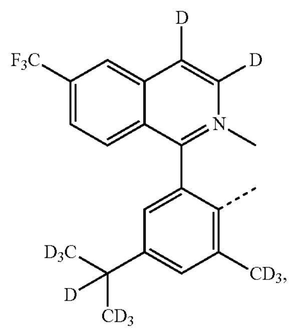
$L_{a858}$
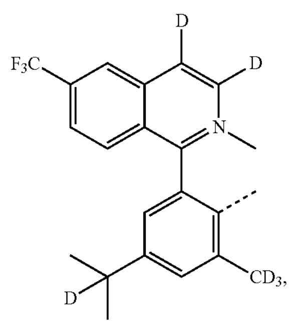
$L_{a859}$
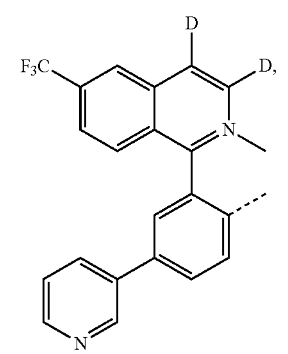
-continued
$L_{a860}$
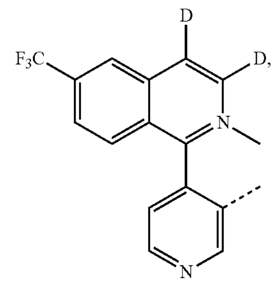
$L_{a861}$
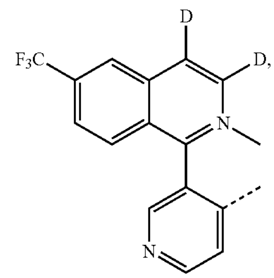
$L_{a862}$
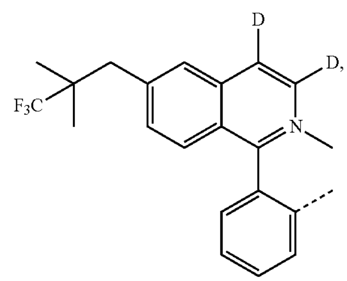
$L_{a863}$
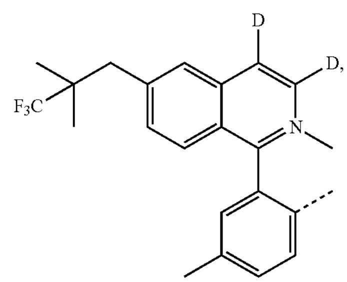
$L_{a864}$
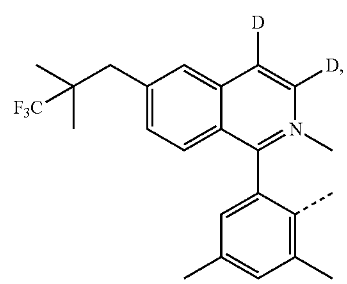

$L_{a865}$
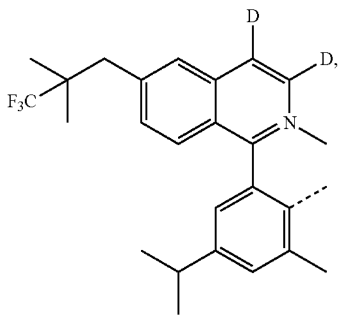
$L_{a866}$
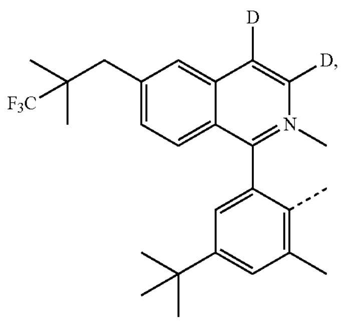
$L_{a867}$
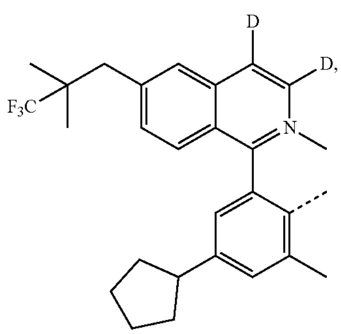
$L_{a868}$
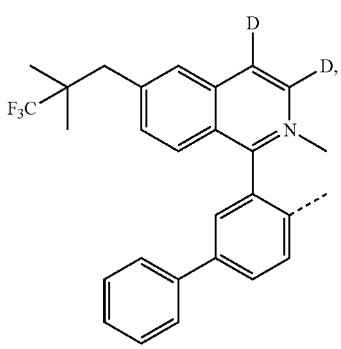
$L_{a869}$
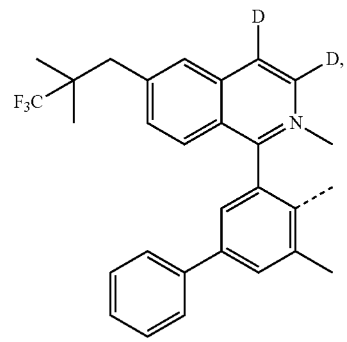
$L_{a870}$
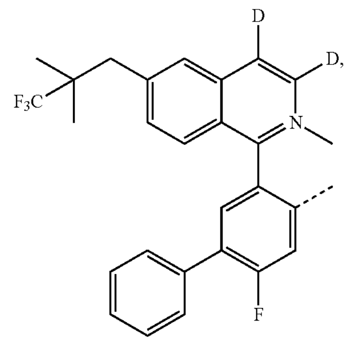
$L_{a871}$
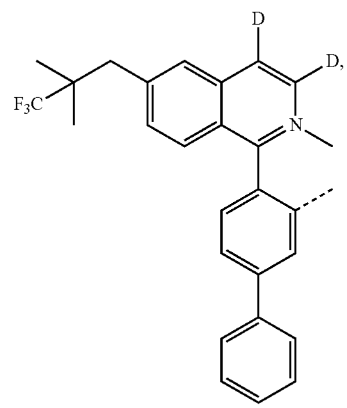
$L_{a872}$
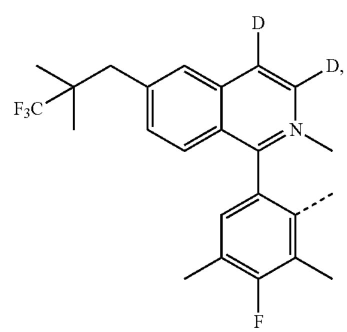

-continued
$L_{a873}$
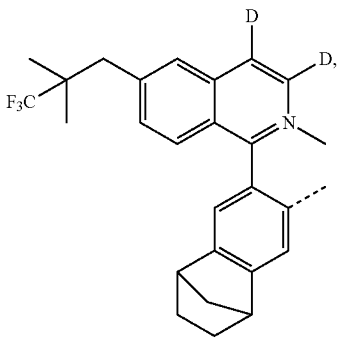
$L_{a874}$
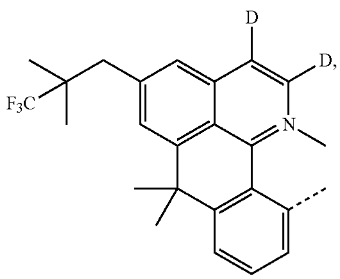
$L_{a875}$
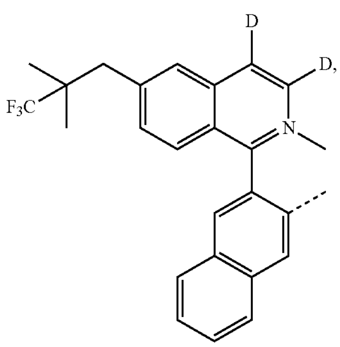
$L_{a876}$
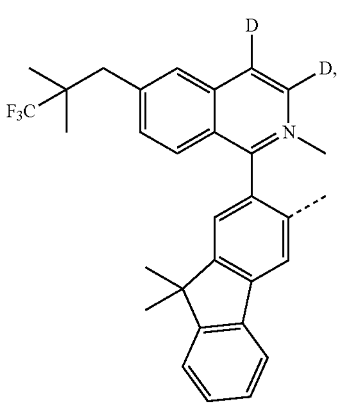
-continued
$L_{a877}$
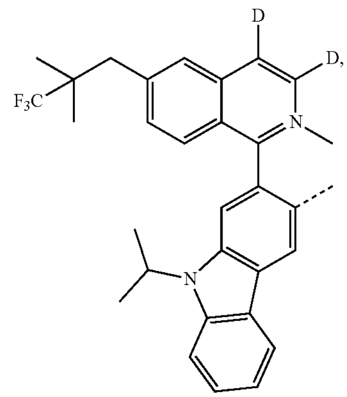
$L_{a878}$
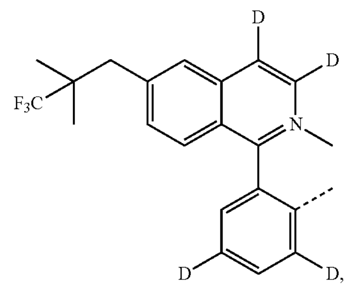
$L_{a879}$
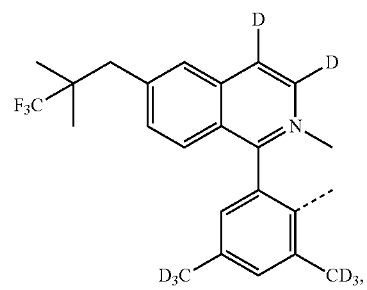
$L_{a880}$
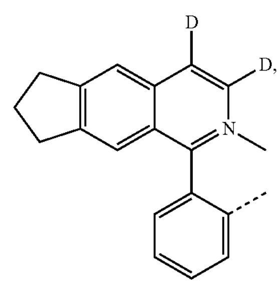
$L_{a881}$
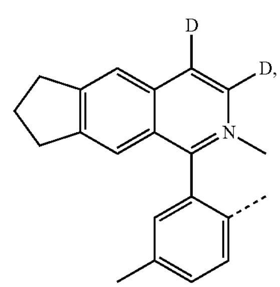

-continued
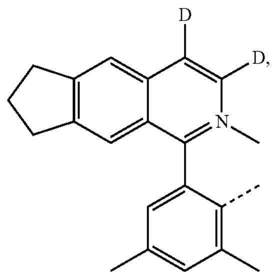
$L_{a882}$
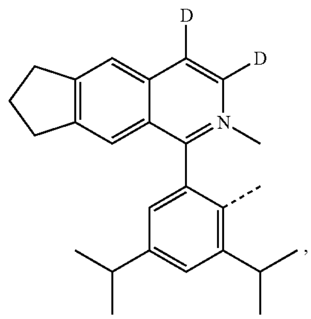
$L_{a883}$
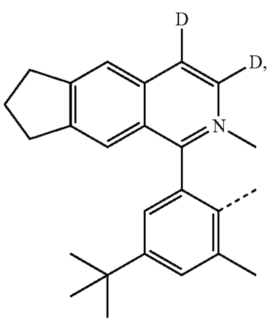
$L_{a884}$
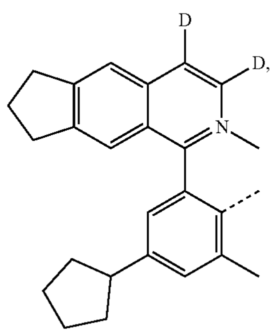
$L_{a885}$
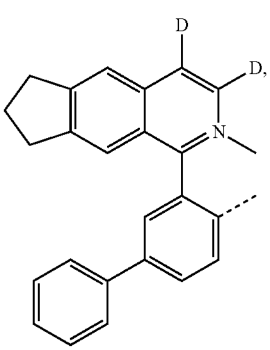
$L_{a886}$
-continued
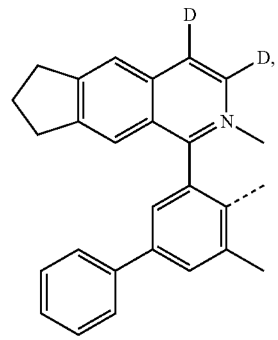
$L_{a887}$
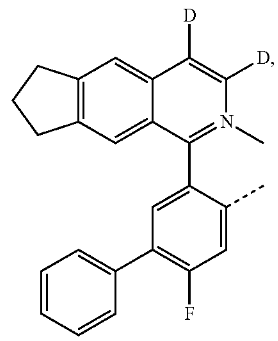
$L_{a888}$
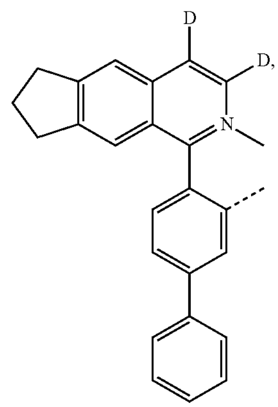
$L_{a889}$
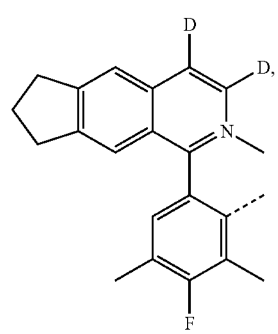
$L_{a890}$ -continued
L$_{a891}$
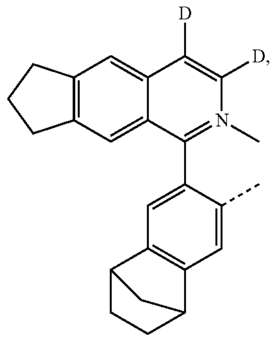
L$_{a892}$
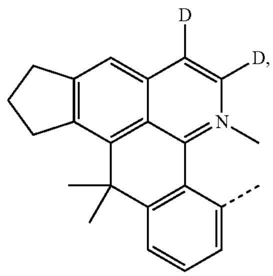
L$_{a893}$
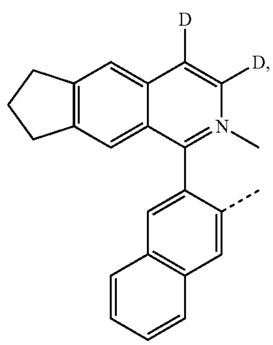
L$_{a894}$
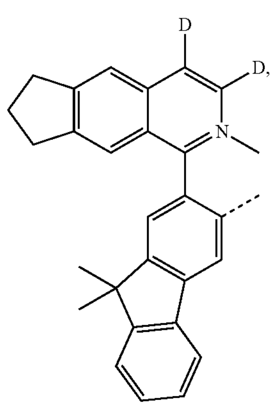
-continued
L$_{a895}$
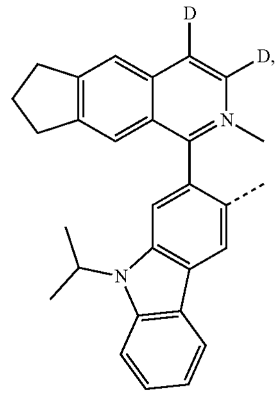
L$_{a896}$
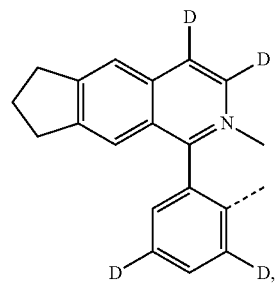
L$_{a897}$
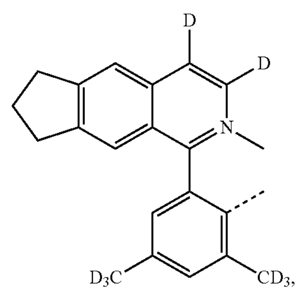
L$_{a898}$
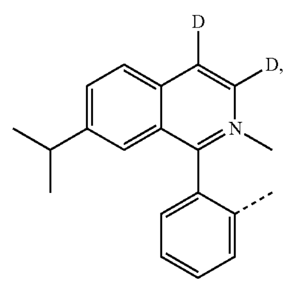
L$_{a899}$
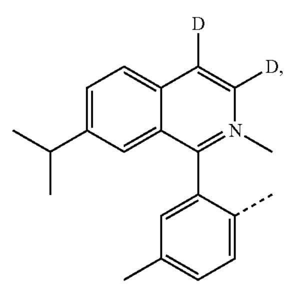

$L_{a900}$
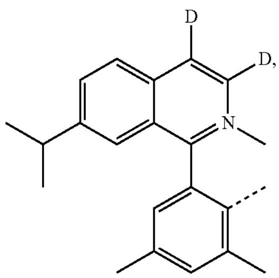
$L_{a901}$
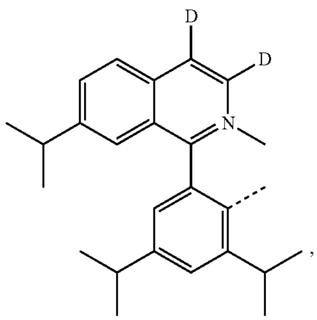
$L_{a902}$
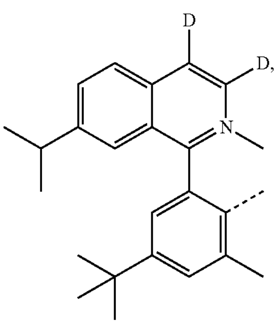
$L_{a903}$
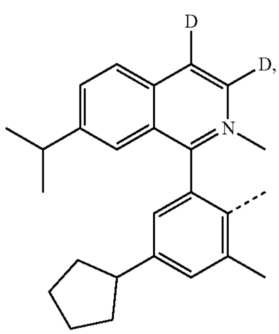
$L_{a904}$
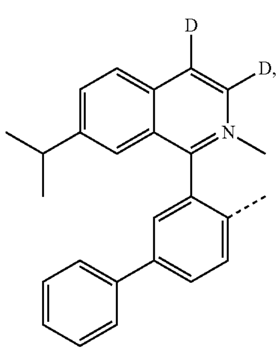
$L_{a905}$
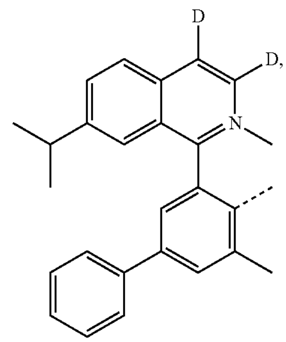
$L_{a906}$
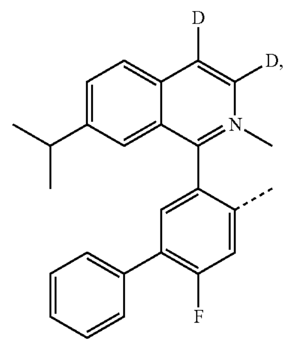
$L_{a907}$
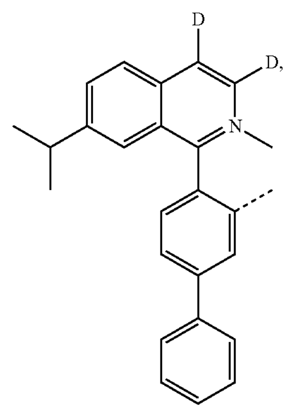
$L_{a908}$
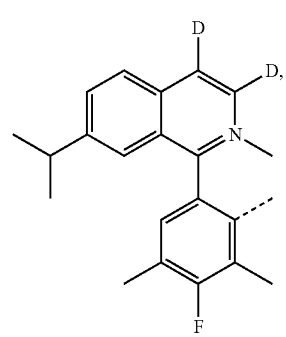

-continued
$L_{a909}$
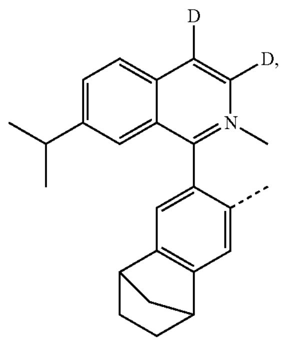
$L_{a910}$
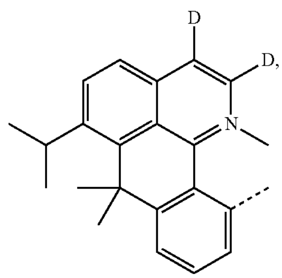
$L_{a911}$
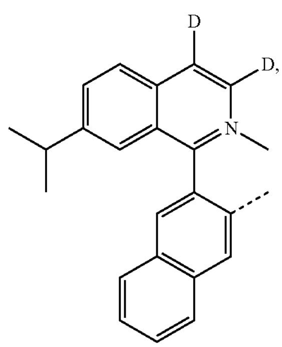
$L_{a912}$
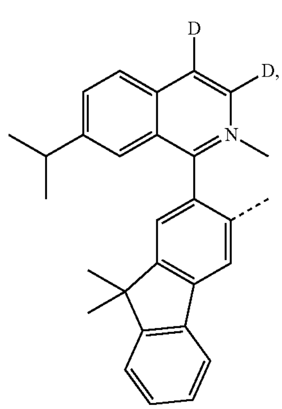
-continued
$L_{a913}$
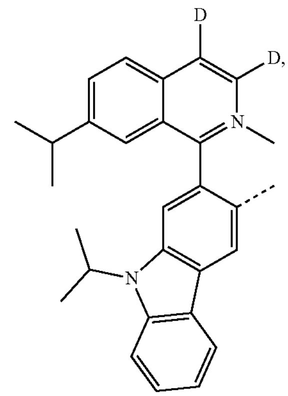
$L_{a914}$
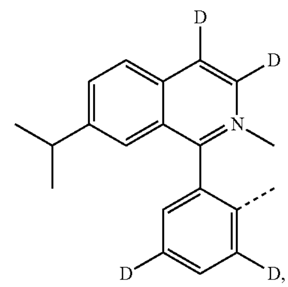
$L_{a915}$
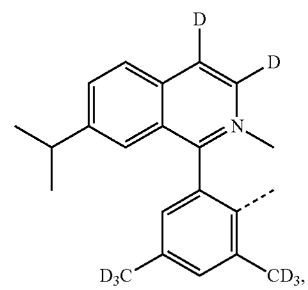
$L_{a916}$
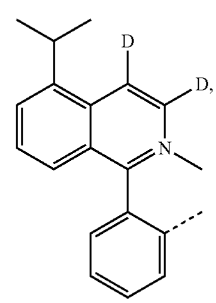
$L_{a917}$
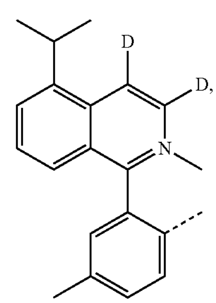

-continued
$L_{a918}$
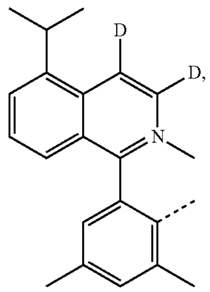
$L_{a919}$
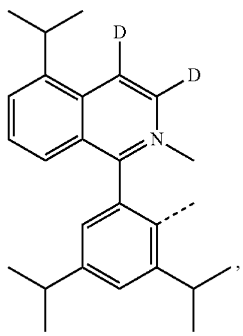
$L_{a920}$
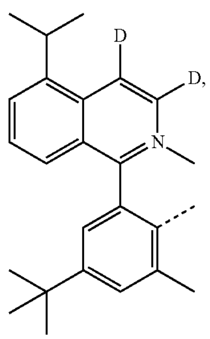
$L_{a921}$
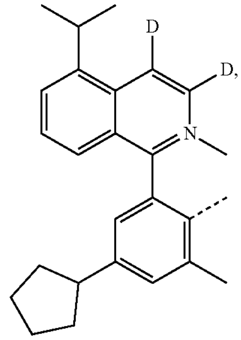
-continued
$L_{a922}$
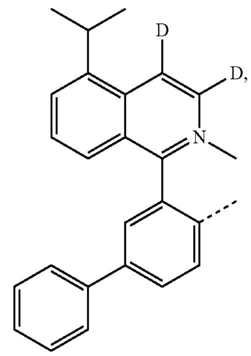
$L_{a923}$
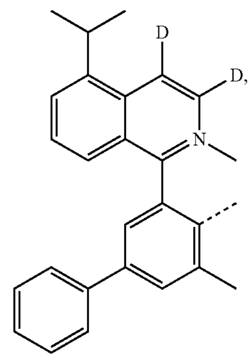
$L_{a924}$
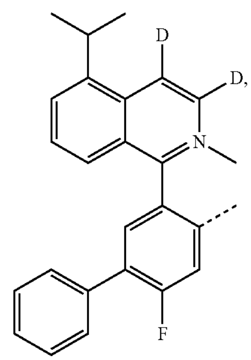
$L_{a925}$
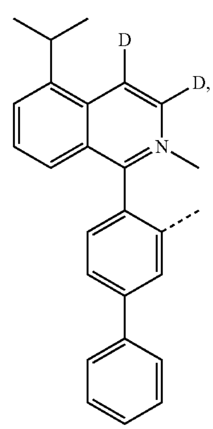

-continued
$L_{a926}$
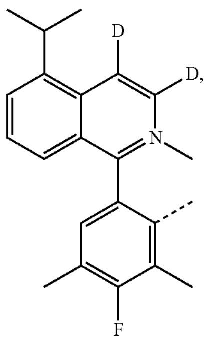
$L_{a927}$
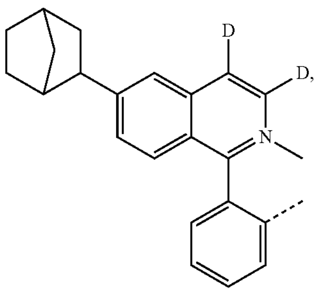
$L_{a928}$
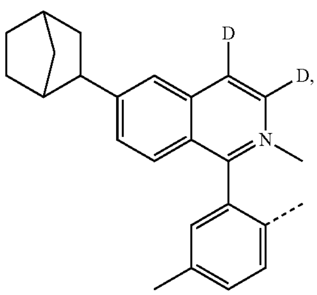
$L_{a929}$
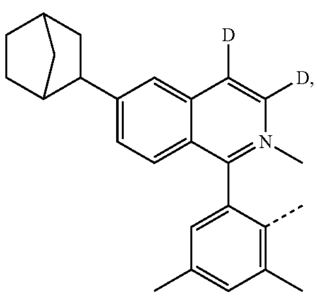
$L_{a930}$
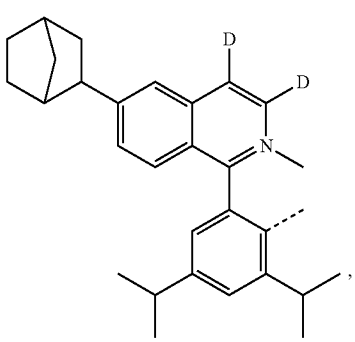
-continued
$L_{a931}$
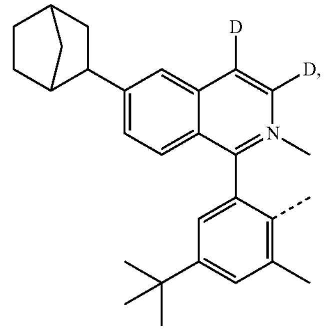
$L_{a932}$
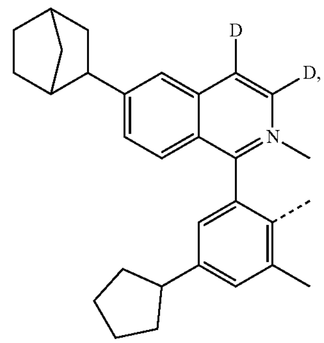
$L_{a933}$
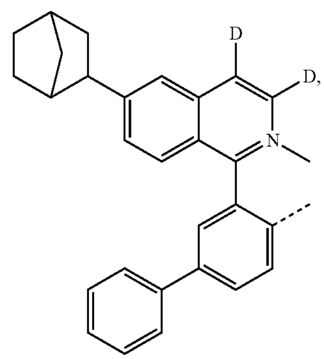
$L_{a934}$
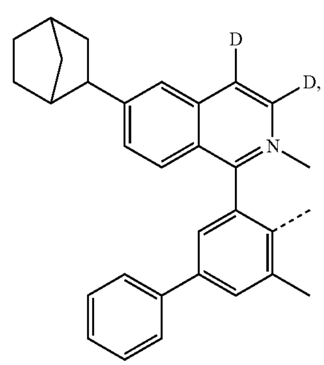

-continued
$L_{a935}$
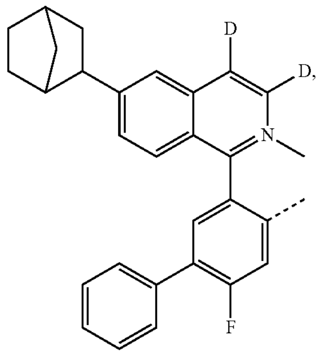
$L_{a936}$
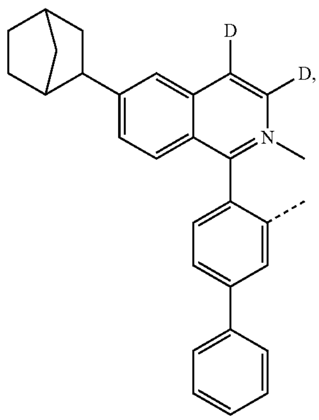
$L_{a937}$
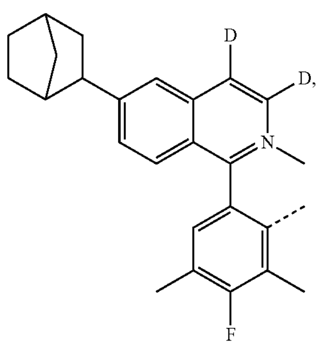
$L_{a938}$
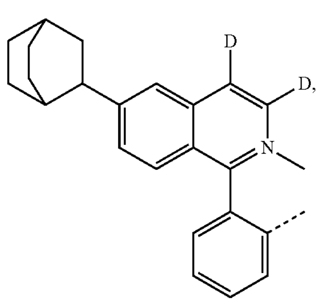
-continued
$L_{a939}$
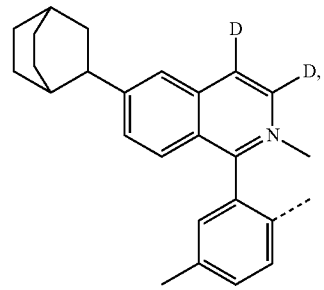
$L_{a940}$
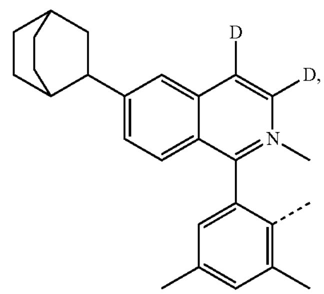
$L_{a941}$
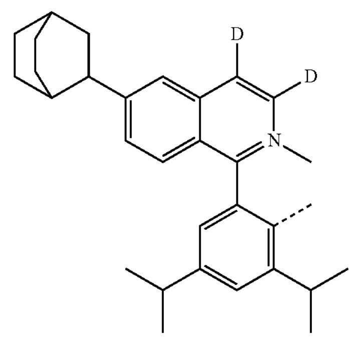
$L_{a942}$
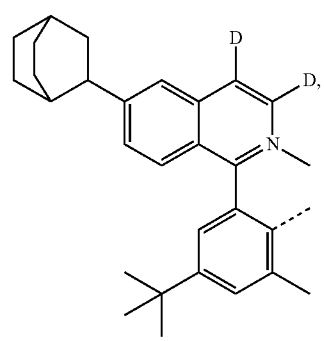
$L_{a943}$
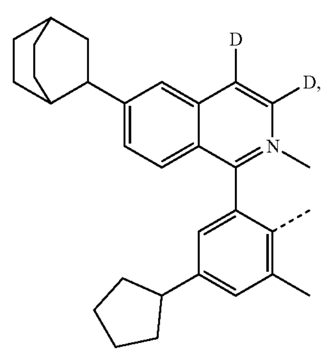

-continued
$L_{a944}$
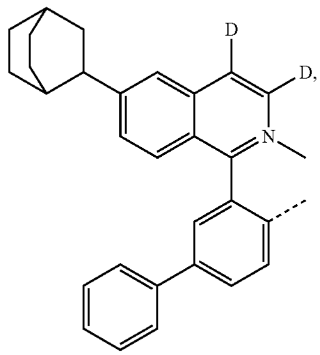
$L_{a945}$
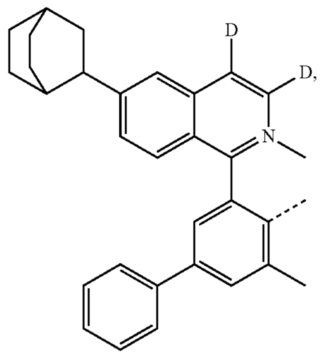
$L_{a946}$
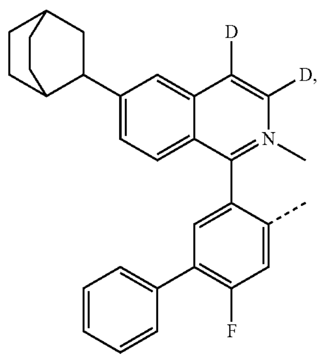
$L_{a947}$
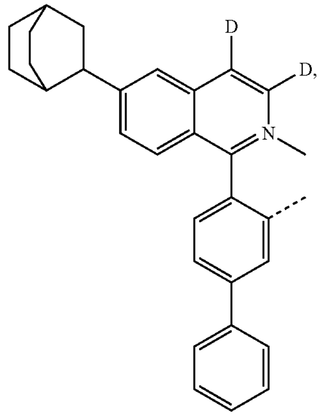
-continued
$L_{a948}$
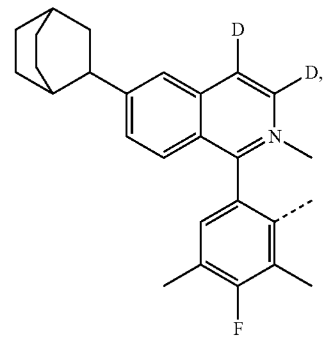
$L_{a949}$
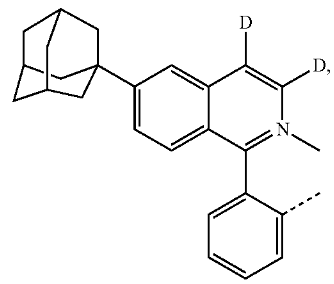
$L_{a950}$
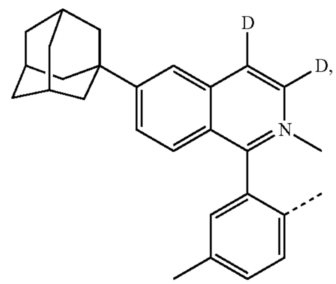
$L_{a951}$
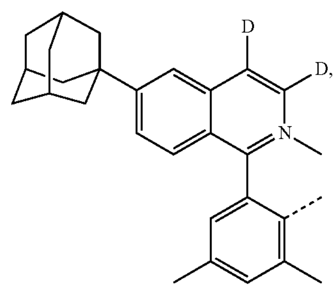
$L_{a952}$
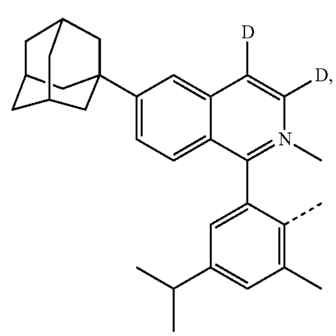

-continued
$L_{a953}$
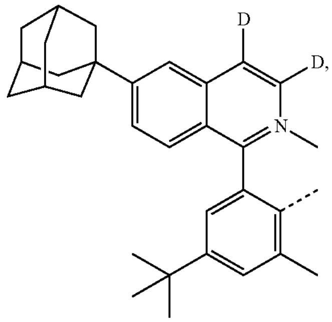
$L_{a954}$
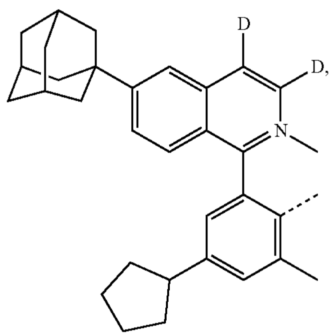
$L_{a955}$
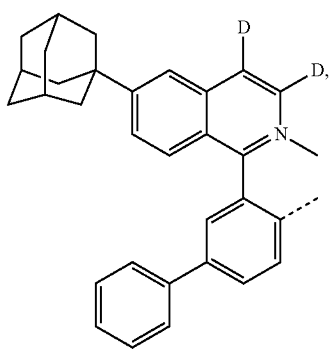
$L_{a956}$
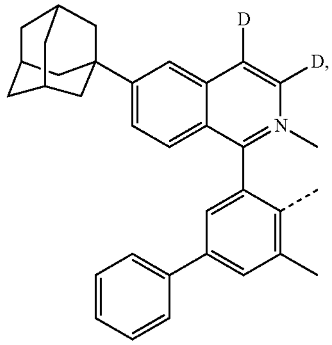
-continued
$L_{a957}$
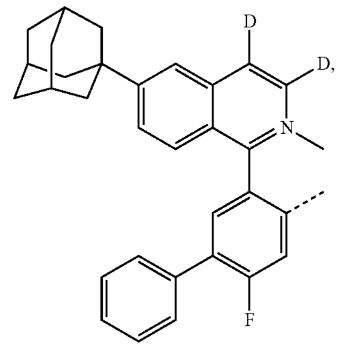
$L_{a958}$
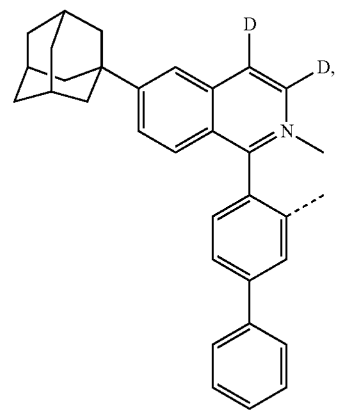
$L_{a959}$
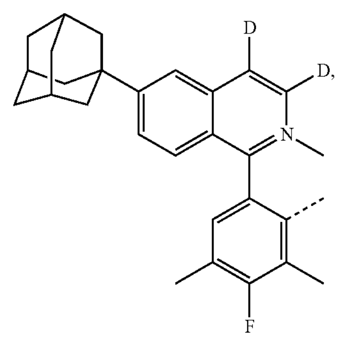
$L_{a960}$
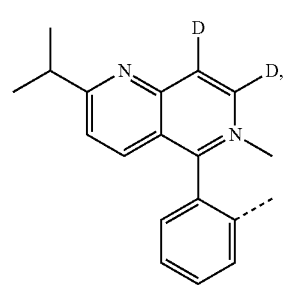

-continued
$L_{a961}$
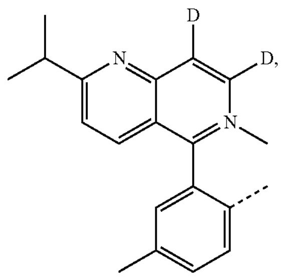
$L_{a962}$
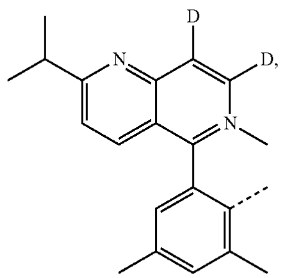
$L_{a963}$
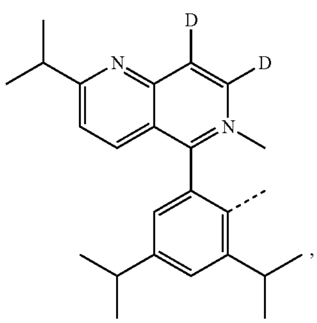
$L_{a964}$
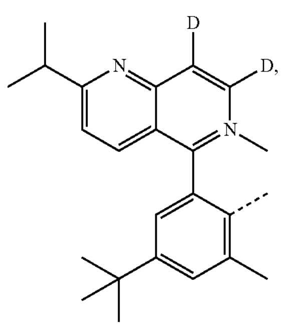
$L_{a965}$
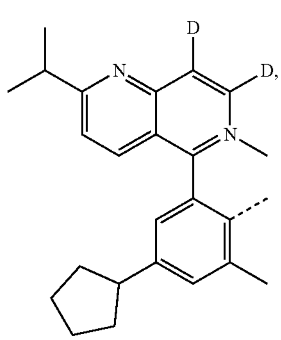
-continued
$L_{a966}$
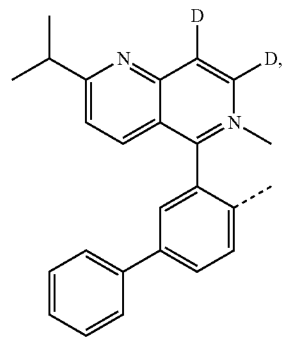
$L_{a967}$
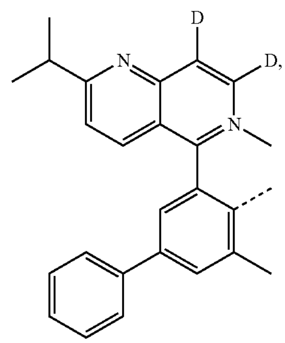
$L_{a968}$
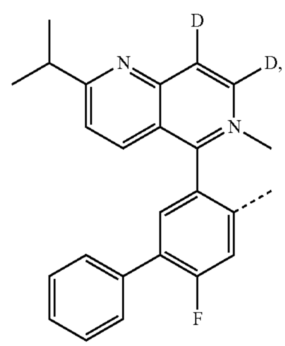
$L_{a969}$
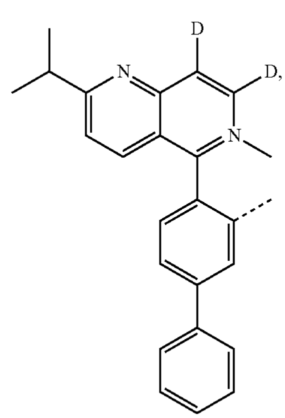

-continued
$L_{a970}$
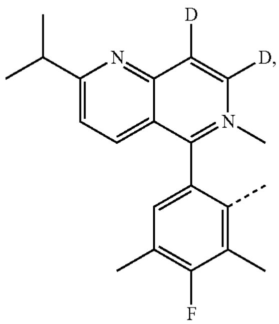
$L_{a971}$
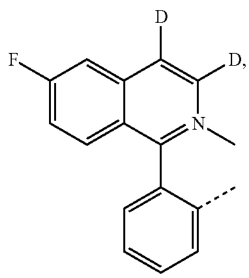
$L_{a972}$
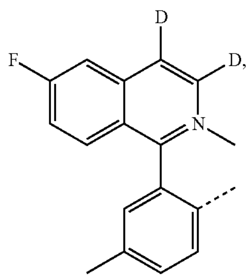
$L_{a973}$
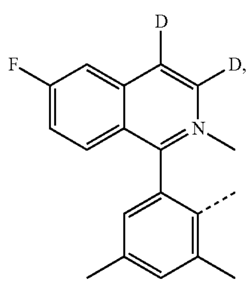
$L_{a974}$
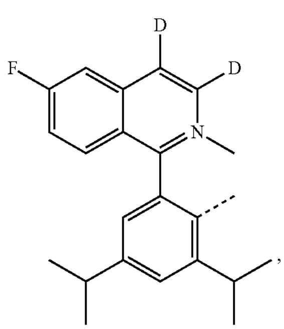
-continued
$L_{a975}$
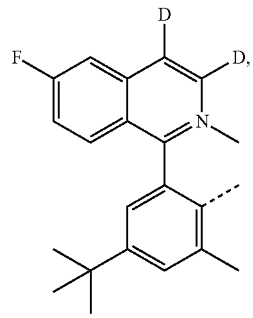
$L_{a976}$
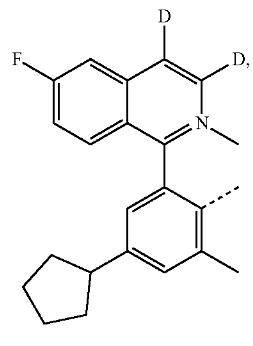
$L_{a977}$
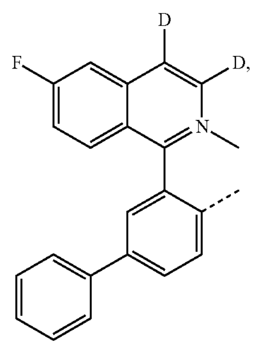
$L_{a978}$
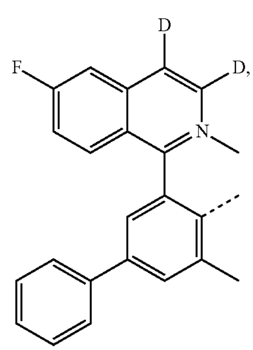

-continued
$L_{a979}$
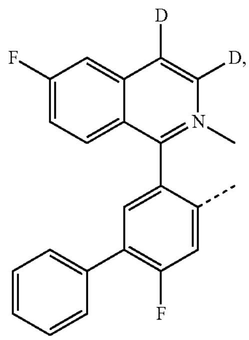
$L_{a980}$
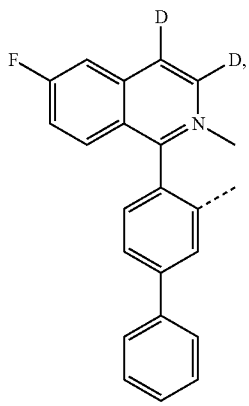
$L_{a981}$
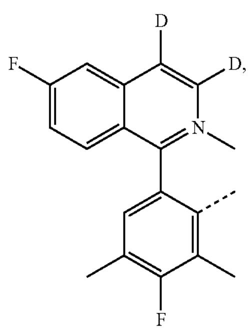
$L_{a982}$
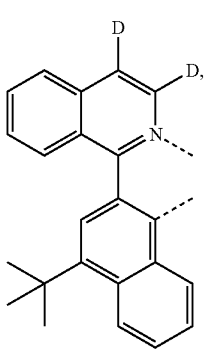
-continued
$L_{a983}$
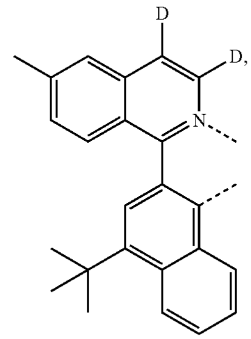
$L_{a984}$
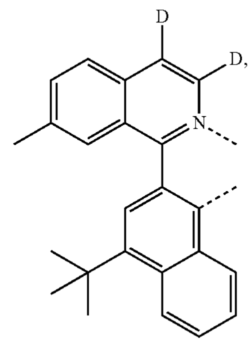
$L_{a985}$
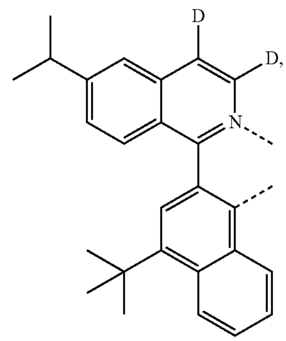
$L_{a986}$
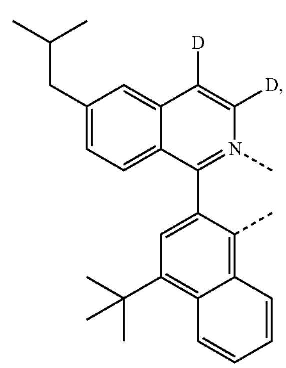

$L_{a987}$
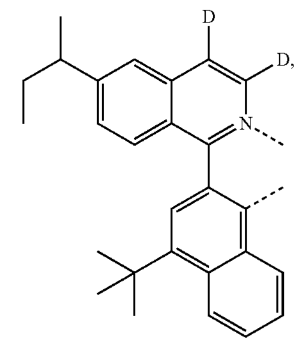
$L_{a988}$
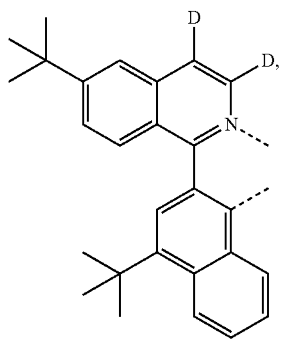
$L_{a989}$
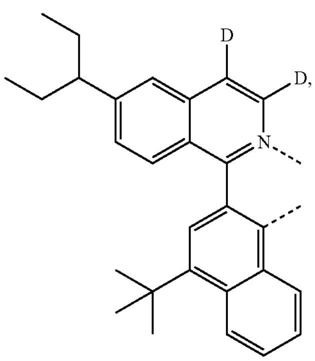
$L_{a990}$
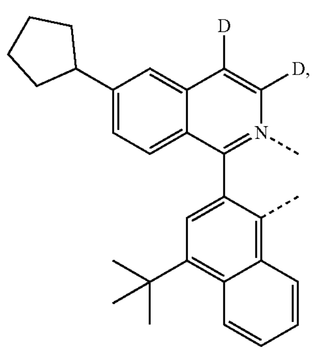
$L_{a991}$
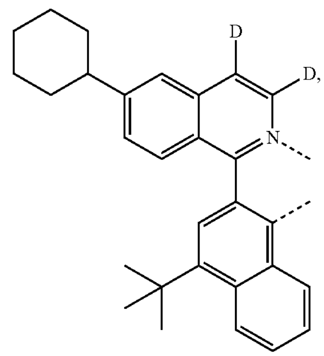
$L_{a992}$
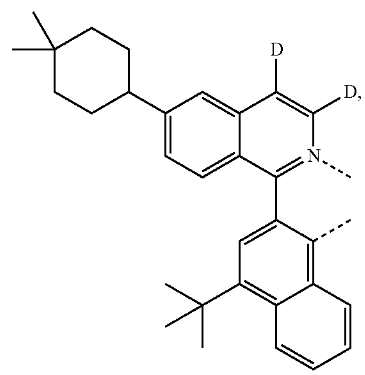
$L_{a993}$
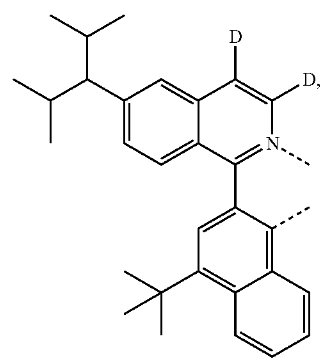
$L_{a994}$
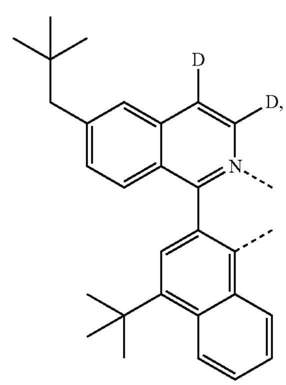

$L_{a995}$
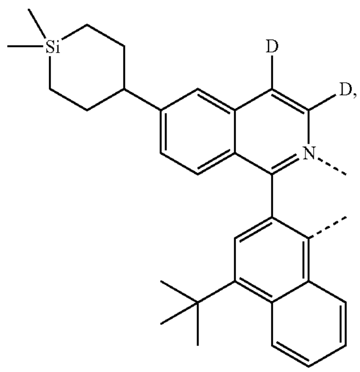
$L_{a996}$
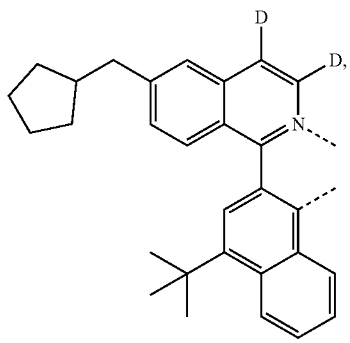
$L_{a997}$
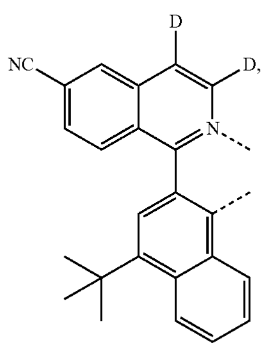
$L_{a998}$
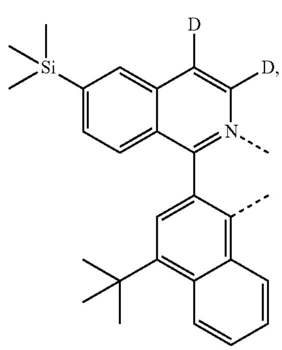
$L_{a999}$
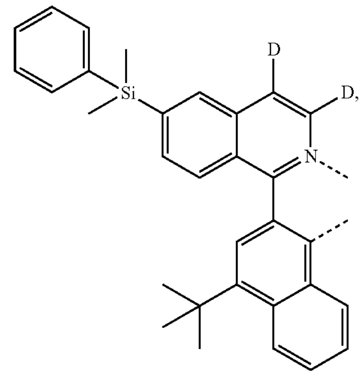
$L_{a1000}$
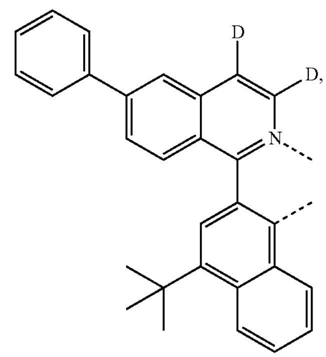
$L_{a1001}$
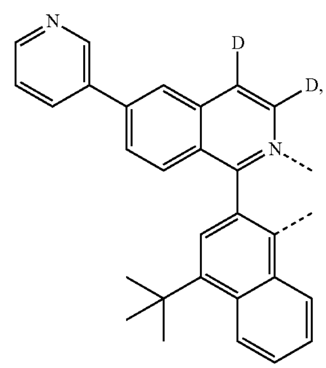
$L_{a1002}$
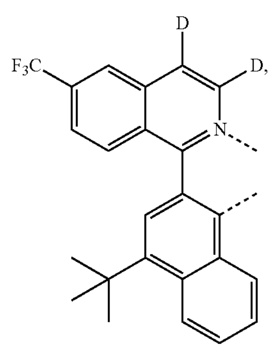

-continued
$L_{a1003}$
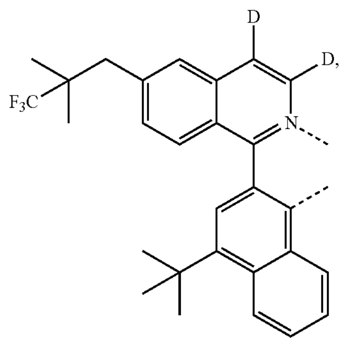
$L_{a1004}$
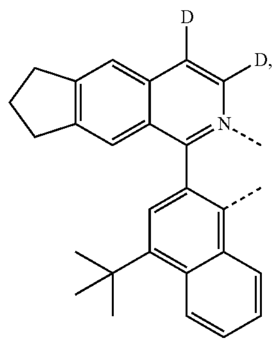
$L_{a1005}$
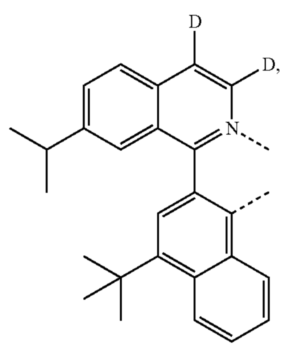
$L_{a1006}$
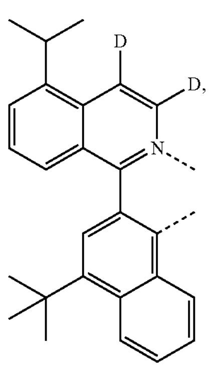
-continued
$L_{a1007}$
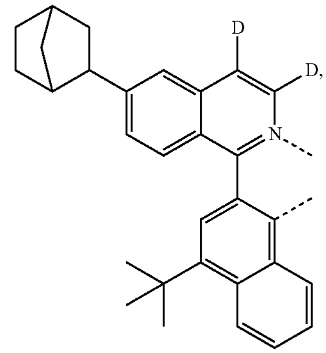
$L_{a1008}$
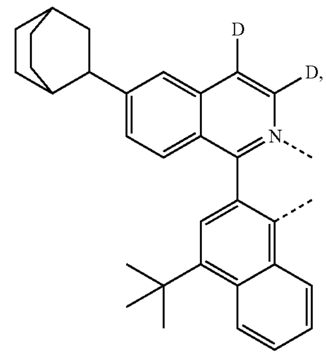
$L_{a1009}$
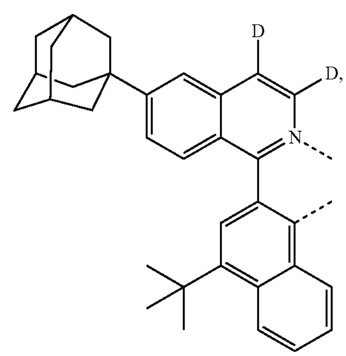
$L_{a1010}$
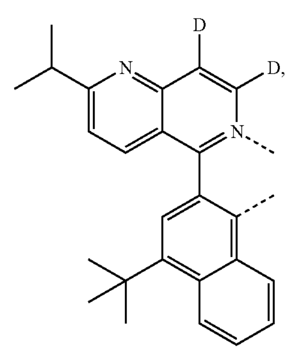

-continued
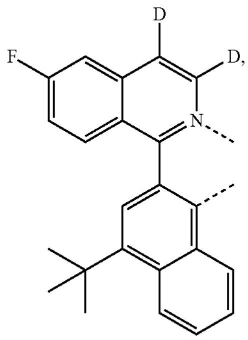
$L_{a1011}$
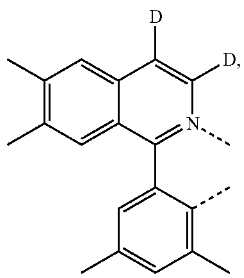
$L_{a1012}$
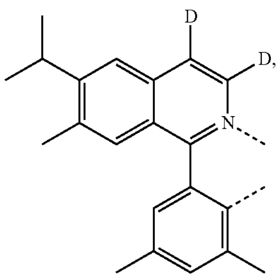
$L_{a1013}$
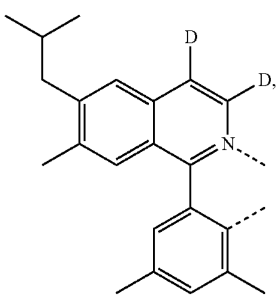
$L_{a1014}$
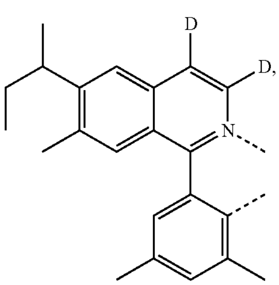
$L_{a1015}$
-continued
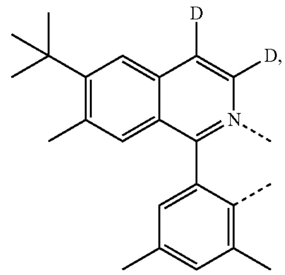
$L_{a1016}$
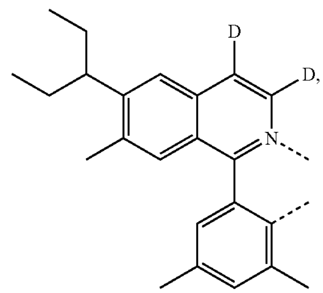
$L_{a1017}$
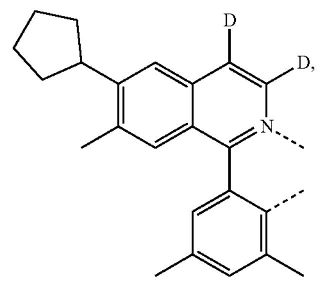
$L_{a1018}$
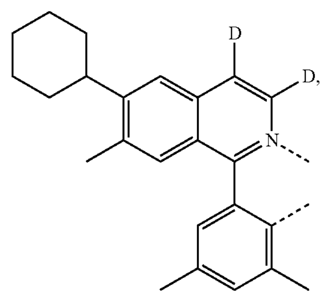
$L_{a1019}$
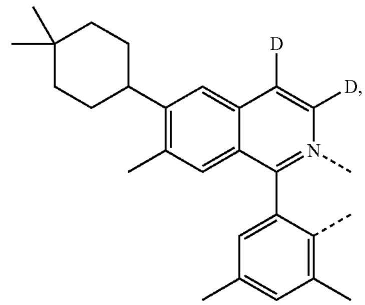
$L_{a1020}$ $L_{a1021}$
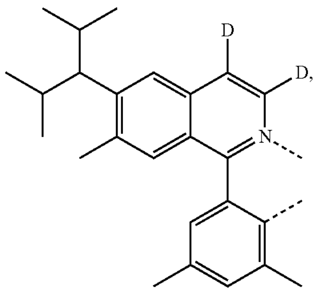
$L_{a1022}$
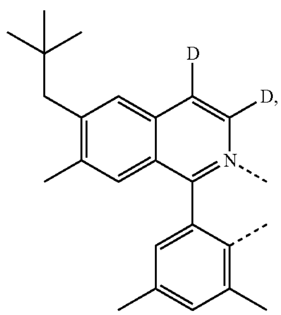
$L_{a1023}$
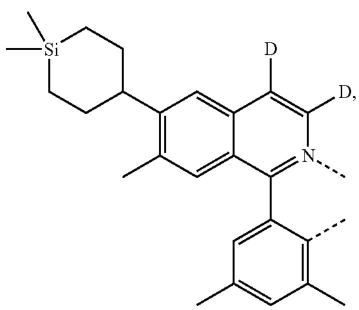
$L_{a1024}$
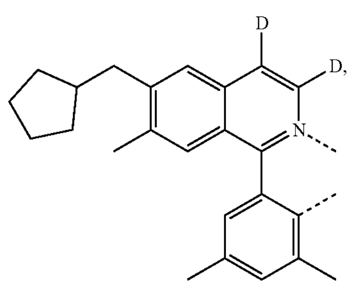
$L_{a1025}$
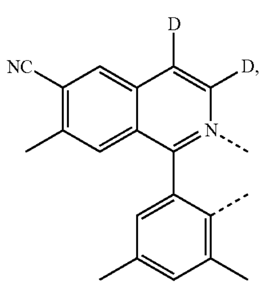
$L_{a1026}$
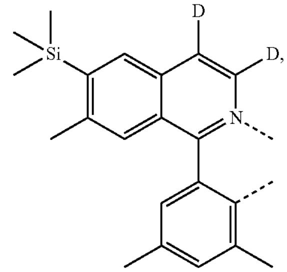
$L_{a1027}$
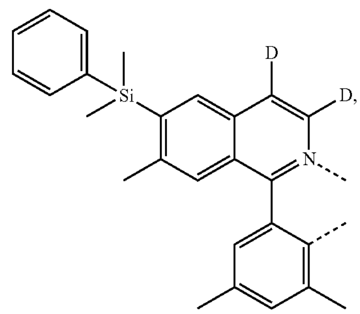
$L_{a1028}$
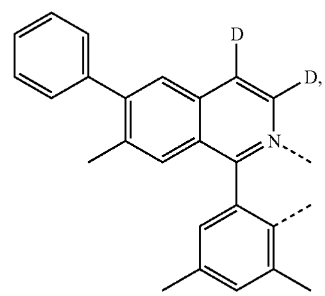
$L_{a1029}$
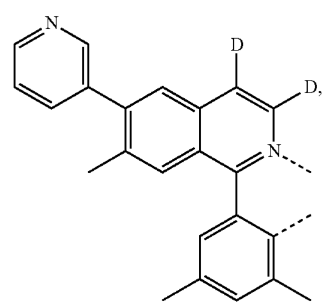
$L_{a1030}$
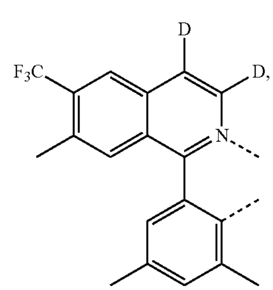

-continued
$L_{a1031}$
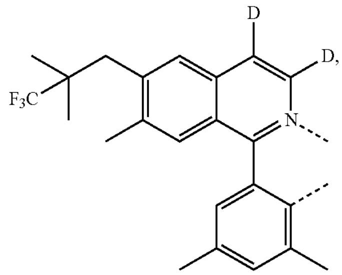
$L_{a1032}$
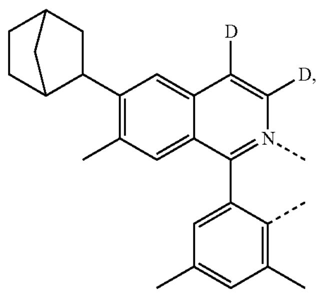
$L_{a1033}$
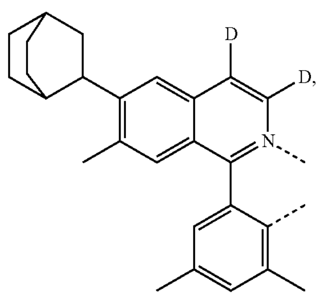
$L_{a1034}$
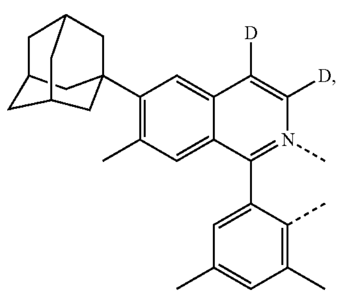
$L_{a1035}$
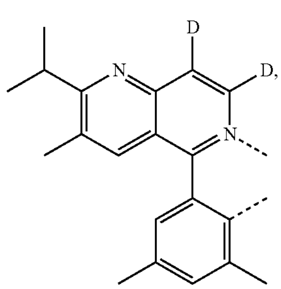
-continued
$L_{a1036}$
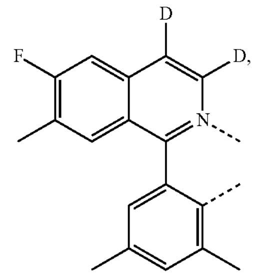
$L_{a1037}$
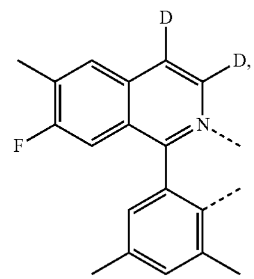
$L_{a1038}$
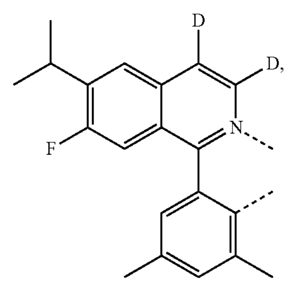
$L_{a1039}$
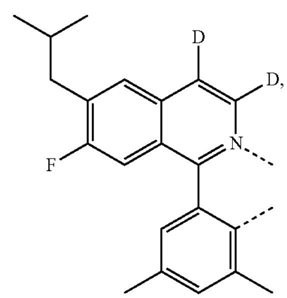
$L_{a1040}$
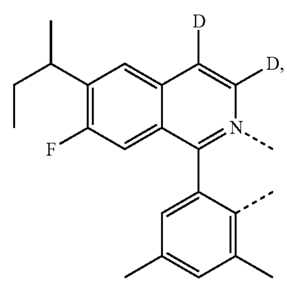

-continued
L$_{a1041}$
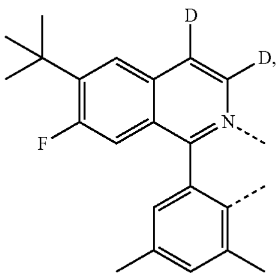
L$_{a1042}$
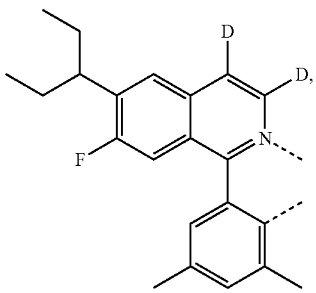
L$_{a1043}$
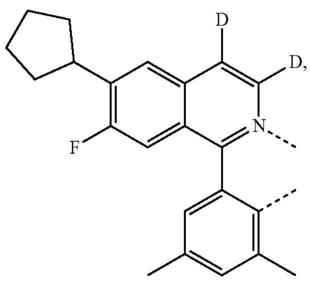
L$_{a1044}$
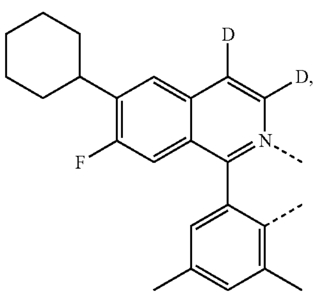
L$_{a1045}$
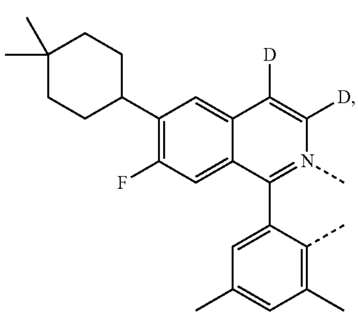
-continued
L$_{a1046}$
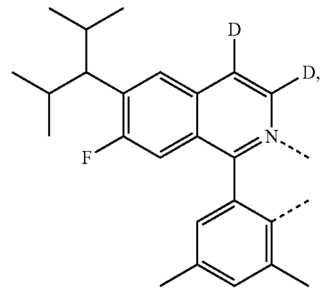
L$_{a1047}$
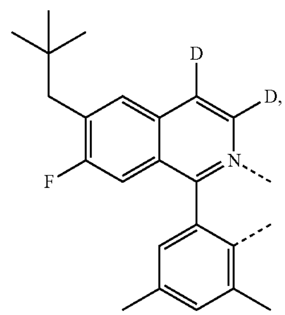
L$_{a1048}$
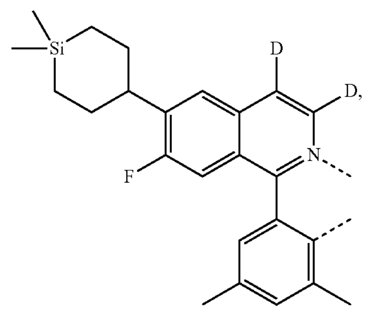
L$_{a1049}$
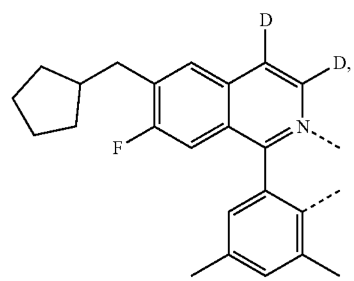
L$_{a1050}$
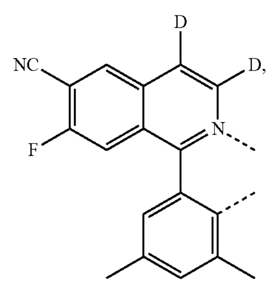

-continued
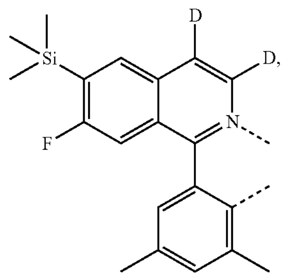
$L_{a1051}$
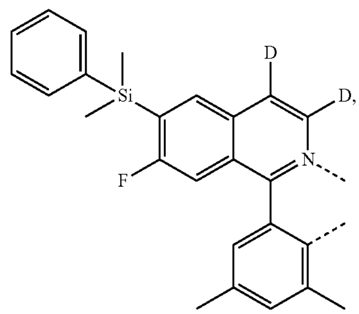
$L_{a1052}$
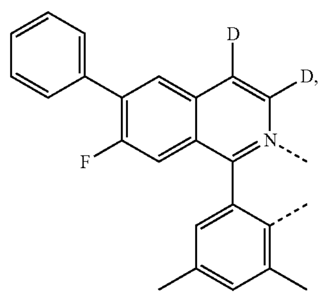
$L_{a1053}$
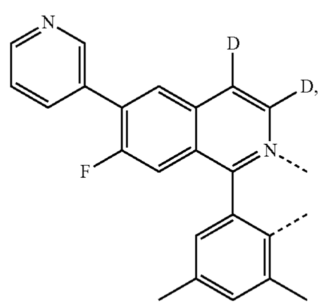
$L_{a1054}$
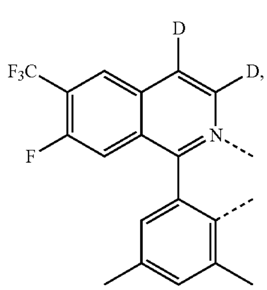
$L_{a1055}$
-continued
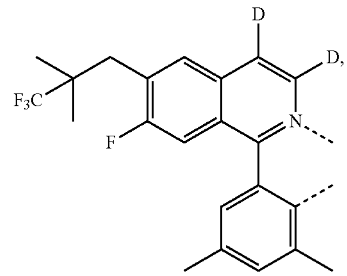
$L_{a1056}$
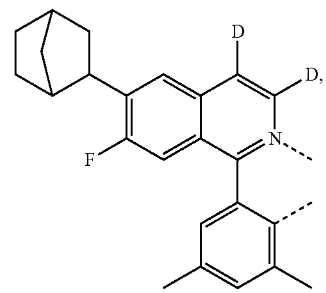
$L_{a1057}$
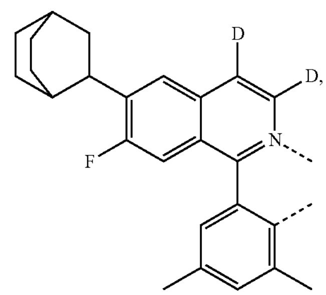
$L_{a1058}$
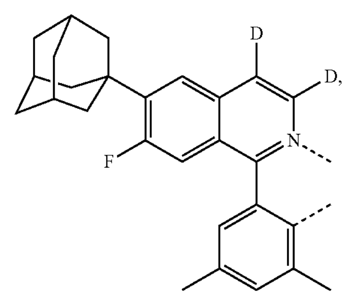
$L_{a1059}$
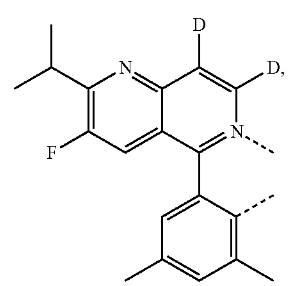
$L_{a1060}$ -continued
$L_{a1061}$
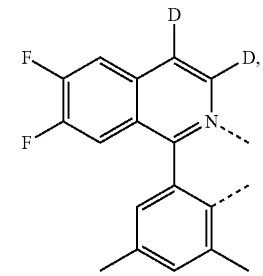
$L_{a1062}$
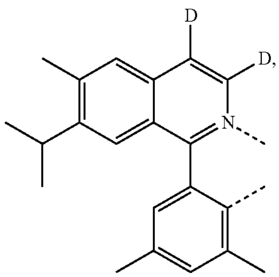
$L_{a1063}$
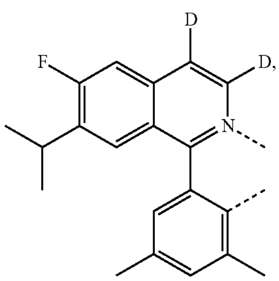
$L_{a1064}$
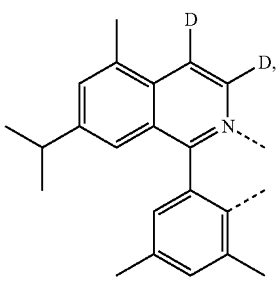
$L_{a1065}$
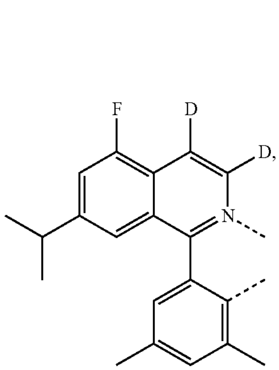
-continued
$L_{a1066}$
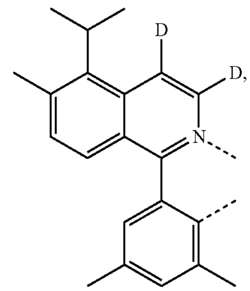
$L_{a1067}$
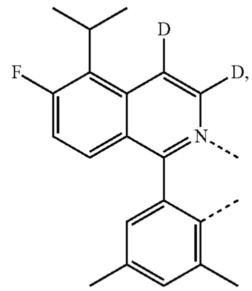
$L_{a1068}$
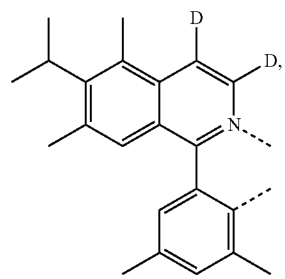
$L_{a1069}$
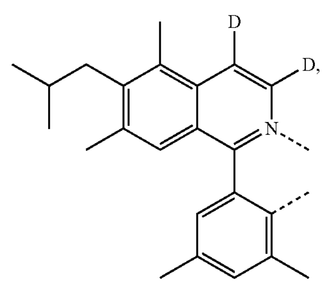
$L_{a1070}$
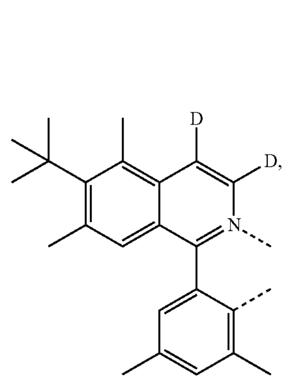

-continued
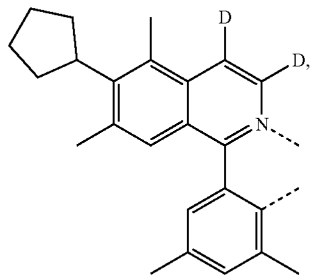
$L_{a1071}$
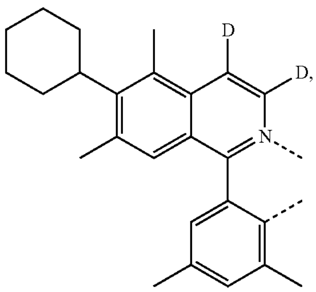
$L_{a1072}$
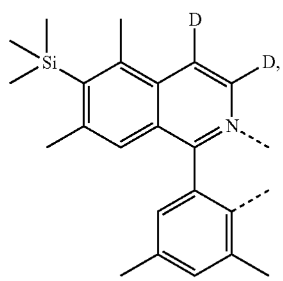
$L_{a1073}$
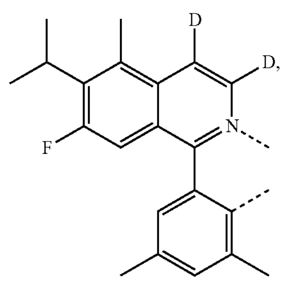
$L_{a1074}$
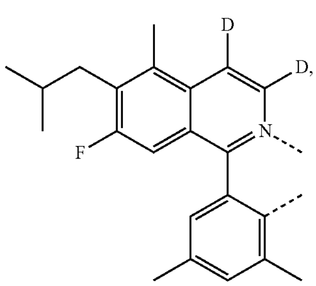
$L_{a1075}$
-continued
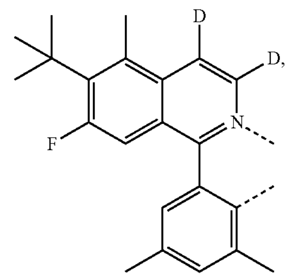
$L_{a1076}$
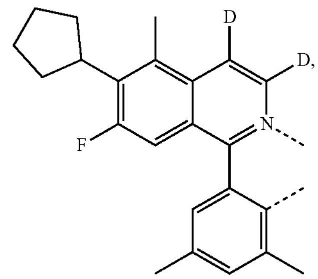
$L_{a1077}$
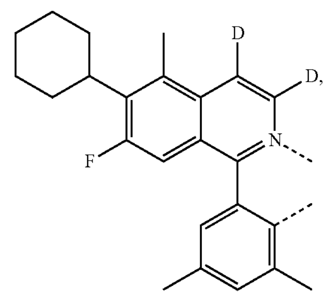
$L_{a1078}$
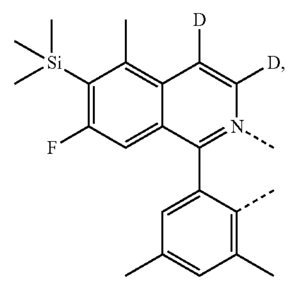
$L_{a1079}$
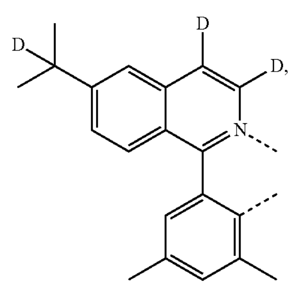
$L_{a1080}$ $L_{a1081}$
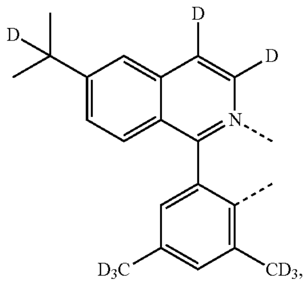
$L_{a1082}$
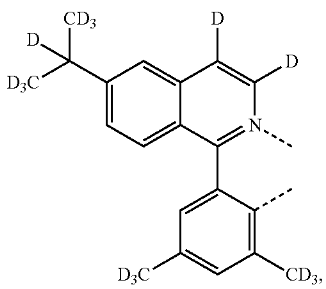
$L_{a1083}$
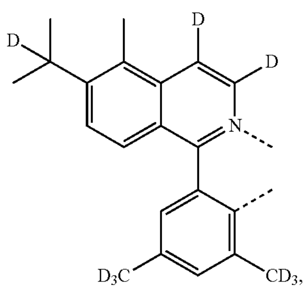
$L_{a1084}$
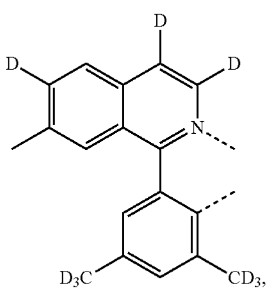
$L_{a1085}$
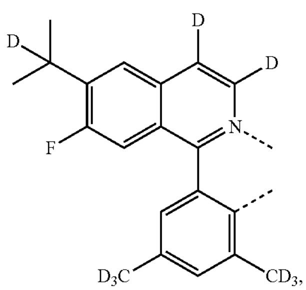
$L_{a1091}$
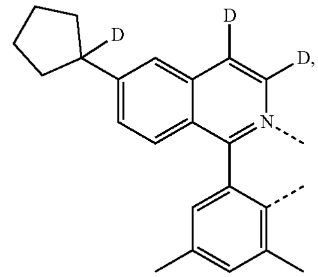
$L_{a1092}$
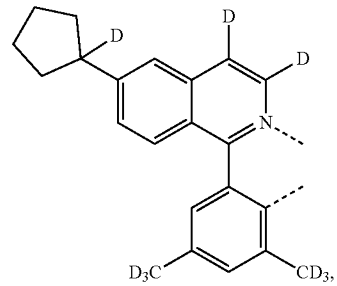
$L_{a1093}$
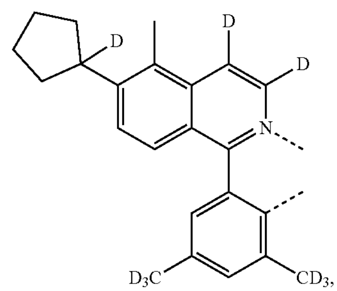
$L_{a1094}$
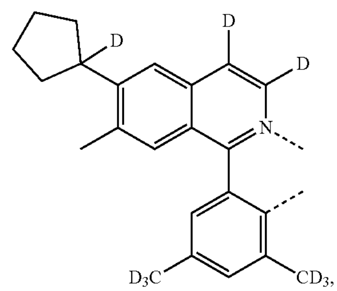
$L_{a1096}$
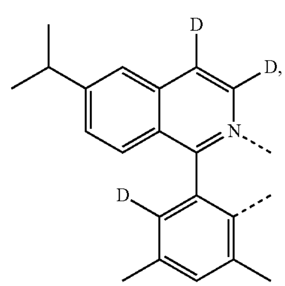

-continued
$L_{a1097}$
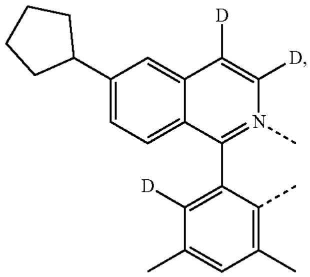
$L_{a1098}$
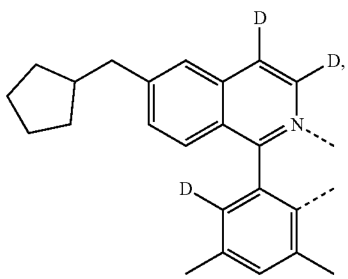
$L_{a1099}$
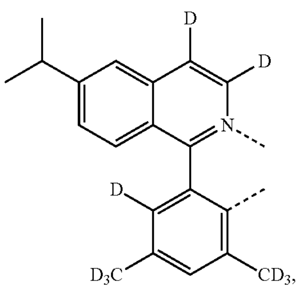
$L_{a1100}$
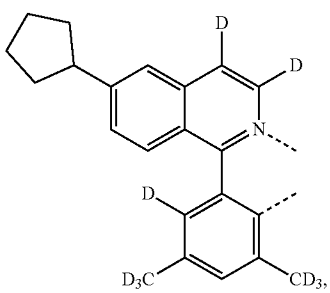
$L_{a1101}$
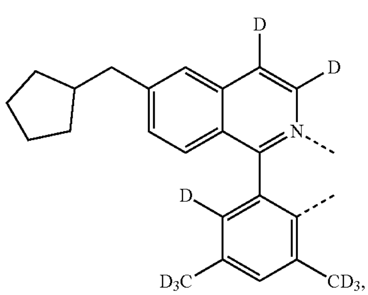
-continued
$L_{a1102}$
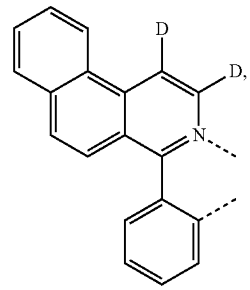
$L_{a1103}$
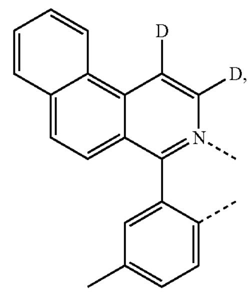
$L_{a1104}$
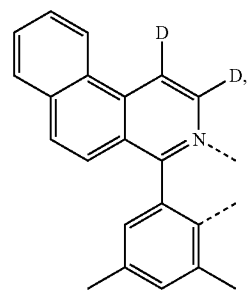
$L_{a1105}$
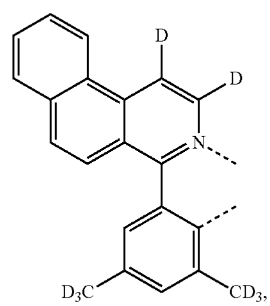
$L_{a1106}$
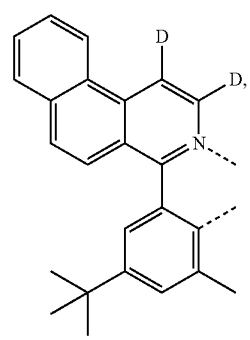

$L_{a1107}$
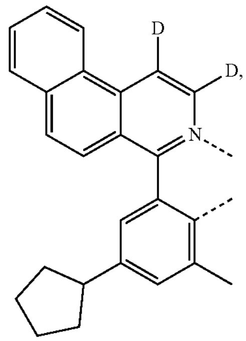
$L_{a1108}$
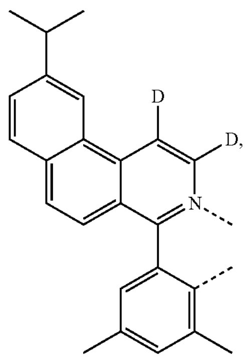
$L_{a1109}$
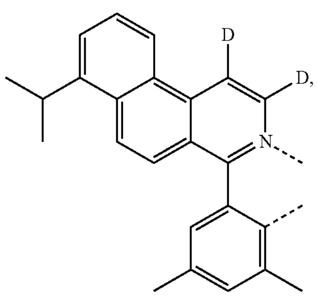
$L_{a1110}$
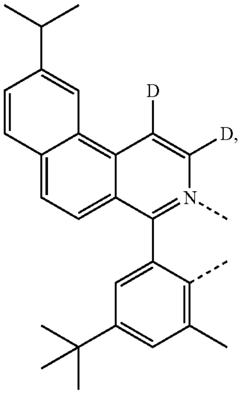
$L_{a1111}$
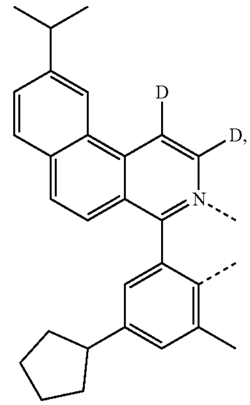
$L_{a1112}$
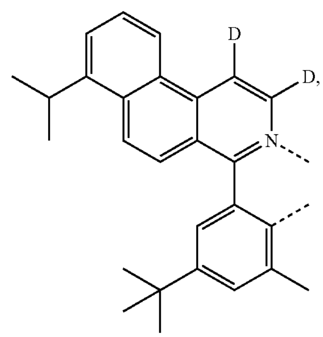
$L_{a1113}$
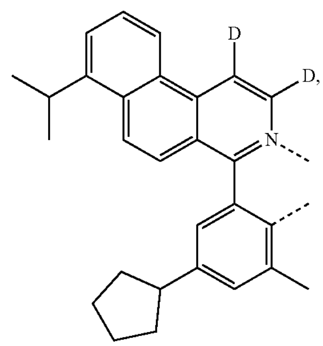
$L_{a1114}$
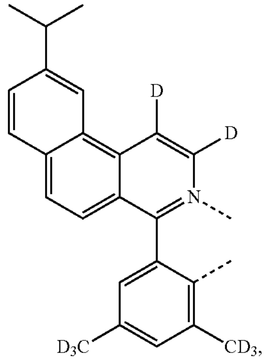

-continued
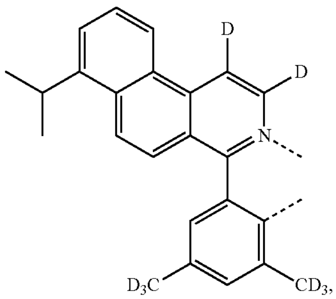
$L_{a1115}$
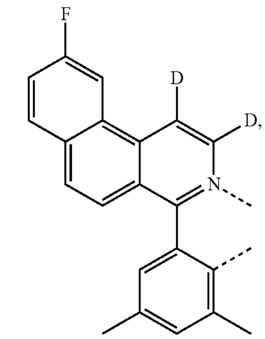
$L_{a1116}$
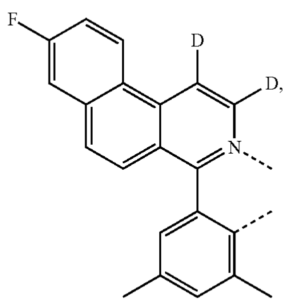
$L_{a1117}$
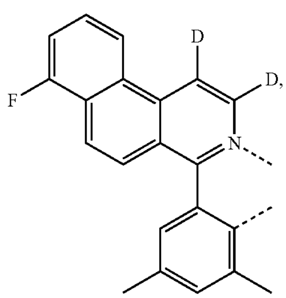
$L_{a1118}$
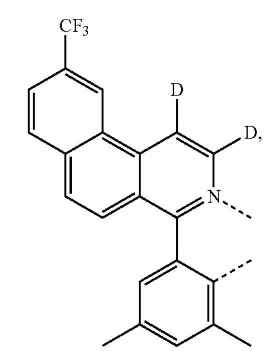
$L_{a1119}$
-continued
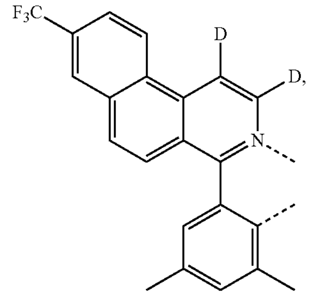
$L_{a1120}$
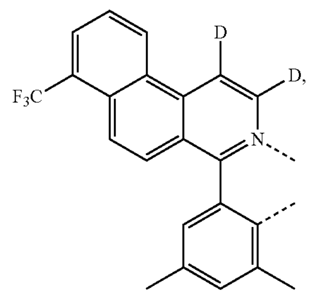
$L_{a1121}$
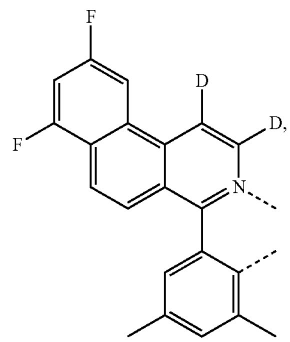
$L_{a1122}$
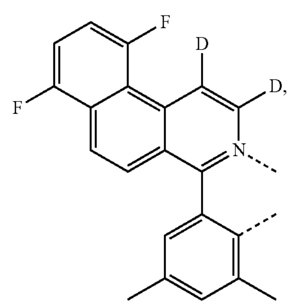
$L_{a1123}$
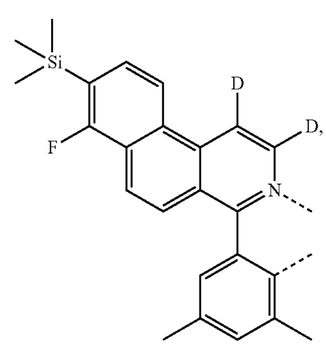
$L_{a1124}$ -continued
$L_{a1125}$
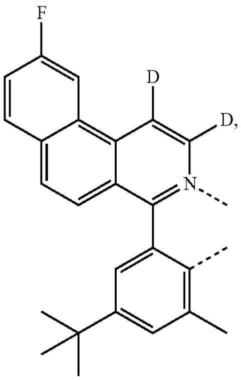
$L_{a1126}$
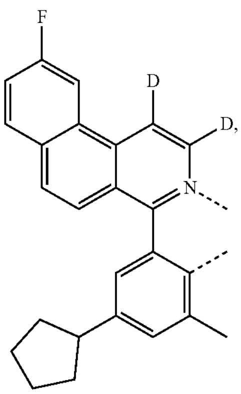
$L_{a1127}$
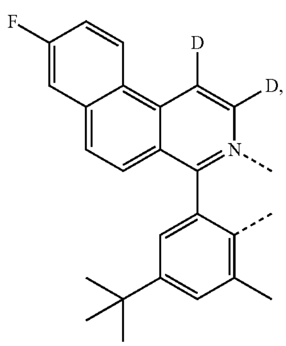
$L_{a1128}$
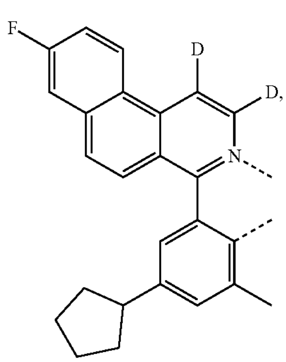
-continued
$L_{a1129}$
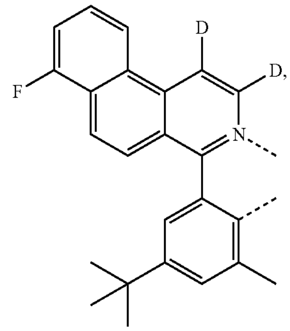
$L_{a1130}$
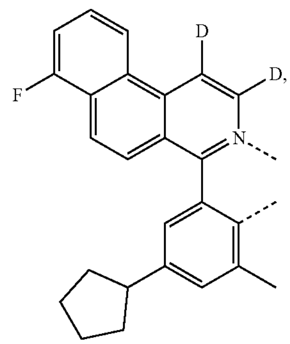
$L_{a1131}$
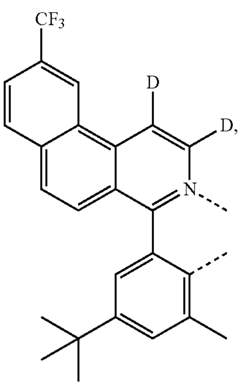
$L_{a1132}$
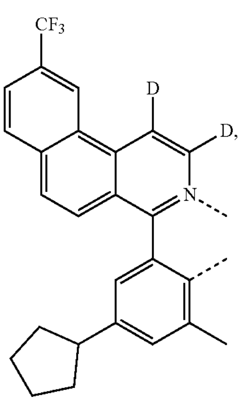

$L_{a1133}$
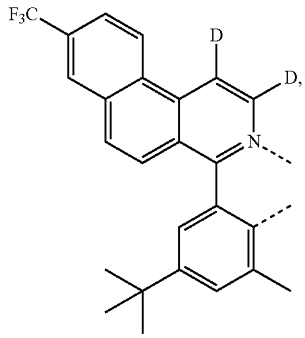
$L_{a1134}$
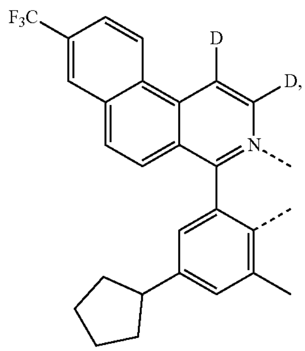
$L_{a1135}$
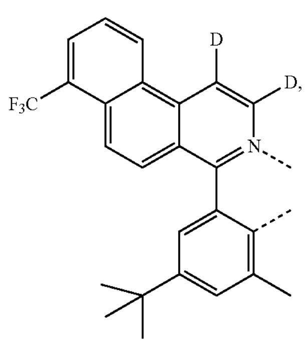
$L_{a1136}$
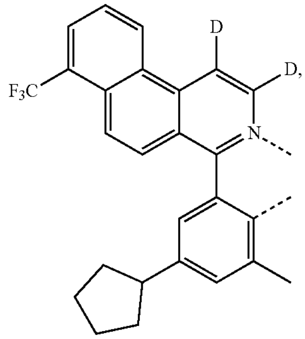
$L_{a1137}$
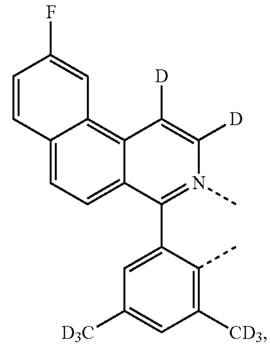
$L_{a1138}$
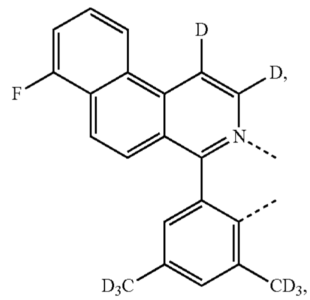
$L_{a1139}$
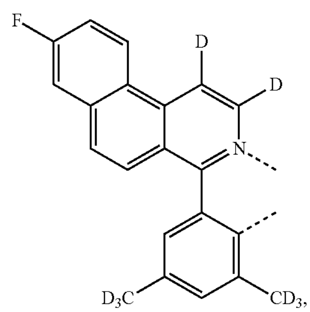
$L_{a1140}$
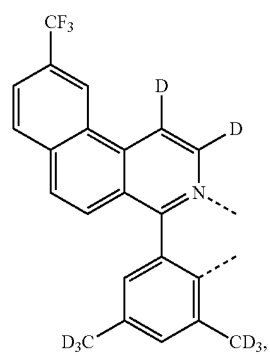
$L_{a1141}$
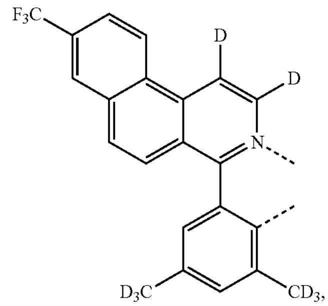

-continued
L$_{a1142}$
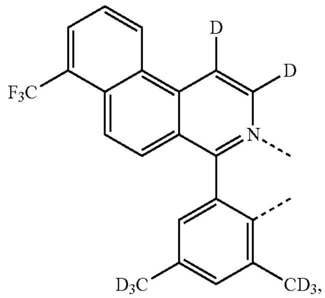
L$_{a1143}$
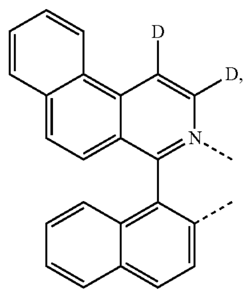
L$_{a1144}$
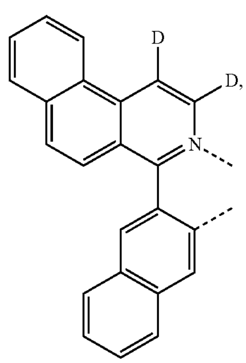
L$_{a1145}$
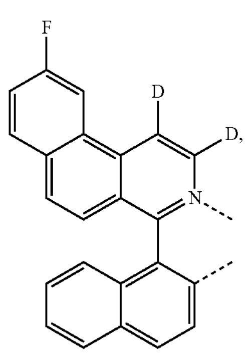
-continued
L$_{a1146}$
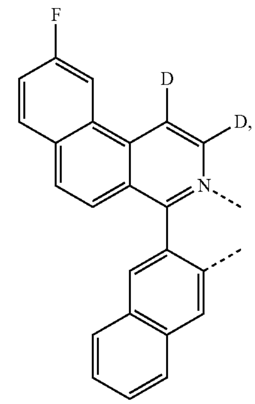
L$_{a1147}$
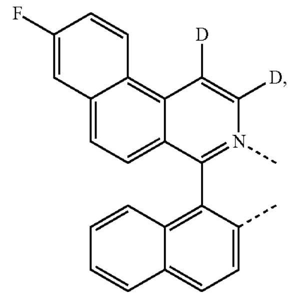
L$_{a1148}$
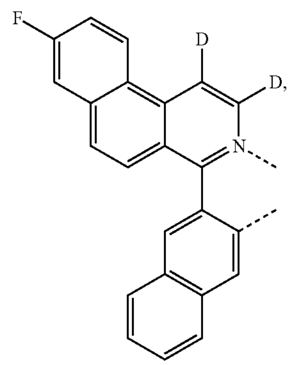
L$_{a1149}$
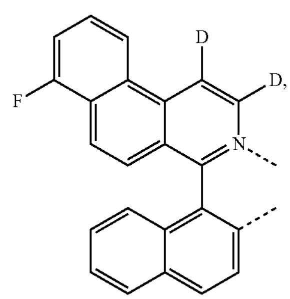

-continued
$L_{a1150}$
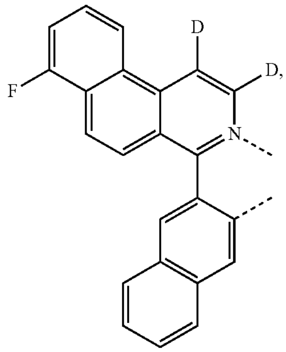
$L_{a1151}$
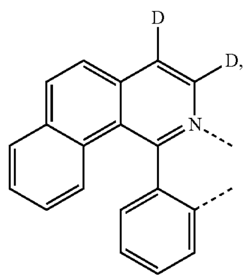
$L_{a1152}$
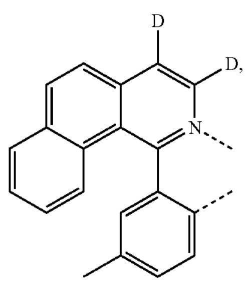
$L_{a1153}$
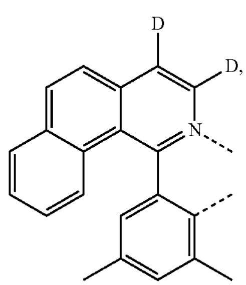
$L_{a1154}$
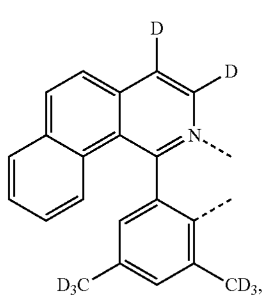
-continued
$L_{a1155}$
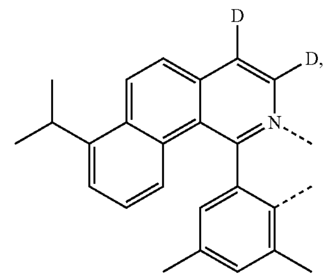
$L_{a1156}$
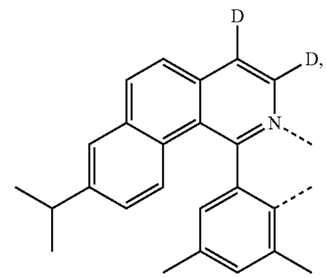
$L_{a1157}$
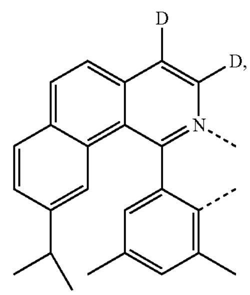
$L_{a1158}$
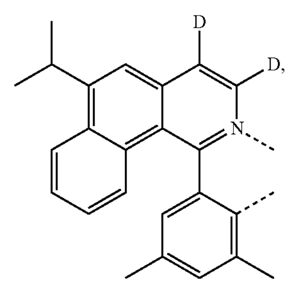
$L_{a1159}$
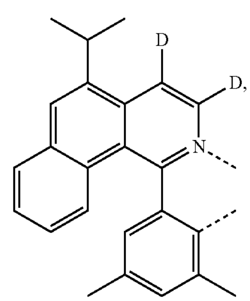

$L_{a1160}$
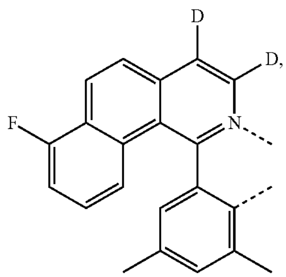
$L_{a1161}$
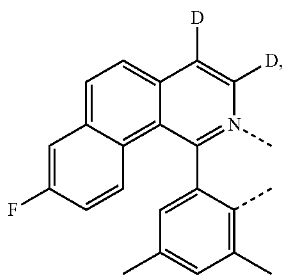
$L_{a1162}$
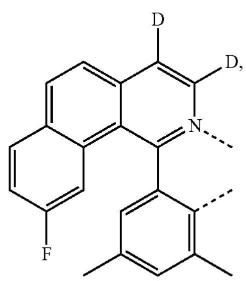
$L_{a1163}$
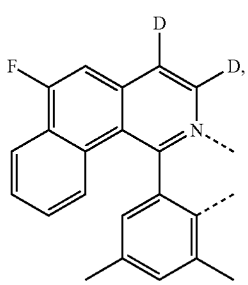
$L_{a1164}$
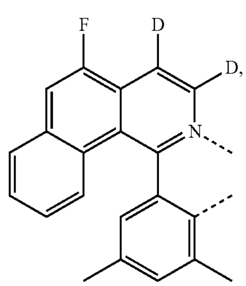
$L_{a1165}$
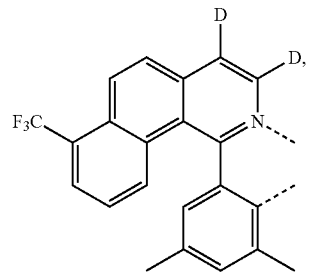
$L_{a1166}$
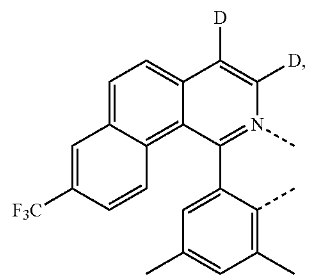
$L_{a1167}$
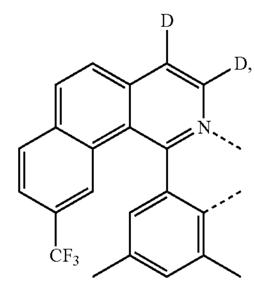
$L_{a1168}$
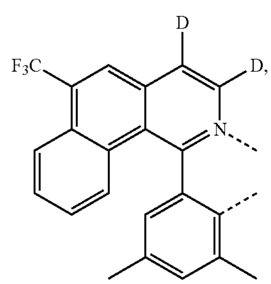
$L_{a1169}$
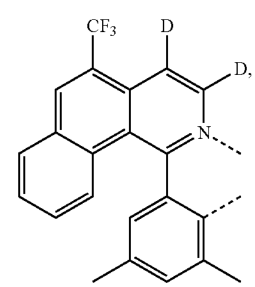

$L_{a1170}$
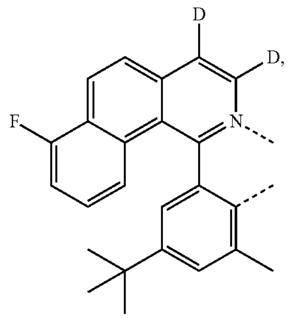
$L_{a1171}$
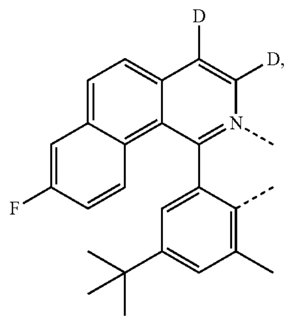
$L_{a1172}$
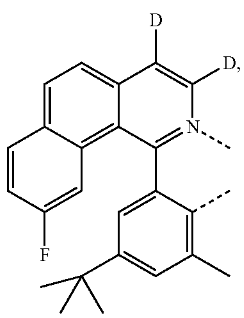
$L_{a1173}$
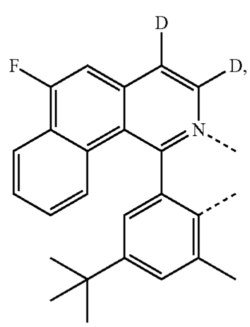
$L_{a1174}$
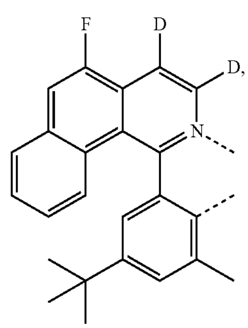
$L_{a1175}$
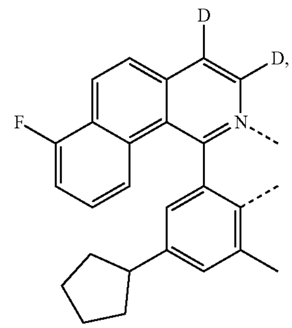
$L_{a1176}$
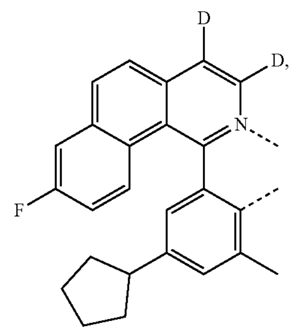
$L_{a1177}$
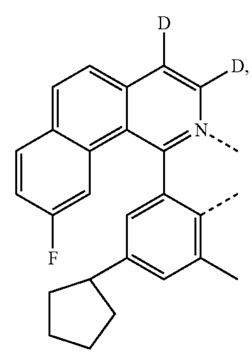
$L_{a1178}$
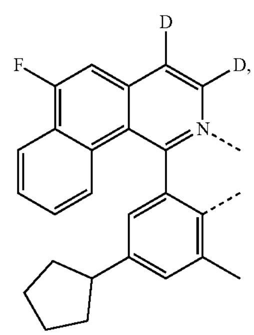

$L_{a1179}$
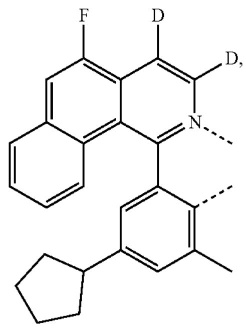
$L_{a1180}$
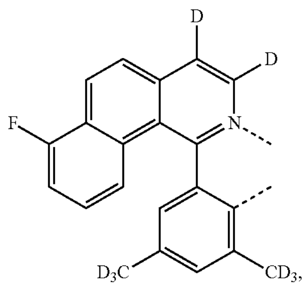
$L_{a1181}$
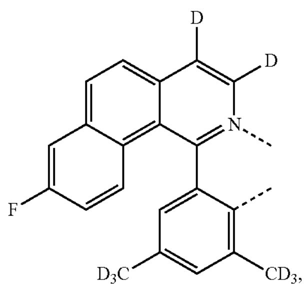
$L_{a1182}$
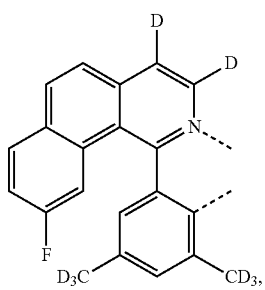
$L_{a1183}$
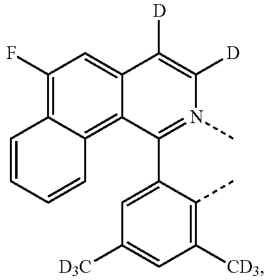
$L_{a1184}$
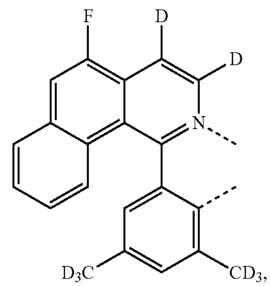
$L_{a1185}$
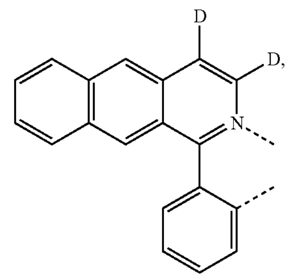
$L_{a1186}$
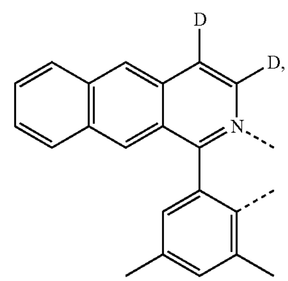
$L_{a1187}$
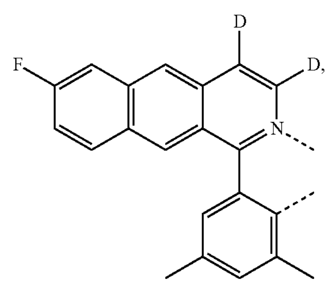
$L_{a1188}$
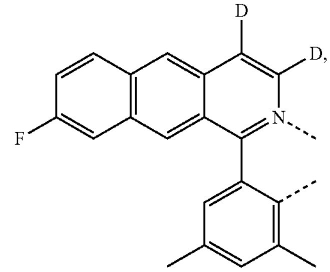
and -continued $L_{a1189}$

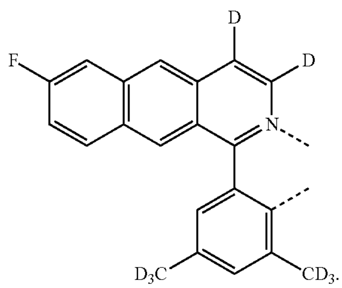

11. The metal complex according to claim 1, wherein in Formula 2, $R_t$ to $R_z$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, and combinations thereof.

12. The metal complex according to claim 10, wherein the second ligand $L_b$ is, at each occurrence identically or differently, selected from any one or two structures of the group consisting of $L_{b1}$ to $L_{b383}$:

$L_{b1}$

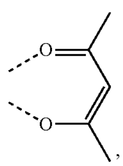

$L_{b2}$

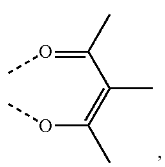

$L_{b3}$

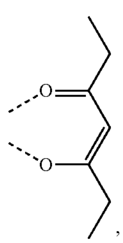

$L_{b4}$

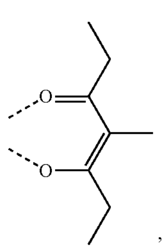

-continued $L_{b5}$

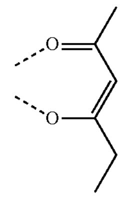

$L_{b6}$

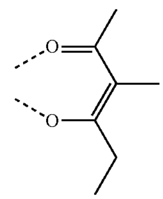

$L_{b7}$

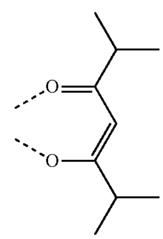

$L_{b8}$

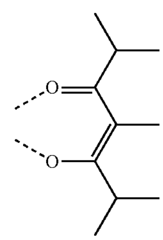

$L_{b9}$

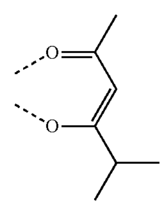

$L_{b10}$

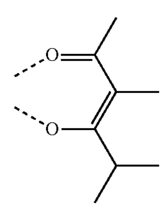

$L_{b11}$

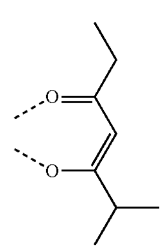

-continued
$L_{b12}$
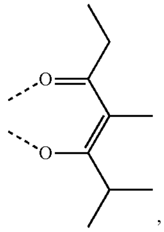
$L_{b13}$
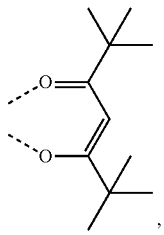
$L_{b14}$
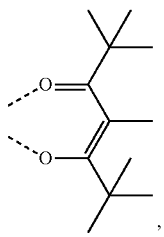
$L_{b15}$
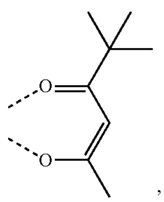
$L_{b16}$
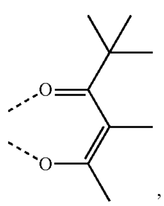
$L_{b17}$
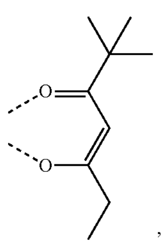
$L_{b18}$
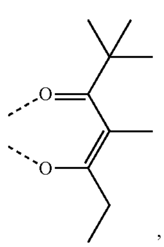
-continued
$L_{b19}$
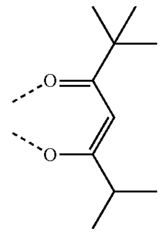
$L_{b20}$
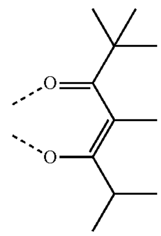
$L_{b21}$
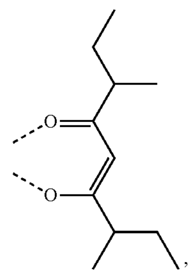
$L_{b22}$
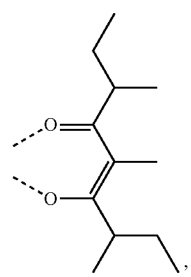
$L_{b23}$
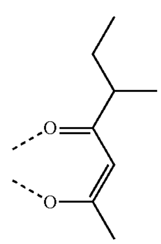
$L_{b24}$
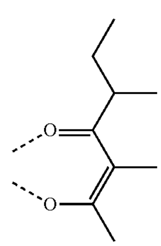

-continued
$L_{b25}$
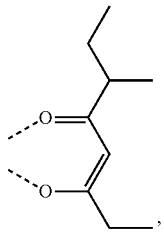
$L_{b26}$
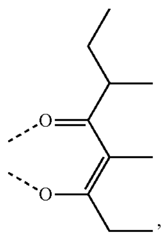
$L_{b27}$
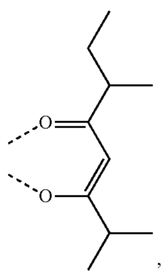
$L_{b28}$
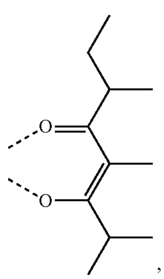
$L_{b29}$
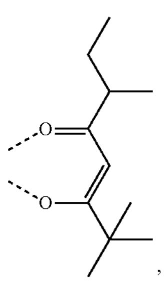
$L_{b30}$
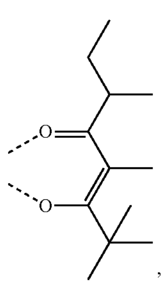
-continued
$L_{b31}$
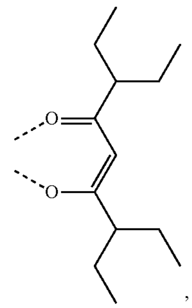
$L_{b32}$
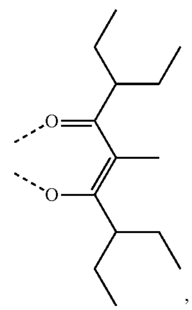
$L_{b33}$
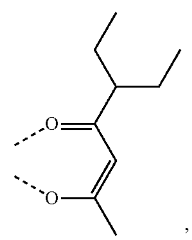
$L_{b34}$
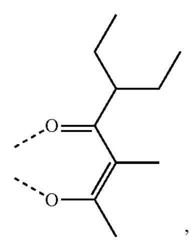
$L_{b35}$
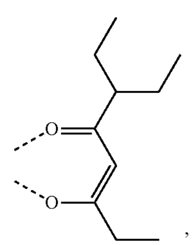
$L_{b36}$
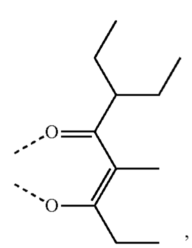

-continued
L$_{b37}$
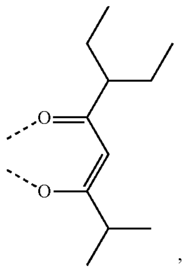
L$_{b38}$
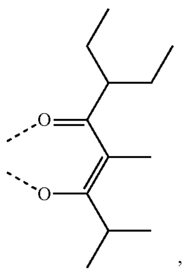
L$_{b39}$
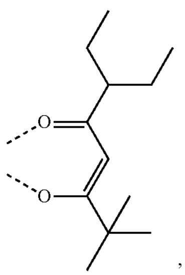
L$_{b40}$
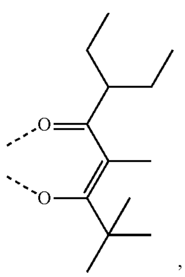
L$_{b41}$
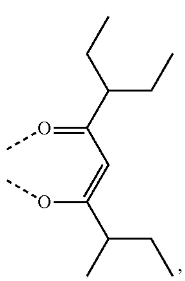
-continued
L$_{b42}$
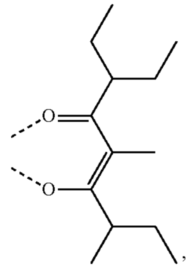
L$_{b43}$
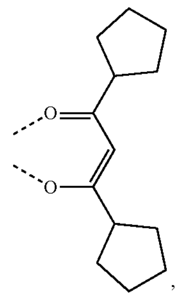
L$_{b44}$
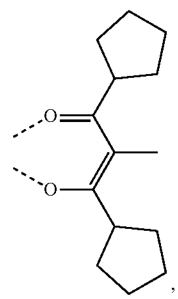
L$_{b45}$
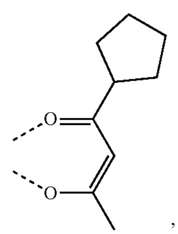
L$_{b46}$
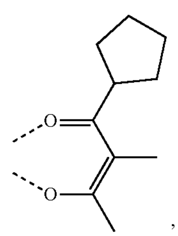
L$_{b47}$
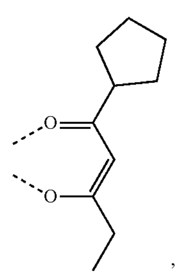

-continued
$L_{b48}$
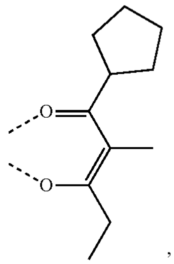
$L_{b49}$
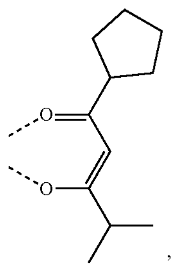
$L_{b50}$
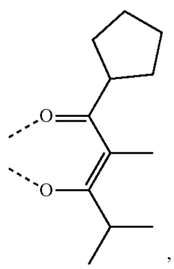
$L_{b51}$
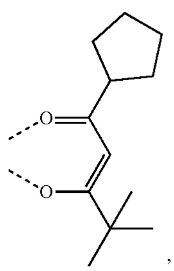
$L_{b52}$
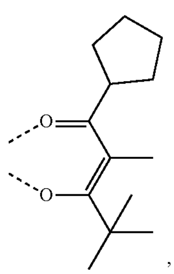
$L_{b53}$
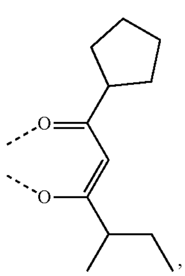
-continued
$L_{b54}$
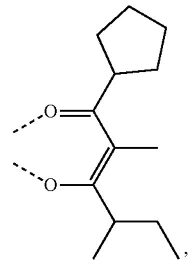
$L_{b55}$
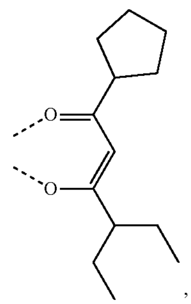
$L_{b56}$
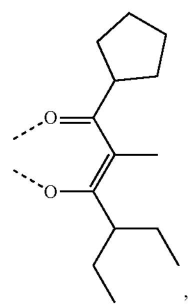
$L_{b57}$
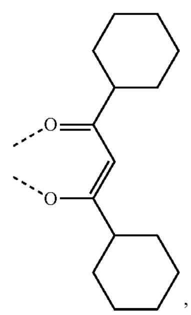
$L_{b58}$
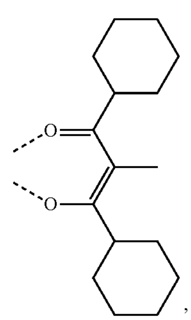

-continued
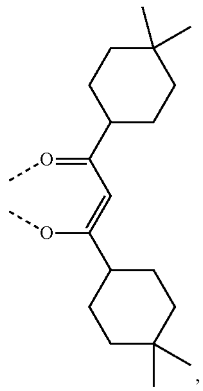
$L_{b59}$
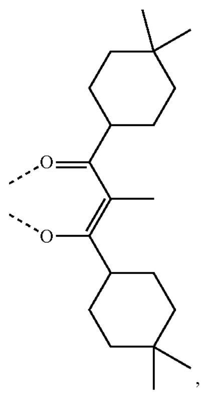
$L_{b60}$
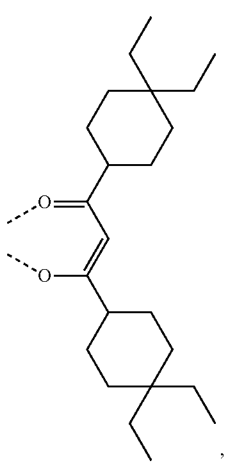
$L_{b61}$
-continued
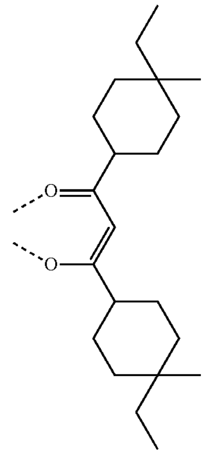
$L_{b62}$
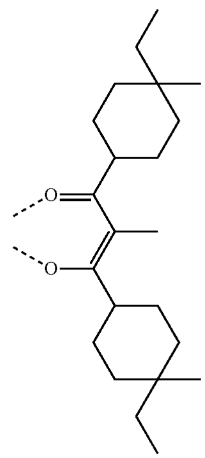
$L_{b63}$
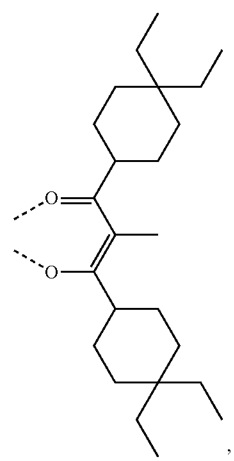
$L_{b64}$
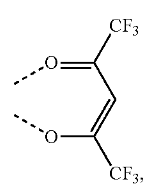
$L_{b65}$ -continued
$L_{b66}$
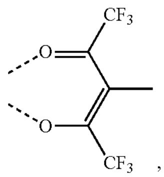
$L_{b67}$
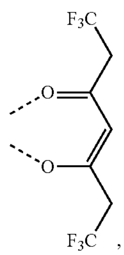
$L_{b68}$
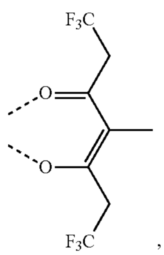
$L_{b69}$
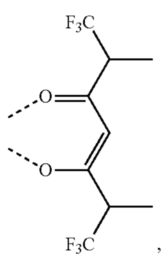
$L_{b70}$
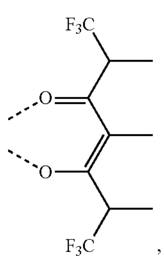
$L_{b71}$
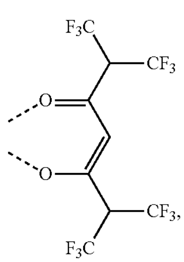
-continued
$L_{b72}$
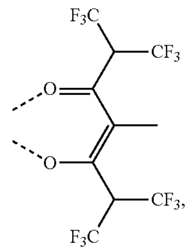
$L_{b73}$
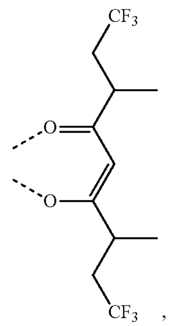
$L_{b74}$
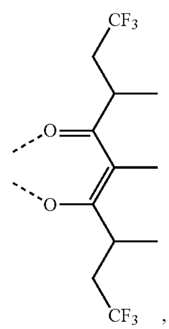
$L_{b75}$
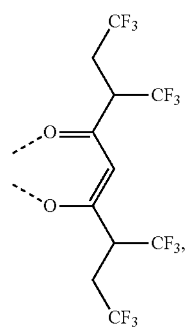
$L_{b76}$
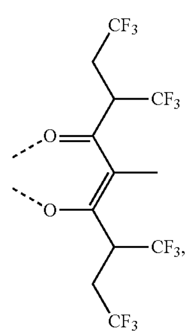

-continued
$L_{b77}$
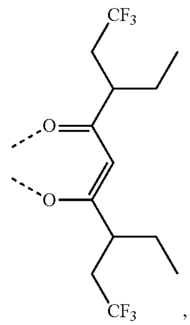
$L_{b78}$
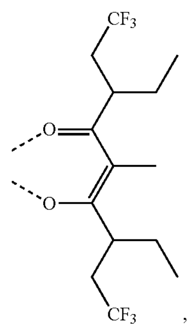
$L_{b79}$
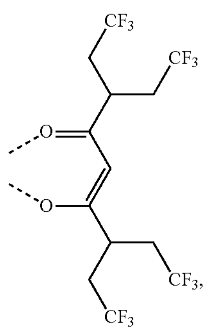
$L_{b80}$
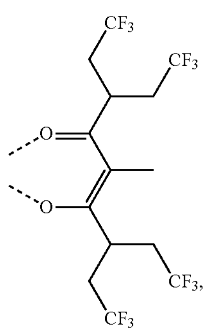
$L_{b81}$
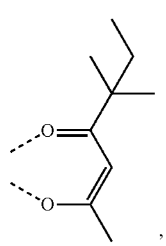
-continued
$L_{b82}$
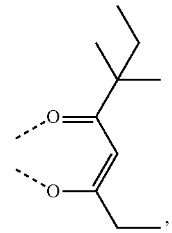
$L_{b83}$
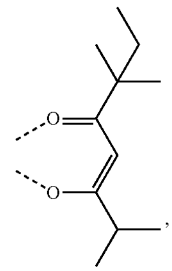
$L_{b84}$
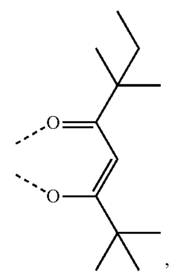
$L_{b85}$
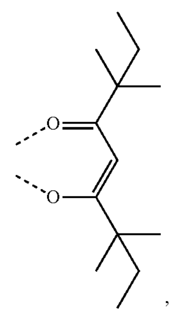
$L_{b86}$
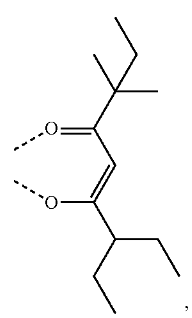

-continued
$L_{b87}$
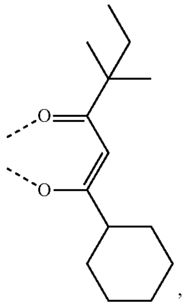
$L_{b88}$
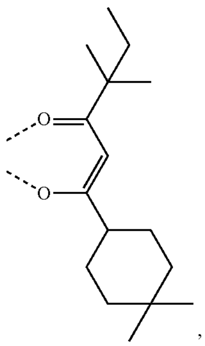
$L_{b89}$
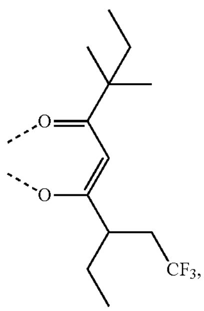
$L_{b90}$
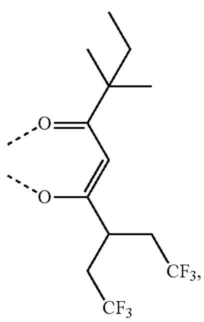
$L_{b91}$
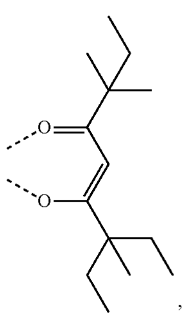
-continued
$L_{b92}$
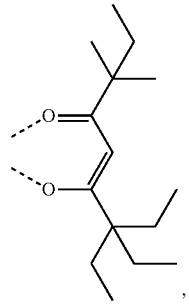
$L_{b93}$
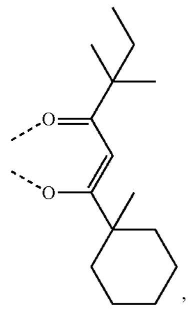
$L_{b94}$
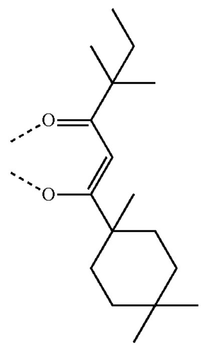
$L_{b95}$
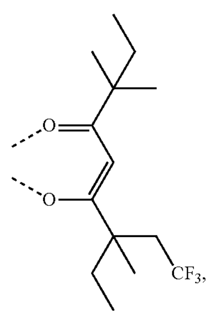
$L_{b96}$
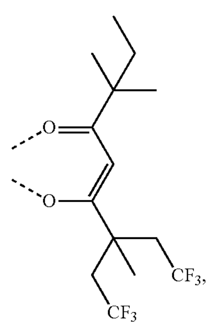

$L_{b97}$
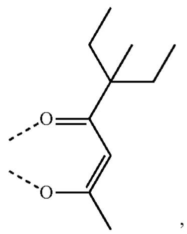
$L_{b98}$
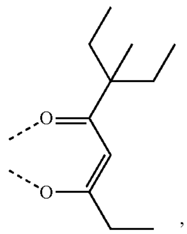
$L_{b99}$
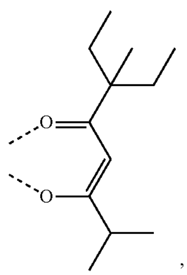
$L_{b100}$
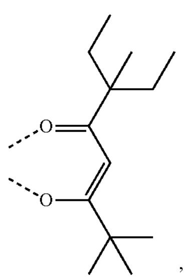
$L_{b101}$
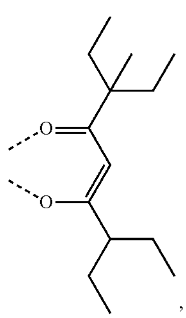
$L_{b102}$
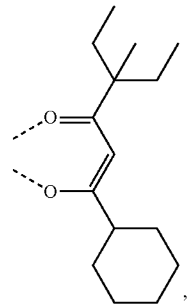
$L_{b103}$
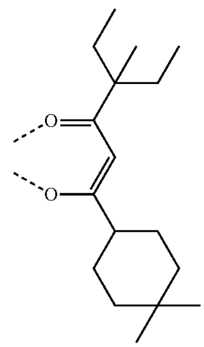
$L_{b104}$
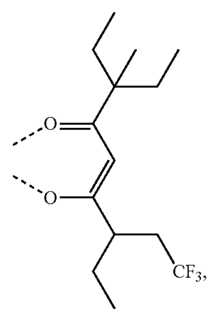
$L_{b105}$
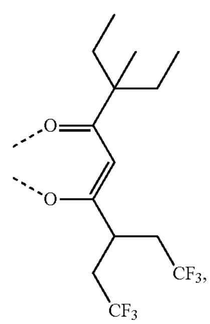
$L_{b106}$
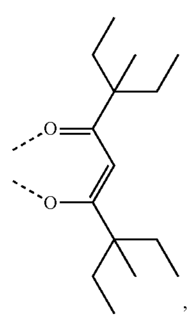

-continued
$L_{b107}$
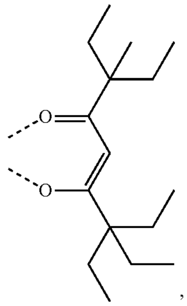
$L_{b108}$
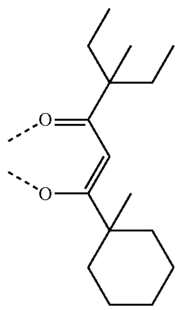
$L_{b109}$
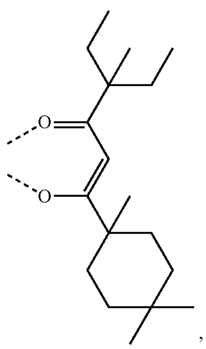
$L_{b110}$
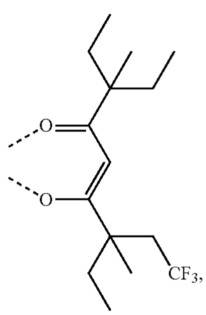
$L_{b111}$
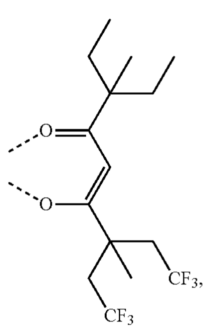
-continued
$L_{b112}$
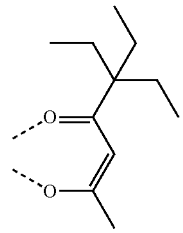
$L_{b113}$
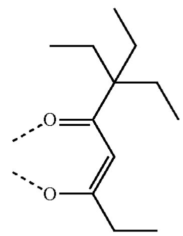
$L_{b114}$
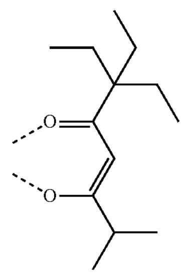
$L_{b115}$
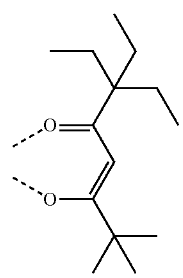
$L_{b116}$
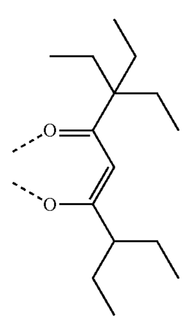

-continued
$L_{b117}$
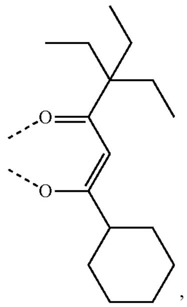
$L_{b118}$
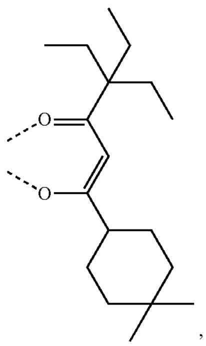
$L_{b119}$
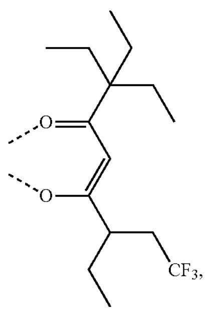
$L_{b120}$
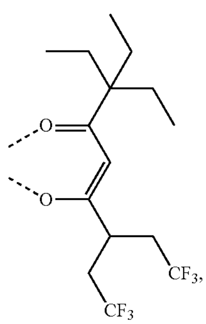
$L_{b121}$
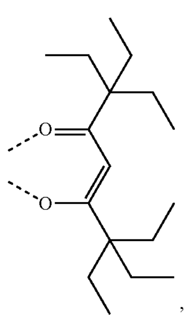
-continued
$L_{b122}$
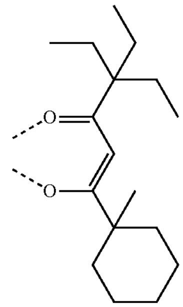
$L_{b123}$
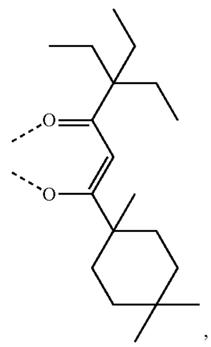
$L_{b124}$
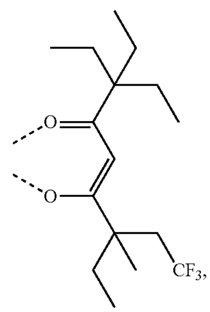
$L_{b125}$
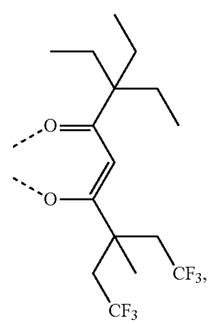
$L_{b126}$
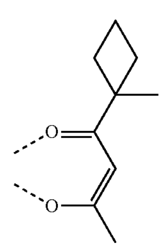

-continued
$L_{b127}$
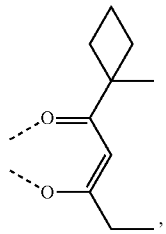
$L_{b128}$
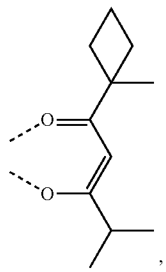
$L_{b129}$
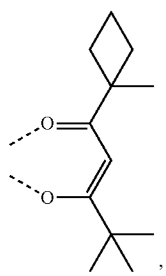
$L_{b130}$
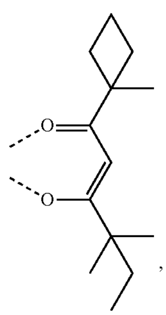
$L_{b131}$
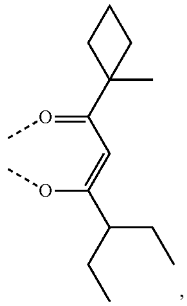
-continued
$L_{b132}$
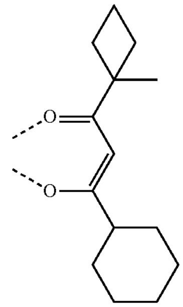
$L_{b133}$
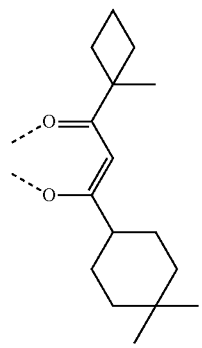
$L_{b134}$
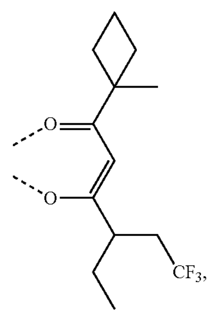
$L_{b135}$
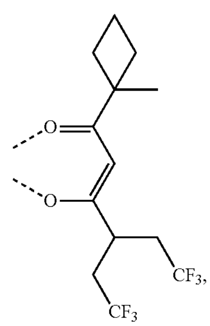
$L_{b136}$
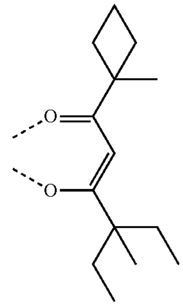

-continued
$L_{b137}$
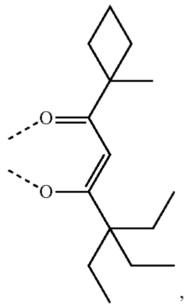
$L_{b138}$
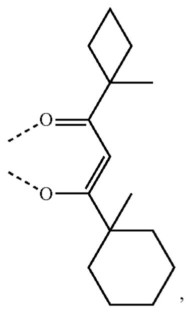
$L_{b139}$
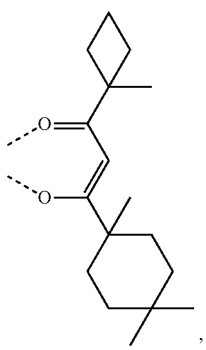
$L_{b140}$
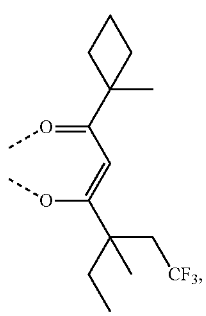
$L_{b141}$
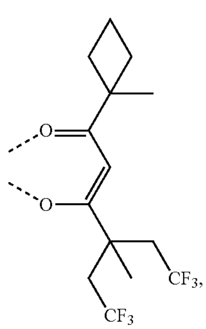
-continued
$L_{b142}$
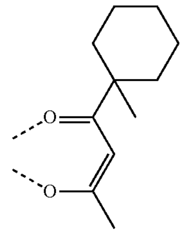
$L_{b143}$
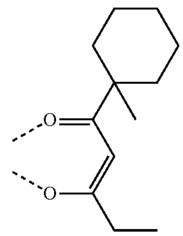
$L_{b144}$
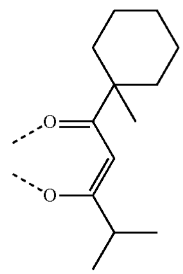
$L_{b145}$
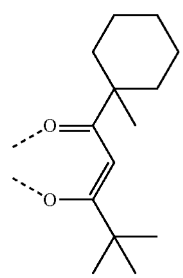
$L_{b146}$
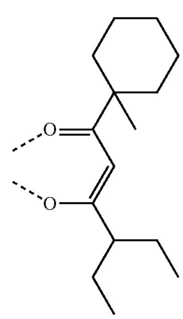

-continued
$L_{b147}$
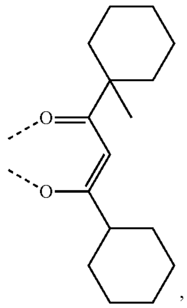
$L_{b148}$
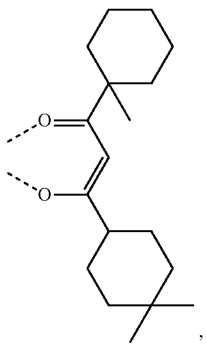
$L_{b149}$
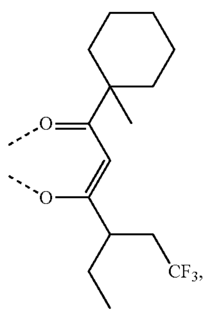
$L_{b150}$
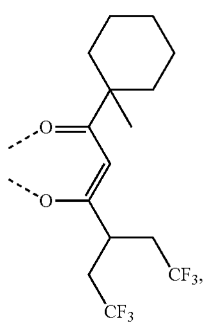
$L_{b151}$
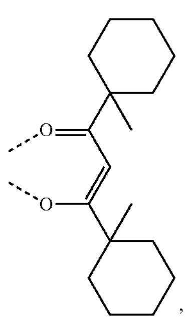
-continued
$L_{b152}$
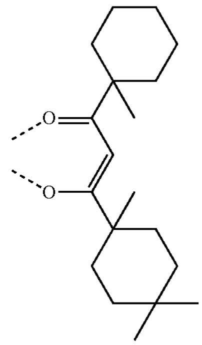
$L_{b153}$
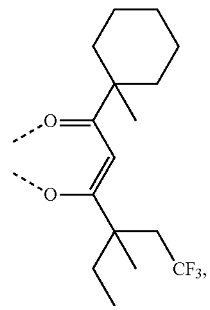
$L_{b154}$
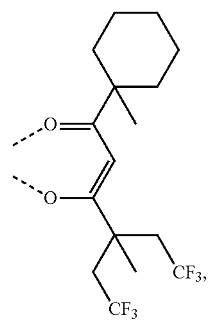
$L_{b155}$
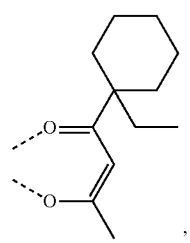
$L_{b156}$
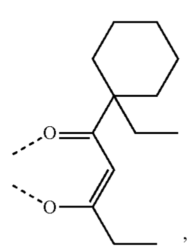

-continued
$L_{b157}$
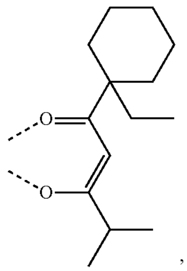
$L_{b158}$
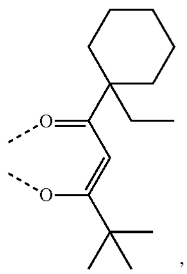
$L_{b159}$
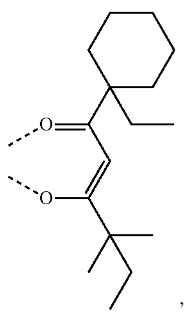
$L_{b160}$
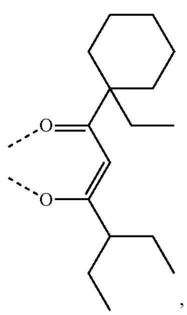
$L_{b161}$
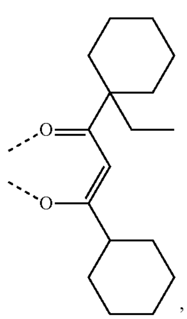
-continued
$L_{b162}$
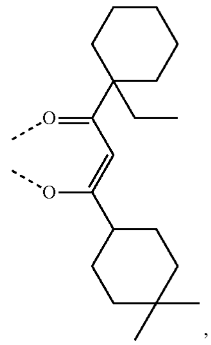
$L_{b163}$
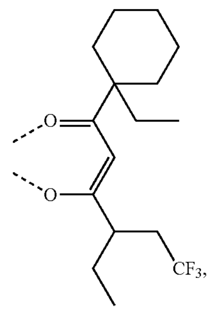
$L_{b164}$
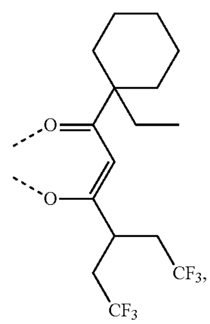
$L_{b165}$
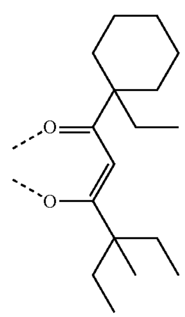
$L_{b166}$
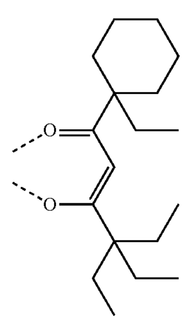

-continued
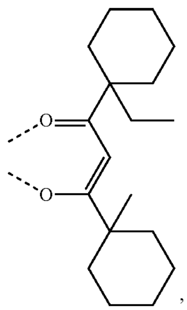
$L_{b167}$
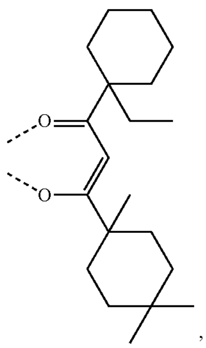
$L_{b168}$
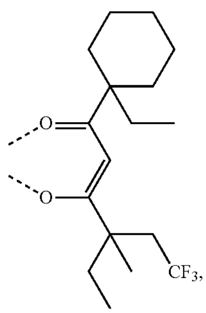
$L_{b169}$
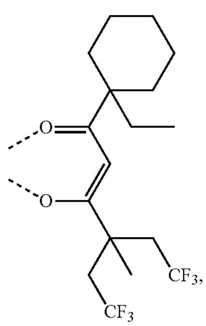
$L_{b170}$
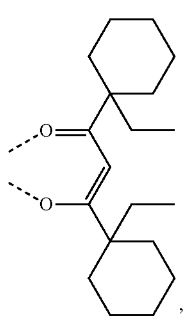
$L_{b171}$
-continued
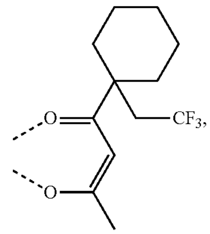
$L_{b172}$
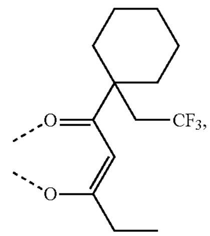
$L_{b173}$
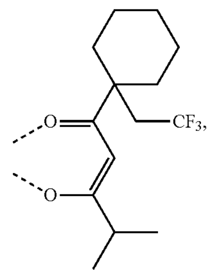
$L_{b174}$
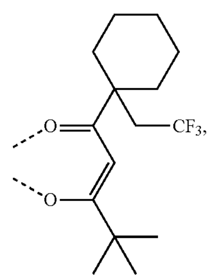
$L_{b175}$
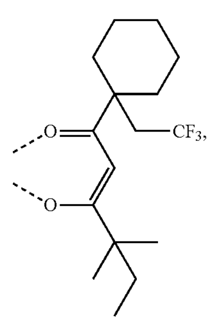
$L_{b176}$ -continued
$L_{b177}$
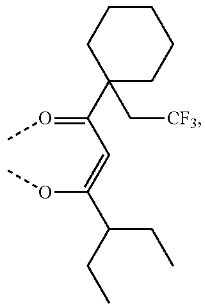
$L_{b178}$
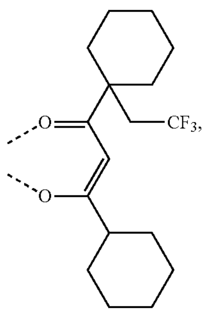
$L_{b179}$
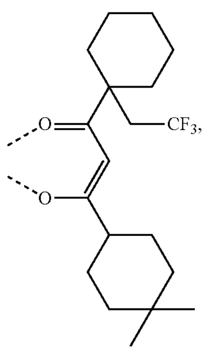
$L_{b180}$
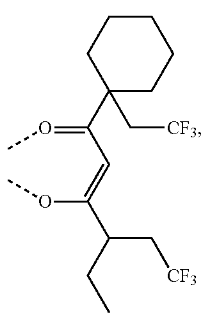
$L_{b181}$
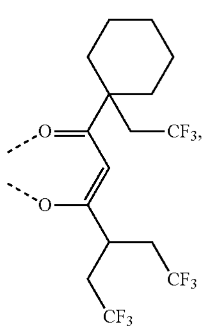
-continued
$L_{b182}$
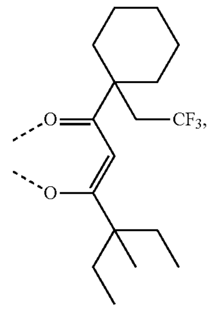
$L_{b183}$
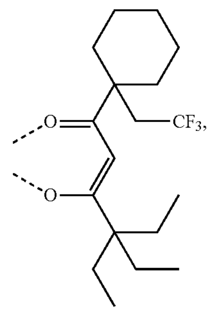
$L_{b184}$
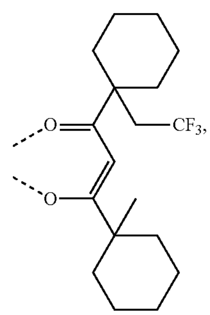
$L_{b185}$
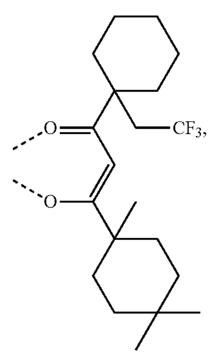
$L_{b186}$
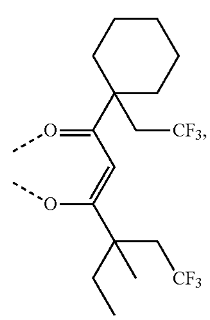

-continued
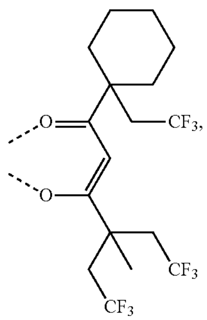
$L_{b187}$
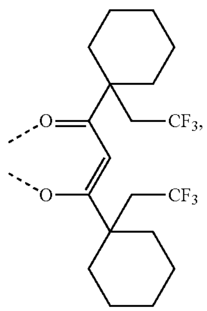
$L_{b188}$
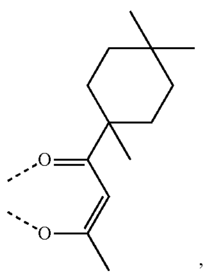
$L_{b189}$
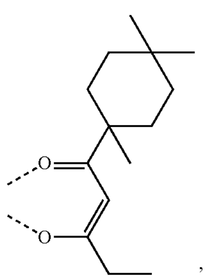
$L_{b190}$
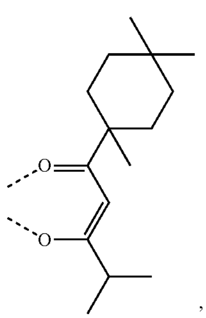
$L_{b191}$
-continued
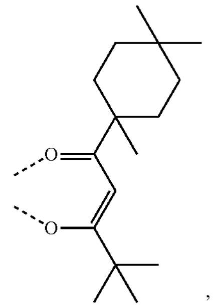
$L_{b192}$
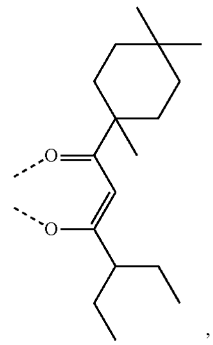
$L_{b193}$
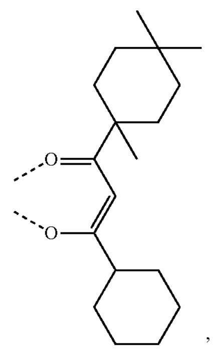
$L_{b194}$
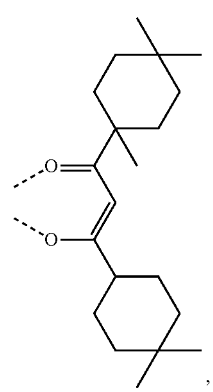
$L_{b195}$ -continued
$L_{b196}$
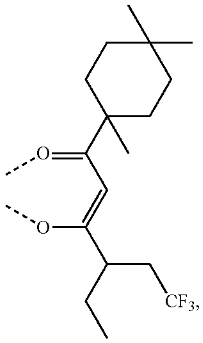
$L_{b197}$
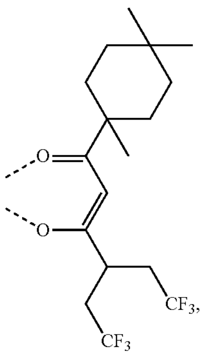
$L_{b198}$
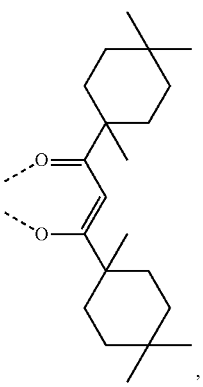
$L_{b199}$
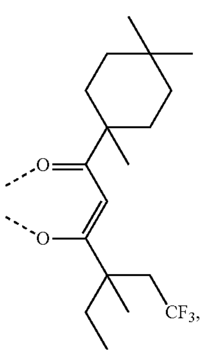
-continued
$L_{b200}$
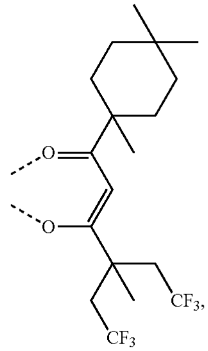
$L_{b201}$
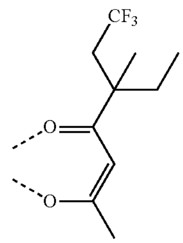
$L_{b202}$
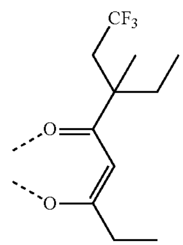
$L_{b203}$
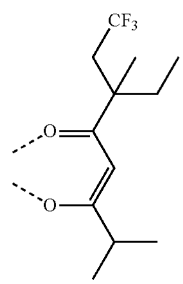
$L_{b204}$
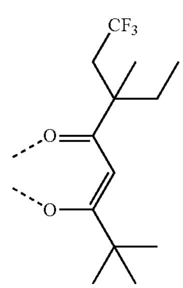

$L_{b205}$
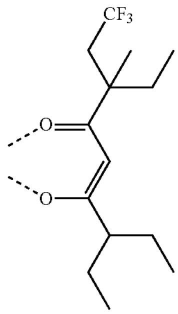
,
$L_{b206}$
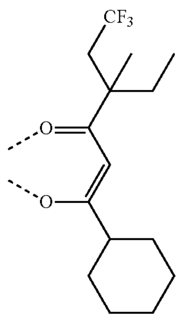
,
$L_{b207}$
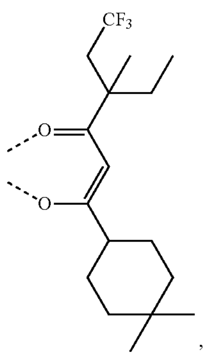
,
$L_{b208}$
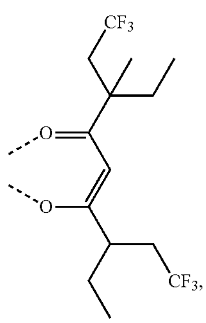
$L_{b209}$
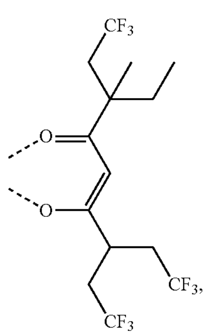
$L_{b210}$
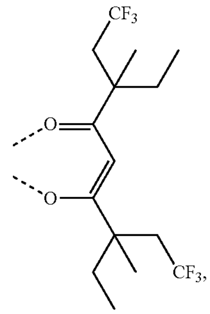
$L_{b211}$
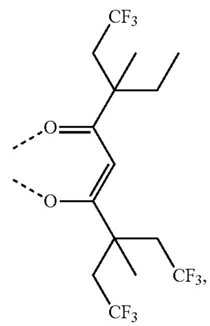
$L_{b212}$
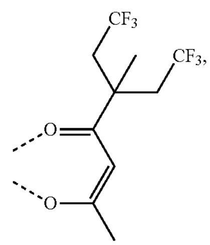
$L_{b213}$
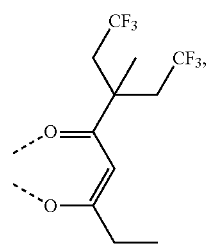
$L_{b214}$
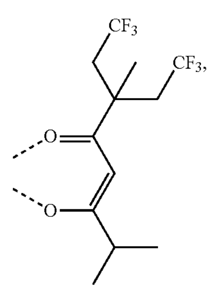

-continued
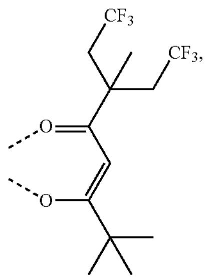
$L_{b215}$
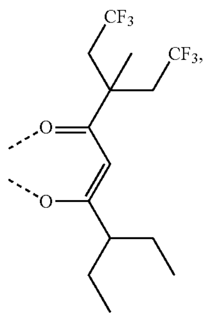
$L_{b216}$
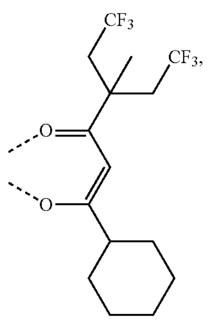
$L_{b217}$
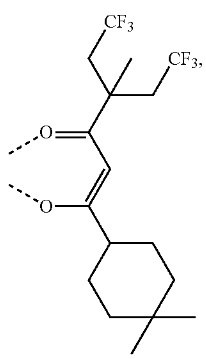
$L_{b218}$
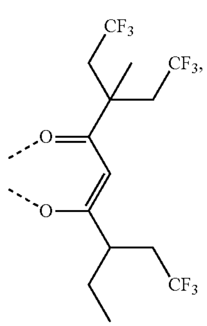
$L_{b219}$
-continued
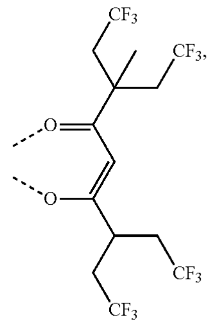
$L_{b220}$
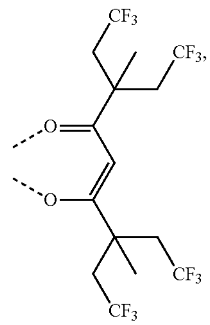
$L_{b221}$
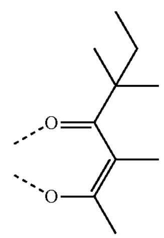
$L_{b222}$
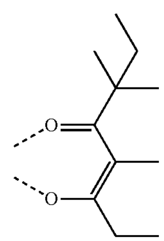
$L_{b223}$
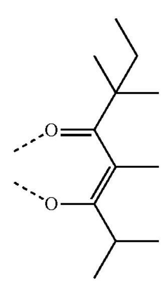
$L_{b224}$ -continued
$L_{b225}$
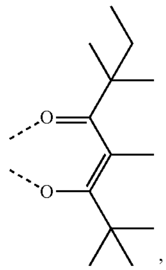
$L_{b226}$
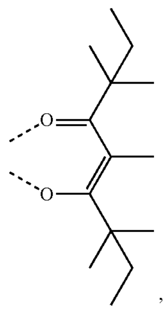
$L_{b227}$
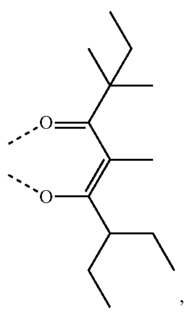
$L_{b228}$
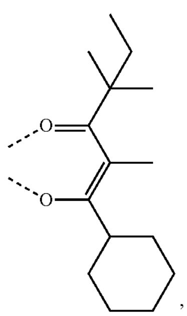
$L_{b229}$
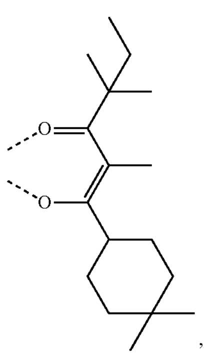
-continued
$L_{b230}$
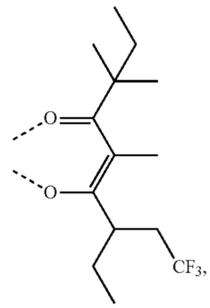
$L_{b231}$
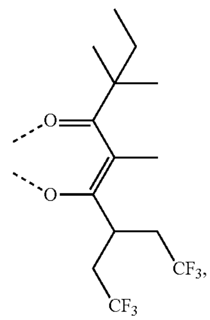
$L_{b232}$
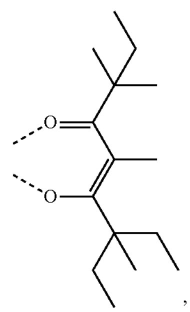
$L_{b233}$
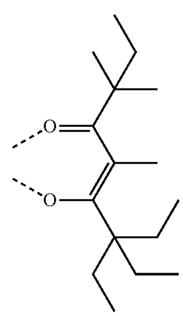
$L_{b234}$
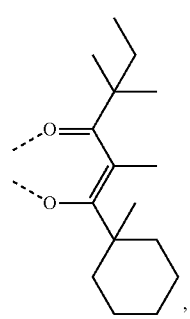

-continued
$L_{b235}$
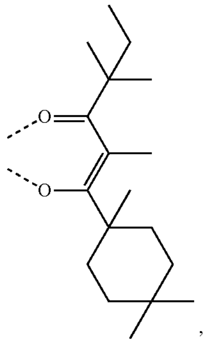
$L_{b236}$
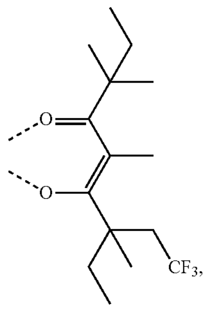
$L_{b237}$
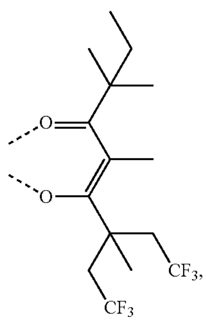
$L_{b238}$
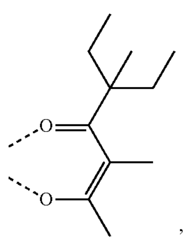
$L_{b239}$
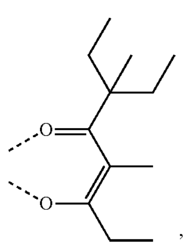
-continued
$L_{b240}$
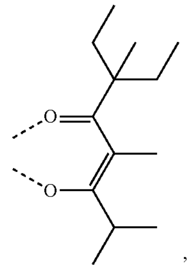
$L_{b241}$
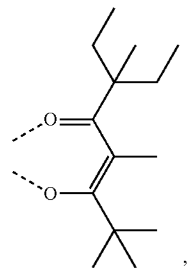
$L_{b242}$
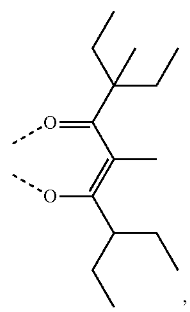
$L_{b243}$
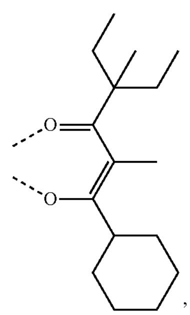
$L_{b244}$
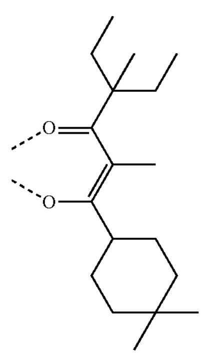

-continued
$L_{b245}$
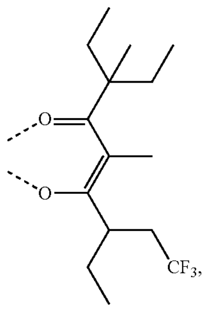
$L_{b246}$
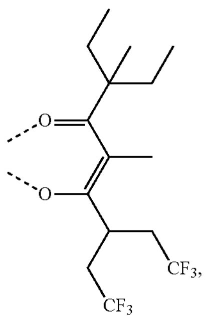
$L_{b247}$
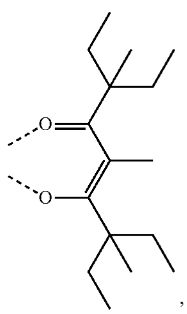
$L_{b248}$
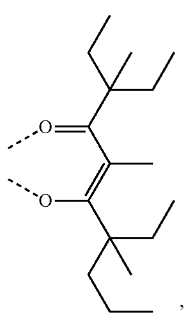
$L_{b249}$
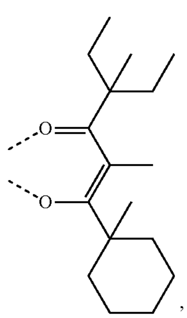
-continued
$L_{b250}$
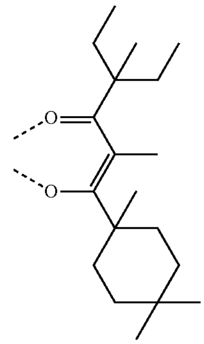
$L_{b251}$
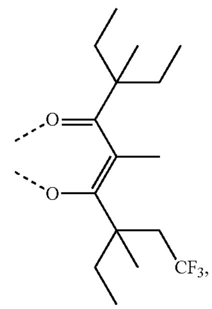
$L_{b252}$
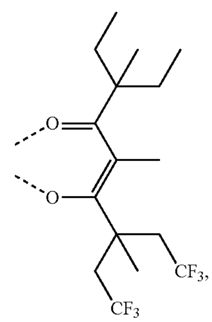
$L_{b253}$
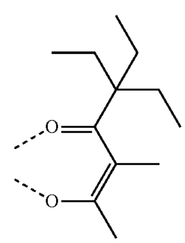
$L_{b254}$
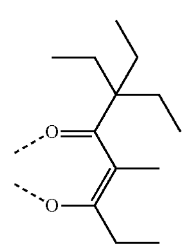

-continued
$L_{b255}$
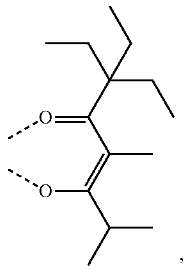
$L_{b256}$
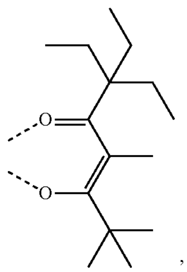
$L_{b257}$
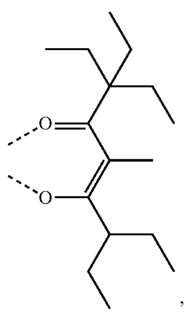
$L_{b258}$
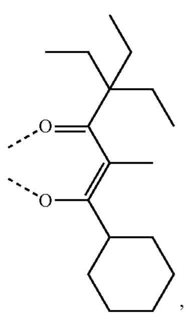
$L_{b259}$
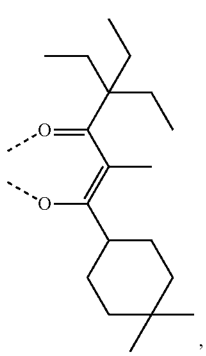
-continued
$L_{b260}$
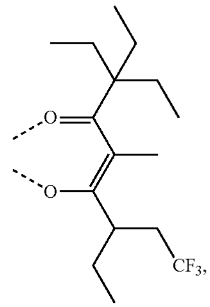
$L_{b261}$
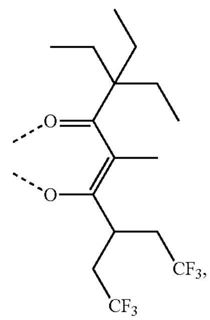
$L_{b262}$
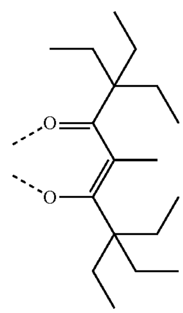
$L_{b263}$
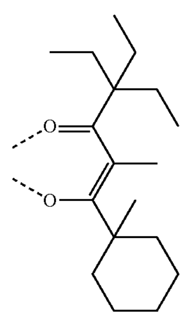
$L_{b264}$
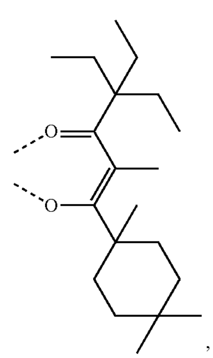

-continued
$L_{b265}$
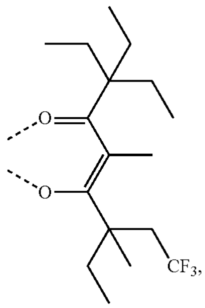
$L_{b266}$
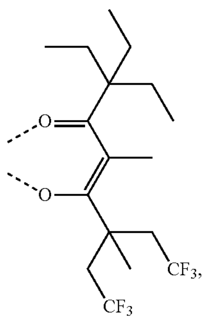
$L_{b267}$
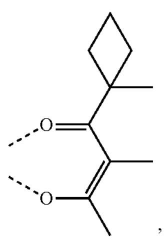
$L_{b268}$
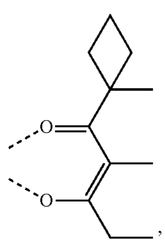
$L_{b269}$
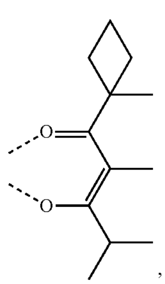
-continued
$L_{b270}$
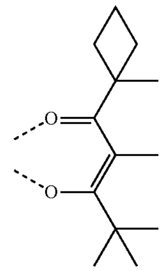
$L_{b271}$
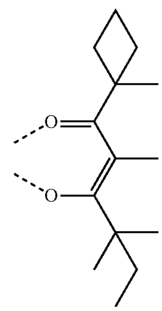
$L_{b272}$
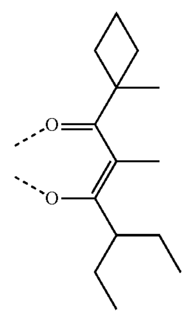
$L_{b273}$
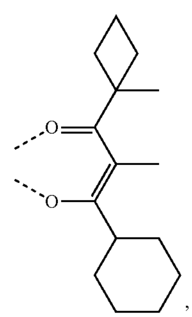
$L_{b274}$
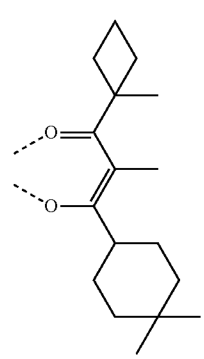

-continued
$L_{b275}$
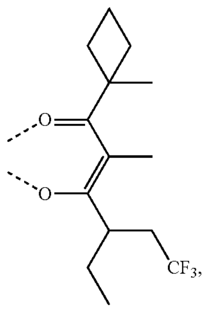
$L_{b276}$
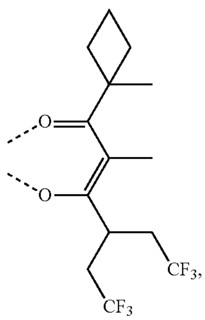
$L_{b277}$
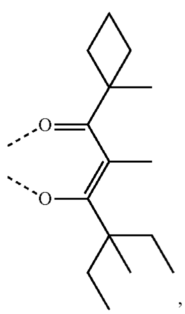
$L_{b278}$
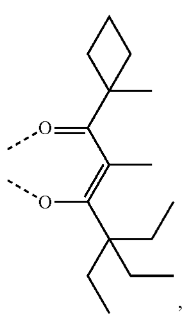
$L_{b279}$
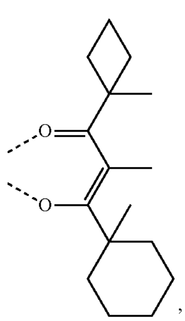
-continued
$L_{b280}$
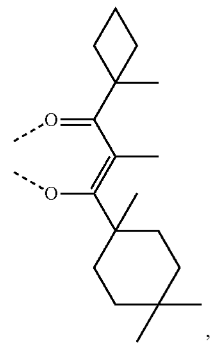
$L_{b281}$
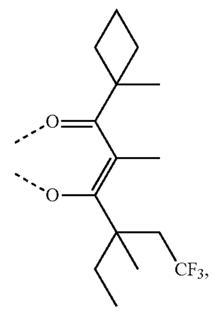
$L_{b282}$
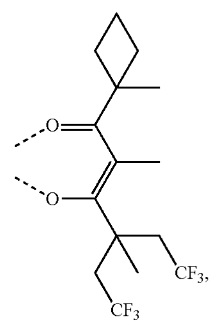
$L_{b283}$
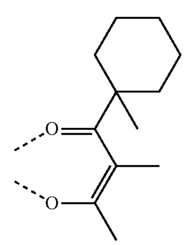
$L_{b284}$
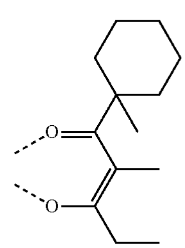

-continued
$L_{b285}$
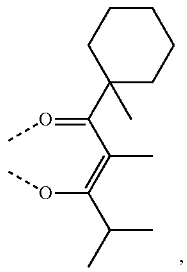
$L_{b286}$
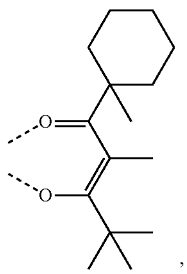
$L_{b287}$
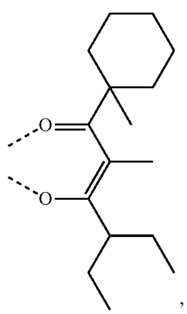
$L_{b288}$
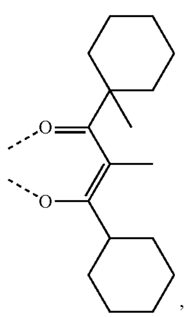
$L_{b289}$
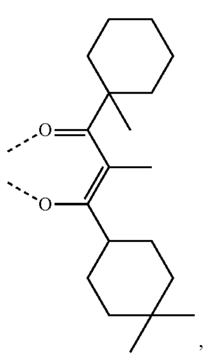
-continued
$L_{b290}$
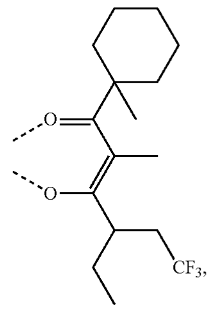
$L_{b291}$
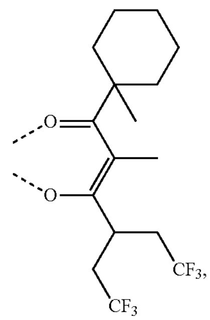
$L_{b292}$
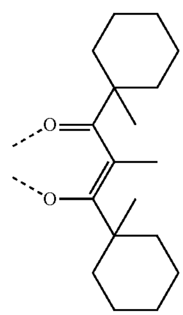
$L_{b293}$
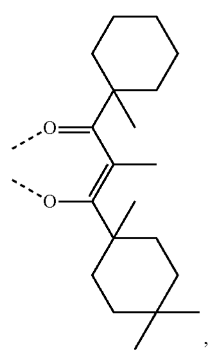
$L_{b294}$
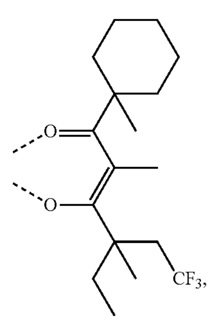

-continued
$L_{b295}$
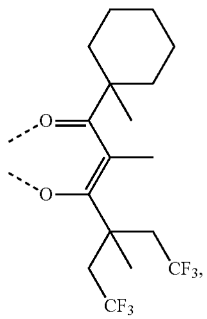
$L_{b296}$
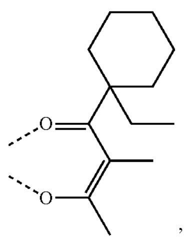
$L_{b297}$
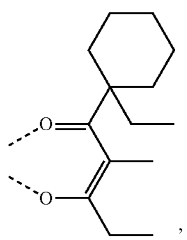
$L_{b298}$
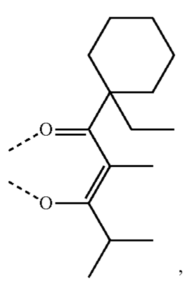
$L_{b299}$
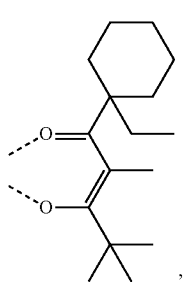
-continued
$L_{b300}$
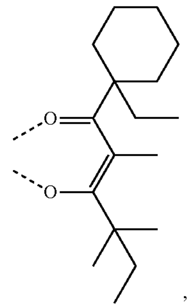
$L_{b301}$
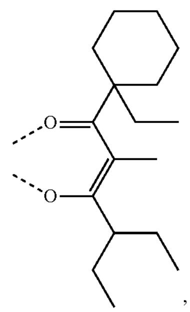
$L_{b302}$
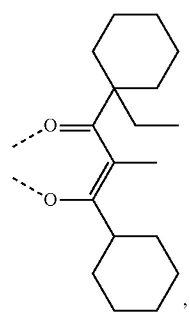
$L_{b303}$
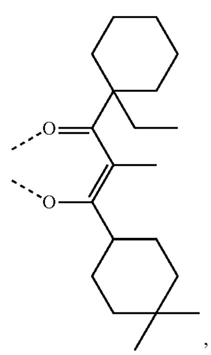
$L_{b304}$
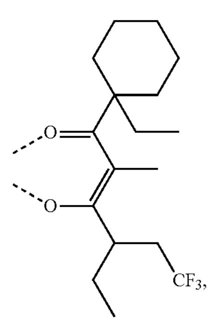

-continued
$L_{b305}$
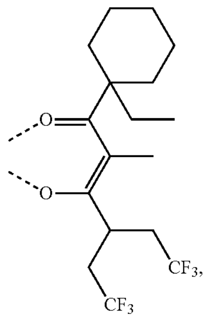
$L_{b306}$
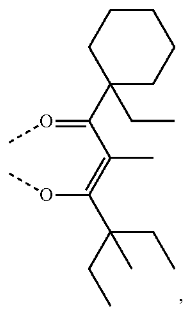
$L_{b307}$
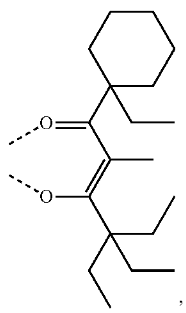
$L_{b308}$
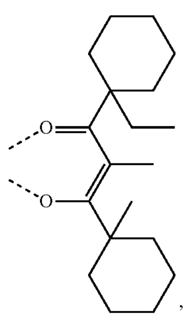
$L_{b309}$
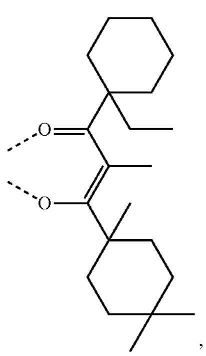
-continued
$L_{b310}$
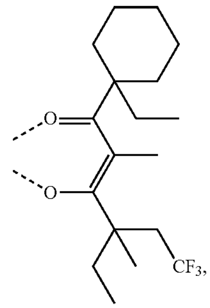
$L_{b311}$
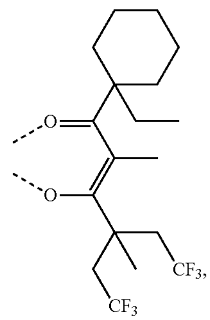
$L_{b312}$
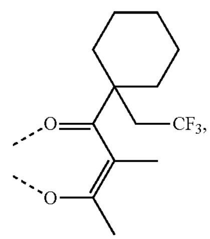
$L_{b313}$
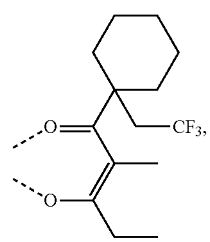
$L_{b314}$
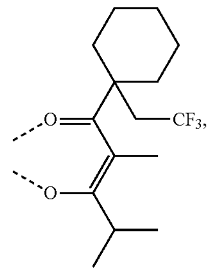

-continued
$L_{b315}$
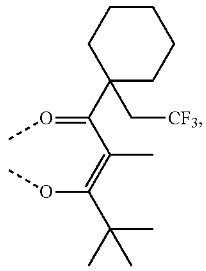
$L_{b316}$
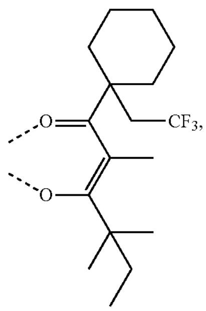
$L_{b317}$
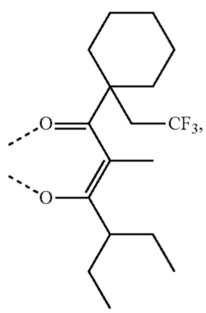
$L_{b318}$
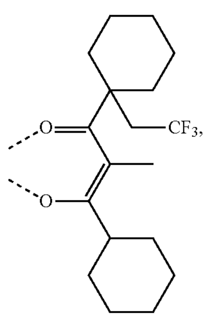
$L_{b319}$
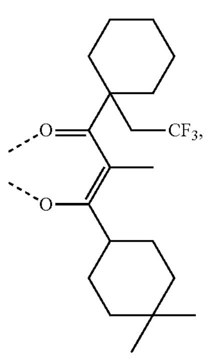
-continued
$L_{b320}$
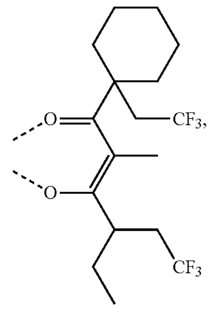
$L_{b321}$
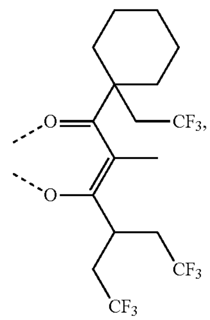
$L_{b322}$
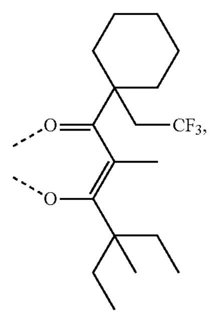
$L_{b323}$
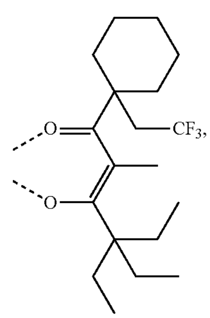
$L_{b324}$
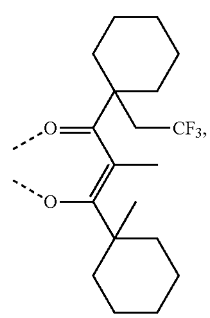

$L_{b325}$
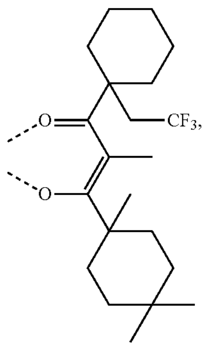
$L_{b326}$
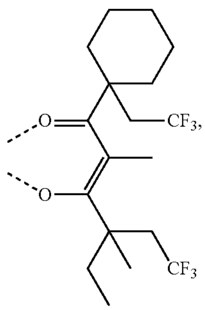
$L_{b327}$
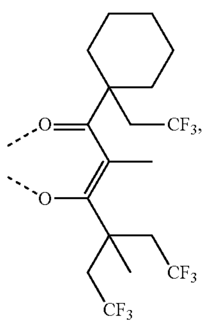
$L_{b328}$
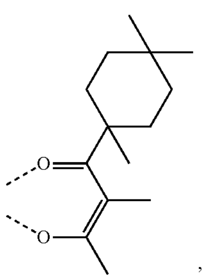
$L_{b329}$
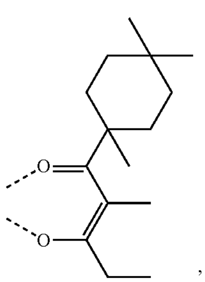
$L_{b330}$
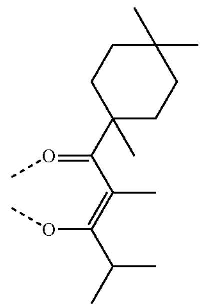
$L_{b331}$
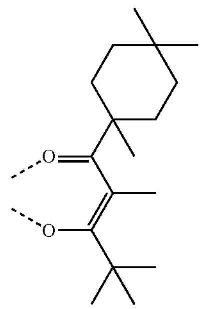
$L_{b332}$
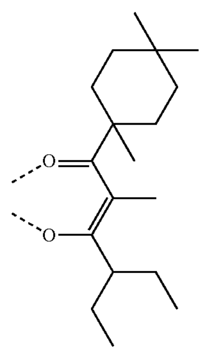
$L_{b333}$
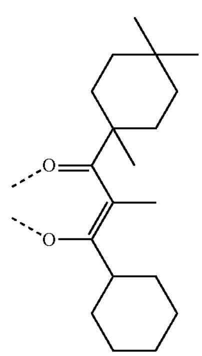

-continued
$L_{b334}$
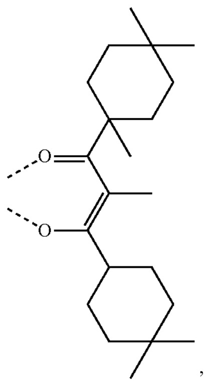
$L_{b335}$
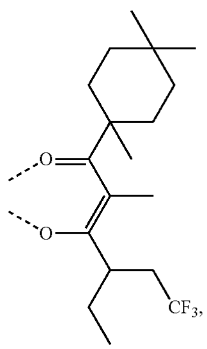
$L_{b336}$
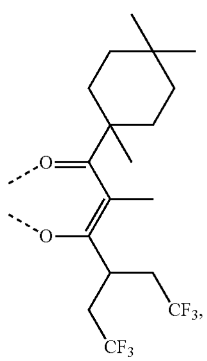
$L_{b337}$
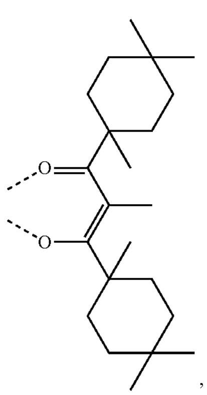
-continued
$L_{b338}$
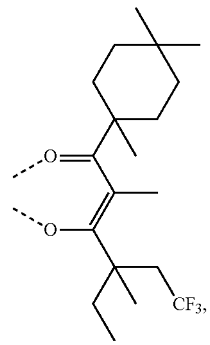
$L_{b339}$
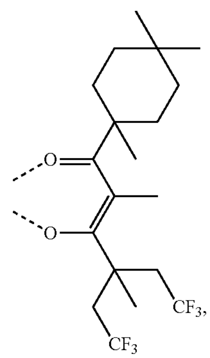
$L_{b340}$
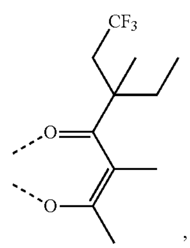
$L_{b341}$
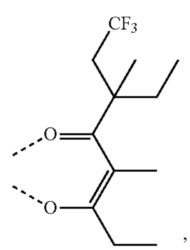
$L_{b342}$
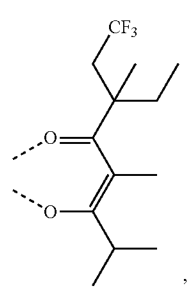

-continued
$L_{b343}$
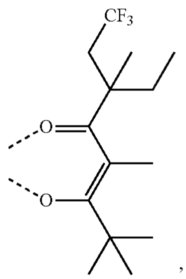
$L_{b344}$
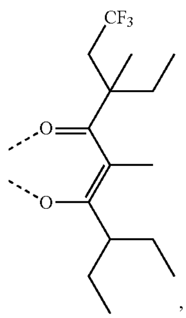
$L_{b345}$
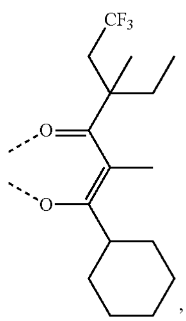
$L_{b346}$
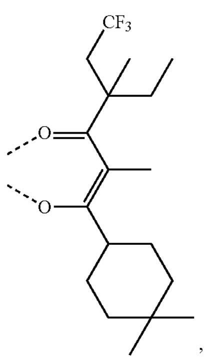
$L_{b347}$
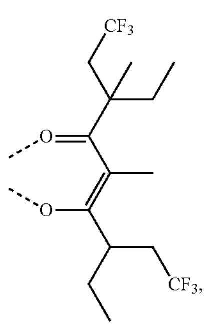
-continued
$L_{b348}$
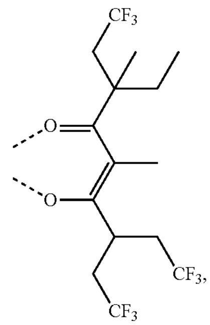
$L_{b349}$
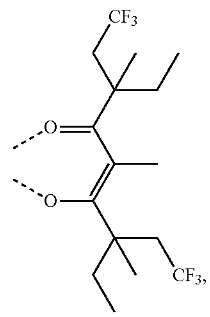
$L_{b350}$
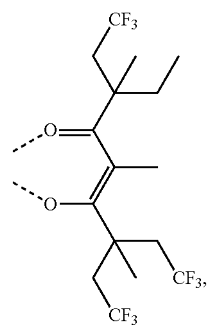
$L_{b351}$
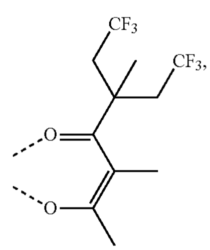
$L_{b352}$
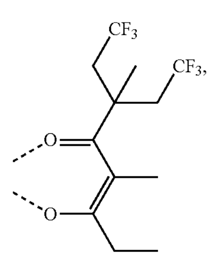

-continued
$L_{b353}$
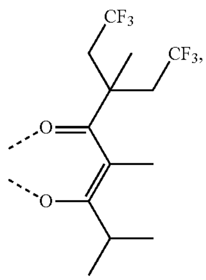
$L_{b354}$
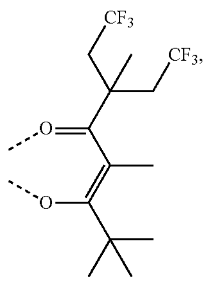
$L_{b355}$
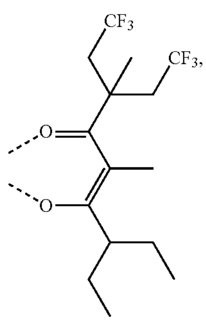
$L_{b356}$
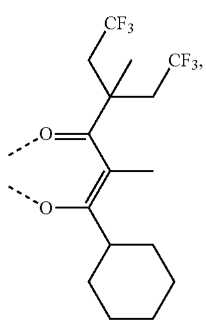
$L_{b357}$
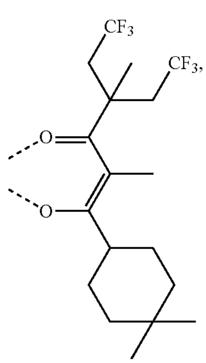
-continued
$L_{b358}$
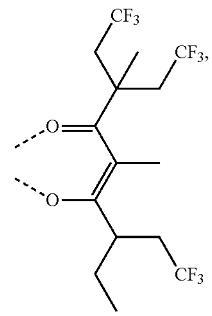
$L_{b359}$
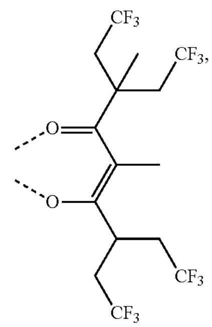
$L_{b360}$
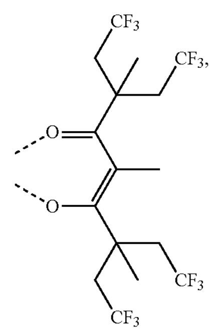
$L_{b361}$
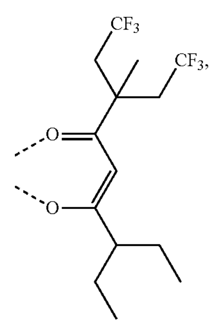
$L_{b362}$
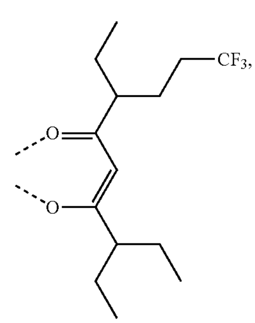

-continued
$L_{b363}$
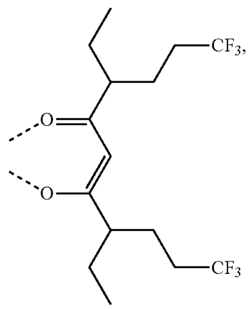
$L_{b364}$
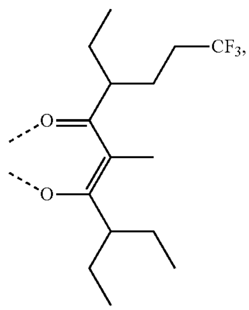
$L_{b365}$
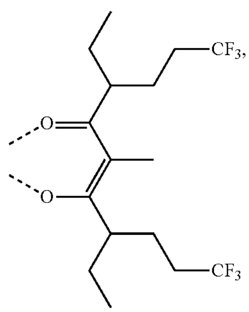
$L_{b366}$
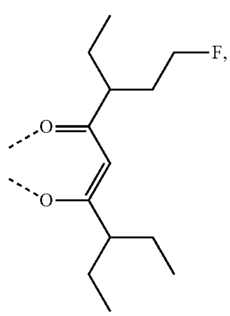
$L_{b367}$
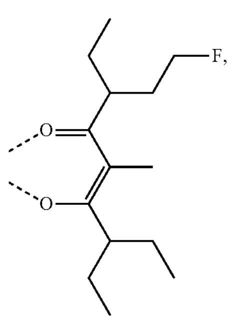
-continued
$L_{b368}$
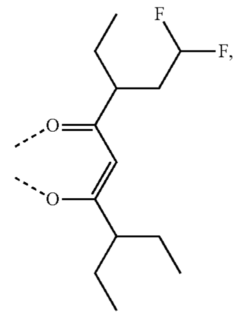
$L_{b369}$
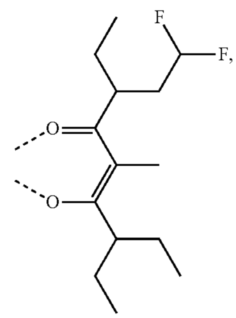
$L_{b370}$
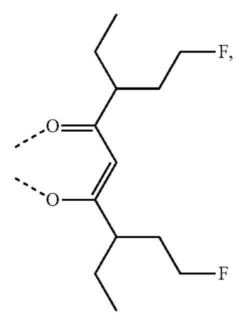
$L_{b371}$
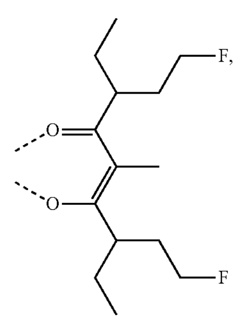

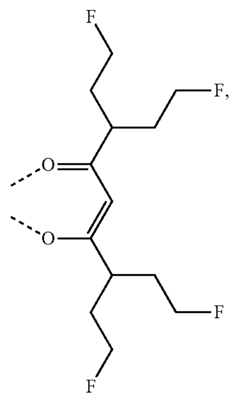
$L_{b372}$
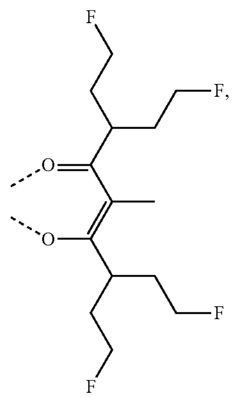
$L_{b373}$
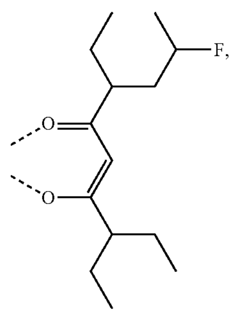
$L_{b374}$
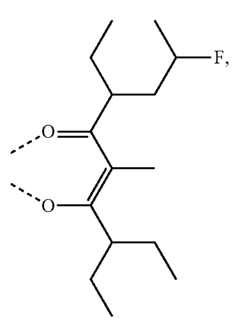
$L_{b375}$
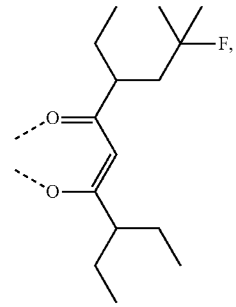
$L_{b376}$
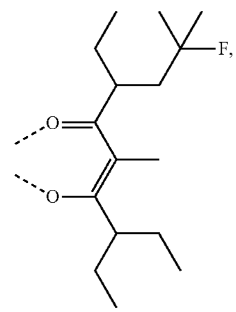
$L_{b377}$
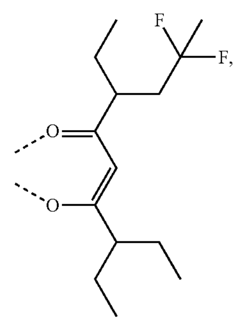
$L_{b378}$
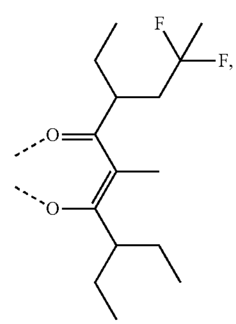
$L_{b379}$
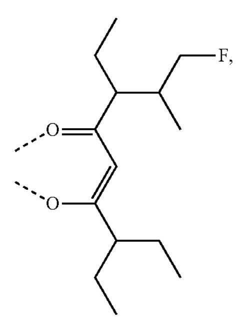
$L_{b380}$ -continued

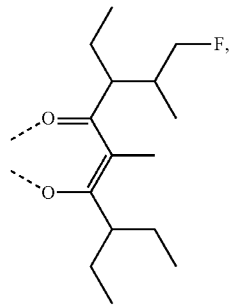

$L_{b381}$

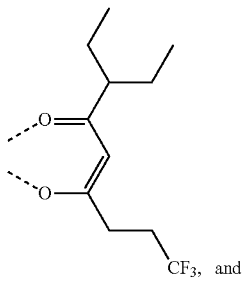

$L_{b382}$

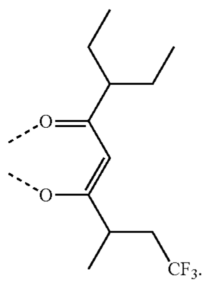

$L_{b383}$

13. The metal complex according to claim 12, wherein hydrogen in the second ligand $L_b$ is partially or fully substituted by deuterium.

14. The metal complex according to claim 1, wherein the third ligand $L_c$ is selected from any of the following structures:

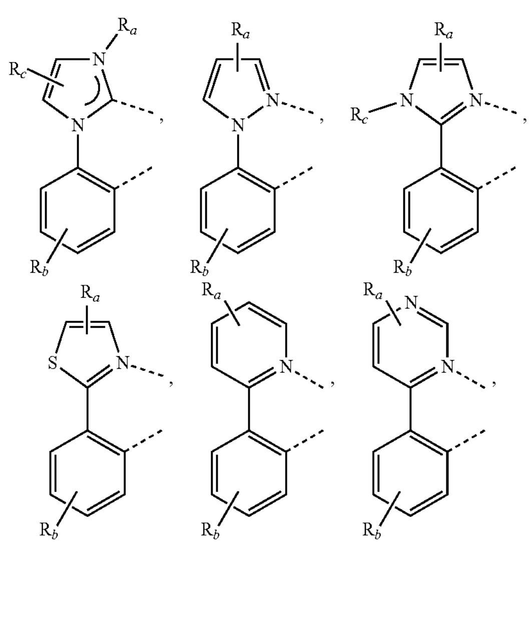

-continued

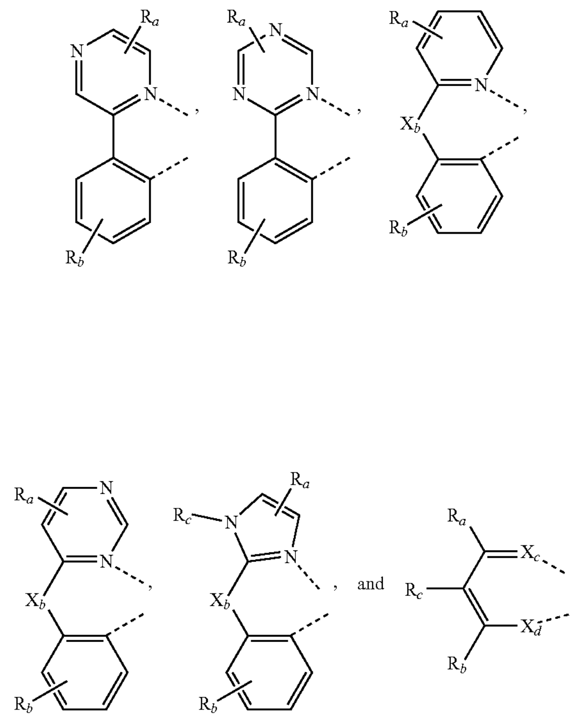

wherein $R_a$, $R_b$ and $R_c$ may represent mono-substitution, multi-substitution or no substitution;

$X_b$ is, at each occurrence identically or differently, selected from the group consisting of: O, S, Se, $NR_{N1}$, and $CR_{C1}R_{C2}$;

$X_c$ and $X_d$ are, at each occurrence identically or differently, selected from the group consisting of: O, S, Se, and $NR_{N2}$;

$R_a$, $R_b$, $R_c$, $R_{N1}$, $R_{N2}$, $R_{C1}$ and $R_{C2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a nitrile group, an isonitrile group, a sulfanyl group, a sulfinyl group, a sulfonyl group, a phosphino group, and combinations thereof;

in the structure of $L_c$, adjacent substituents can be optionally joined to form a ring.

15. The metal complex according to claim 13, wherein the third ligand $L_c$ is, at each occurrence identically or differently, selected from the group consisting of:
$L_{c1}$
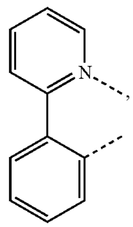
$L_{c2}$
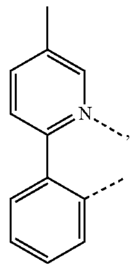
$L_{c3}$
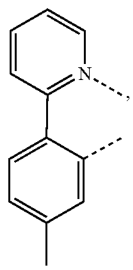
$L_{c4}$
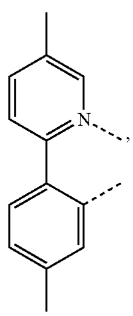
$L_{c5}$
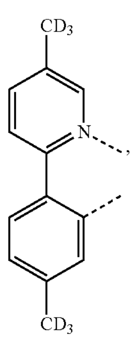
-continued
$L_{c6}$
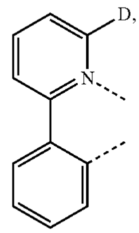
$L_{c7}$
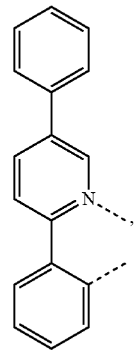
$L_{c8}$
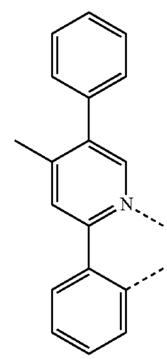
$L_{c9}$
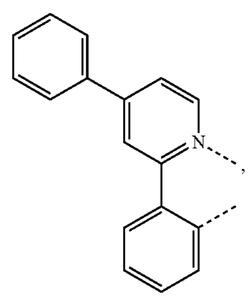
$L_{c10}$
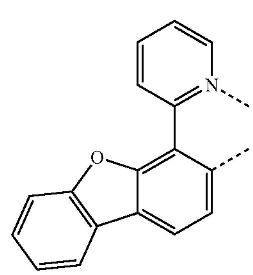

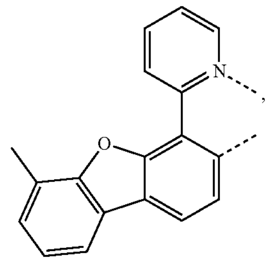
$L_{c11}$
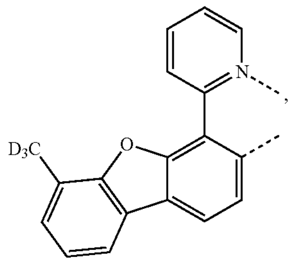
$L_{c12}$
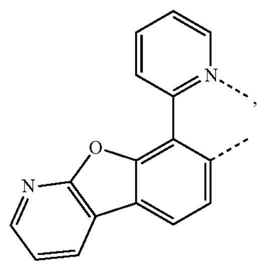
$L_{c13}$
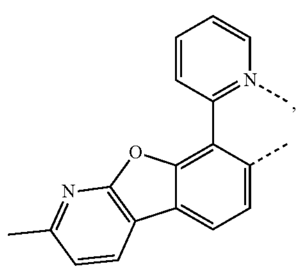
$L_{c14}$
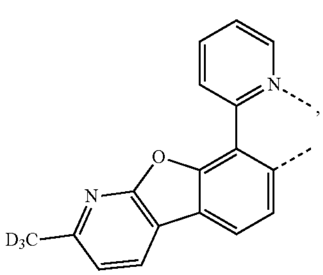
$L_{c15}$
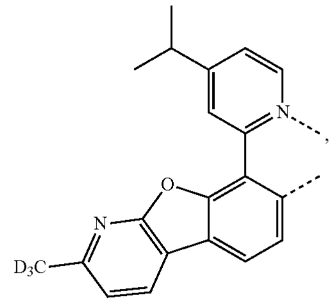
$L_{c16}$
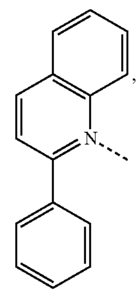
$L_{c17}$
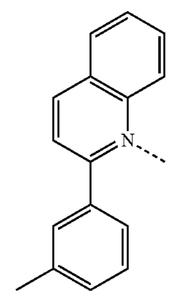
$L_{c18}$
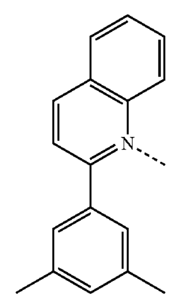
$L_{c19}$
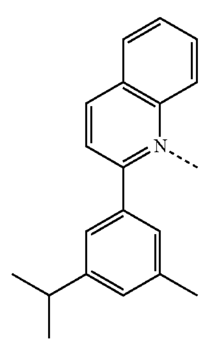
$L_{c20}$ -continued
$L_{c21}$
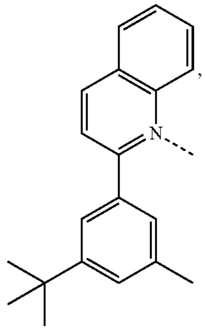
$L_{c22}$
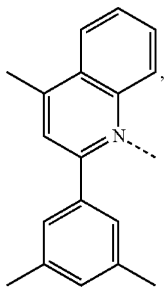
$L_{c23}$
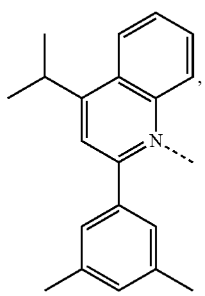
$L_{c24}$
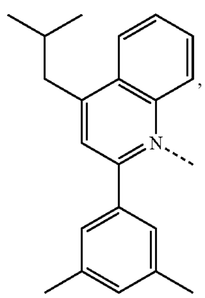
$L_{c25}$
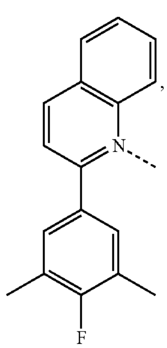
-continued
$L_{c26}$
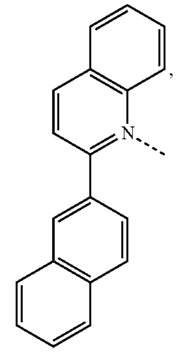
$L_{c27}$
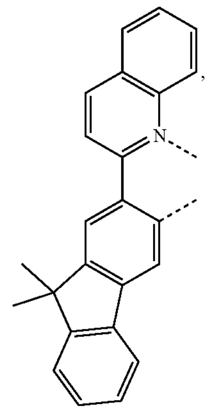
$L_{c28}$
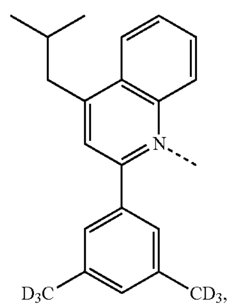
$L_{c29}$
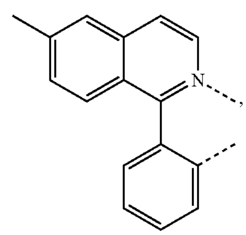
$L_{c30}$
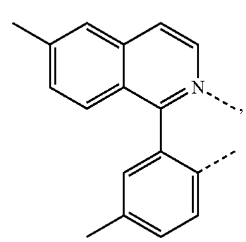

-continued
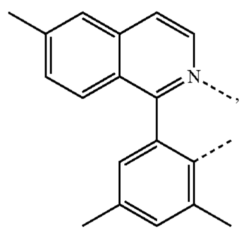
$L_{c31}$
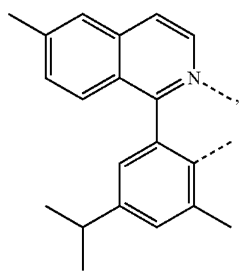
$L_{c32}$
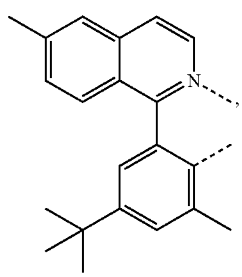
$L_{c33}$
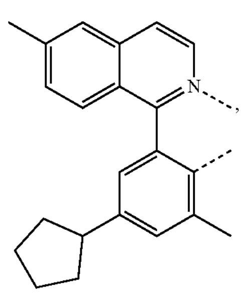
$L_{c34}$
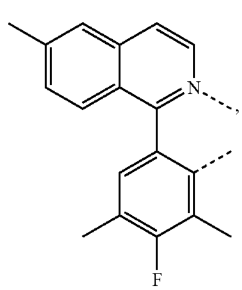
$L_{c35}$
-continued
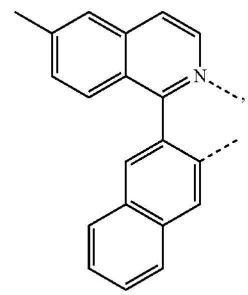
$L_{c36}$
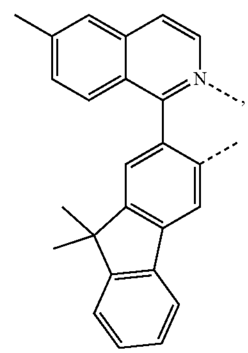
$L_{c37}$
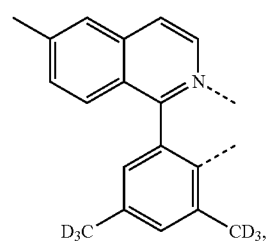
$L_{c38}$
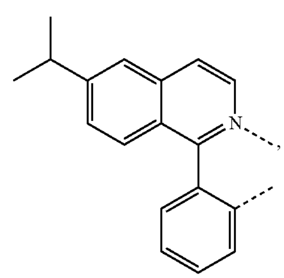
$L_{c39}$
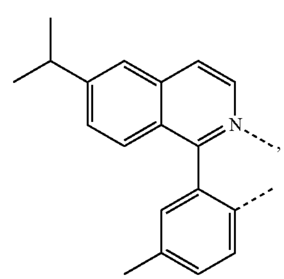
$L_{c40}$ -continued
$L_{c41}$
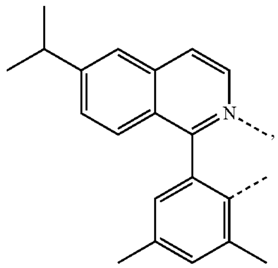
$L_{c42}$
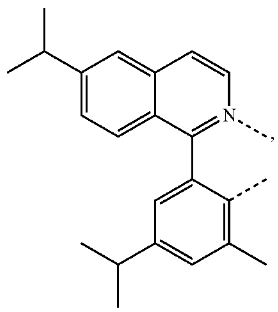
$L_{c43}$
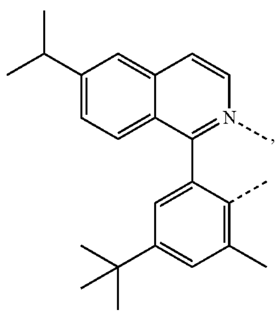
$L_{c44}$
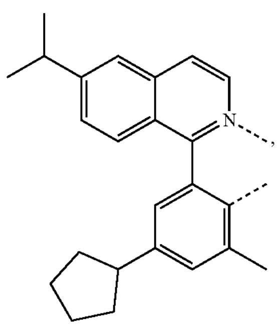
$L_{c45}$
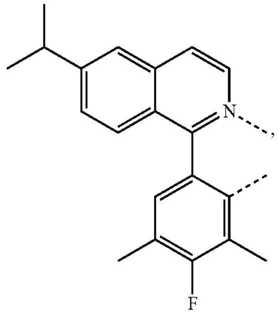
-continued
$L_{c46}$
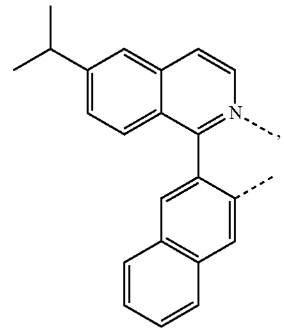
$L_{c47}$
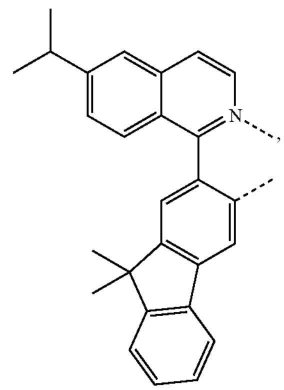
$L_{c48}$
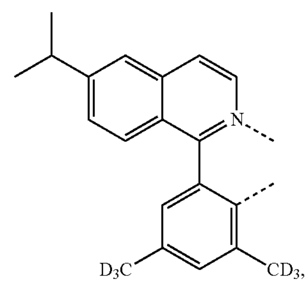
$L_{c49}$
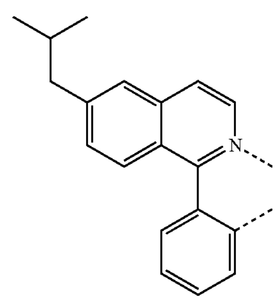
$L_{c50}$
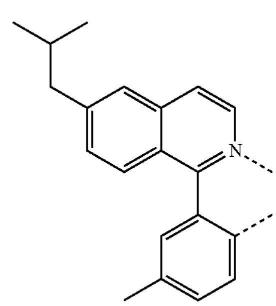

-continued
$L_{c51}$
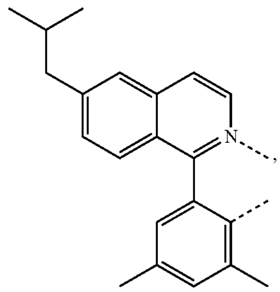
$L_{c52}$
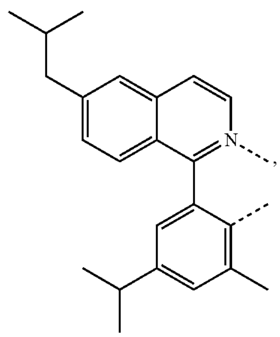
$L_{c53}$
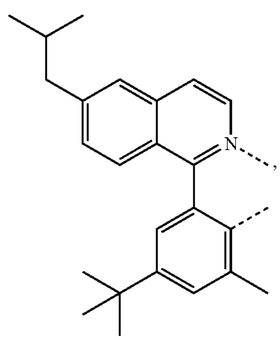
$L_{c54}$
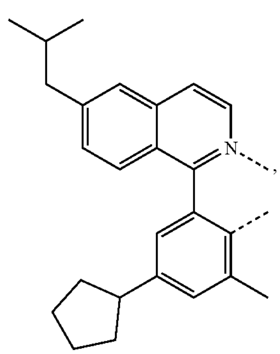
-continued
$L_{c55}$
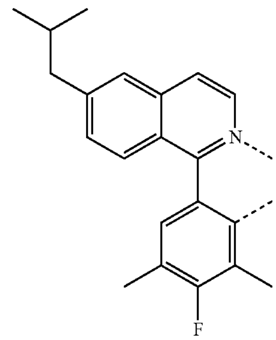
$L_{c56}$
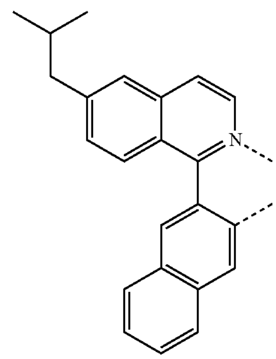
$L_{c57}$
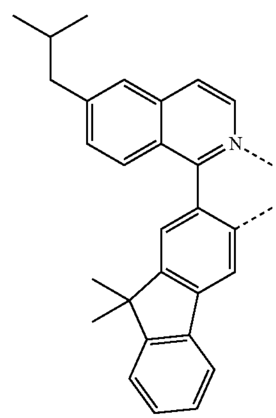
$L_{c58}$
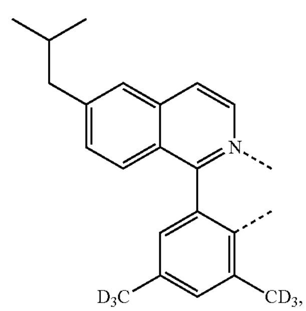

-continued
$L_{c59}$
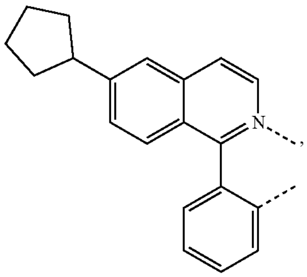
$L_{c60}$
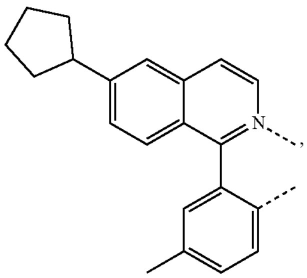
$L_{c61}$
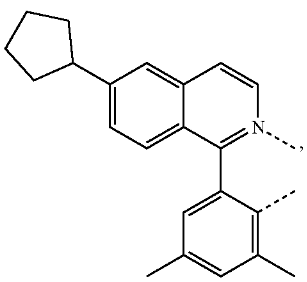
$L_{c62}$
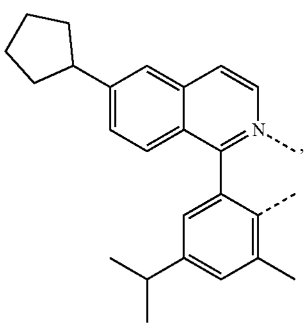
$L_{c63}$
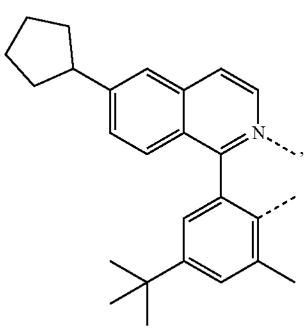
-continued
$L_{c64}$
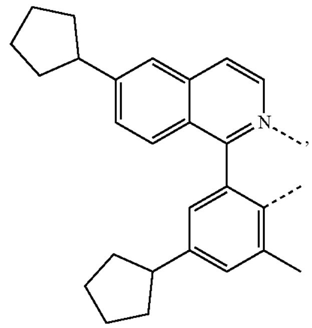
$L_{c65}$
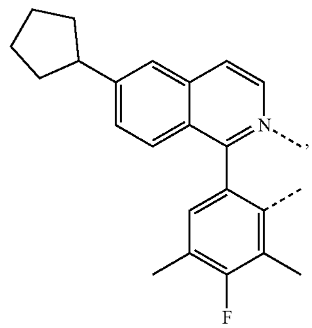
$L_{c66}$
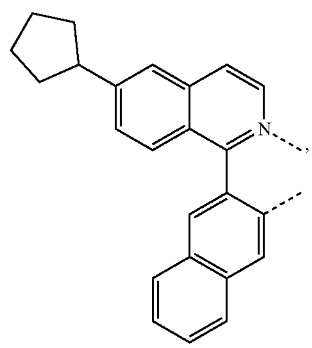
$L_{c67}$
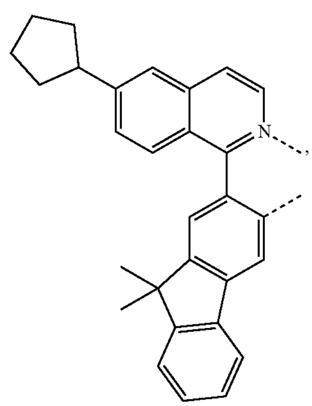

-continued
$L_{c68}$
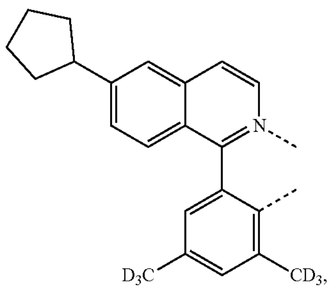
$L_{c69}$
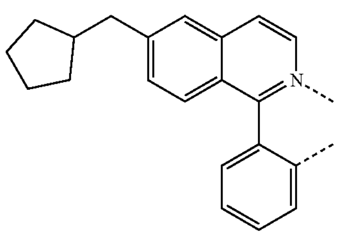
$L_{c70}$
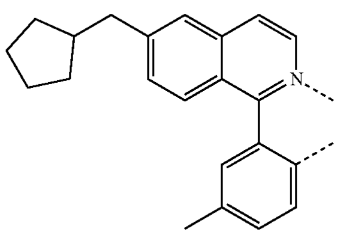
$L_{c71}$
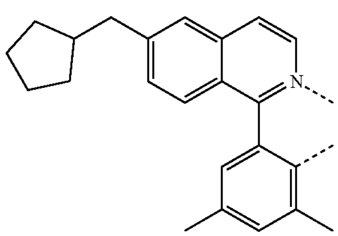
$L_{c72}$
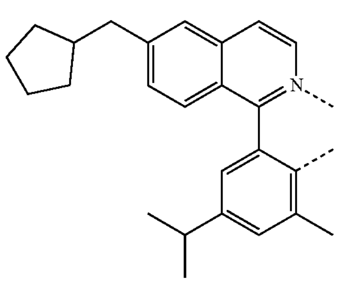
$L_{c73}$
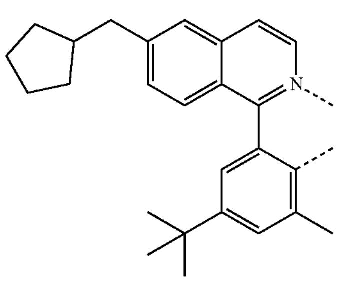
-continued
$L_{c74}$
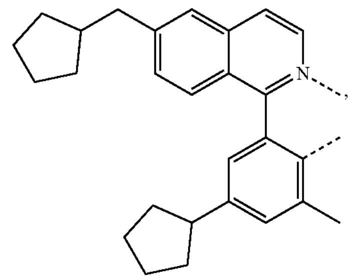
$L_{c75}$
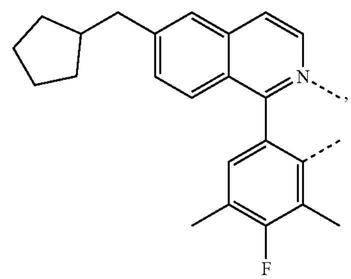
$L_{c76}$
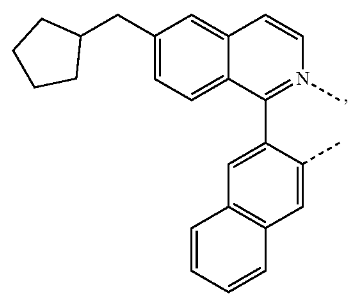
$L_{c77}$
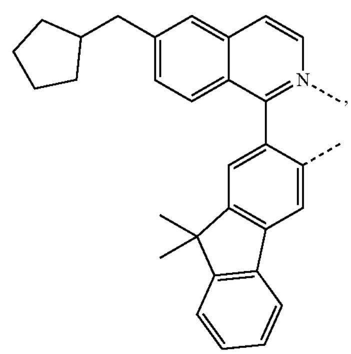
$L_{c78}$
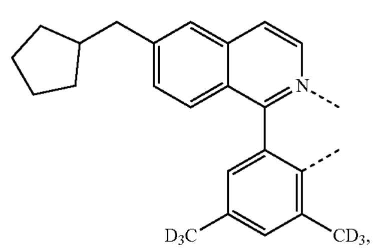

-continued
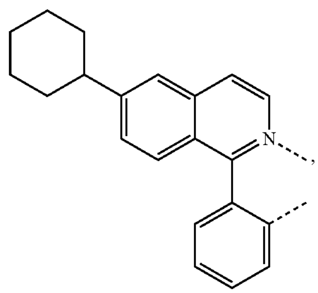
$L_{c79}$
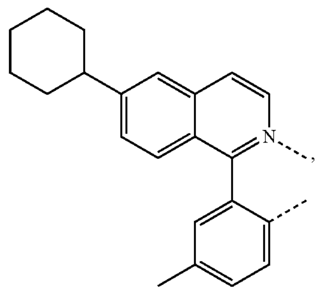
$L_{c80}$
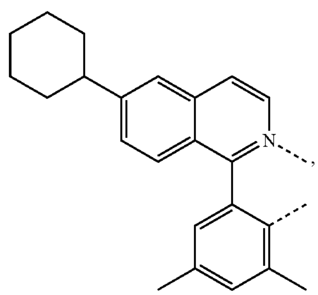
$L_{c81}$
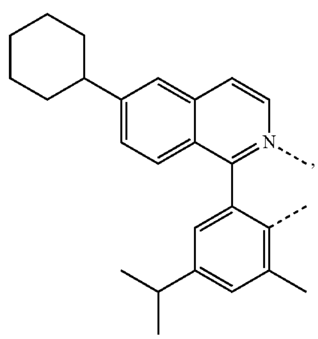
$L_{c82}$
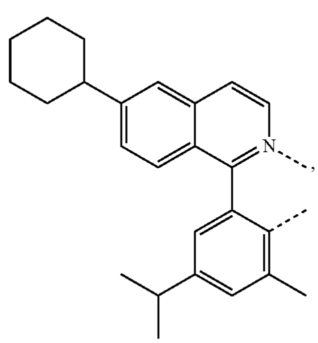
$L_{c82}$
-continued
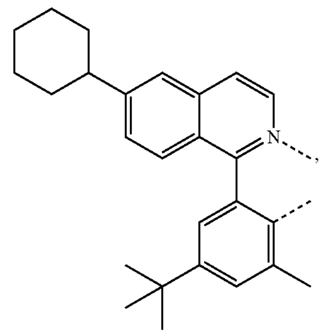
$L_{c83}$
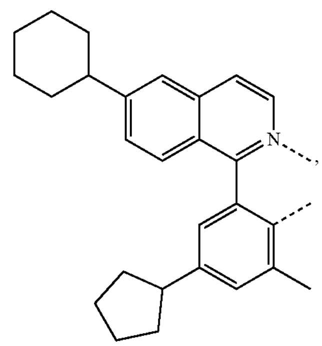
$L_{c84}$
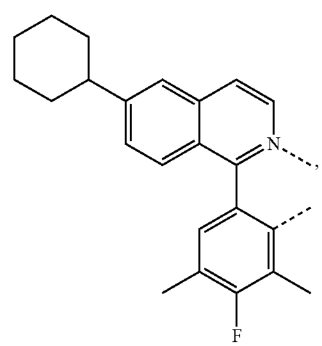
$L_{c85}$
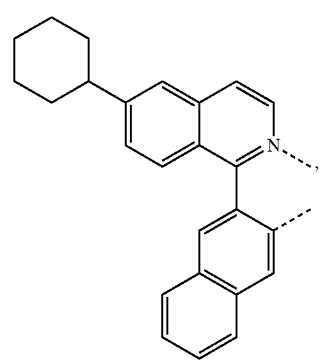
$L_{c86}$ -continued
$L_{c87}$
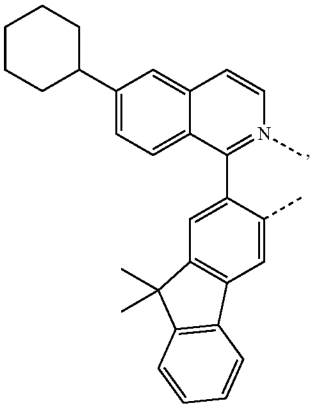
$L_{c88}$
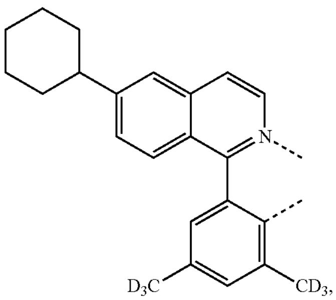
$L_{c89}$
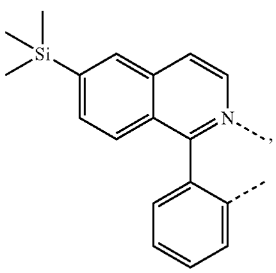
$L_{c90}$
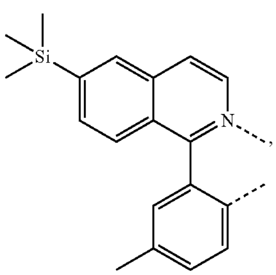
$L_{c91}$
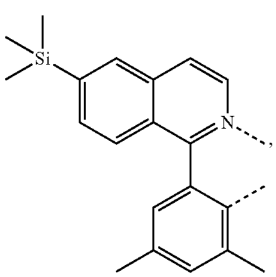
-continued
$L_{c92}$
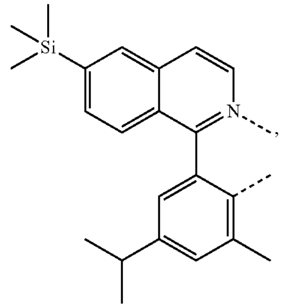
$L_{c93}$
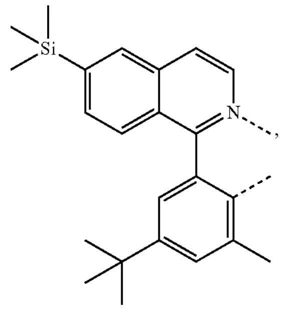
$L_{c94}$
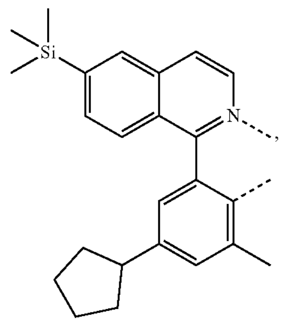
$L_{c95}$
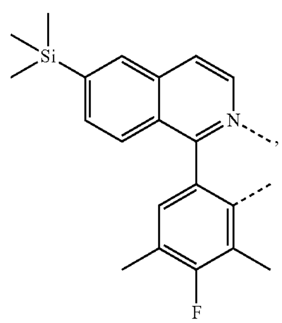
$L_{c96}$
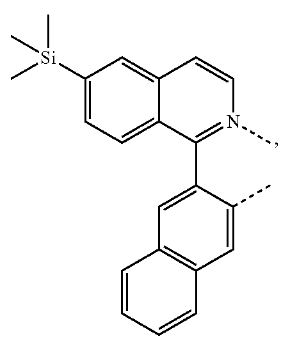

$L_{c97}$
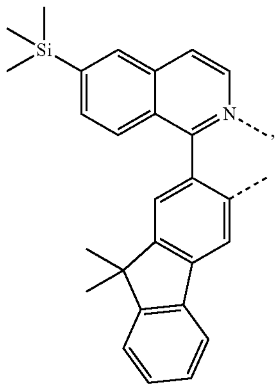
$L_{c98}$
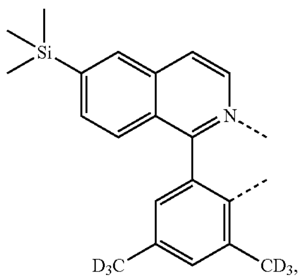
$L_{c99}$
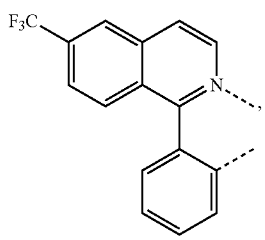
$L_{c100}$
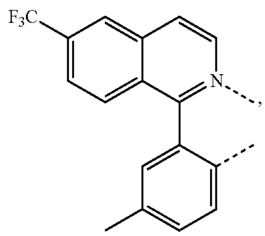
$L_{c101}$
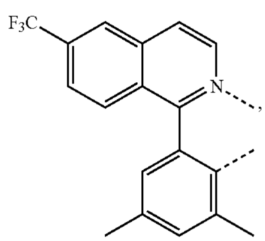
$L_{c102}$
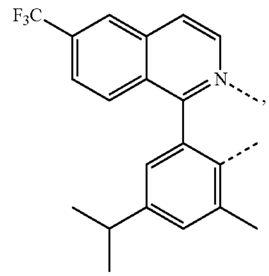
$L_{c103}$
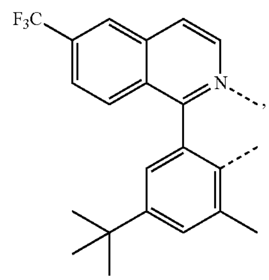
$L_{c104}$
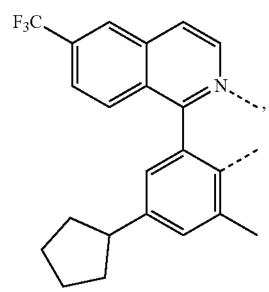
$L_{c105}$
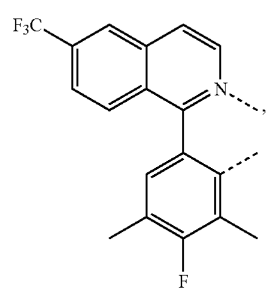
$L_{c106}$
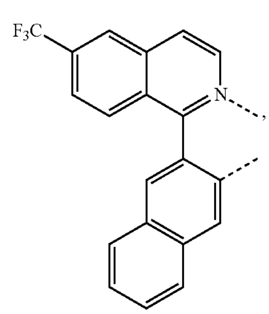

$L_{c107}$
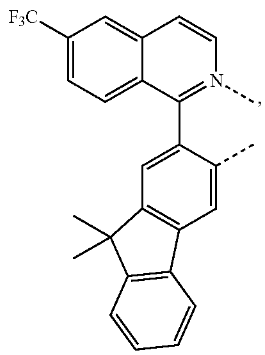
$L_{c108}$
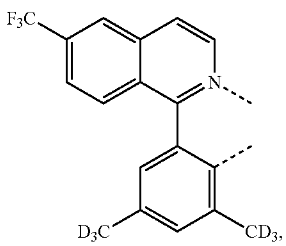
$L_{c109}$
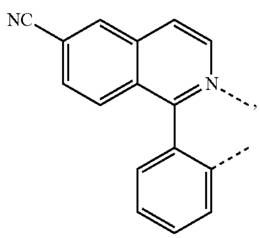
$L_{c110}$
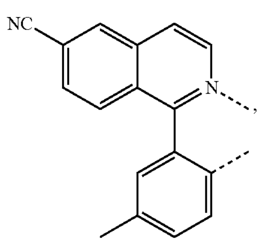
$L_{c111}$
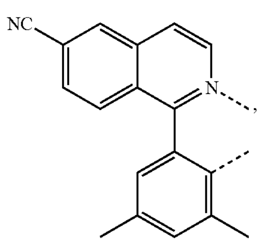
$L_{c112}$
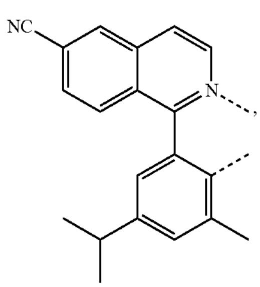
$L_{c113}$
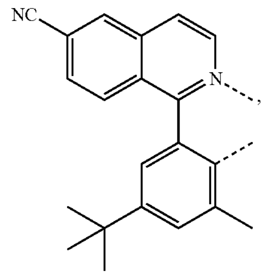
$L_{c114}$
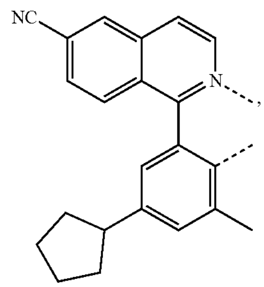
$L_{c115}$
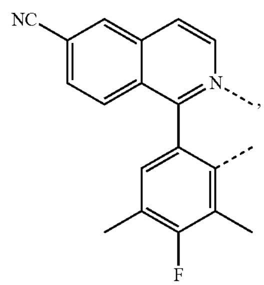
$L_{c116}$
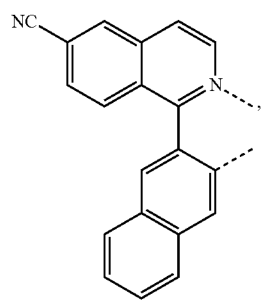
$L_{c117}$
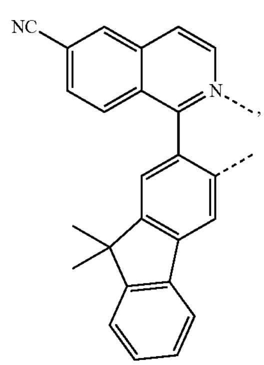

-continued
$L_{c118}$
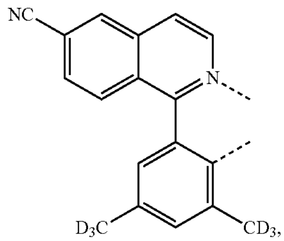
$L_{c119}$
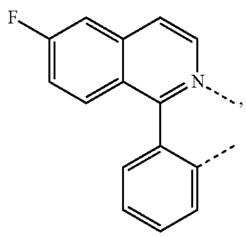
$L_{c120}$
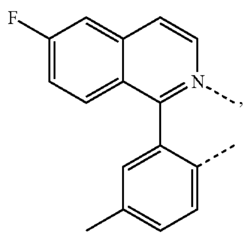
$L_{c121}$
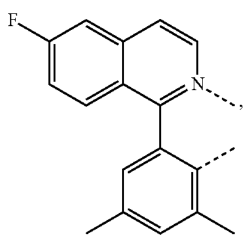
$L_{c122}$
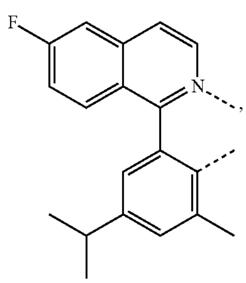
$L_{c123}$
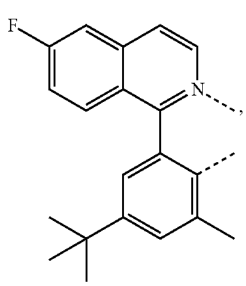
-continued
$L_{c124}$
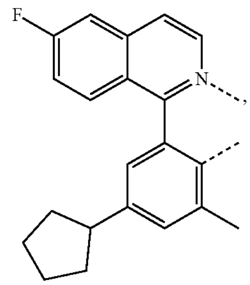
$L_{c125}$
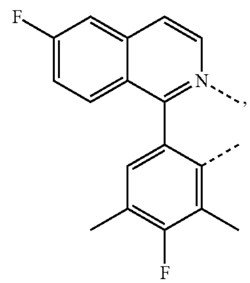
$L_{c126}$
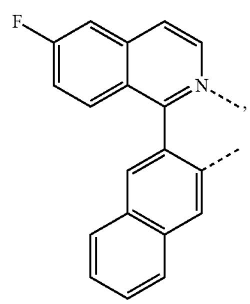
$L_{c127}$
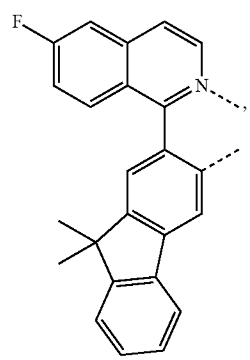
$L_{c128}$
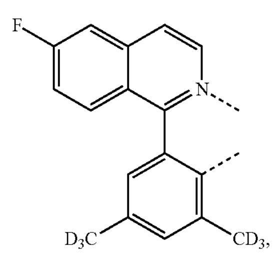

-continued
$L_{c129}$
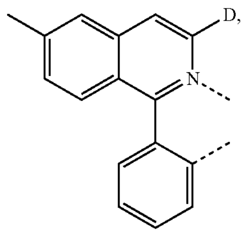
$L_{c130}$
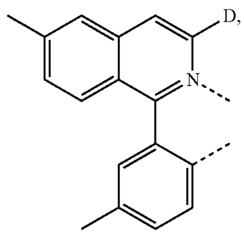
$L_{c131}$
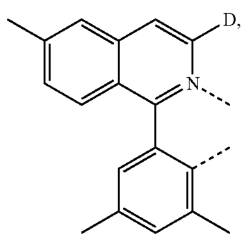
$L_{c132}$
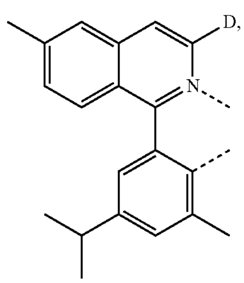
$L_{c133}$
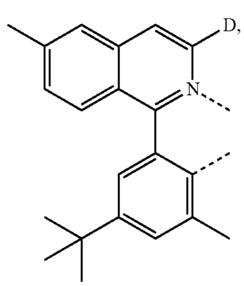
$L_{c134}$
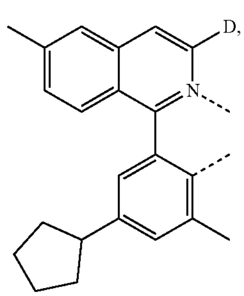
-continued
$L_{c135}$
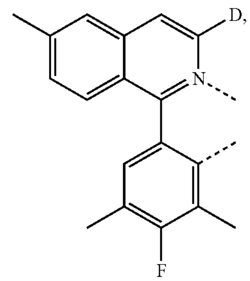
$L_{c136}$
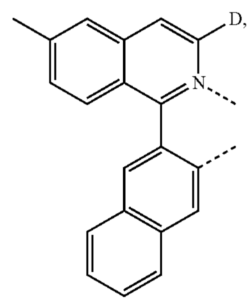
$L_{c137}$
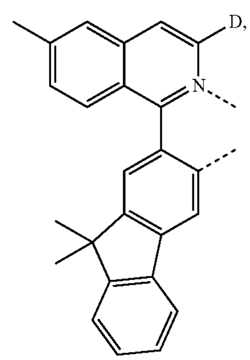
$L_{c138}$
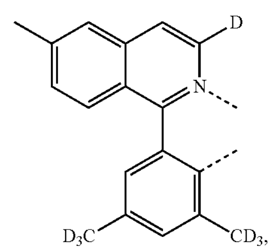
$L_{c139}$
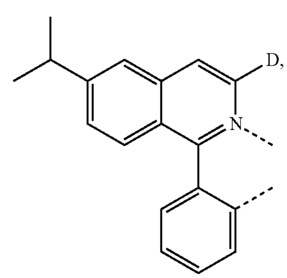

-continued
$L_{c140}$
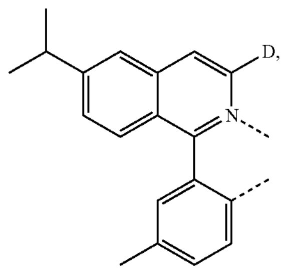
$L_{c141}$
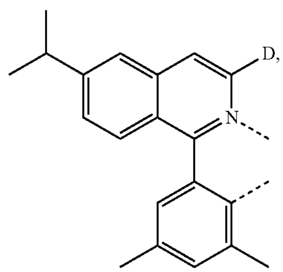
$L_{c142}$
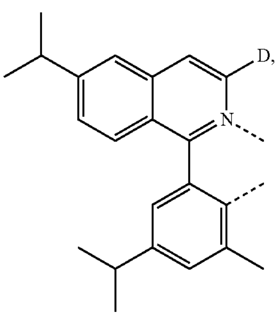
$L_{c143}$
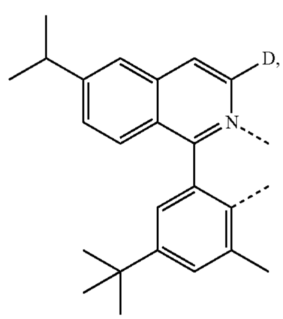
$L_{c144}$
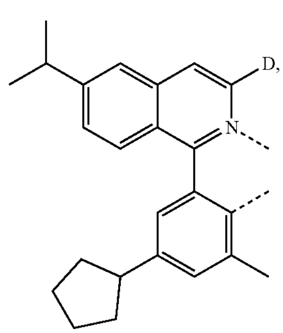
-continued
$L_{c145}$
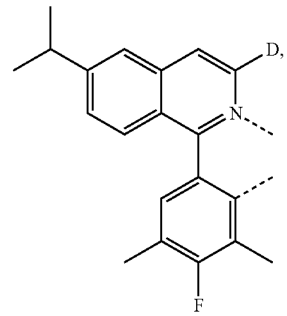
$L_{c146}$
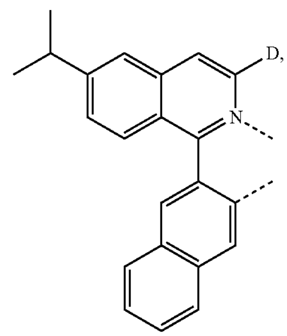
$L_{c147}$
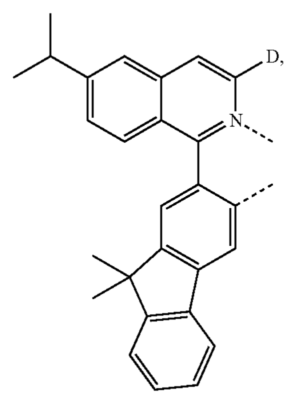
$L_{c148}$
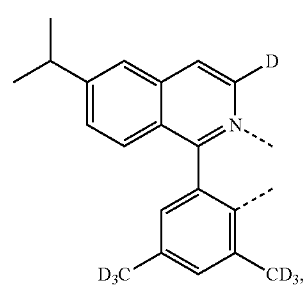
$L_{c149}$
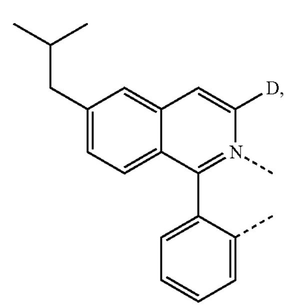

-continued
$L_{c150}$
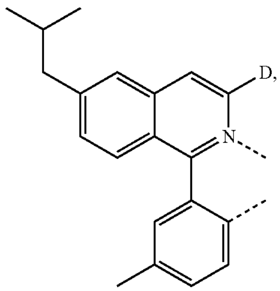
$L_{c151}$
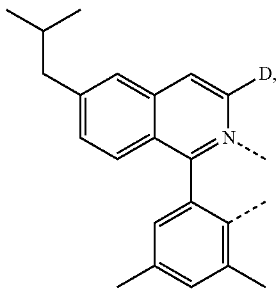
$L_{c152}$
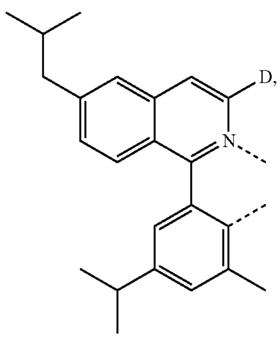
$L_{c153}$
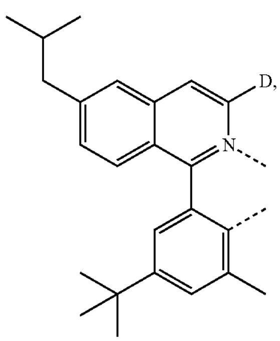
$L_{c154}$
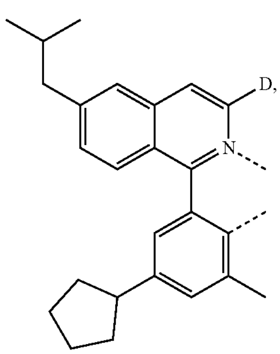
-continued
$L_{c155}$
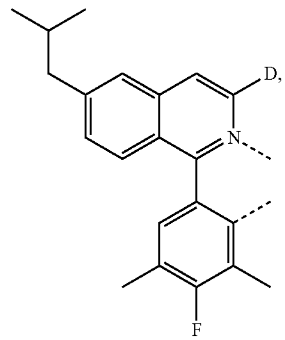
$L_{c156}$
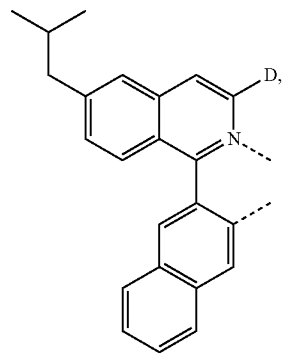
$L_{c157}$
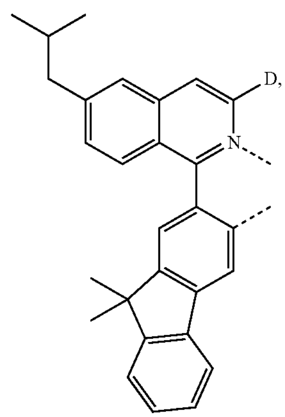
$L_{c158}$
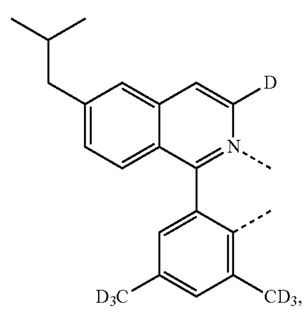

-continued
$L_{c159}$
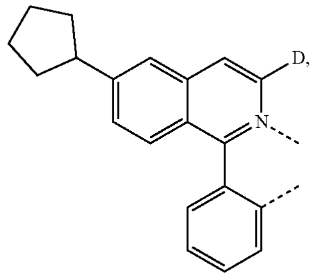
$L_{c160}$
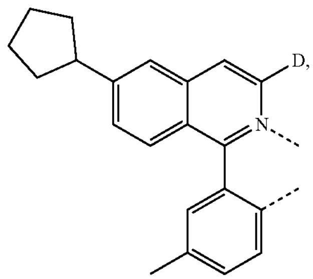
$L_{c161}$
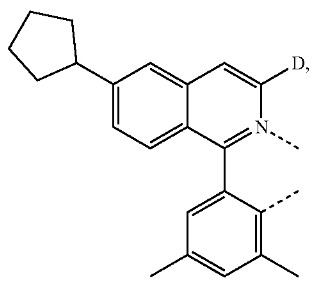
$L_{c162}$
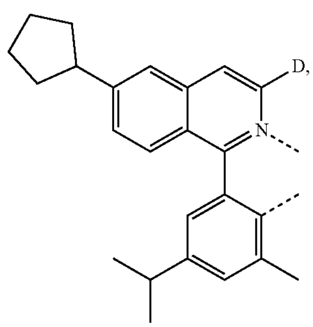
$L_{c163}$
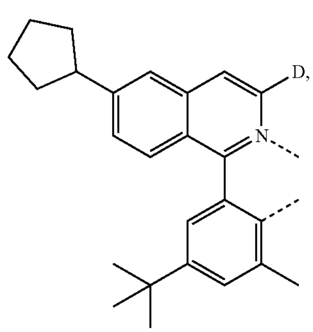
-continued
$L_{c164}$
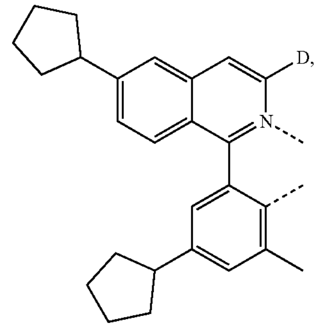
$L_{c165}$
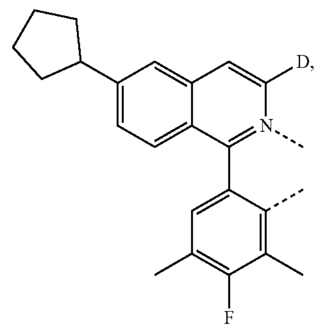
$L_{c166}$
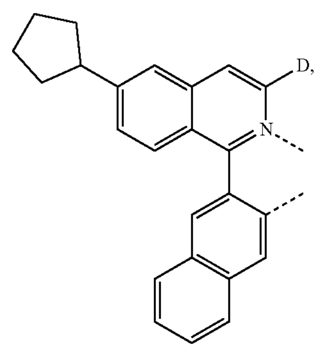
$L_{c167}$
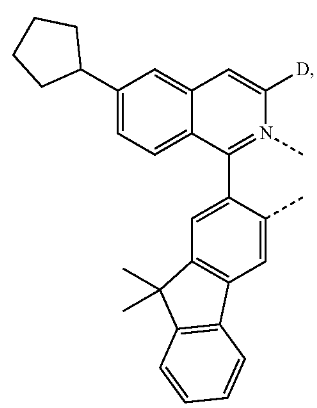

-continued
L$_{c168}$
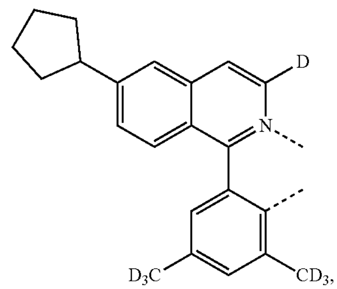
L$_{c169}$
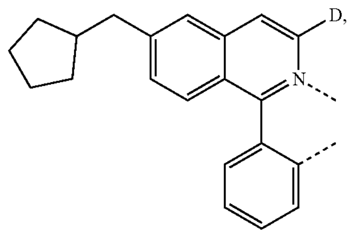
L$_{c170}$
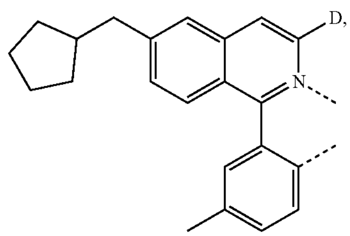
L$_{c171}$
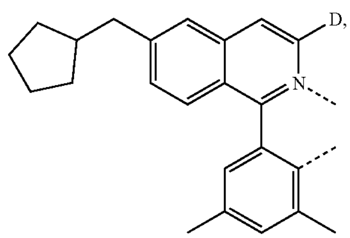
L$_{c172}$
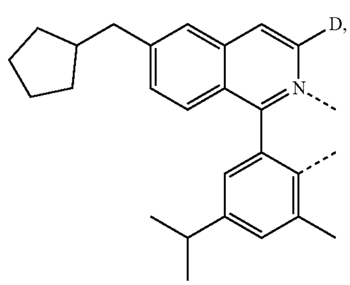
L$_{c173}$
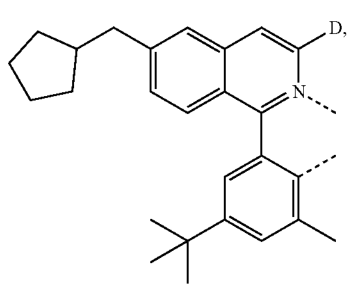
-continued
L$_{c174}$
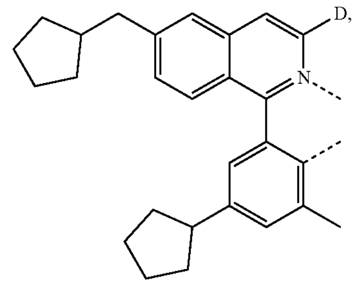
L$_{c175}$
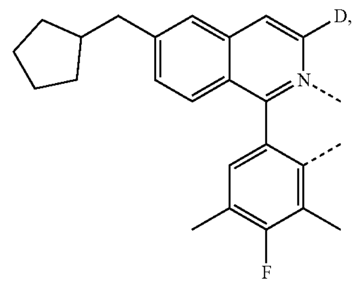
L$_{c176}$
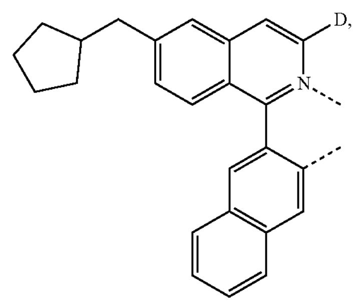
L$_{c177}$
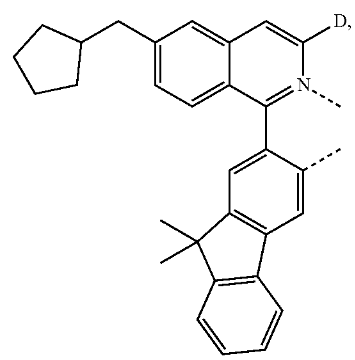
L$_{c178}$
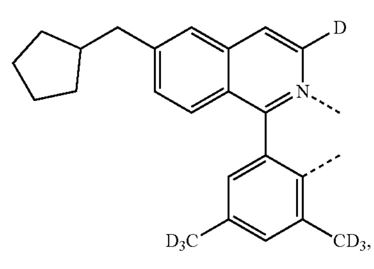

-continued
L$_{c179}$
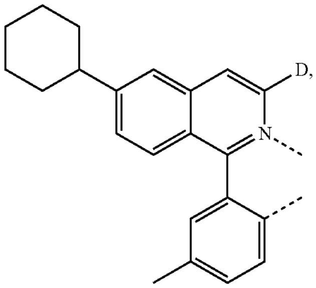
L$_{c180}$
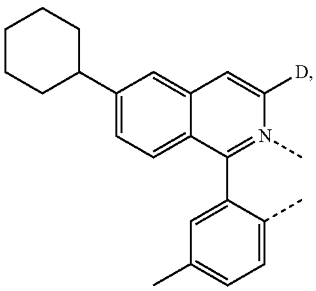
L$_{c181}$
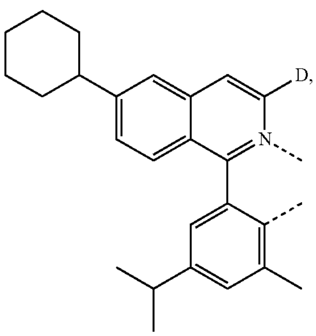
L$_{c182}$
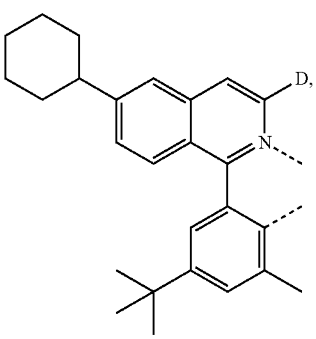
L$_{c183}$
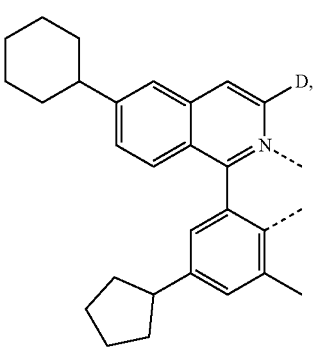
-continued
L$_{c184}$
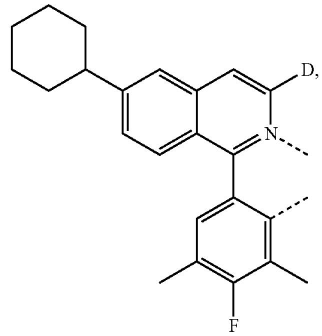
L$_{c185}$
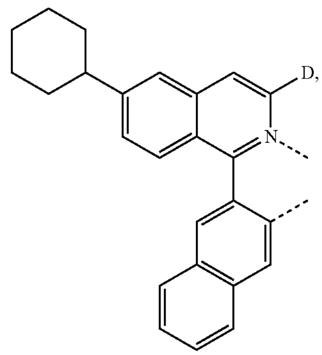
L$_{c186}$
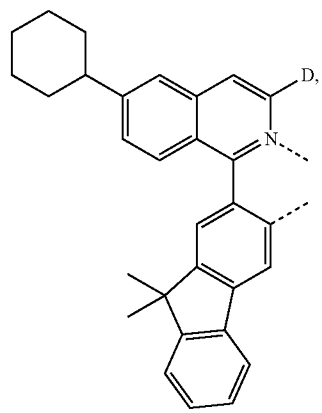
L$_{c187}$
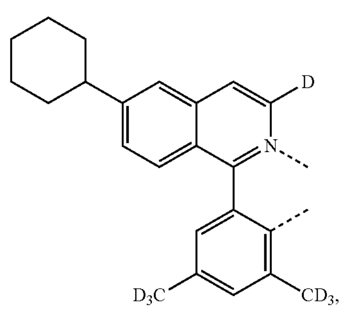

-continued
$L_{c188}$
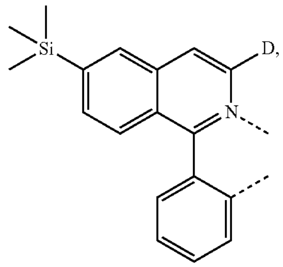
$L_{c189}$
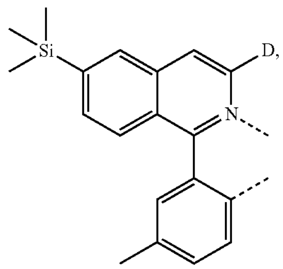
$L_{c190}$
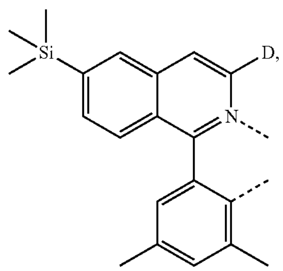
$L_{c191}$
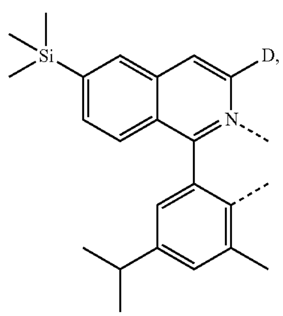
$L_{c192}$
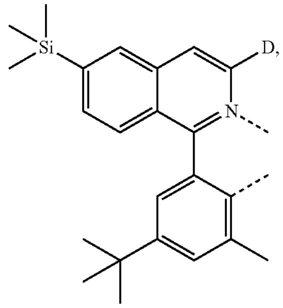
-continued
$L_{c193}$
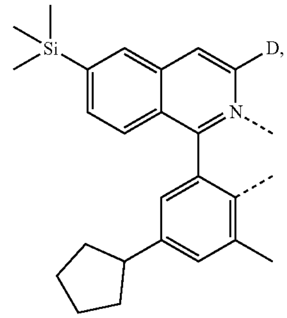
$L_{c194}$
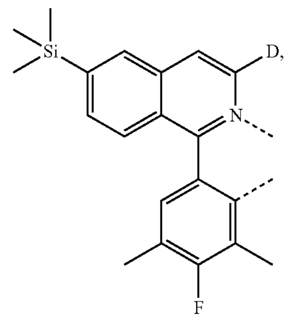
$L_{c195}$
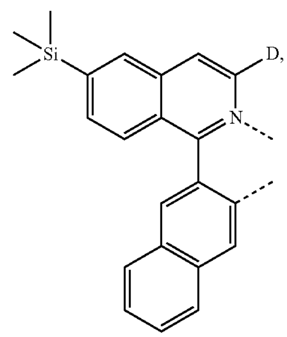
$L_{c196}$
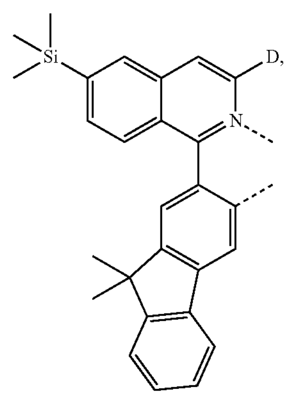

-continued
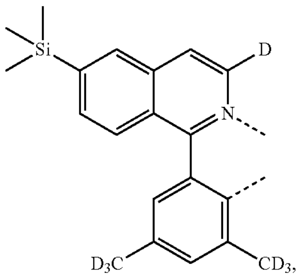
$L_{c197}$
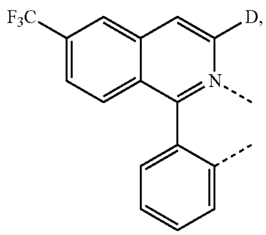
$L_{c198}$
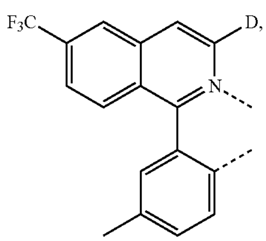
$L_{c199}$
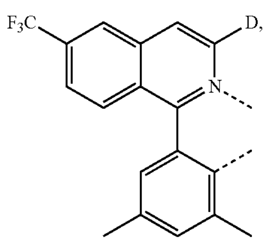
$L_{c200}$
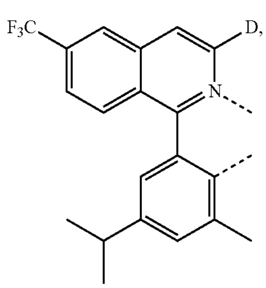
$L_{c201}$
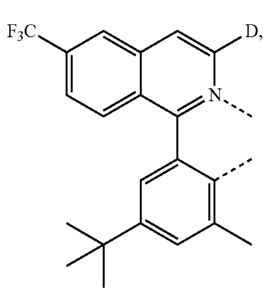
$L_{c202}$
-continued
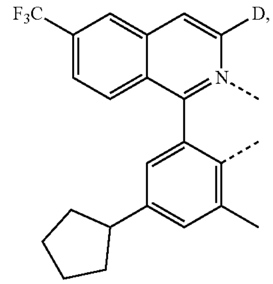
$L_{c203}$
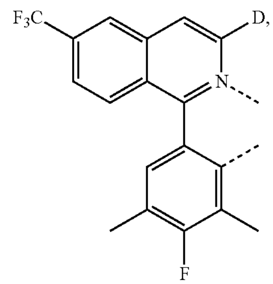
$L_{c204}$
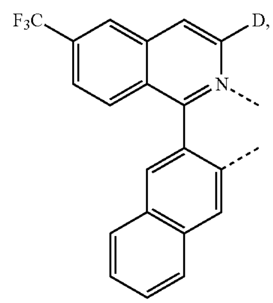
$L_{c205}$
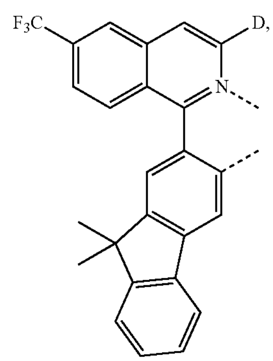
$L_{c206}$
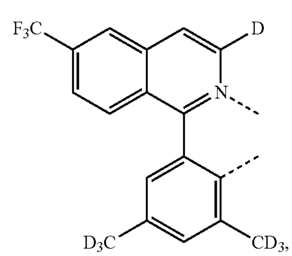
$L_{c207}$ -continued
$L_{c208}$
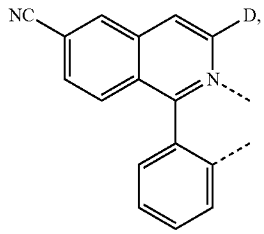
$L_{c209}$
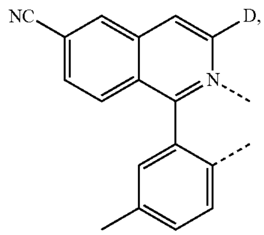
$L_{c210}$
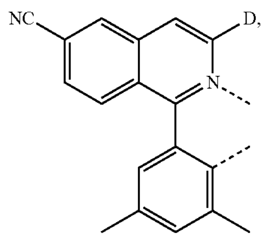
$L_{c211}$
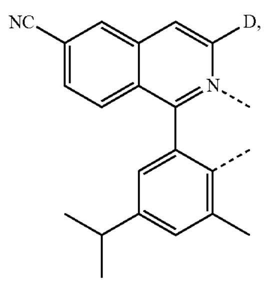
$L_{c212}$
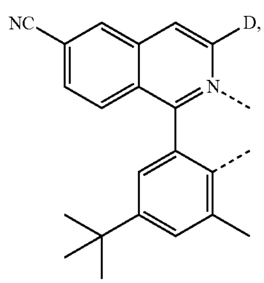
$L_{c213}$
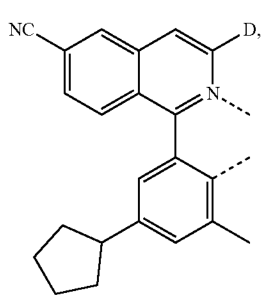
-continued
$L_{c214}$
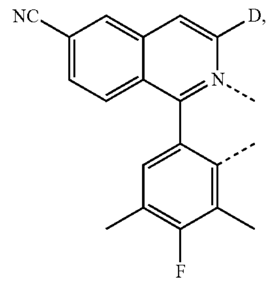
$L_{c215}$
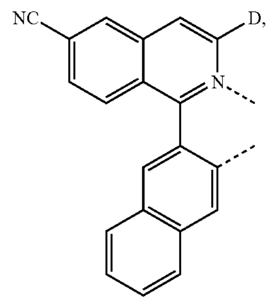
$L_{c216}$
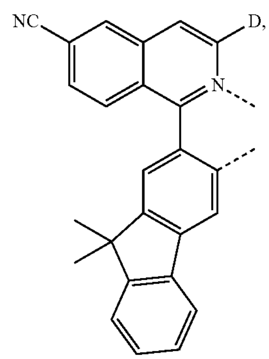
$L_{c217}$
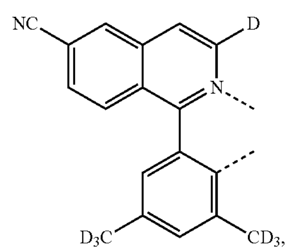
$L_{c218}$
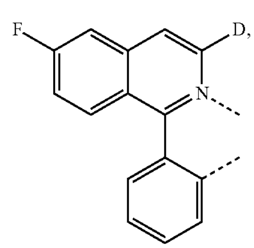

-continued $L_{c219}$

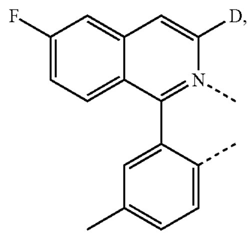

$L_{c220}$

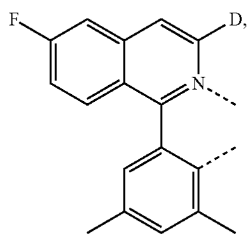

$L_{c221}$

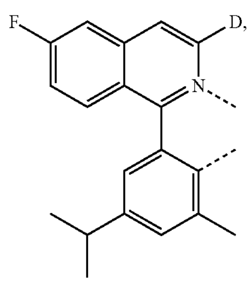

$L_{c222}$

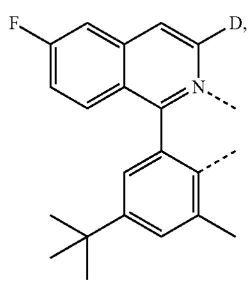

$L_{c223}$

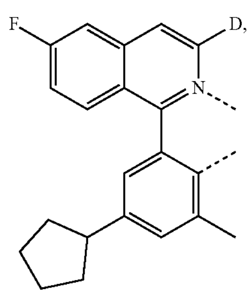

$L_{c224}$

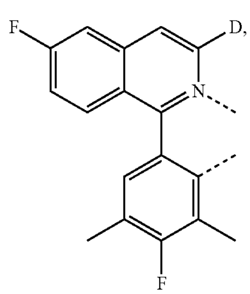

-continued $L_{c225}$

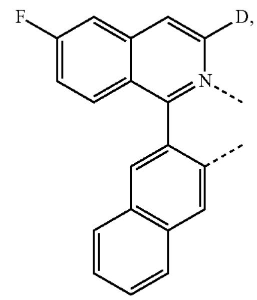

$L_{c226}$

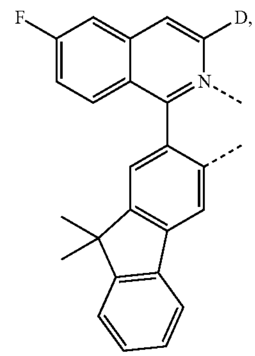

and $L_{c227}$

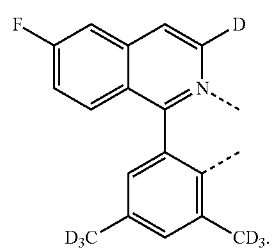

16. The metal complex according to claim 15, wherein the metal complex is $Ir(L_a)_2(L_b)$ or $Ir(L_a)(L_b)(L_c)$.

17. An electroluminescent device, which comprises:

an anode, a cathode, and an organic layer disposed between the anode and the cathode, the organic layer comprises the metal complex according to claim 1.

18. The electroluminescent device according to claim 17, wherein the electroluminescent device emits red light or white light.

19. The electroluminescent device according to claim 17, wherein the organic layer is a light-emitting layer, and the metal complex is a light-emitting material.

20. A compound formulation, comprising the metal complex according to claim 1.

21. The metal complex according to claim 4, wherein $X_1$ and $X_3$ are, at each occurrence identically or differently, selected from $CR_1$, and $R_1$ is, at each occurrence identically or differently, selected from substituted or unsubstituted alkyl having 1 to 20 carbon atoms, and $X_2$ and $X_4$ are CH.

22. The metal complex according to claim 8, $Y_2$ is $CR_2$, and $R_2$ is, at each occurrence identically or differently, selected from substituted or unsubstituted alkyl having 1 to 20 carbon atoms or substituted or unsubstituted alkylsilyl having 3 to 20 carbon atoms, and $Y_1$, $Y_3$, and $Y_4$ each are CH.

23. The metal complex according to claim 16, the metal complex is selected from the group consisting of:
$Ir(L_{a3})_2(L_{b31})$
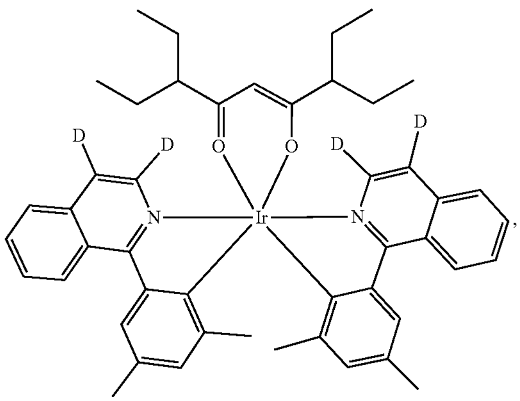
$Ir(L_{a44})_2(L_{b31})$
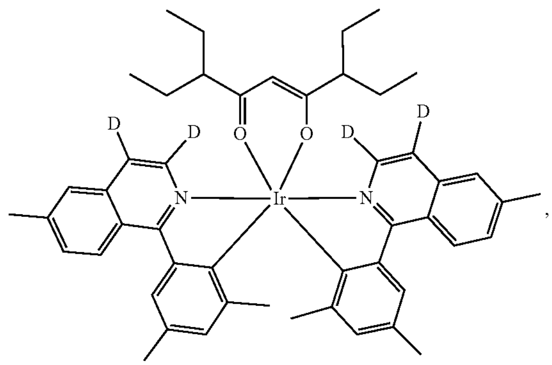
$Ir(L_{a126})_2(L_{b31})$
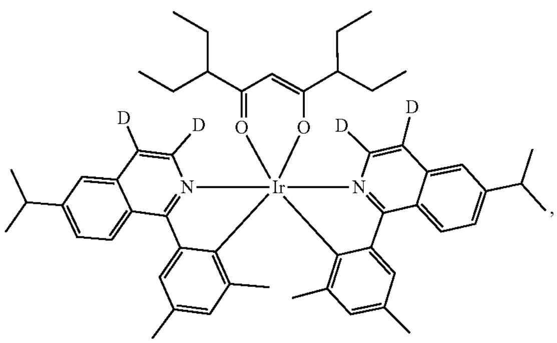
$Ir(L_{a167})_2(L_{b31})$
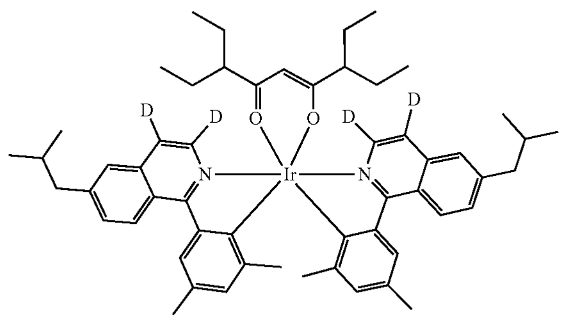
$Ir(L_{a331})_2(L_{b31})$
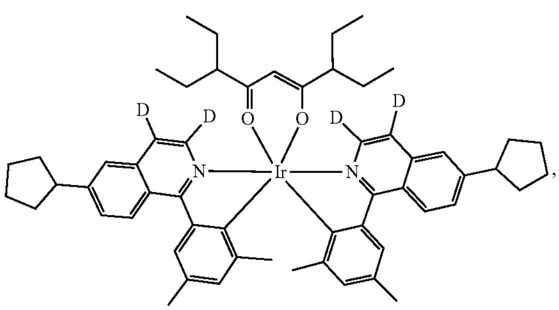
$Ir(L_{a577})_2(L_{b31})$
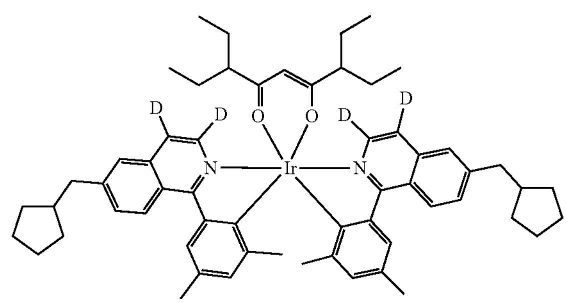
$Ir(L_{a372})_2(L_{b31})$
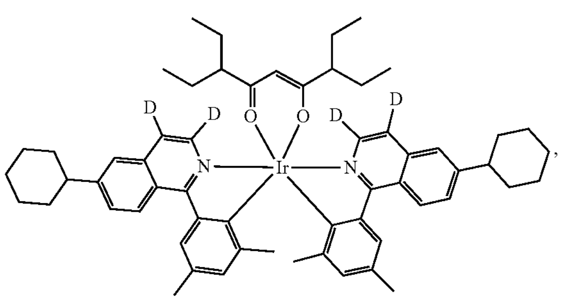
$Ir(L_{a659})_2(L_{b31})$
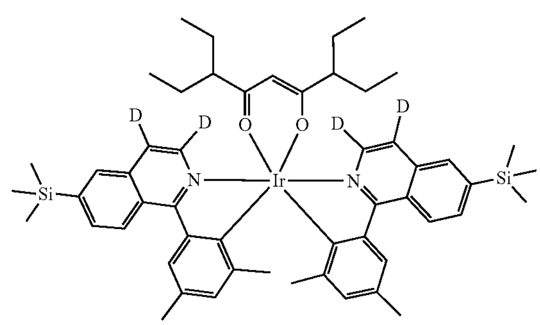

-continued
Ir($L_{a159}$)$_2$($L_{b31}$)
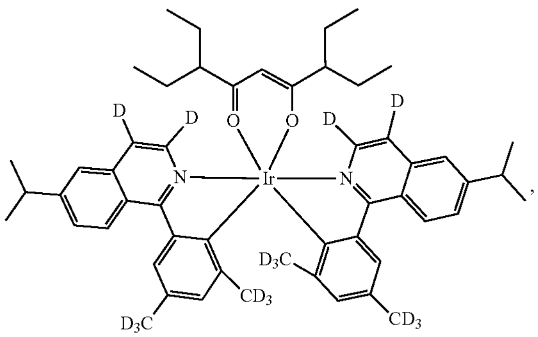
Ir($L_{a364}$)$_2$($L_{b31}$)
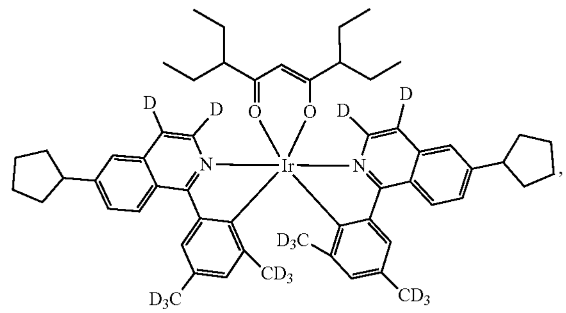
Ir($L_{a610}$)$_2$($L_{b31}$)
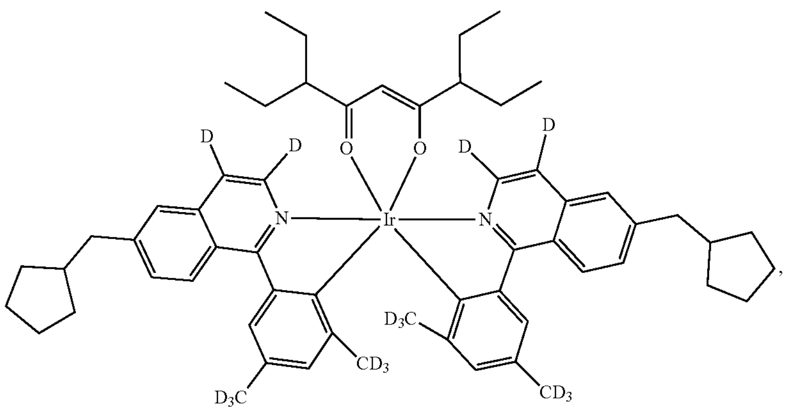
Ir($L_{a3}$)$_2$($L_{b101}$)
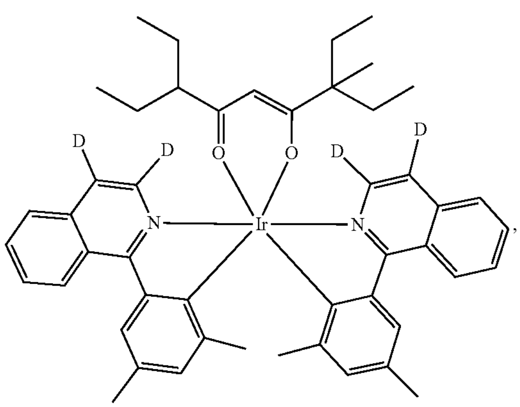
Ir($L_{a44}$)$_2$($L_{b101}$)
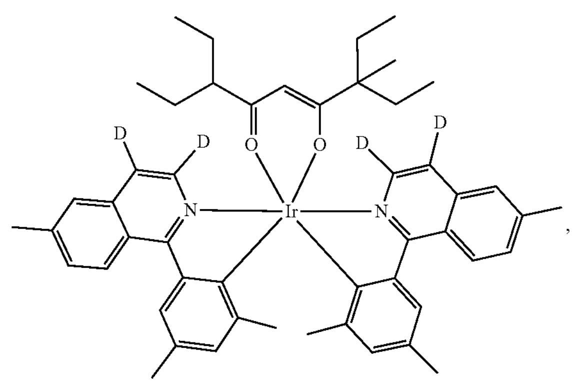
Ir($L_{a126}$)$_2$($L_{b101}$)
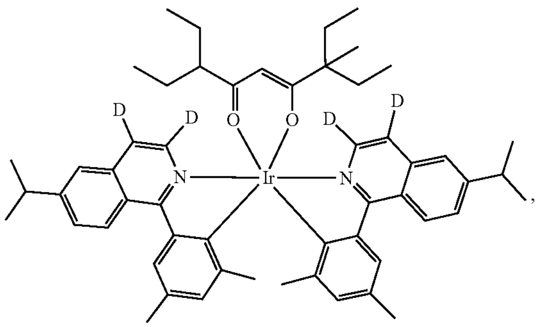
Ir($L_{a167}$)$_2$($L_{b101}$)
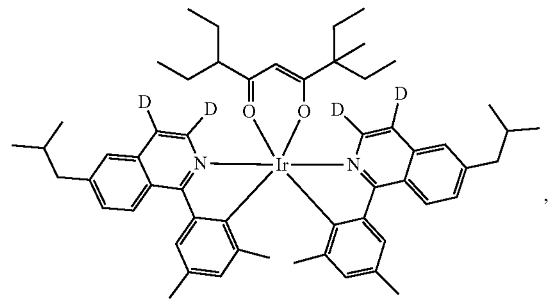

-continued
$Ir(L_{a331})_2(L_{b101})$
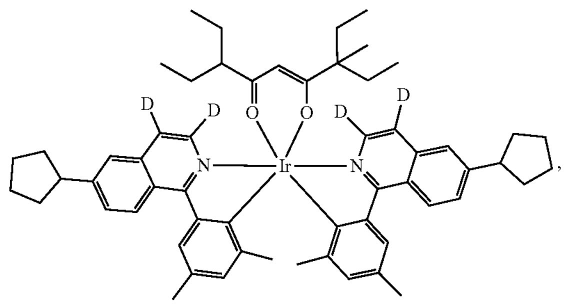
$Ir(L_{a577})_2(L_{b101})$
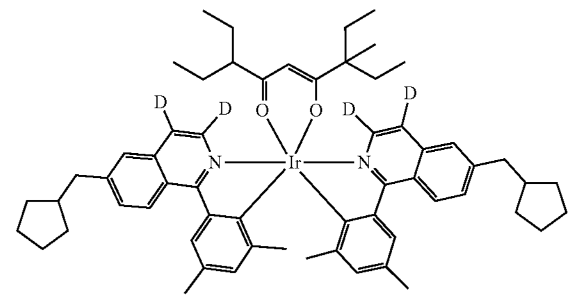
$Ir(L_{a372})_2(L_{b101})$
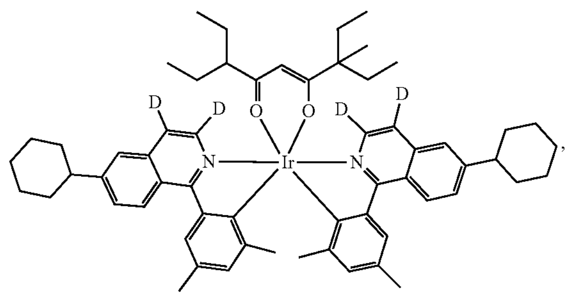
$Ir(L_{a659})_2(L_{b101})$
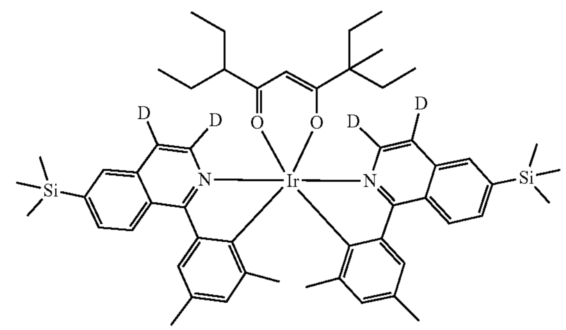
$Ir(L_{a159})_2(L_{b101})$
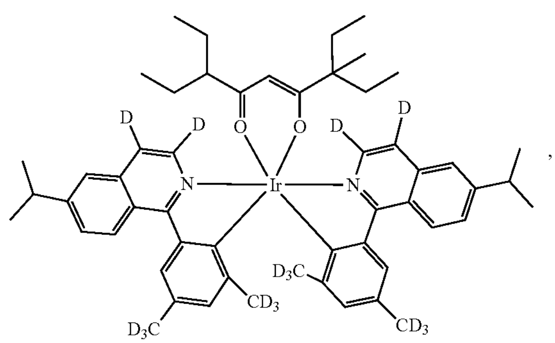
$Ir(L_{a364})_2(L_{b101})$
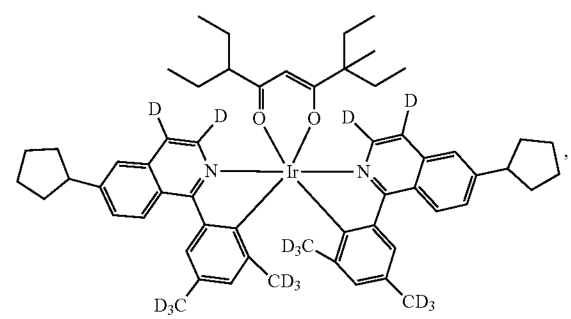
$Ir(L_{a610})_2(L_{b101})$
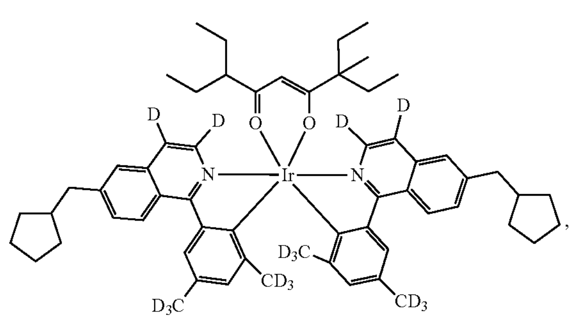
$Ir(L_{a3})_2(L_{b361})$
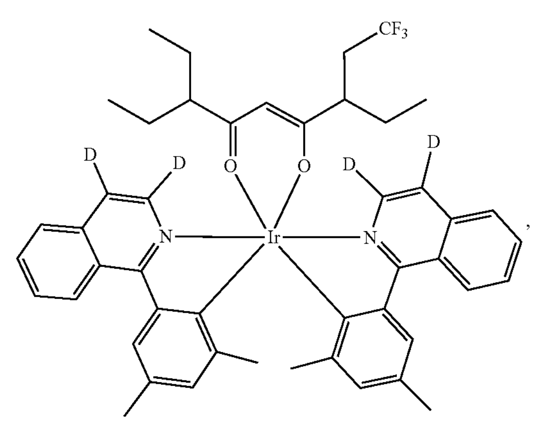

-continued
Ir($L_{a44}$)$_2$($L_{b361}$)
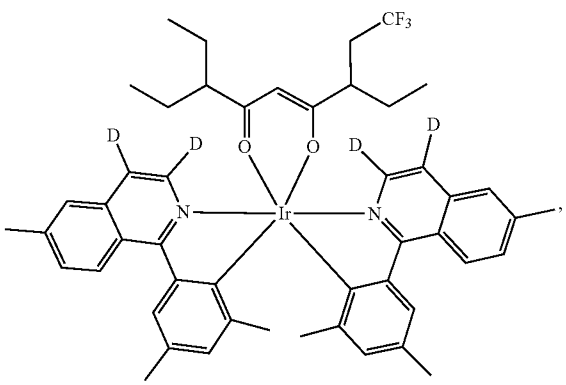
Ir($L_{a126}$)$_2$($L_{b361}$)
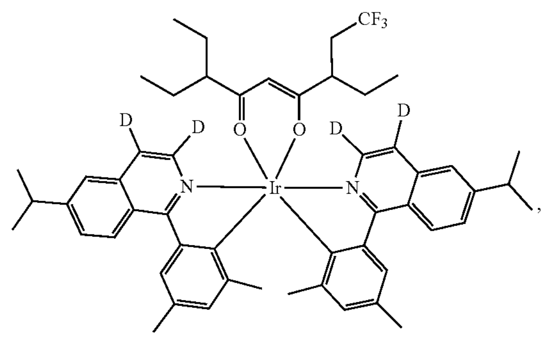
Ir($L_{a167}$)$_2$($L_{b361}$)
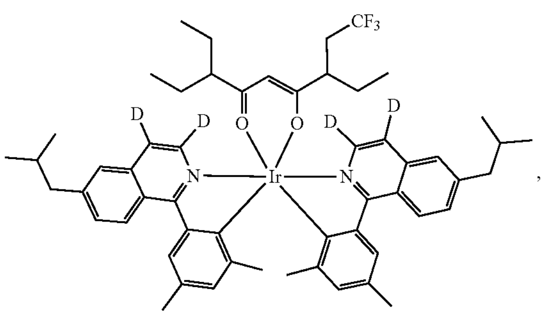
Ir($L_{a331}$)$_2$($L_{b361}$)
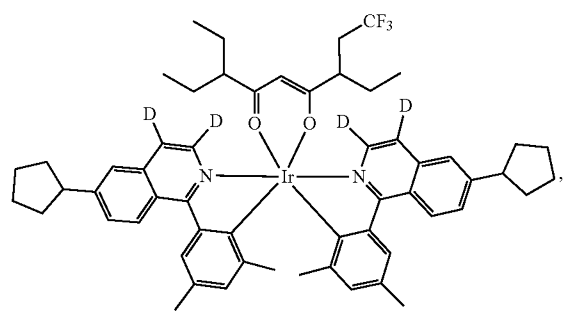
Ir($L_{a577}$)$_2$($L_{b361}$)
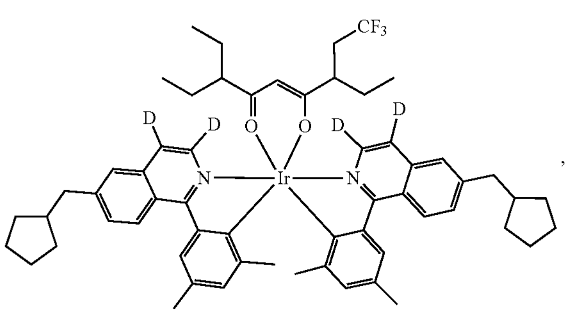
Ir($L_{a372}$)$_2$($L_{b361}$)
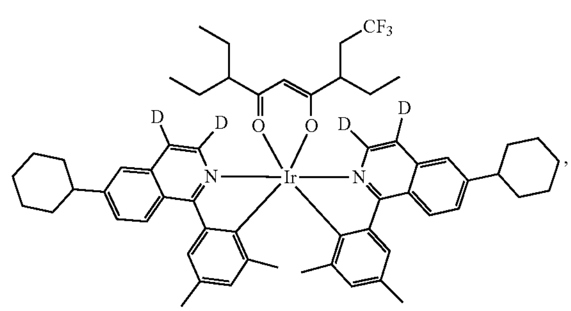
Ir($L_{a659}$)$_2$($L_{b361}$)
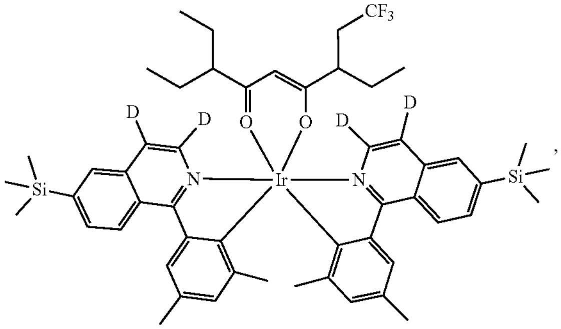
Ir($L_{a159}$)$_2$($L_{b361}$)
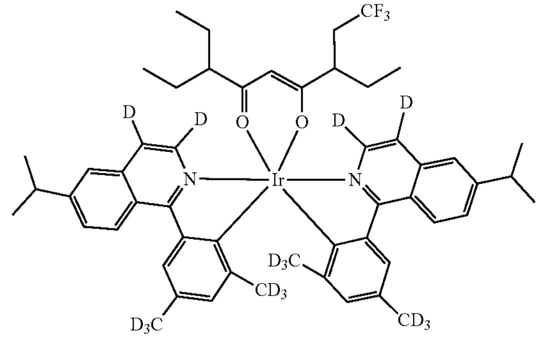

-continued
$Ir(L_{a364})_2(L_{b361})$
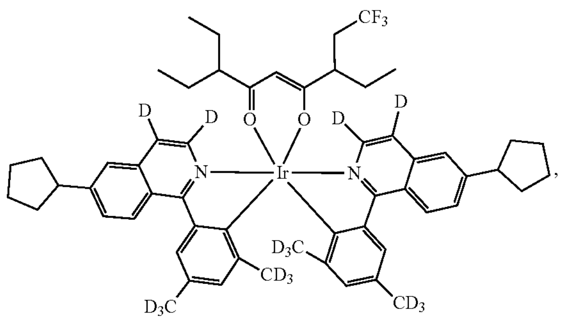
$Ir(L_{a610})_2(L_{b361})$
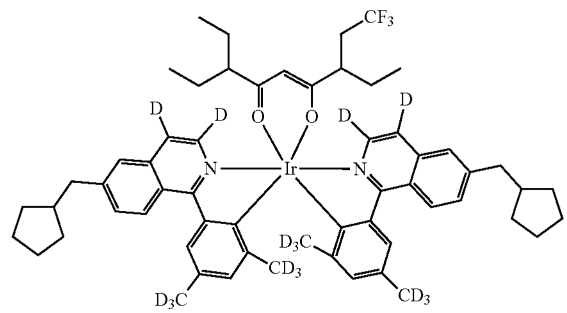
$Ir(_{a3})_2(L_{b366})$
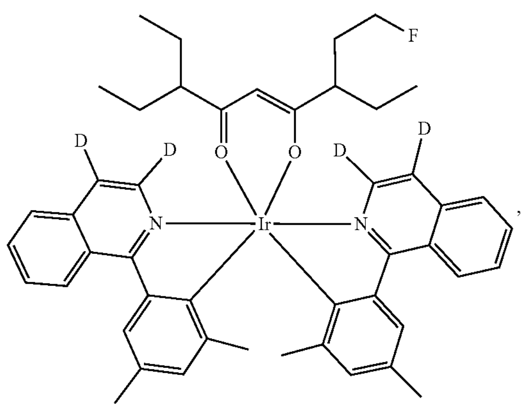
$Ir(L_{a44})_2(L_{b366})$
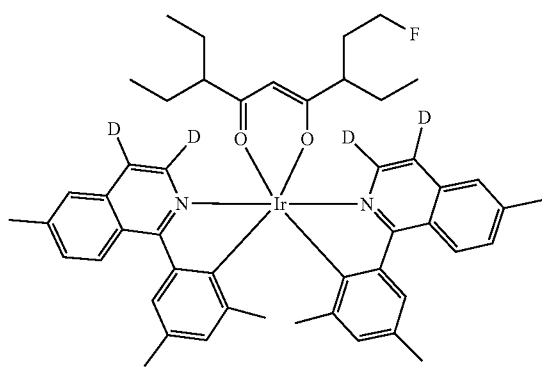
$Ir(L_{a126})_2(L_{b366})$
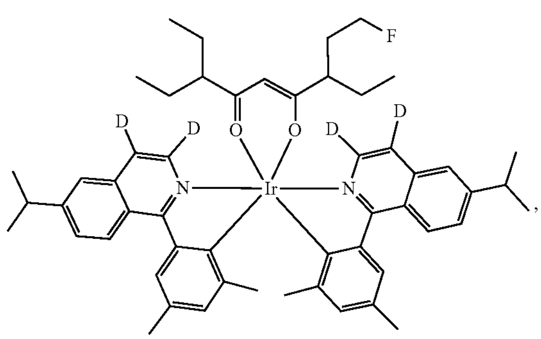
$Ir(L_{a167})_2(L_{b366})$
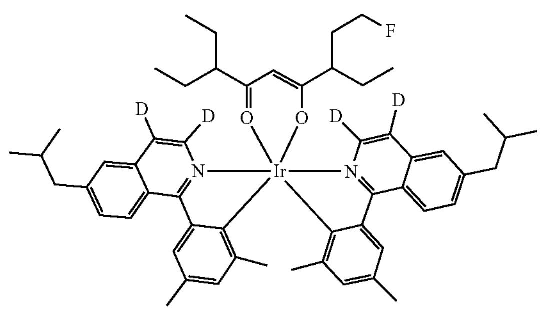
$Ir(L_{a331})_2(L_{b366})$
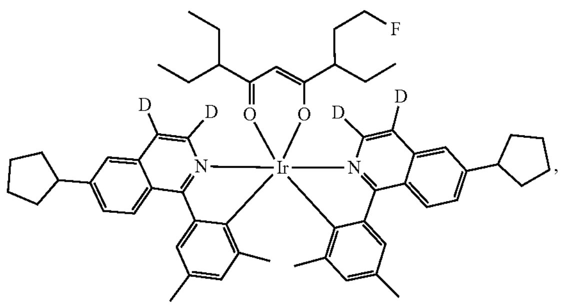

-continued
$Ir(L_{a577})_2(L_{b366})$
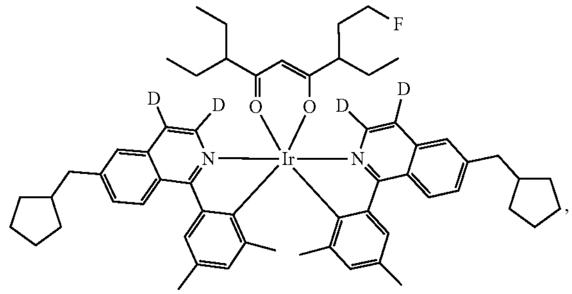
$Ir(L_{a372})_2(L_{b366})$
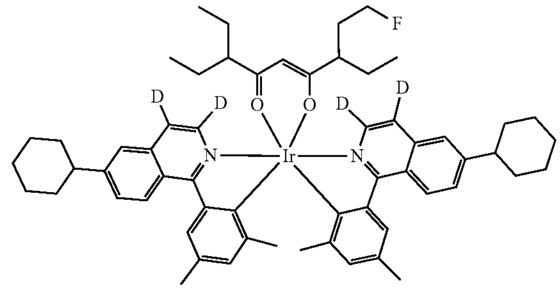
$Ir(L_{a659})_2(L_{b366})$
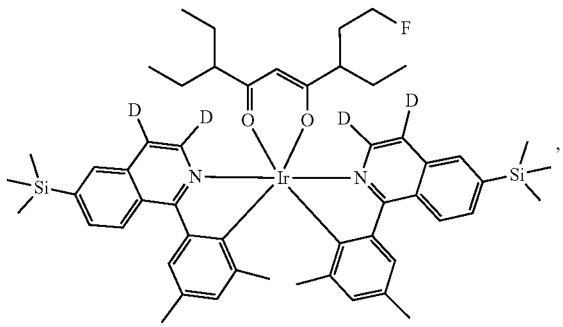
$Ir(L_{a159})_2(L_{b366})$
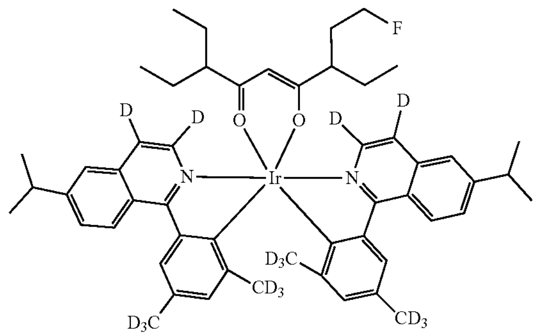
$Ir(L_{a364})_2(L_{b366})$
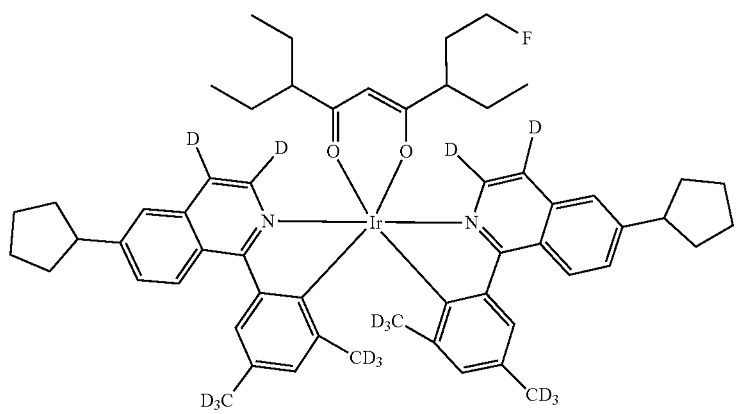
$Ir(L_{a610})_2(L_{b366})$
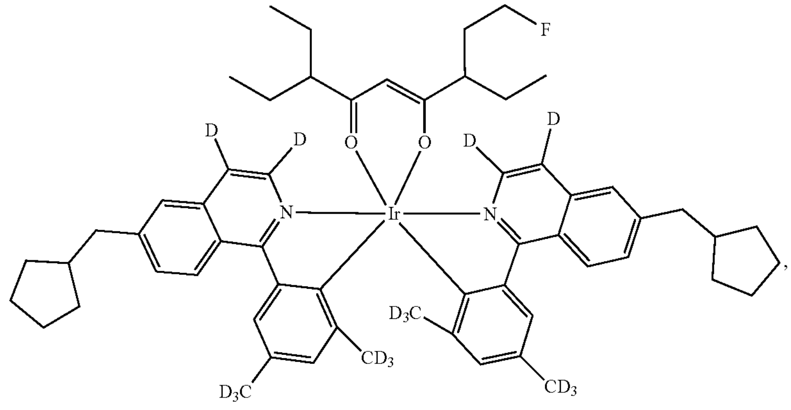

-continued
$Ir(L_{a3})_2(L_{b368})$
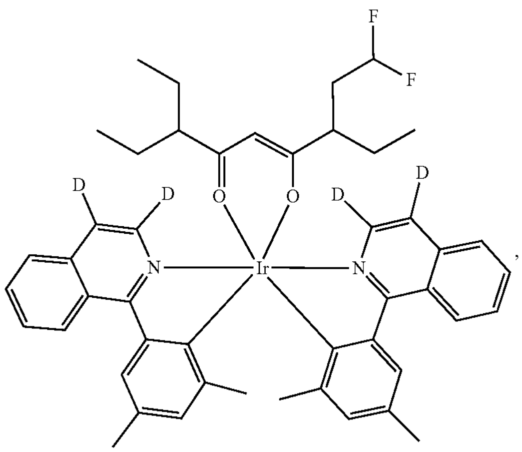
$Ir(L_{a126})_2(L_{b368})$
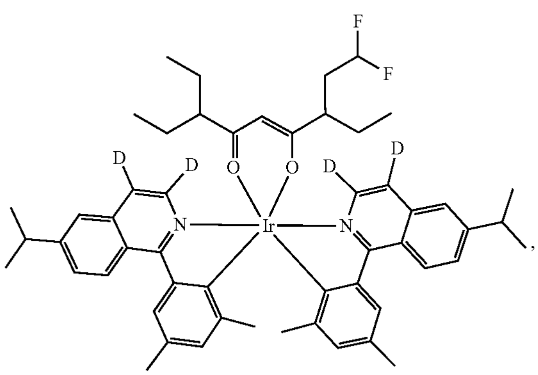
$Ir(L_{a331})_2(L_{b368})$
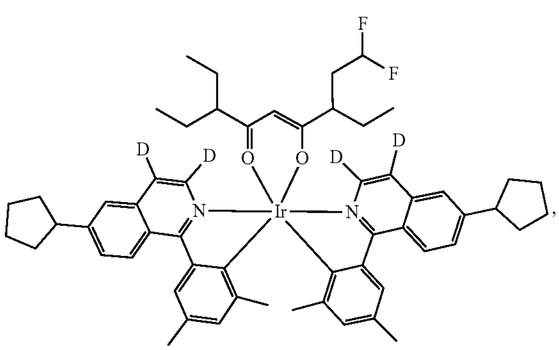
$Ir(L_{a372})_2(L_{b368})$
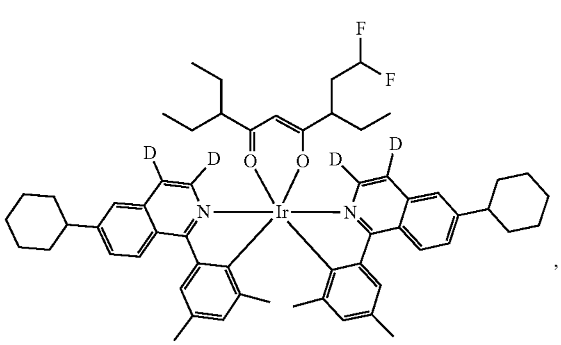
$Ir(L_{a44})_2(L_{b368})$
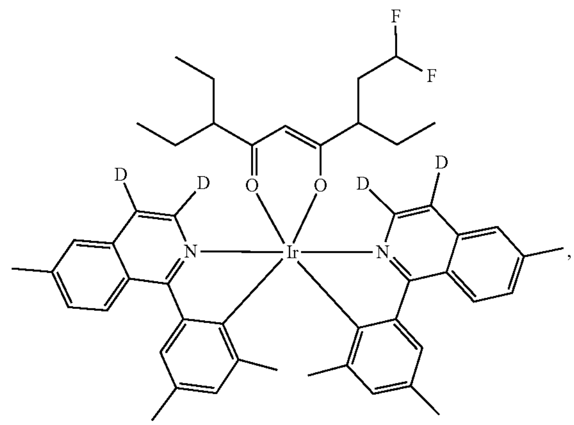
$Ir(L_{a167})_2(L_{b368})$
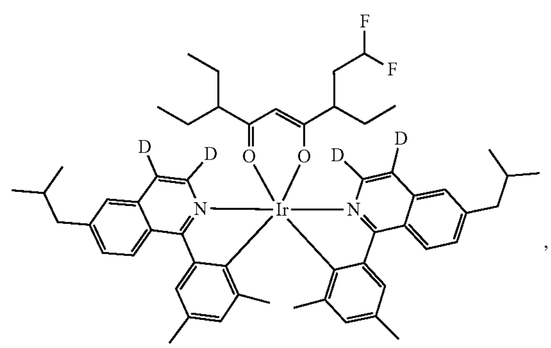
$Ir(L_{a577})_2(L_{b368})$
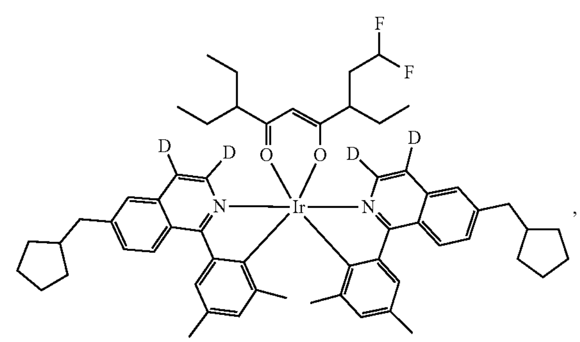
$Ir(L_{a659})_2(L_{b368})$
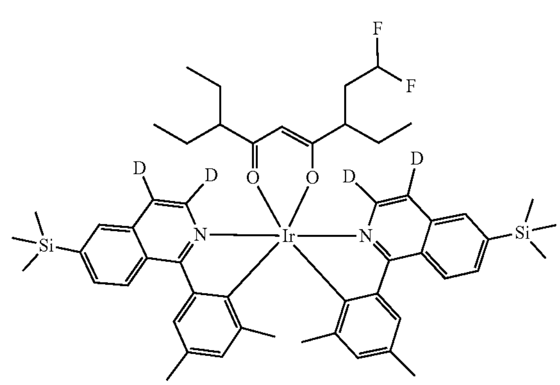

-continued
$Ir(L_{a159})_2(L_{b368})$
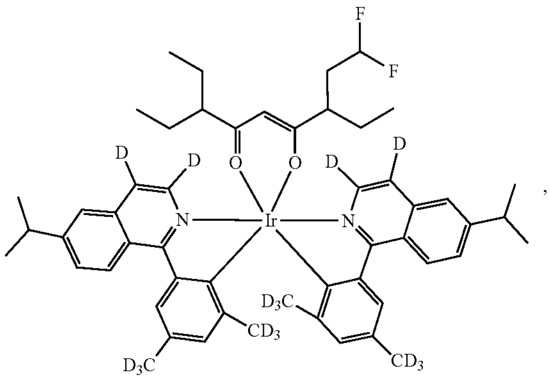
$Ir(L_{a364})_2(L_{b368})$
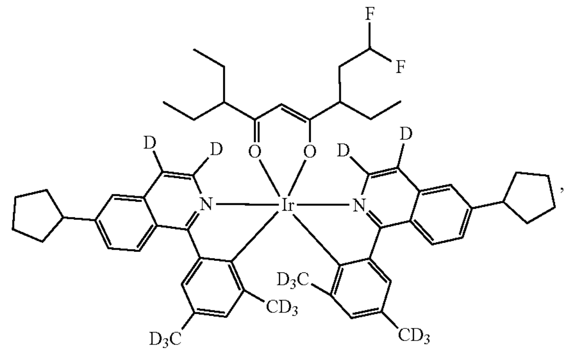
$Ir(L_{a610})_2(L_{b368})$
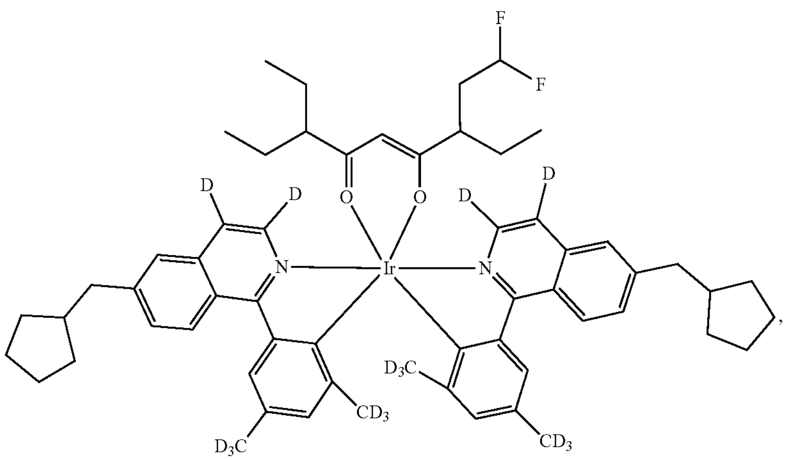
$Ir(L_{a3})_2(L_{b378})$
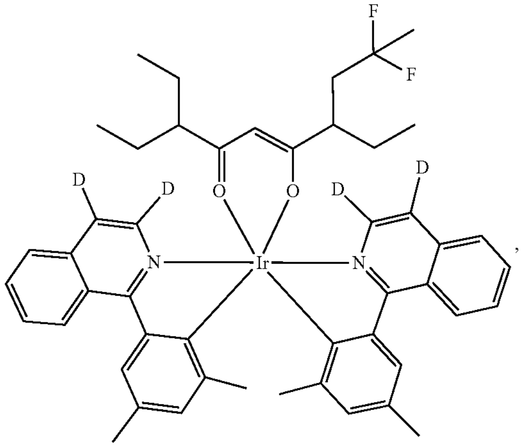
$Ir(L_{a44})_2(L_{b378})$
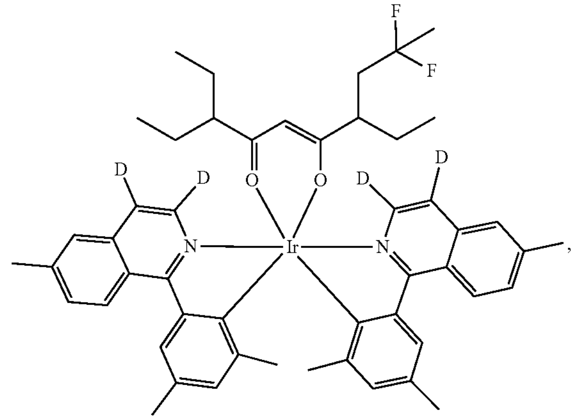

-continued
$Ir(L_{a126})_2(L_{b378})$
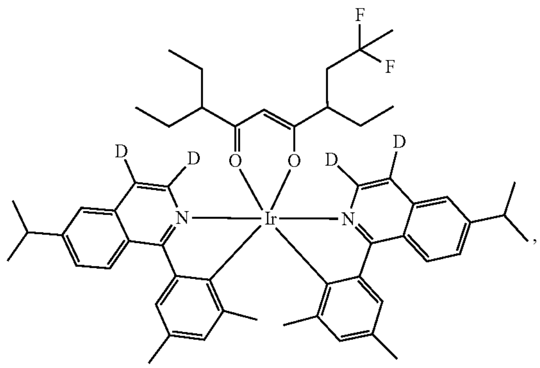
$Ir(L_{a167})_2(L_{b378})$
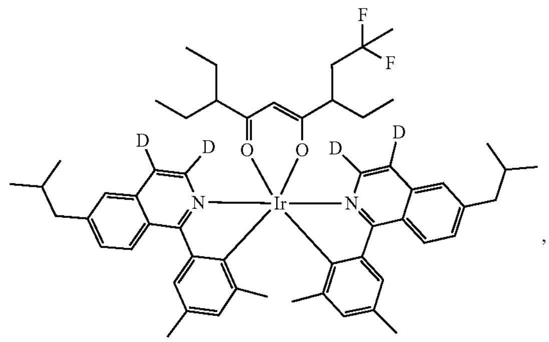
$Ir(L_{a331})_2(L_{b378})$
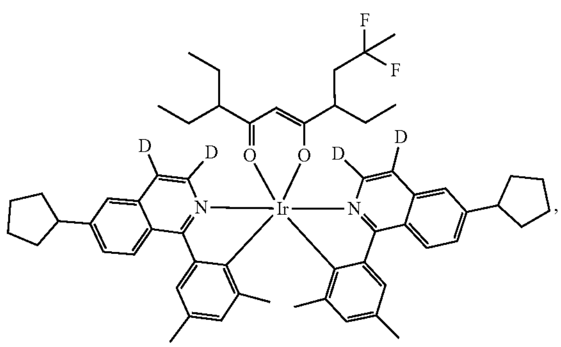
$Ir(L_{a577})_2(L_{b378})$
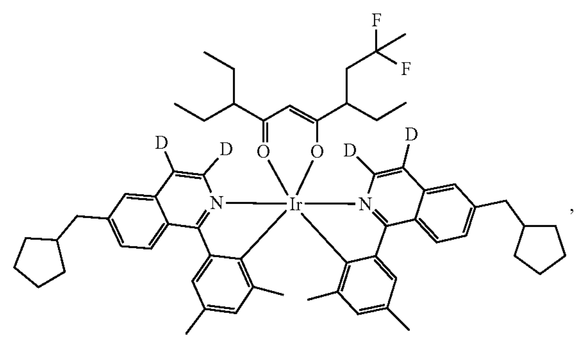
$Ir(L_{a372})_2(L_{b378})$
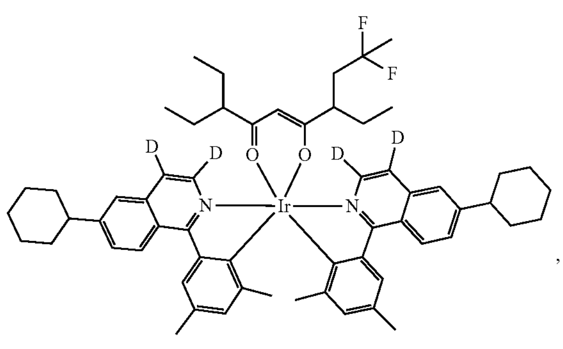
$Ir(L_{a659})_2(L_{b378})$
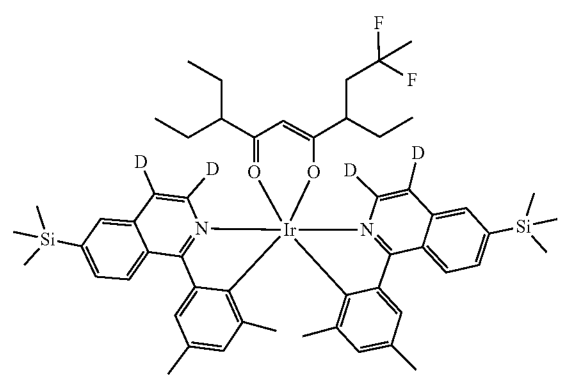
$Ir(L_{a159})_2(L_{b378})$
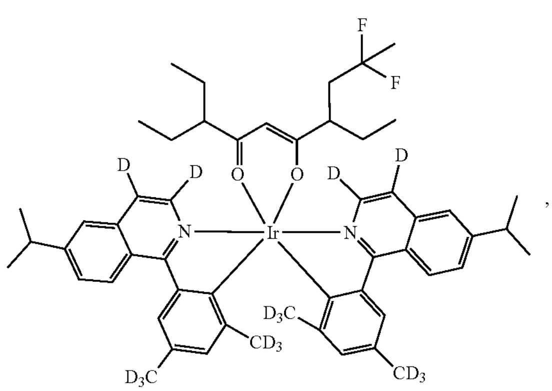
$Ir(L_{a364})_2(L_{b378})$
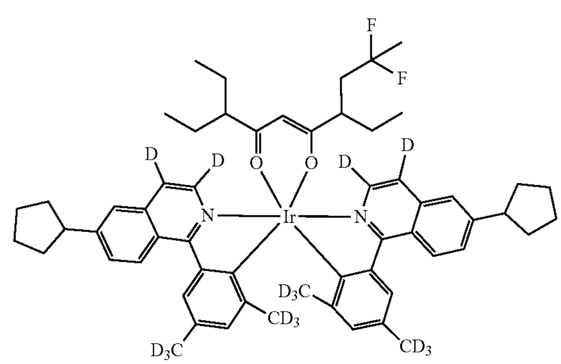

-continued
$Ir(L_{a610})_2(L_{b378})$
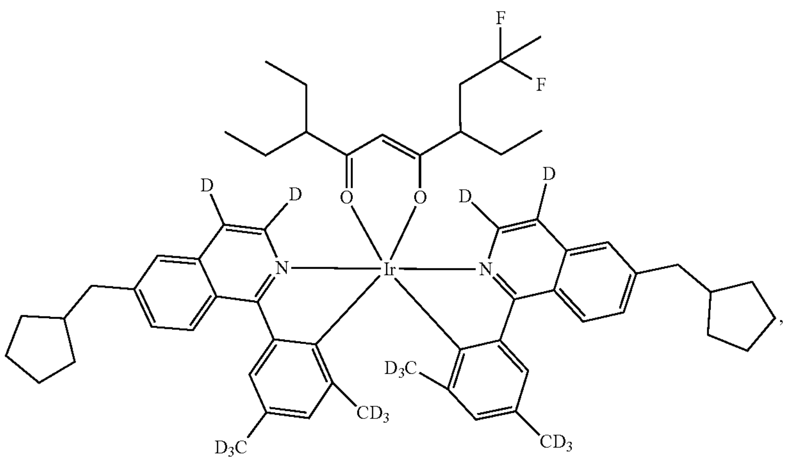
$Ir(L_{a44})(L_{a126})(L_{b31})$
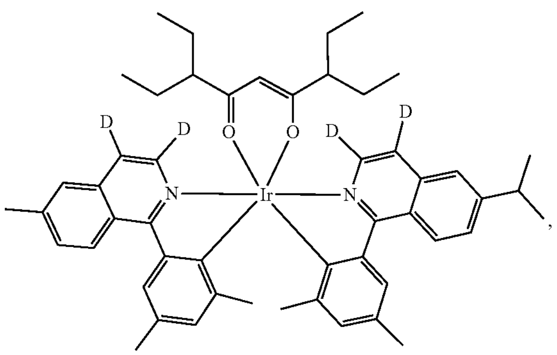
$Ir(L_{a44})(L_{a331})(L_{b31})$
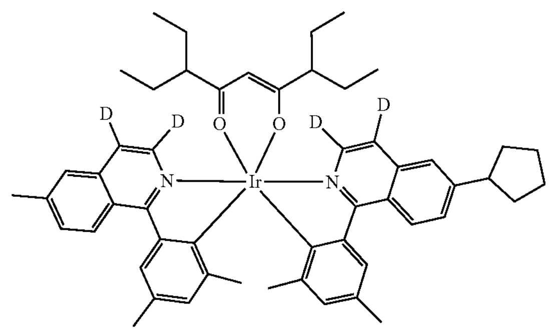
$Ir(L_{a126})(L_{a331})(L_{b31})$
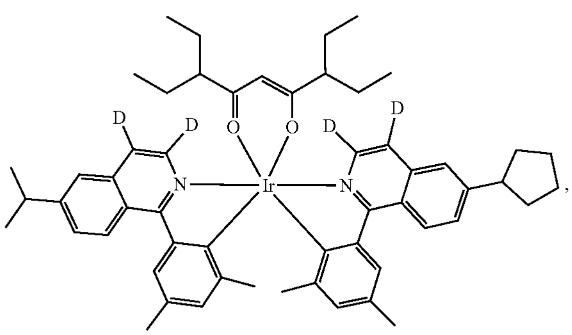
$Ir(L_{a126})(L_{a130})(L_{b31})$
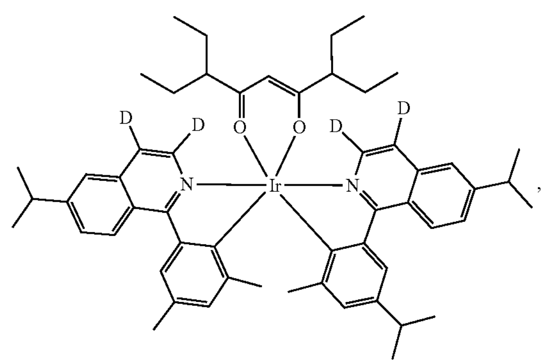
$Ir(L_{a331})(L_{a335})(L_{b31})$
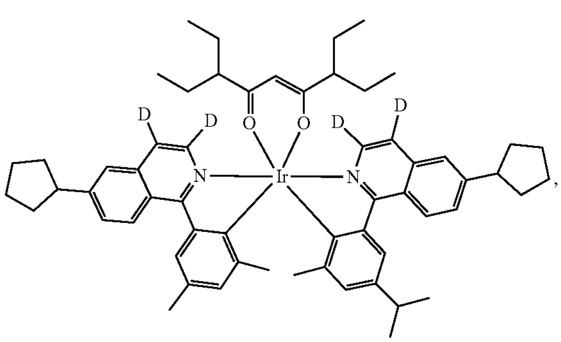
$Ir(L_{a44})(L_{a659})(L_{b31})$
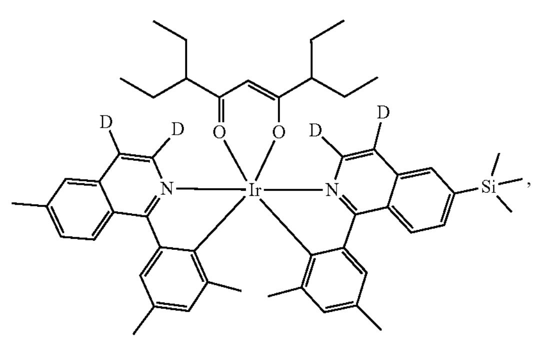

-continued
$Ir(L_{a159})(L_{a364})(L_{b31})$
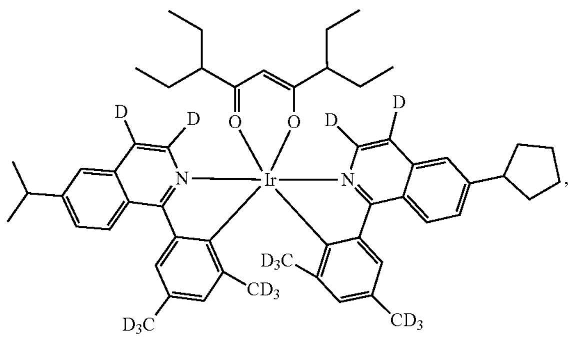
$Ir(L_{a44})(L_{a126})(L_{b101})$
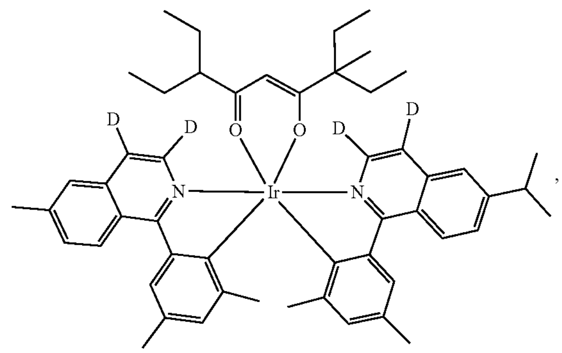
$Ir(L_{a44})(L_{a331})(L_{b101})$
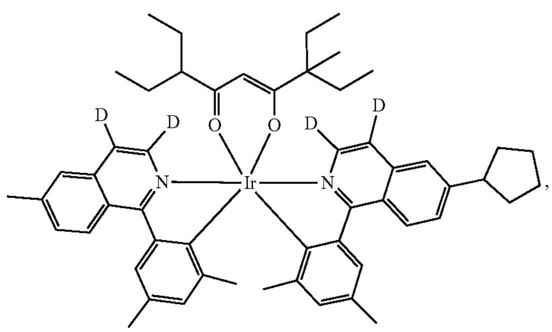
$Ir(L_{a126})(L_{a331})(L_{b101})$
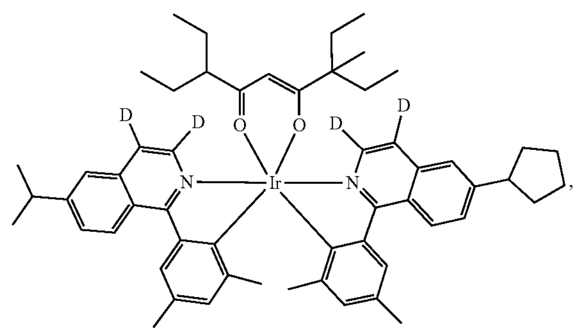
$Ir(L_{a126})(L_{a130})(L_{b101})$
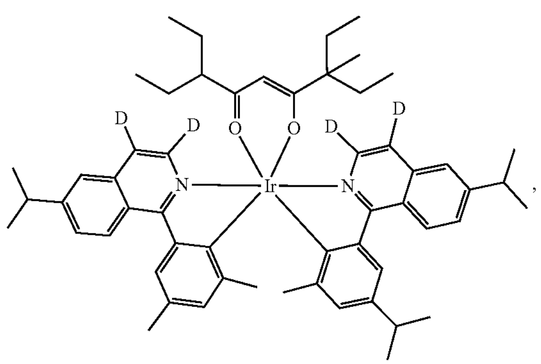
$Ir(L_{a126})(L_{a133})(L_{b101})$
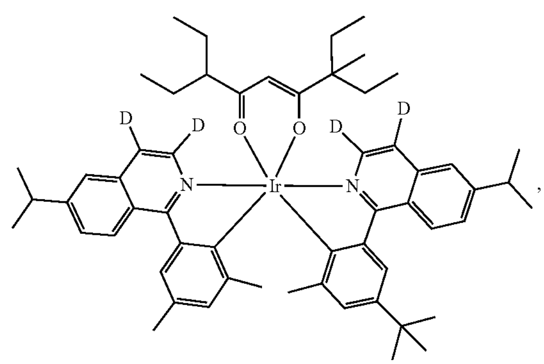
$Ir(L_{a331})(L_{a335})(L_{b101})$
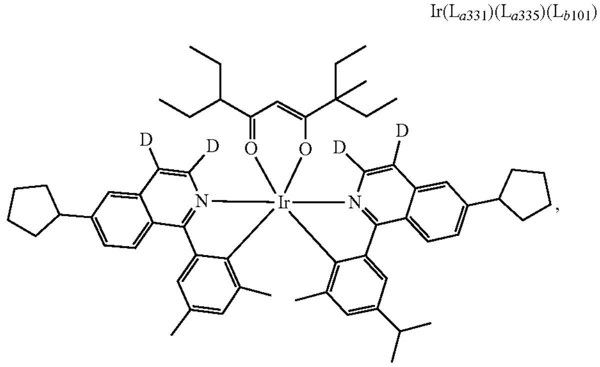
$Ir(L_{a44})(L_{a659})(L_{b101})$
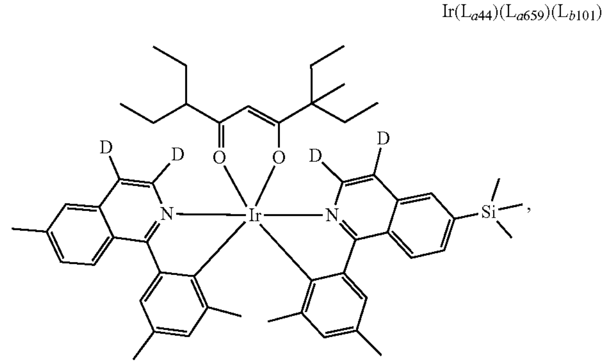

-continued
$Ir(L_{a159})(L_{a364})(L_{b101})$
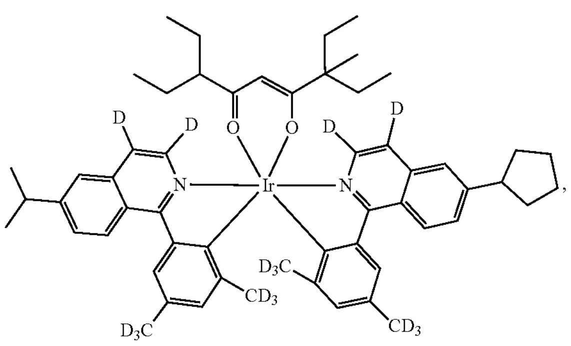
$Ir(L_{a44})(L_{a126})(L_{b361})$
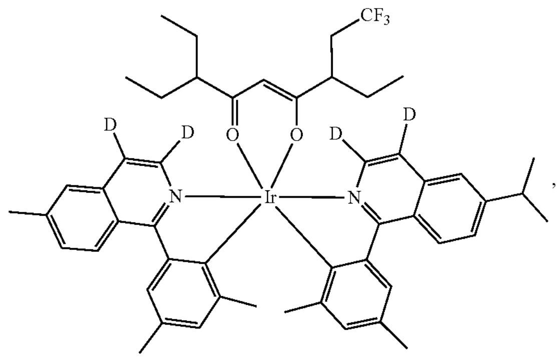
$Ir(L_{a44})(L_{a331})(L_{b361})$
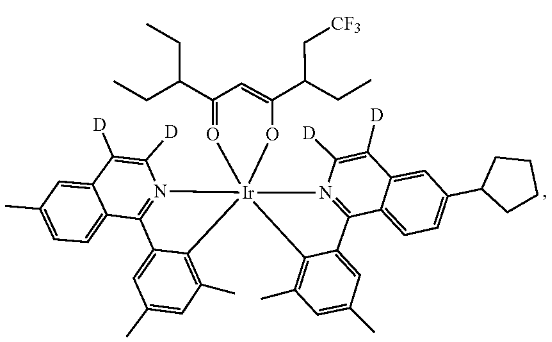
$Ir(L_{a126})(L_{a331})(L_{b361})$
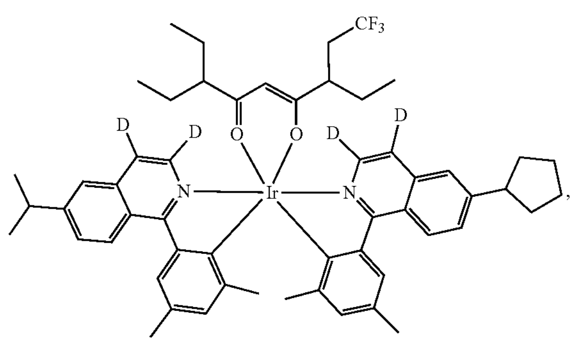
$Ir(L_{a126})(L_{a130})(L_{b361})$
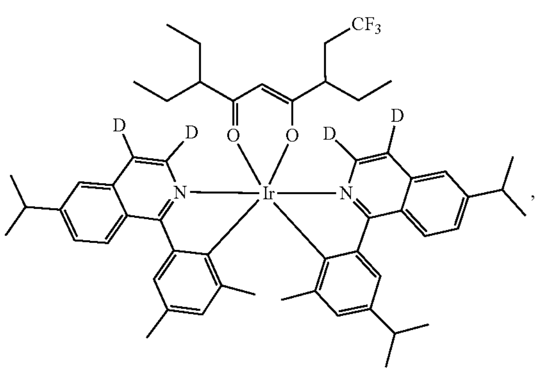
$Ir(L_{a126})(L_{a133})(L_{b361})$
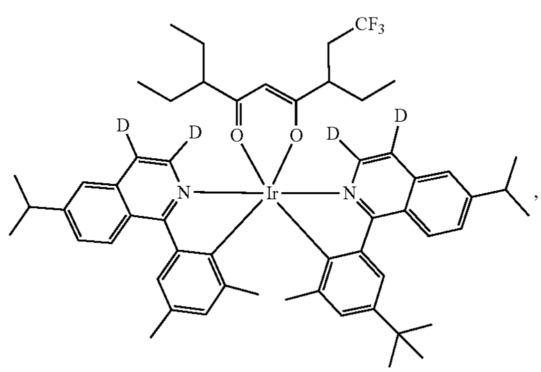
$Ir(L_{a331})(L_{a335})(L_{b361})$
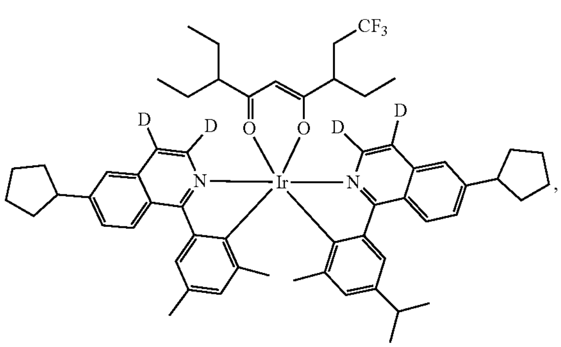
$Ir(L_{a44})(L_{a659})(L_{b361})$
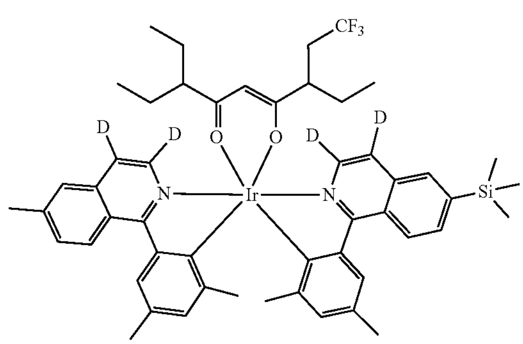

-continued
Ir(L$_{a159}$)(L$_{a364}$)(L$_{b361}$)
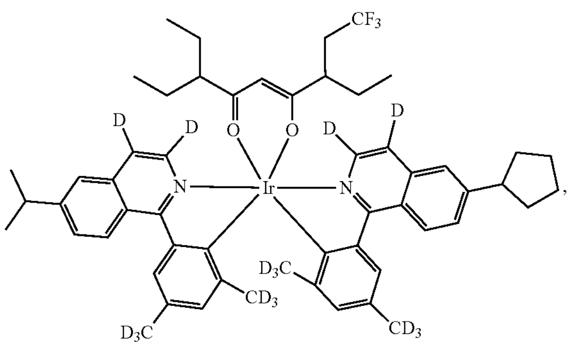
Ir(L$_{a44}$)(L$_{a126}$)(L$_{b366}$)
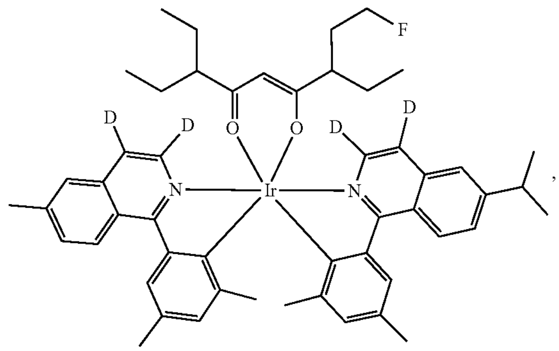
Ir(L$_{a44}$)(L$_{a331}$)(L$_{b366}$)
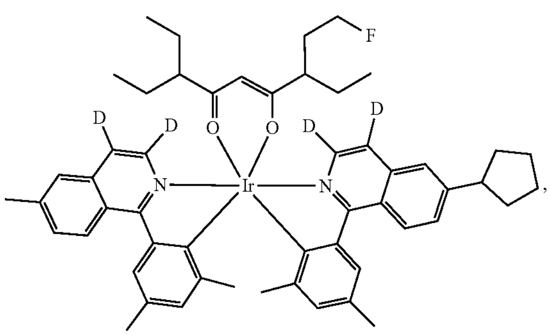
Ir(L$_{a126}$)(L$_{a331}$)(L$_{b366}$)
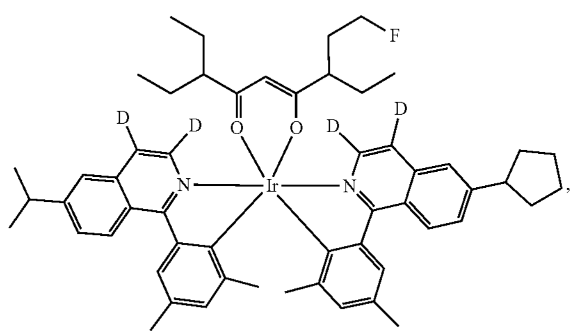
Ir(L$_{a44}$)(L$_{a659}$)(L$_{b366}$)
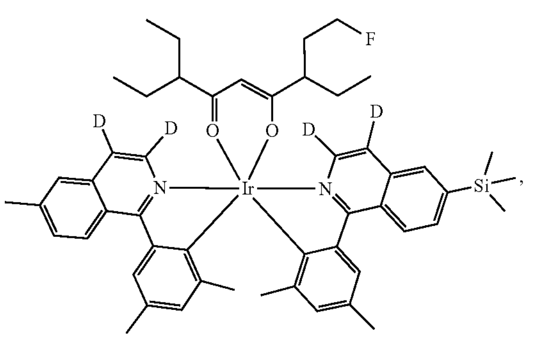
Ir(L$_{a159}$)(L$_{a364}$)(L$_{b366}$)
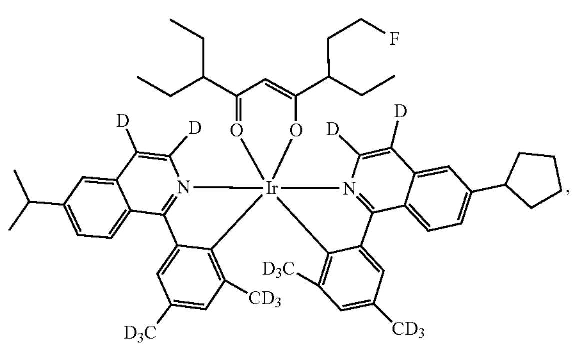
Ir(L$_{a44}$)(L$_{a126}$)(L$_{b368}$)
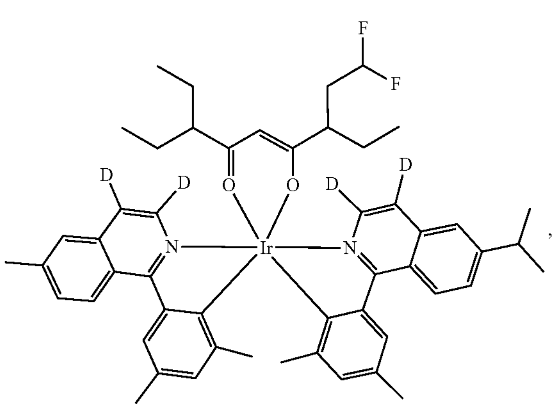
Ir(L$_{a44}$)(L$_{a331}$)(L$_{b368}$)
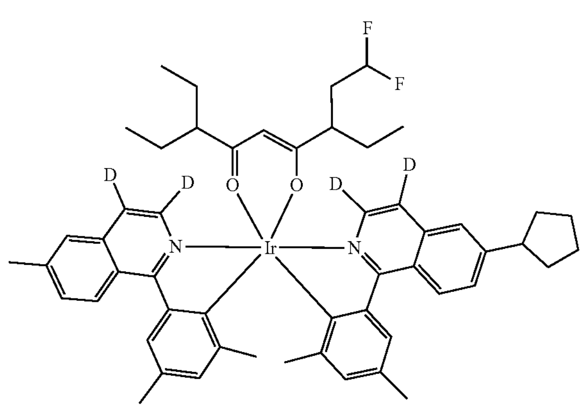

-continued
Ir($L_{a126}$)($L_{a331}$)($L_{b368}$)
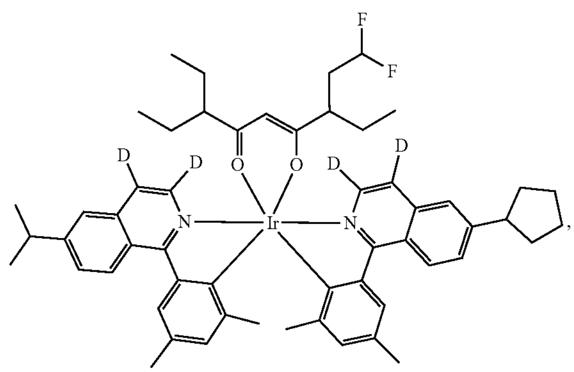
Ir($L_{a44}$)($L_{a659}$)($L_{b368}$)
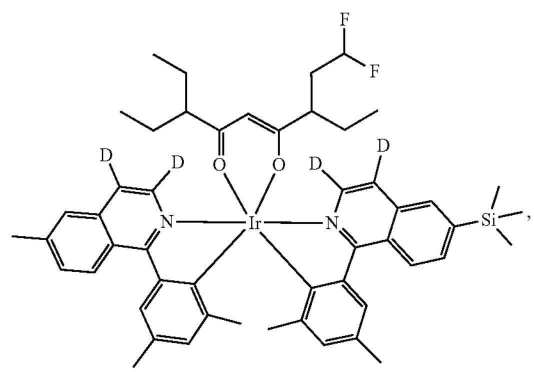
Ir($L_{a159}$)($L_{a364}$)($L_{b368}$)
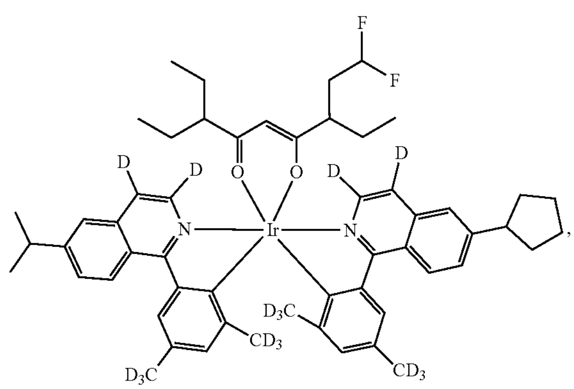
Ir($L_{a44}$)($L_{a126}$)($L_{b378}$)
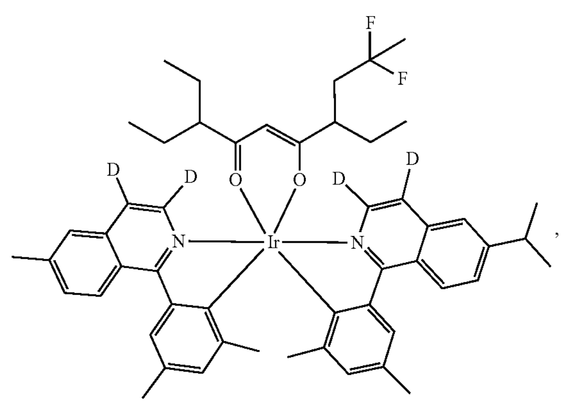
Ir($L_{a44}$)($L_{a331}$)($L_{b378}$)
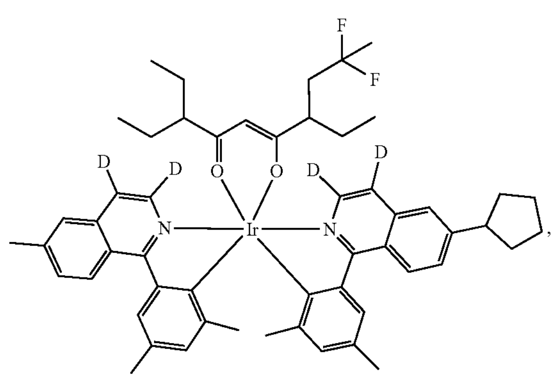
Ir($L_{a126}$)($L_{a331}$)($L_{b378}$)
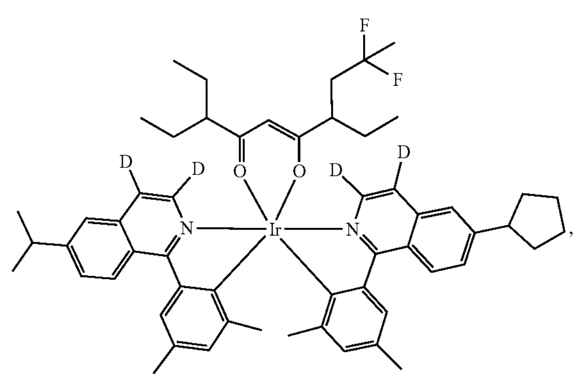
Ir($L_{a44}$)($L_{a659}$)($L_{b378}$)
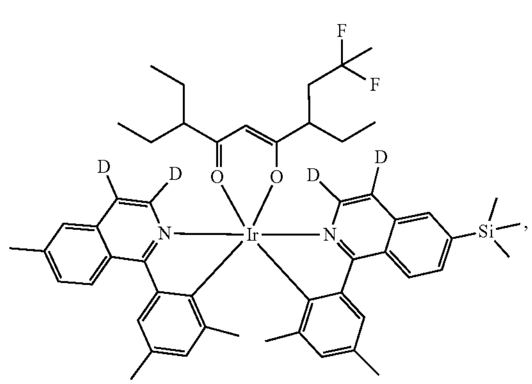
Ir($L_{a159}$)($L_{a364}$)($L_{b378}$)
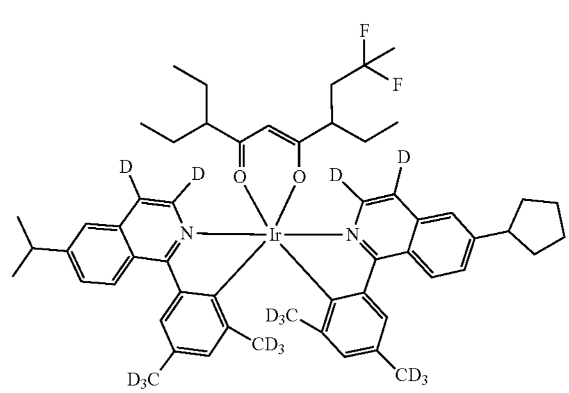

-continued
$Ir(L_{a44})(L_{b31})(L_{c31})$
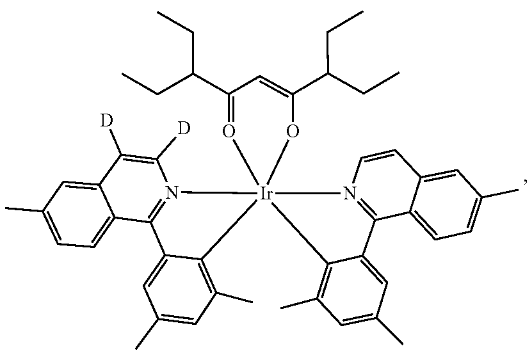
$Ir(L_{a126})(L_{b31})(L_{c41})$
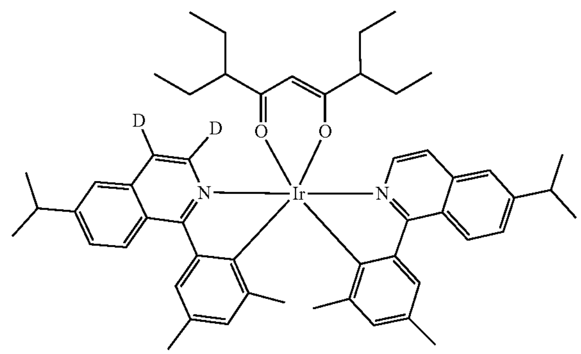
$Ir(L_{a331})(L_{b31})(L_{c61})$
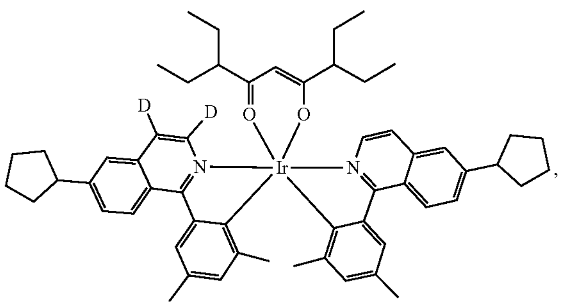
$Ir(L_{a372})(L_{b31})(L_{c61})$
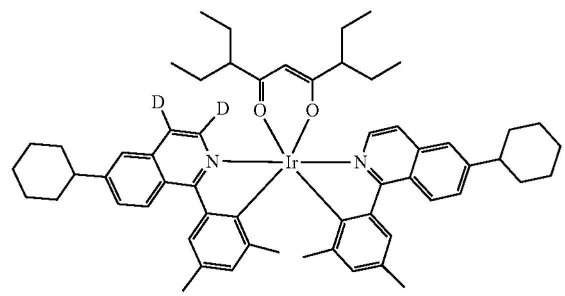
$Ir(L_{a659})(L_{b31})(L_{c91})$
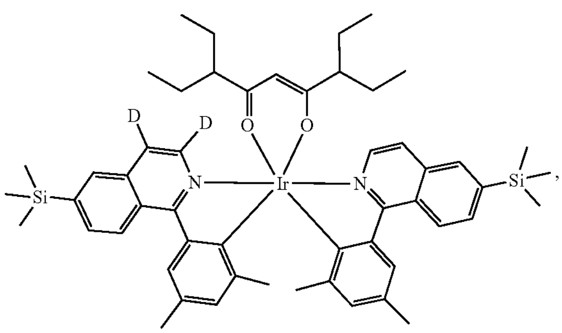
$Ir(L_{a44})(L_{b31})(L_{c61})$
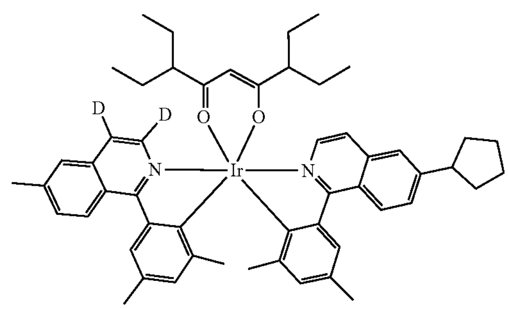
$Ir(L_{a331})(L_{b31})(L_{c31})$
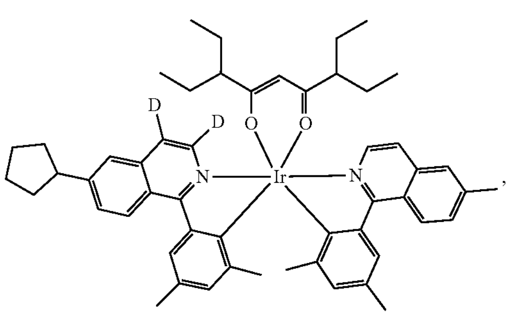
$Ir(L_{a159})(L_{b31})(L_{c48})$
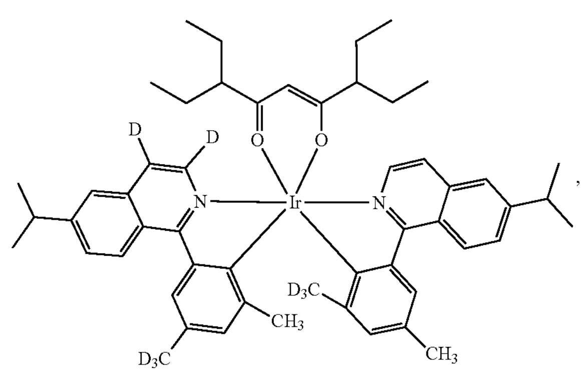

-continued
Ir($L_{a364}$)($L_{b31}$)($L_{c68}$)
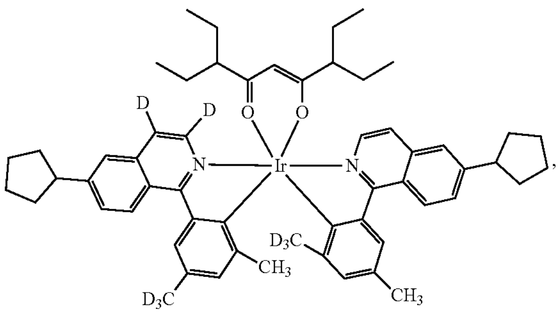
Ir($L_{a577}$)($L_{b31}$)($L_{c71}$)
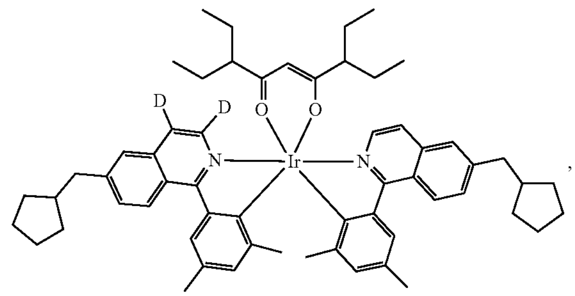
Ir($L_{a126}$)($L_{b31}$)($L_{c1}$)
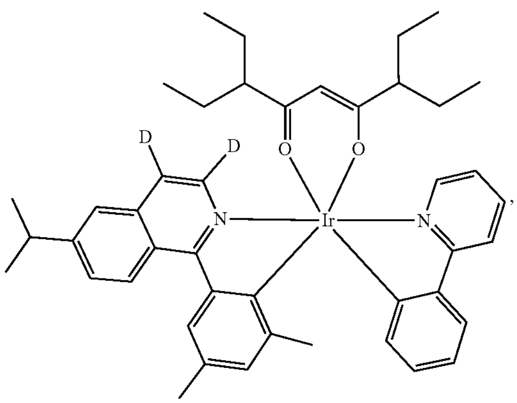
Ir($L_{a126}$)($L_{b31}$)($L_{c19}$)
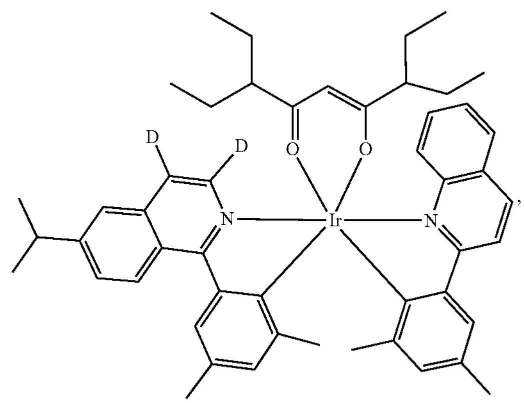
Ir($L_{a44}$)($L_{b101}$)($L_{c31}$)
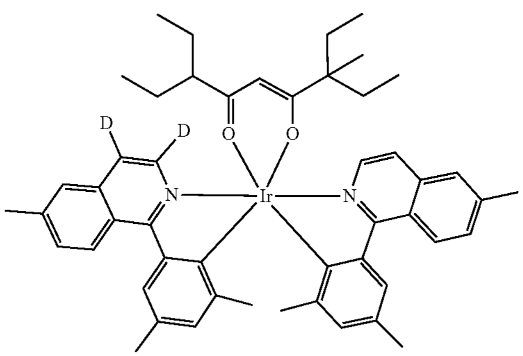
Ir($L_{a126}$)($L_{b101}$)($L_{c41}$)
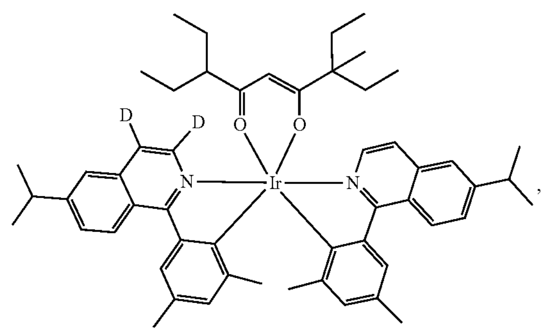
Ir($L_{a331}$)($L_{b101}$)($L_{c61}$)
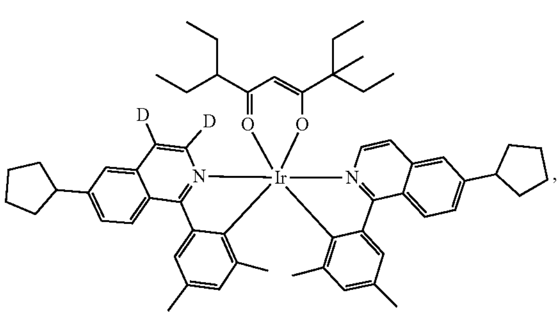
Ir($L_{a577}$)($L_{b101}$)($L_{c71}$)
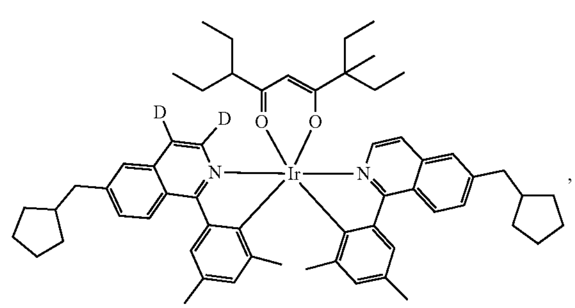

-continued
Ir($L_{a372}$)($L_{b101}$)($L_{c81}$)
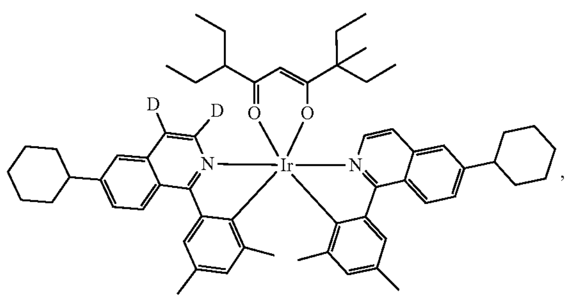
Ir($L_{a659}$)($L_{b101}$)($L_{c91}$)
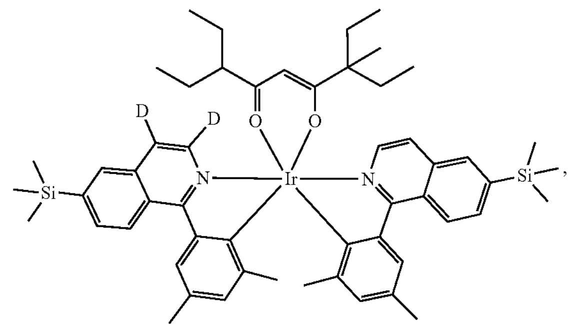
Ir($L_{a44}$)($L_{b101}$)($L_{c61}$)
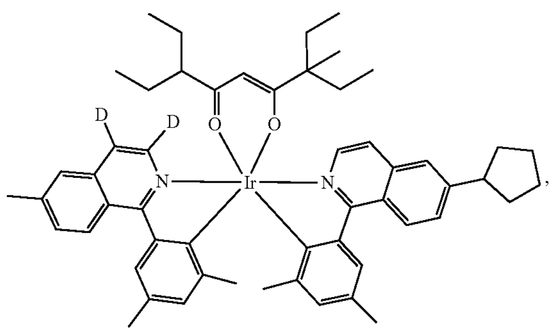
Ir($L_{a331}$)($L_{b101}$)($L_{c31}$)
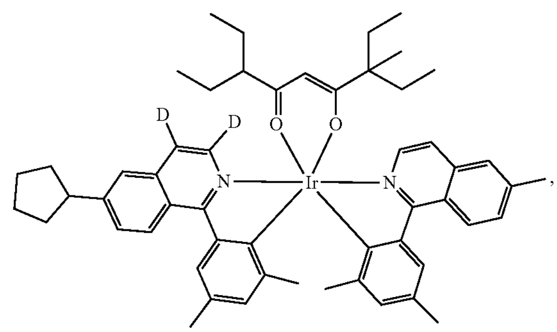
Ir($L_{a159}$)($L_{b101}$)($L_{c48}$)
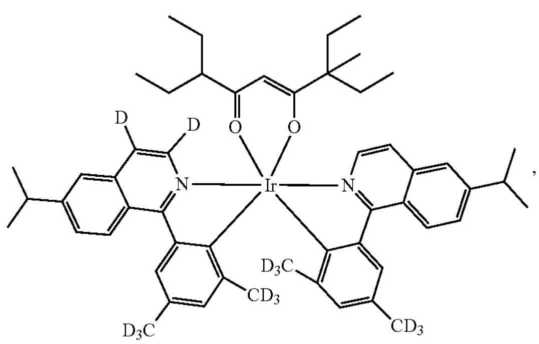
Ir($L_{a364}$)($L_{b101}$)($L_{c68}$)
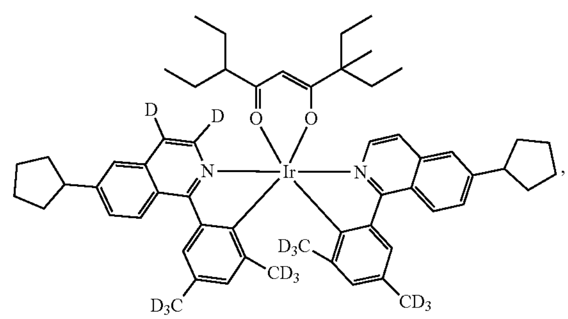
Ir($L_{a126}$)($L_{b101}$)($L_{c1}$)
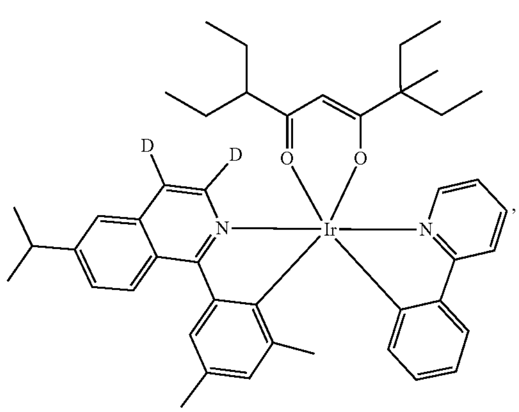
Ir($L_{a126}$)($L_{b101}$)($L_{c19}$)
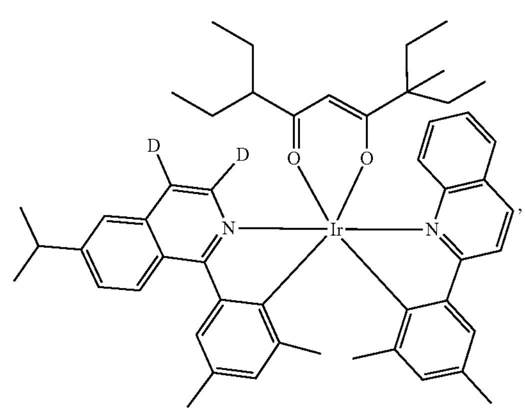

-continued
$Ir(L_{a44})(L_{b361})(L_{c31})$
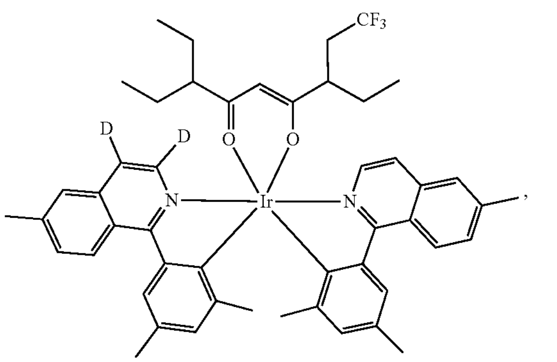
$Ir(L_{a126})(L_{b361})(L_{c41})$
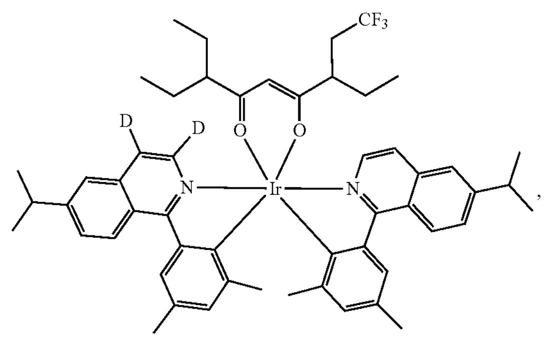
$Ir(L_{a331})(L_{b361})(L_{c61})$
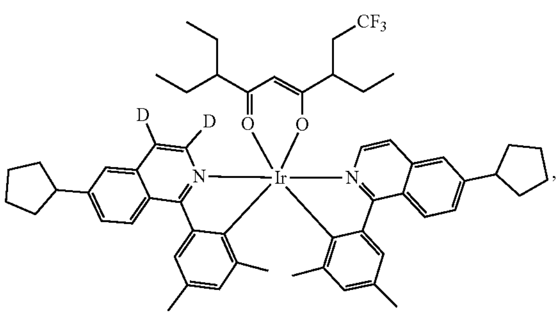
$Ir(L_{a577})(L_{b361})(L_{c71})$
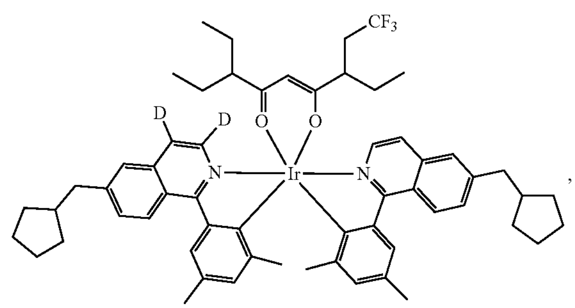
$Ir(L_{a372})(L_{b361})(L_{c81})$
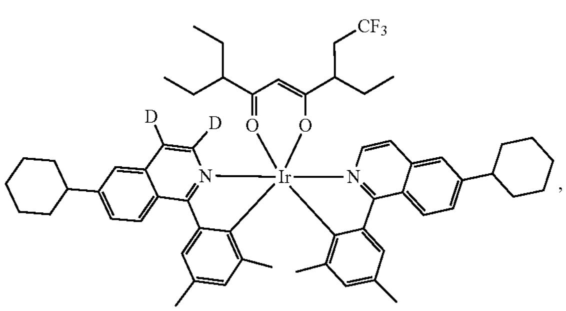
$Ir(L_{a659})(L_{b361})(L_{c91})$
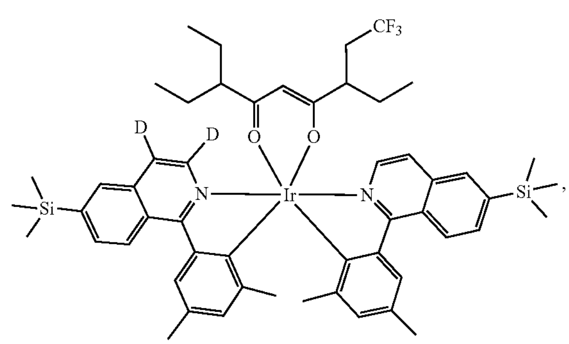
$Ir(L_{a44})(L_{b361})(L_{c61})$
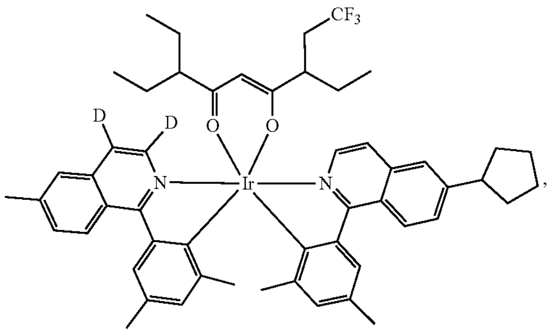
$Ir(L_{a331})(L_{b361})(L_{c31})$
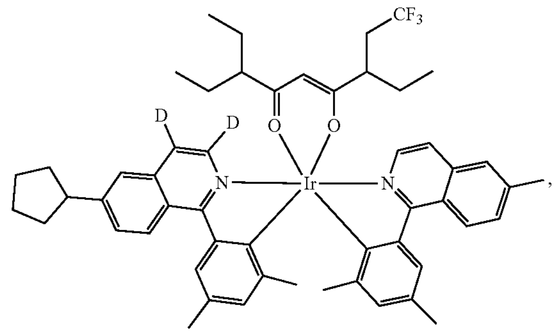

-continued
$Ir(L_{a159})(L_{b361})(L_{c48})$
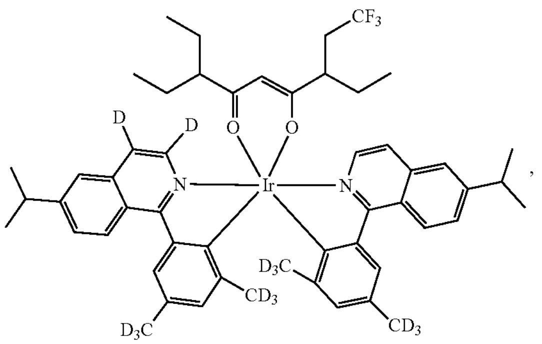
$Ir(L_{a364})(L_{b361})(L_{c68})$
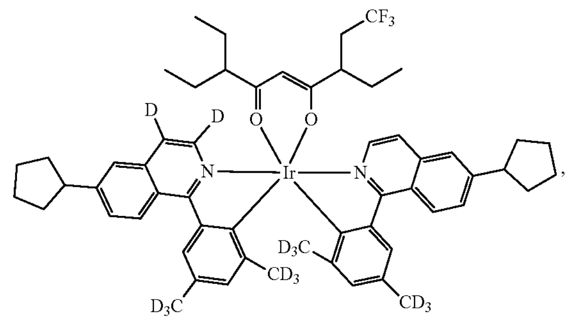
$Ir(L_{a126})(L_{b361})(L_{c1})$
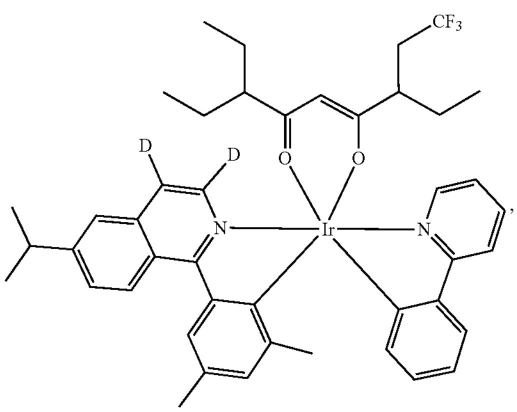
$Ir(L_{a126})(L_{b361})(L_{c19})$
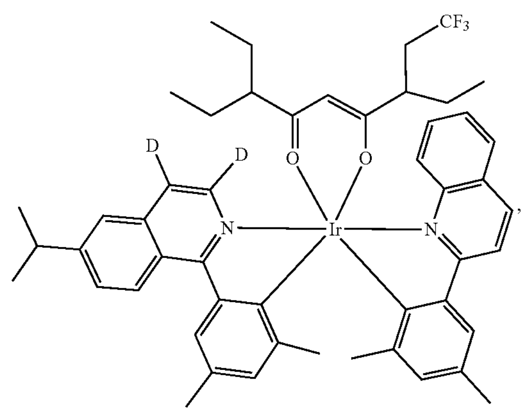
$Ir(L_{a44})(L_{b366})(L_{c31})$
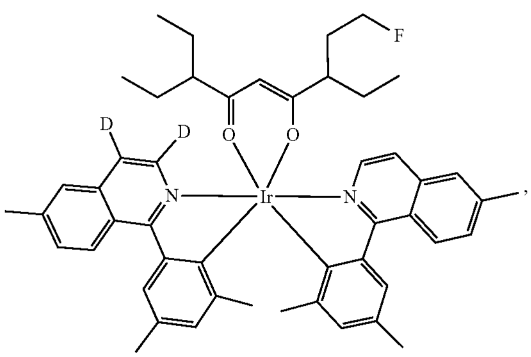
$Ir(L_{a126})(L_{b366})(L_{c41})$
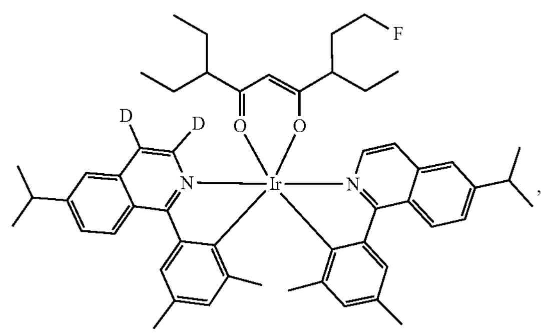
$Ir(L_{a331})(L_{b366})(L_{c61})$
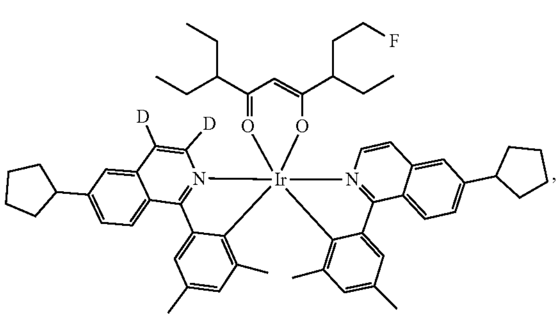
$Ir(L_{a577})(L_{b366})(L_{c71})$
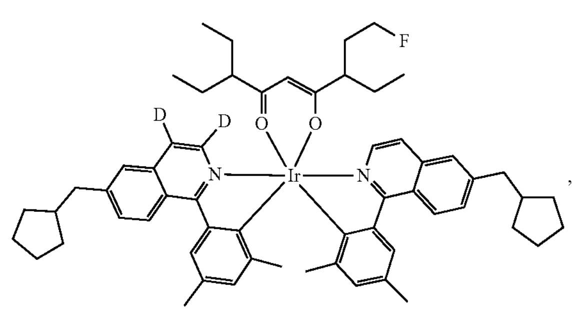

-continued
Ir(L$_{a372}$)(L$_{b366}$)(L$_{c81}$)
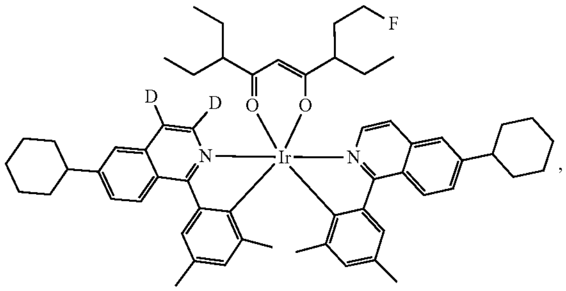
Ir(L$_{a659}$)(L$_{b366}$)(L$_{c91}$)
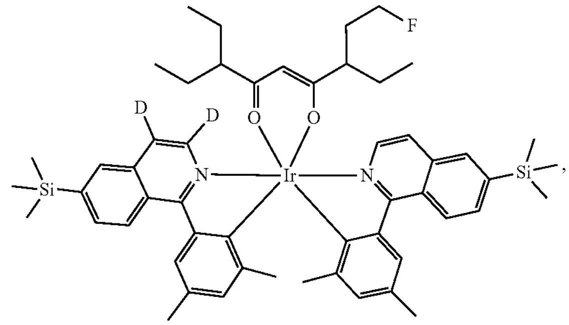
Ir(L$_{a44}$)(L$_{b368}$)(L$_{c31}$)
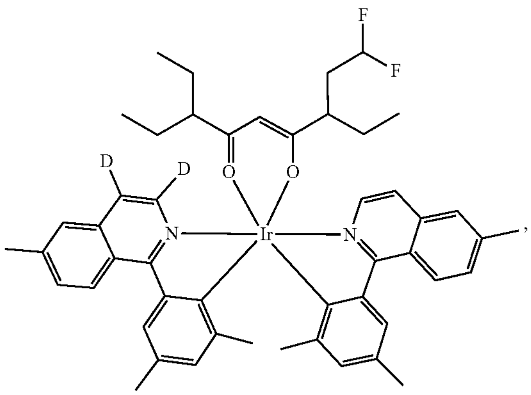
Ir(L$_{a126}$)(L$_{b368}$)(L$_{c41}$)
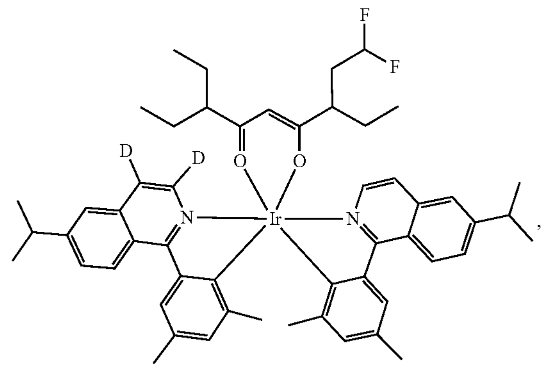
Ir(L$_{a331}$)(L$_{b368}$)(L$_{c61}$)
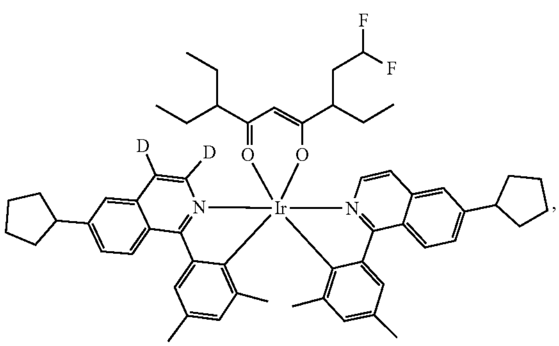
Ir(L$_{a577}$)(L$_{b368}$)(L$_{c71}$)
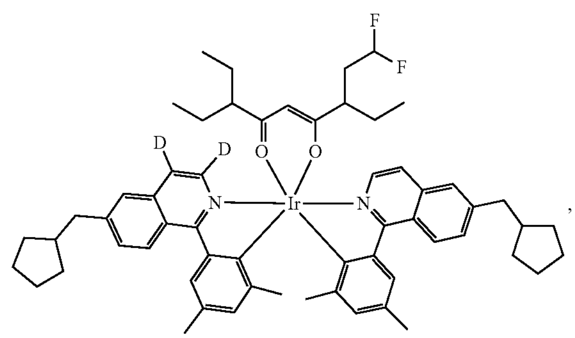
Ir(L$_{a372}$)(L$_{b368}$)(L$_{c81}$)
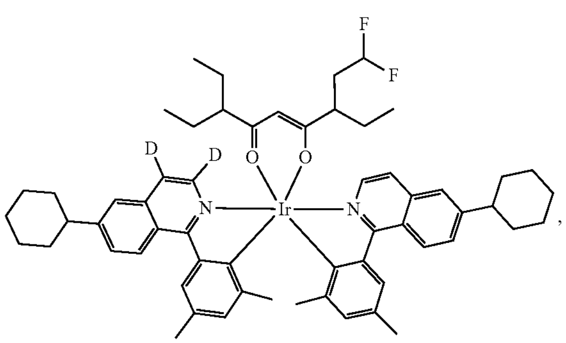
Ir(L$_{a659}$)(L$_{b368}$)(L$_{c91}$)
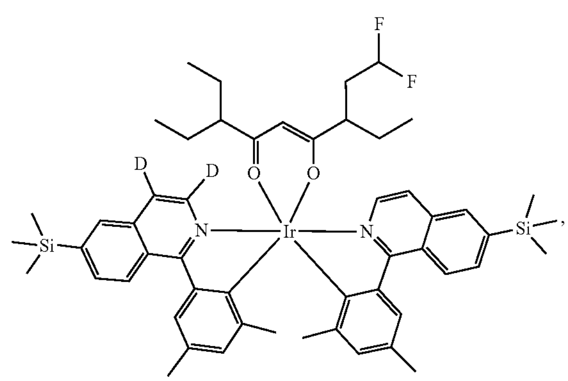

-continued
$Ir(L_{a44})(L_{b378})(L_{c31})$
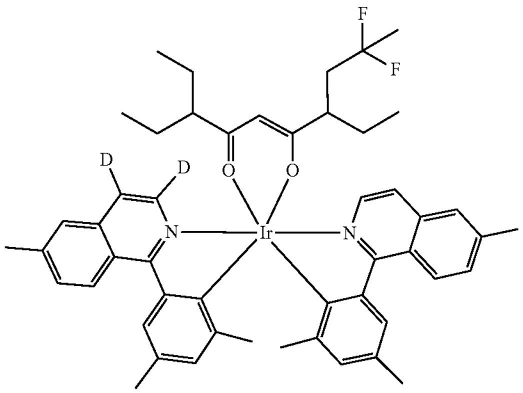
$Ir(L_{a126})(L_{b378})(L_{c41})$
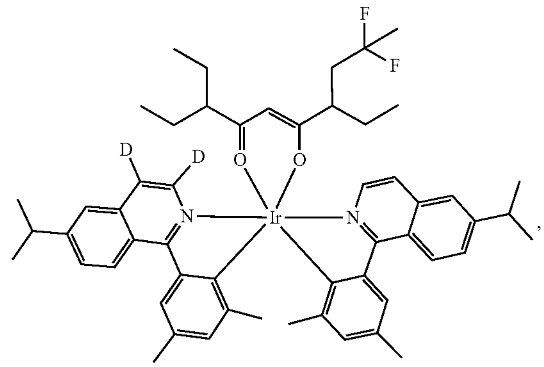
$Ir(L_{a331})(L_{b378})(L_{c61})$
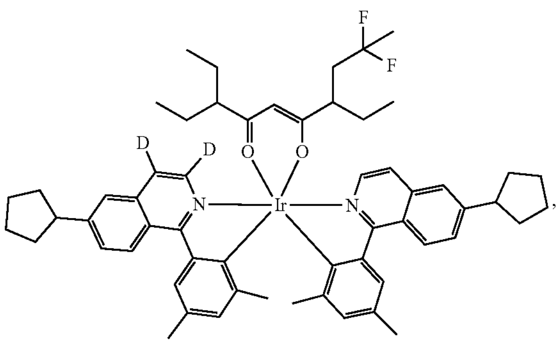
$Ir(L_{a577})(L_{b378})(L_{c71})$
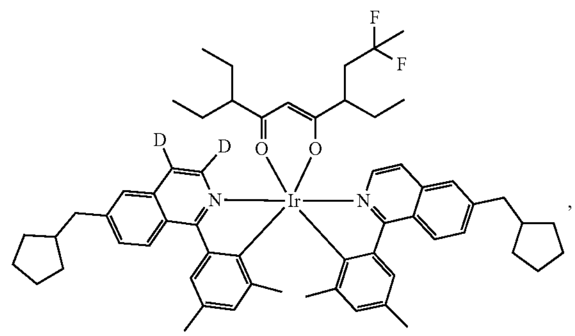
$Ir(L_{a372})(L_{b378})(L_{c81})$
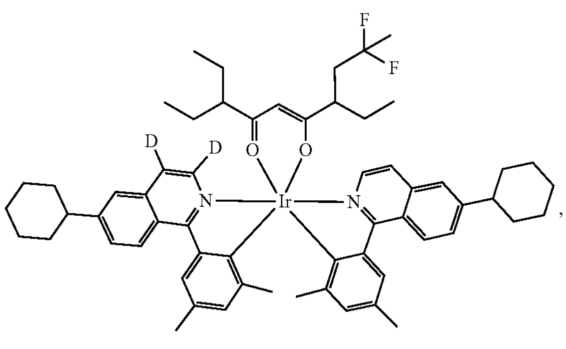
$Ir(L_{a659})(L_{b378})(L_{c91})$
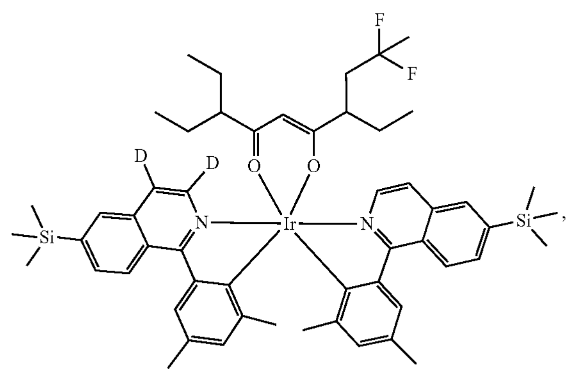
$Ir(L_{a44})(L_{b31})(L_{c131})$
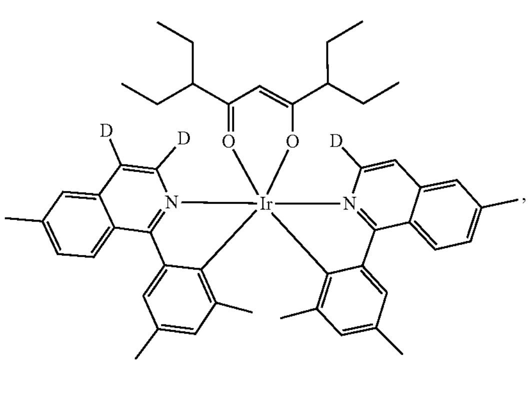
$Ir(L_{a126})(L_{b31})(L_{c141})$
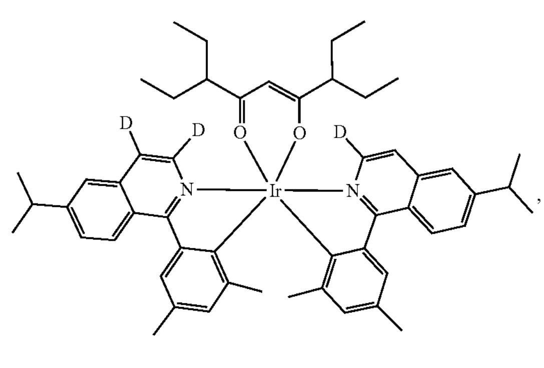

-continued
$Ir(L_{a331})(L_{b31})(L_{c161})$
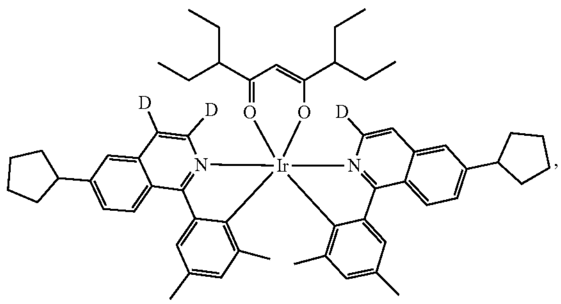
$Ir(L_{a372})(L_{b31})(L_{c180})$
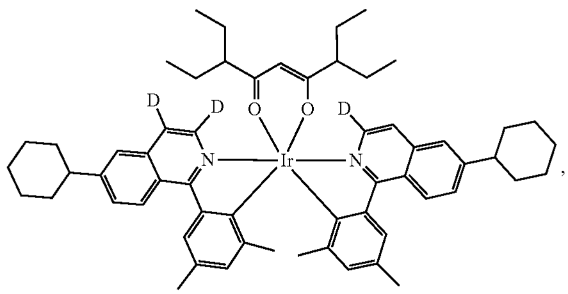
$Ir(L_{a44})(L_{b31})(L_{c161})$
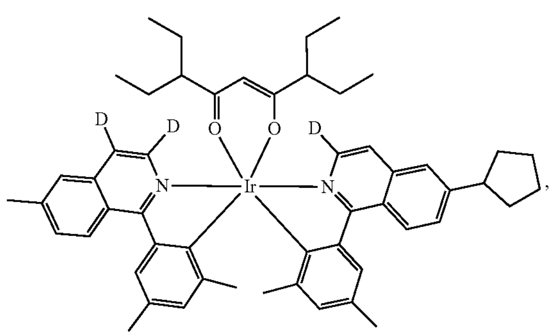
$Ir(L_{a159})(L_{b31})(L_{c148})$
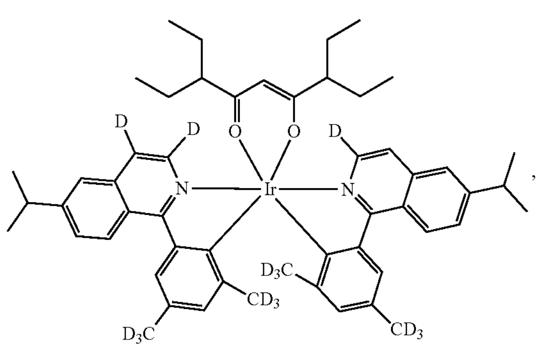
$Ir(L_{a577})(L_{b31})(L_{c171})$
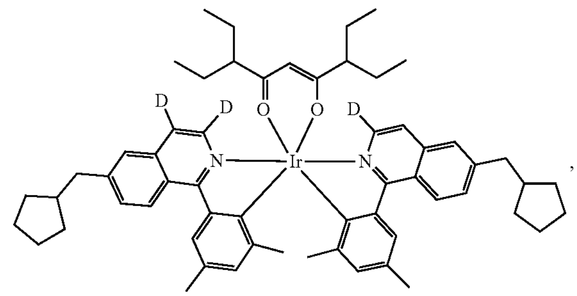
$Ir(L_{a659})(L_{b31})(L_{c190})$
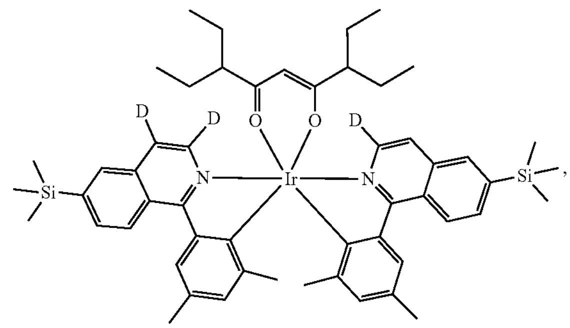
$Ir(L_{a331})(L_{b31})(L_{c131})$
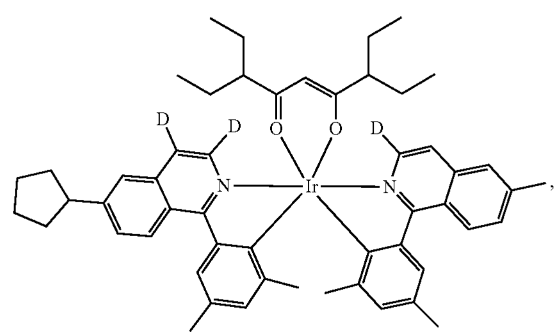
$Ir(L_{a364})(L_{b31})(L_{c168})$
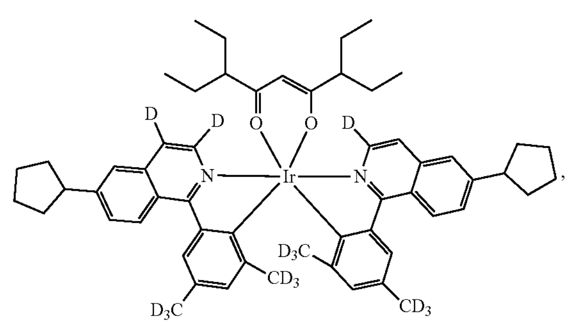

-continued
Ir($L_{a44}$)($L_{b101}$)($L_{c131}$)
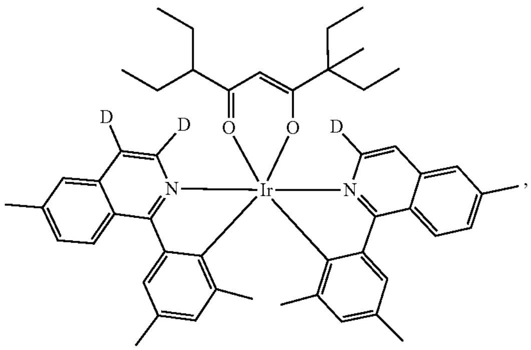
Ir($L_{a126}$)($L_{b101}$)($L_{c141}$)
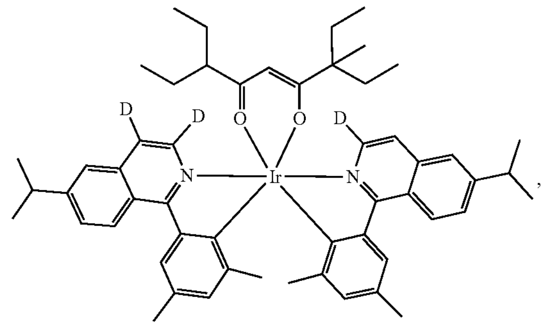
Ir($L_{a331}$)($L_{b101}$)($L_{c161}$)
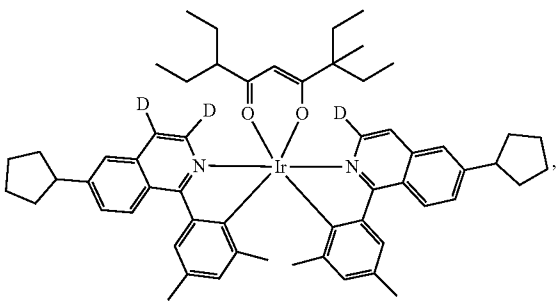
Ir($L_{a577}$)($L_{b101}$)($L_{c171}$)
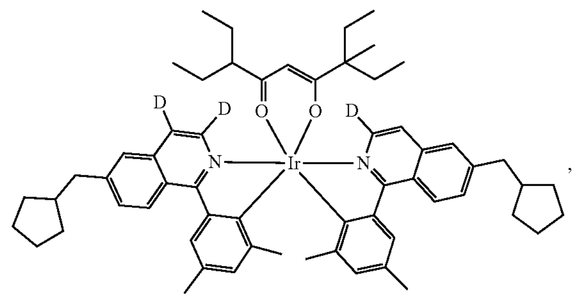
Ir($L_{a372}$)($L_{b101}$)($L_{c180}$)
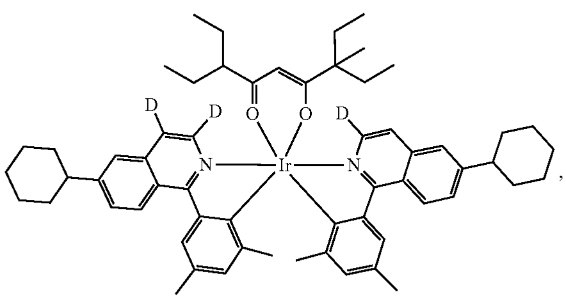
Ir($L_{a659}$)($L_{b101}$)($L_{c190}$)
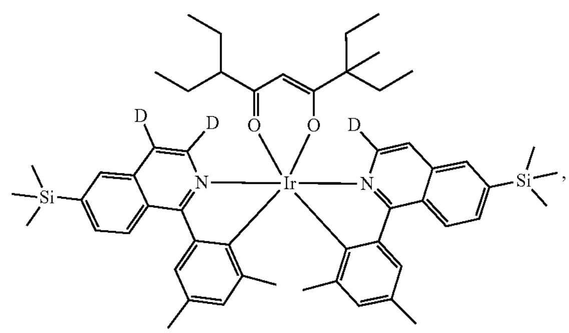
Ir($L_{a44}$)($L_{b101}$)($L_{c161}$)
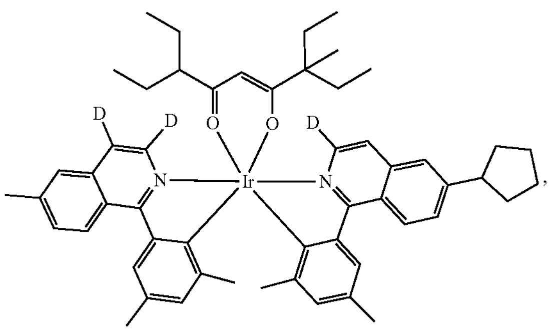
Ir($L_{a557}$)($L_{b101}$)($L_{c131}$)
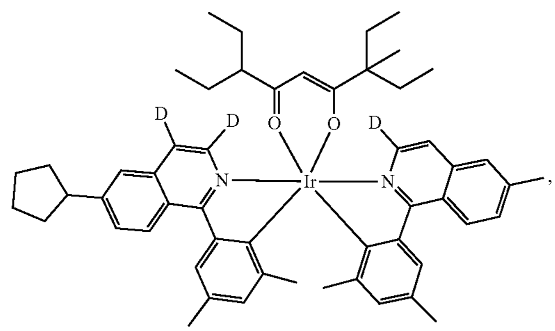

-continued
Ir($L_{a159}$)($L_{b101}$)($L_{c148}$)
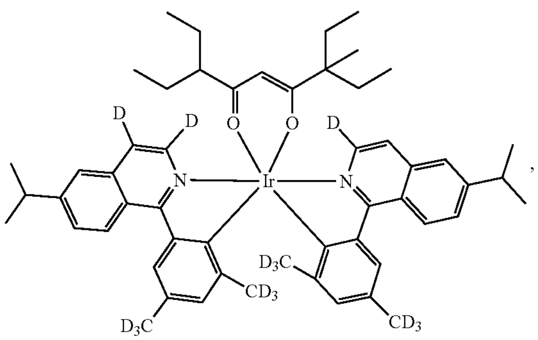
Ir($L_{a364}$)($L_{b101}$)($L_{c168}$)
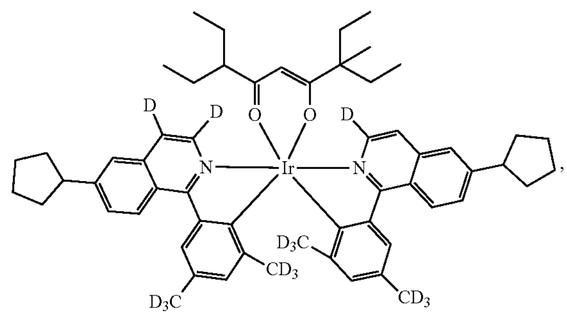
Ir($L_{a44}$)($L_{b361}$)($L_{c131}$)
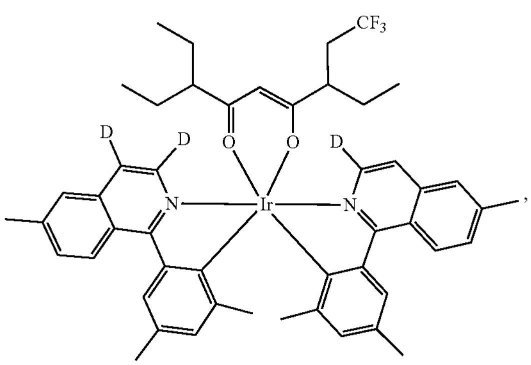
Ir($L_{a126}$)($L_{b361}$)($L_{c141}$)
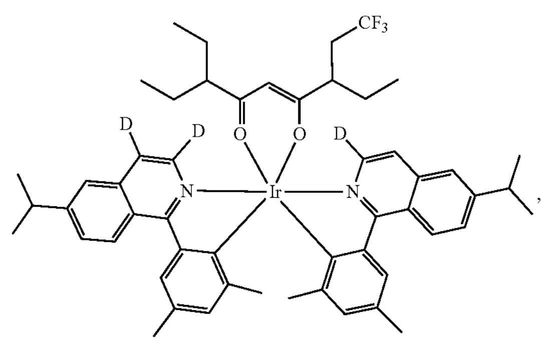
Ir($L_{a331}$)($L_{b361}$)($L_{c161}$)
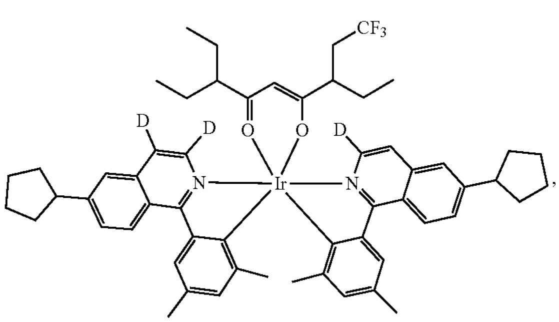
Ir($L_{a577}$)($L_{b361}$)($L_{c171}$)
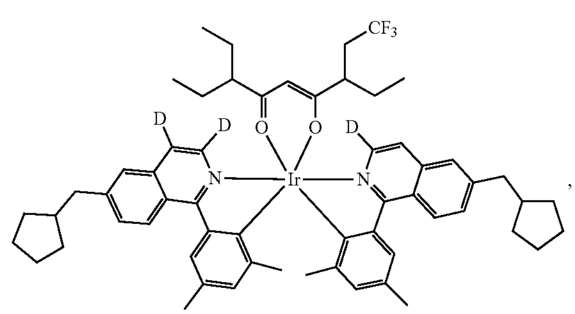
Ir($L_{a372}$)($L_{b361}$)($L_{c180}$)
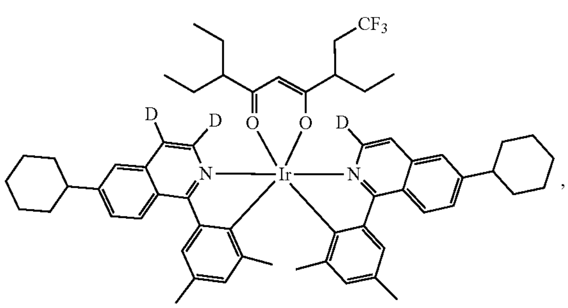
Ir($L_{a659}$)($L_{b361}$)($L_{c190}$)
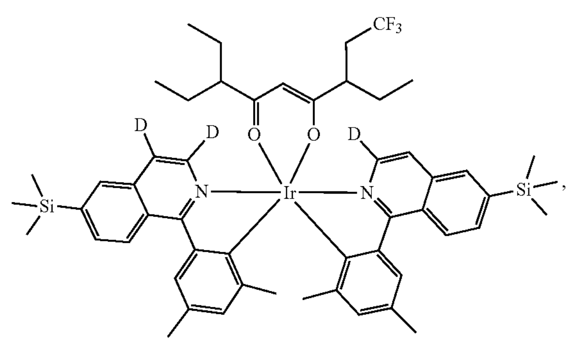

-continued
$Ir(L_{a44})(L_{b361})(L_{c161})$
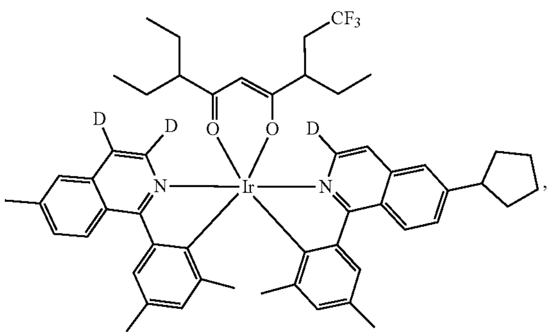
$Ir(L_{a557})(L_{b361})(L_{c131})$
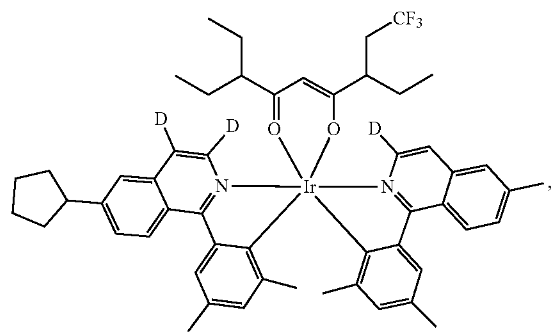
$Ir(L_{a159})(L_{b361})(L_{c148})$
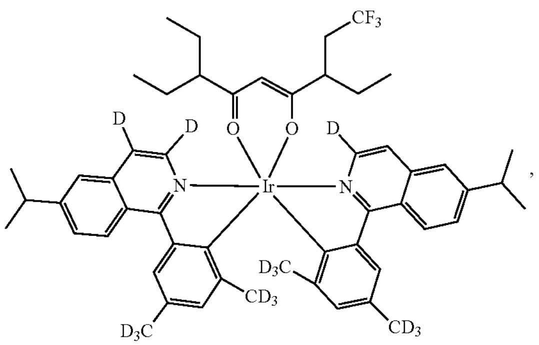
$Ir(L_{a364})(L_{b361})(L_{c168})$
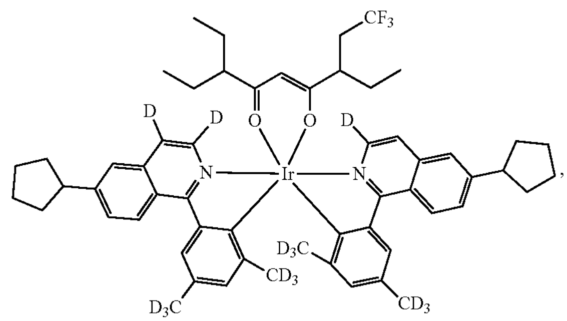
$Ir(L_{a44})(L_{b366})(L_{c131})$
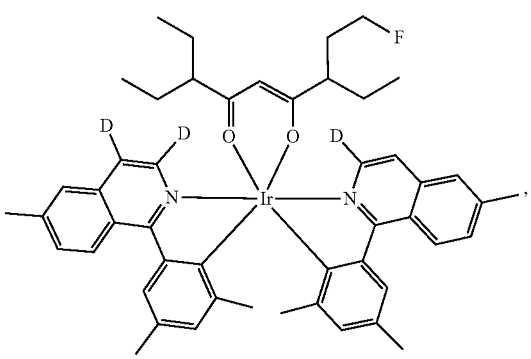
$Ir(L_{a126})(L_{b366})(L_{c141})$
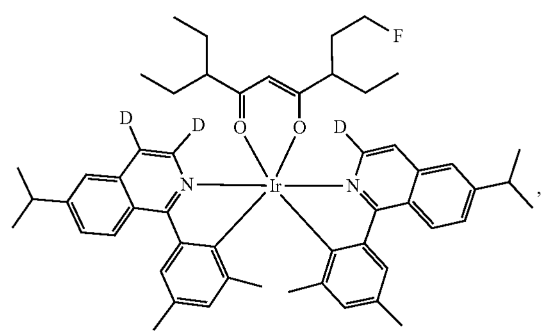
$Ir(L_{a331})(L_{b366})(L_{c161})$
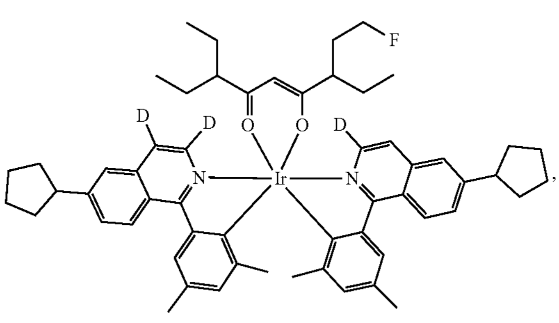
$Ir(L_{a577})(L_{b366})(L_{c171})$
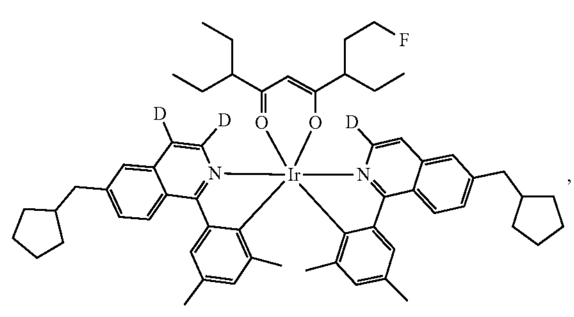

-continued
$Ir(L_{a372})(L_{b366})(L_{c180})$
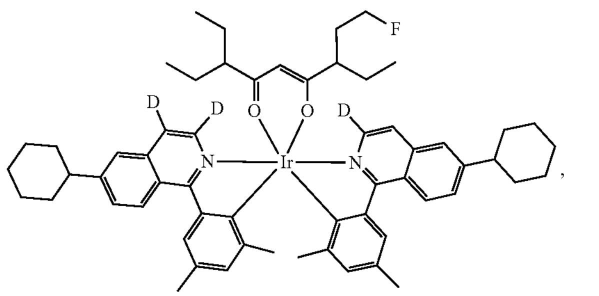
$Ir(L_{a659})(L_{b366})(L_{c190})$
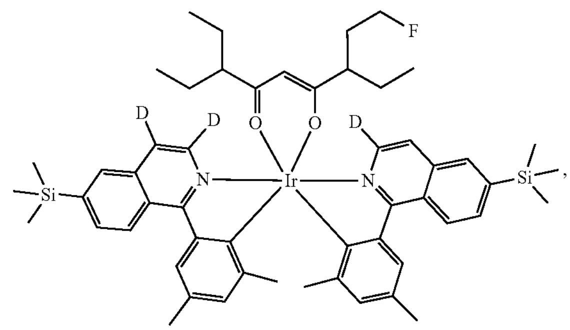
$Ir(L_{a44})(L_{b366})(L_{c161})$
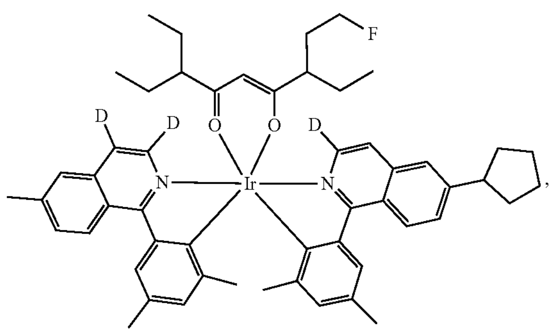
$Ir(L_{a577})(L_{b366})(L_{c131})$
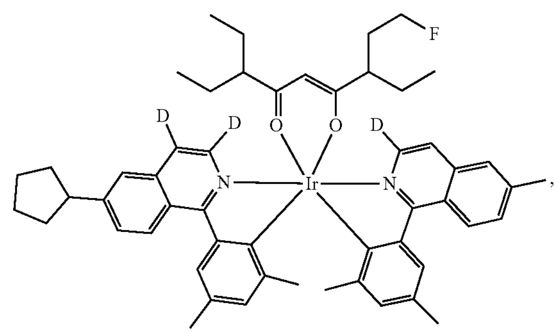
$Ir(L_{a159})(L_{b366})(L_{c148})$
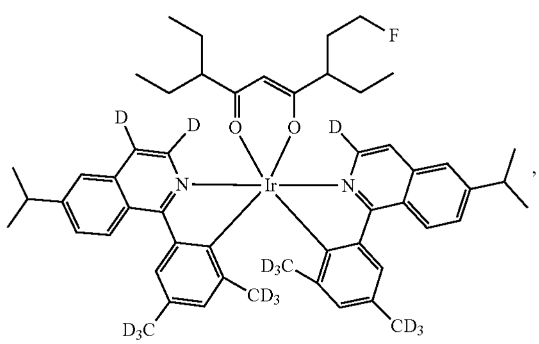
$Ir(L_{a364})(L_{b366})(L_{c168})$
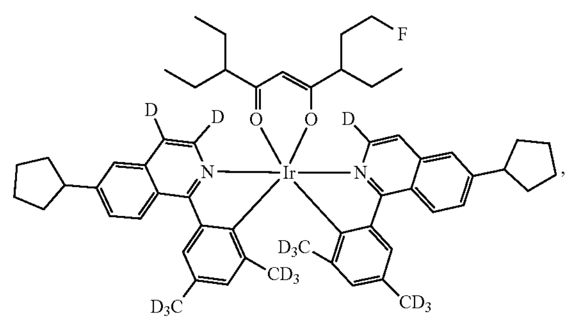
$Ir(L_{a44})(L_{b368})(L_{c131})$
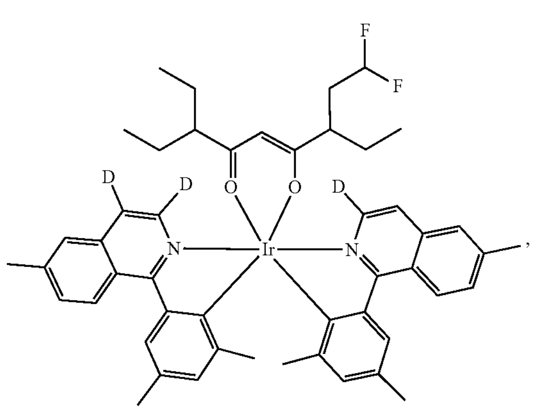
$Ir(L_{a126})(L_{b368})(L_{c141})$
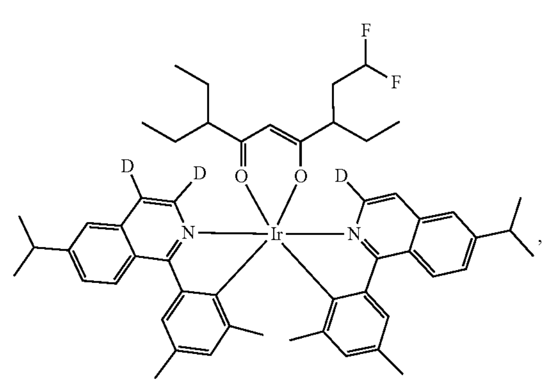

-continued
$Ir(L_{a331})(L_{b368})(L_{c161})$
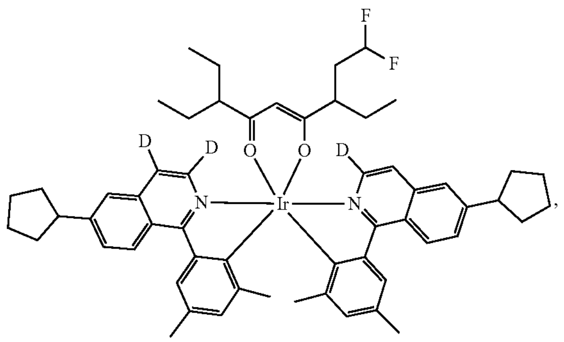
$Ir(L_{a577})(L_{b368})(L_{c171})$
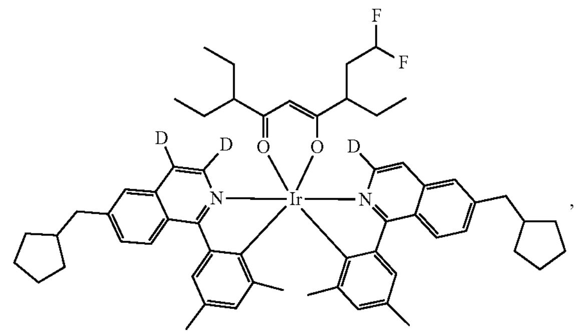
$Ir(L_{a372})(L_{b368})(L_{c180})$
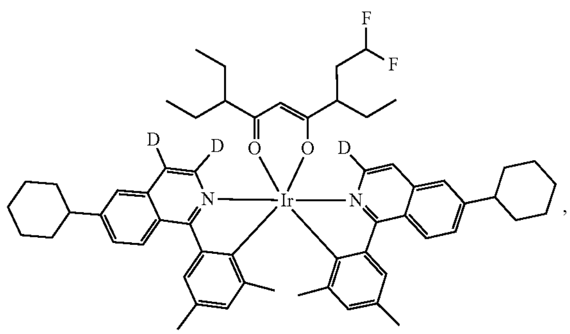
$Ir(L_{a659})(L_{b368})(L_{c190})$
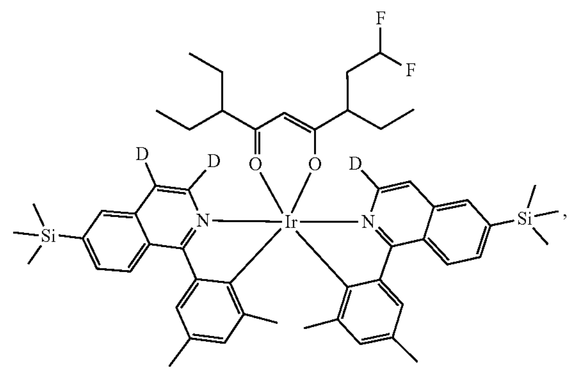
$Ir(L_{a44})(L_{b368})(L_{c161})$
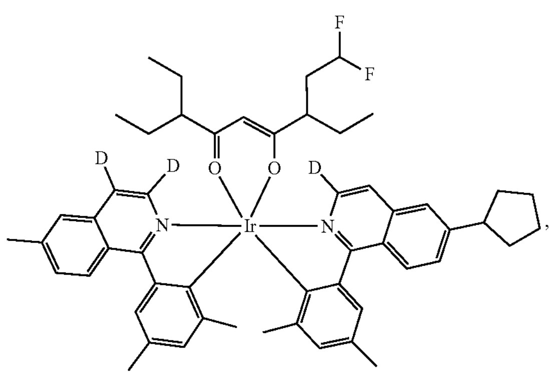
$Ir(L_{a557})(L_{b368})(L_{c131})$
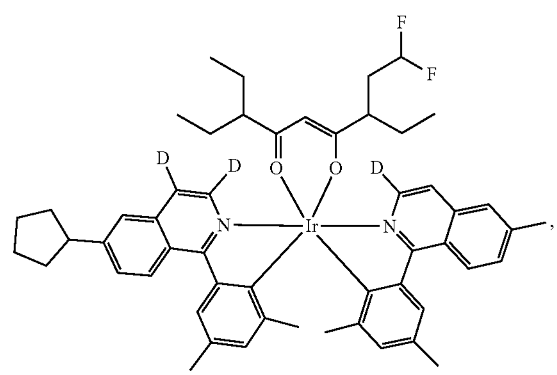
$Ir(L_{a159})(L_{b368})(L_{c148})$
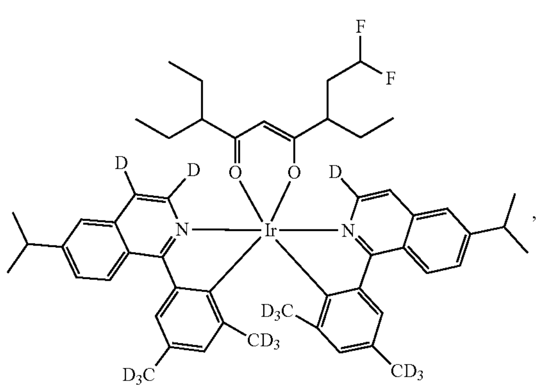
$Ir(L_{a364})(L_{b368})(L_{c168})$
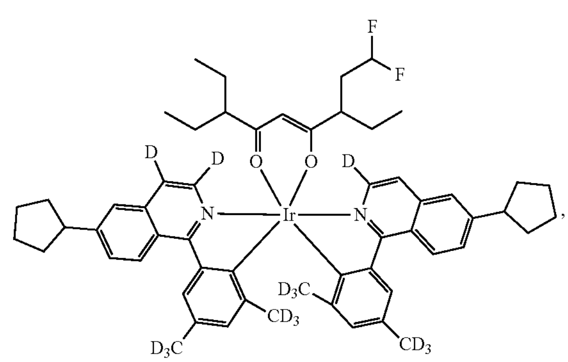

-continued
$Ir(L_{a44})(L_{b378})(L_{c131})$
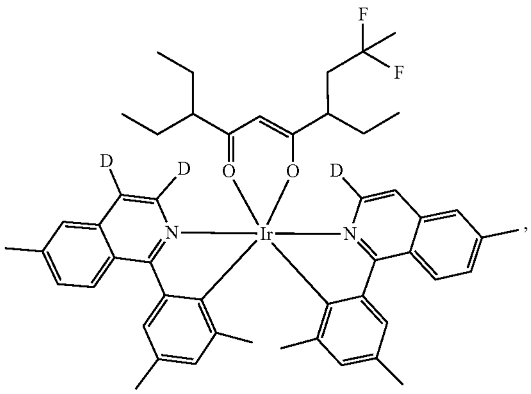
$Ir(L_{a331})(L_{b378})(L_{c161})$
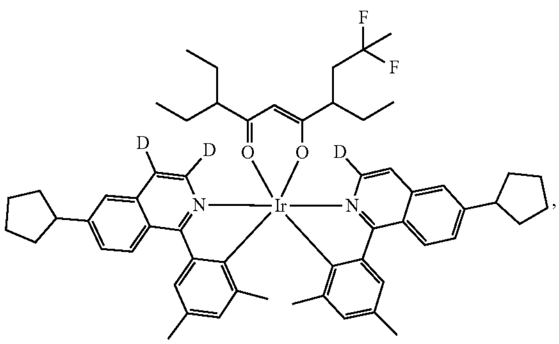
$Ir(L_{a372})(L_{b378})(L_{c180})$
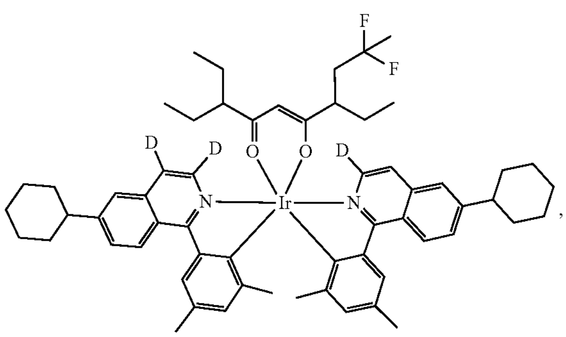
$Ir(L_{a44})(L_{b378})(L_{c161})$
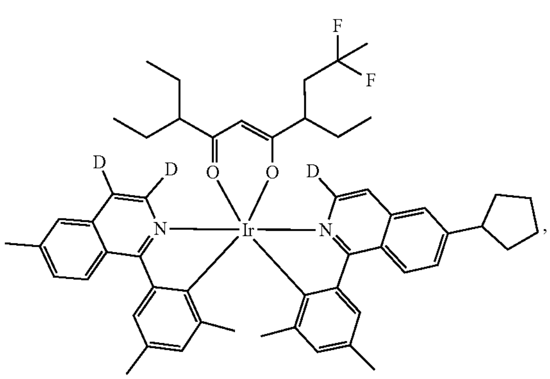
$Ir(L_{a126})(L_{b378})(L_{c141})$
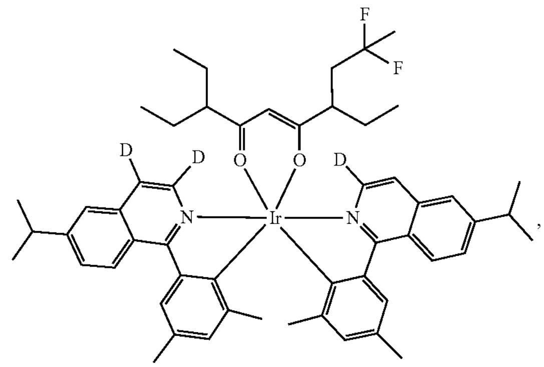
$Ir(L_{a577})(L_{b378})(L_{c171})$
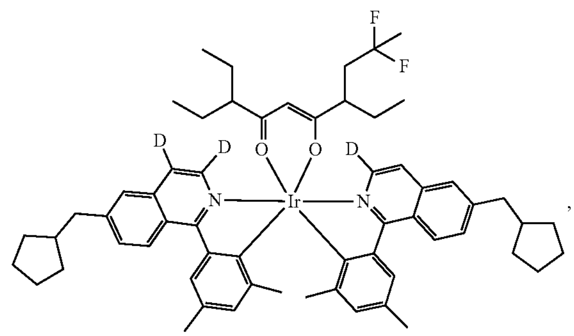
$Ir(L_{a659})(L_{b378})(L_{c190})$
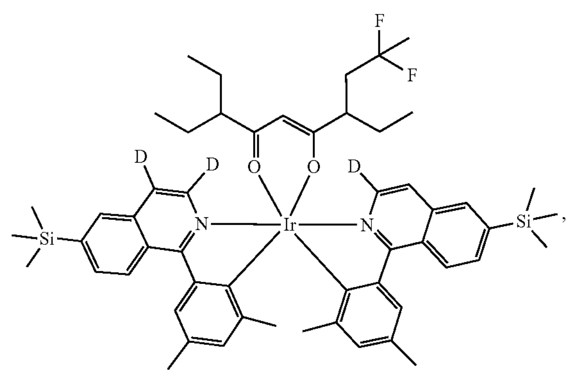
$Ir(L_{a577})(L_{b378})(L_{c131})$
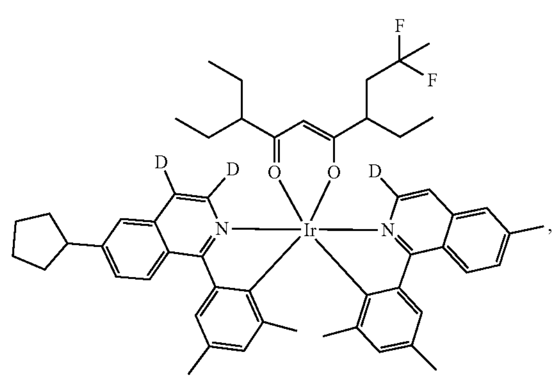

-continued
$Ir(L_{a159})(L_{b378})(L_{c148})$
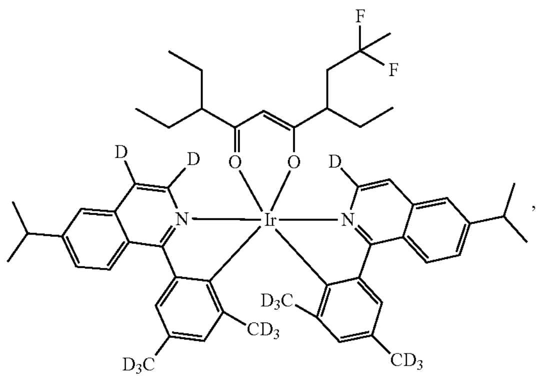
$Ir(L_{a10})_2L_{b31}$
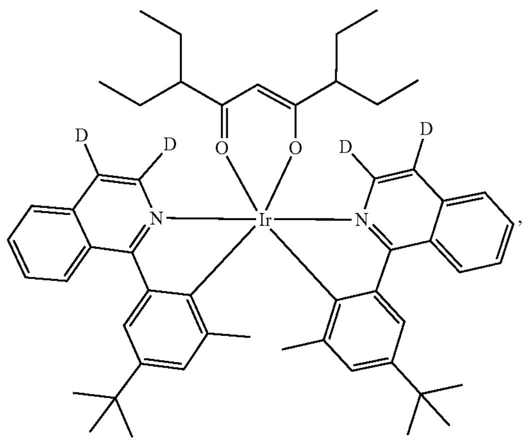
$Ir(L_{a174})_2L_{b31}$
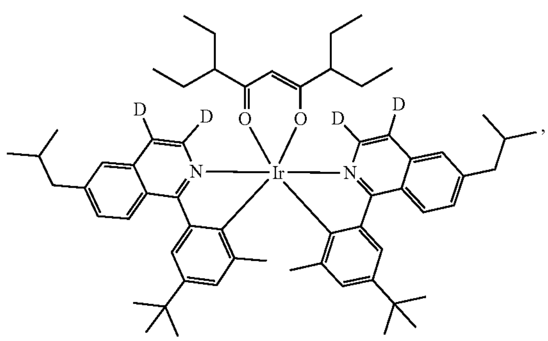
$Ir(L_{a379})_2L_{b31}$
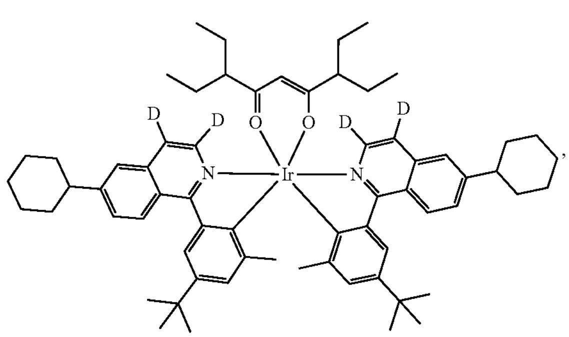
$Ir(L_{a364})(L_{b378})(L_{c168})$
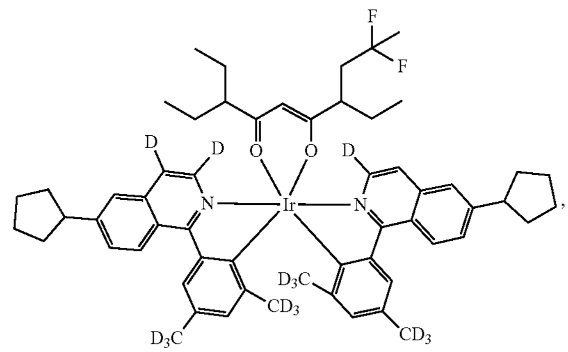
$Ir(L_{a133})_2L_{b31}$
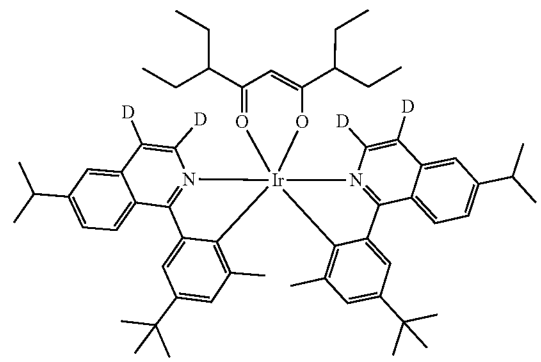
$Ir(L_{a338})_2L_{b31}$
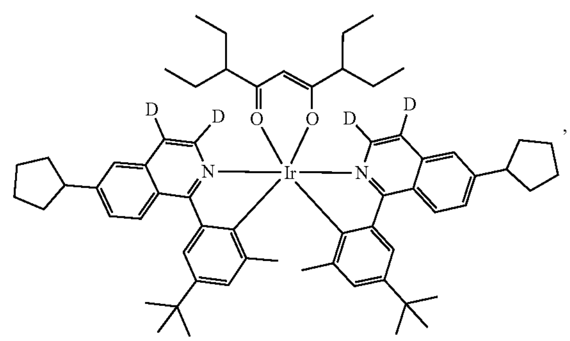
$Ir(L_{a584})_2L_{b31}$
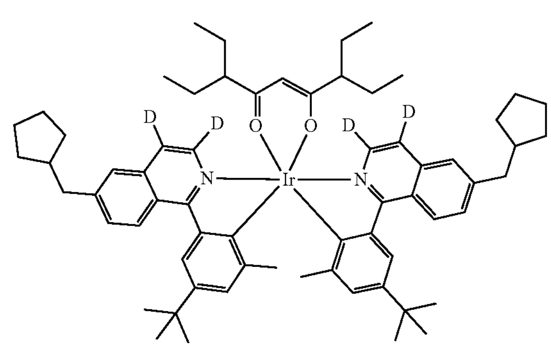

-continued
Ir($L_{a666}$)$_2$$L_{b31}$
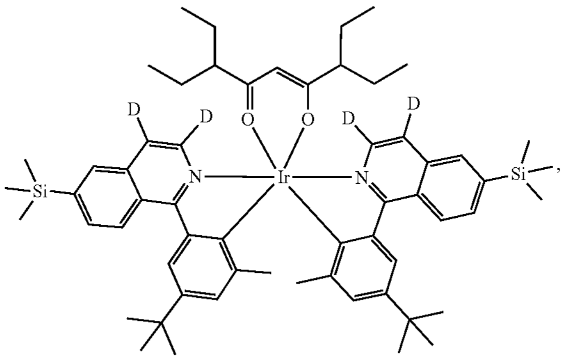
Ir($L_{a10}$)$_2$$L_{b101}$
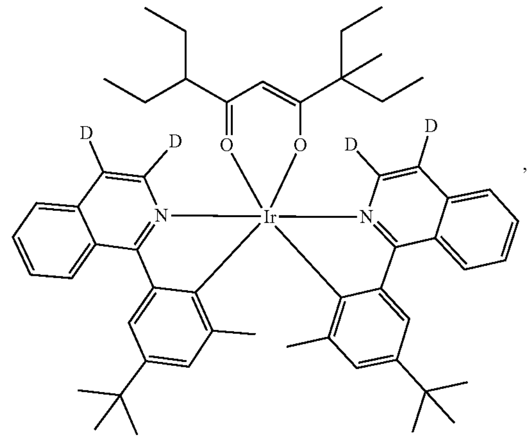
Ir($L_{a51}$)$_2$$L_{b101}$
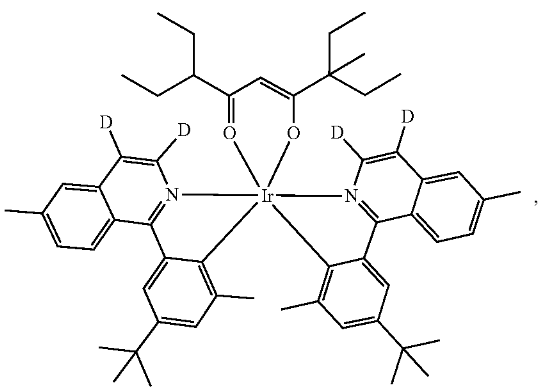
Ir($L_{a133}$)$_2$$L_{b101}$
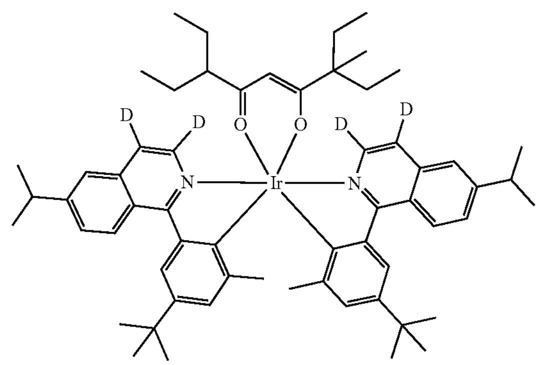
Ir($L_{a174}$)$_2$$L_{b101}$
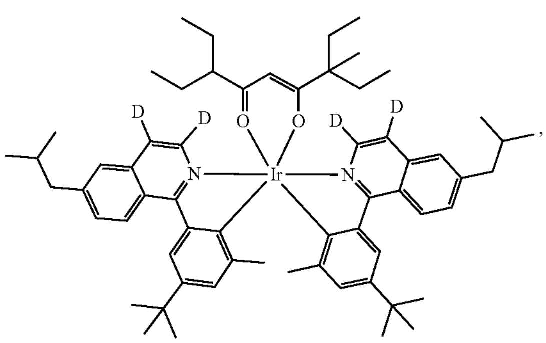
Ir($L_{a338}$)$_2$$L_{b101}$
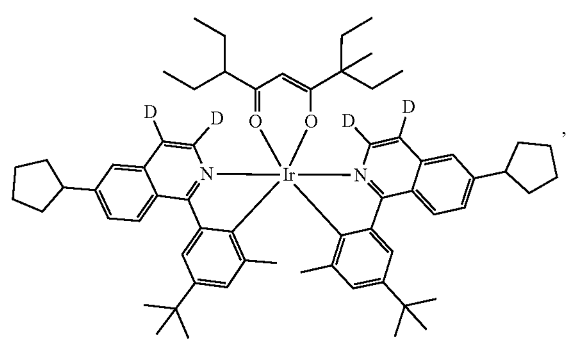
Ir($L_{a379}$)$_2$$L_{b101}$
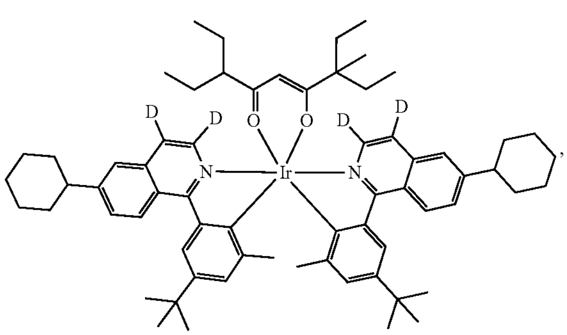
Ir($L_{a584}$)$_2$$L_{b101}$
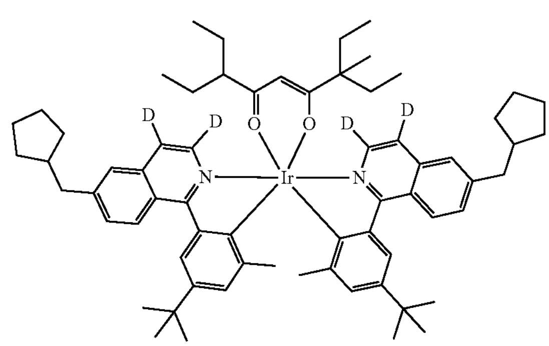

-continued
$Ir(L_{a666})_2L_{b101}$
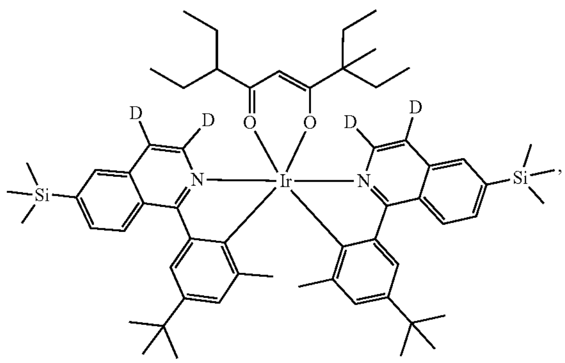
$Ir(L_{a51})_2L_{b361}$
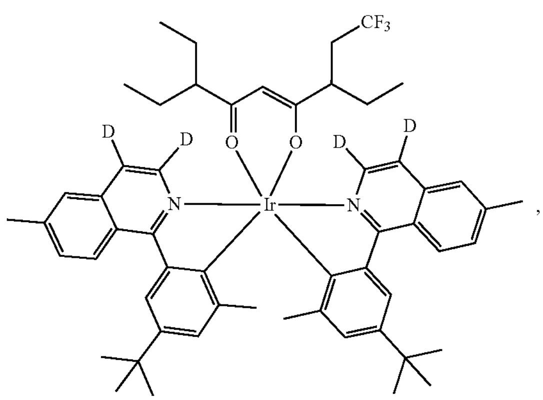
$Ir(L_{a174})_2L_{b361}$
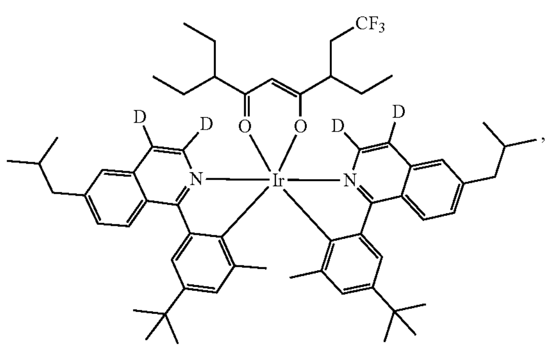
$Ir(L_{a379})_2L_{b361}$
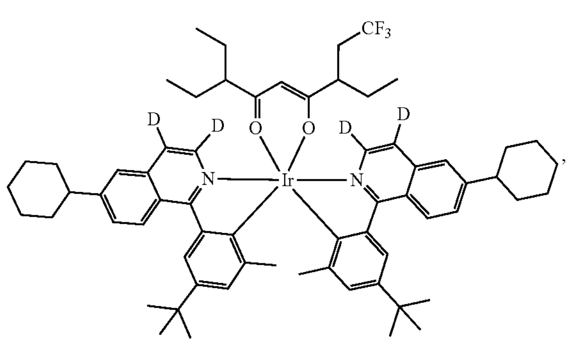
$Ir(L_{a10})_2L_{b361}$
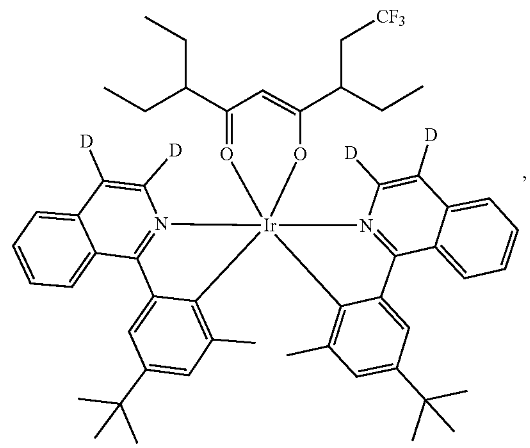
$Ir(L_{a133})_2L_{b361}$
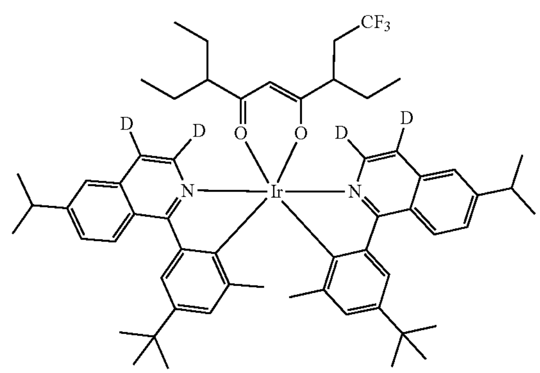
$Ir(L_{a338})_2L_{b361}$
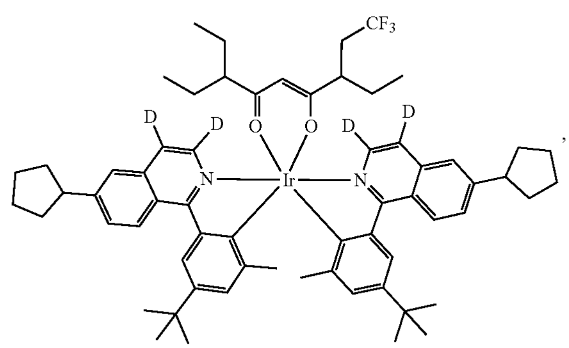
$Ir(L_{a584})_2L_{b361}$
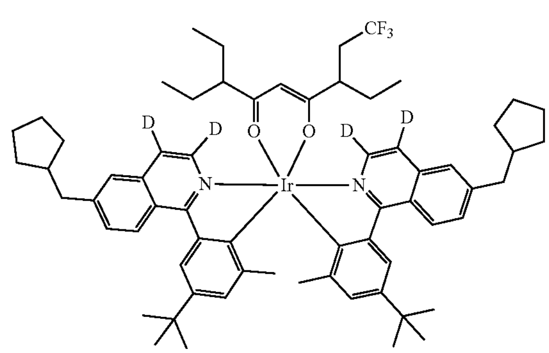

-continued
$Ir(L_{a666})_2L_{b361}$
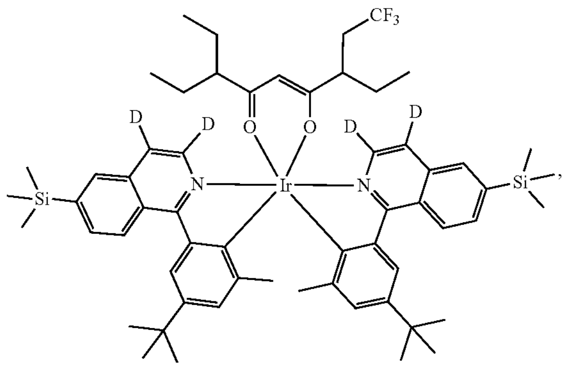
$Ir(L_{a10})_2L_{b366}$
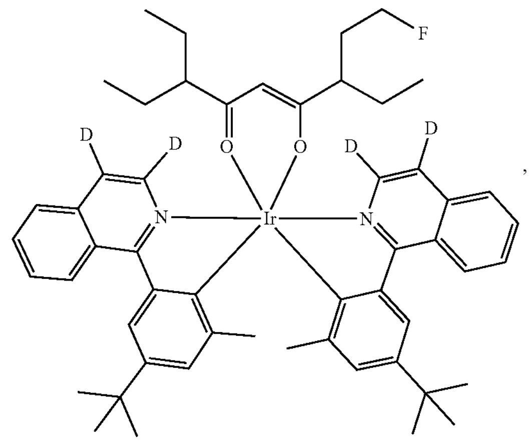
$Ir(L_{a51})_2L_{b366}$
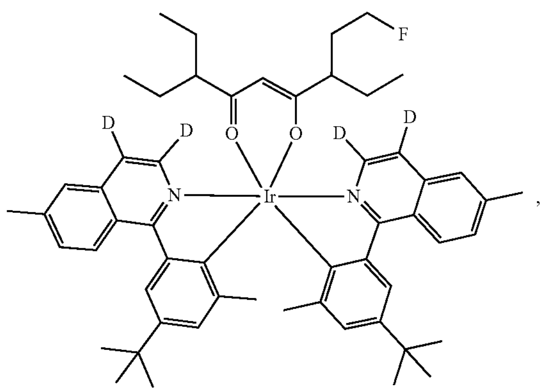
$Ir(L_{a133})_2L_{b366}$
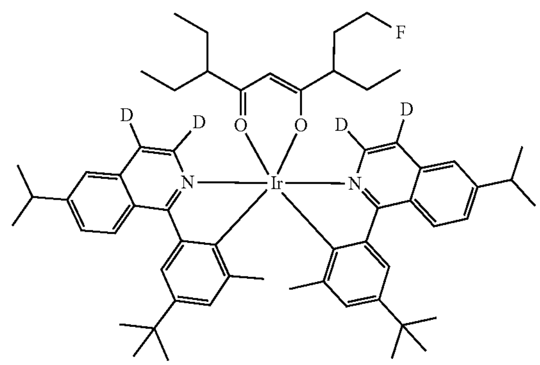
$Ir(L_{a174})_2L_{b366}$
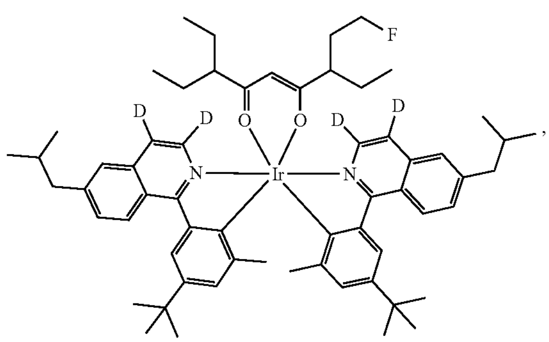
$Ir(L_{a338})_2L_{b366}$
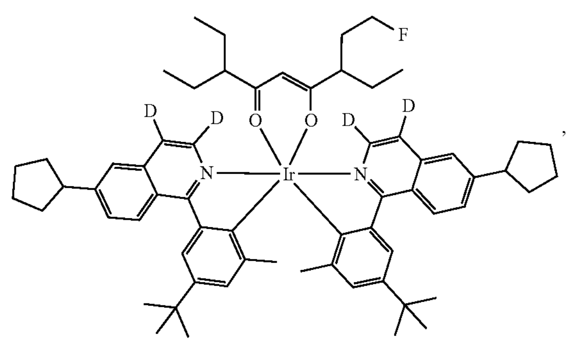
$Ir(L_{a379})_2L_{b366}$
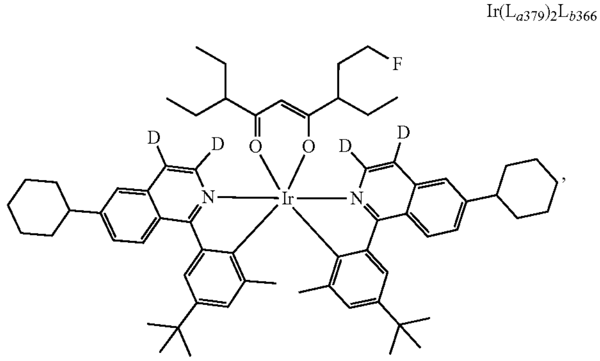
$Ir(L_{a584})_2L_{b366}$
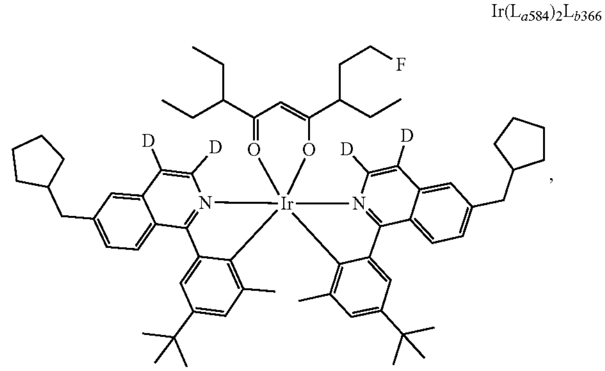

-continued
$Ir(L_{a666})_2L_{b366}$
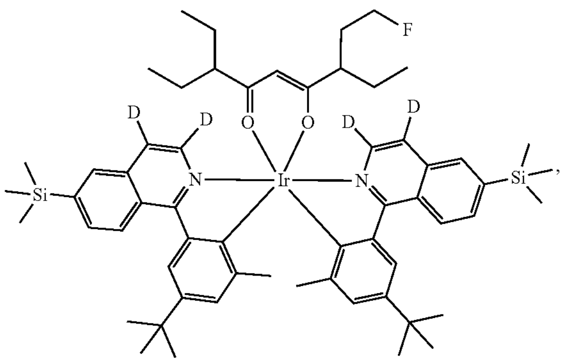
$Ir(L_{a10})_2L_{b368}$
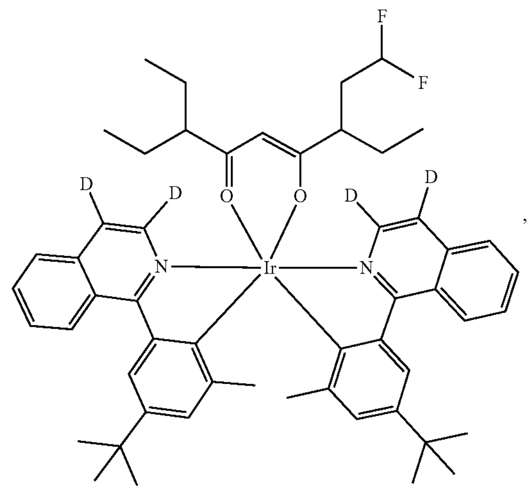
$Ir(L_{a51})_2L_{b368}$
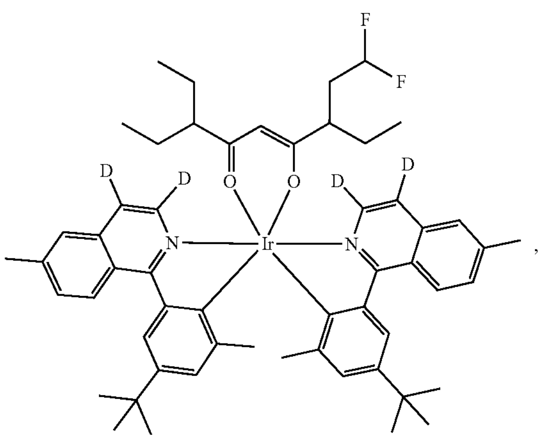
$Ir(L_{a133})_2L_{b368}$
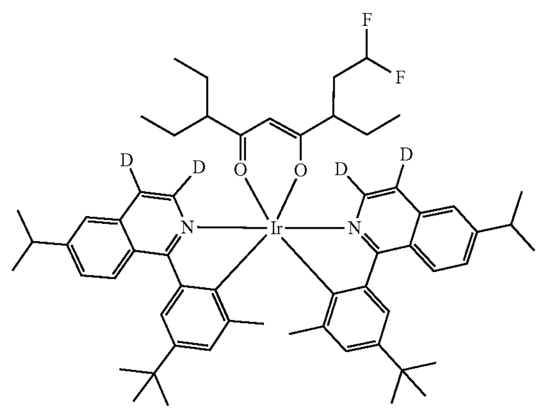
$Ir(L_{a174})_2L_{b368}$
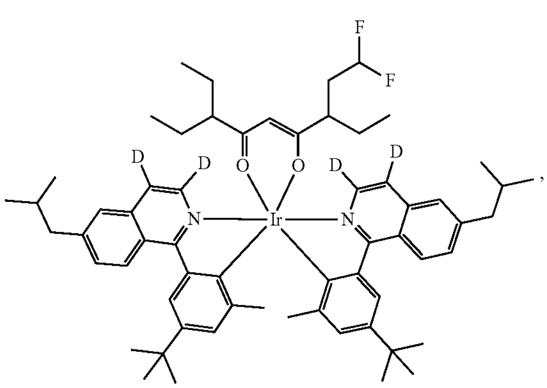
$Ir(L_{a338})_2L_{b368}$
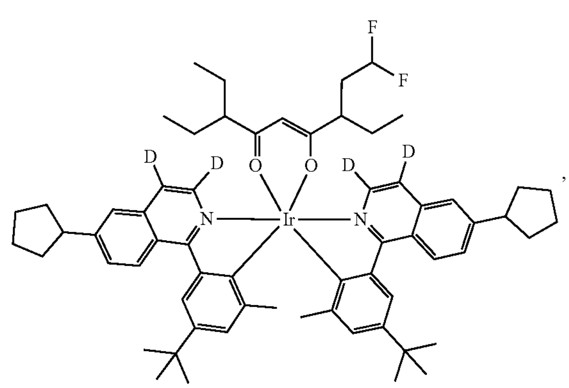

-continued
Ir($L_{a379}$)$_2$$L_{b368}$
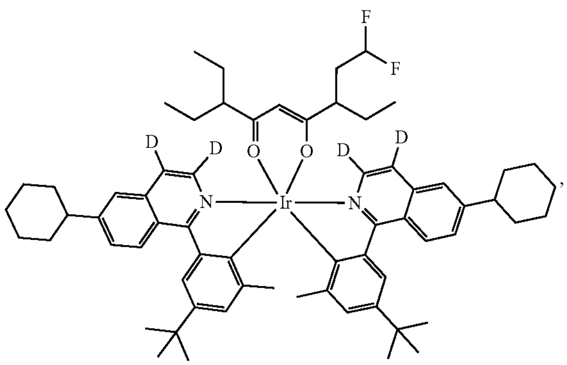
Ir($L_{a584}$)$_2$$L_{b368}$
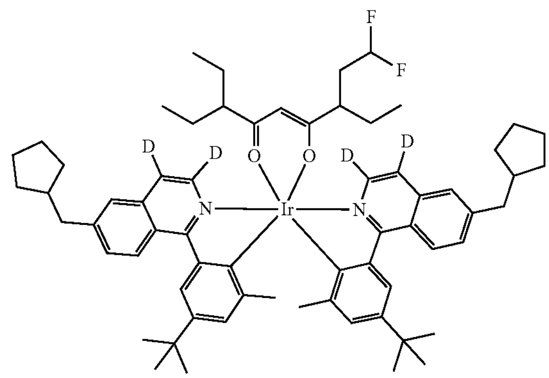
Ir($L_{a666}$)$_2$$L_{b368}$
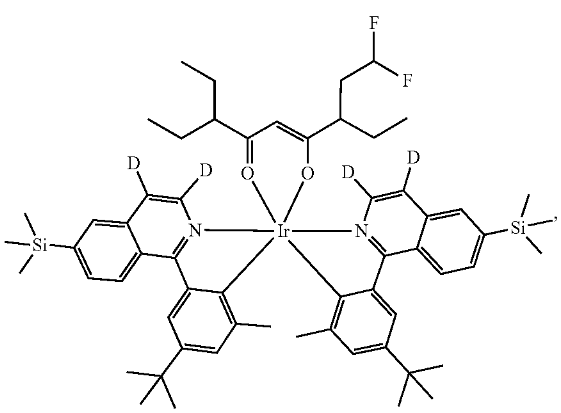
Ir($L_{a10}$)$_2$$L_{b378}$
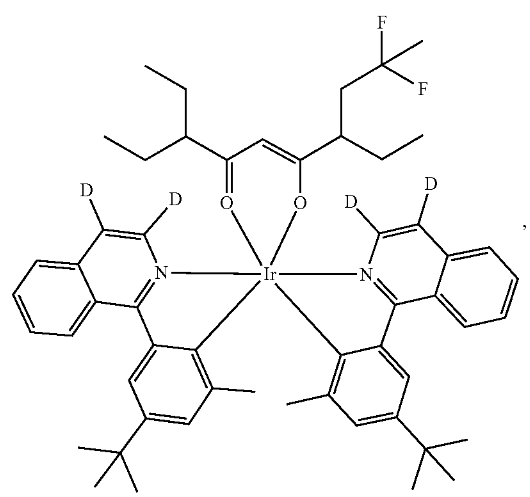
Ir($L_{a51}$)$_2$$L_{b378}$
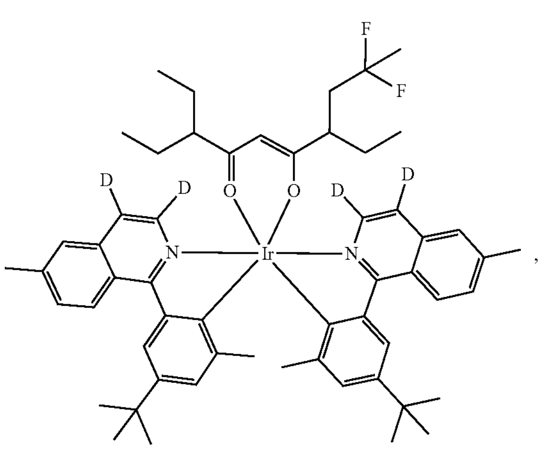
Ir($L_{a133}$)$_2$$L_{b378}$
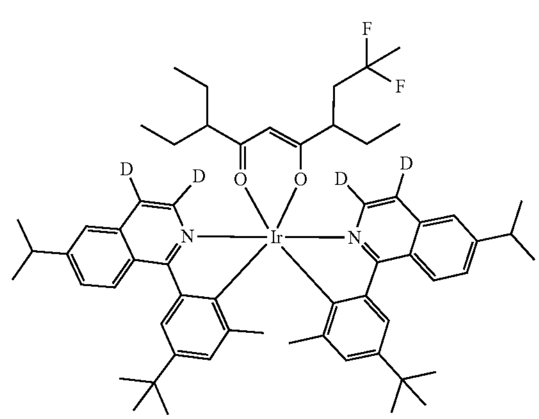

-continued
$Ir(L_{a174})_2L_{b378}$
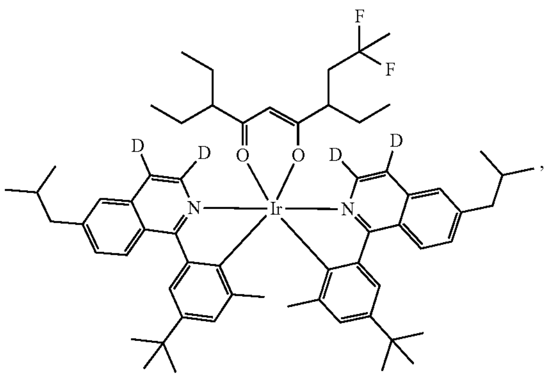
$Ir(L_{a338})_2L_{b378}$
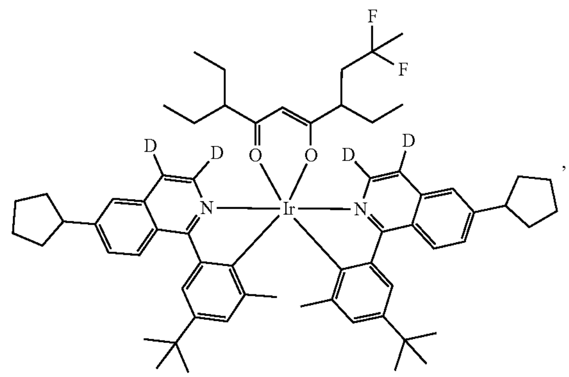
$Ir(L_{a379})_2L_{b378}$
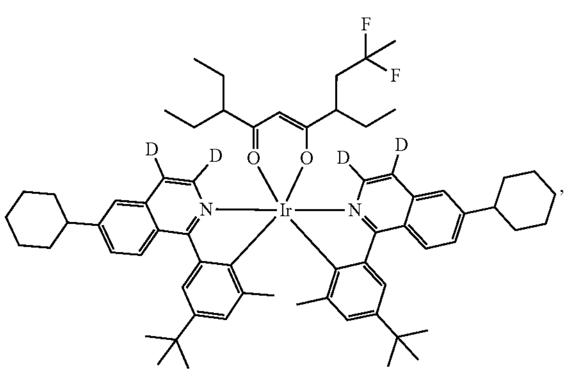
$Ir(L_{a584})_2L_{b378}$
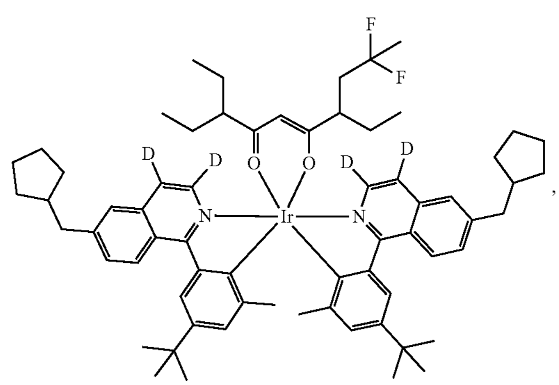
$Ir(L_{a666})_2L_{b378}$
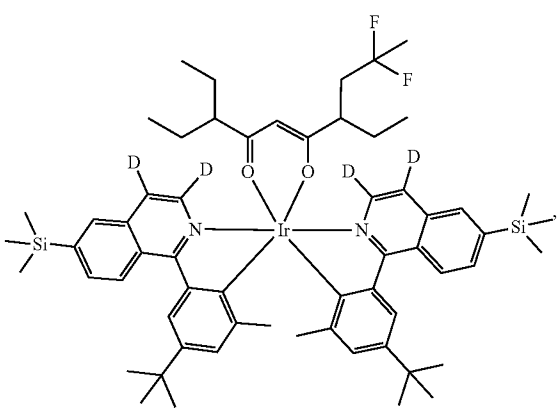
$Ir(L_{a1013})_2L_{b31}$
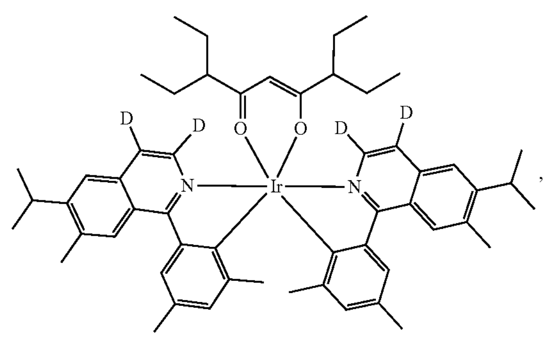
$Ir(L_{a1018})_2L_{b31}$
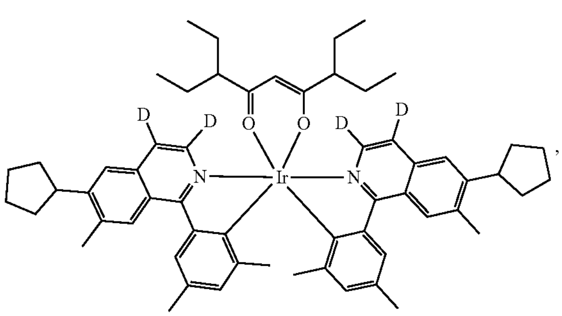
$Ir(L_{a1019})_2L_{b31}$
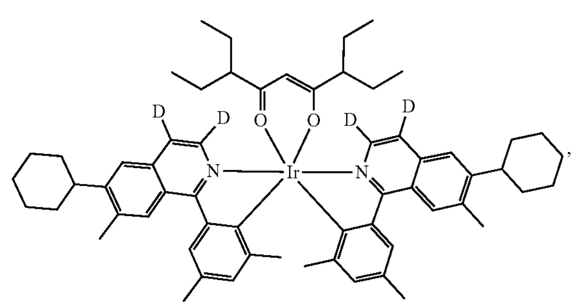

-continued
Ir($L_{a1024}$)$_2$$L_{b31}$
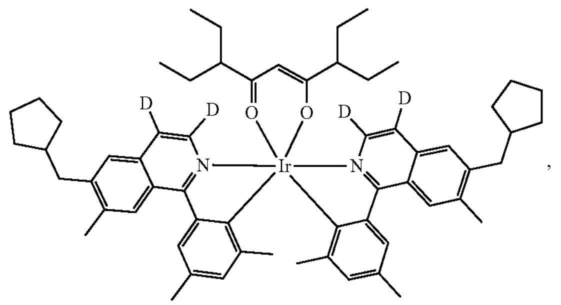
Ir($L_{a1026}$)$_2$$L_{b31}$
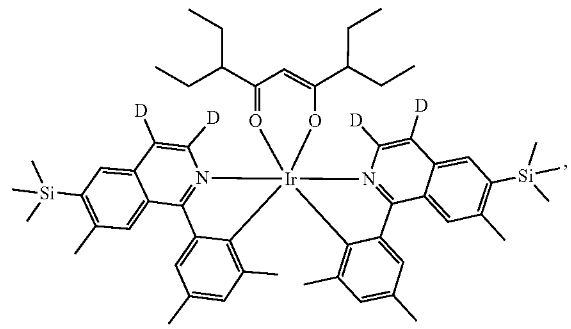
Ir($L_{a1068}$)$_2$$L_{b31}$
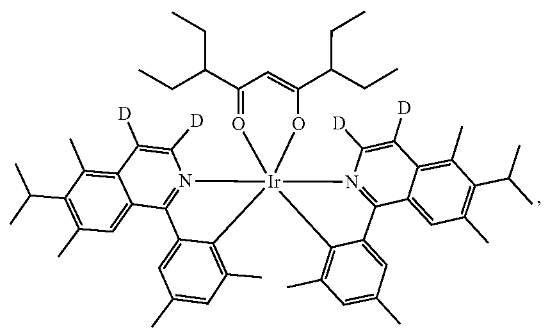
Ir($L_{a1013}$)$_2$$L_{b101}$
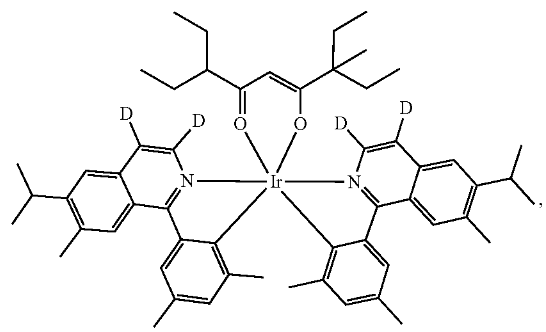
Ir($L_{a1018}$)$_2$$L_{b101}$
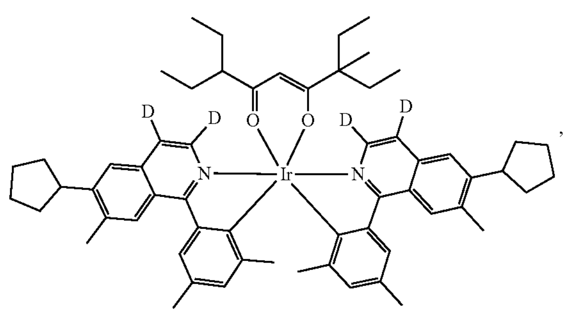
Ir($L_{a1019}$)$_2$$L_{b101}$
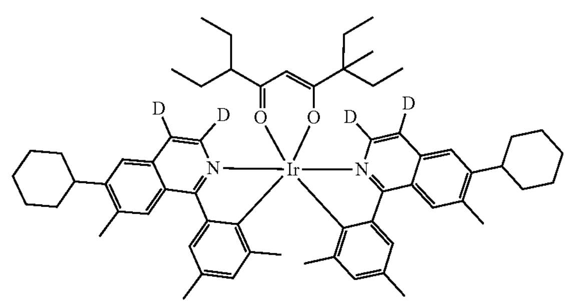
Ir($L_{a1024}$)$_2$$L_{b101}$
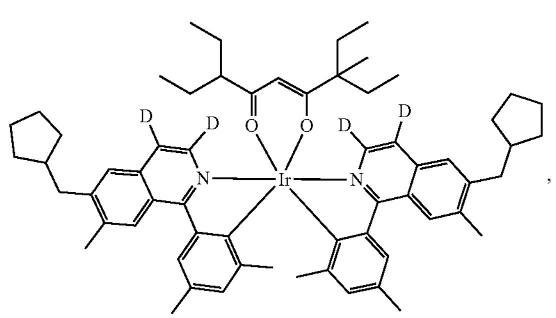
Ir($L_{a1026}$)$_2$$L_{b101}$
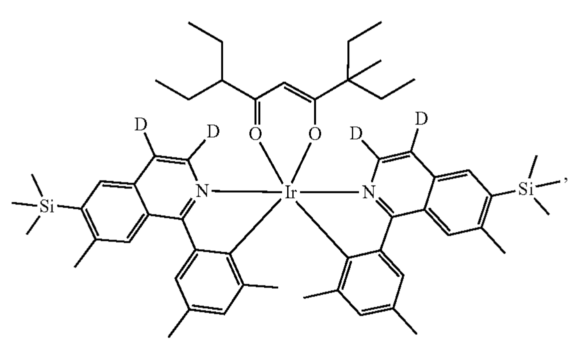

-continued
$Ir(L_{a1068})_2L_{b101}$
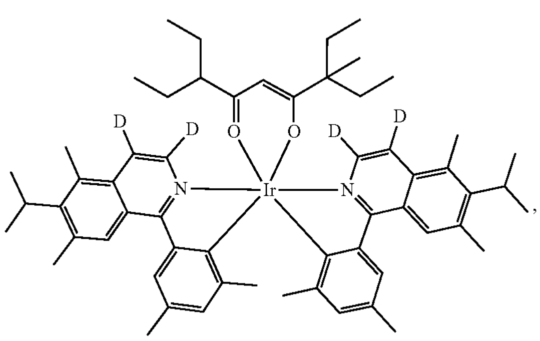
$Ir(L_{a1013})_2L_{b361}$
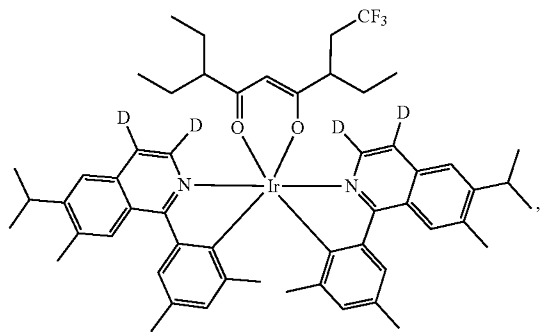
$Ir(L_{a1018})_2L_{b361}$
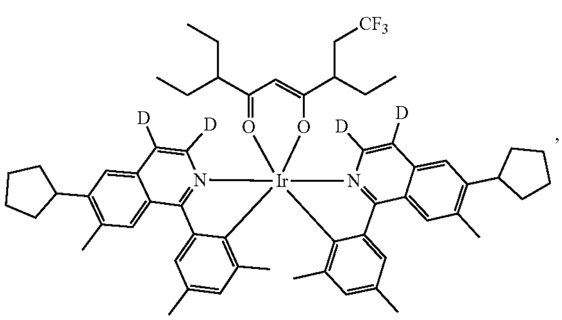
$Ir(L_{a1019})_2L_{b361}$
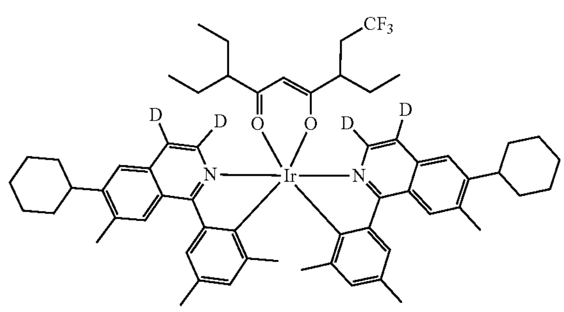
$Ir(L_{a1024})_2L_{b361}$
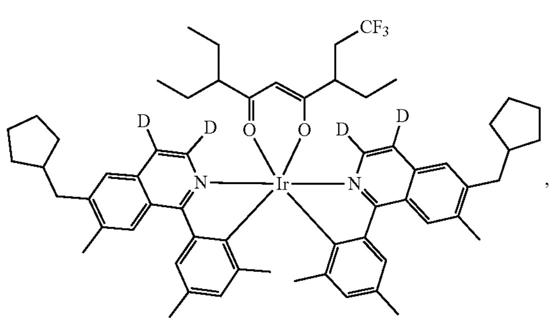
$Ir(L_{a1026})_2L_{b361}$
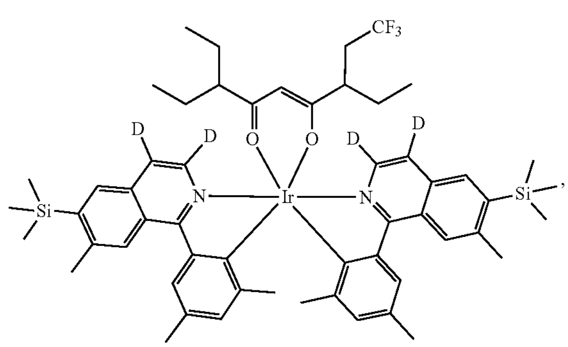
$Ir(L_{a1068})_2L_{b361}$
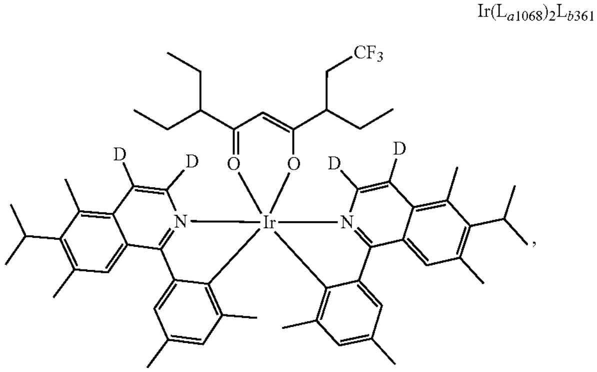
$Ir(L_{a1013})_2L_{b366}$
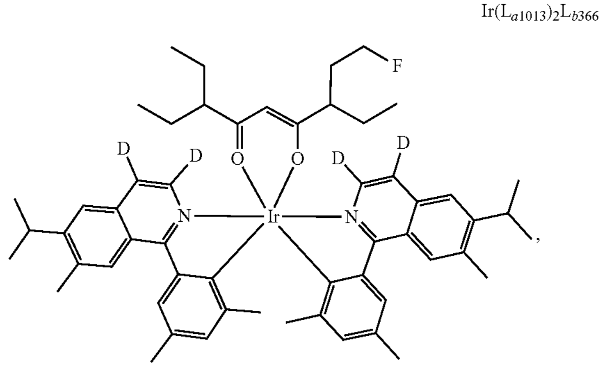

-continued
Ir($L_{a1018}$)$_2$$L_{b366}$
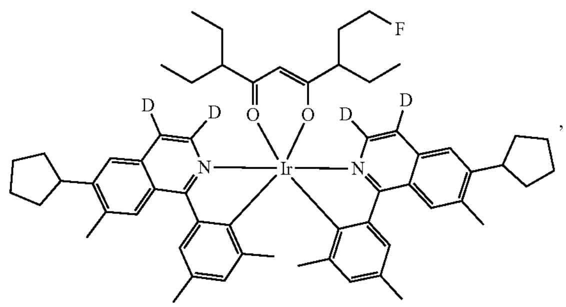
Ir($L_{a1019}$)$_2$$L_{b366}$
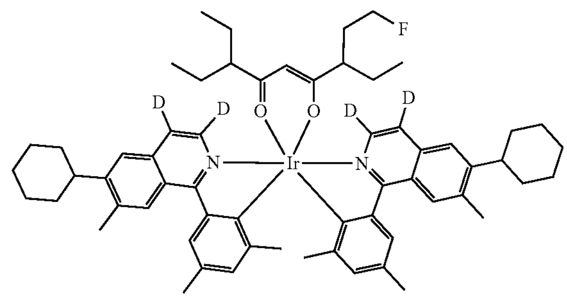
Ir($L_{a1024}$)$_2$$L_{b366}$
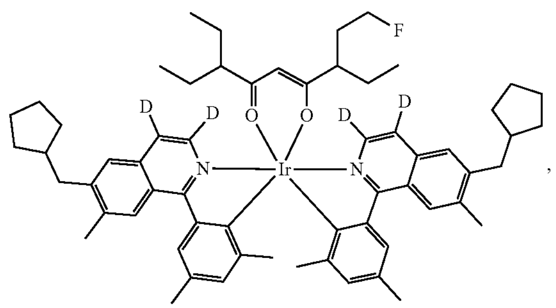
Ir($L_{a1026}$)$_2$$L_{b366}$
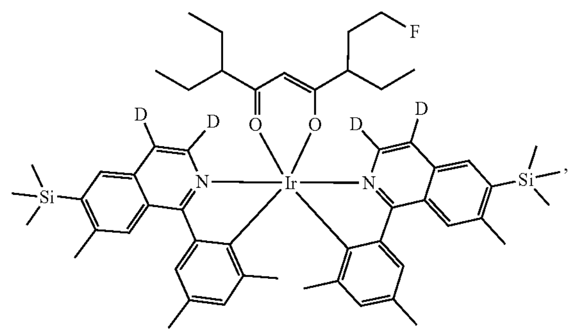
Ir($L_{a1068}$)$_2$$L_{b366}$
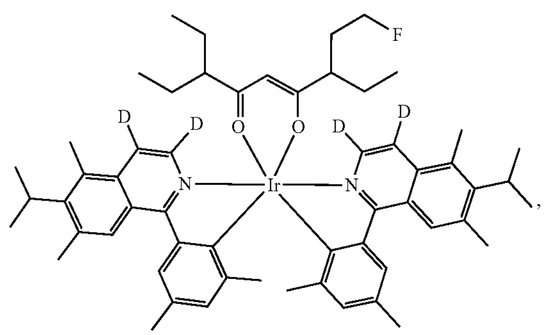
Ir($L_{a1013}$)$_2$$L_{b368}$
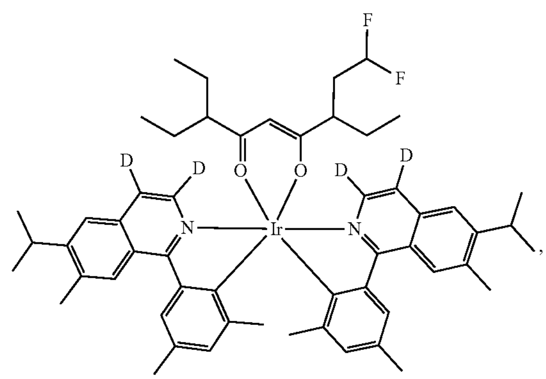
Ir($L_{a1018}$)$_2$$L_{b368}$
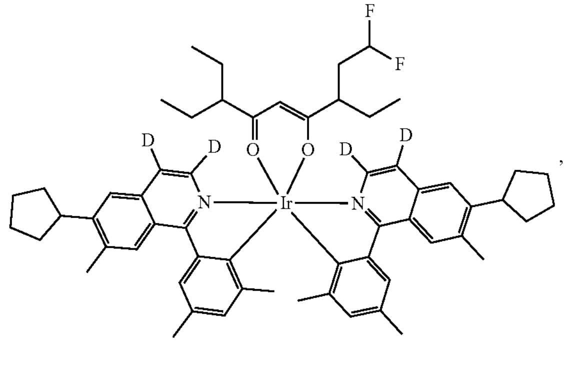
Ir($L_{a1019}$)$_2$$L_{b368}$
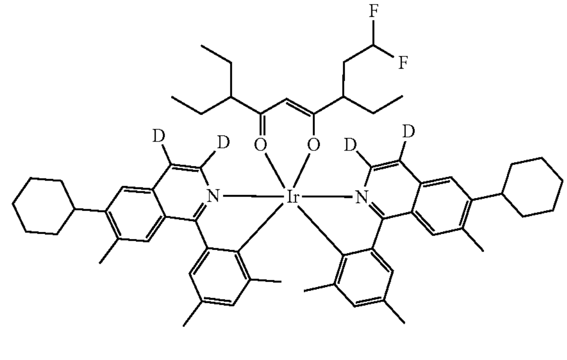

-continued
Ir($L_{a1024}$)$_2$$L_{b368}$
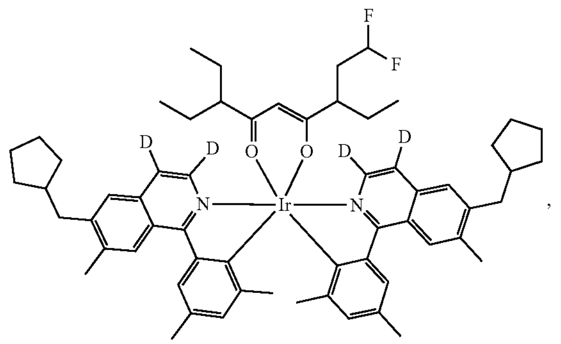
Ir($L_{a1026}$)$_2$$L_{b368}$
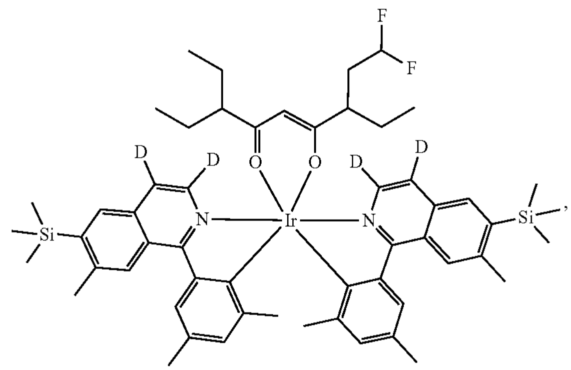
Ir($L_{a1068}$)$_2$$L_{b368}$
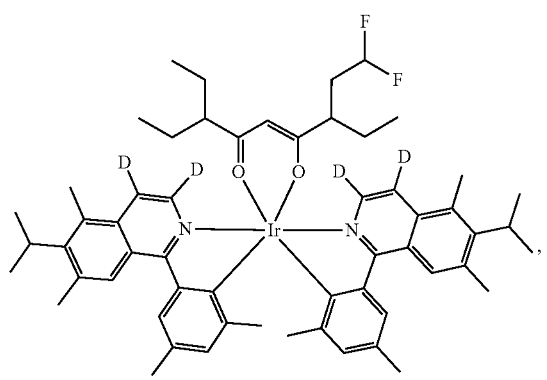
Ir($L_{a1013}$)$_2$$L_{b378}$
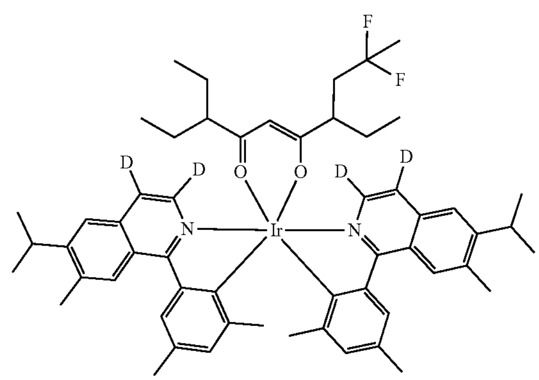
Ir($L_{a1018}$)$_2$$L_{b378}$
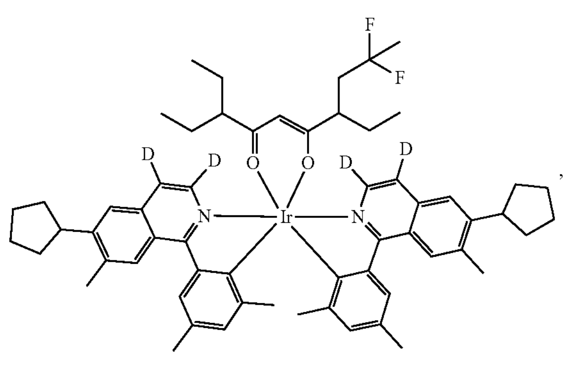
Ir($L_{a1019}$)$_2$$L_{b378}$
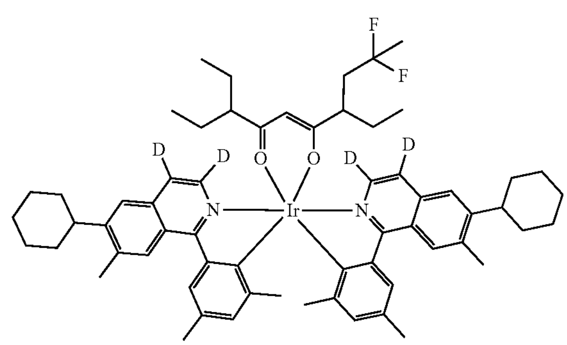
Ir($L_{a1024}$)$_2$$L_{b378}$
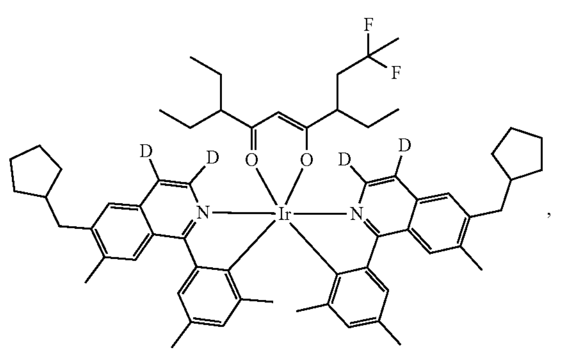
Ir($L_{a1026}$)$_2$$L_{b378}$
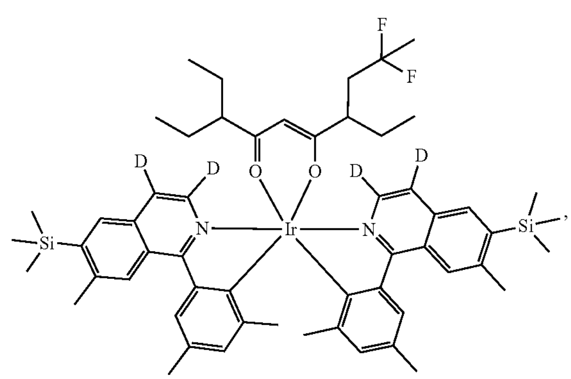

-continued
$Ir(L_{a1068})_2L_{b378}$
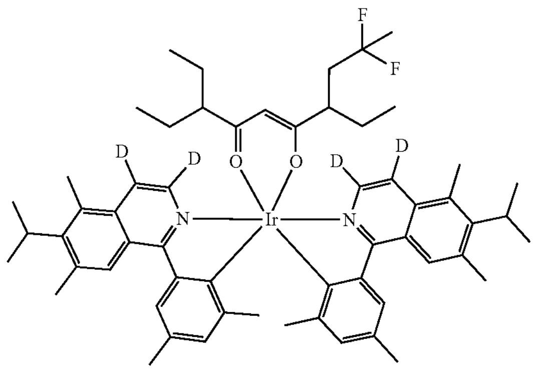
,
$Ir(L_{a1098})_2L_{b361}$
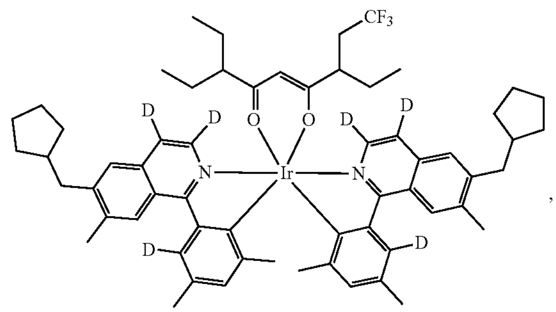
,
$Ir(L_{a1096})_2L_{b378}$
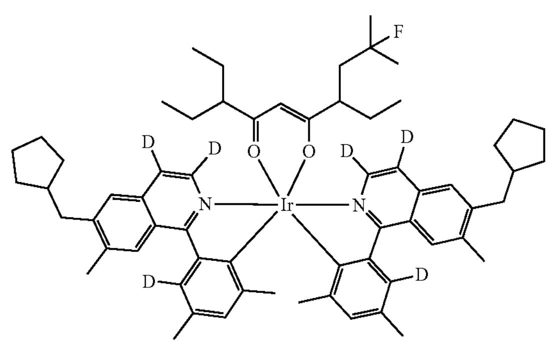
,
$Ir(L_{a1101})_2L_{b361}$
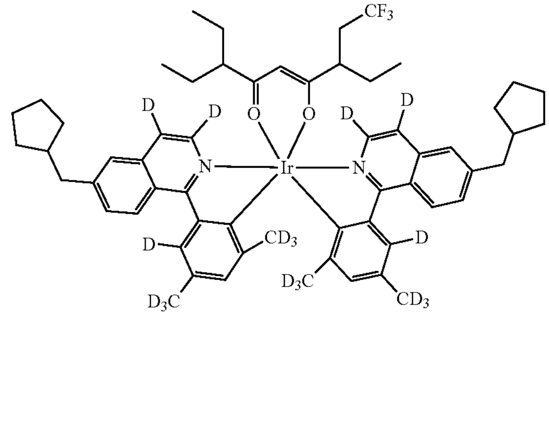
,
$Ir(L_{a1096})_2L_{b361}$
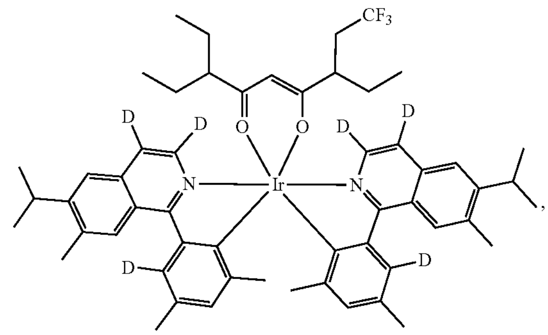
,
$Ir(L_{a1096})_2L_{b378}$
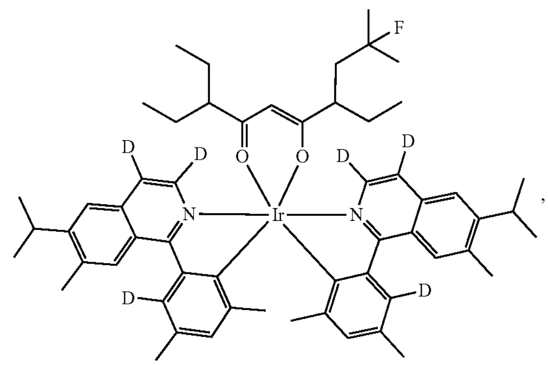
,
$Ir(L_{a1099})_2L_{b361}$
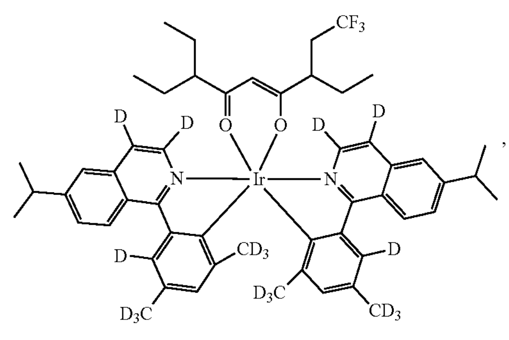
,
$Ir(L_{a1099})_2L_{b378}$
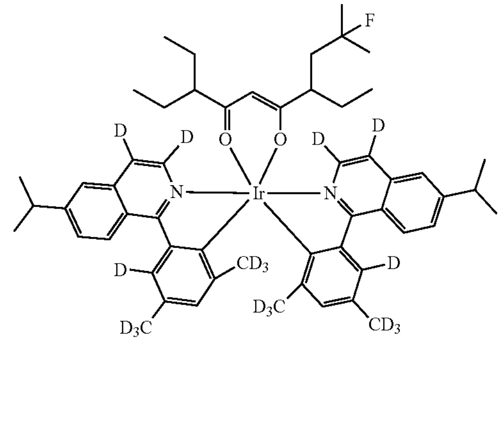
, and -continued
Ir($L_{a1101}$)$_2$$L_{b378}$
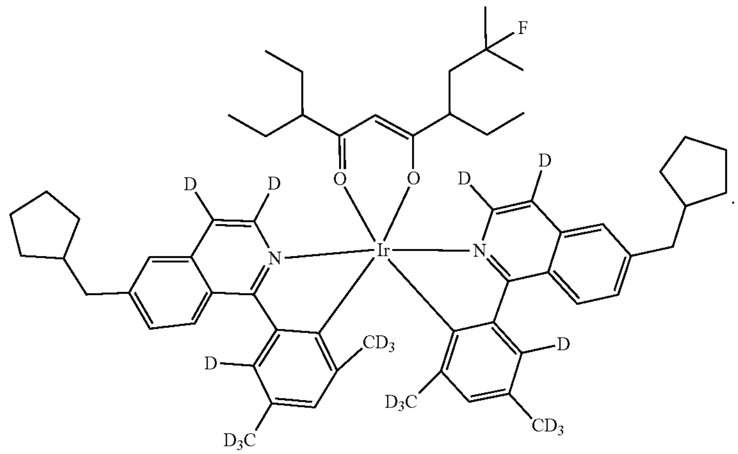
* * * * *